US012501828B2

(12) United States Patent
Numata et al.

(10) Patent No.: US 12,501,828 B2
(45) Date of Patent: Dec. 16, 2025

(54) ORGANIC LIGHT-EMITTING DEVICE AND APPARATUS INCLUDING THE SAME

(71) Applicant: Samsung Electronics Co., Ltd., Suwon-si (KR)

(72) Inventors: Masaki Numata, Yokohama (JP); Masaru Kinoshita, Yokohama (JP); Mitsunori Ito, Yokohama (JP); Wataru Sotoyama, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/726,452

(22) Filed: Dec. 24, 2019

(65) Prior Publication Data

US 2020/0212314 A1 Jul. 2, 2020

(30) Foreign Application Priority Data

Dec. 28, 2018 (JP) ................................ 2018-248433
Sep. 4, 2019 (KR) ........................ 10-2019-0109515

(51) Int. Cl.
*H01L 51/00* (2006.01)
*H10K 50/11* (2023.01)
*H10K 85/60* (2023.01)

(52) U.S. Cl.
CPC ......... *H10K 85/6572* (2023.02); *H10K 50/11* (2023.02); *H10K 85/622* (2023.02); *H10K 85/654* (2023.02); *H10K 85/6574* (2023.02); *H10K 85/6576* (2023.02)

(58) Field of Classification Search
CPC ............. H01L 51/0072; H01L 51/0074; H01L 51/0067; H01L 51/0073; H01L 51/0054; H01L 51/5012; H01L 51/5016; H10K 85/6572; H10K 85/654; H10K 85/6574; H10K 85/622; H10K 85/6576
See application file for complete search history.

(56) References Cited

U.S. PATENT DOCUMENTS 6,013,982 A 1/2000 Thompson et al.
6,087,196 A 7/2000 Sturm et al.
6,294,398 B1 9/2001 Kim et al.
6,337,102 B1 1/2002 Forrest et al.
6,468,819 B1 10/2002 Kim et al.
6,720,090 B2 4/2004 Young et al.
6,780,529 B2 8/2004 Kimura
6,790,538 B2 9/2004 Naito
6,800,379 B2 10/2004 Taguchi
6,803,124 B2 10/2004 Taguchi
6,824,891 B2 11/2004 Okada et al.
6,881,973 B2 4/2005 Nii
6,897,913 B2 5/2005 Tsuboyama et al.
6,905,784 B2 6/2005 Seo
7,001,676 B2 2/2006 Igarashi et al.
7,223,483 B2 5/2007 Shirane et al.
8,743,031 B2 6/2014 Hashimoto et al.
9,142,791 B2 9/2015 Adamovich et al.
9,190,620 B2 11/2015 Zeng et al.
9,680,111 B2 6/2017 Feldman et al.
10,199,577 B2 2/2019 Park et al.
10,593,895 B2 3/2020 Shitagaki et al.
11,008,280 B2 * 5/2021 Mun .................... C07D 409/12
2001/0033135 A1 * 10/2001 Duggal ............... H01L 27/3211 313/506
2002/0034659 A1 3/2002 Nishi et al.
2004/0209115 A1 10/2004 Thompson et al.
2004/0209116 A1 10/2004 Ren et al.
2007/0257600 A1 * 11/2007 Matsuura ............. H10K 85/654 313/498
2008/0074038 A1 3/2008 Kim et al.
2010/0237334 A1 * 9/2010 Ma ....................... C07D 307/91 546/281.1

(Continued)

FOREIGN PATENT DOCUMENTS

CN 103563117 A 2/2014
CN 106318379 A 1/2017

(Continued)

OTHER PUBLICATIONS

Kim et al., machine translation of WO-2015009102-A1 (2015) pp. 1-16. (Year: 2015).*
Extended European search report issued by the European Patent Office on May 26, 2020 in the examination of the European Patent Application No. 19220143.2, which corresponds to the U.S. application above.
Extended European search report issued by the European Patent Office on Mar. 16, 2020 in the examination of the European Patent Application No. 19218571.8, which corresponds to the U.S. Application above.

(Continued)

*Primary Examiner* — Dylan C Kershner
(74) *Attorney, Agent, or Firm* — CANTOR COLBURN LLP

(57) ABSTRACT

An organic light-emitting device comprising: a first electrode; a second electrode; and an emission layer between the first electrode and the second electrode, wherein the emission layer comprising a first compound, a second compound, and a third compound, the first compound comprising at least one compound represented by one of Formulae 1-1 to 1-4, the second compound comprising at least one compound represented by one of Formulae 2-1 to 2-4, and the third compound includes at least one of a triphenylene group, a dibenzofuran group, a dibenzothiophene group, a fluorene group, a biscarbazole group, or any combination thereof, wherein a band gap between a highest occupied molecular orbital (HOMO) band energy level and a lowest unoccupied molecular orbital (LUMO) band energy level of the third compound is 3.3 eV or more. Formulae 1-1 to 1-4 and Formulae 2-1 to 2-4 are described herein.

17 Claims, 1 Drawing Sheet

(56) References Cited

U.S. PATENT DOCUMENTS

| | | | | |
|---|---|---|---|---|
| 2011/0084599 | A1* | 4/2011 | Brooks | C09K 11/025<br>313/504 |
| 2011/0291080 | A1 | 12/2011 | Schmid et al. | |
| 2012/0211736 | A1* | 8/2012 | Kim | H10K 85/6576<br>548/440 |
| 2013/0009139 | A1 | 1/2013 | Ohsawa et al. | |
| 2013/0056720 | A1* | 3/2013 | Kim | H01L 51/0067<br>257/E51.026 |
| 2013/0341599 | A1 | 12/2013 | Xia et al. | |
| 2014/0070196 | A1 | 3/2014 | Kim et al. | |
| 2014/0374728 | A1* | 12/2014 | Adamovich | H05B 33/10<br>257/40 |
| 2015/0249221 | A1 | 9/2015 | Zeng et al. | |
| 2015/0318510 | A1 | 11/2015 | Ito et al. | |
| 2015/0349268 | A1 | 12/2015 | Zeng et al. | |
| 2016/0093808 | A1 | 3/2016 | Adamovich et al. | |
| 2016/0233436 | A1 | 8/2016 | Zeng et al. | |
| 2016/0315259 | A1 | 10/2016 | Fennimore et al. | |
| 2017/0012207 | A1 | 1/2017 | Seo et al. | |
| 2017/0047527 | A1* | 2/2017 | Lee | C09K 11/025 |
| 2017/0092873 | A1 | 3/2017 | Kang et al. | |
| 2017/0098778 | A1* | 4/2017 | Oh | C07D 251/24 |
| 2017/0117487 | A1 | 4/2017 | Kawakami et al. | |
| 2017/0162796 | A1* | 6/2017 | Jeong | H10K 85/622 |
| 2017/0200920 | A1 | 7/2017 | Nishimura et al. | |
| 2017/0309829 | A1 | 10/2017 | Jung et al. | |
| 2017/0331048 | A1* | 11/2017 | Cho | H01L 51/0067 |
| 2017/0338432 | A1* | 11/2017 | Adamovich | H01L 51/504 |
| 2018/0019411 | A1 | 1/2018 | Otsuki et al. | |
| 2018/0083195 | A1* | 3/2018 | Lim | C08G 61/126 |
| 2018/0138420 | A1 | 5/2018 | Tada et al. | |
| 2018/0138422 | A1* | 5/2018 | Cha | H01L 51/0056 |
| 2019/0214570 | A1 | 7/2019 | Inayama et al. | |
| 2020/0207732 | A1 | 7/2020 | Numata et al. | |
| 2020/0266357 | A1* | 8/2020 | Lui | H10K 85/6572 |
| 2021/0050547 | A1 | 2/2021 | Li et al. | |
| 2021/0226130 | A1* | 7/2021 | Park | C07D 209/86 |

FOREIGN PATENT DOCUMENTS

| | | | | |
|---|---|---|---|---|
| EP | 2966706 | A2 | 1/2016 | |
| EP | 3244466 | A1 | 11/2017 | |
| JP | 2001257076 | A | 9/2001 | |
| JP | 2002260861 | A | 9/2001 | |
| JP | 2001313179 | A | 11/2001 | |
| JP | 2001357977 | A | 12/2001 | |
| JP | 2002008860 | A | 1/2002 | |
| JP | 2002015871 | A | 1/2002 | |
| JP | 2002043056 | A | 2/2002 | |
| JP | 200275645 | A | 3/2002 | |
| JP | 2002105445 | A | 4/2002 | |
| JP | 2002141173 | A | 5/2002 | |
| JP | 2002203683 | A | 7/2002 | |
| JP | 2002231453 | A | 8/2002 | |
| JP | 2002234888 | A | 8/2002 | |
| JP | 2002255934 | A | 9/2002 | |
| JP | 2002280183 | A | 9/2002 | |
| JP | 2002299060 | A | 10/2002 | |
| JP | 2002302516 | A | 10/2002 | |
| JP | 2002305083 | A | 10/2002 | |
| JP | 2002305084 | A | 10/2002 | |
| JP | 2002308837 | A | 10/2002 | |
| JP | 2002308855 | A | 10/2002 | |
| JP | 2002319491 | A | 10/2002 | |
| JP | 2002334786 | A | 11/2002 | |
| JP | 2002334787 | A | 11/2002 | |
| JP | 2002334788 | A | 11/2002 | |
| JP | 2002334789 | A | 11/2002 | |
| JP | 2002338579 | A | 11/2002 | |
| JP | 2002343568 | A | 11/2002 | |
| JP | 2002352957 | A | 12/2002 | |
| JP | 2002363227 | A | 12/2002 | |
| JP | 200327048 | A | 1/2003 | |
| JP | 2003003165 | A | 1/2003 | |
| JP | 2012033784 | A | 2/2012 | |
| JP | 2012508258 | A | 4/2012 | |
| JP | 2012186461 | A | 9/2012 | |
| JP | 2013033958 | A | 2/2013 | |
| JP | 2014509067 | A | 4/2014 | |
| JP | 2014519707 | A | 8/2014 | |
| JP | 5729957 | B2 | 6/2015 | |
| JP | 6763309 | B2 | 6/2015 | |
| JP | 6286033 | B2 | 8/2016 | |
| JP | 2017022378 | A | 1/2017 | |
| JP | 2017081909 | A | 5/2017 | |
| JP | 2017195373 | A | 10/2017 | |
| JP | 2018009078 | A | 1/2018 | |
| JP | 2019119723 | A | 7/2019 | |
| KR | 1020080028212 | A | 3/2008 | |
| KR | 1020160031073 | A | 3/2016 | |
| KR | 1020160050614 | A | 5/2016 | |
| KR | 20170037276 | A | 4/2017 | |
| KR | 1020170096860 | A | 8/2017 | |
| WO | 2011159872 | A1 | 12/2011 | |
| WO | 2012133644 | A1 | 10/2012 | |
| WO | 2013112557 | A1 | 8/2013 | |
| WO | 12160859 | A1 | 7/2014 | |
| WO | WO-2015009102 | A1 * | 1/2015 | C07D 209/88 |
| WO | 2016194604 | A1 | 12/2016 | |
| WO | 2017092495 | A1 | 6/2017 | |

OTHER PUBLICATIONS

English Abstract of JP 2001-257076.
English Abstract of JP 2001-313179.
English Abstract of JP 2001-357977.
English Abstract of JP 2002-008860.
English Abstract of JP 2002-015871.
English Abstract of JP 2002-203683.
English Abstract of JP 2002-231453.
English Abstract of JP 2002-234888.
English Abstract of JP 2002-255934.
English Abstract of JP 2002-299060.
English Abstract of JP 2002-302516.
English Abstract of JP 2002-305083.
English Abstract of JP 2002-308837.
English Abstract of JP 2002-308855.
English Abstract of JP 2002-334786.
English Abstract of JP 2002-334787.
English Abstract of JP 2002-334788.
English Abstract of JP 2002-334789.
English Abstract of JP 2002-343568.
English Abstract of JP 2002-352957.
English Abstract of JP2016524333.
English Abstract of KR 10-2016-0031073.
English Abstract of KR 10-2016-0050614.
English Abtract of JPWO12160859.
English translation of Office Action dated Oct. 4, 2022, issued in corresponding JP Patent Application No. 2018-248433, 13 pp.
Office Action dated Oct. 4, 2022, issued in corresponding JP Patent Application No. 2018-248433, 14 pp.
Su, Shi-Jian et al., RGB Phosphorescent Organic Light-Emitting Diode s by Using Host Materials with Heterocyclic Cores: Effect of Nitrogen At om Orientations, Chem. Mater., 2010, vol. 23, pp. 274-284 (document indicating the reference technology).
English Translation of Office Action issued in corresponding JP Patent Application No. 2018-248443, dated Dec. 27, 2022, 7 pp.
Office Action issued in corresponding JP Patent Application No. 2018-248443, dated Dec. 27, 2022, 5 pp.
English Translation of Office Action dated Mar. 7, 2023 issued in corresponding JP Patent Application No. 2018-248433, 14 pp.
Office Action dated Mar. 7, 2023 issued in corresponding JP Patent Application No. 2018-248433, 12 pp.
English Translation of Office Action dated May 31, 2024, issued in corresponding KR Patent Application No. 10-2019-0109515, 13 pp.
Office Action dated May 31, 2024, issued in corresponding KR Patent Application No. 10-2019-0109515, 14 pp.

(56) References Cited

OTHER PUBLICATIONS

Chinese Office Action for Chinese Patent Application No. 201911426185.1 dated Feb. 29, 2024.

* cited by examiner

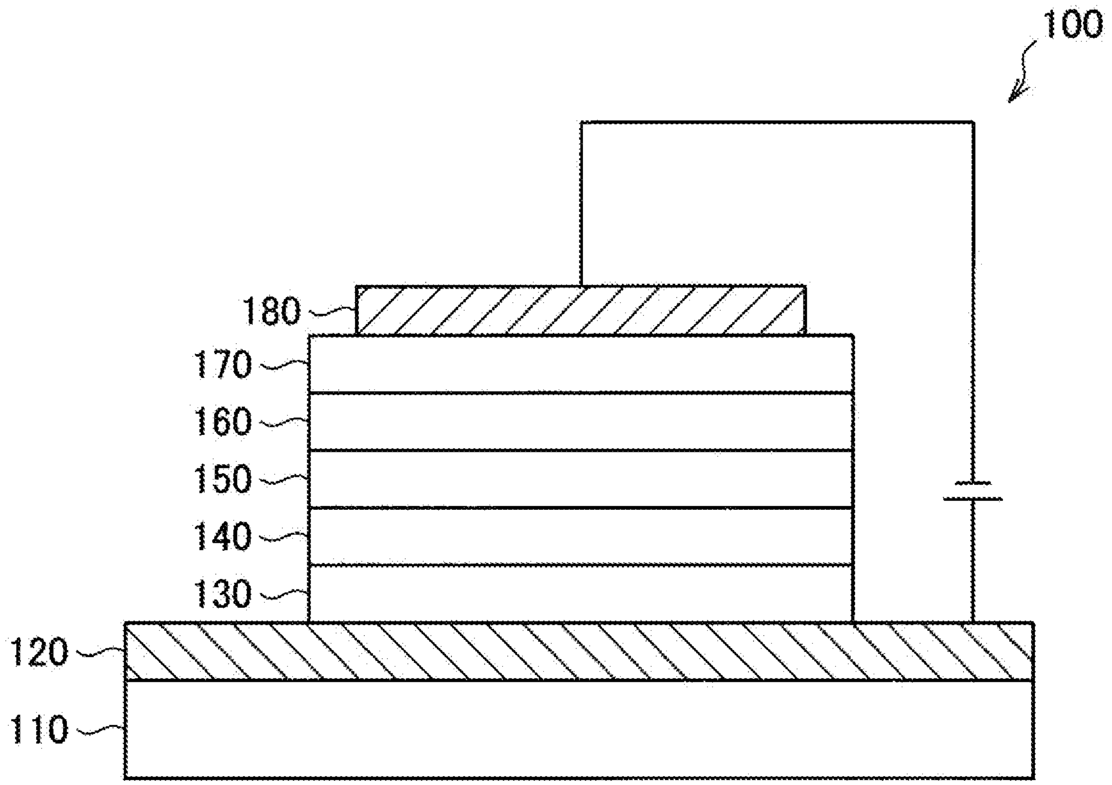
100
180
170
160
150
140
130
120
110

ORGANIC LIGHT-EMITTING DEVICE AND APPARATUS INCLUDING THE SAME

CROSS-REFERENCE TO RELATED APPLICATIONS

This application claims priority to and the benefit of Japanese Patent Application No. 2018-248433, filed on Dec. 28, 2018, in the Japanese Patent Office and Korean Patent Application No. 10-2019-0109515, filed on Sep. 4, 2019, in the Korean Intellectual Property Office, and all the benefits accruing under 35 U.S.C. § 119, the contents of which are incorporated herein in their entireties by reference.

BACKGROUND

1. Field

One or more embodiments relate to an organic light-emitting device and an apparatus including the same.

2. Description of the Related Art

Organic light-emitting devices are self-emission devices that produce full-color images, and also have wide viewing angles, high contrast ratios, short response times, and excellent characteristics in terms of brightness, driving voltage, and response speed, compared to devices in the art.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Aspects of the present disclosure provide an organic light-emitting device including an emission layer including three compounds that are different from each other, and an apparatus including the organic light-emitting device.

Additional aspects will be set forth in part in the description which follows and, in part, will be apparent from the description, or may be learned by practice of the presented embodiments.

An aspect of the present disclosure provides an organic light-emitting device including:

a first electrode;

a second electrode; and an emission layer between the first electrode and the second electrode, wherein the emission layer includes a first compound, a second compound, and a third compound, the first compound includes at least one compound represented by one of Formulae 1-1 to 1-4, the second compound includes at least one compound represented by one of Formulae 2-1 to 2-4, and the third compound includes at least one of a triphenylene group, a dibenzofuran group, a dibenzothiophene group, a fluorene group, a biscarbazole group, or any combination thereof, wherein a band gap between a highest occupied molecular orbital (HOMO) band energy level and a lowest unoccupied molecular orbital (LUMO) band energy level of the third compound is 3.3 eV or more:

1-1

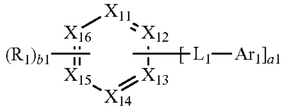

1-2

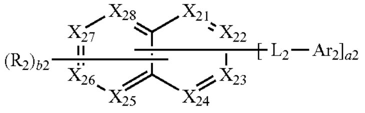

1-3

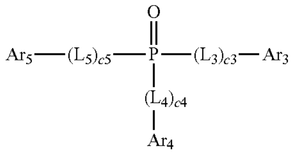

1-4

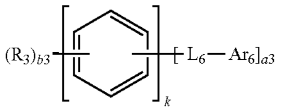

2-1

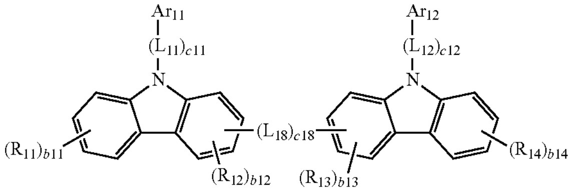

2-2

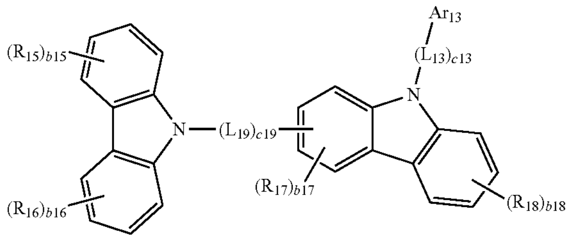

2-3

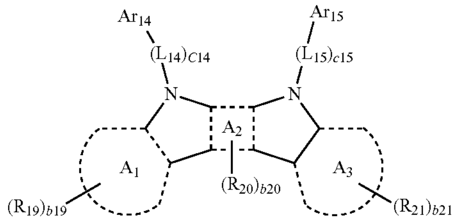

-continued 2-4

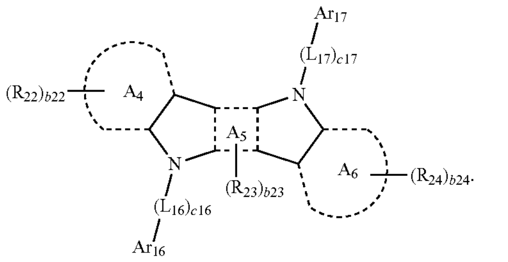

In Formulae 1-1 to 1-4, $X_{11}$ to $X_{16}$ and $X_{21}$ to $X_{28}$ may each independently be C or N, at least one $X_{11}$ to $X_{16}$ may be N, at least one $X_{21}$ to $X_{28}$ may be N, $L_1$ to $L_6$ may each independently be a single bond, a substituted or unsubstituted $C_6$-$C_{30}$ arylene group, a substituted or unsubstituted $C_1$-$C_{30}$ heteroarylene group, a divalent non-aromatic condensed polycyclic group, or a divalent non-aromatic condensed heteropolycyclic group, c3 to c5 may each independently be an integer from 1 to 3, $Ar_1$ to $Ar_6$ may each independently be a substituted or unsubstituted C5-C30 aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, any two adjacent groups among $Ar_3$ to $Ar_5$ may optionally be linked to each other to form a condensed ring via a single bond, a1 to a3 may each independently be an integer from 1 to 3, $R_1$ to $R_3$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b1 may be an integer from 0 to 4, b2 may be an integer from 0 to 6, b3 may be an integer from 7 to 11, and k may be 3 or 4.

In Formulae 2-1 to 2-4, $A_1$ to $A_6$ may each independently be a $C_5$-$C_{30}$ carbocyclic group or a $C_1$-$C_{30}$ heterocyclic group, $L_{11}$ to $L_{19}$ may each independently be a single bond, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, or a substituted or unsubstituted divalent non-aromatic condensed heteropolycyclic group, c11 to c19 may each independently be an integer from 1 to 3, $Ar_{11}$, $Ar_{12}$, and $Ar_{14}$ to $Ar_{17}$ may each independently be a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, wherein each of $Ar_{14}$ and $Ar_{15}$ may not be an indolocarbazole group, and each of $Ar_{16}$ and $Ar_{17}$ may not be a naphthyl group at the same time, $Ar_{13}$ may be a substituted or unsubstituted $C_6$-$C_{30}$ aryl group or a substituted or unsubstituted monovalent non-aromatic condensed polycyclic group, $R_{11}$ to $R_{24}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, a substituted or unsubstituted $C_6$-$C_{30}$ aryl group, and a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, b11, b14, b15, b16, and b18 to b24 may each independently be an integer from 0 to 4, b12, b13, and b17 may each independently be an integer from 0 to 3, at least one substituent of the substituted $C_6$-$C_{30}$ arylene group, the substituted $C_1$-$C_{30}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{30}$ aryl group, the substituted $C_1$-$C_{30}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a C1-$C_{60}$ alkyl group, a $C_2$-$C_{60}$ alkenyl group, a $C_2$-$C_{60}$ alkynyl group, a $C_1$-$C_{60}$ alkoxy group, or any combination thereof; a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q21)(Q22), —Si(Q23)(Q24)(Q25), —$B(Q_{26})(Q_{27})$-$P(=O)(Q_{28})(Q_{29})$, or any combination thereof; and —$N(Q_{31})(Q_{32})$, —$Si(Q_{33})(Q_{34})(Q_{35})$, —$B(Q_{36})(Q_{37})$, —$P(=O)(Q_{38})(Q_{39})$, or any combination thereof, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Another aspect of the present disclosure provides an apparatus including the organic light-emitting device. For example, the apparatus may include a light-emitting device and an electronic device, wherein the light-emitting device may include a lighting display, and the electronic device may include a computer, a mobile phone, an electronic dictionary, a medical device, and a projector.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Hereinafter, the present disclosure will be described in detail by explaining embodiments with reference to the accompanying drawing. In addition, like reference numerals in the present specification and drawing denote like elements having substantially the same functions and/or features, and thus their description will be omitted.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organic light-emitting device including: a first electrode; a second electrode; and an emission layer between the first electrode and the second electrode, wherein the emission layer includes a first compound, a second compound, and a third compound, the first compound includes at least one compound represented by one of Formulae 1-1 to 1-4, the second compound includes at least one compound represented by one of Formulae 2-1 to 2-4, and the third compound includes at least one of a triphenylene group, a dibenzofuran group, a dibenzothiophene group, a fluorene group, a biscarbazole group, or any combination thereof, wherein a band gap between a highest occupied molecular orbital (HOMO) band energy level and a lowest unoccupied molecular orbital (LUMO) band energy level of the third compound is 3.3 eV or more:

1-1

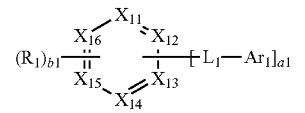

1-2

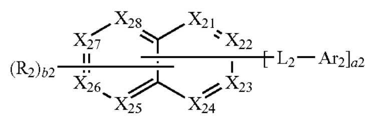

1-3

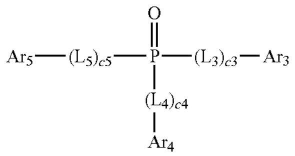

1-4

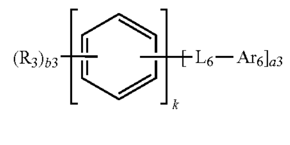

-continued 2-1

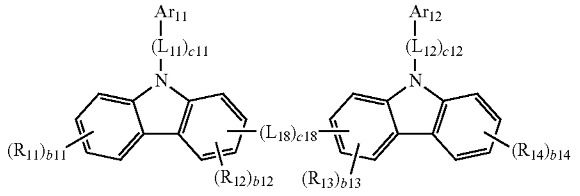

2-2

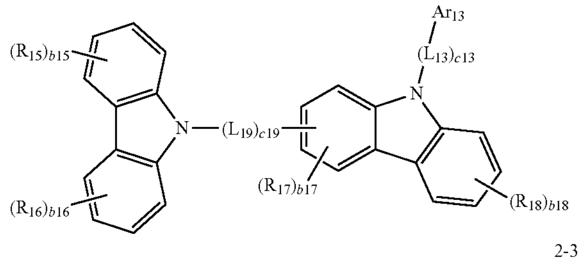

2-3

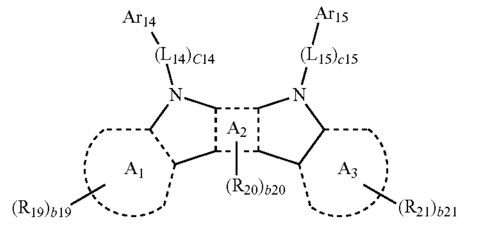

2-4

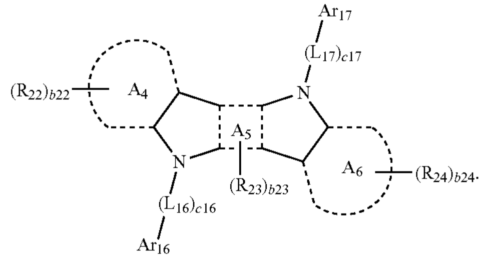

Formulae 1-1 to 1-4 will be described in detail below.

$X_{11}$ to $X_{16}$ and $X_{21}$ to $X_{28}$ may each independently be C or N.

In one or more embodiments, at least one $X_{11}$ to $X_{16}$ may be N, and at least one $X_{21}$ to $X_{28}$ may be N.

For example, (i) $X_{11}$ may be N, and $X_{12}$ to $X_{16}$ may each be C, (ii) $X_{11}$ and $X_{12}$ may each be N, and $X_{13}$ to $X_{16}$ may each be C, (iii) $X_{11}$ and $X_{13}$ may each be N, and $X_{12}$ and $X_{14}$ to $X_{16}$ may each be C, (iv) $X_{11}$ and $X_{14}$ may each be N, and $X_{12}$, $X_{13}$, $X_{15}$, and $X_{16}$ may each be C, (v) $X_{11}$ to $X_{13}$ may each be N, an d $X_{14}$ to $X_{16}$ may each be C, (vi) $X_{11}$, $X_{12}$, and $X_{14}$ may each be N, and $X_{13}$, $X_{15}$, and $X_{16}$ may each be C, or (vii) $X_{11}$, $X_{13}$, and $X_{15}$ may each be N, and $X_{12}$, $X_{14}$, and $X_{16}$ may each be C.

For example, (i) $X_{21}$ may be N, and $X_{22}$ to $X_{28}$ may each be C, (ii) $X_{22}$ may be N, and $X_{21}$ and $X_{23}$ to $X_{28}$ may each be C, (iii) $X_{21}$ and $X_{22}$ may each be N, and $X_{23}$ to $X_{28}$ may each be C, (iv) $X_{21}$ and $X_{23}$ may each be N, and $X_{22}$ and $X_{24}$ to $X_{28}$ may each be C, or (v) $X_{21}$ and $X_{24}$ may each be N, and $X_{22}$, $X_{23}$, and $X_{25}$ to $X_{28}$ may each be C.

$L_1$ to $L_6$ may each independently be a single bond, a substituted or unsubstituted $C_6$-$C_{30}$ arylene group, a substituted or unsubstituted $C_1$-$C_{30}$ heteroarylene group, a divalent non-aromatic condensed polycyclic group, or a divalent non-aromatic condensed heteropolycyclic group.

In one or more embodiments, $L_1$ to $L_6$ and $L_{11}$ to $L_{19}$ may each independently be a single bond, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolyl benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a pentalenyl group, an indenyl group, a naphthyl group, an azulenyl group, a heptalenyl group, an indacenyl group, an acenaphthyl group, a fluorenyl group, a spiro-fluorenylene group, a benzofluorenylene group, a dibenzofluorenylene group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolylene group, a dibenzocarbazolylene group, or any combination thereof, but embodiments of the present disclosure are not limited thereto.

c3 to c5 may each independently be an integer from 1 to 3.

$Ar_1$ to $Ar_6$ may each independently be a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, wherein any two adjacent groups among $Ar_3$ to $Ar_5$ may optionally be linked to each other via a single bond to form a condensed ring.

In one or more embodiments, $Ar_1$ to $Ar_6$ may each independently be a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, or an indoloazadibenzothiophenyl group; or a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, or an indoloazadibenzothiophenyl group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, an indoloazadibenzothiophenyl group, or any combination thereof, but embodiments of the present disclosure are not limited thereto.

a1 to a3 may each independently be an integer from 1 to 3.

In one or more embodiments, when a1 is an integer of 2 or more, two or more $-L_1-Ar_1$ group(s) may be identical to or different from each other. For example, when a1 is 3, three $-L_1-Ar_1$ group(s) may be different from each other. When having such a structure, a compound may have low crystallinity, thereby improving dissolubility of the compound.

In one or more embodiments, when a2 is an integer of 2 or more, two or more $-L_2-Ar_2$ group(s) may be identical to or different from each other. For example, when a2 is 2, two $-L_2-Ar_2$ group(s) may be different from each other. When having such a structure, a compound may have low crystallinity, thereby improving the solubility of the compound.

In one or more embodiments, when a3 is an integer of 2 or more, two or more $-L_6-Ar_5$ group(s) may be identical to or different from each other. For example, when a3 is 2, two $-L_6-Ar_5$ group(s) may be different from each other. When having such a structure, a compound may have low crystallinity, thereby improving the solubility of the compound.

$R_1$ to $R_3$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group.

In one or more embodiments, $R_1$ to $R_3$ may each independently be hydrogen, deuterium, —F, —Cl, —Br, —I, a cyano group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, —F, —Cl, —Br, —I, a cyano group, a $C_1$-$C_{20}$ alkyl group, a $C_1$-$C_{20}$ alkoxy group, or any combination thereof, but embodiments of the present disclosure are not limited thereto.

For example, $R_1$ to $R_3$ may each independently be hydrogen, deuterium, —F, —Cl, —Br, —I, a cyano group, a methyl group, an ethyl group, a propyl group, an isopropyl group, a butyl group, an isobutyl group, a tert-butyl group, a sec-butyl group, a methoxy group, an ethoxy group, a propoxy group, or a butoxy group; or a methyl group, an ethyl group, a propyl group, an isopropyl group, a butyl group, an isobutyl group, a tert-butyl group, a sec-butyl group, a methoxy group, an ethoxy group, a propoxy group, or a butoxy group, each substituted with at least one deuterium, —F, —Cl, —Br, —I, a cyano group, a methyl group, an ethyl group, a propyl group, an isopropyl group, a butyl group, an isobutyl group, a tert-butyl group, a sec-butyl group, a methoxy group, an ethoxy group, a propoxy group, a butoxy group, or any combination thereof.

b1 may be an integer from 0 to 4, b2 may be an integer from 0 to 6, and b3 may be an integer from 7 to 11.

k may be 3 or 4.

In one or more embodiments, when k is 3, a compound having a structure in which three benzene rings are condensed, for example, an anthracene group or a phenanthrene group may be included. When k is 4, a compound having a structure in which four benzene rings are condensed, for example, a chrysene group, a tetracene group, or a benzanthracene group may be included.

Hereinafter, Formulae 2-1 to 2-4 will be described in detail.

$A_1$ to $A_6$ may each independently be a $C_5$-$C_{30}$ carbocyclic group or a $C_1$-$C_{30}$ heterocyclic group.

In one or more embodiments, $A_1$, $A_2$, $A_3$, $A_4$, $A_5$, and $A_6$ may each independently be a benzene group, a naphthalene group, an anthracene group, a thiophene group, a furan group, a pyrrole group, an indole group, an indene group, a benzosilole group, a benzothiophene group, a benzofuran group, a carbazole group, a fluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, but embodiments of the present disclosure are not limited thereto.

For example, $A_2$ and $A_5$ may each independently be a benzene group or a naphthalene group, and $A_1$, $A_3$, $A_4$, and $A_5$ may each independently be a benzene group, a naphthalene group, an indole group, an indene group, a benzosilole group, a benzothiophene group, a benzofuran group, a carbazole group, a fluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a benzopyrazole group, a benzimidazole group, a benzoxazole group, a benzothiazole group, a benzoxadiazole group, or a benzothiadiazole group.

For example, $A_1$ to $A_6$ may be all benzene groups.

$L_{11}$ to $L_{19}$ may each independently be a single bond, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, or a substituted or unsubstituted divalent non-aromatic condensed heteropolycyclic group.

$L_{11}$ to $L_{19}$ may each be understood by referring to description presented herein.

c11 to c19 may each independently be an integer from 1 to 3.

$Ar_{11}$, $Ar_{12}$, and $Ar_{14}$ to $Ar_{17}$ may each independently be a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, each of $Ar_{14}$ and $Ar_{15}$ may not be an indolocarbazole group, and each of $Ar_{16}$ and $Ar_{17}$ may not be a naphthyl group at the same time.

In one or more embodiments, $Ar_{11}$, $Ar_{12}$, and $Ar_{14}$ to $Ar_{17}$ may each independently be a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or a group represented by Formula a below, or a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or a group represented by Formula a below, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, $—N(Q_{11})(Q_{12})$, or any combination thereof, each of $Ar_{14}$ and $Ar_{16}$ may not be an indolocarbazole group, and each of $Ar_{16}$ and $Ar_{17}$ may not be a naphthalene group at the same time, and $Q_{11}$ and $Q_{12}$ may each independently be a phenyl group, a biphenyl group, a terphenyl group, or a naphthyl group.

Formula a

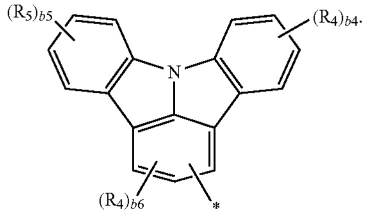

In Formula a, $R_4$ to $R_6$ may each independently be hydrogen, deuterium, —F, —Cl, —Br, —I, a cyano group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, —F, —Cl, —Br, —I, a cyano group, a $C_1$-$C_{20}$ alkyl group, a $C_1$-$C_{20}$ alkoxy group, or any combination thereof, and b4 is an integer from 0 to 4, b5 is an integer from 0 to 4, b6 is an integer from 0 to 3, and "*" indicates a binding site to a neighboring group.

$Ar_{13}$ may be a substituted or unsubstituted $C_6$-$C_{30}$ aryl group or a substituted or unsubstituted monovalent non-aromatic condensed polycyclic group.

In one or more embodiments, $Ar_{13}$ may be a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group;

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, or any combination thereof, but embodiments of the present disclosure are not limited thereto.

$R_{11}$ to $R_{24}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, a substituted or unsubstituted $C_6$-$C_{30}$ aryl group, and a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group.

In one or more embodiments, $R_{11}$ to $R_{24}$ may each independently be hydrogen, deuterium, —F, —Cl, —Br, —I, a cyano group, a $C_1$-$C_{20}$ alkyl group, a $C_1$-$C_{20}$ alkoxy group, or any combination thereof;

a $C_1$-$C_{20}$ alkyl group or a $C_1$-$C_{20}$ alkoxy group, each substituted with at least one deuterium, —F, —Cl, —Br, —I, a cyano group, or any combination thereof;

a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, or a dibenzocarbazolyl group; or a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, or a dibenzocarbazolyl group, each substituted with at least one a $C_1$-$C_{20}$ alkyl group, a $C_1$-$C_{20}$ alkoxy group, a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, and a dibenzocarbazolyl group that are each substituted with at least one deuterium, —F, —Cl, —Br, —I, a cyano group, or any combination thereof, but embodiments of the present disclosure are not limited thereto.

b11, b14, b15, b16, and b18 to b2 may each independently be an integer from 0 to 4.

b12, b13, and b17 may each independently be an integer from 0 to 3.

The third compound may include at least one group represented by Formulae 3-1 to 3-4:

3-1

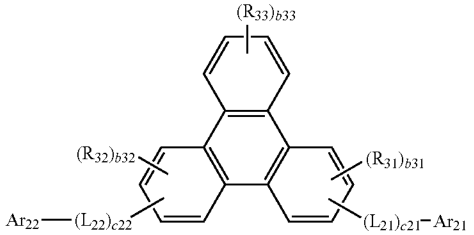

3-2

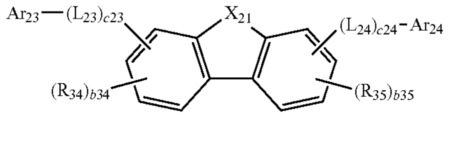

3-3

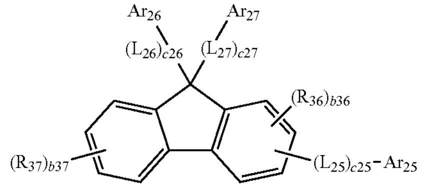

3-4

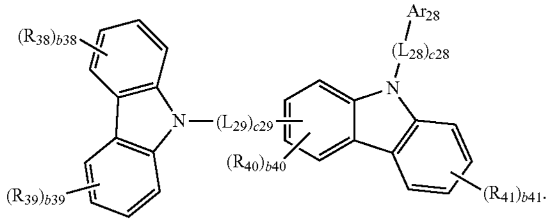

In Formulae 3-1 to 3-4, $X_{21}$ may be O or S, $L_{21}$ to $L_{29}$ may each independently be a single bond, a substituted or unsubstituted $C_6$-$C_{30}$ arylene group, a substituted or unsubstituted $C_1$-$C_{30}$ heteroarylene group, a divalent non-aromatic condensed polycyclic group, or a divalent non-aromatic condensed heteropolycyclic group, c21 to c29 may each independently be an integer from 1 to 3, $Ar_{21}$ to $Ar_{28}$ may each independently be hydrogen, a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, each of $Ar_{21}$ and $Ar_{22}$ may not be hydrogen at the same time, $Ar_{26}$ and $Ar_{27}$ may optionally be linked to form a condensed ring via a single bond, $R_{31}$ to $R_{41}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b31, b32, b34, b35, b36, and b40 may each independently be an integer from 0 to 3, and b33, b37, b38, b39, and b41 may each independently be an integer from 0 to 4.

In one or more embodiments, $Ar_{23}$ and $Ar_{24}$ in Formula 3-2 may be different from each other, and when having such a structure, a compound may have low crystallinity, thereby improving the solubility of the compound.

In one or more embodiments, $L_{21}$ to $L_{29}$ may each independently be a single bond, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group; or a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a pentalenyl group, an indenyl group, a naphthyl group, an azulenyl group, a heptalenyl group, an indacenyl group, an acenaphthyl group, a fluorenyl group, a spiro-fluorenylene group, a benzofluorenylene group, a dibenzofluorenylene group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolylene group, a dibenzocarbazolylene group, or any combination thereof, but embodiments of the present disclosure are not limited thereto.

In one or more embodiments, $Ar_{21}$ to $Ar_{28}$ may each independently be hydrogen, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group;

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, or any combination thereof.

In one or more embodiments, Formula 1-1 may be represented by Formula 1-1(1),

Formula 1-2 may be represented by Formula 1-2(1), and

Formula 1-4 may be represented by one of Formulae 1-4(1), 1-4(2), and 1-4(3):

1-1(1)

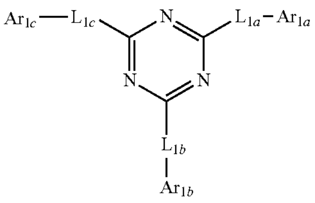

1-2(1)

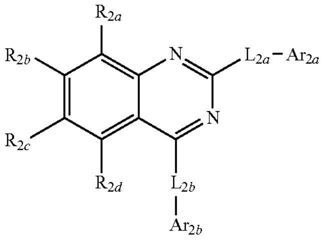

1-4(1)

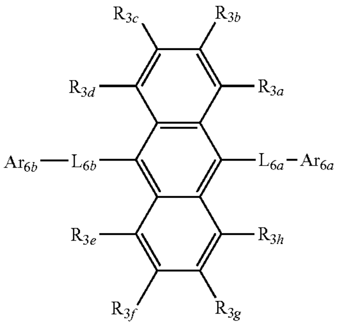

-continued 1-4(2)

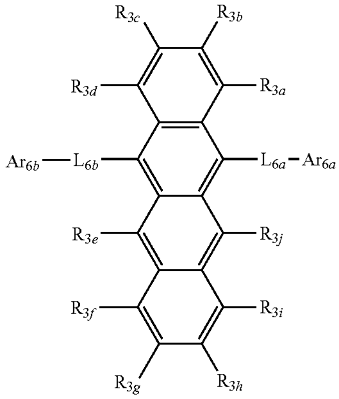

1-4(3)

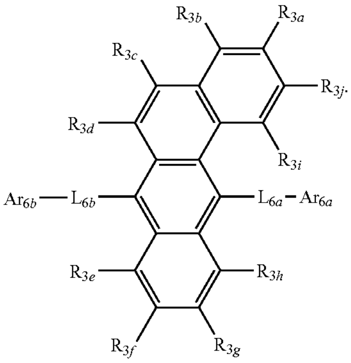

In Formula 1-1(1) $L_{1a}$, $L_{1b}$, and $L_{1c}$ may each independently be understood by referring to the description presented in connection with L1, and $Ar_{1a}$, $Ar_{1b}$, and $Ar_{1c}$ may each independently be understood by referring to the description presented in connection with $Ar_1$.

In Formula 1-2(1), $L_{2a}$ and $L_{2b}$ may each independently be understood by referring to the description presented in connection with $L_2$, $Ar_{2a}$ and $Ar_{2b}$ may each independently be understood by referring to the description presented in connection with $Ar_2$, and $R_{2a}$, $R_{2b}$, $R_{2c}$, and $R_{2d}$ may each independently be understood by referring to the description presented in connection with $R_2$.

In Formula 1-4(1) to 1-4(3), $L_{6a}$ and $L_{6b}$ may each independently be understood by referring to the description presented in connection with $L_6$, $Ar_{6a}$ and $Ar_{6b}$ may each independently be understood by referring to the description presented in connection with $Ar_6$ and $R_{3a}$ to $R_{3j}$ may each independently be understood by referring to the description presented in connection with $R_3$.

In Formula 1-1(1), $Ar_{1a}$, $Ar_{1b}$, and $Ar_{1c}$ may be different from each other, and a compound having such a structure may have low crystallinity, thereby improving dissolubility of the compound.

The first compound may include at least one of the following compounds:

-continued
1
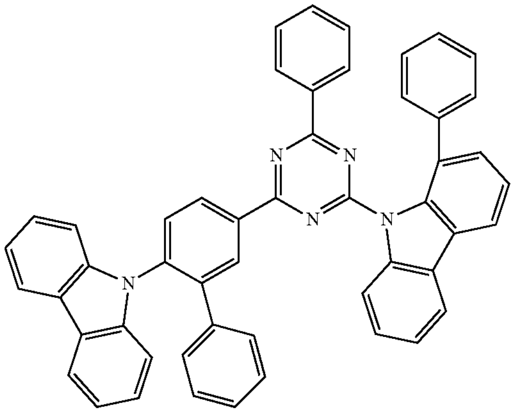
2
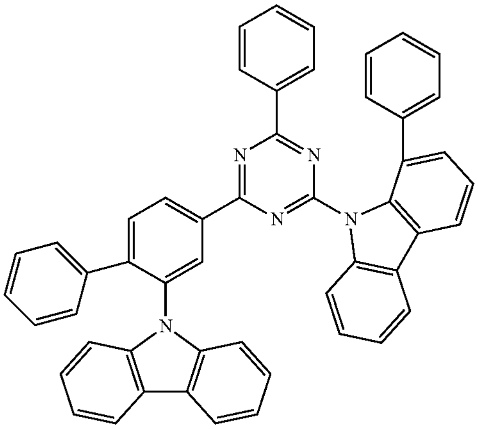
3
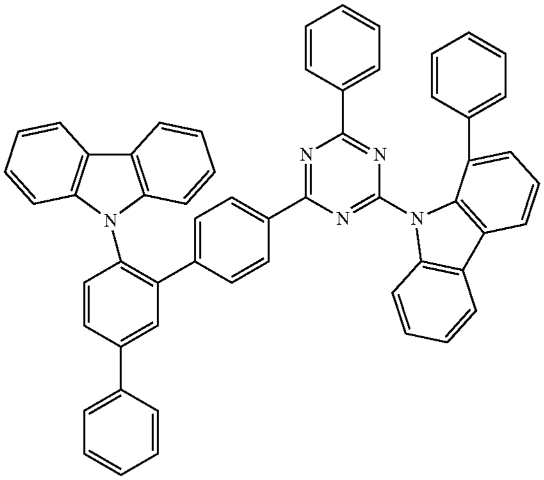
4
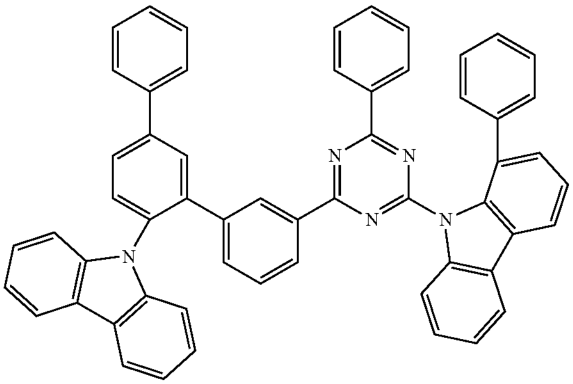
5
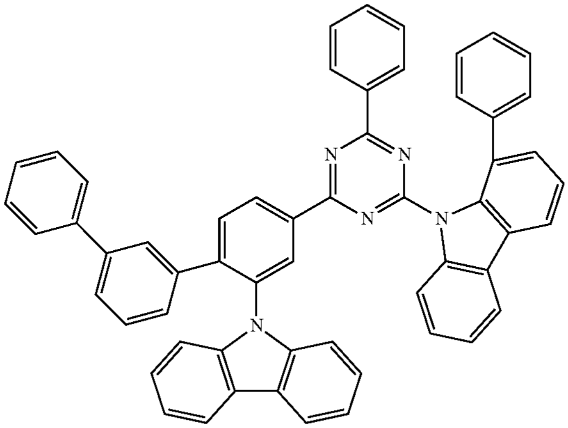
6
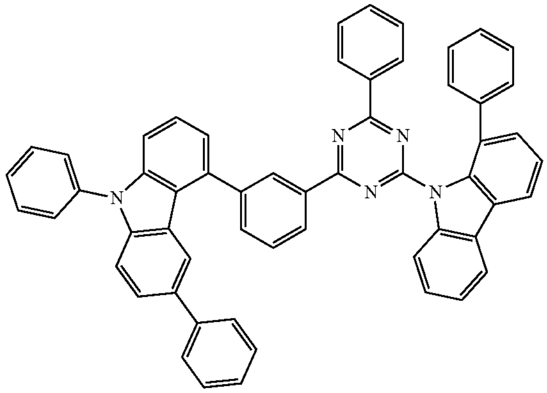

-continued
7
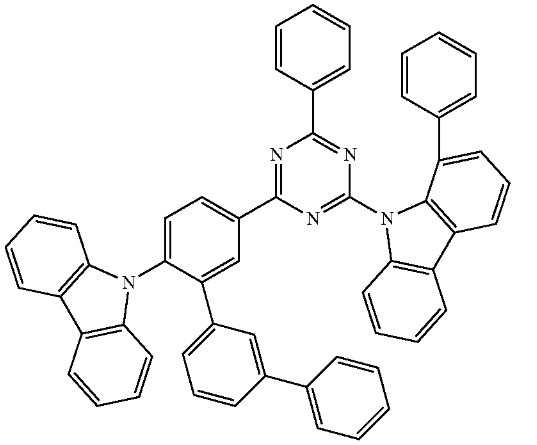
8
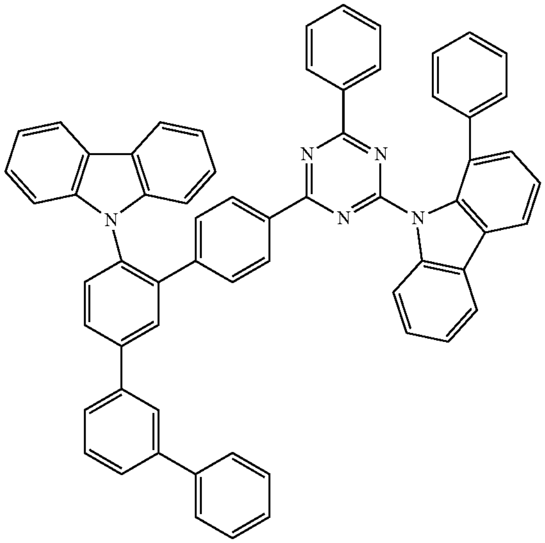
9
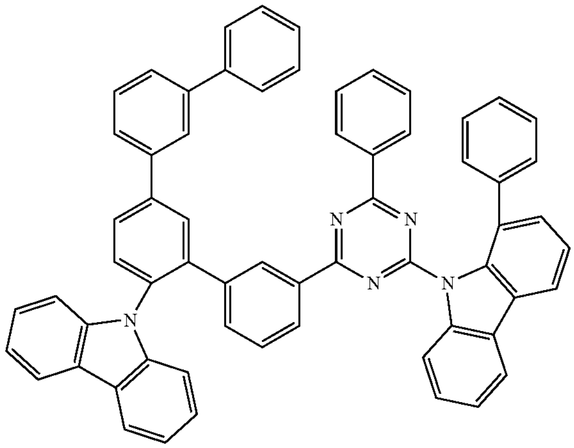
-continued
10
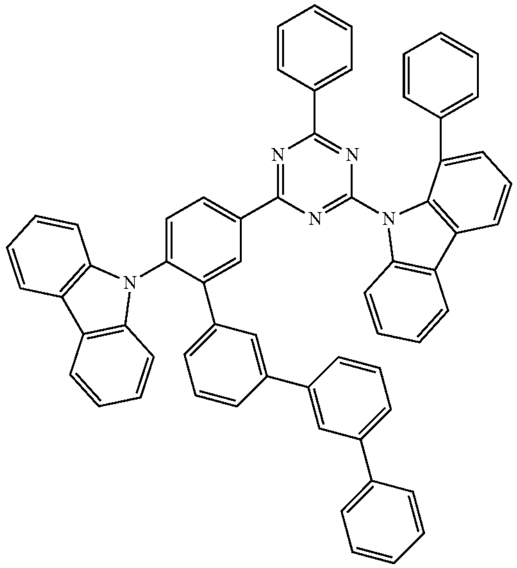
11
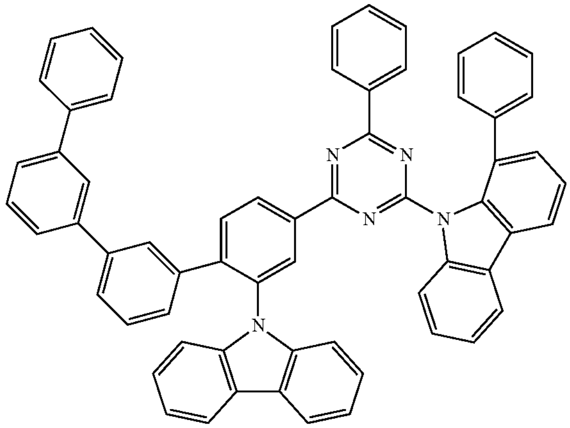
12
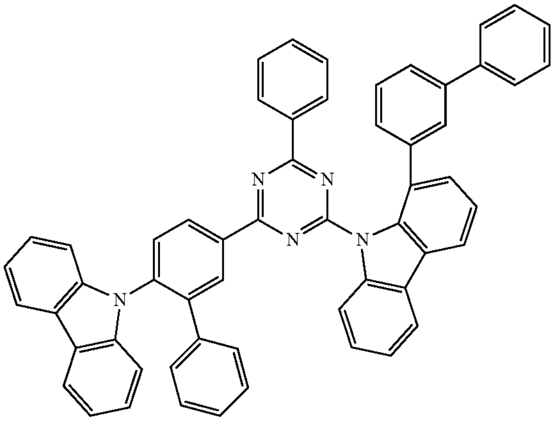

-continued
13
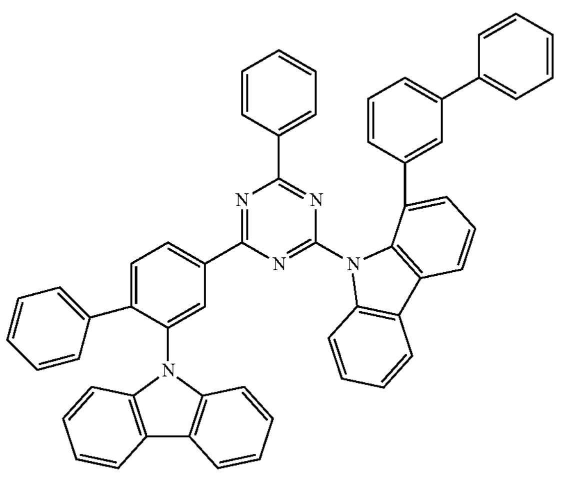
14
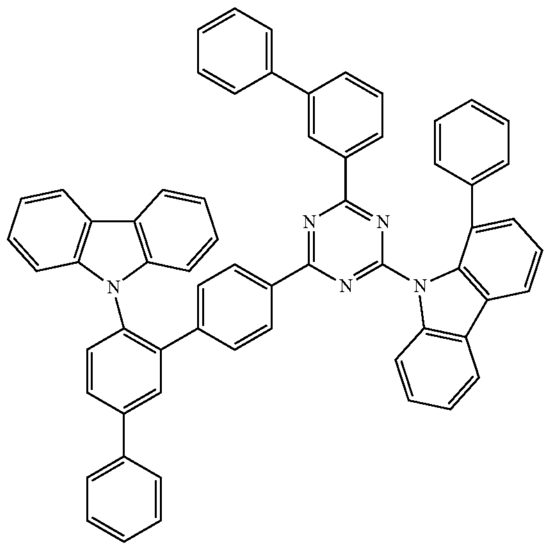
15
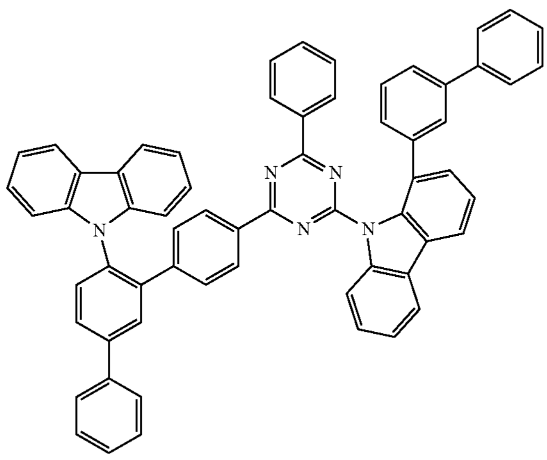
-continued
16
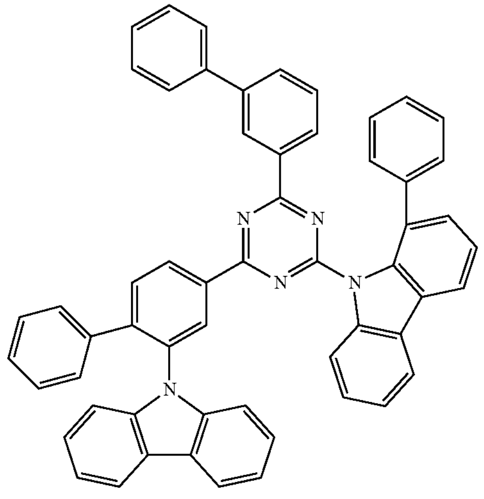
17
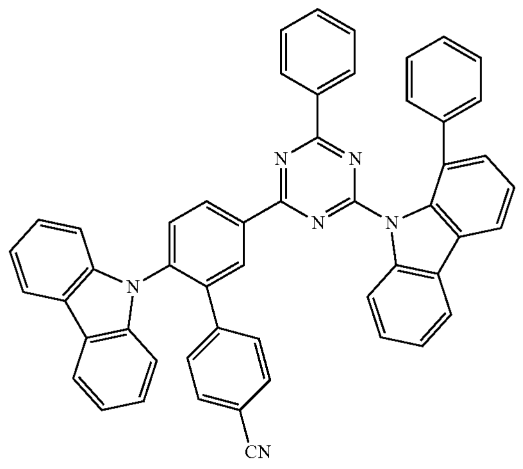
18
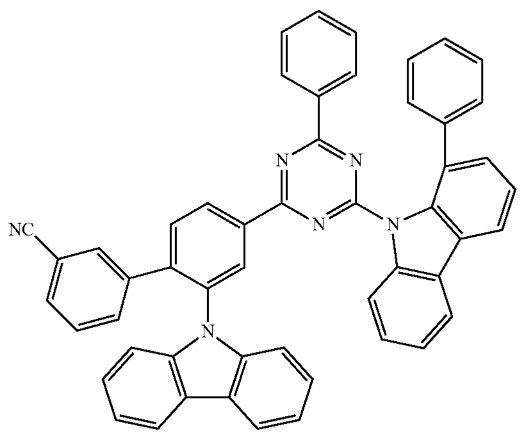

-continued
19
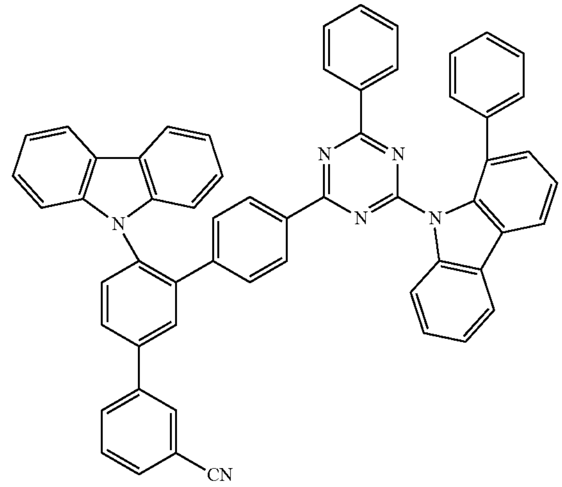
20
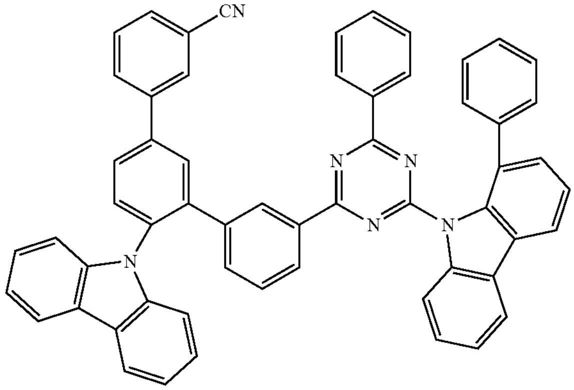
21
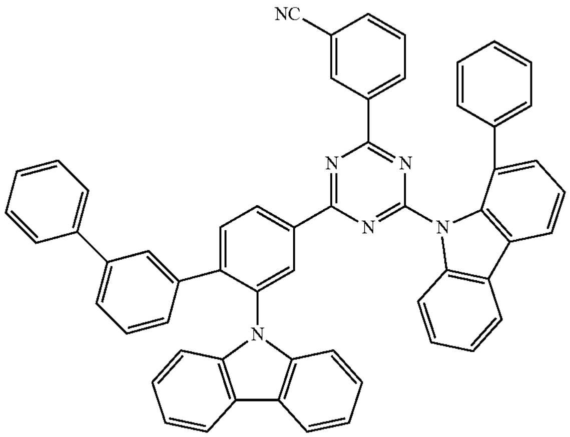
-continued
22
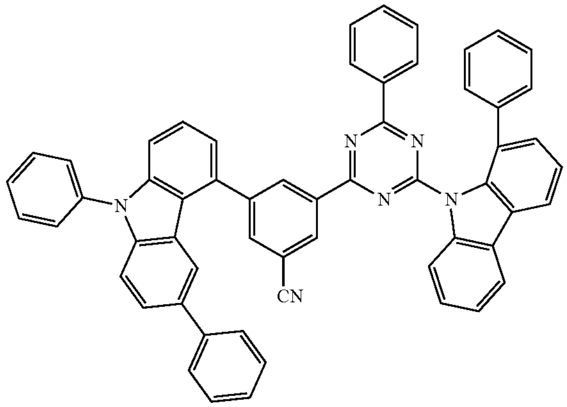
23
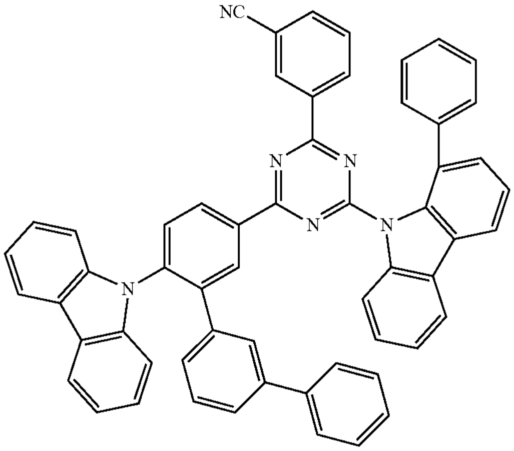
24
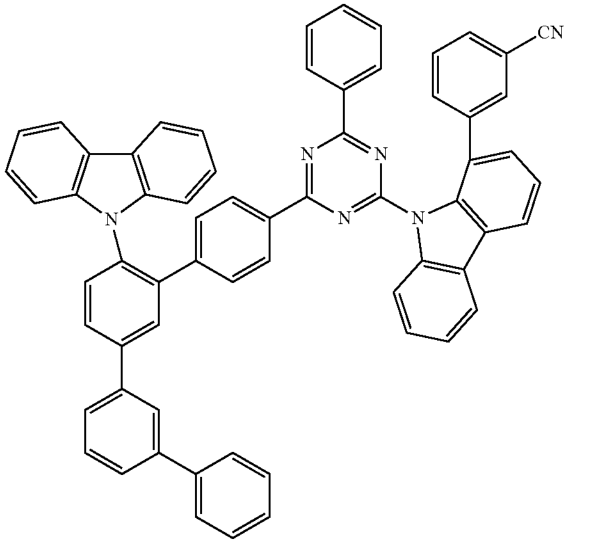

-continued
25
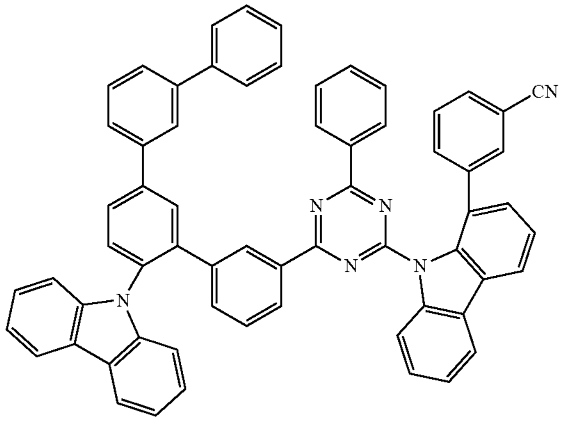
26
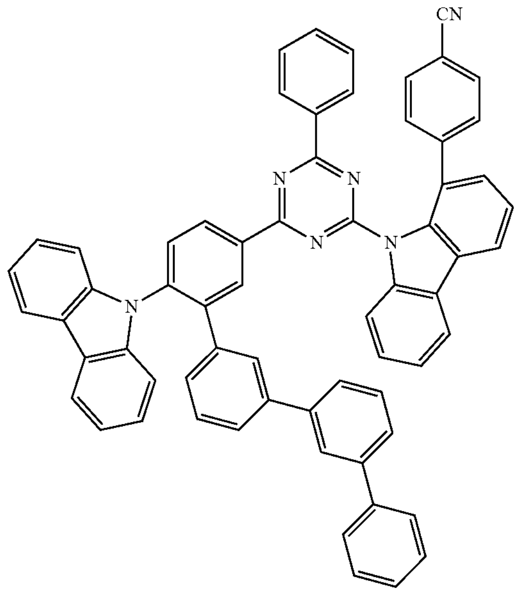
27
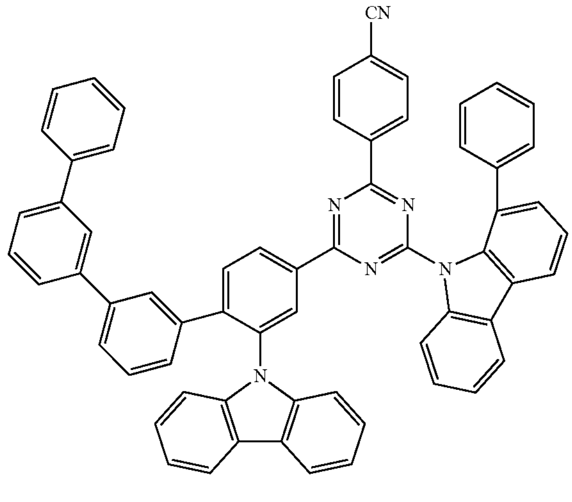
-continued
28
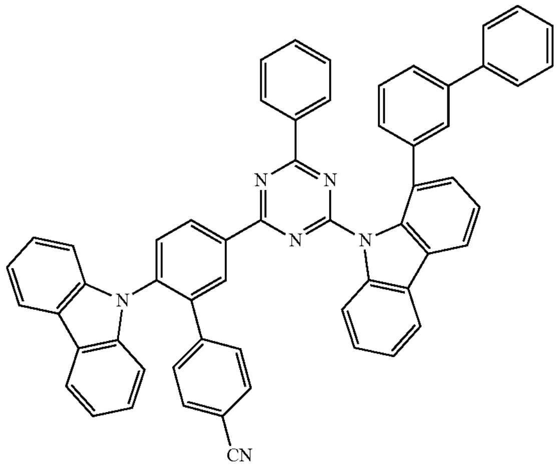
29
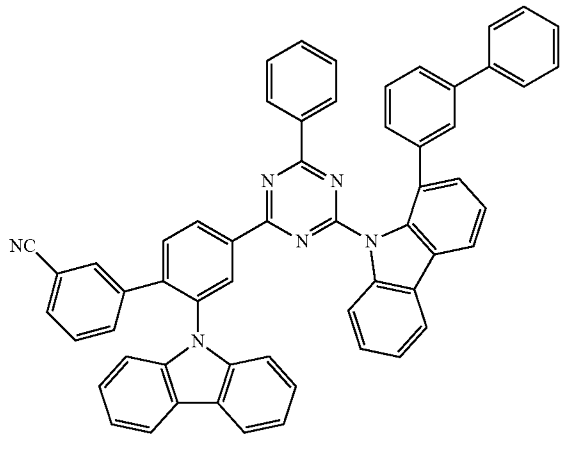
30
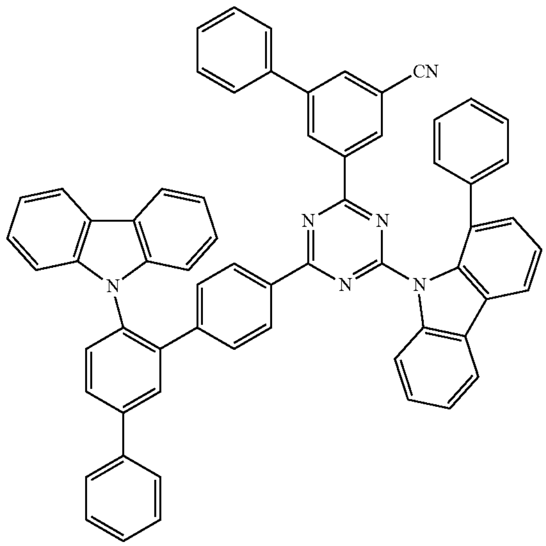

-continued
31
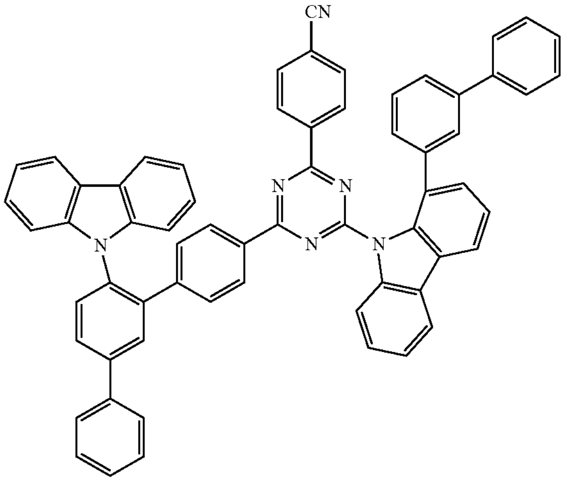
32
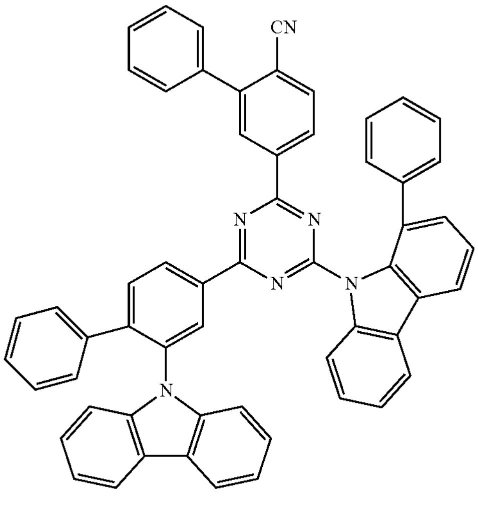
33
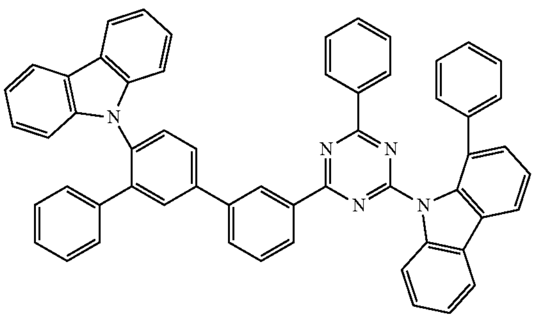
-continued
34
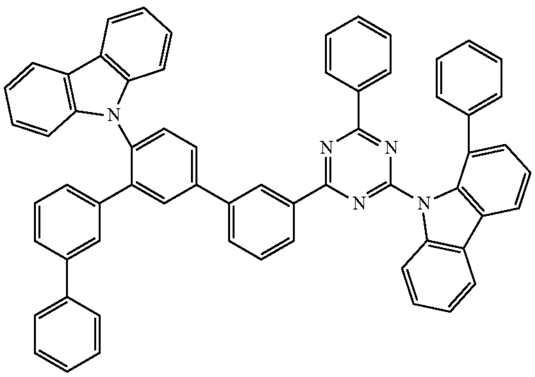
35
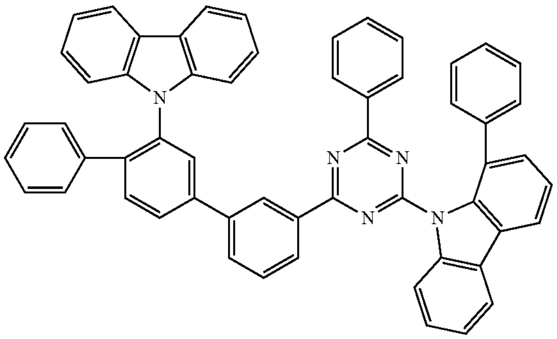
36
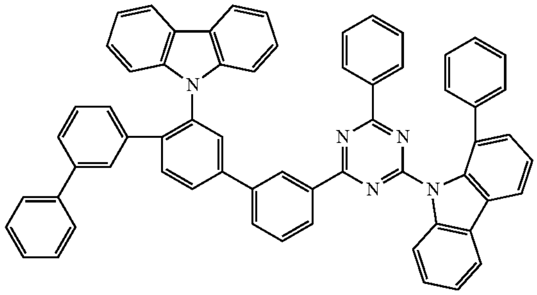
37
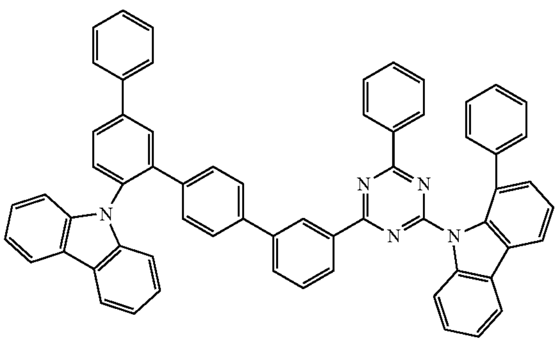

-continued
38
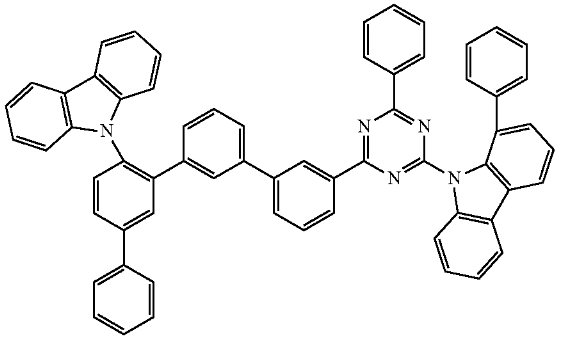
39
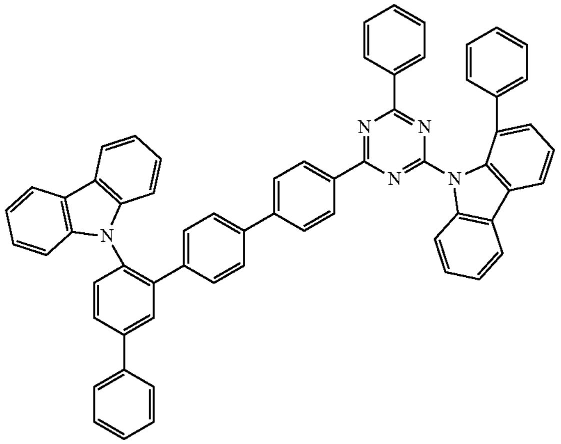
40
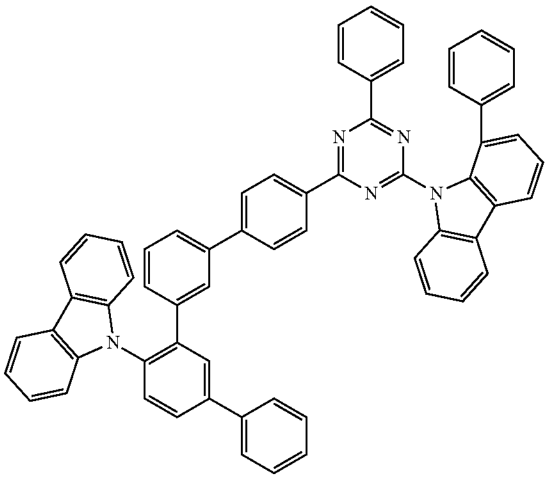
-continued
41
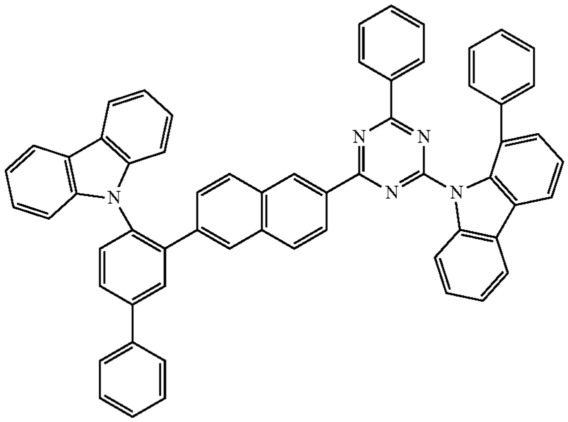
42
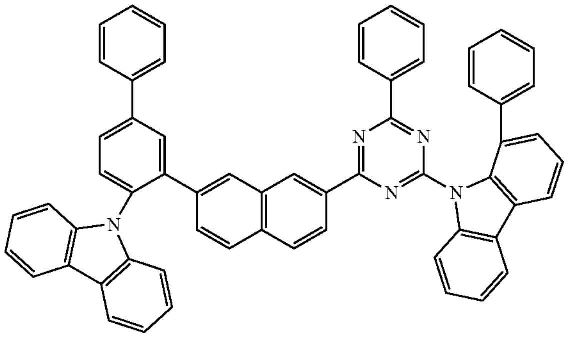
43
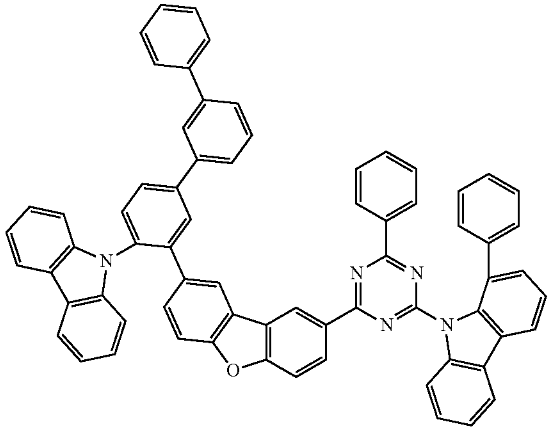

44
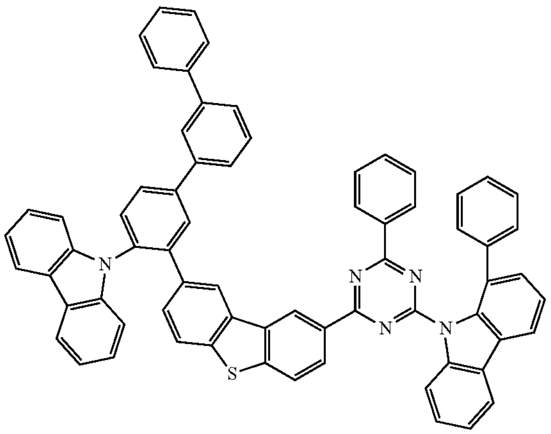
45
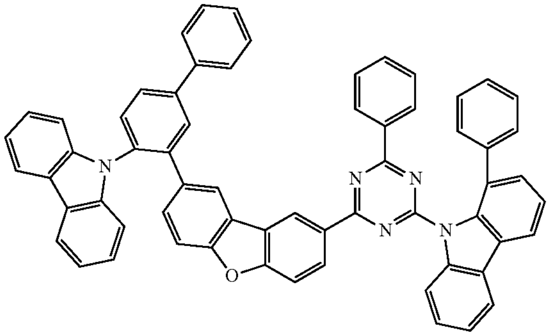
46
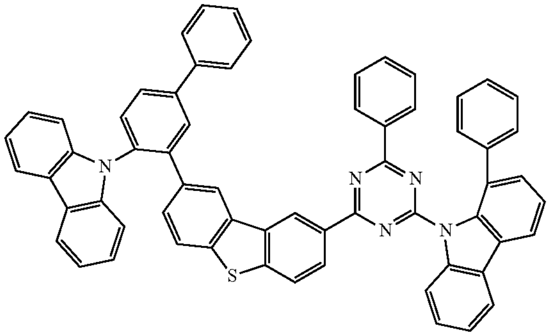
47
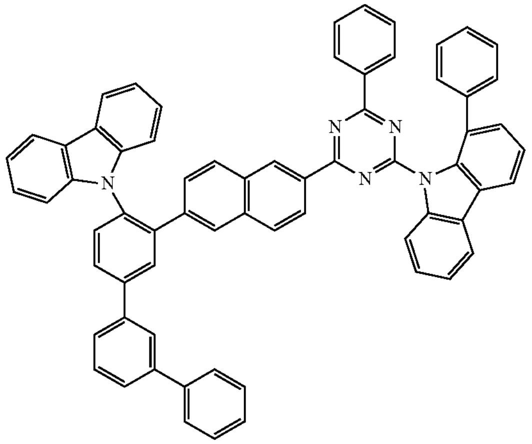
48
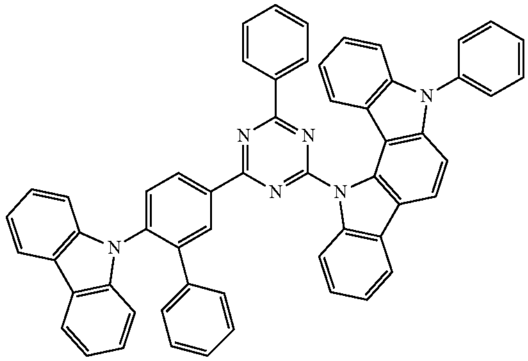
49
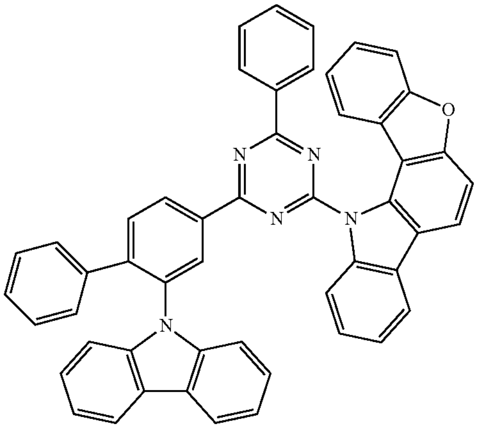
50
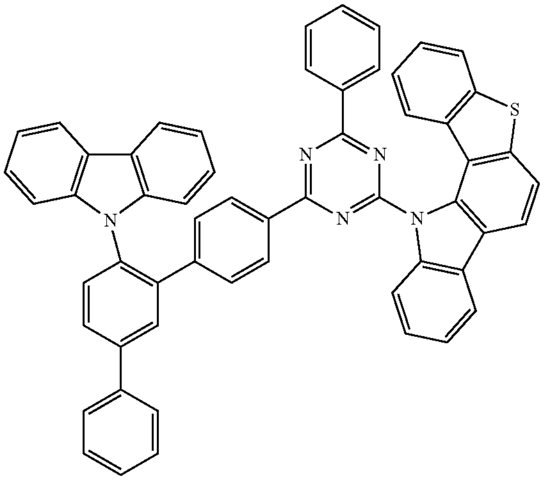

-continued
51
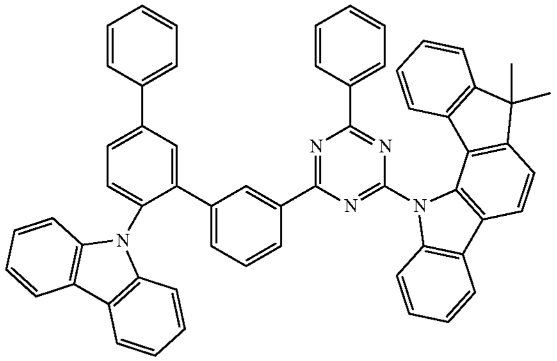
52
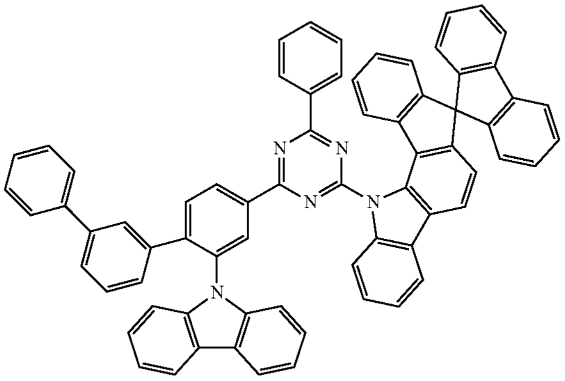
53
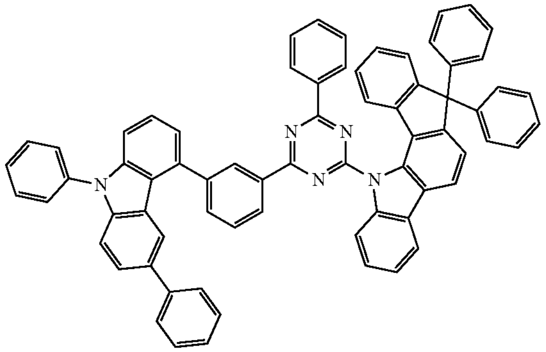
54
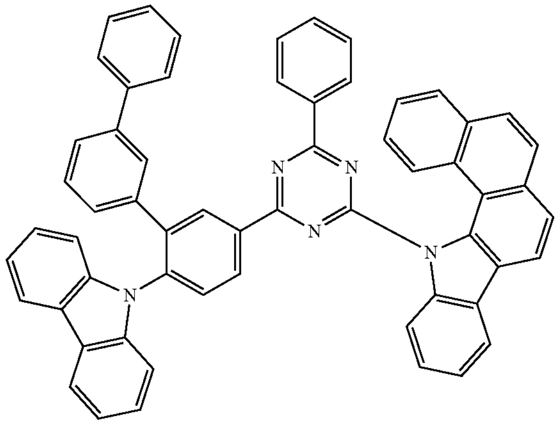
-continued
55
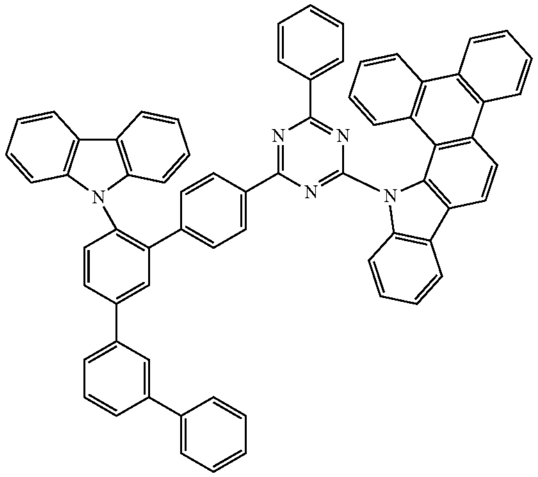
56
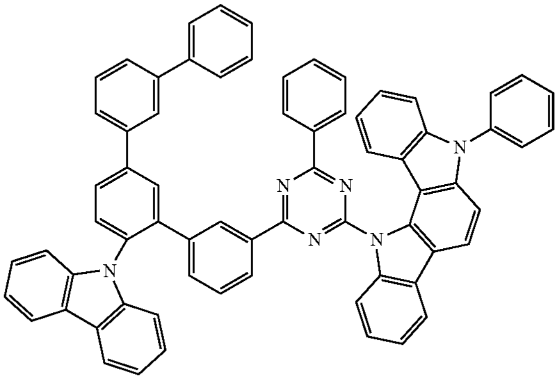
57
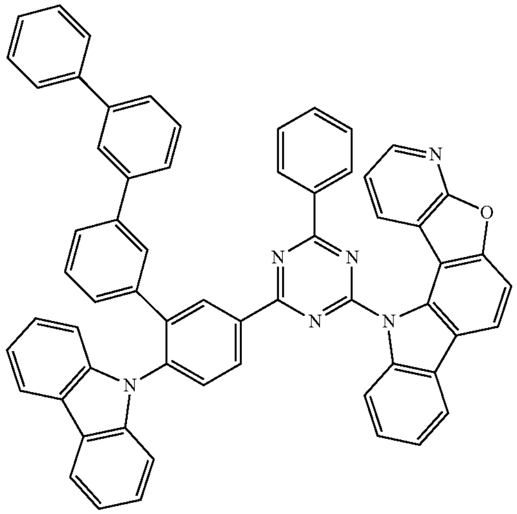

-continued
58
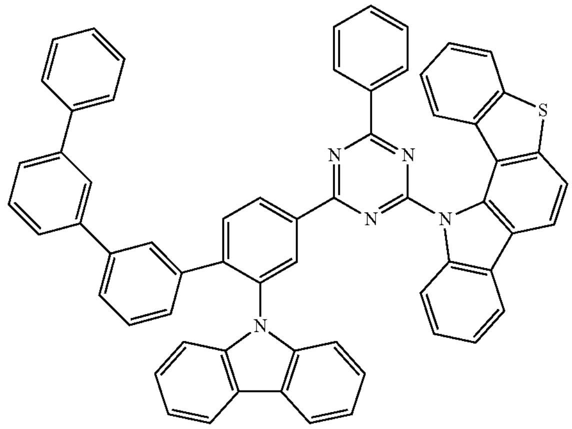
59
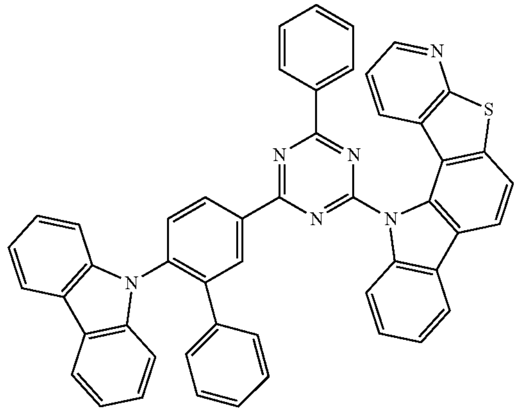
60
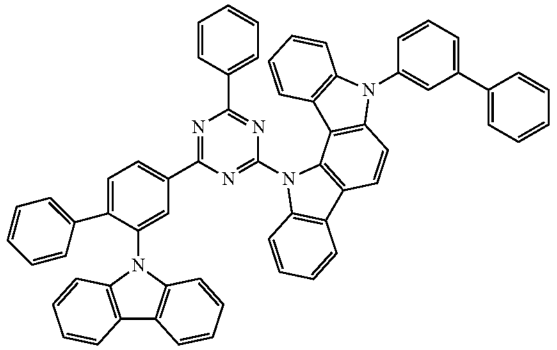
-continued
61
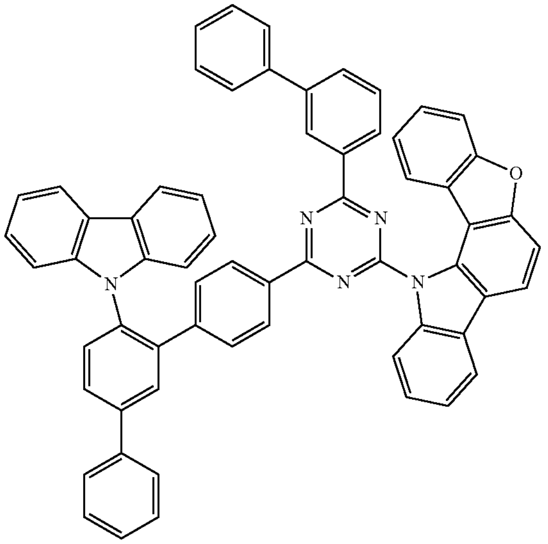
62
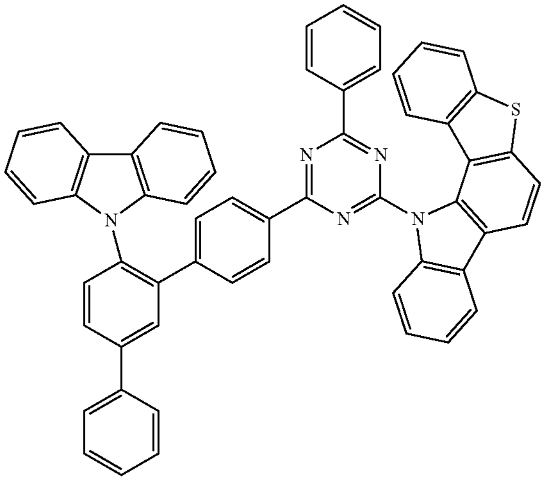
63
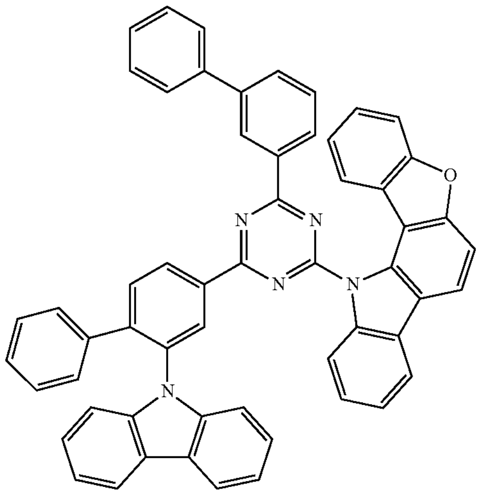

-continued
64
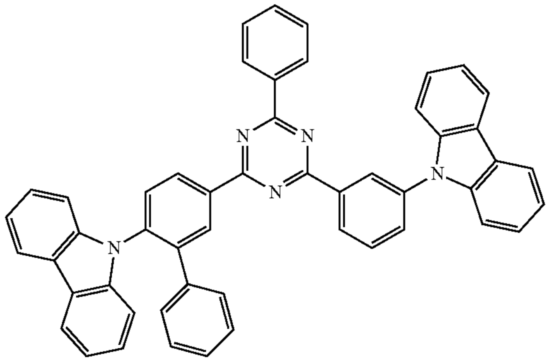
65
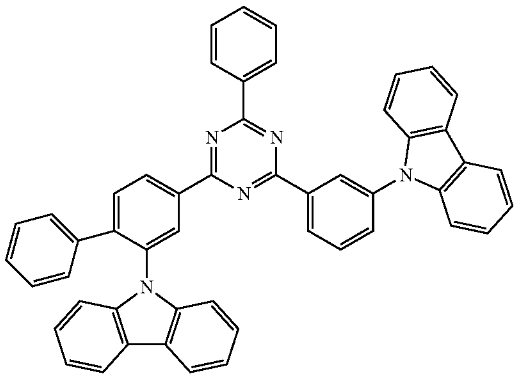
66
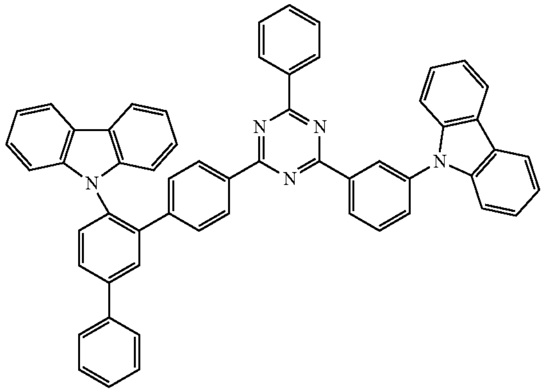
67
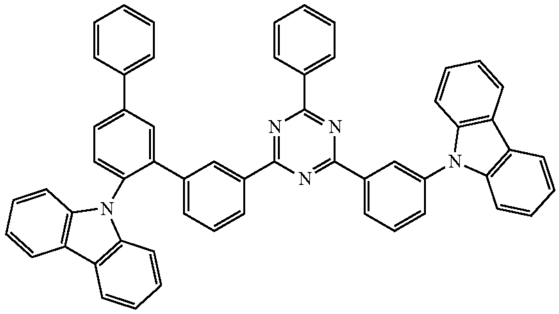
-continued
68
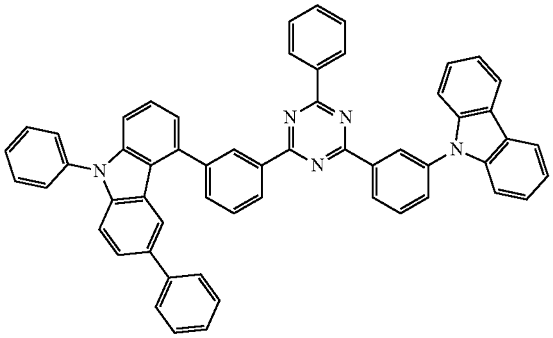
69
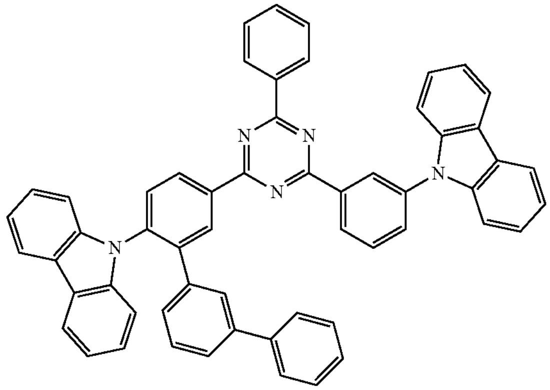
70
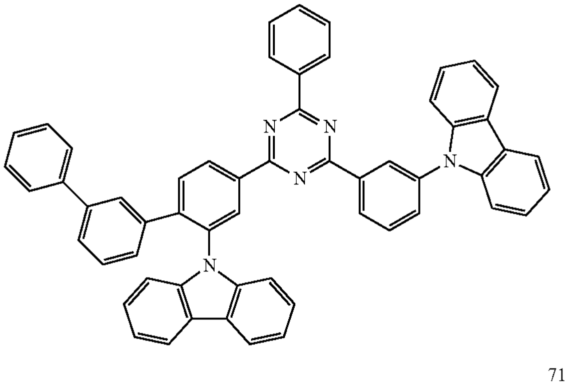
71
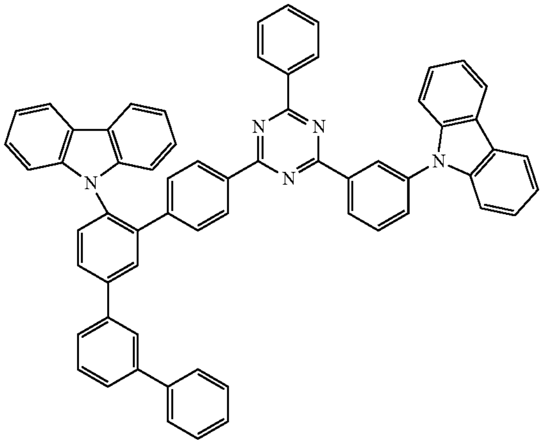

-continued
72
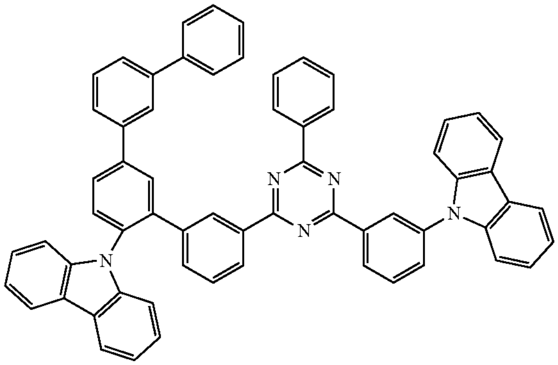
73
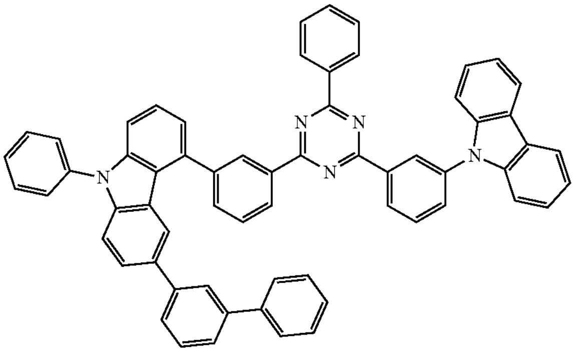
74
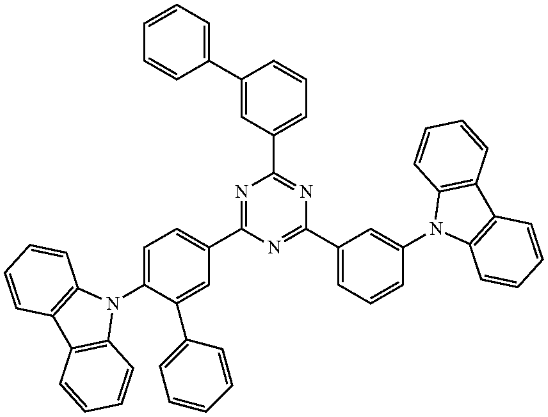
-continued
75
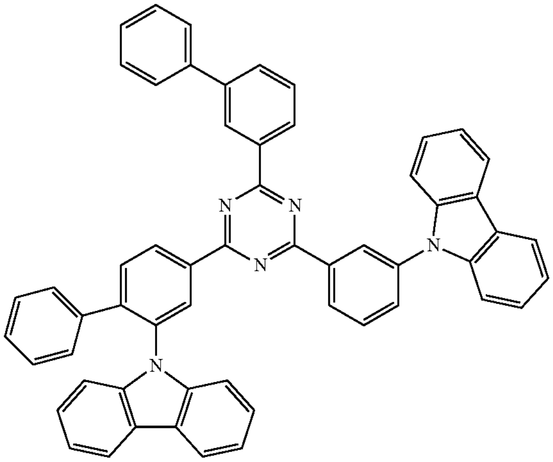
76
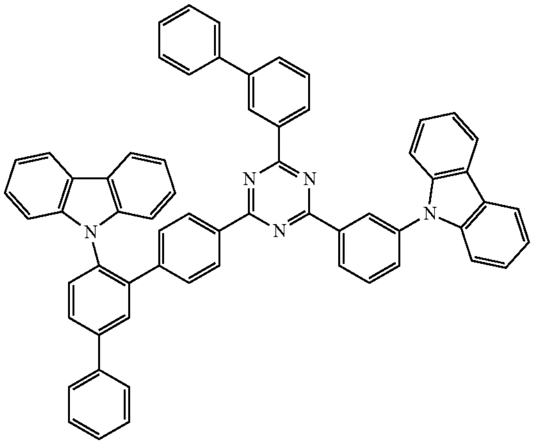
77
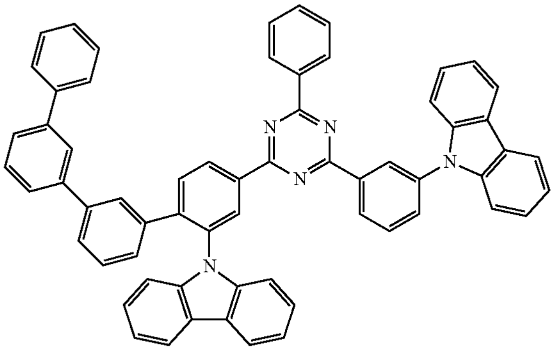

-continued
78
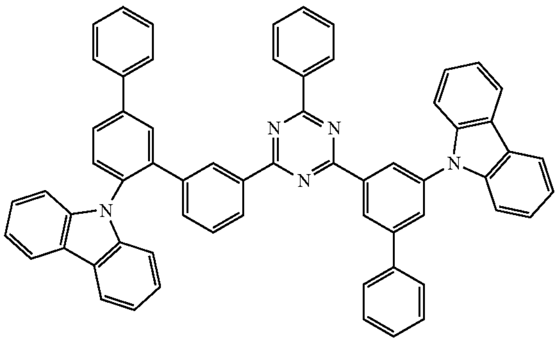
79
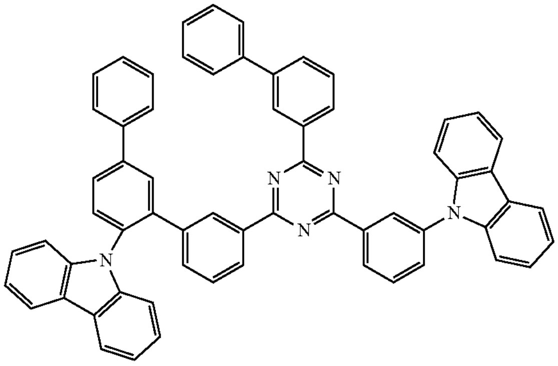
80
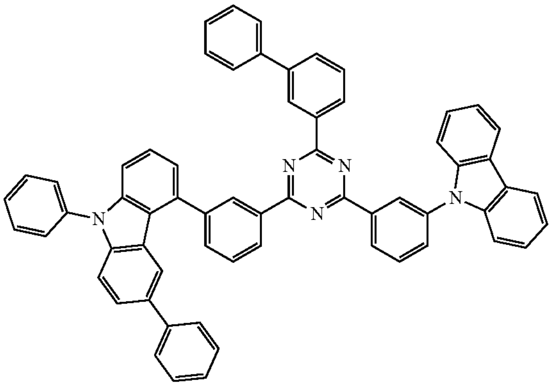
81
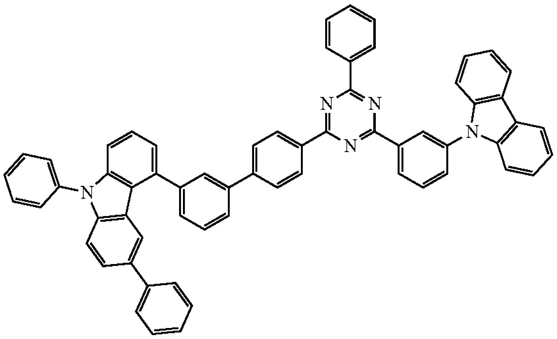
-continued
82
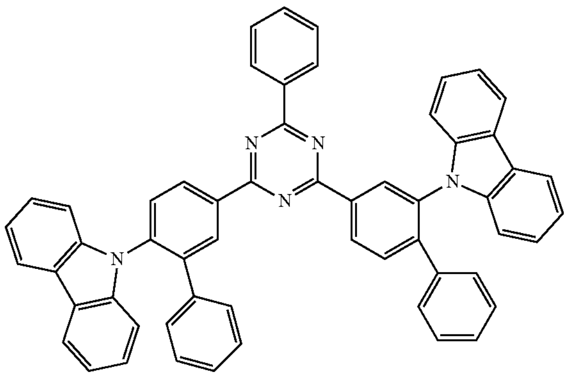
83
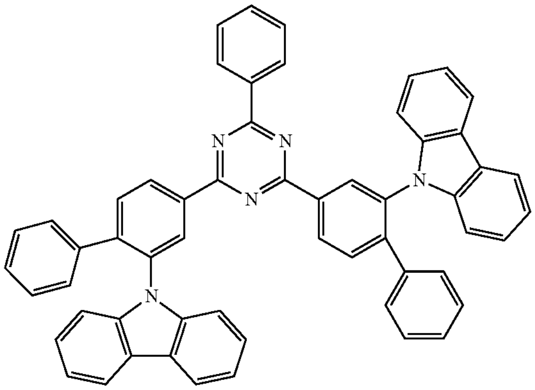
84
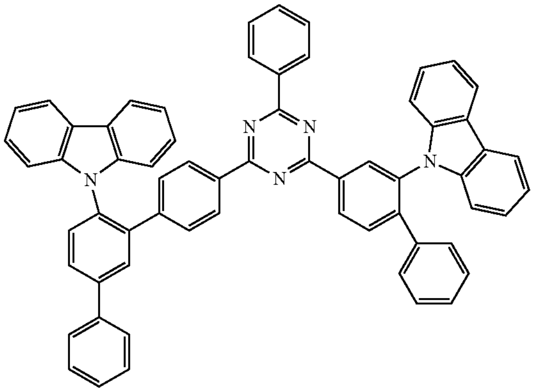
85
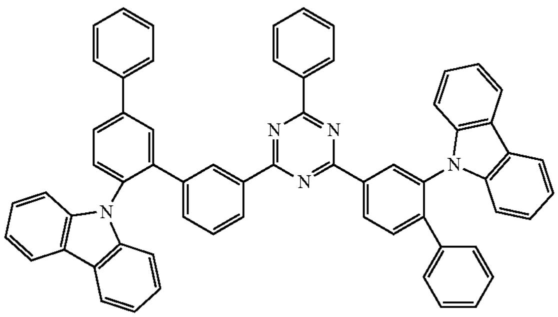

-continued
86
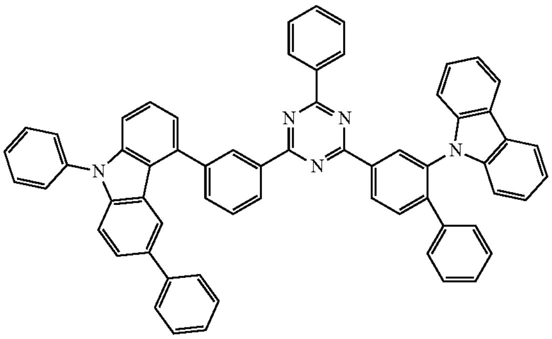
87
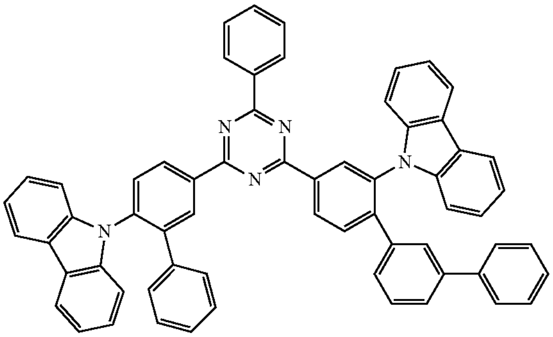
88
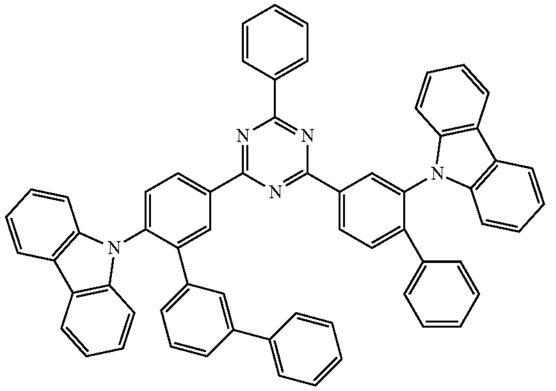
89
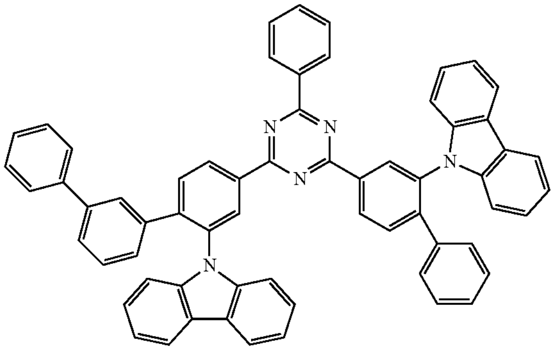
-continued
90
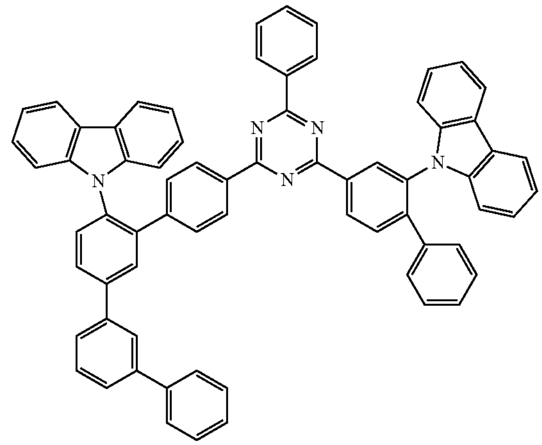
91
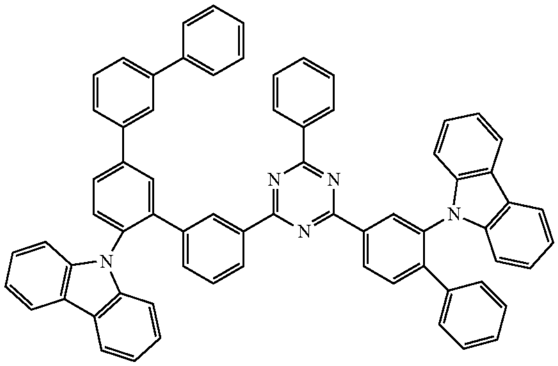
92
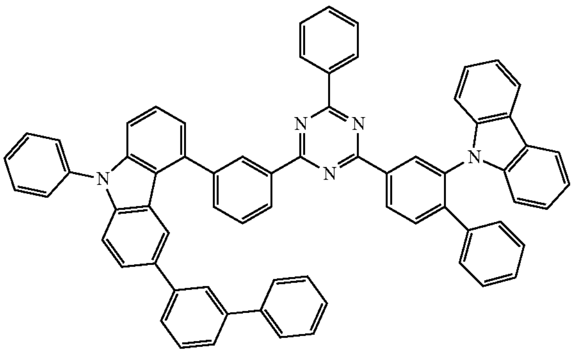
93
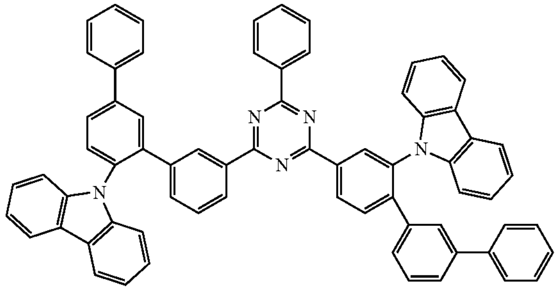

94
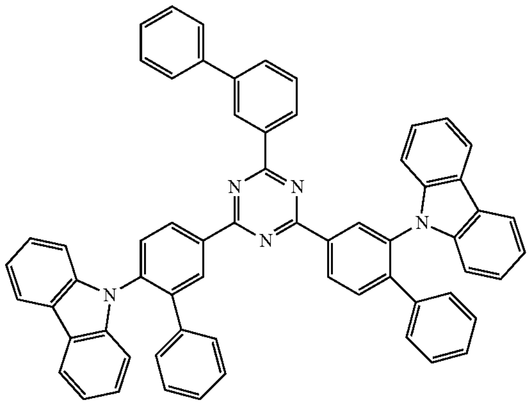
95
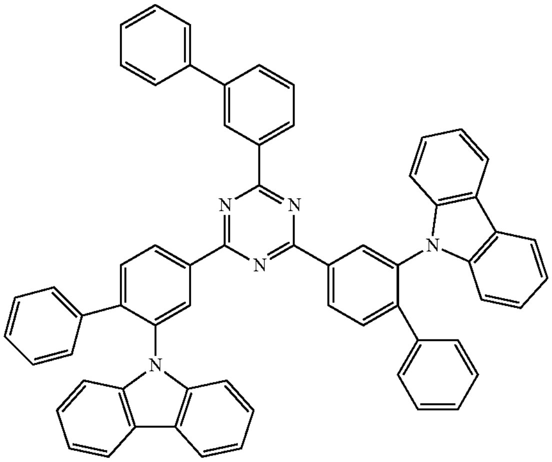
96
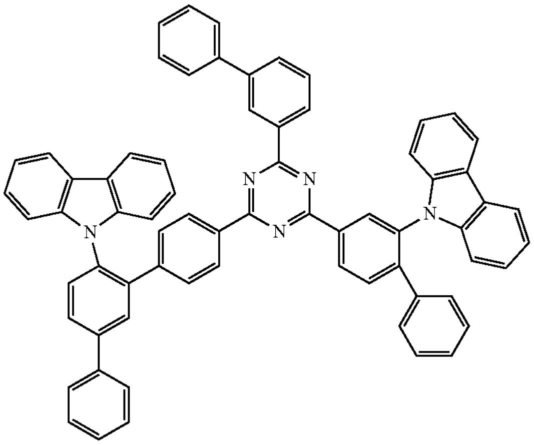
97
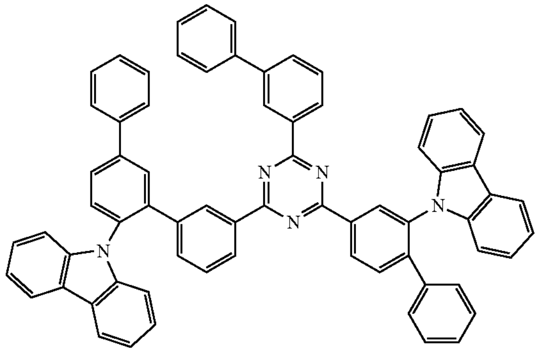
98
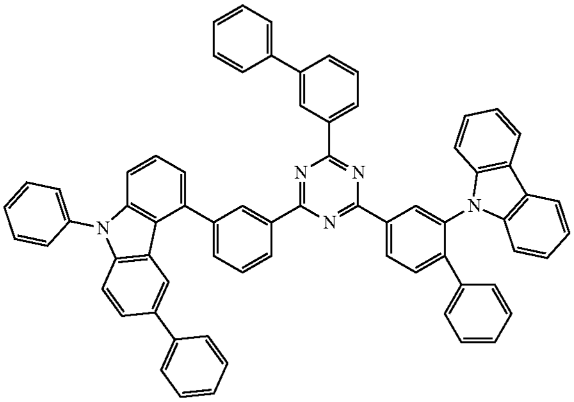
99
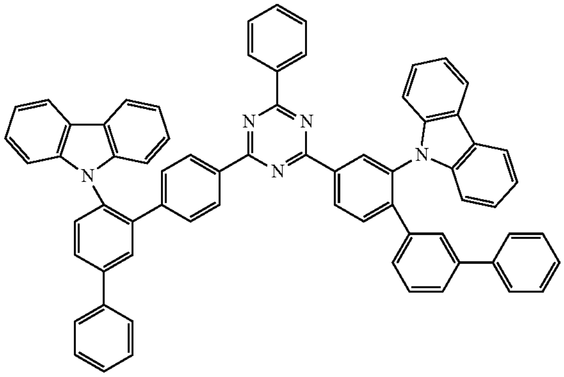

-continued
100
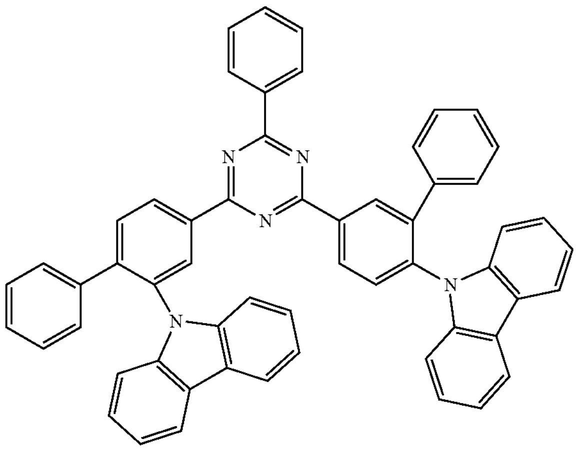
101
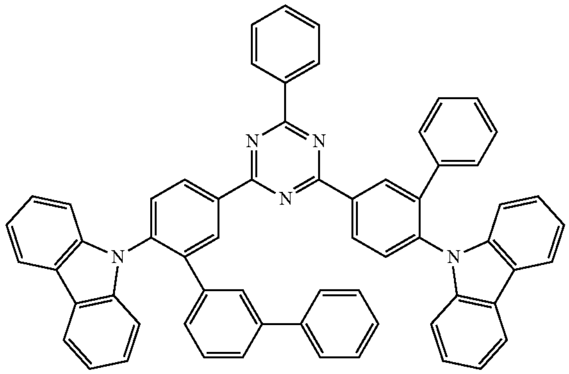
102
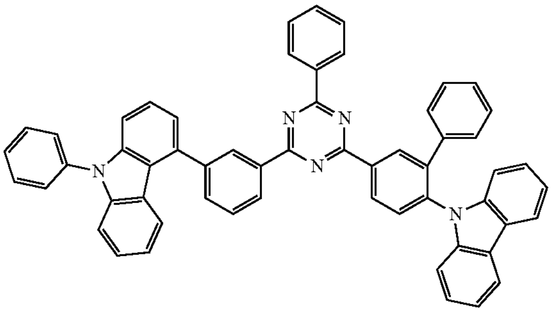
103
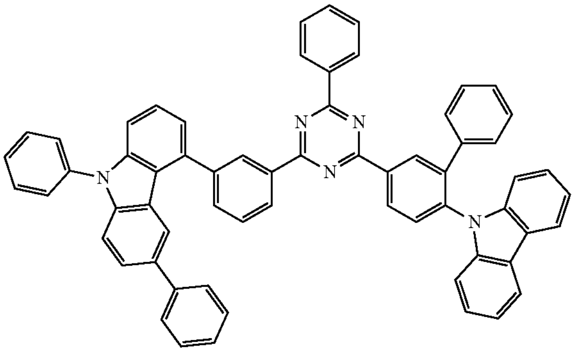
-continued
104
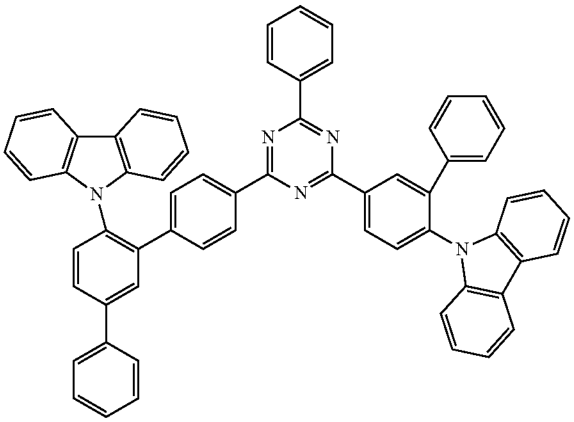
105
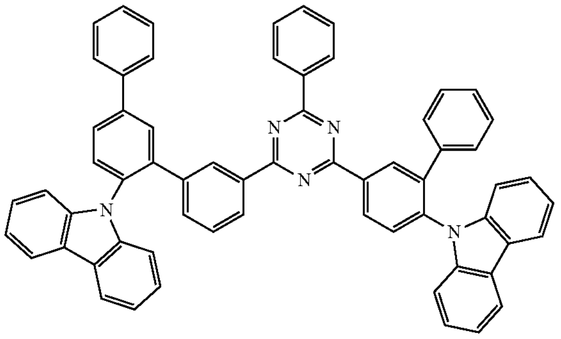
106
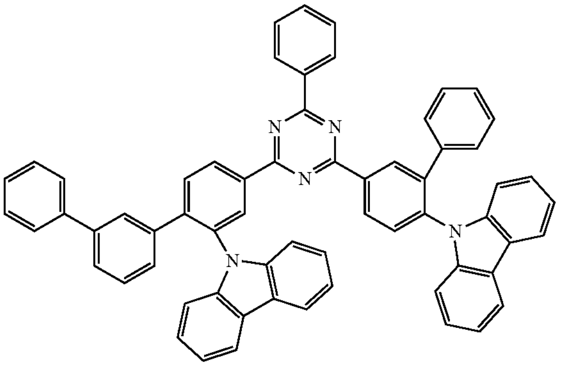
107
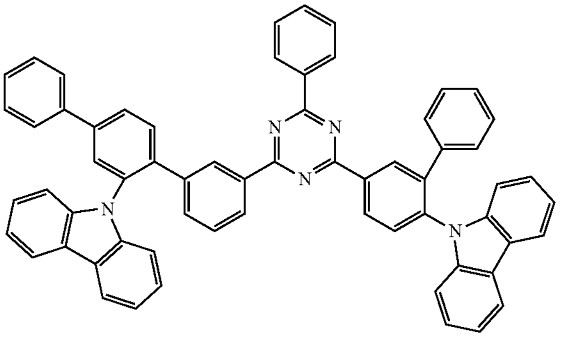

-continued
108
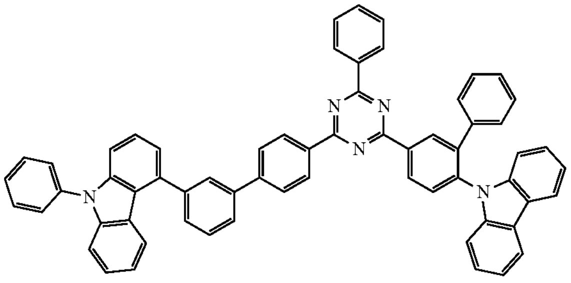
109
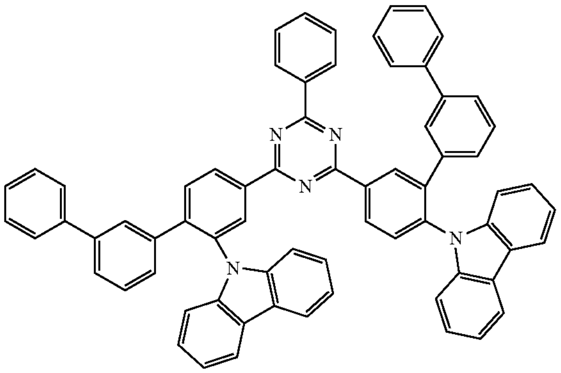
110
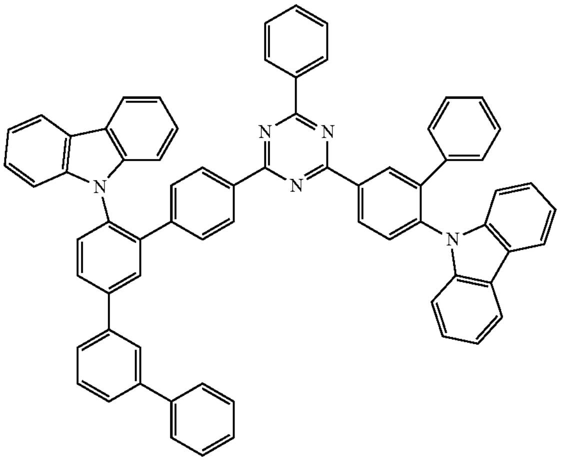
111
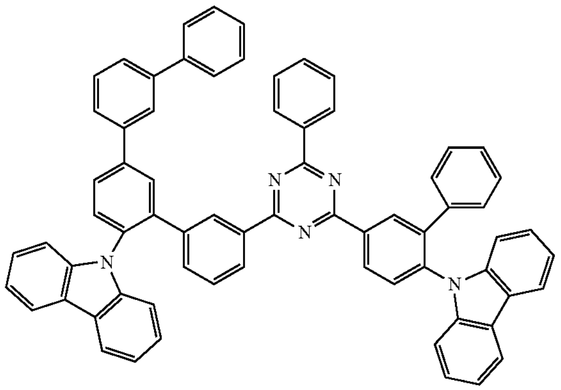
-continued
112
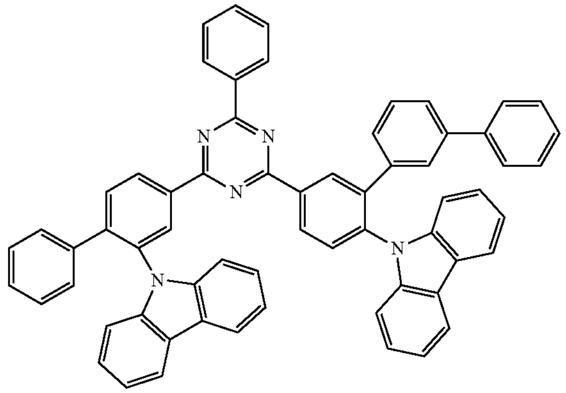
113
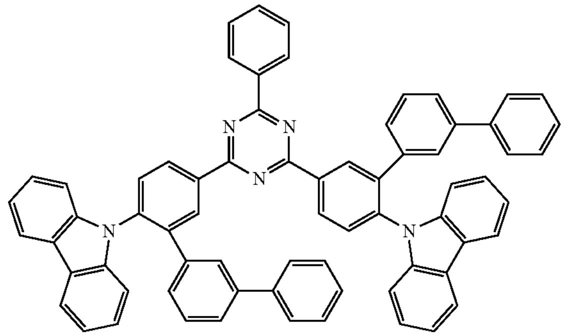
114
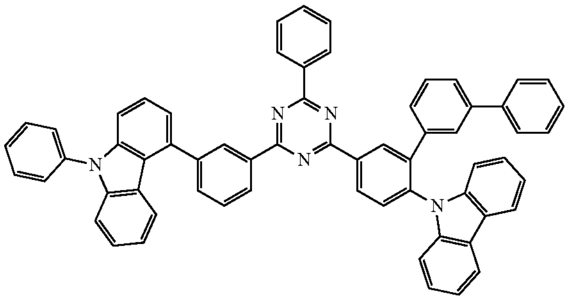
115
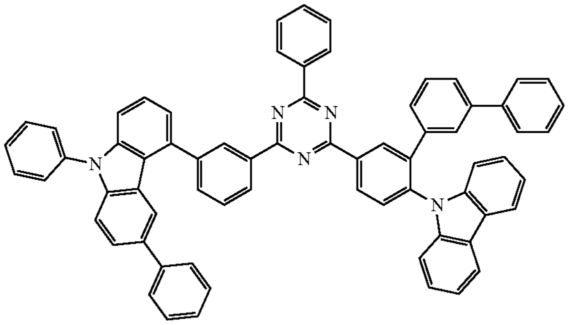

-continued
116
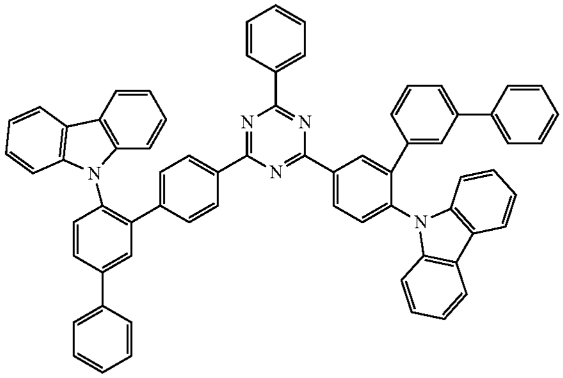
-continued
117
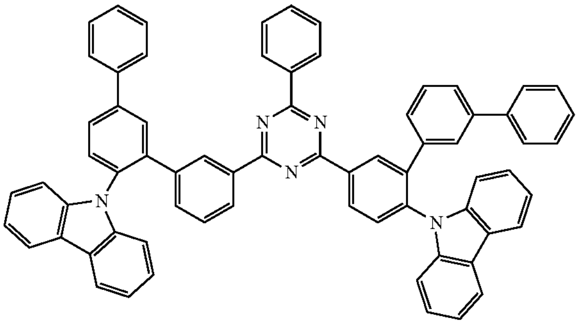
118
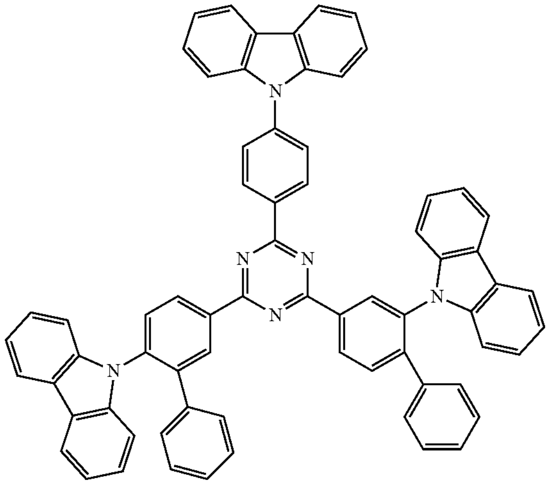
119
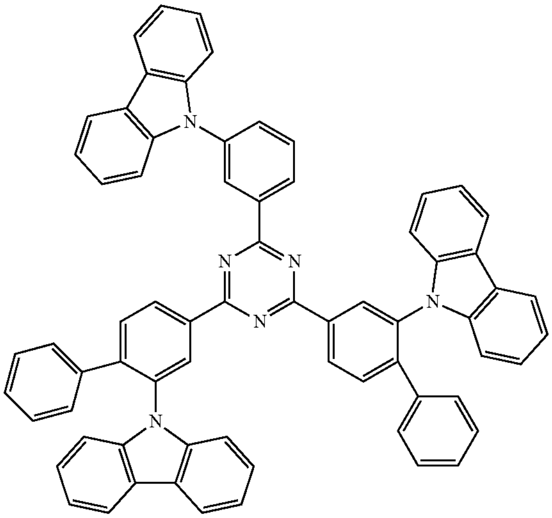
120
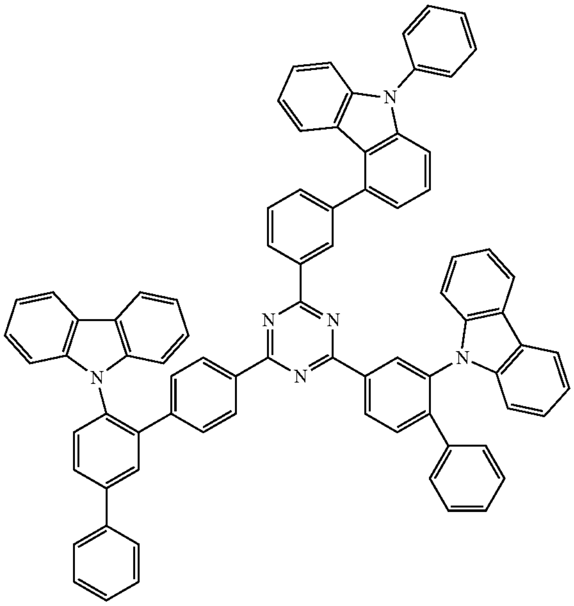
121
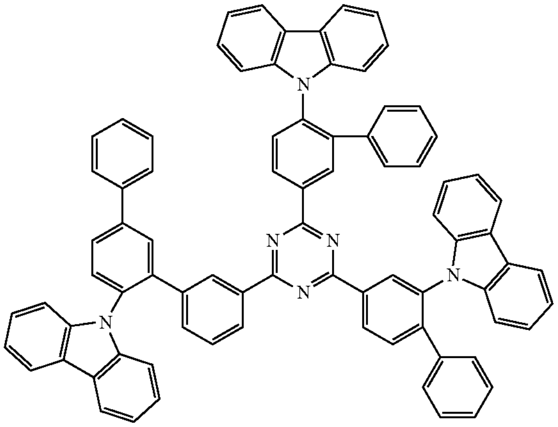

-continued
122
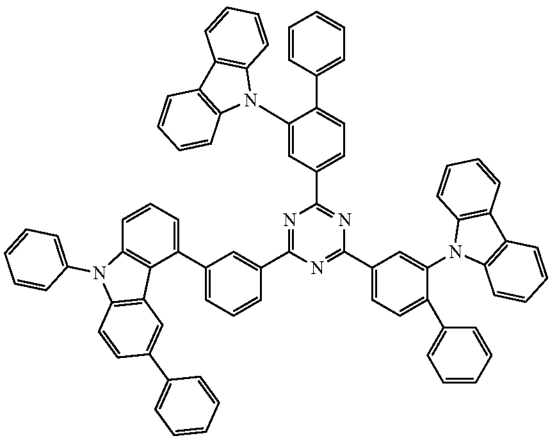
123
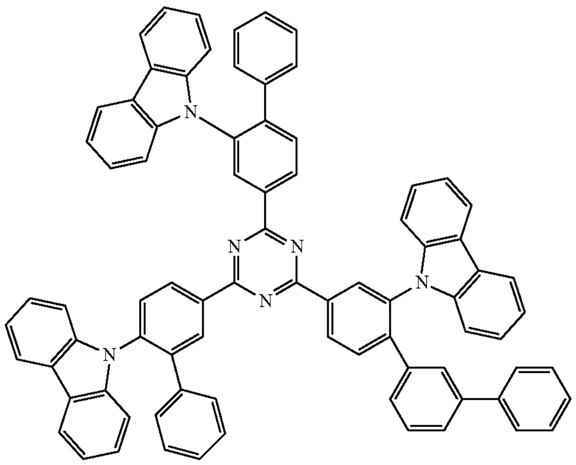
124
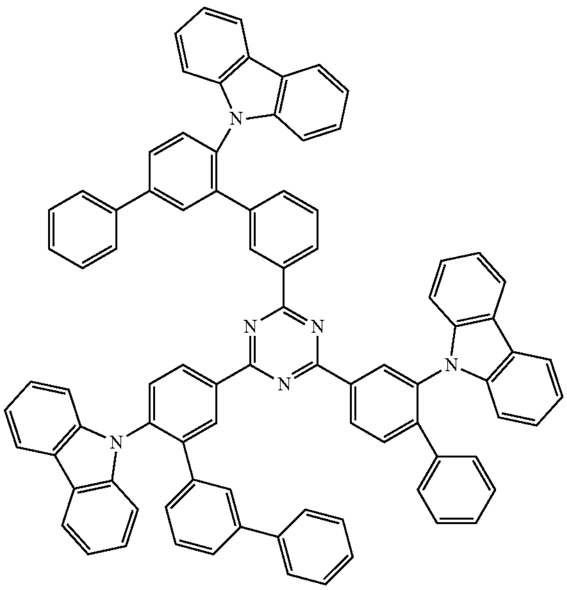
125
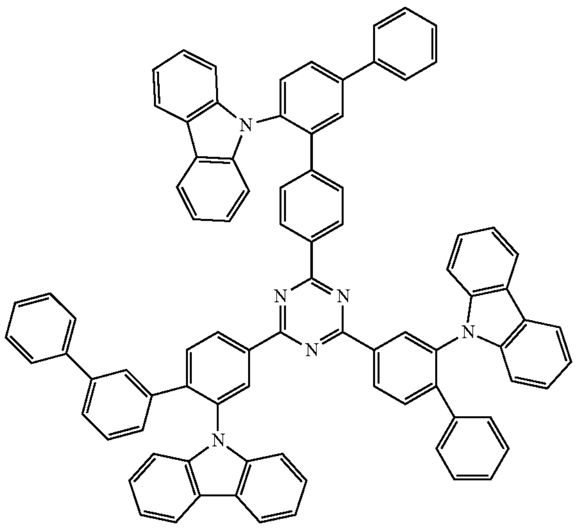

-continued
126
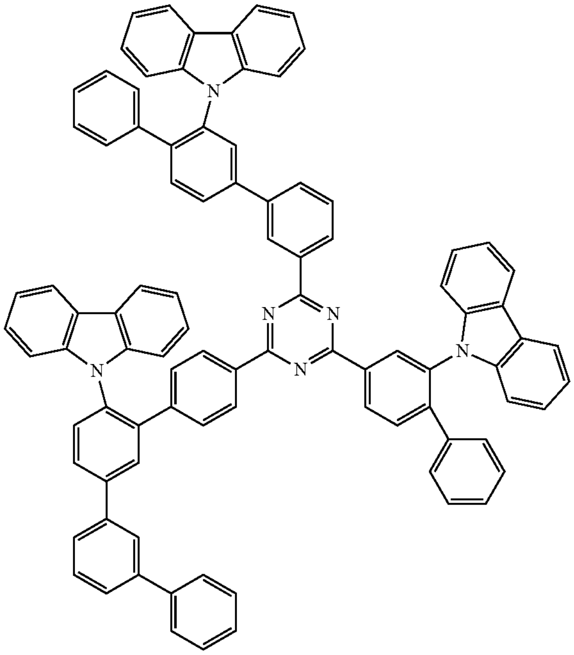
127
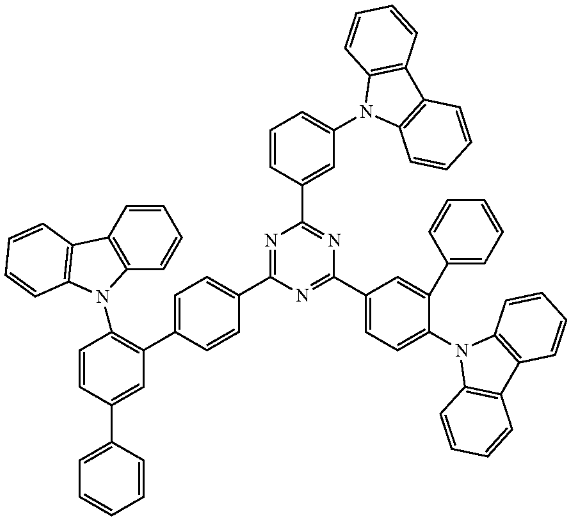
128
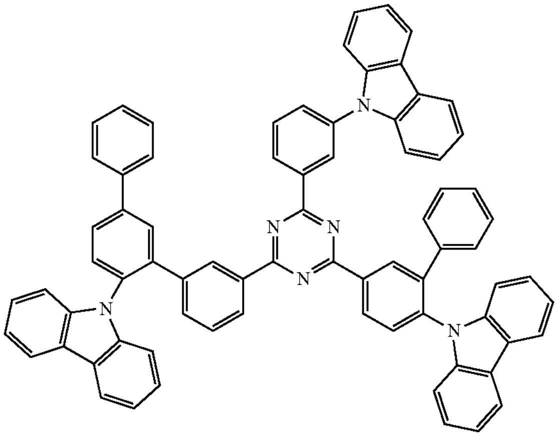
129
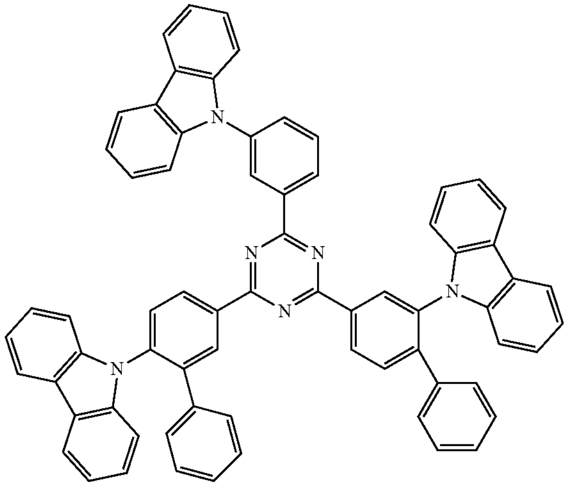
130
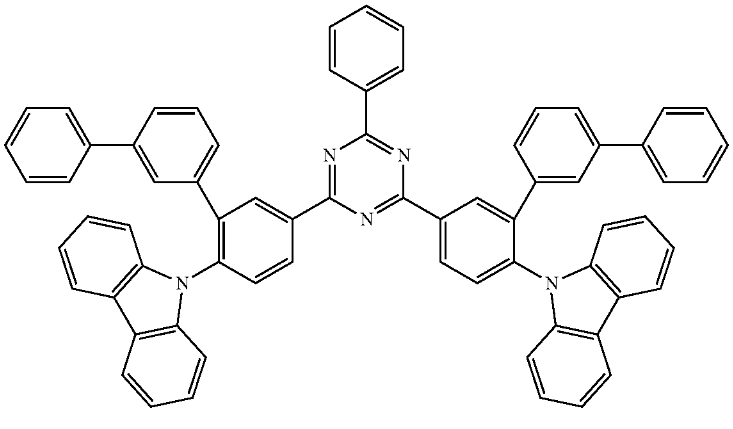

-continued
131
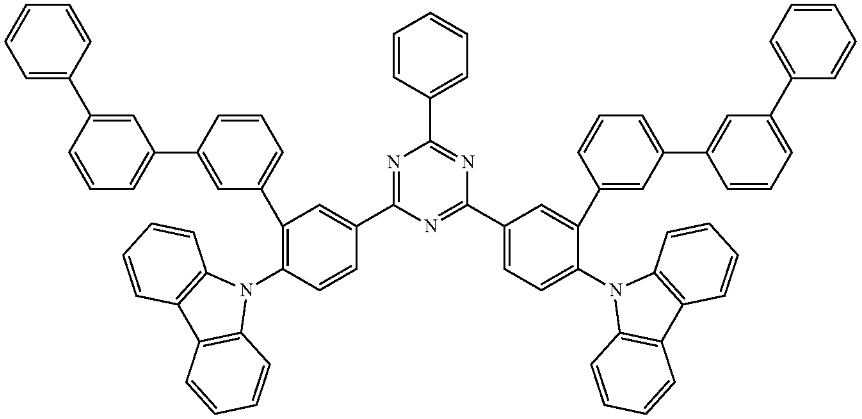
132
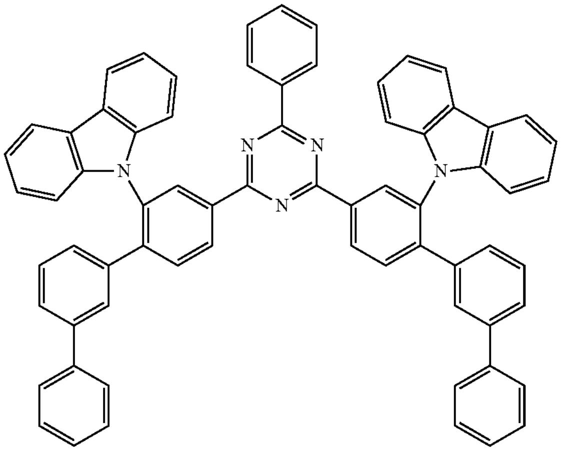
133
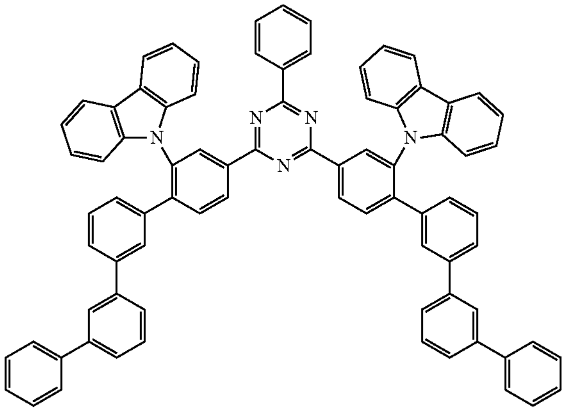
134
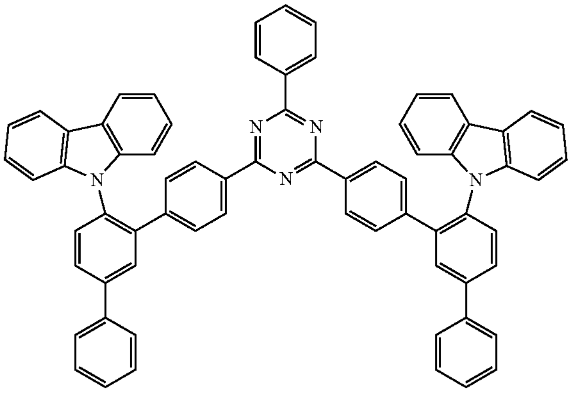
135
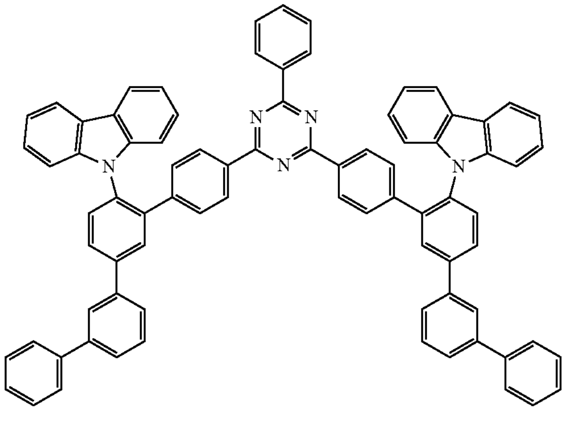

-continued
136
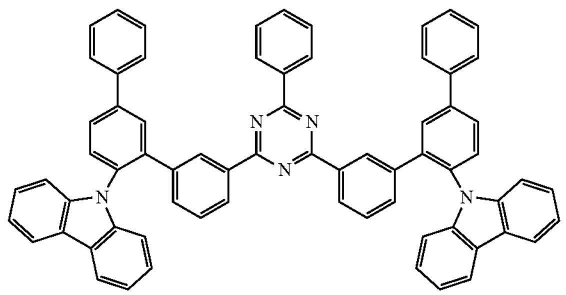
137
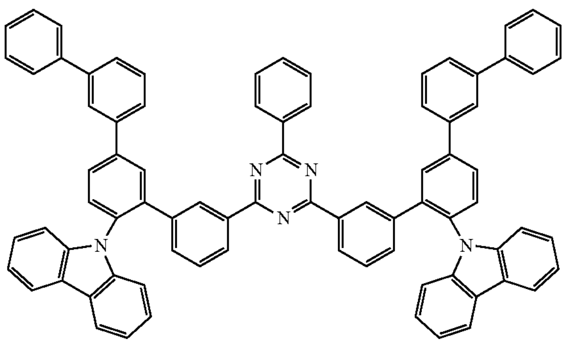
138
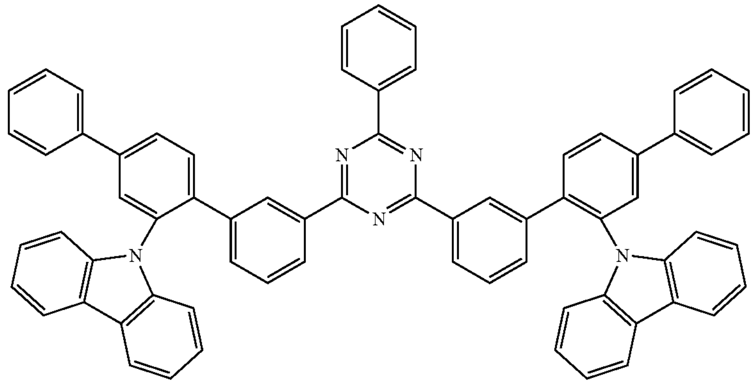
139
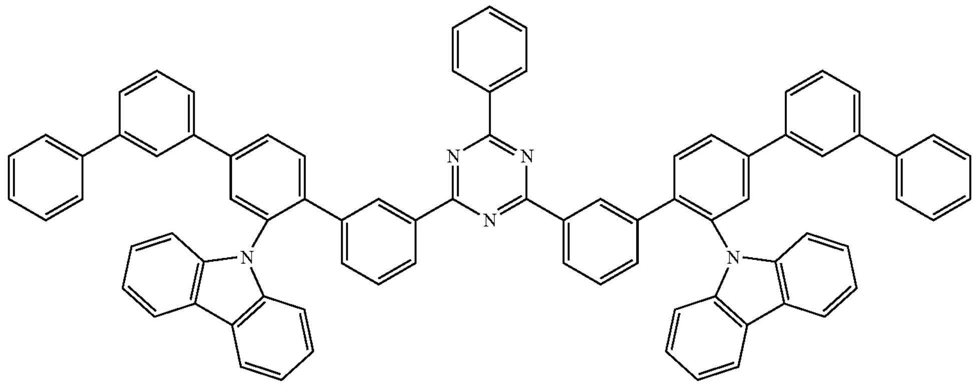
140
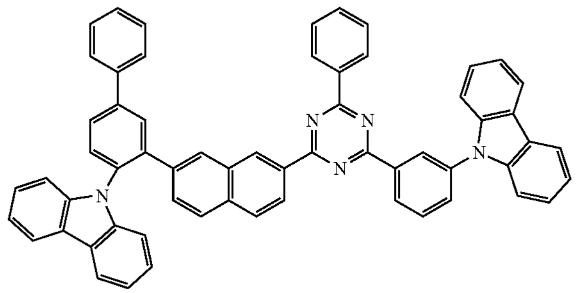
141
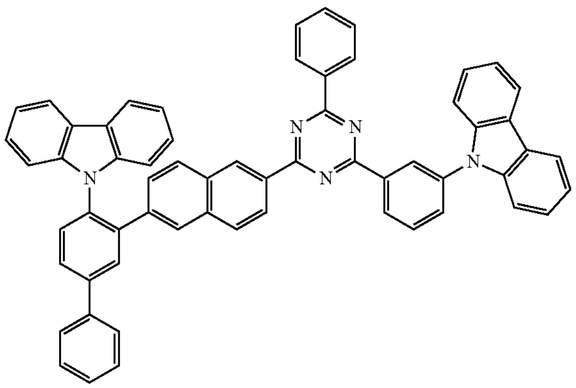

-continued
142
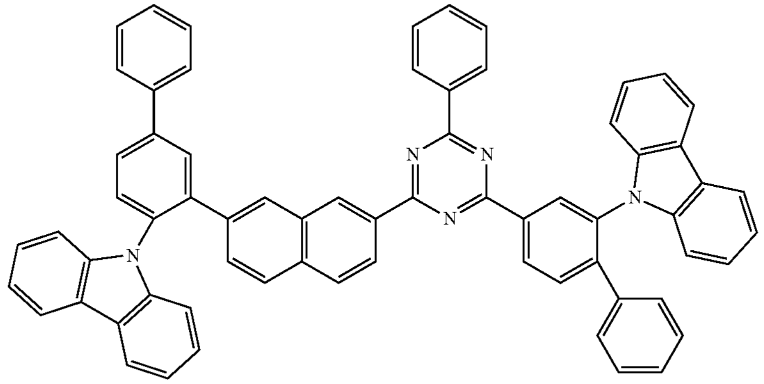
143
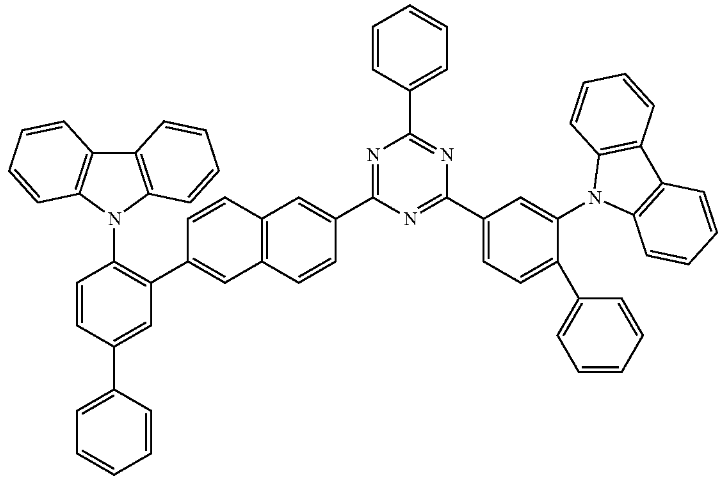
144
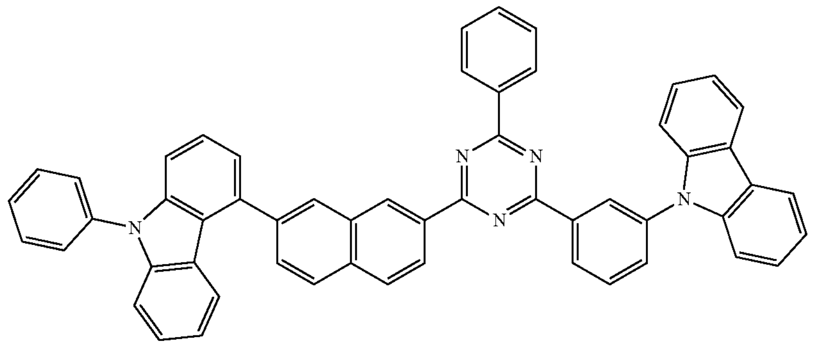

-continued
145
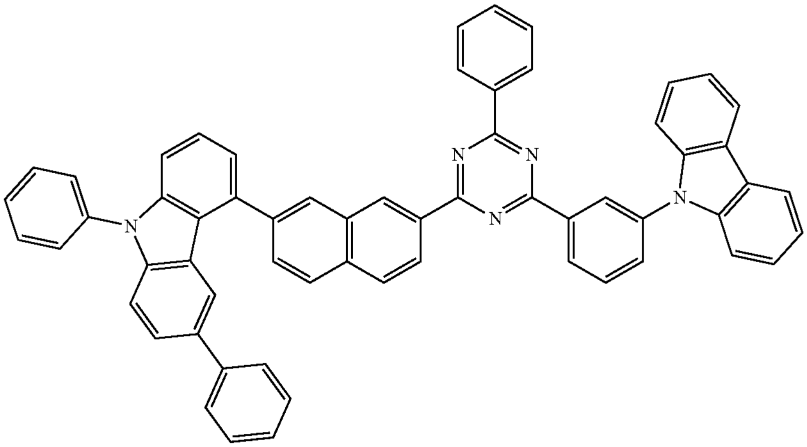
146
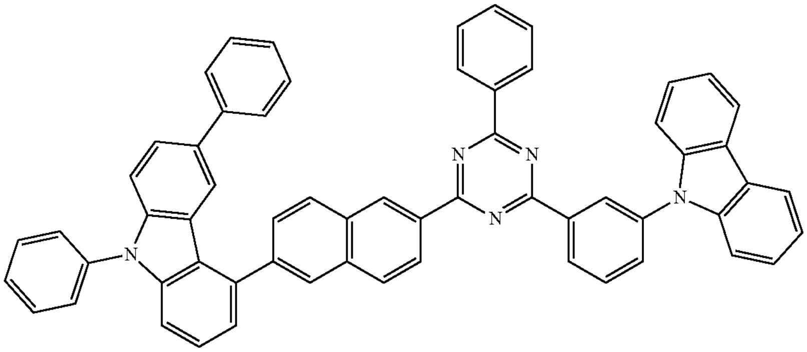
147
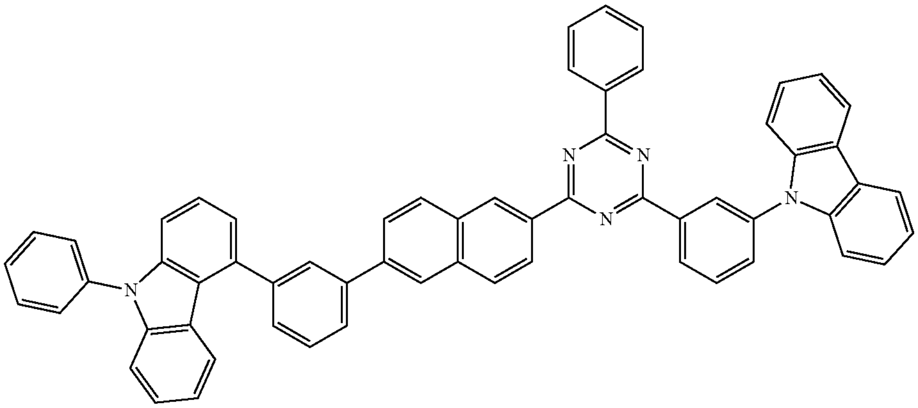
148
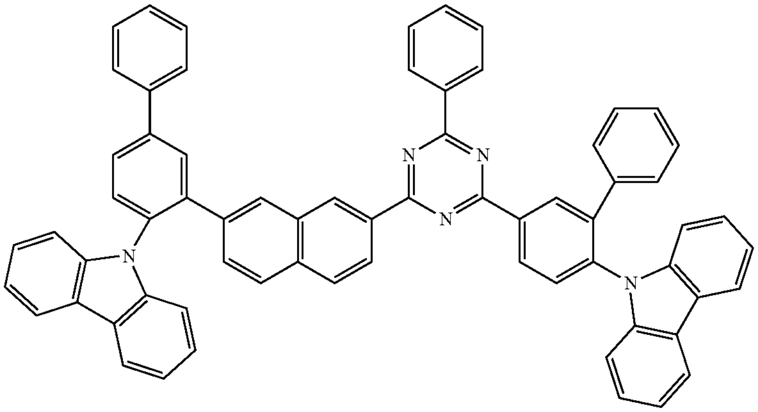

-continued
149
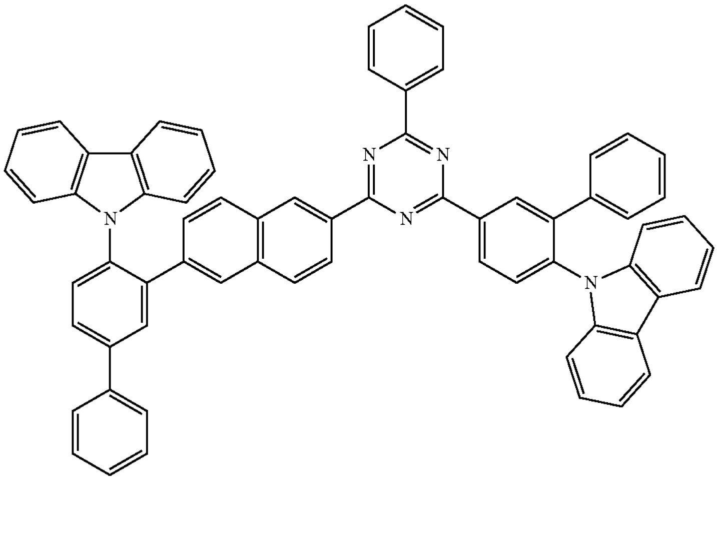
150
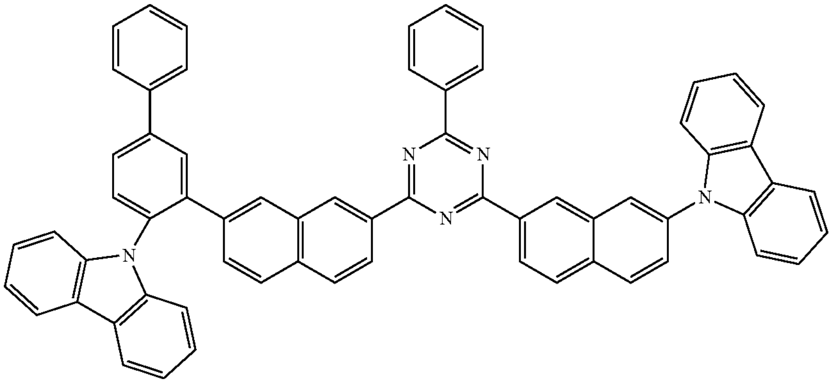
151
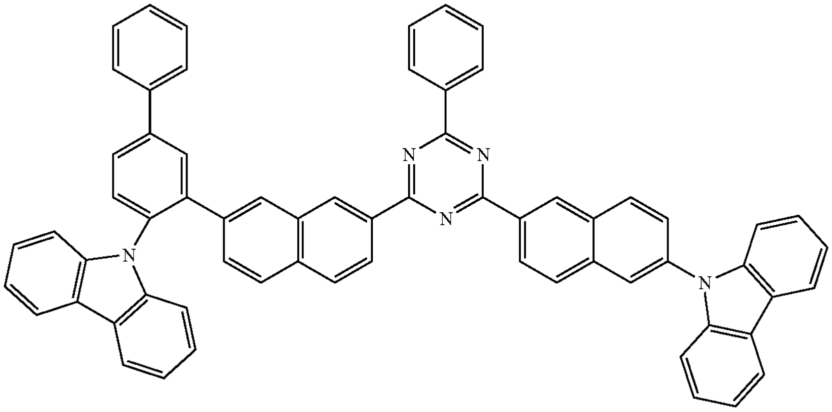

-continued
152
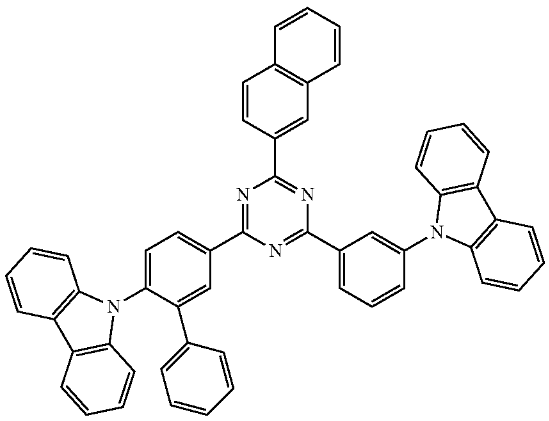
153
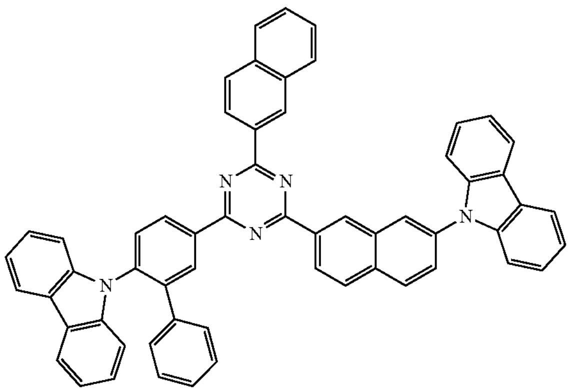
154
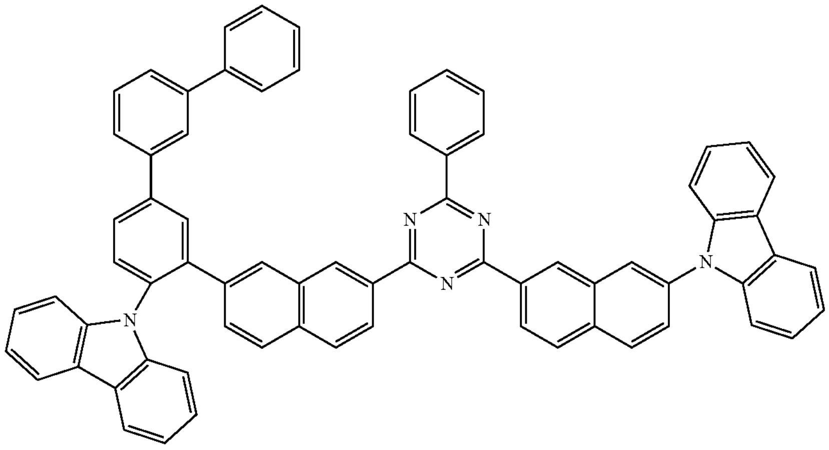
155
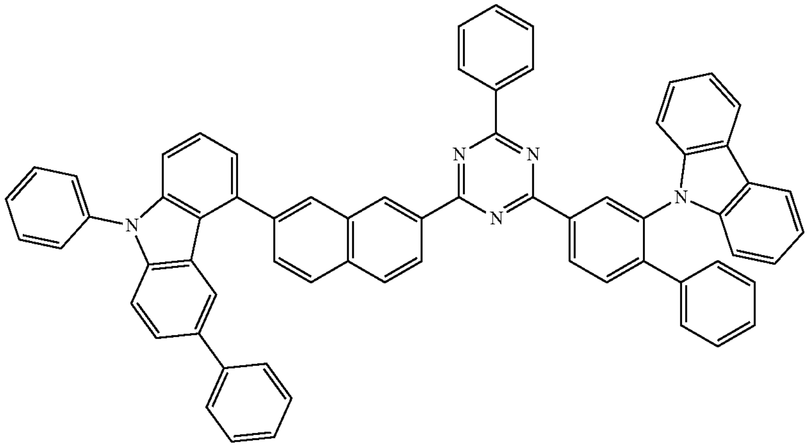

-continued
156
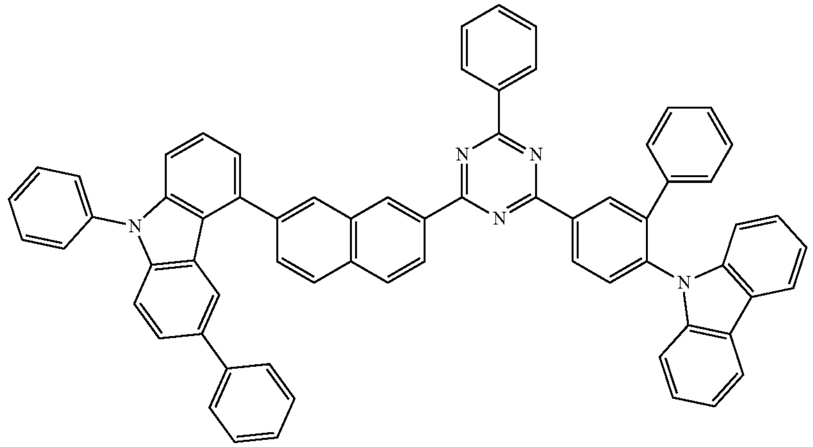
157
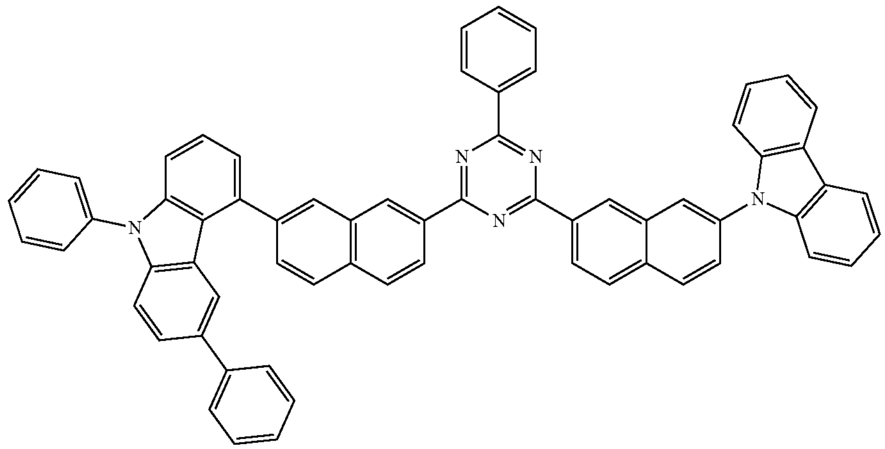
158
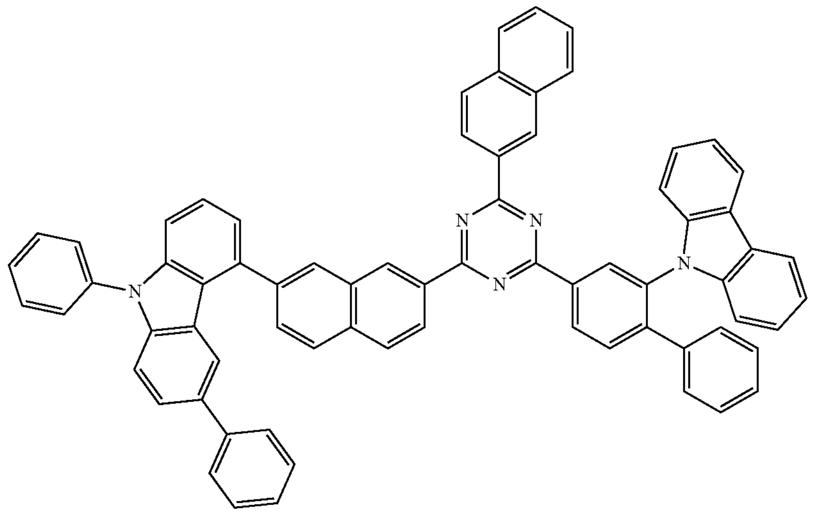

-continued
159
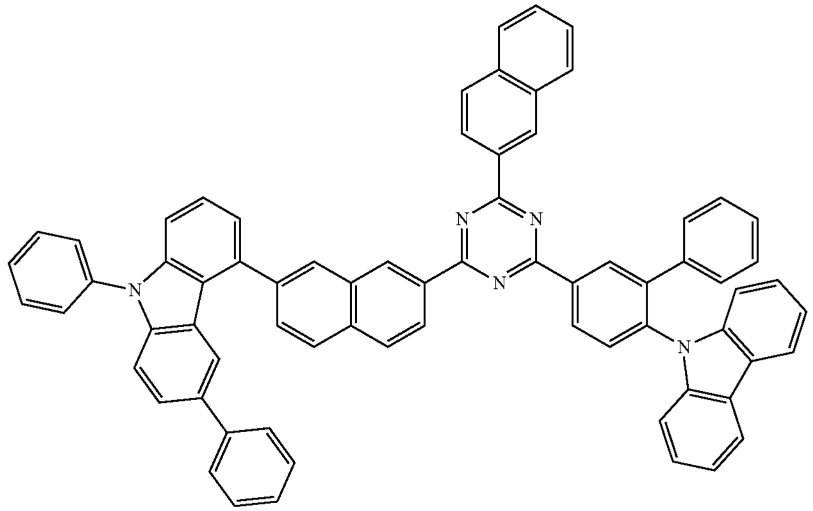
160
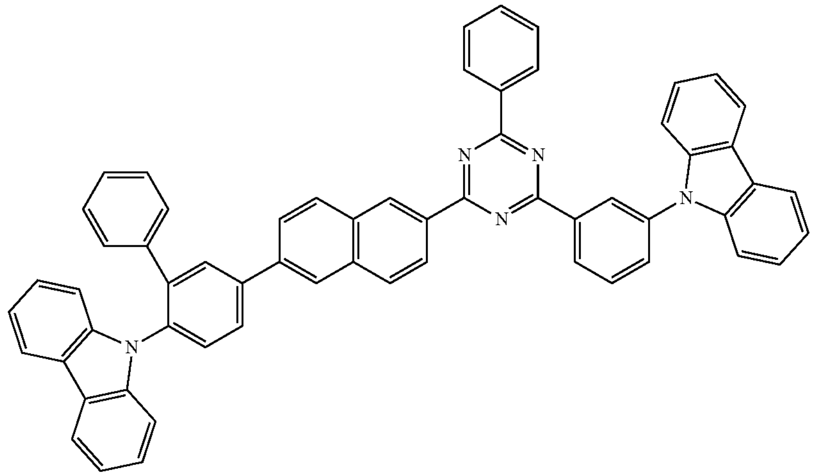
161
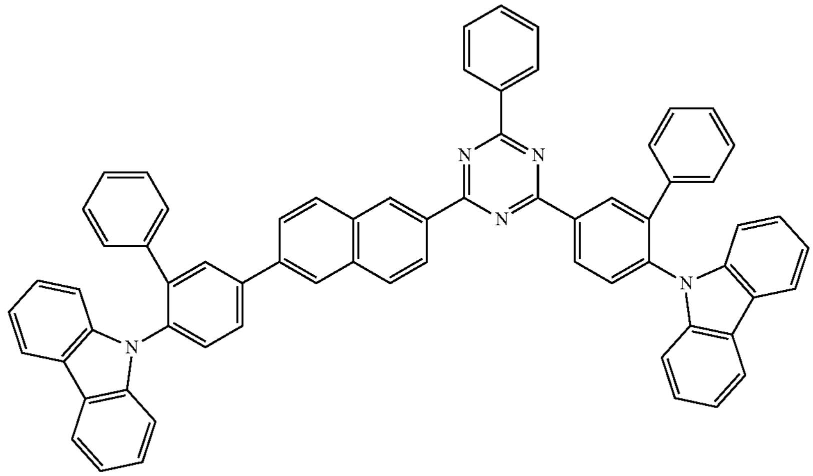

-continued
162
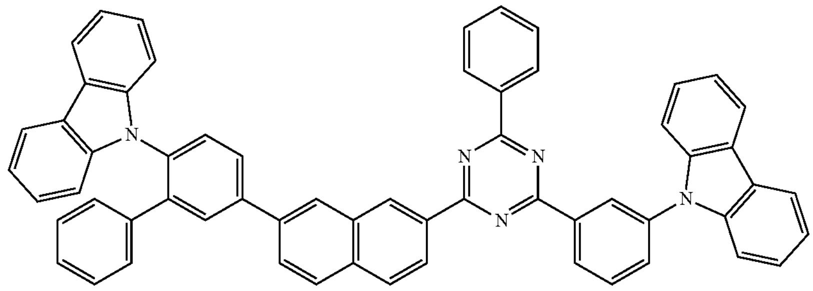
163
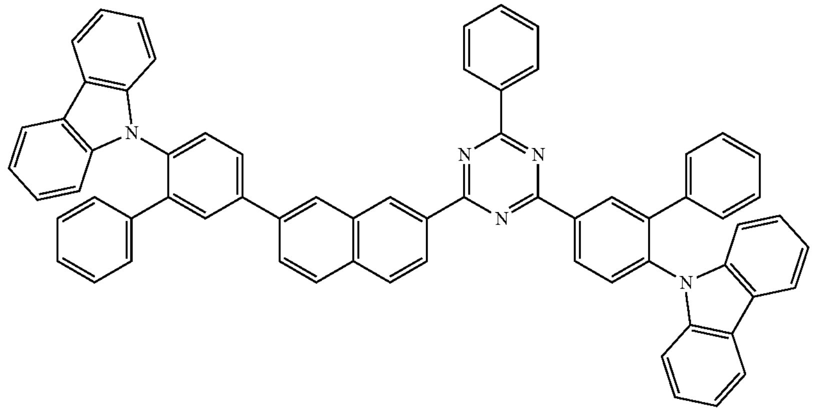
164
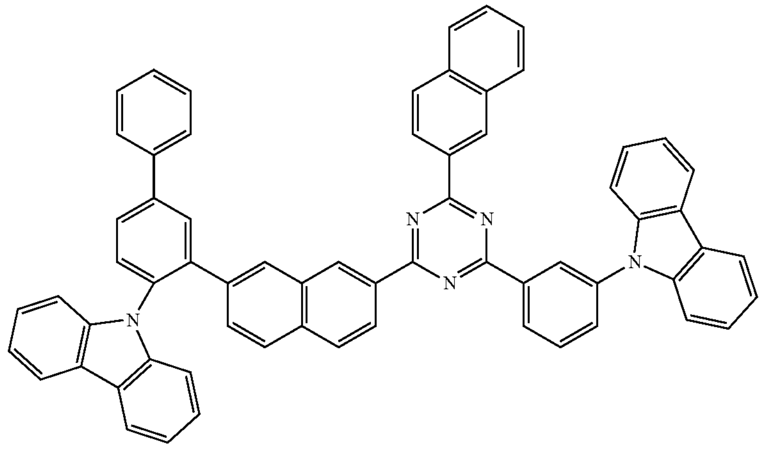
165
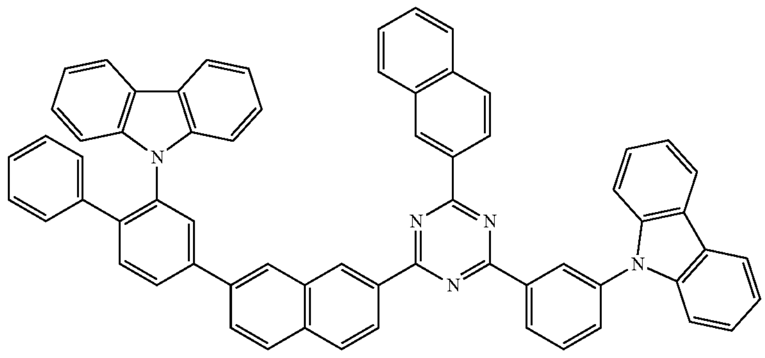

-continued
166
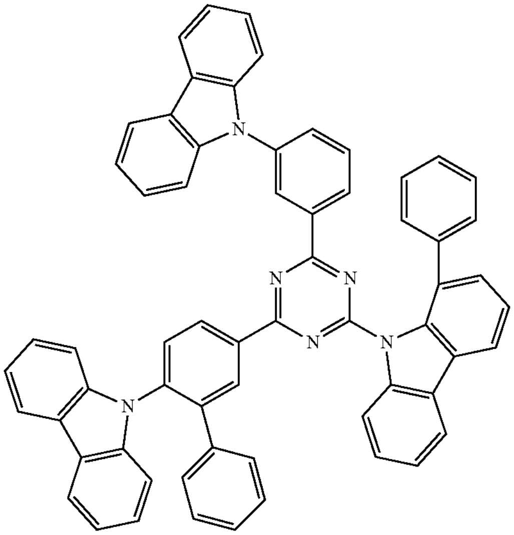
167
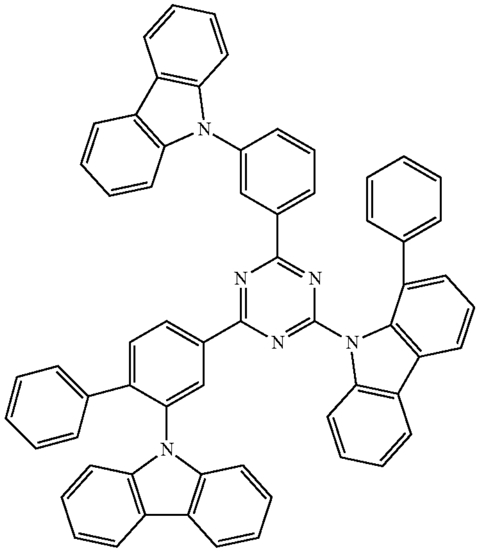
168
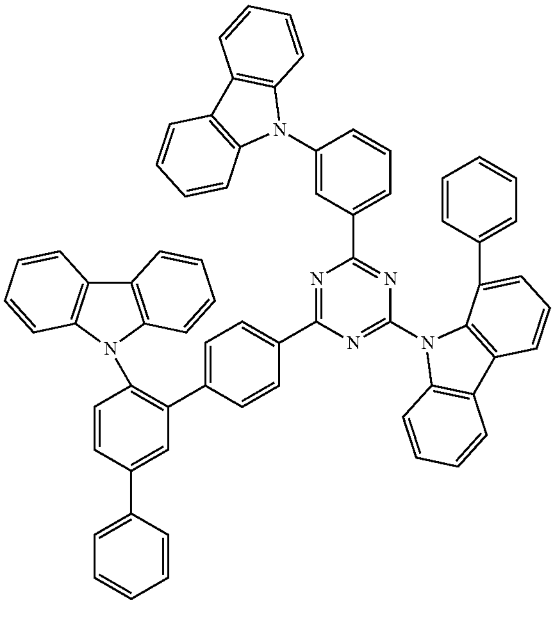
169
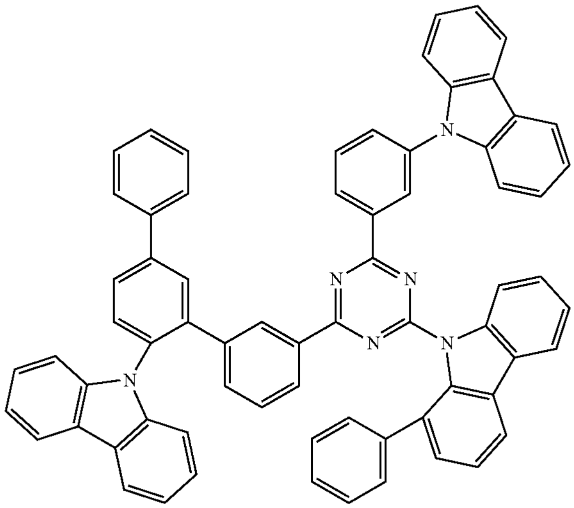

-continued
170
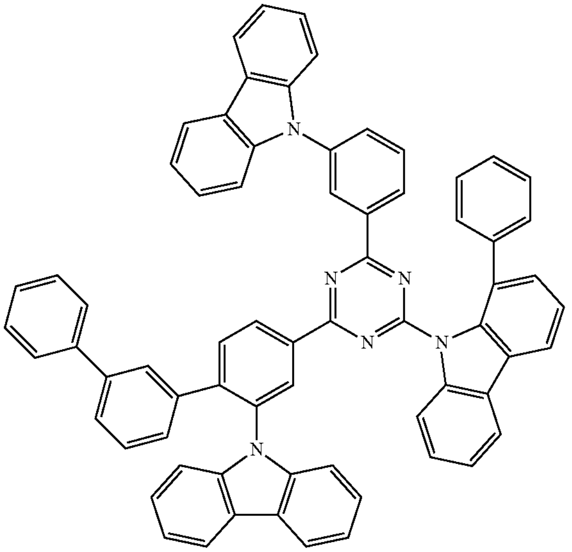
171
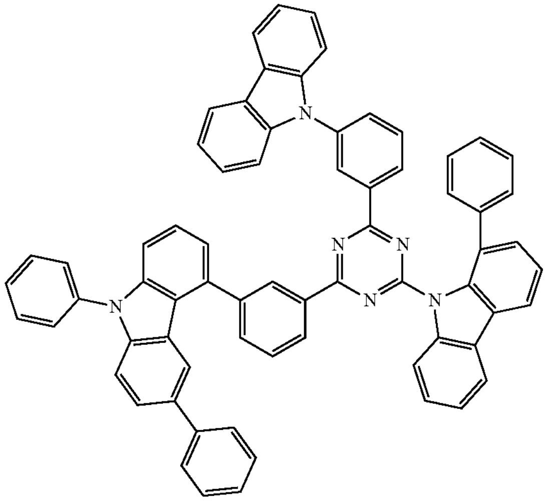
172
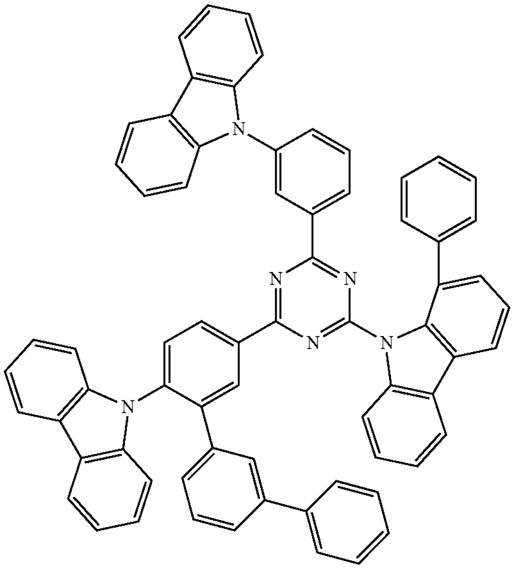
173
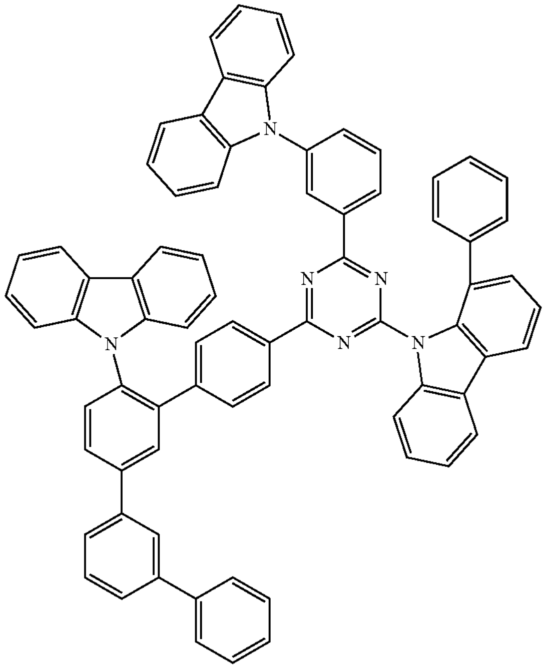

-continued
174
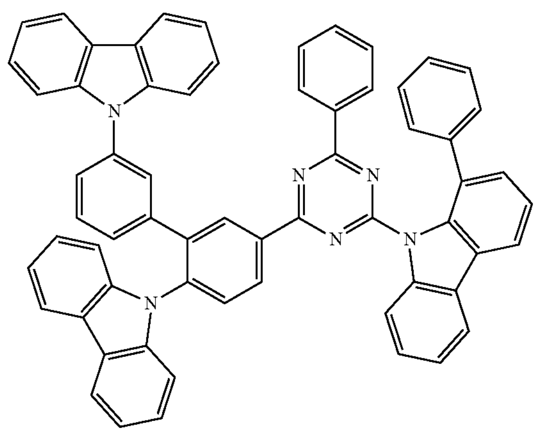
175
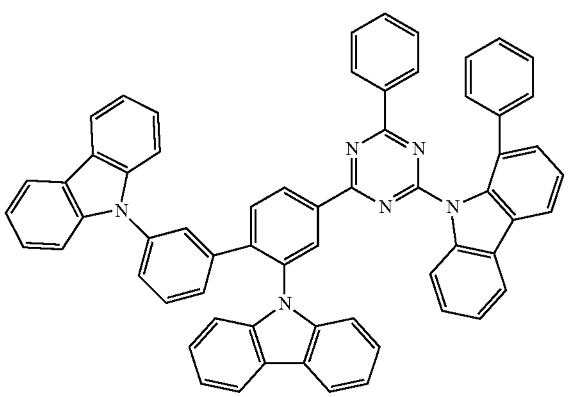
176
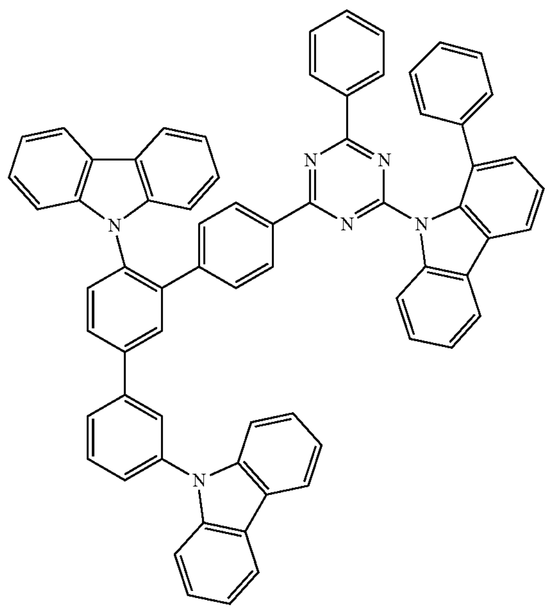
177
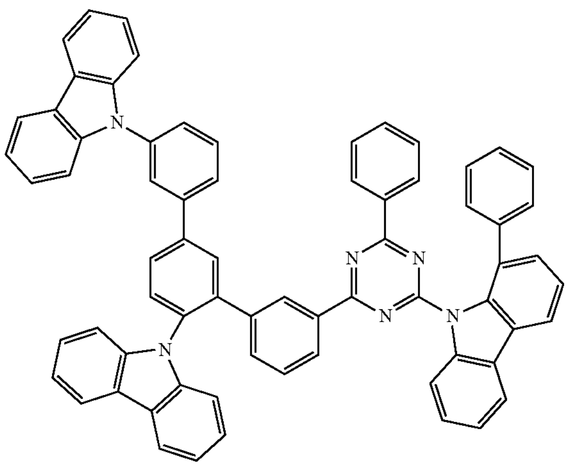
178
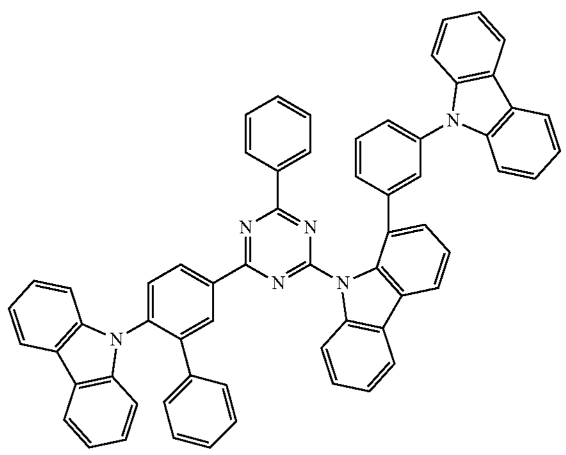
179
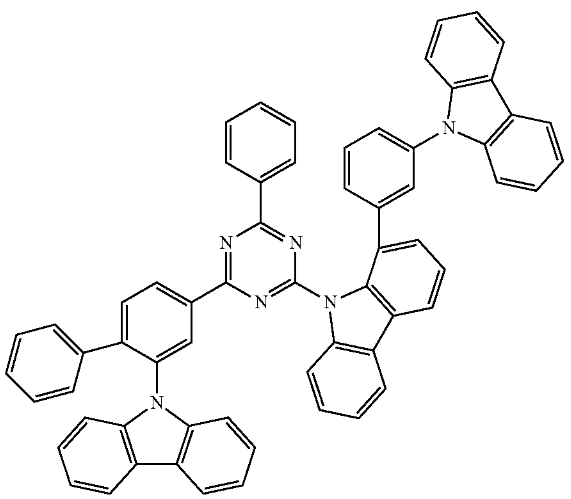

-continued
180
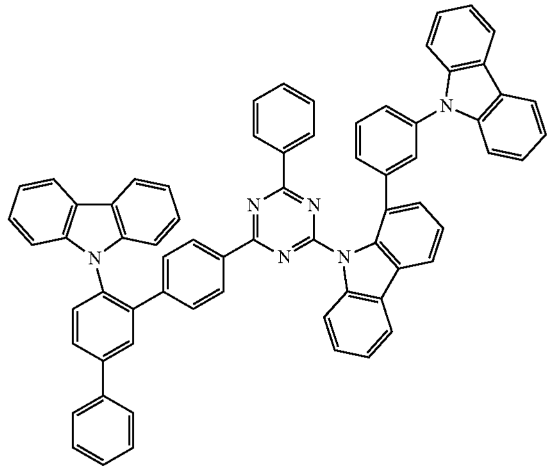
181
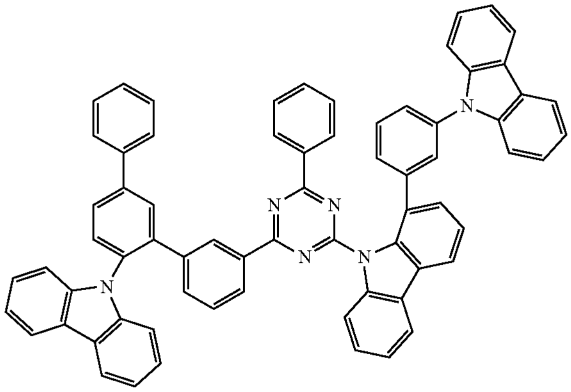
182
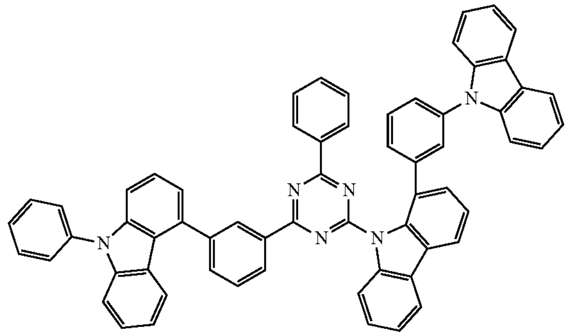
183
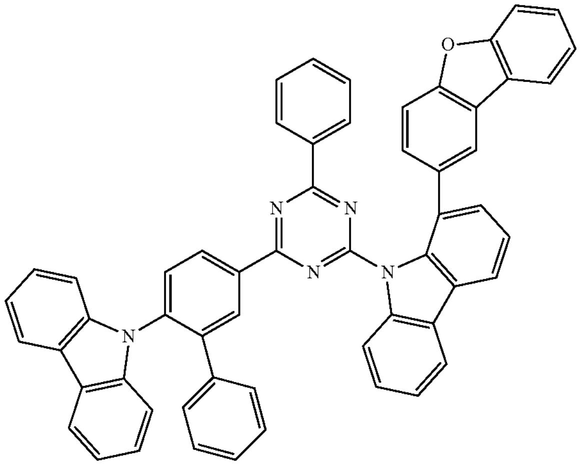
184
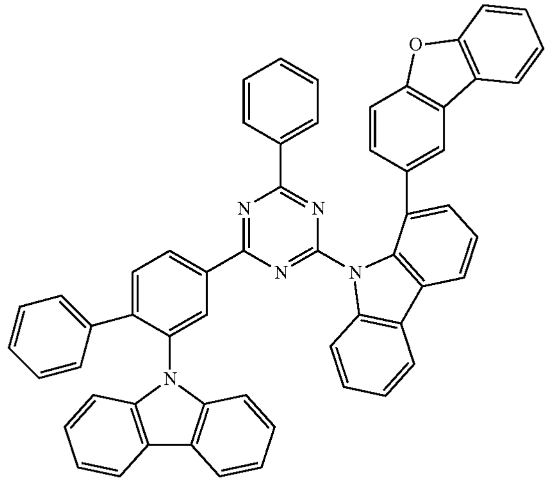
185
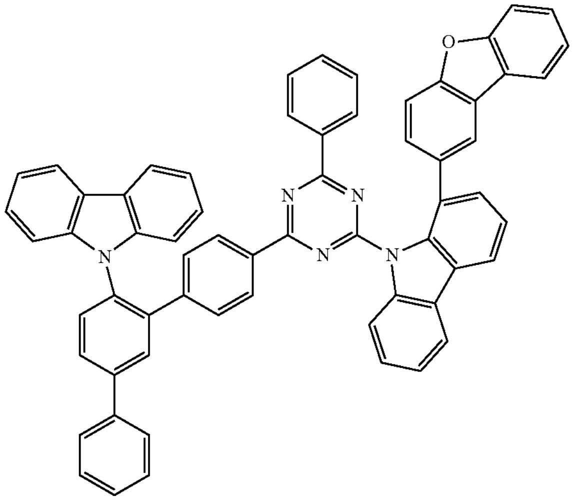

-continued
186
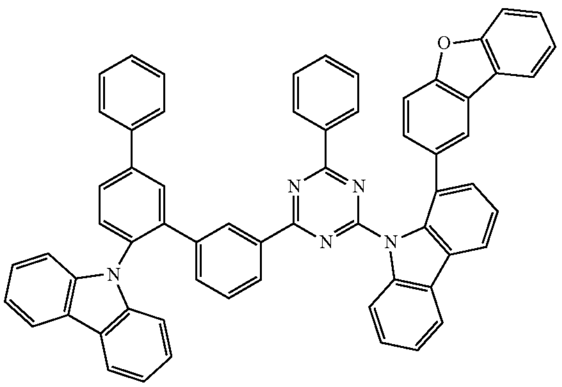
187
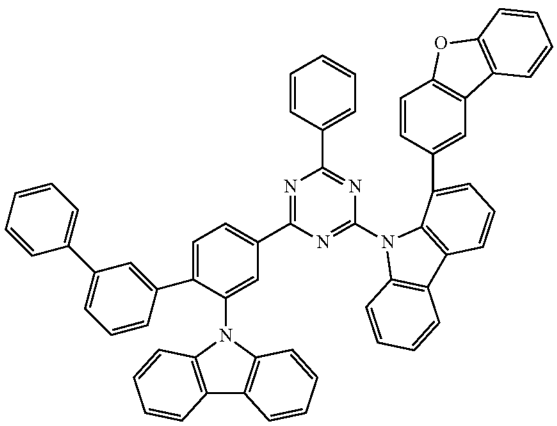
188
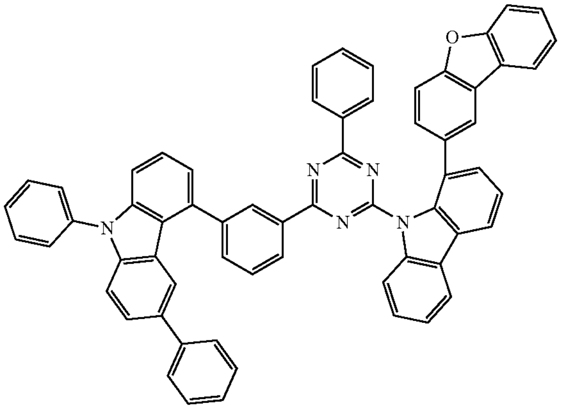
189
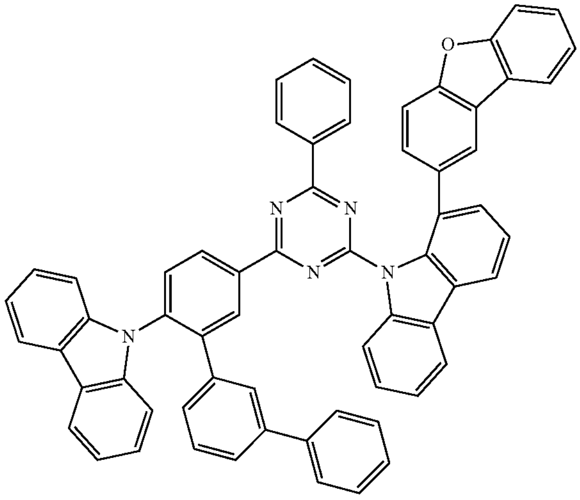
190
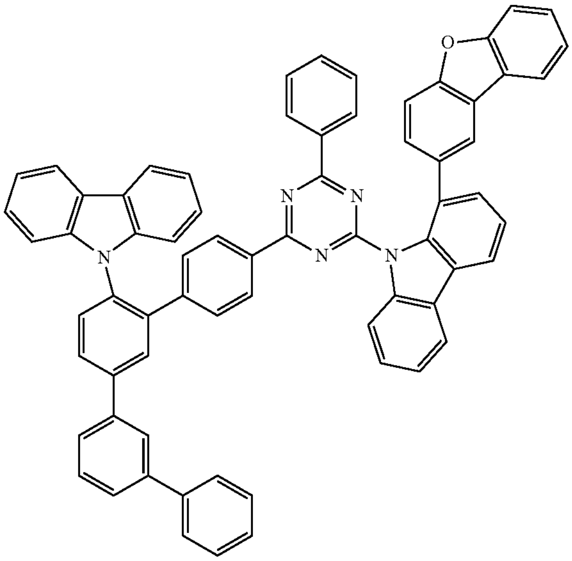
191
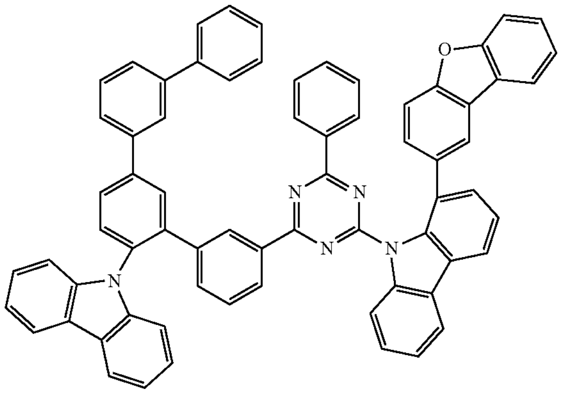

-continued
192
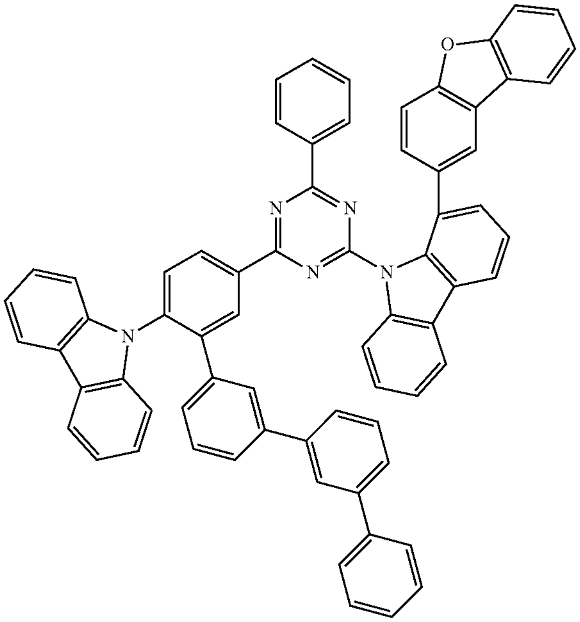
193
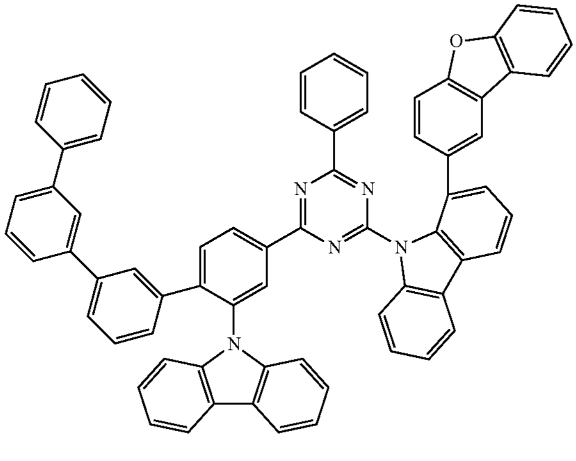
194
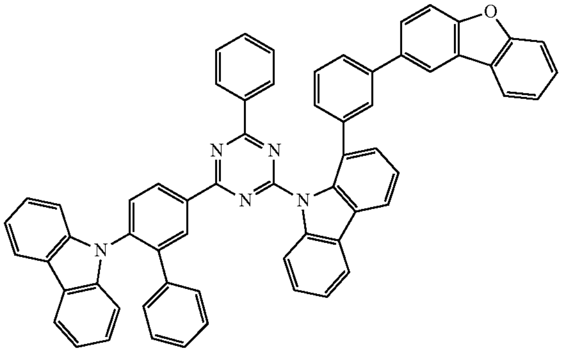
195
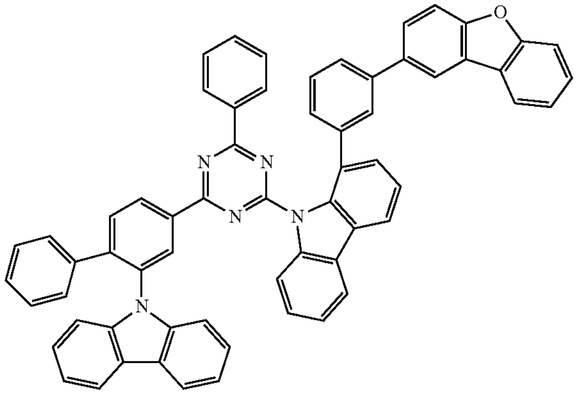

-continued
196
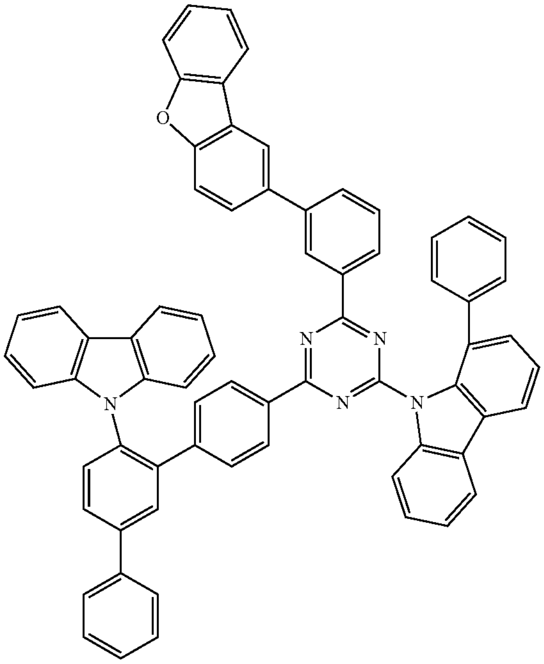
197
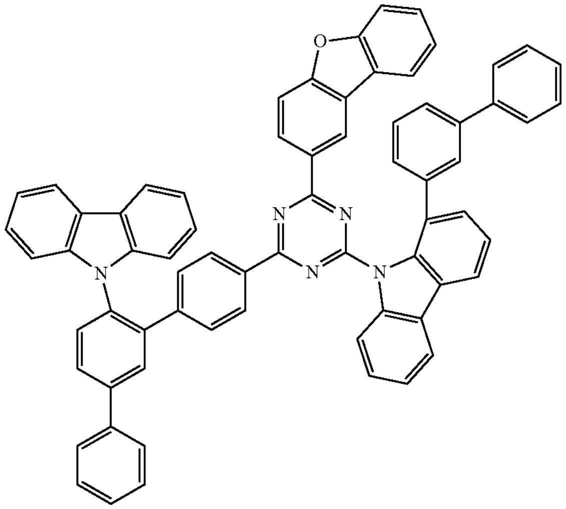
198
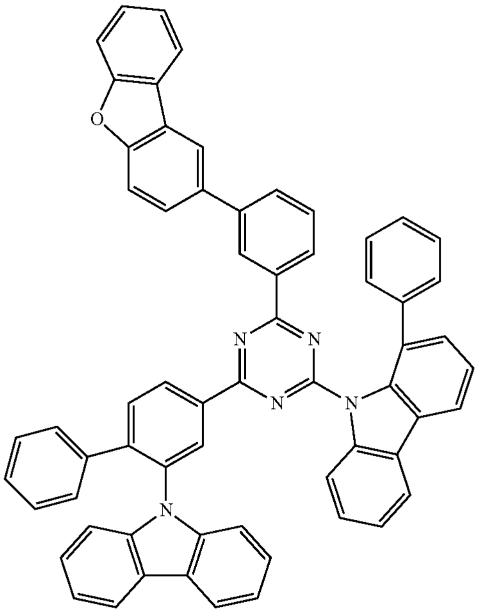
199
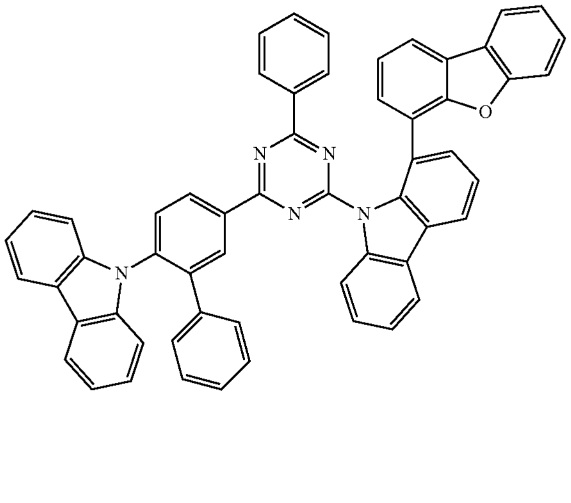

-continued
200
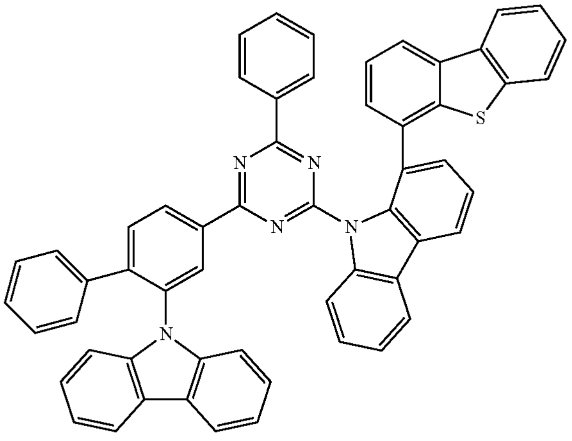
201
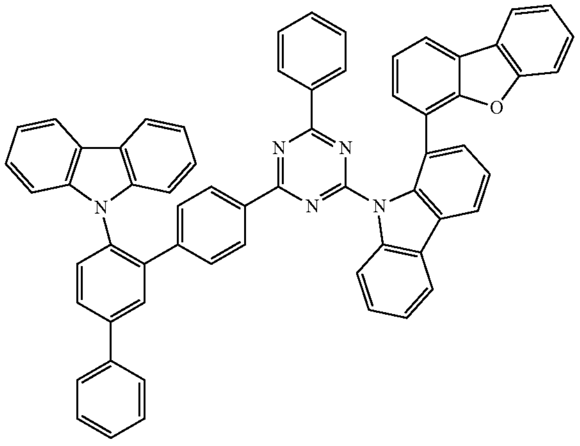
202
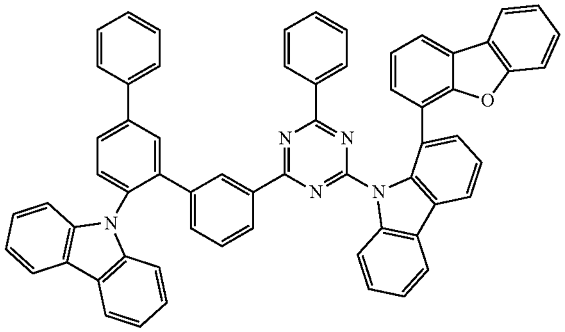
203
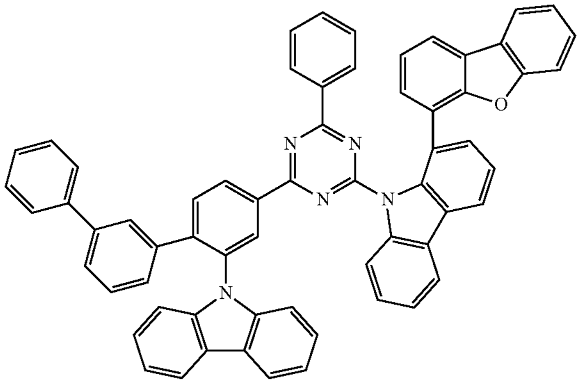
204
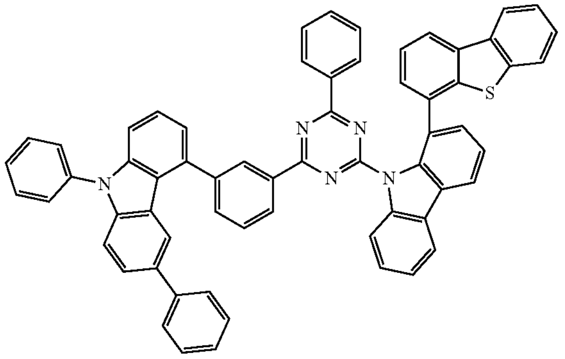
205
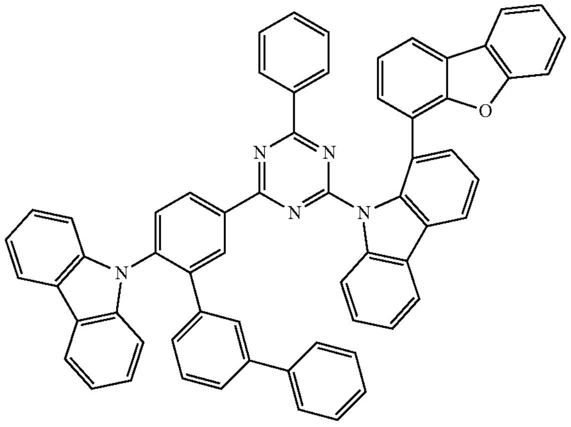

-continued
206
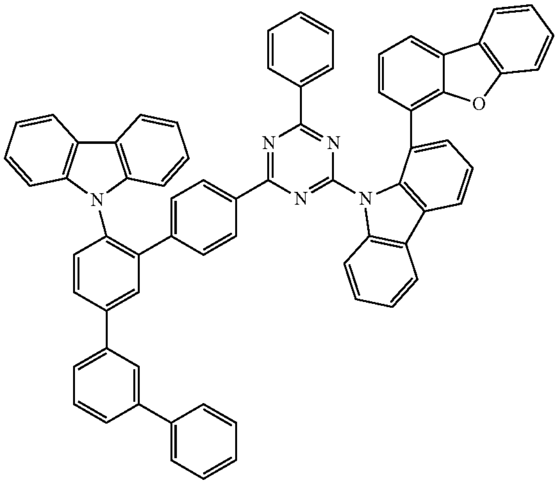
207
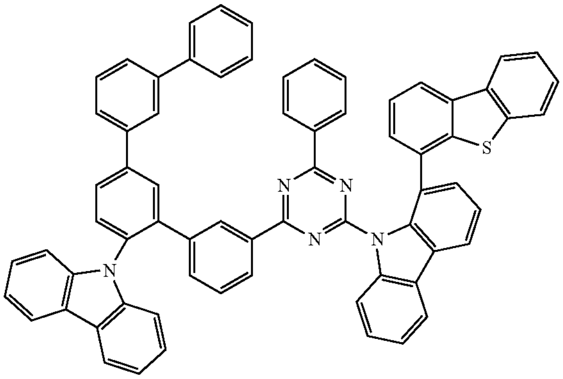
208
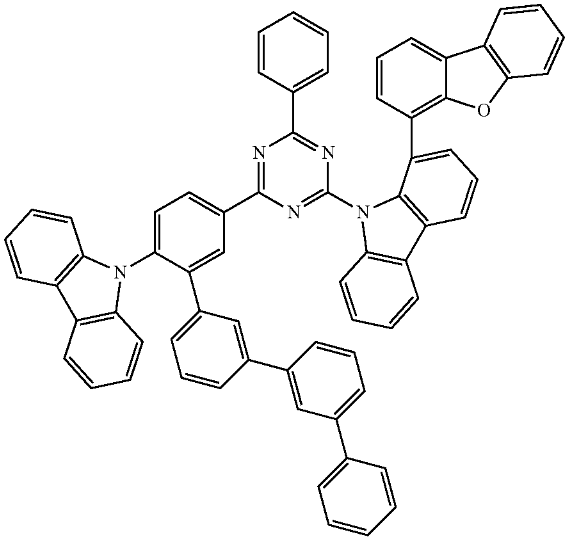
209
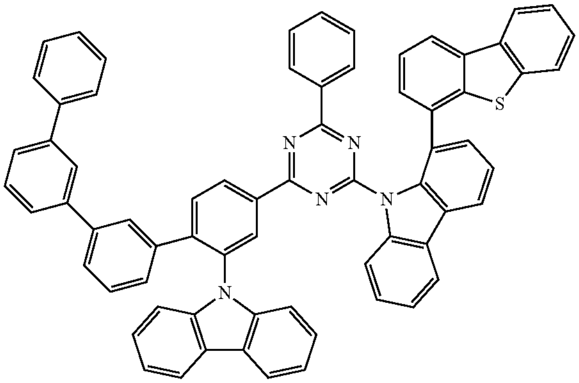
210
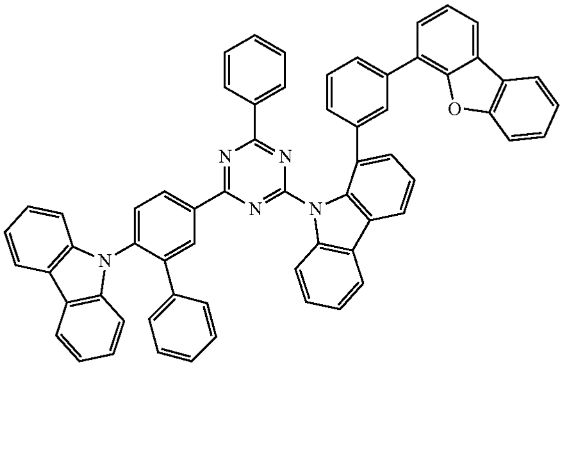
211
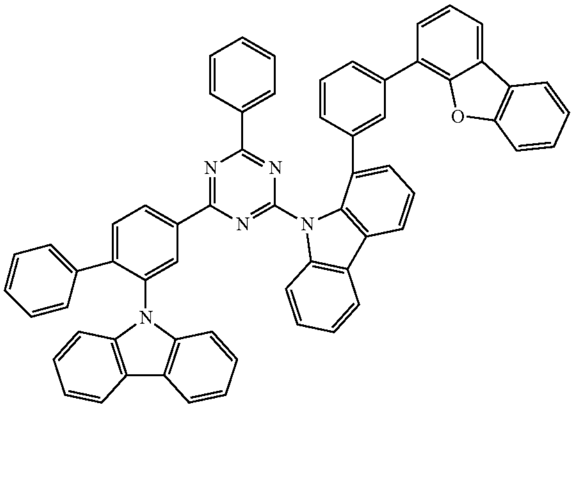

-continued
212
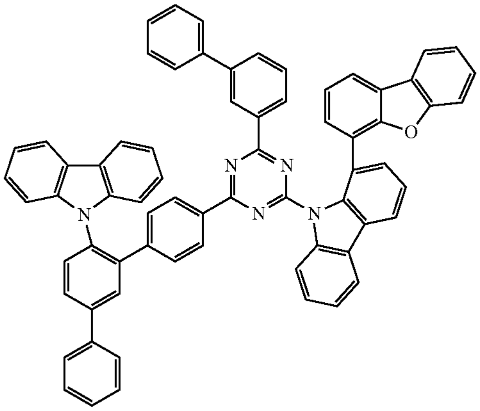
213
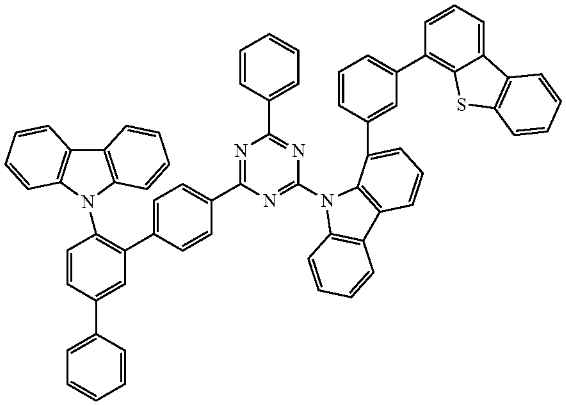
214
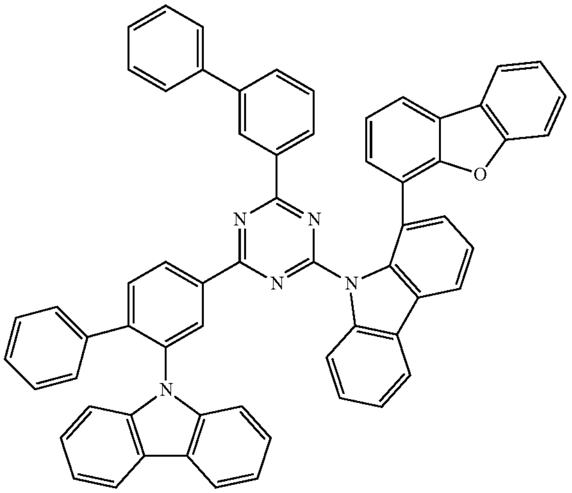
215
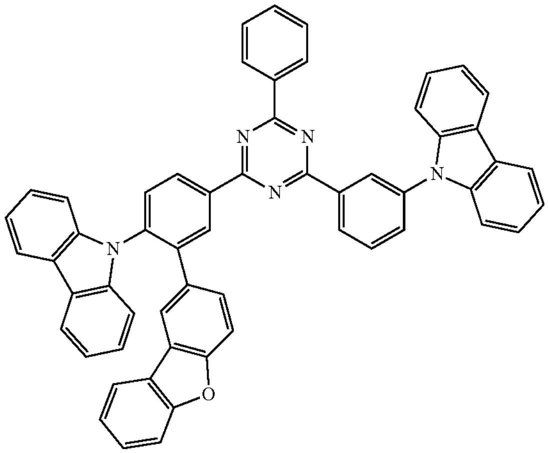
216
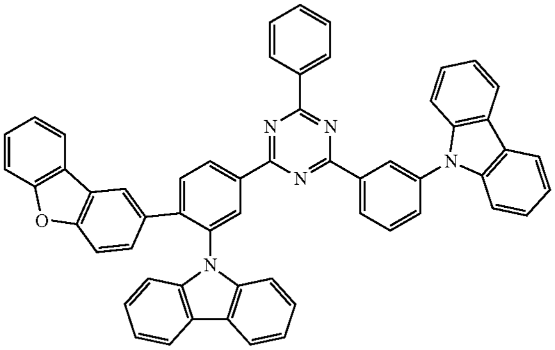
217
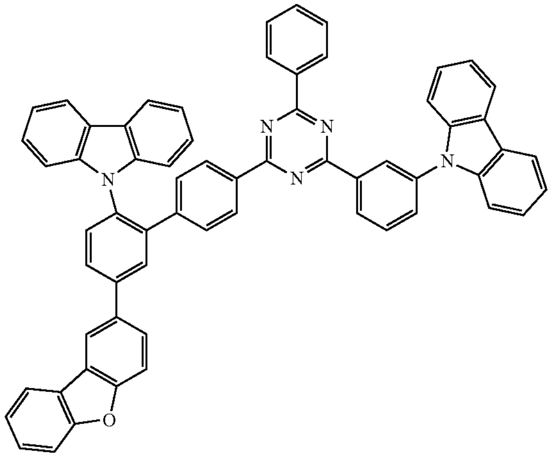

-continued
218
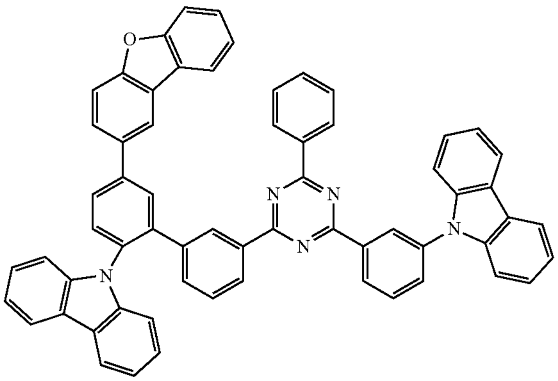
219
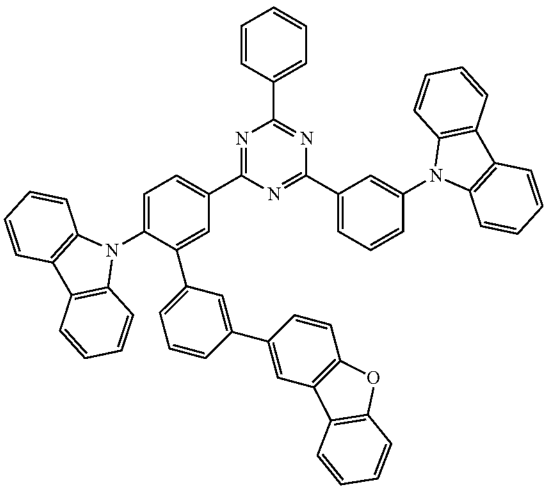
220
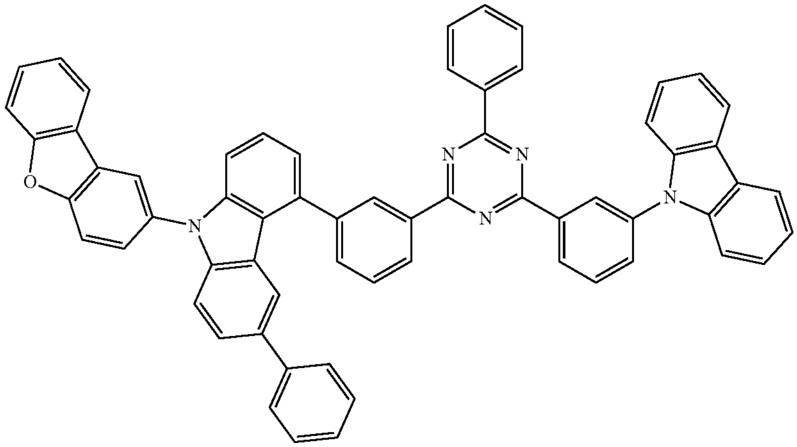
221
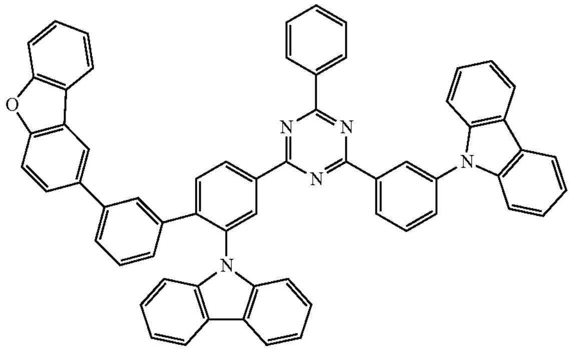
222
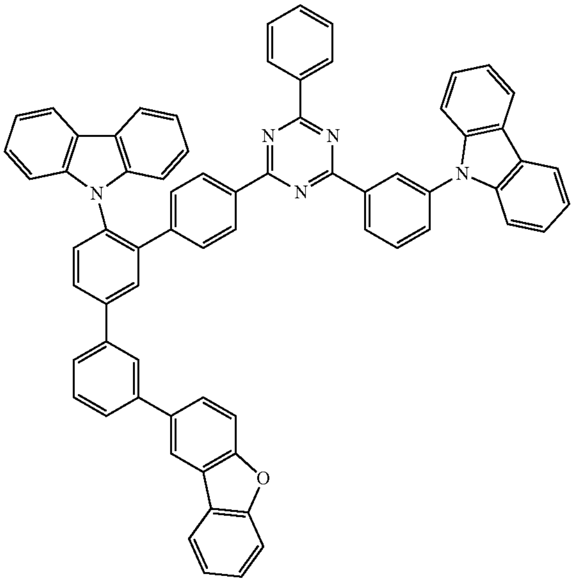

-continued
223
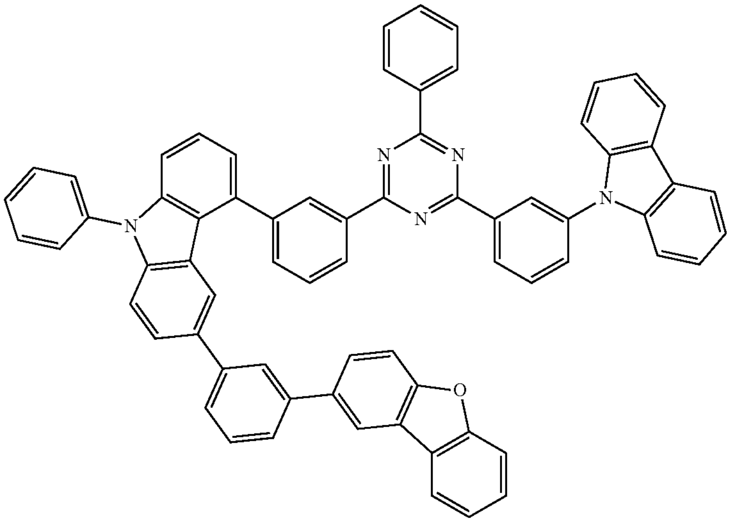
224
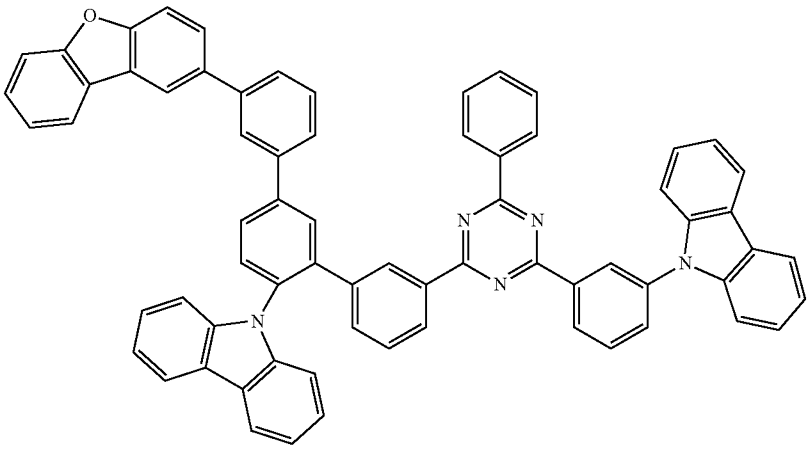
225
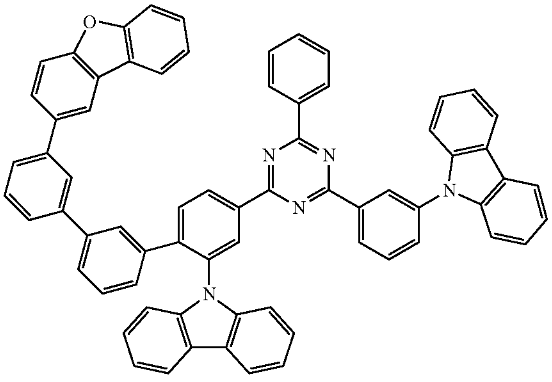
226
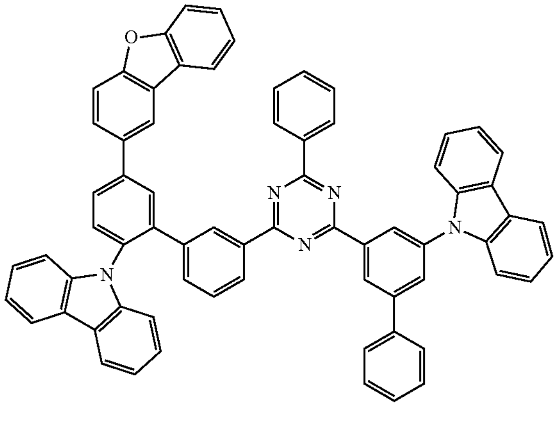

-continued
227
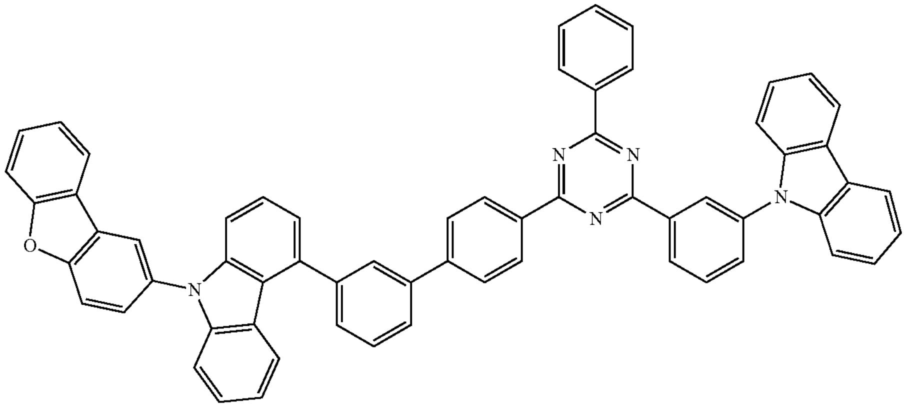
228
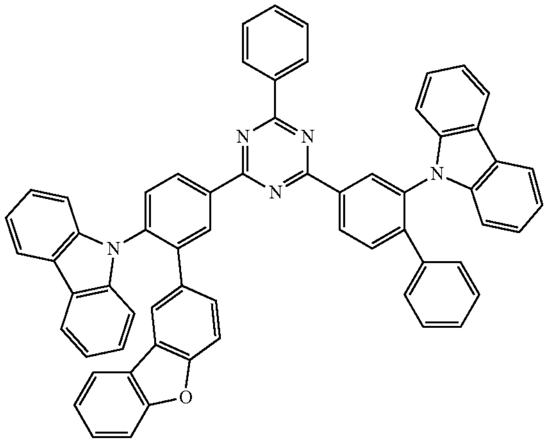
229
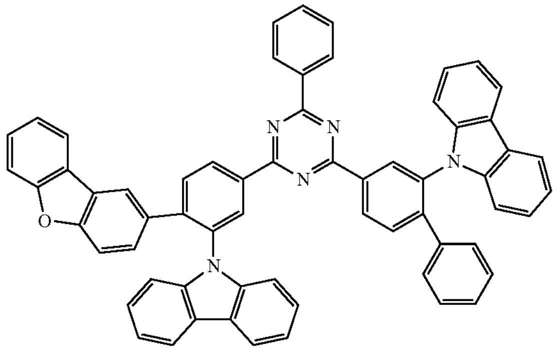
230
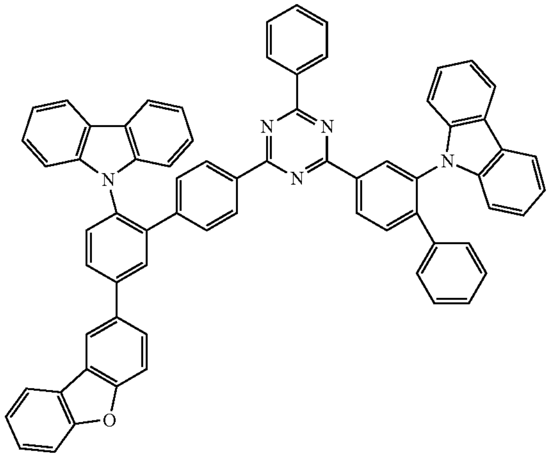
231
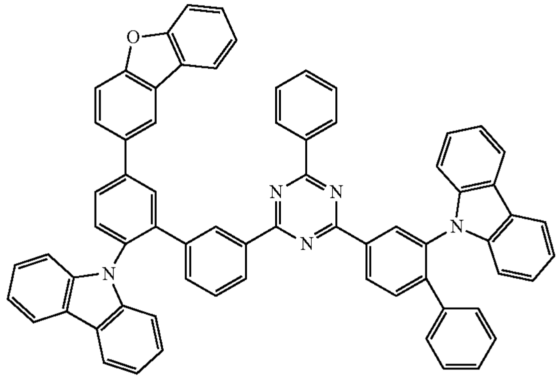

-continued
232
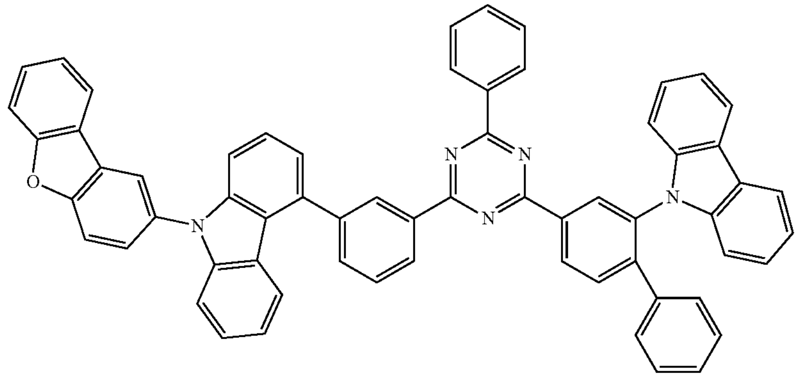
233
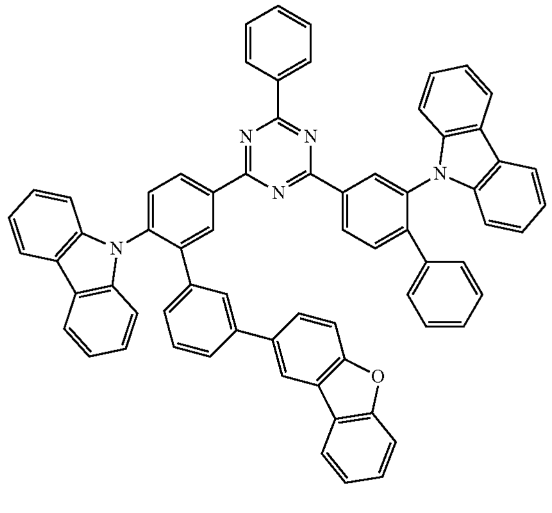
234
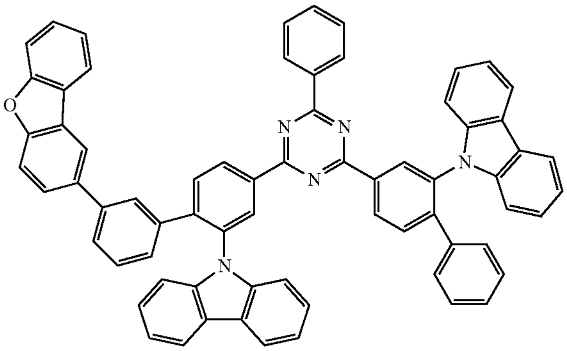
235
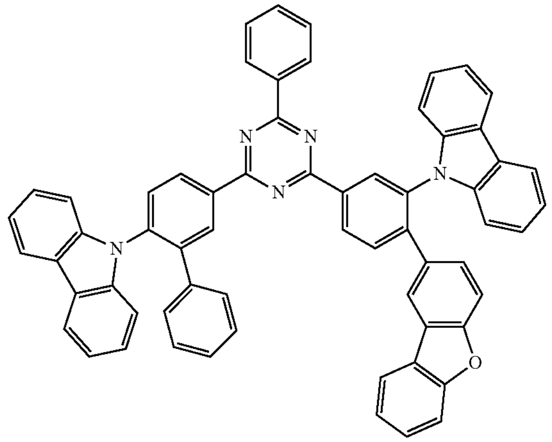
236
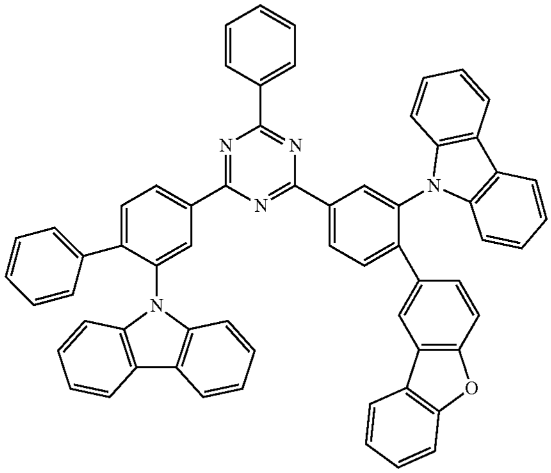

-continued
237
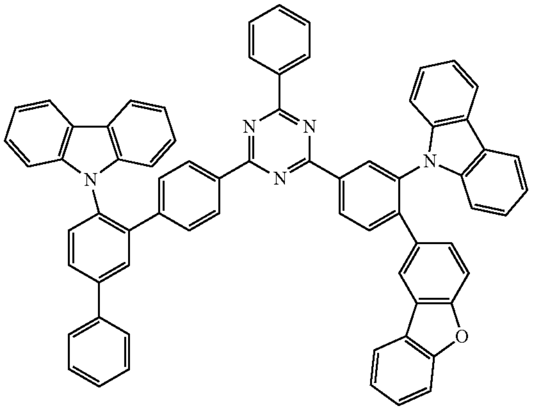
238
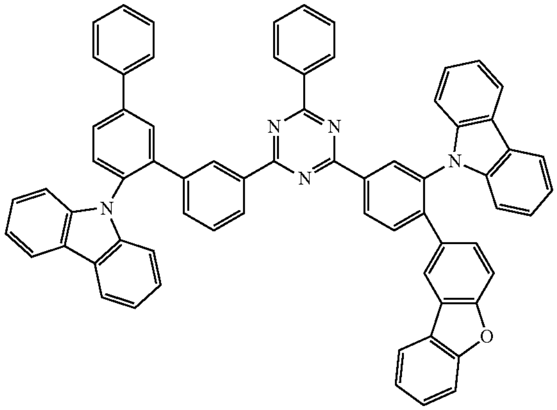
239
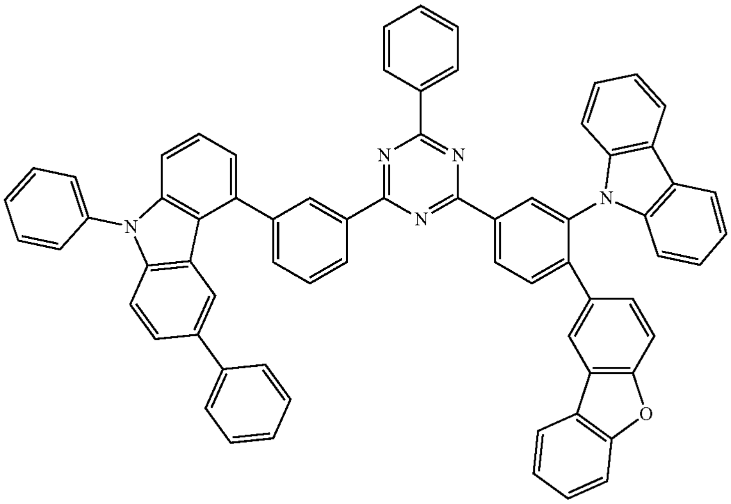
240
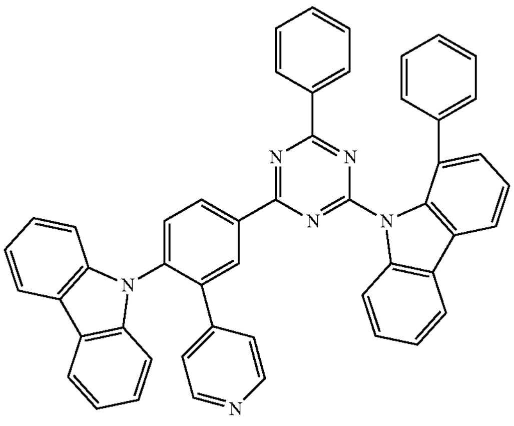
241
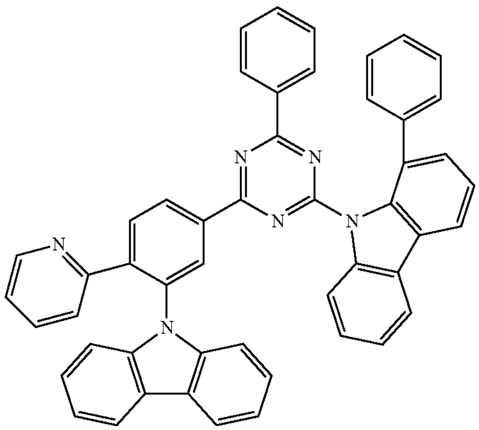

-continued
242
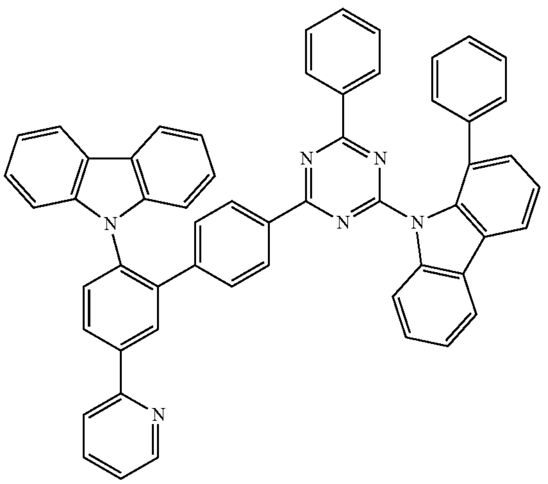
243
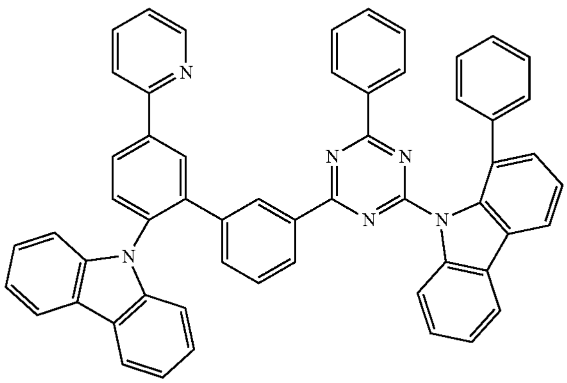
244
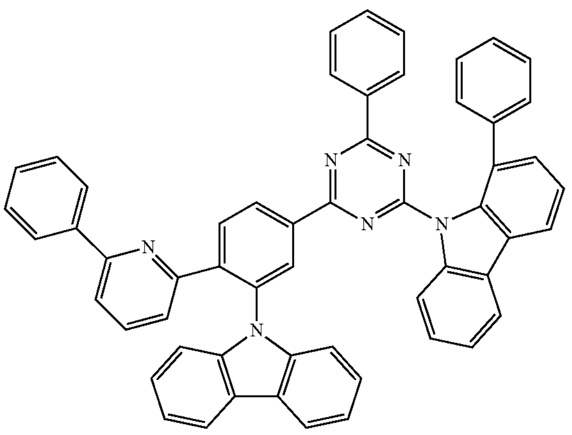
245
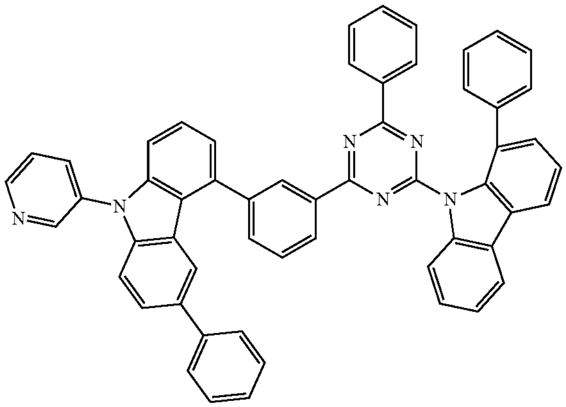
246
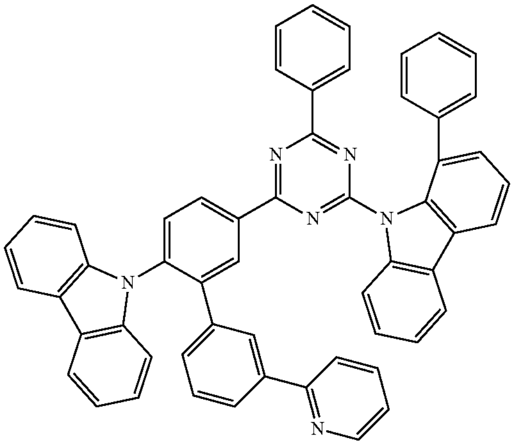
247
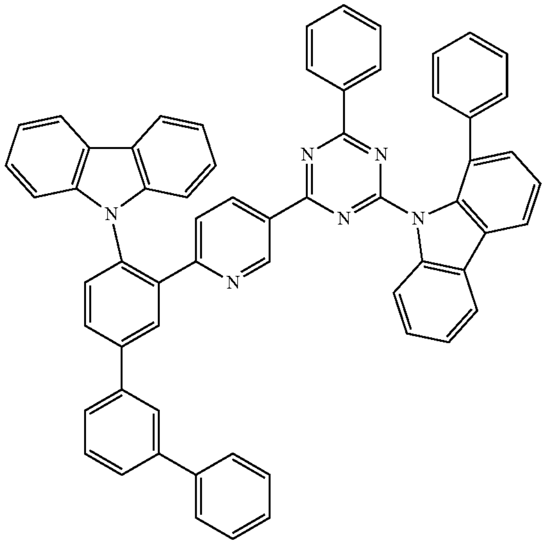

-continued
248
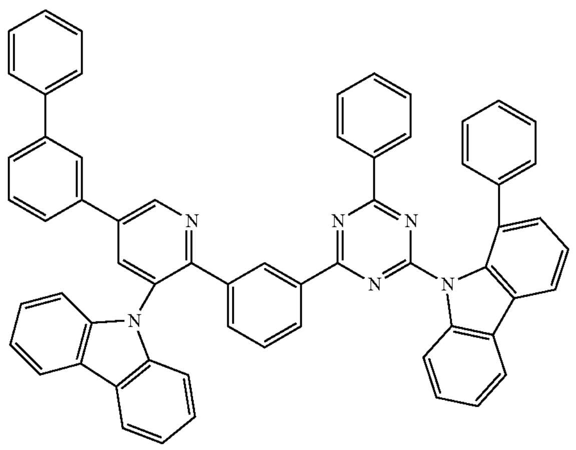
249
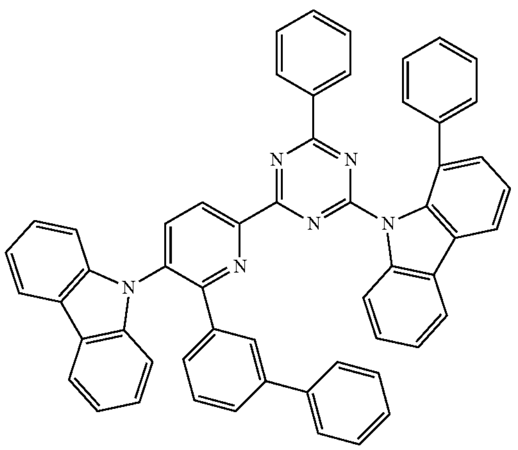
250
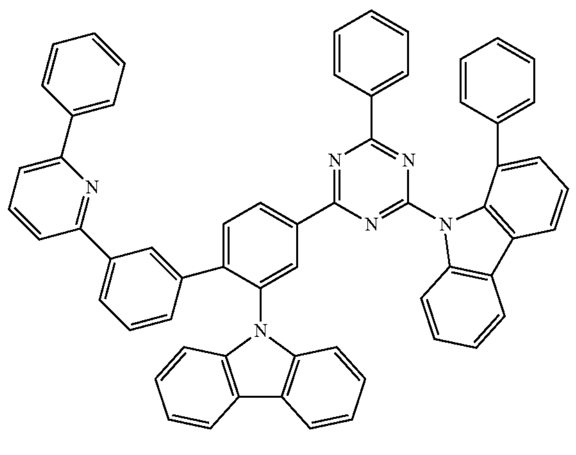
251
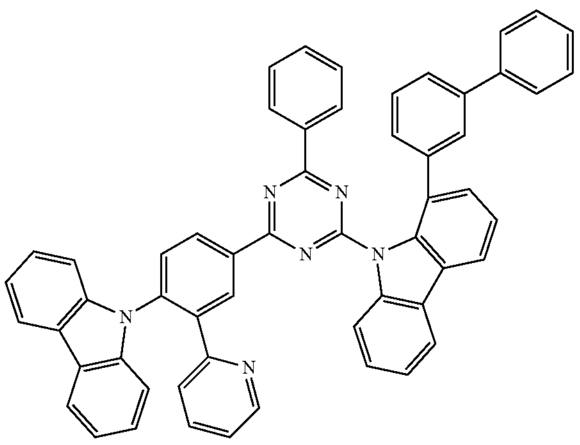
252
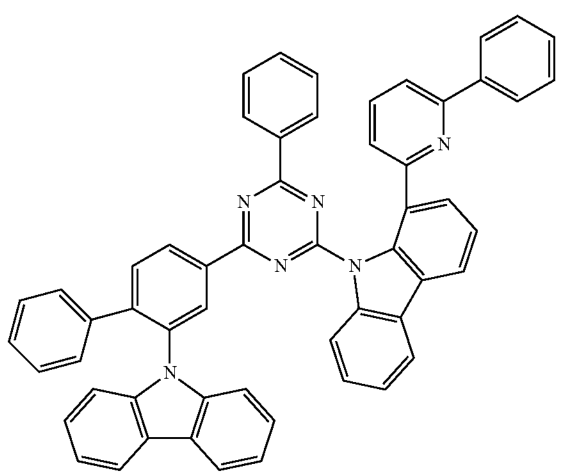
253
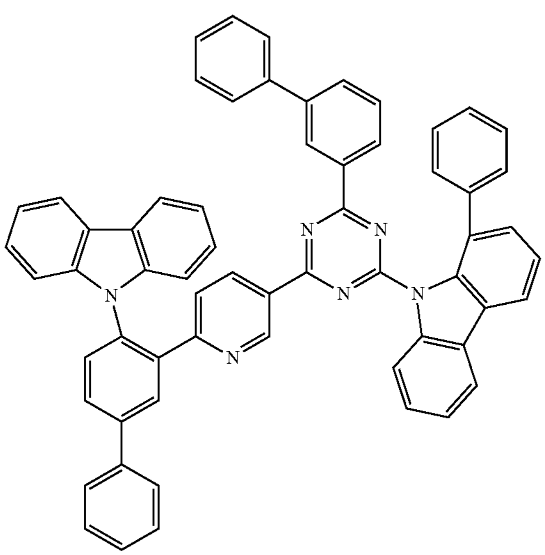

-continued
254
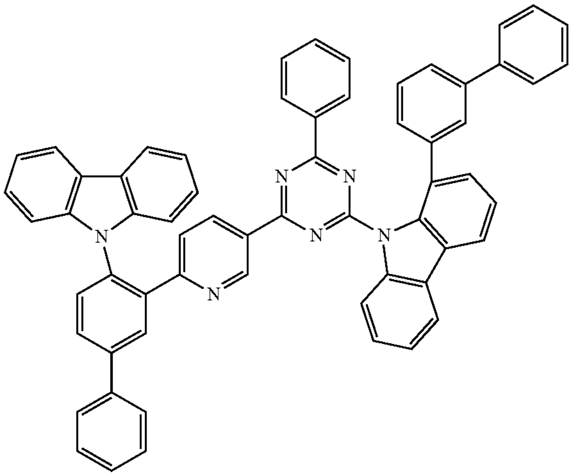
255
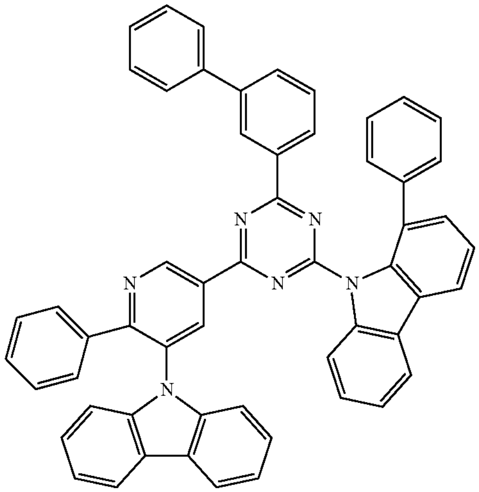
256
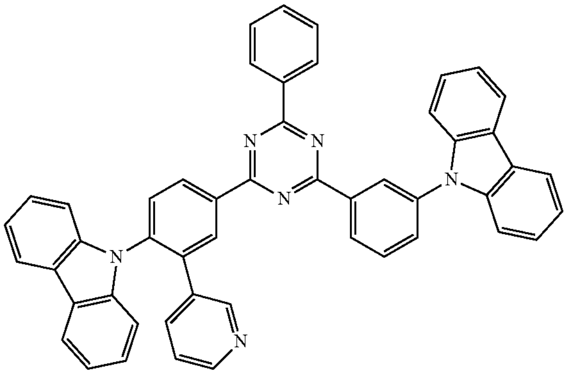
257
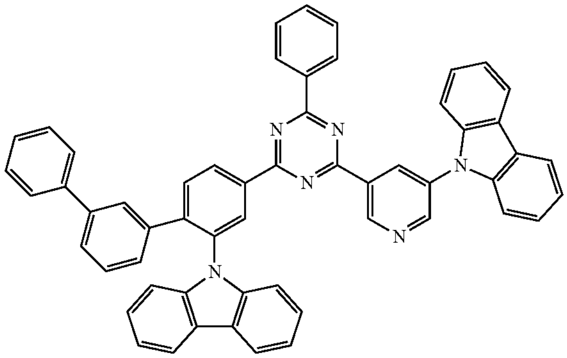
258
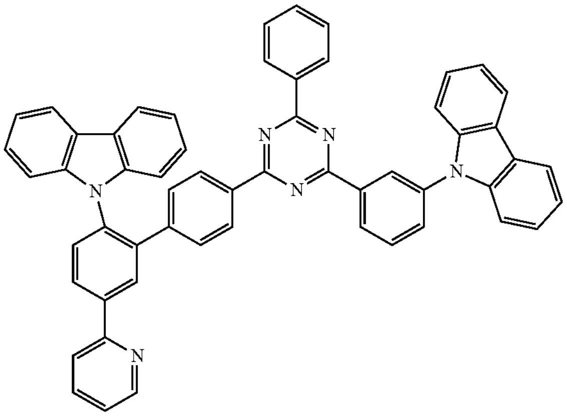
259
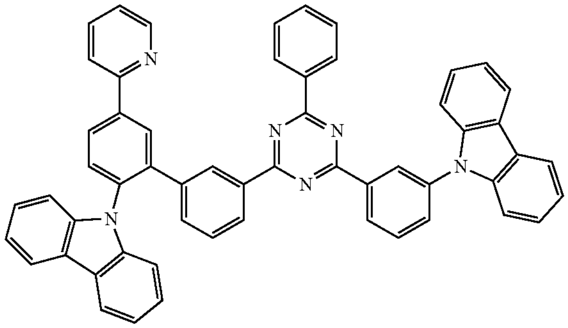

-continued
260
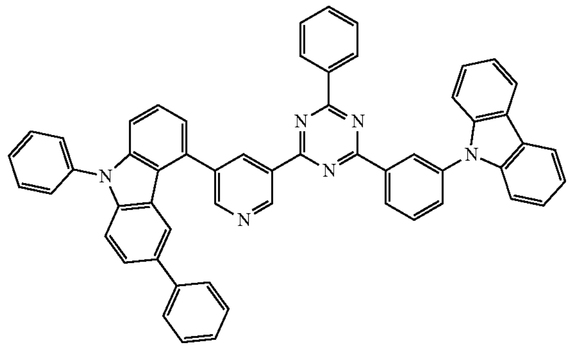
261
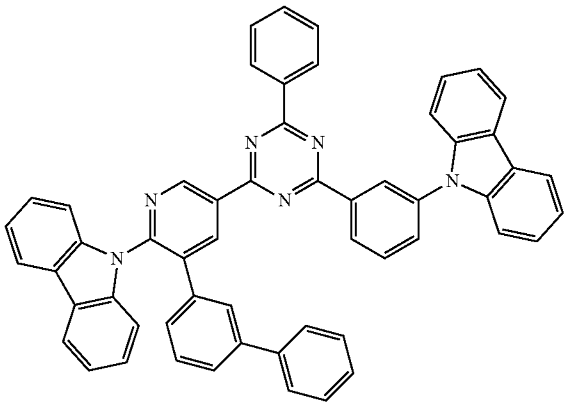
262
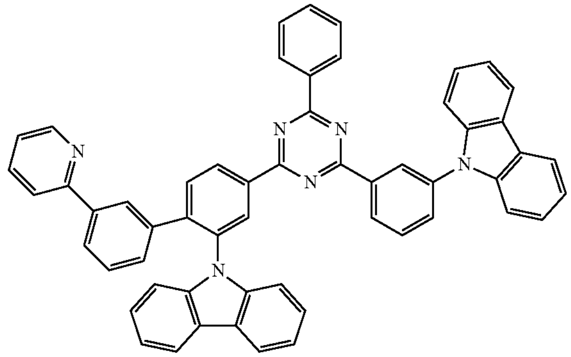
263
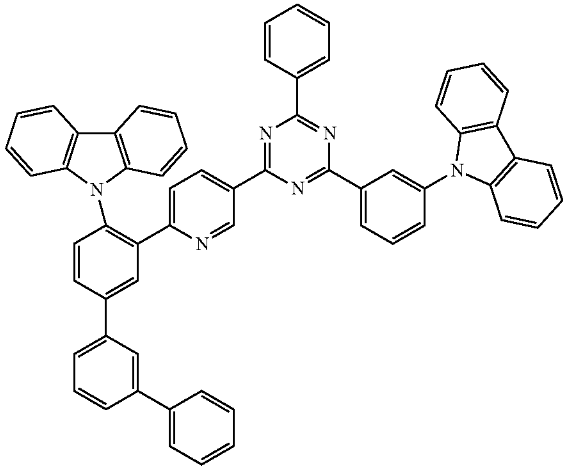
264
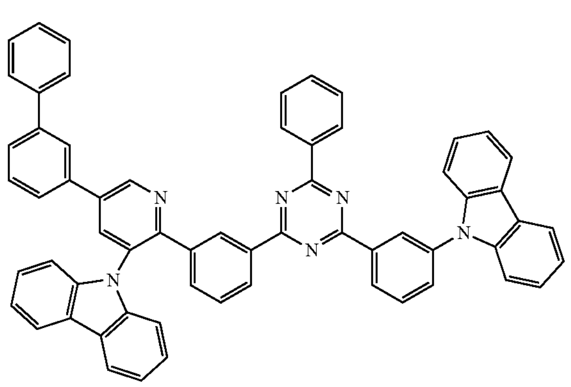
265
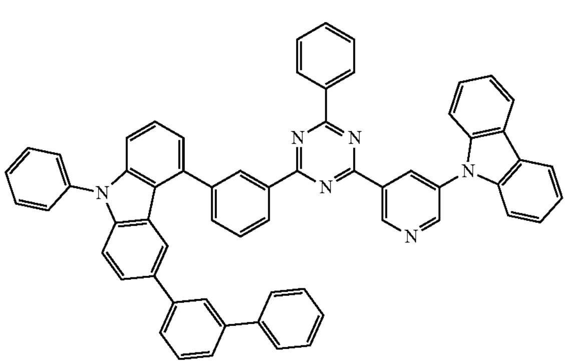

-continued
266
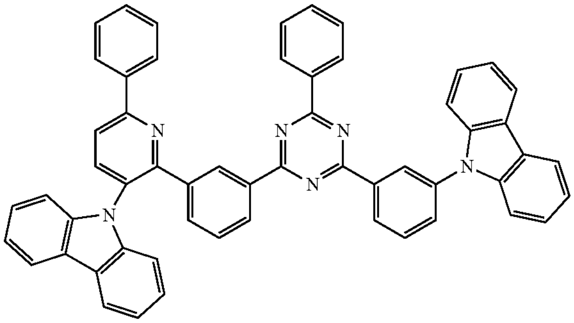
267
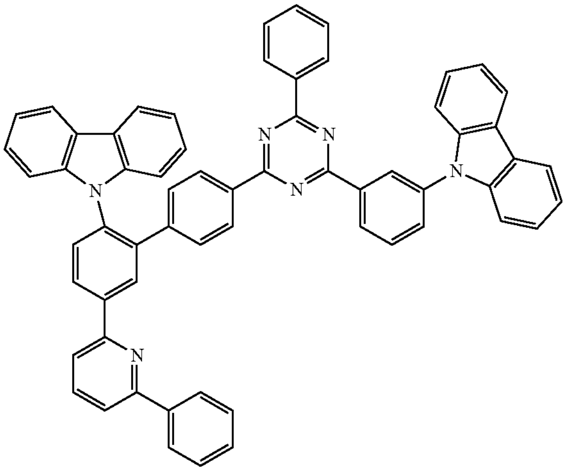
268
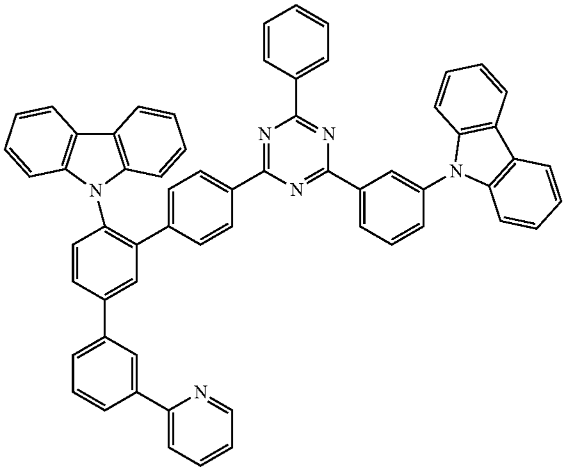
269
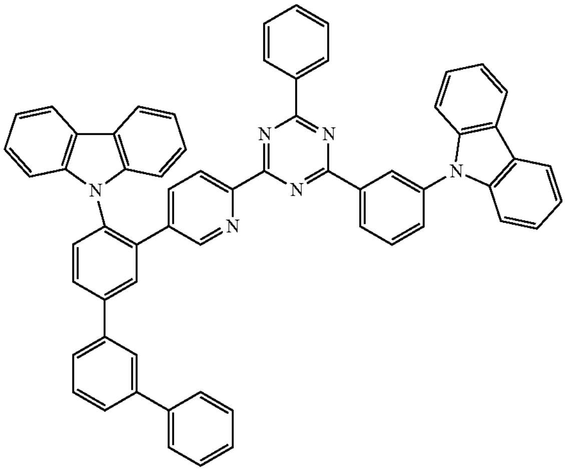
270
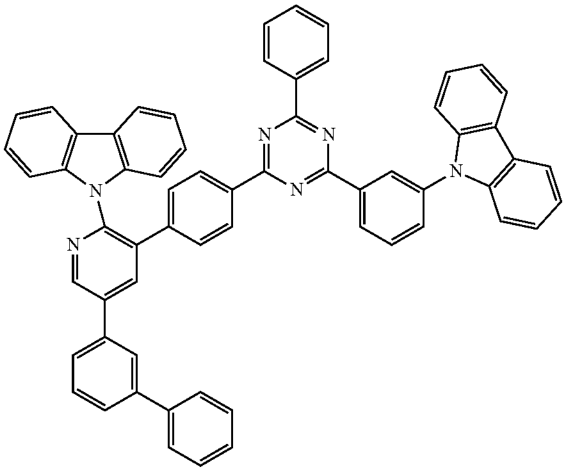
271
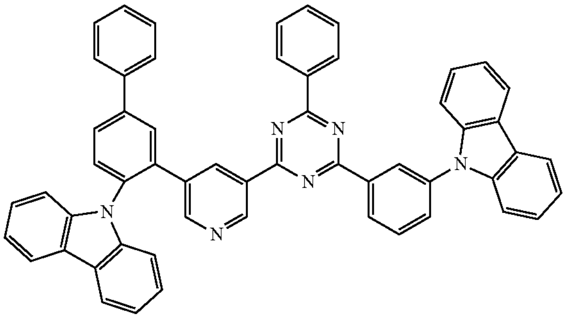

-continued
272
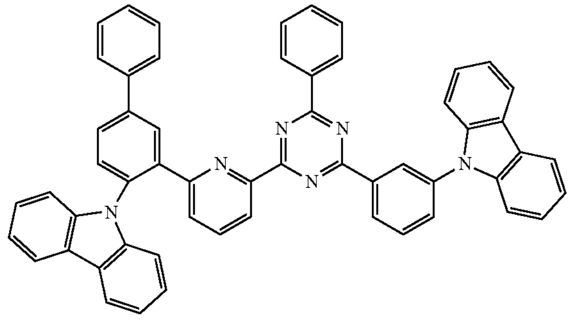
273
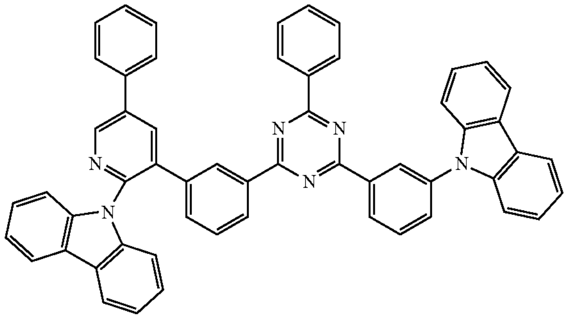
274
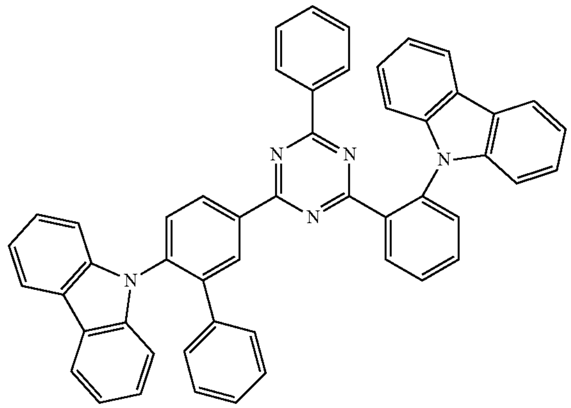
275
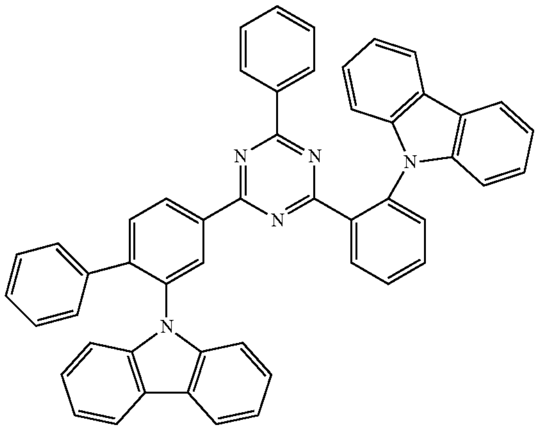
276
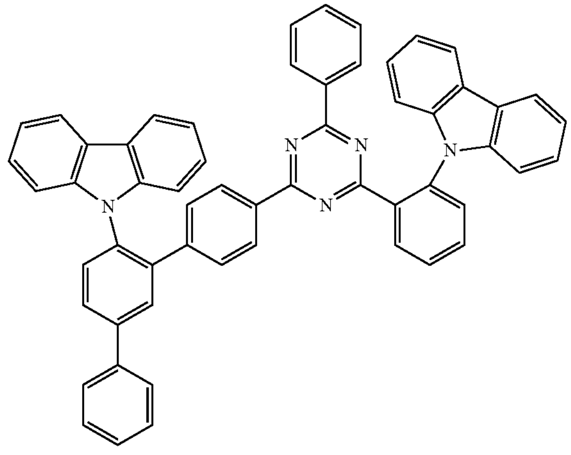
277
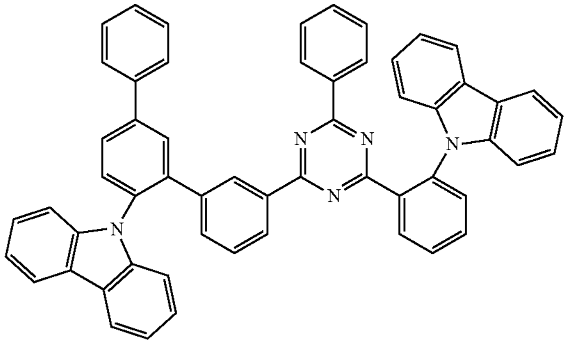

-continued
278
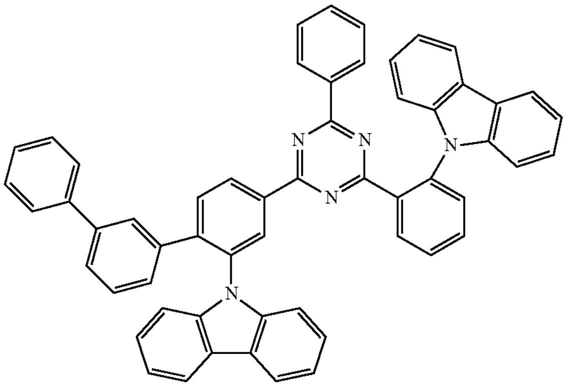
279
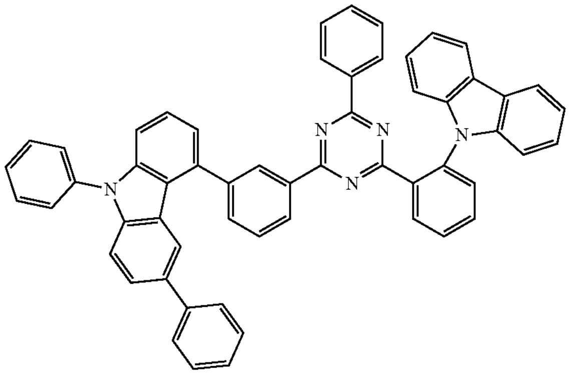
280
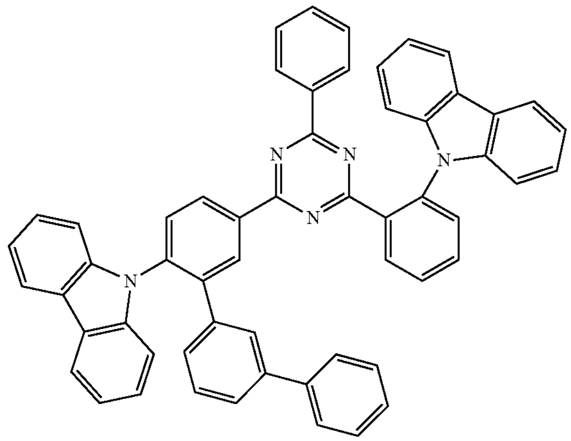
281
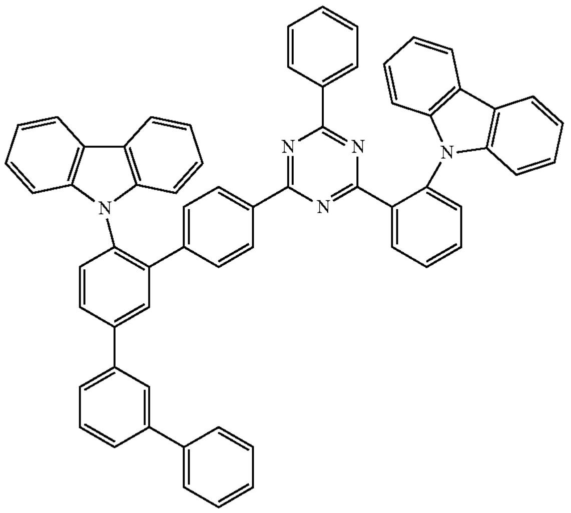
282
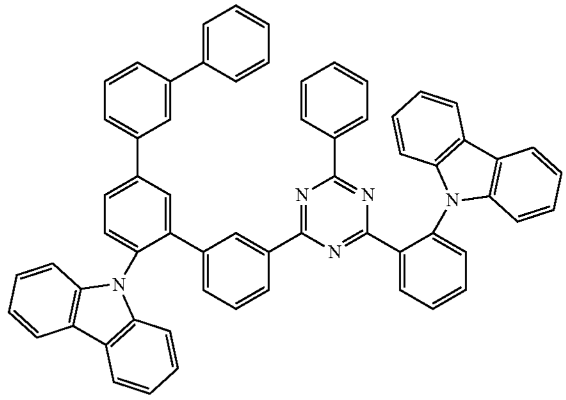
283
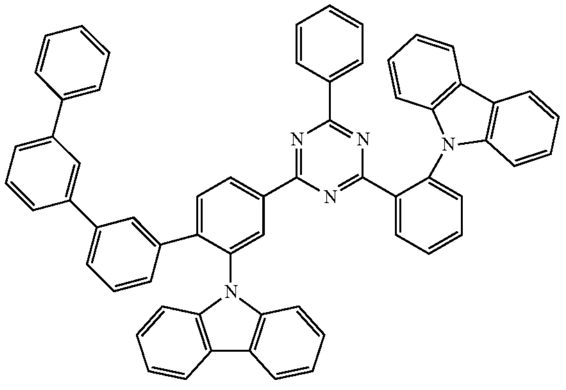

-continued
284
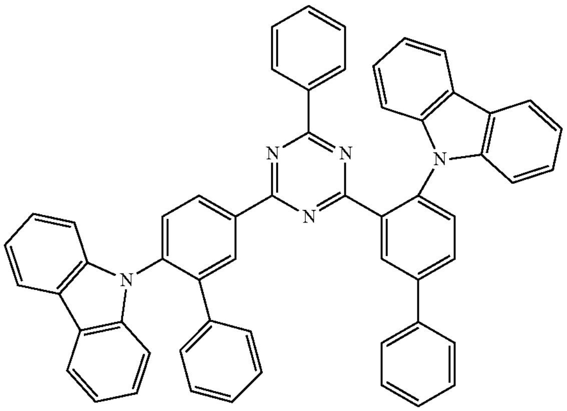
285
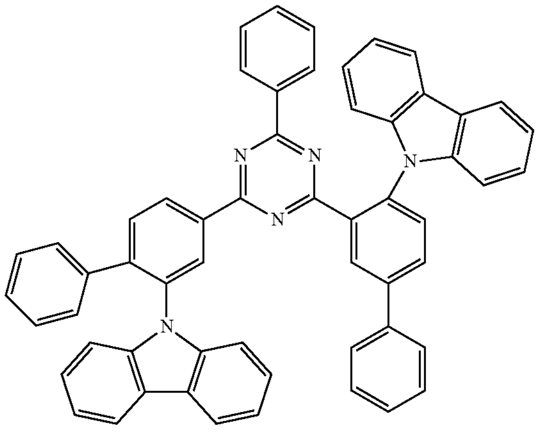
286
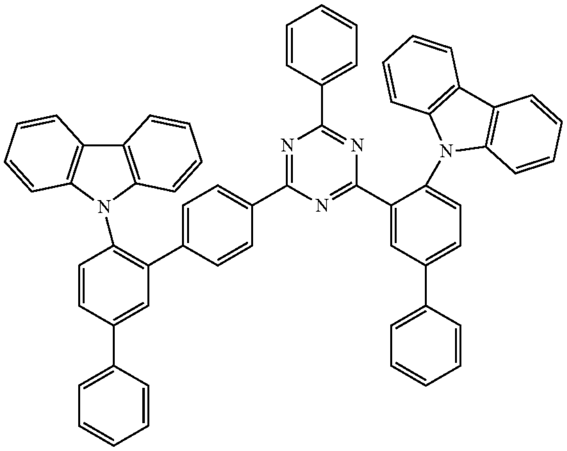
287
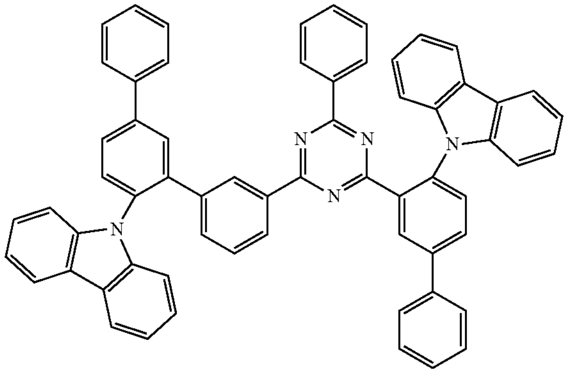
288
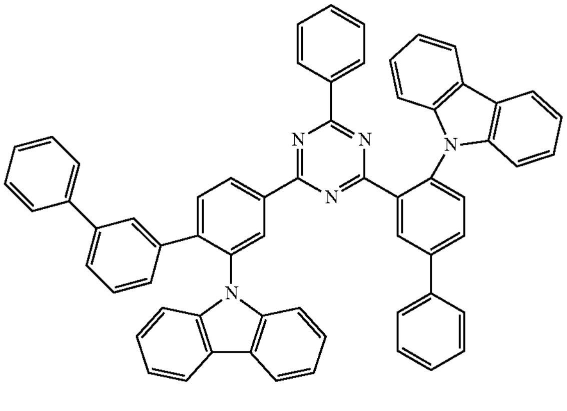
289
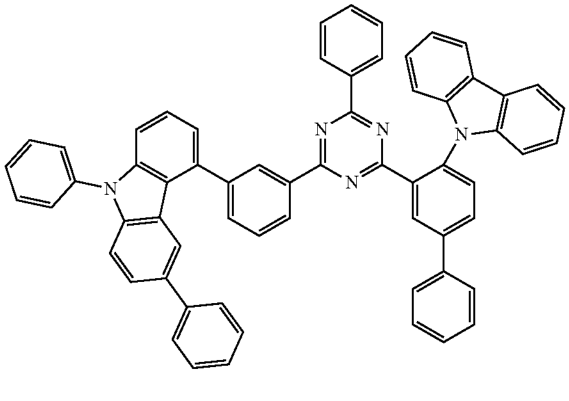

-continued
290
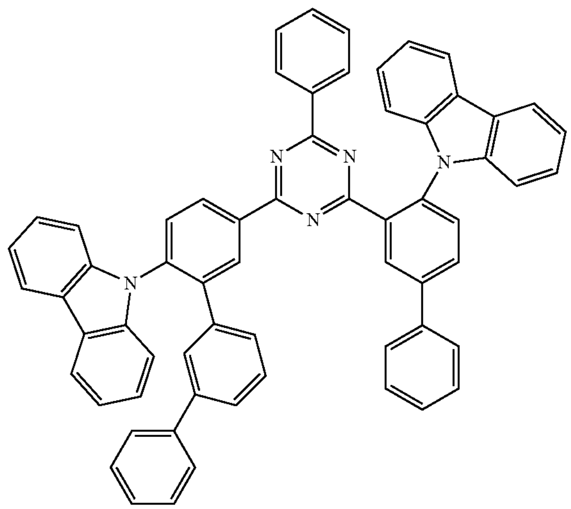
291
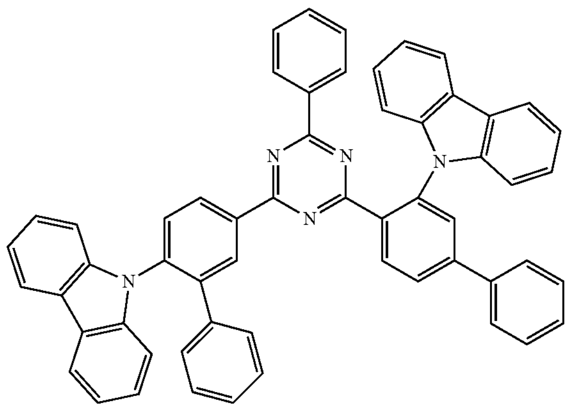
292
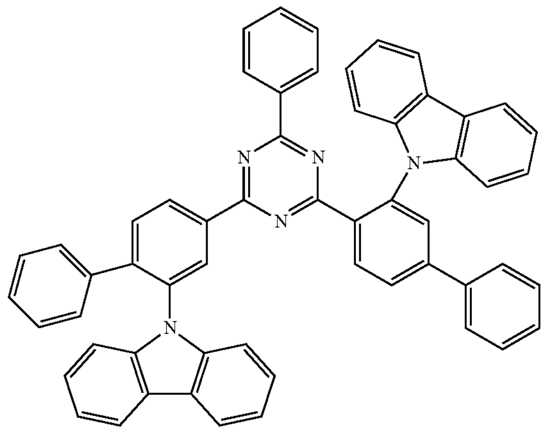
293
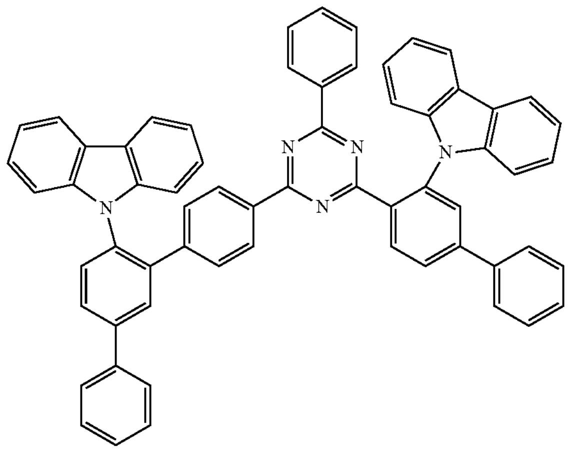
294
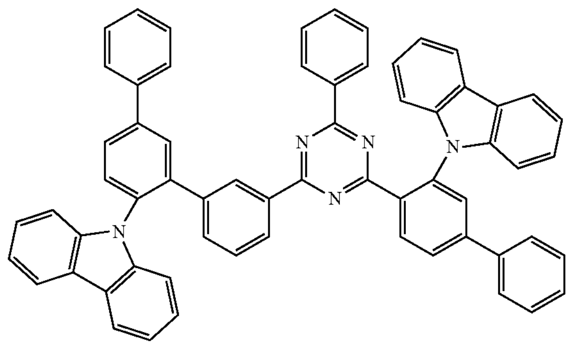
295
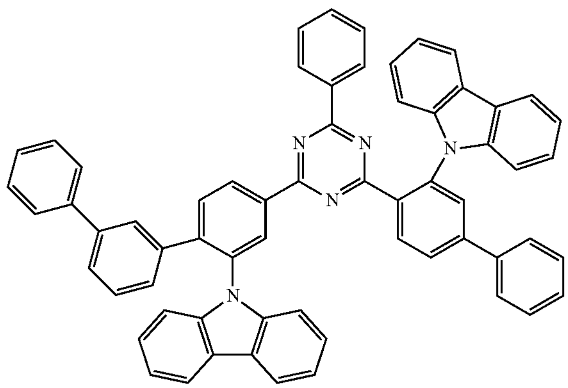

-continued
296
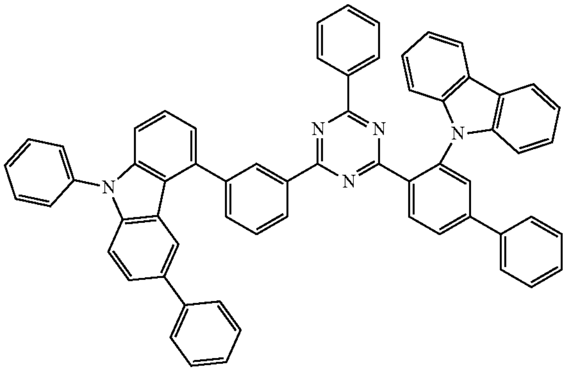
297
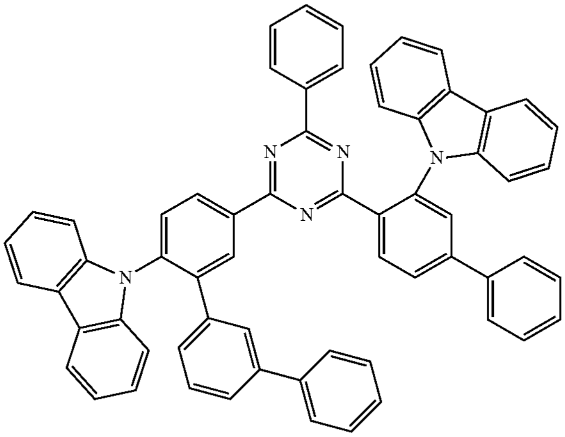
298
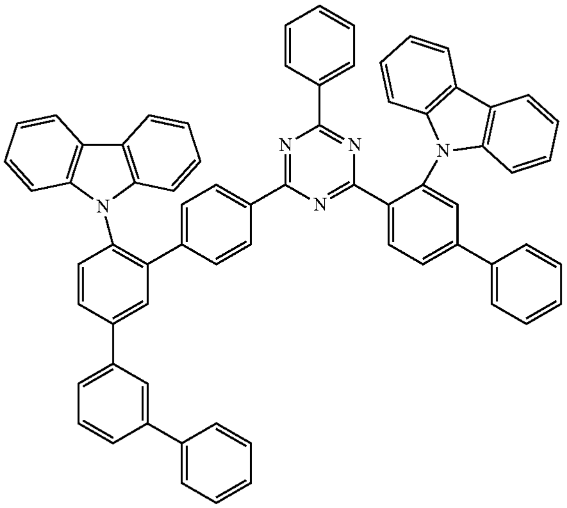
299
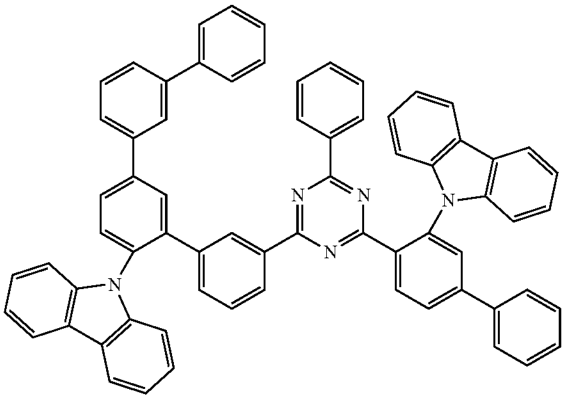
300
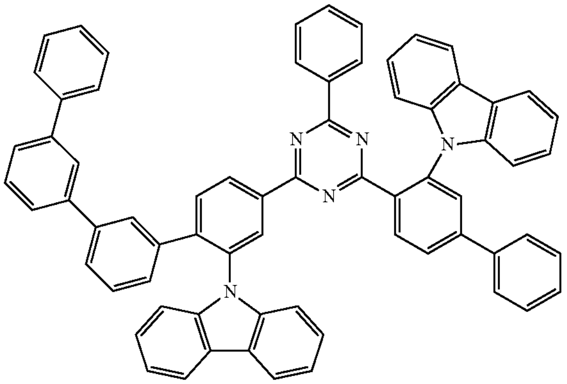
301
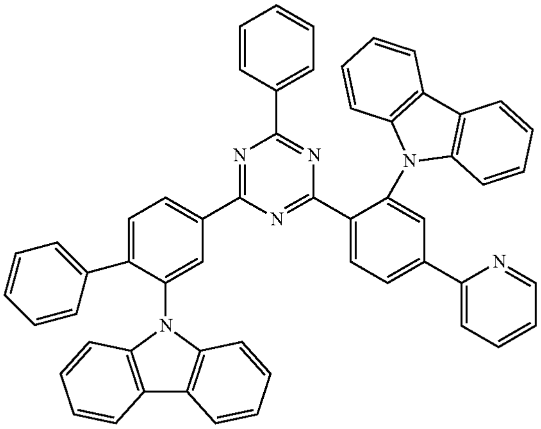

-continued
302
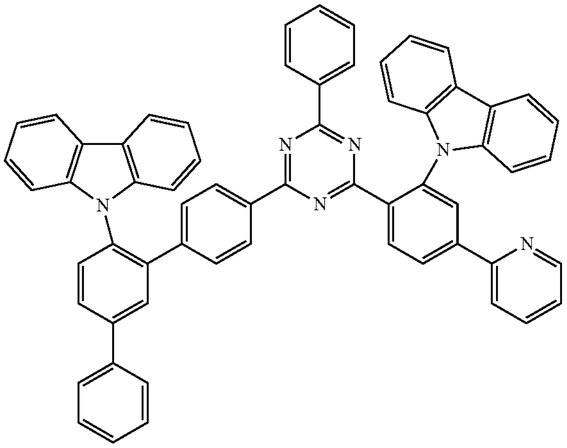
303
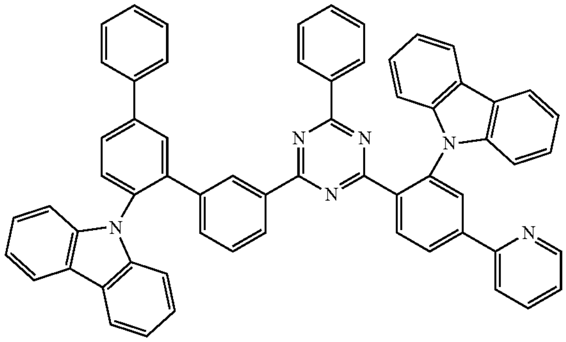
304
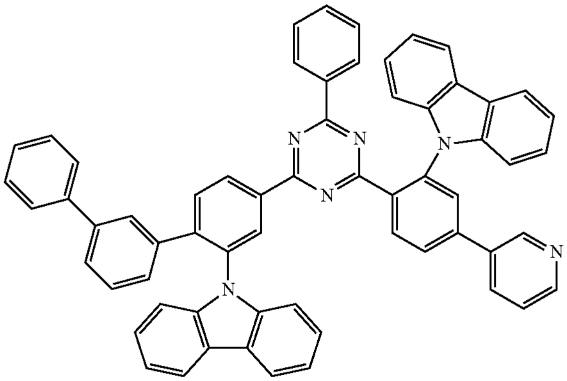
305
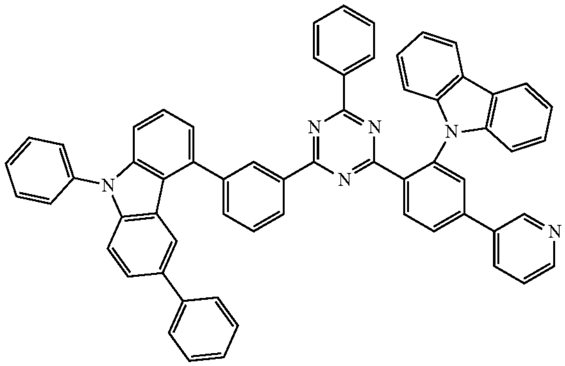
306
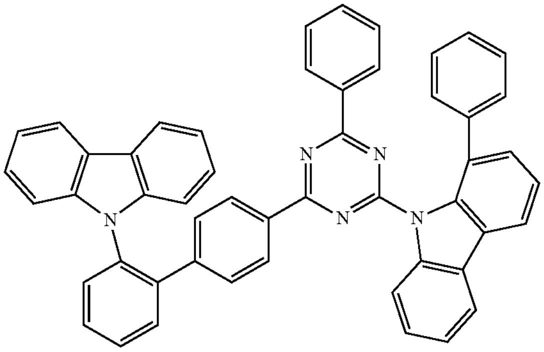
307
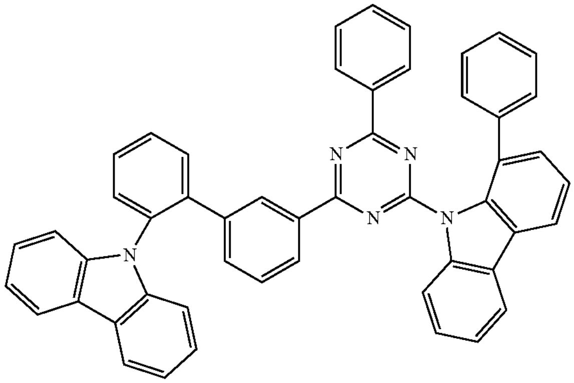

-continued
308
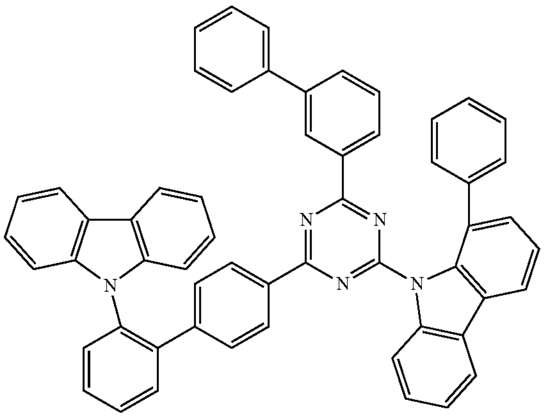
309
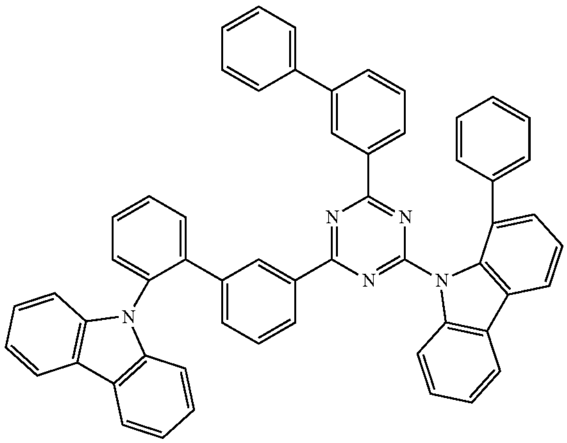
310
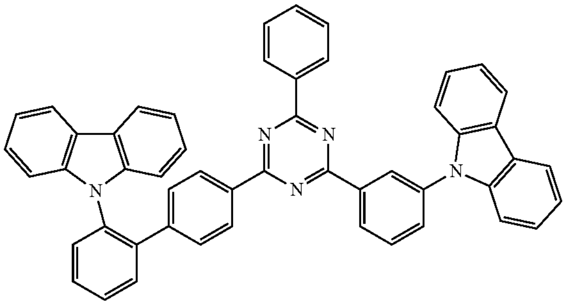
311
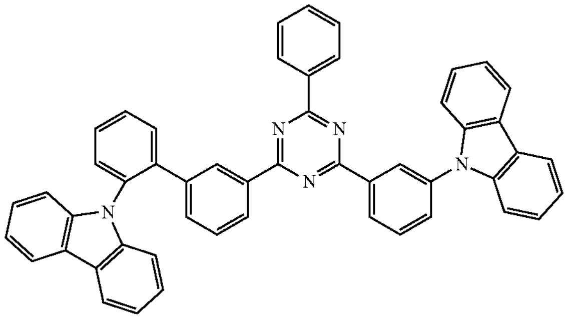
312
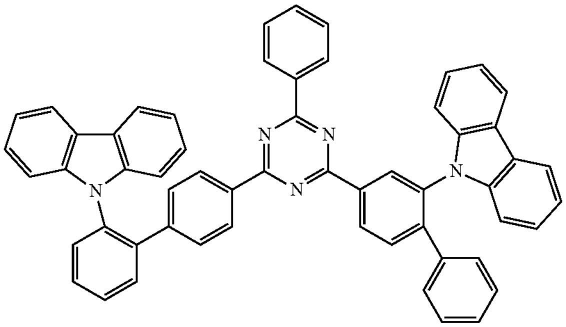
313
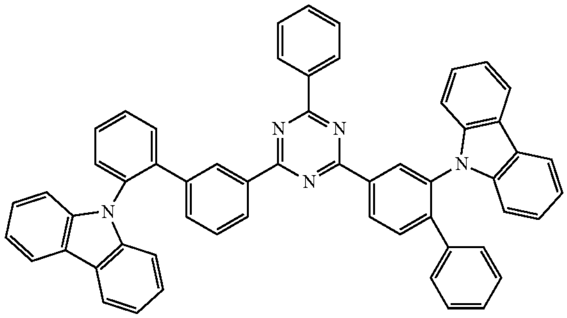
314
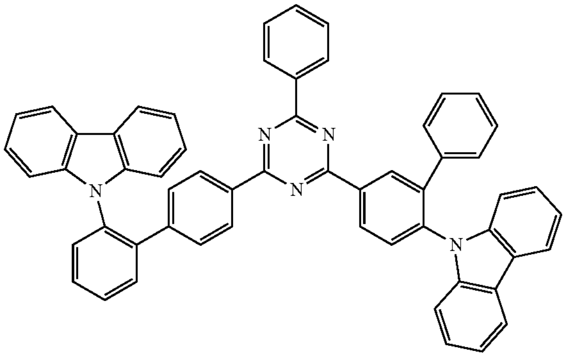
315
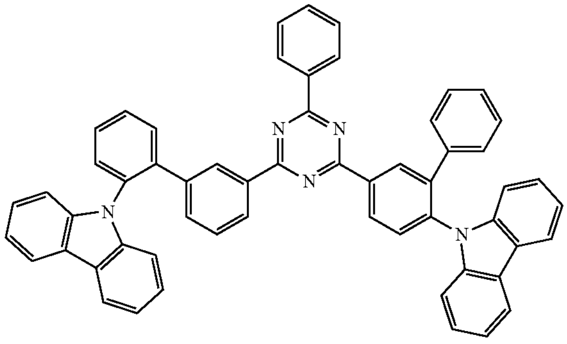

-continued
316
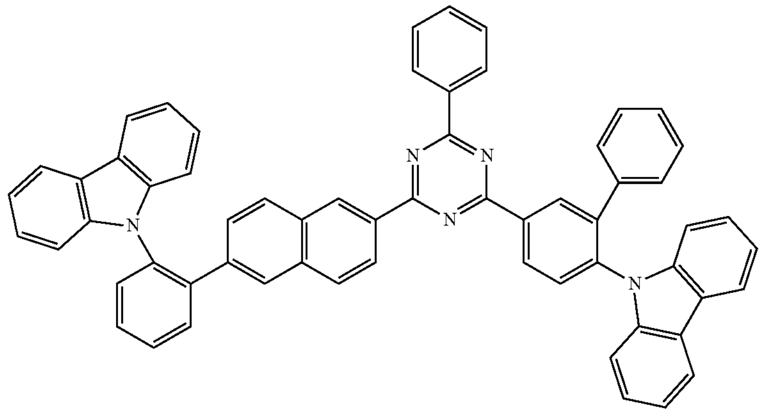
317
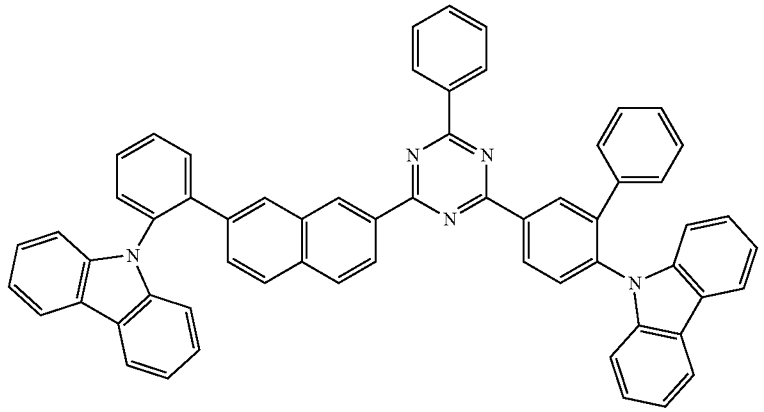
318
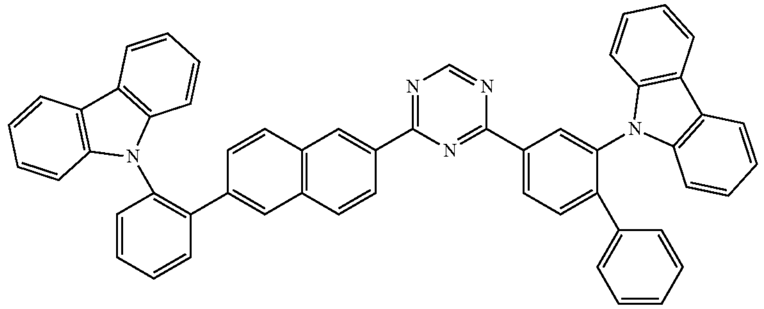
319
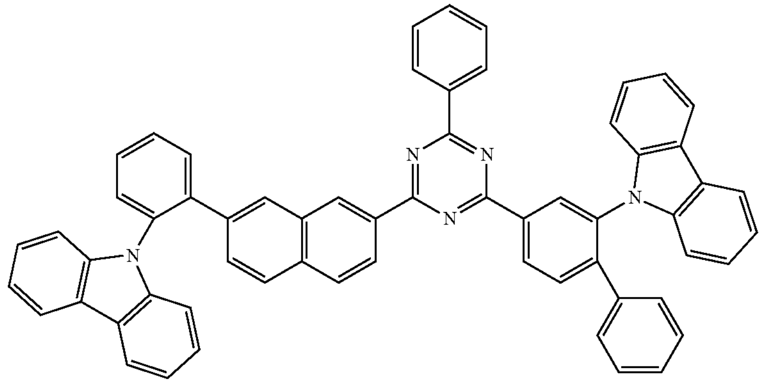

-continued
320
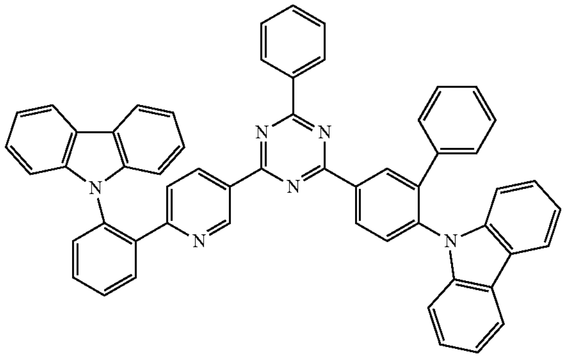
321
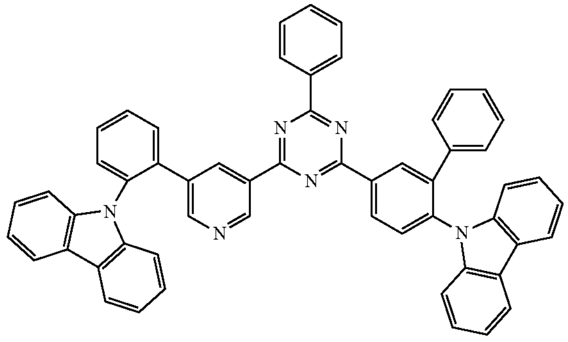
322
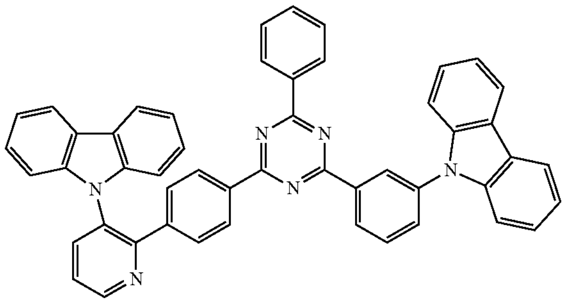
323
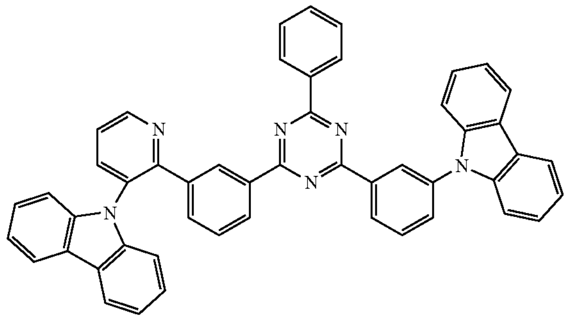
324
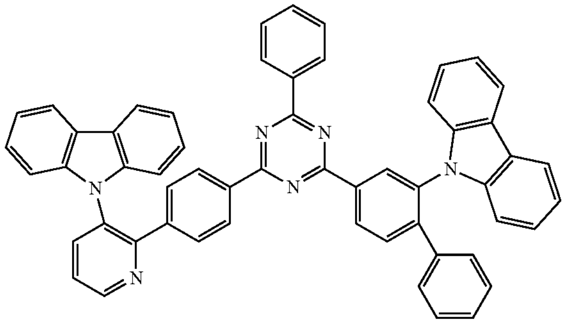
325
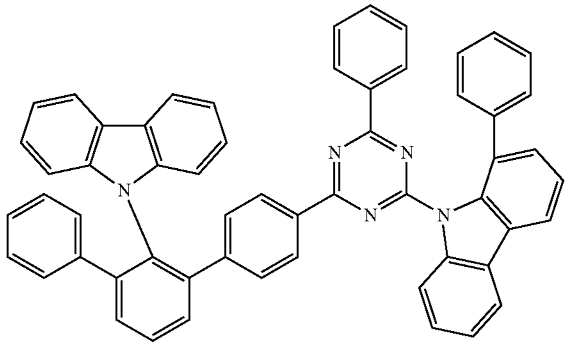
326
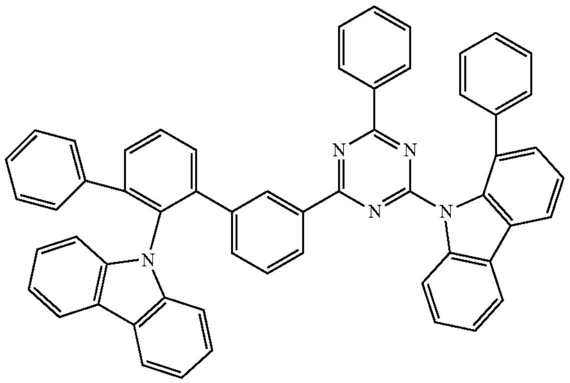
327
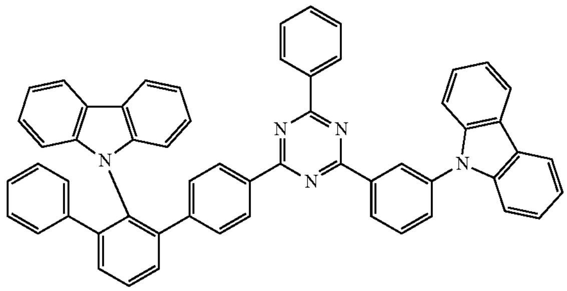

-continued
328
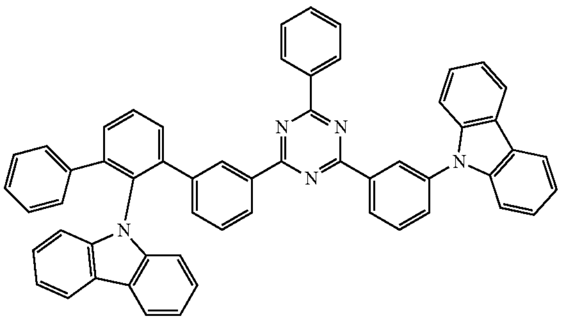
329
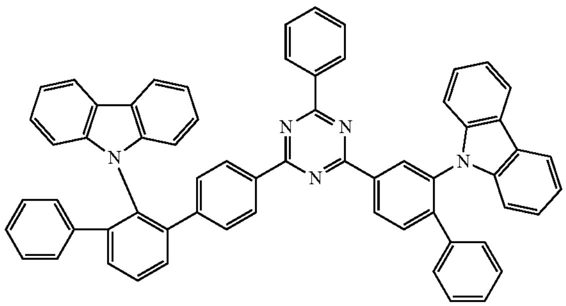
330
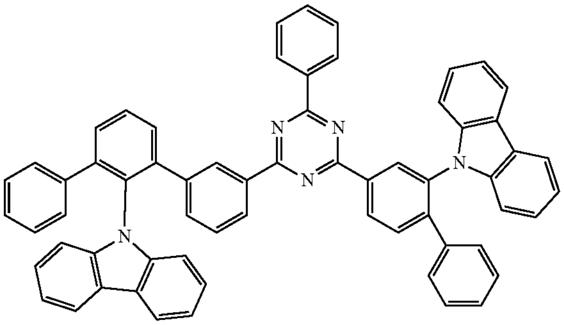
331
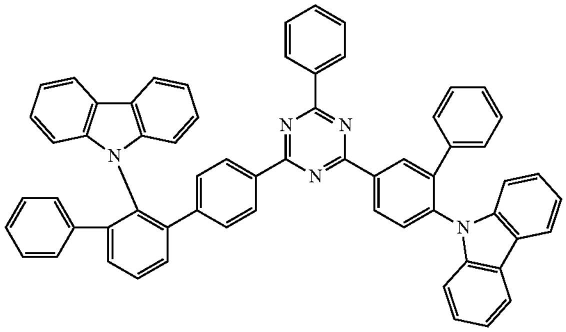
332
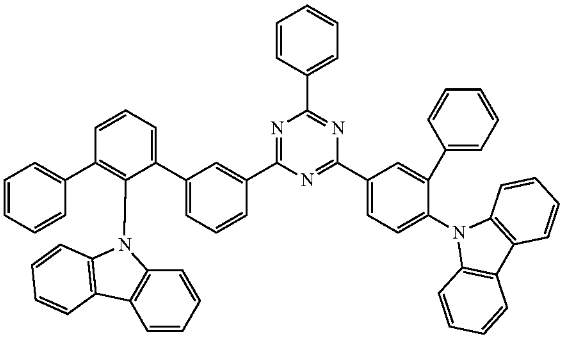
333
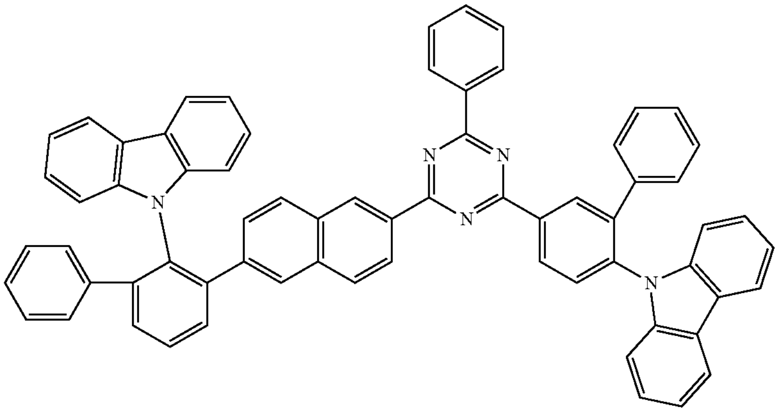

-continued
334
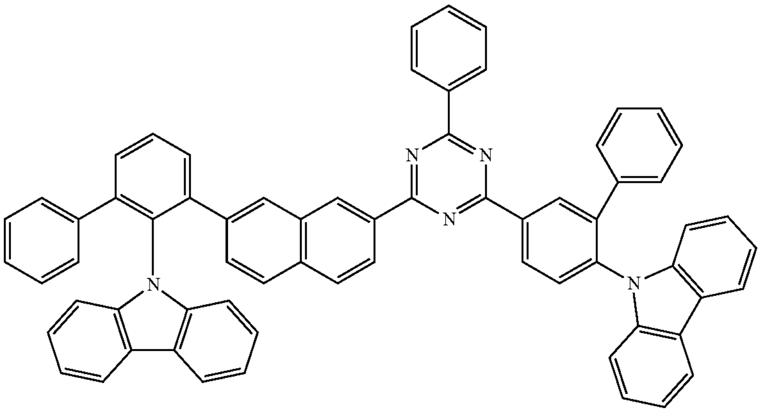
335
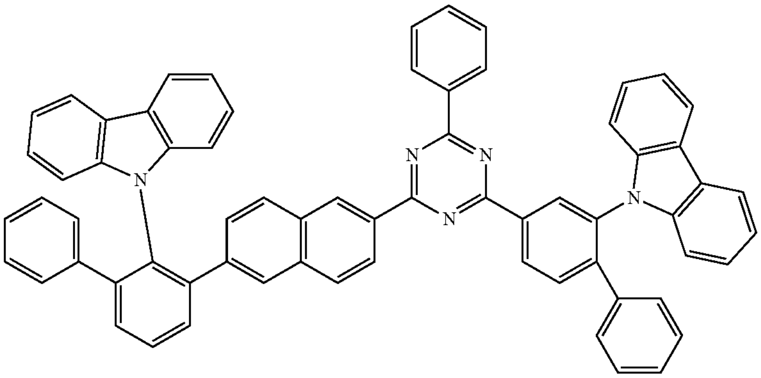
336
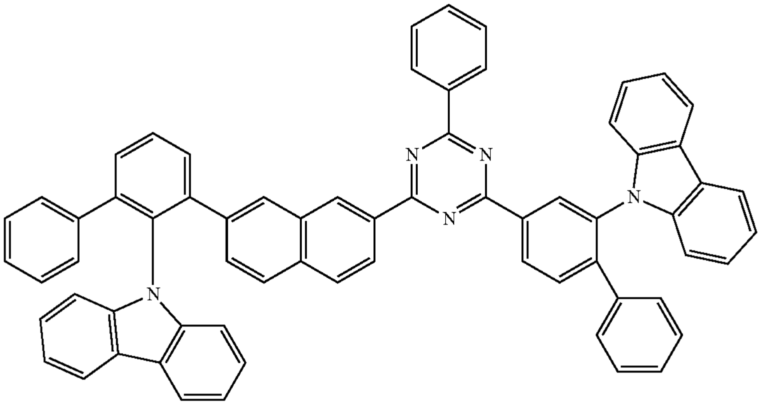
337
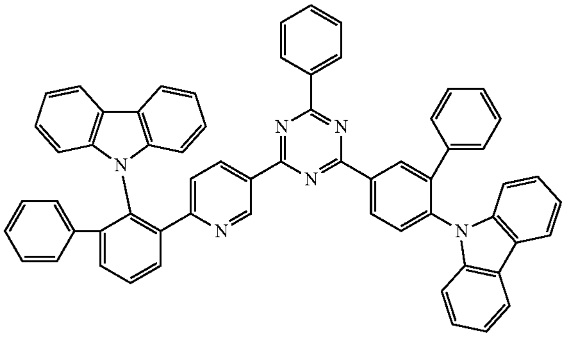
338
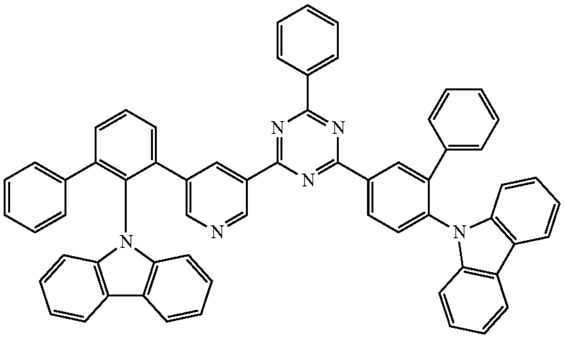

-continued
339
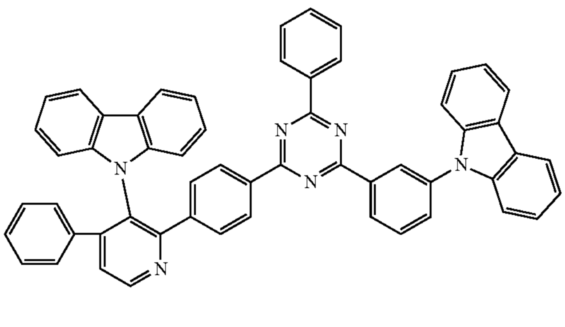
340
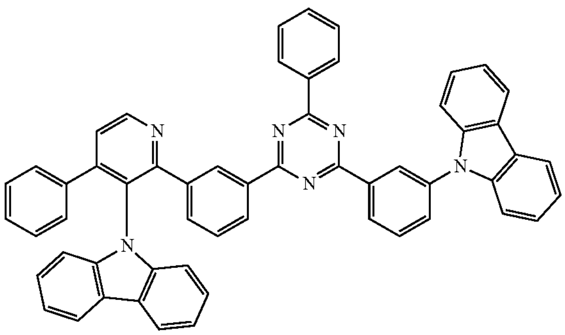
341
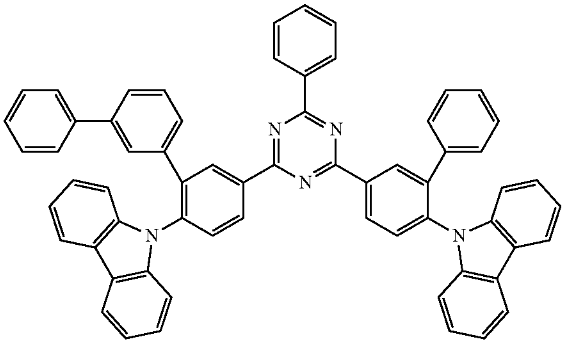
342
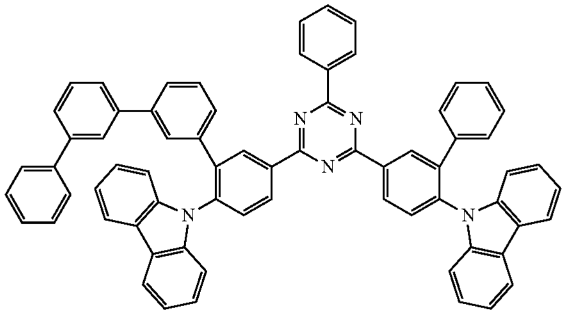
343
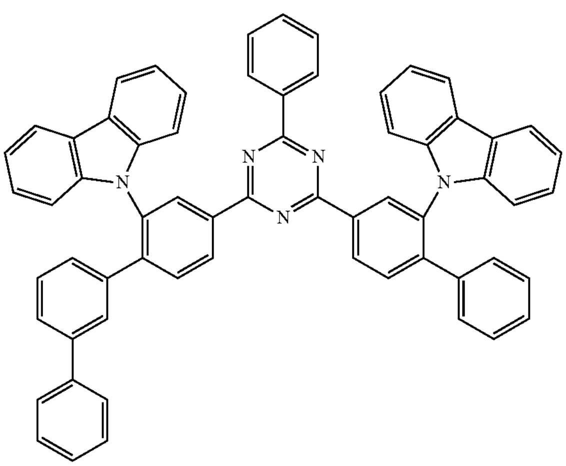
345
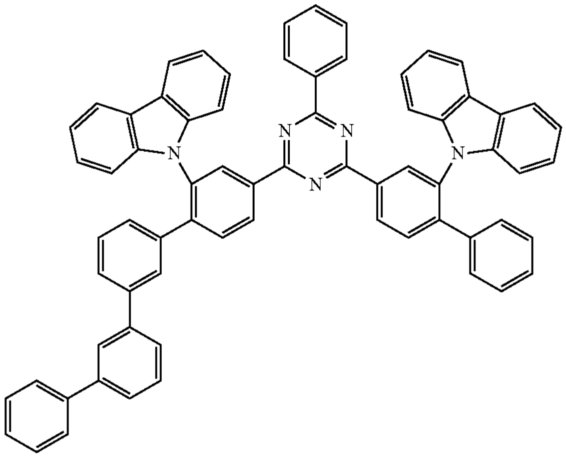
346
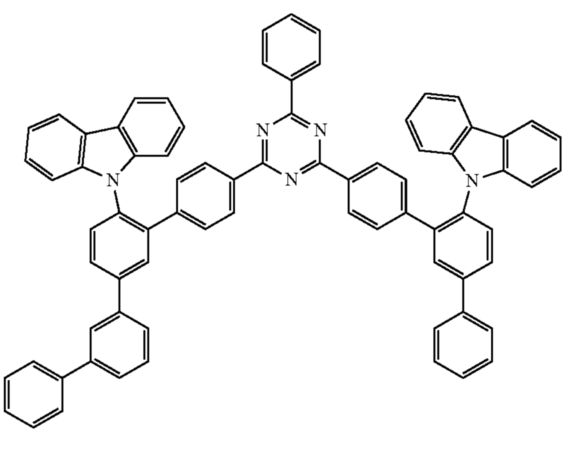
347
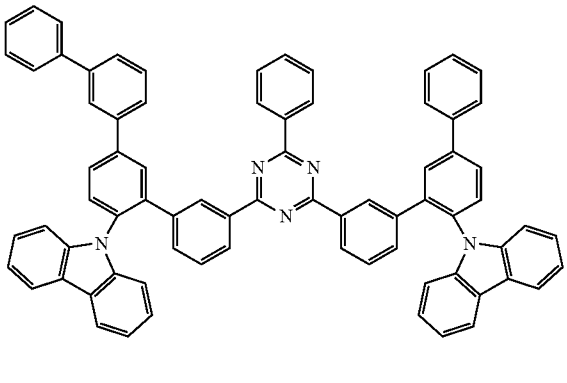

-continued
348
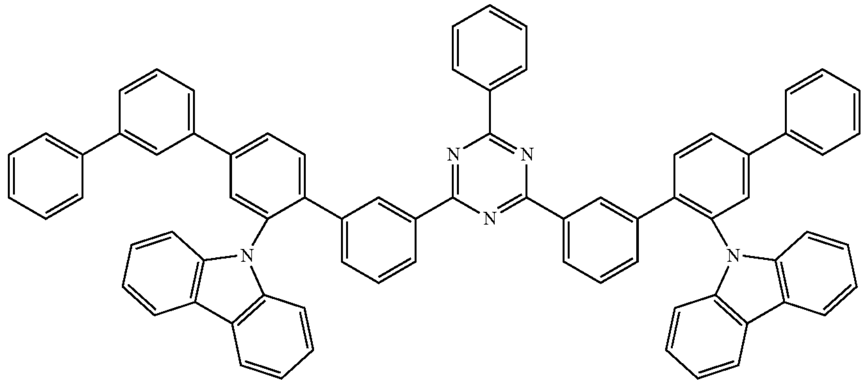
349
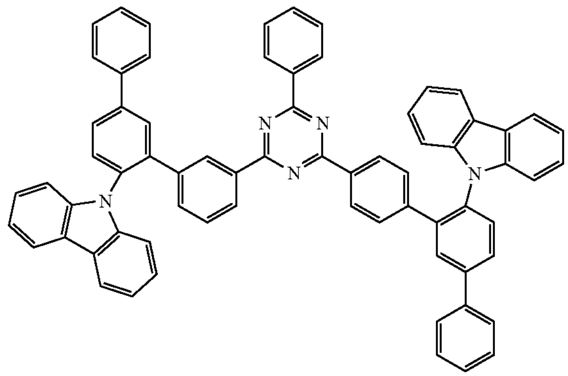
350
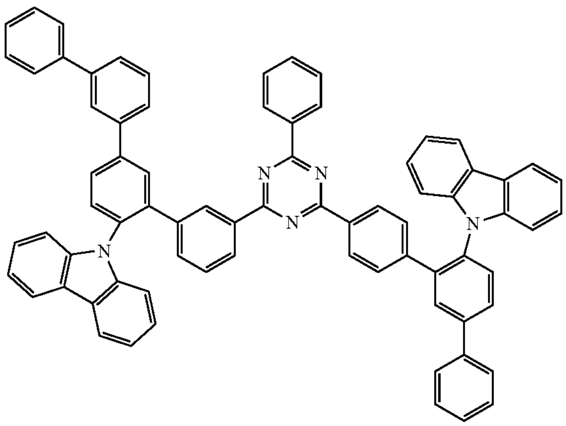
351
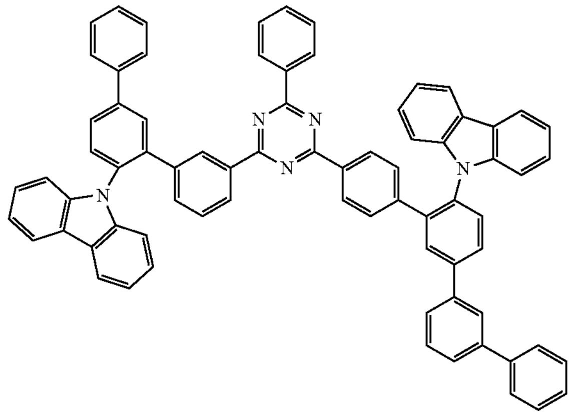
352
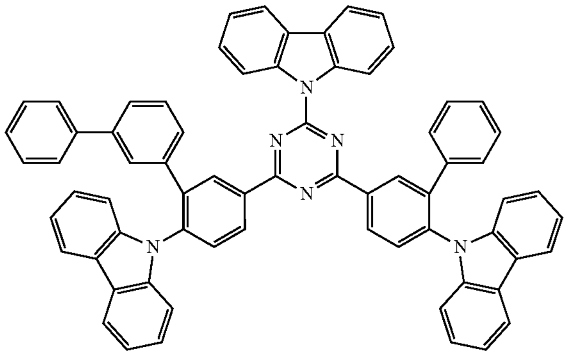

-continued
353
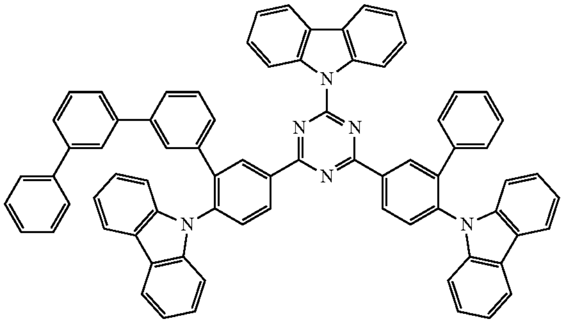
354
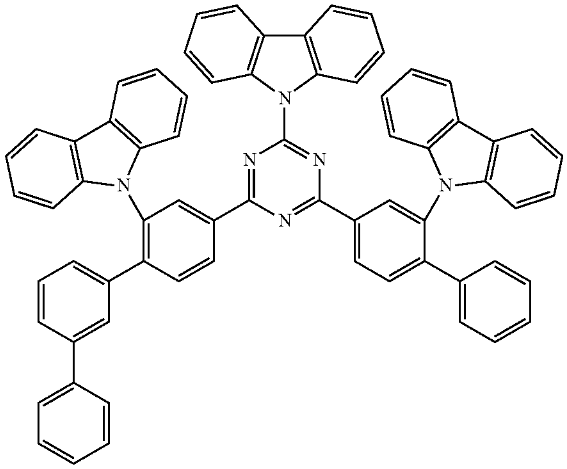
355
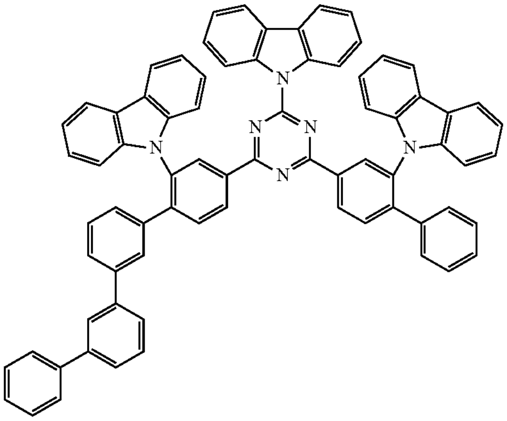
356
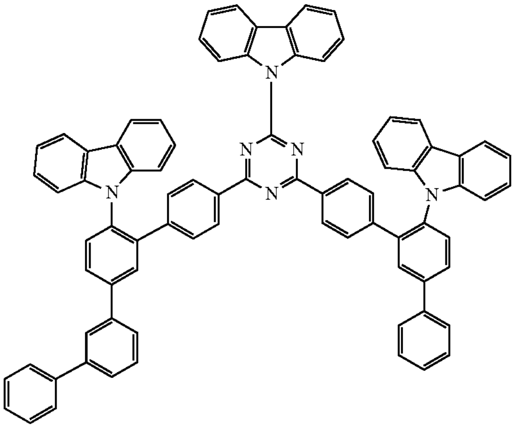
357
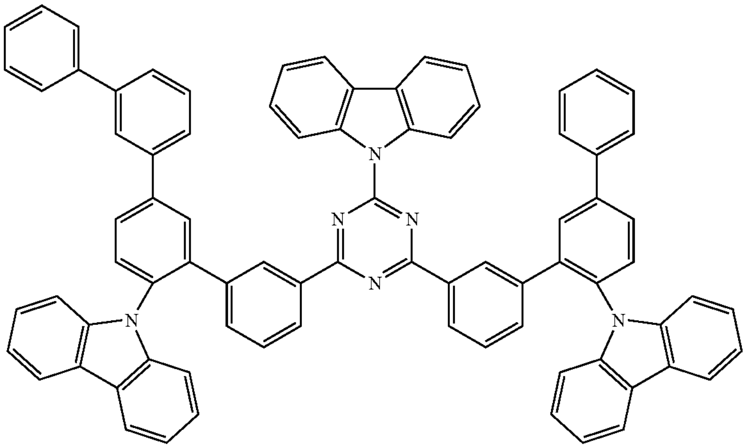

-continued
358
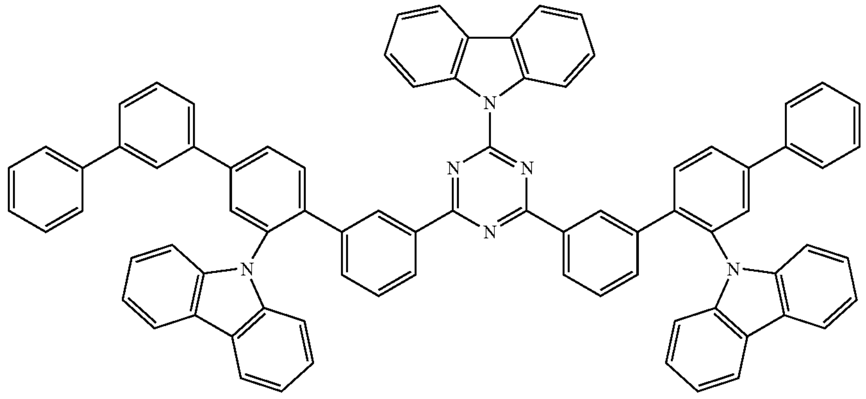
359
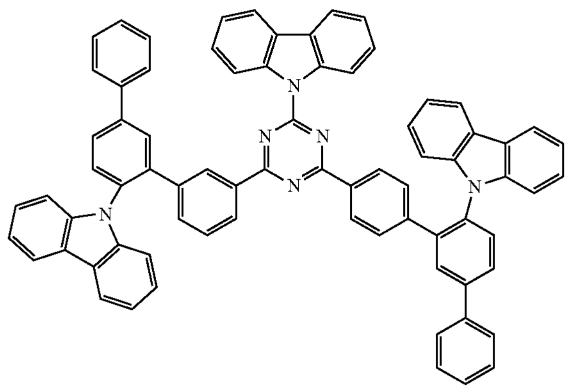
360
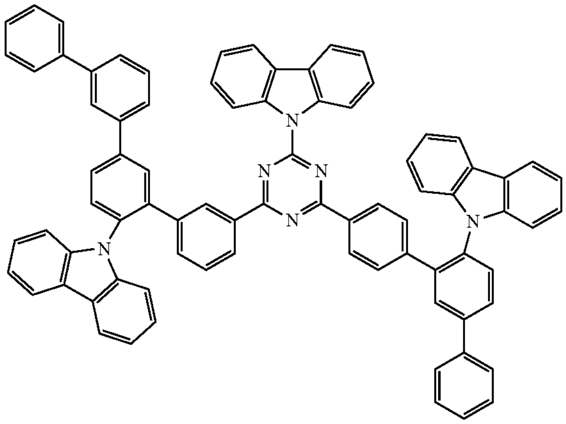
361
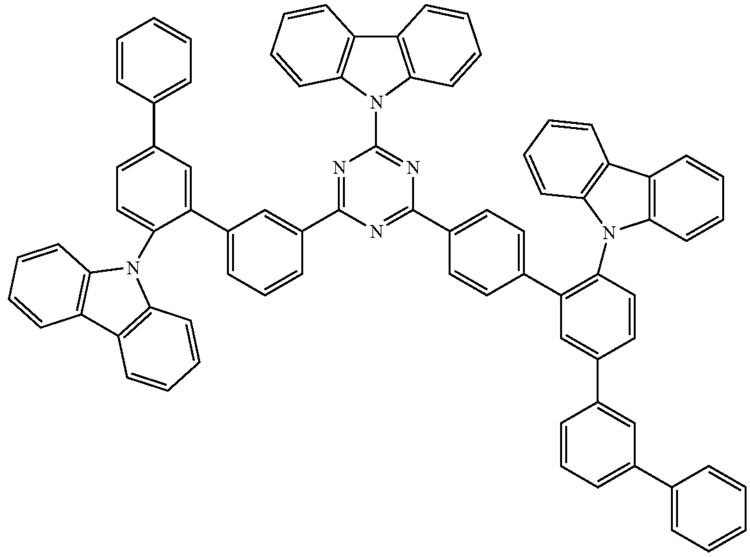

362
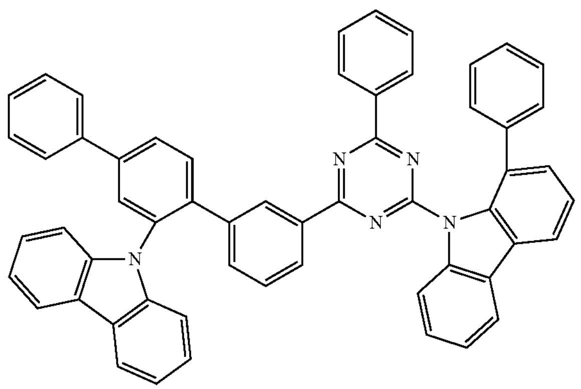
363
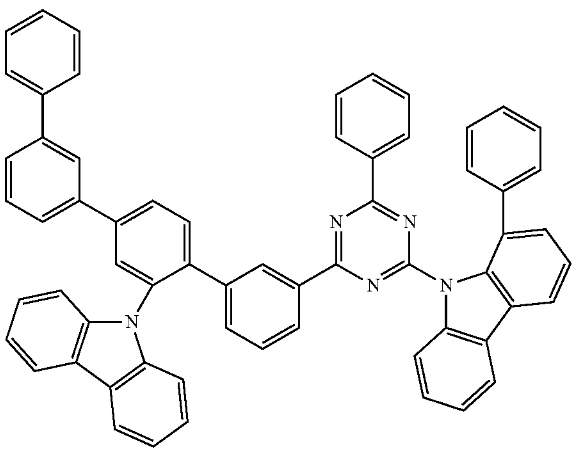
364
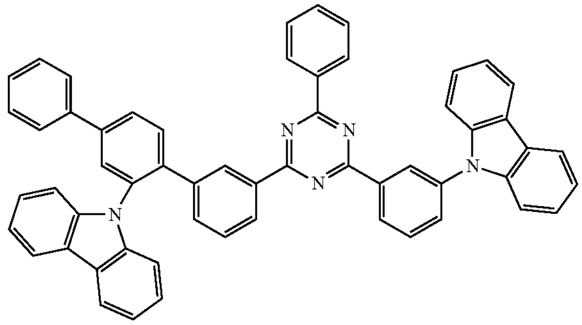
365
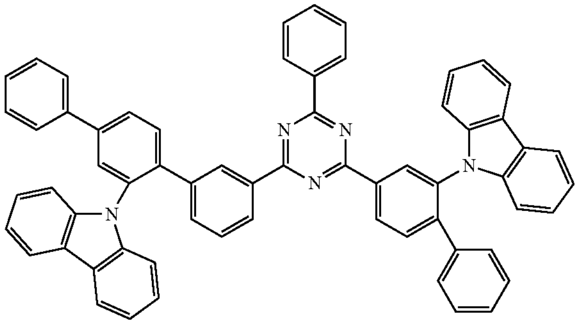
366
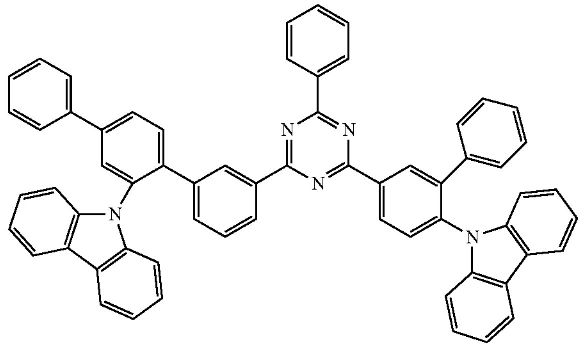
367
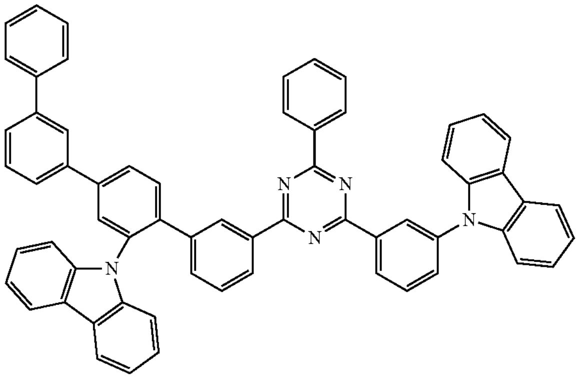
368
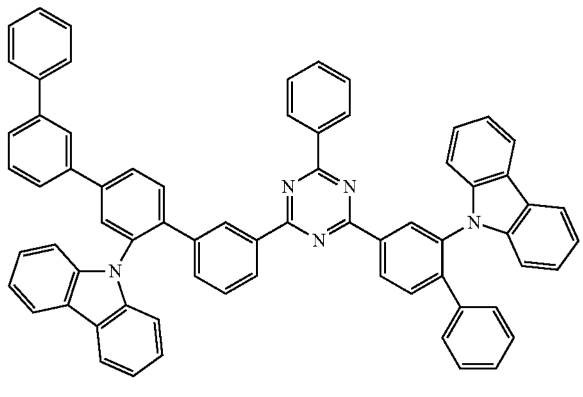
369
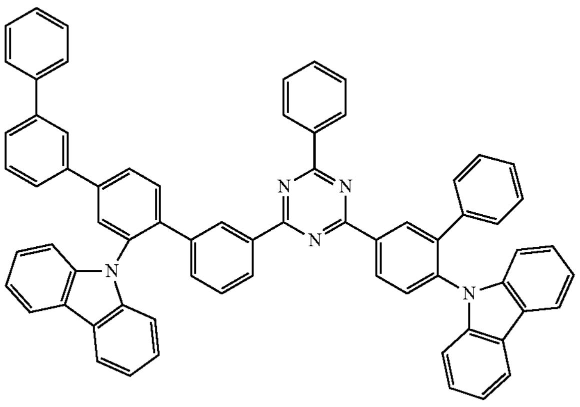

-continued
370
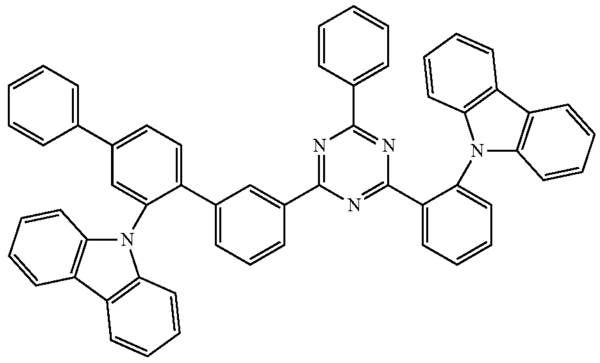
371
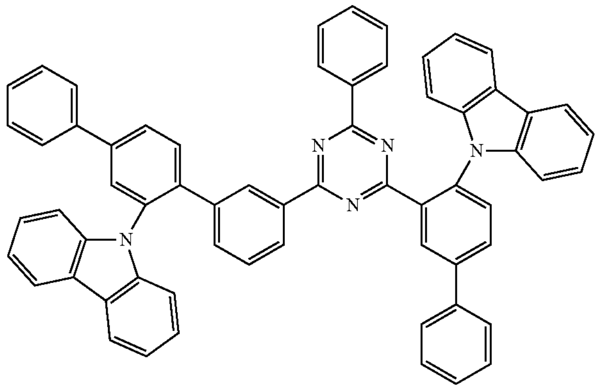
372
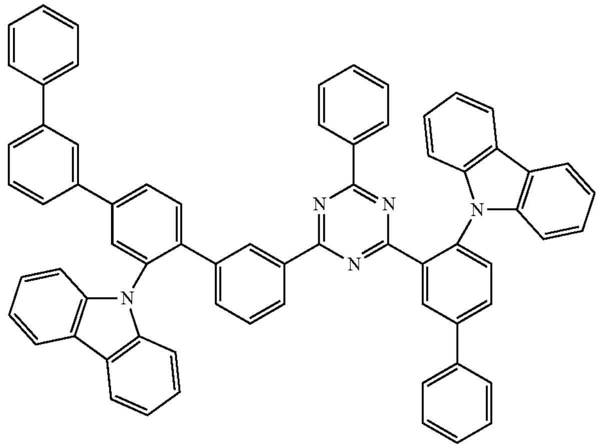
373
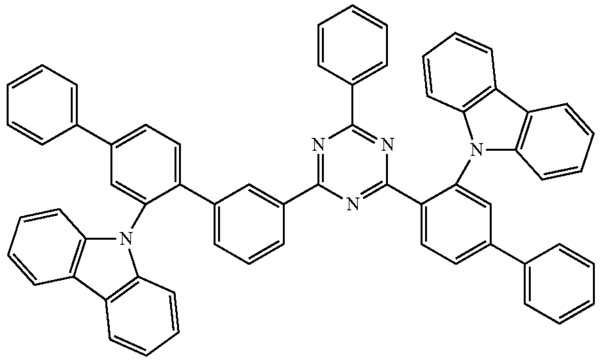
374
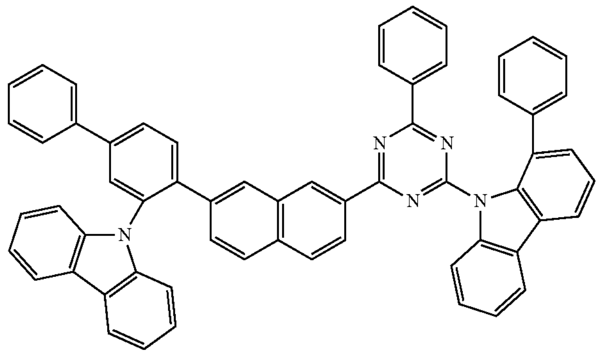
375
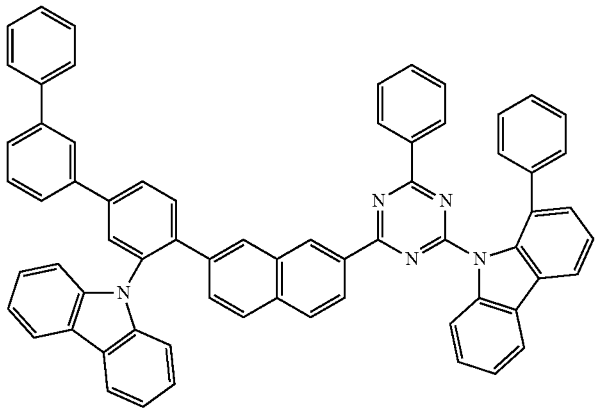

-continued
376
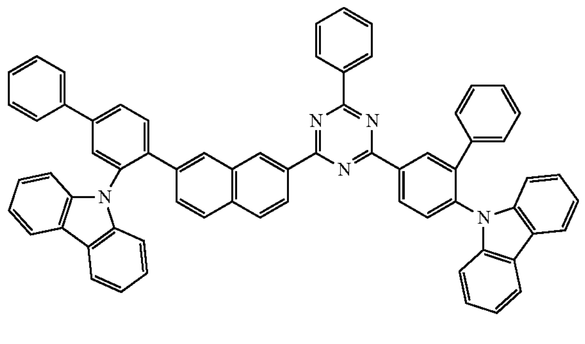
377
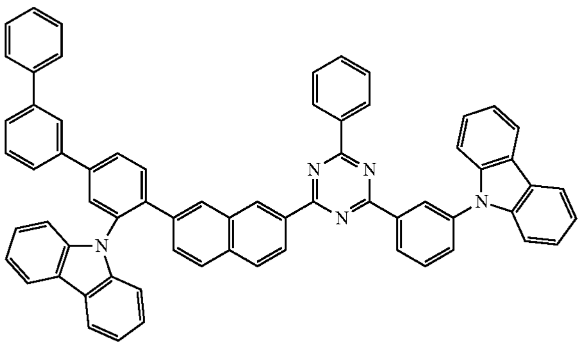
378
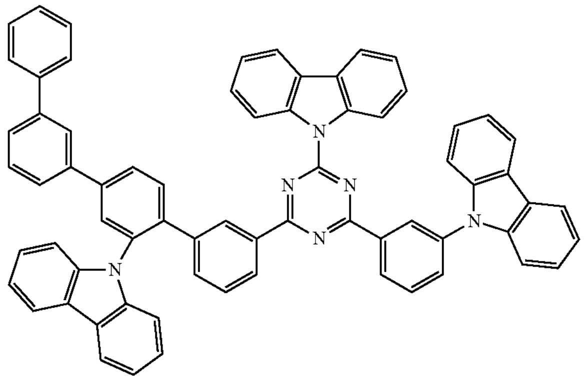
379
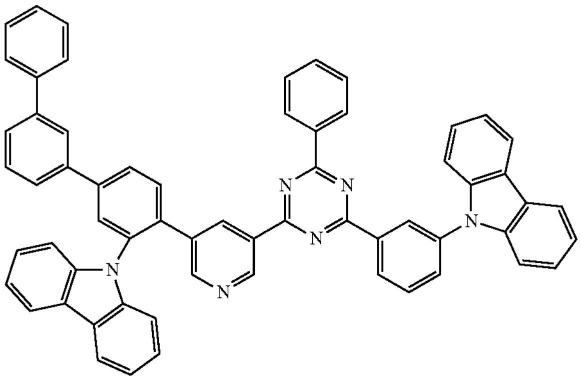
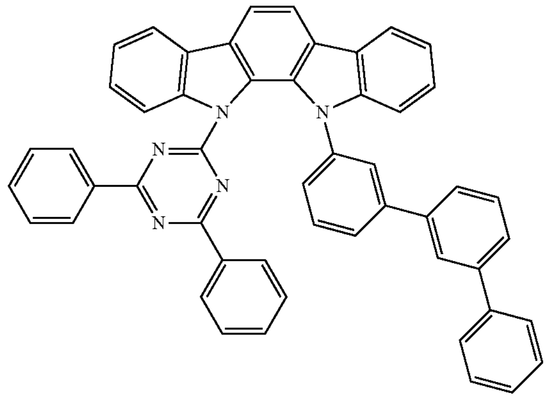

-continued
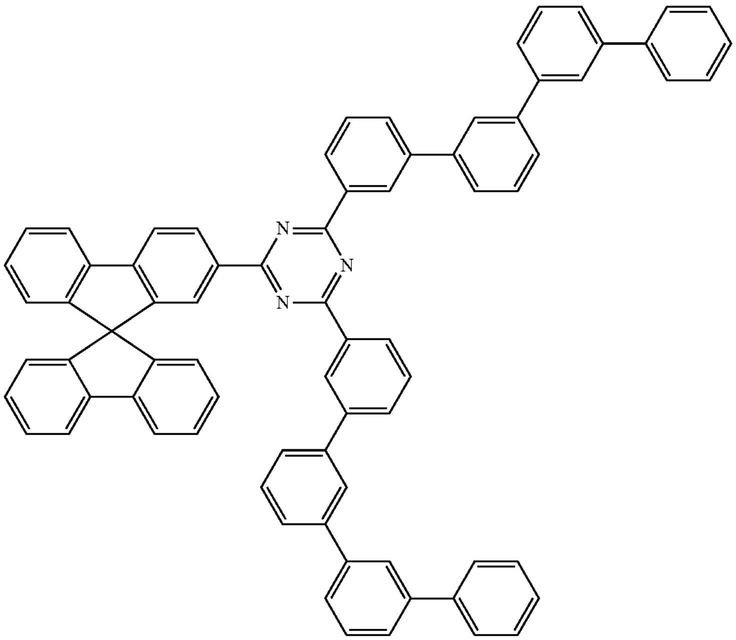
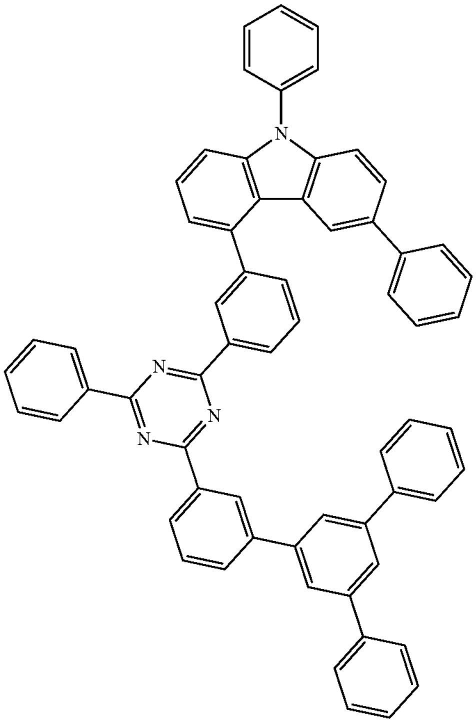

-continued
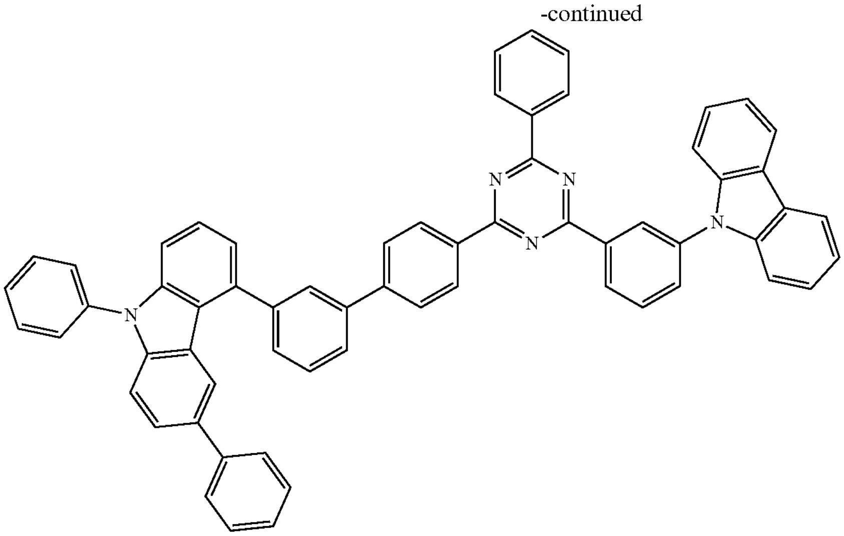
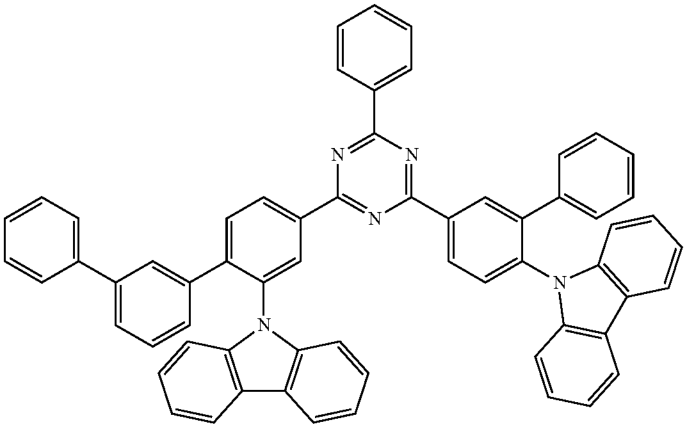
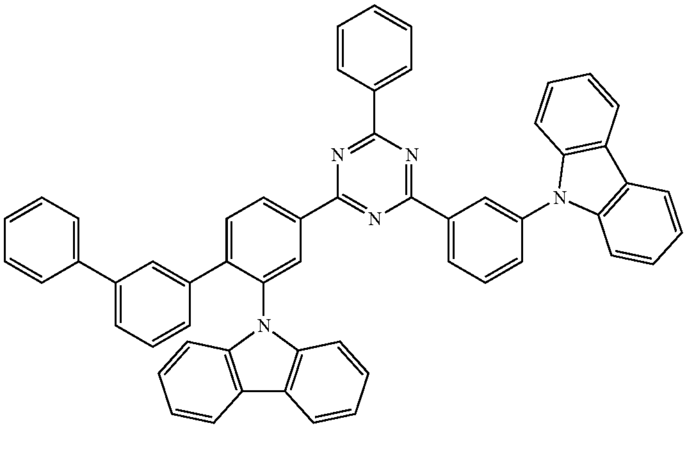

-continued
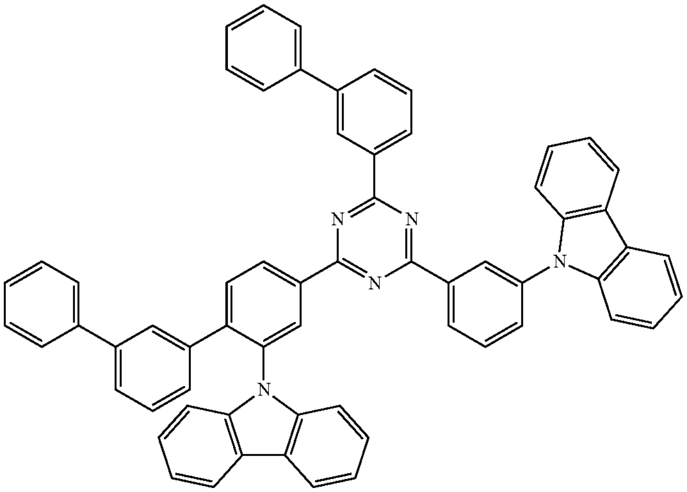
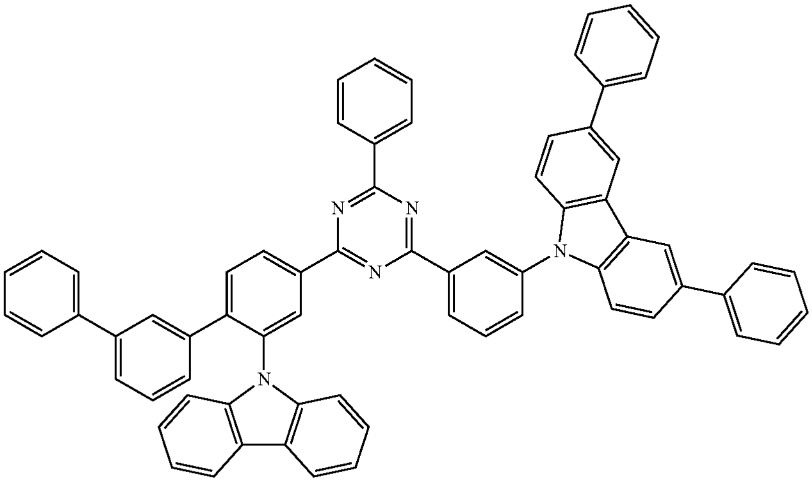
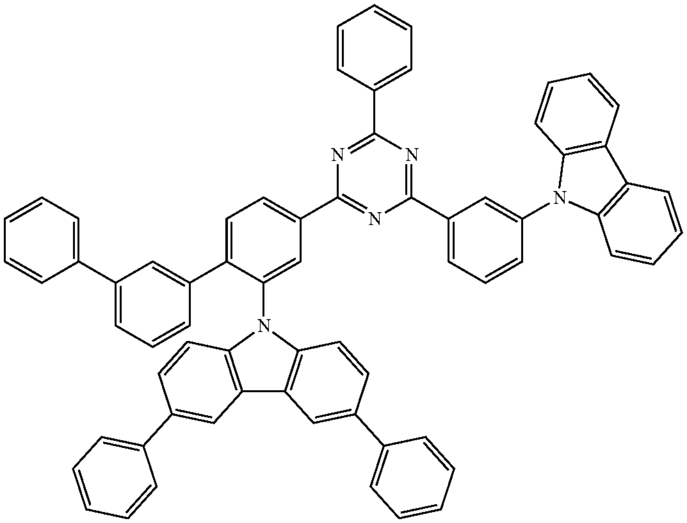
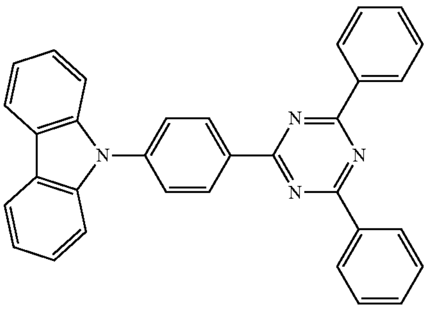

-continued
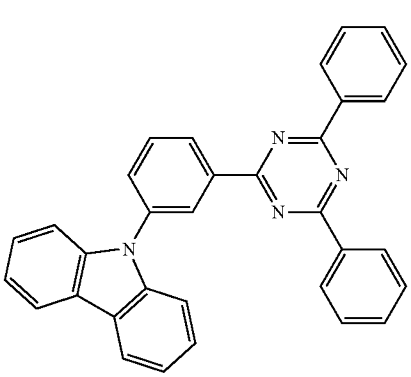
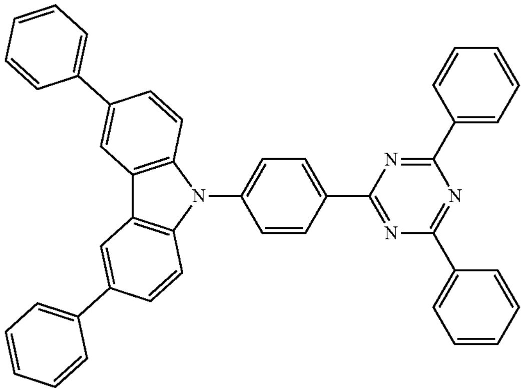
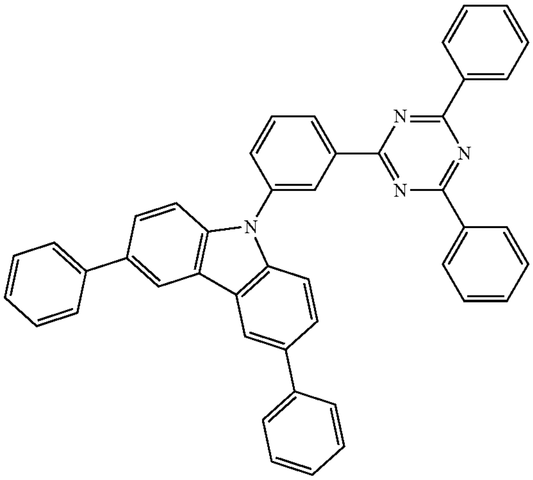
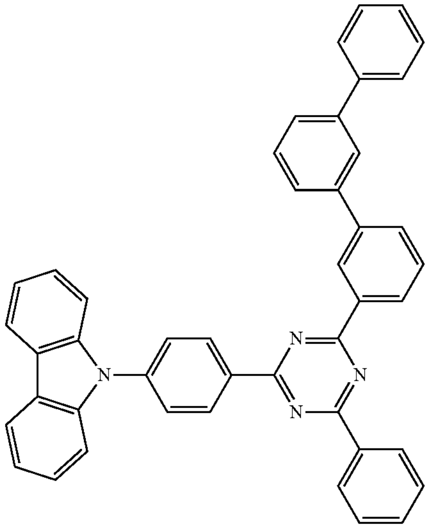
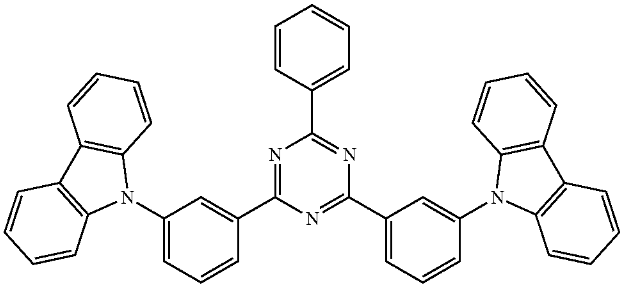
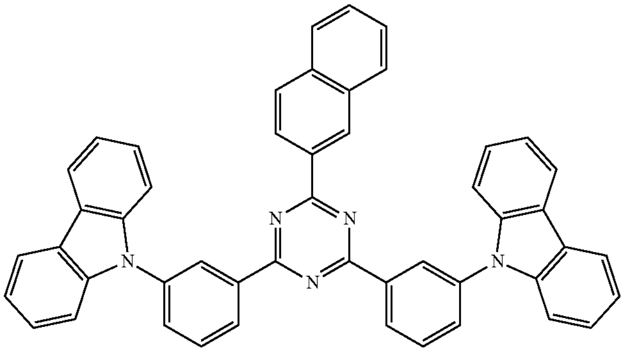

-continued
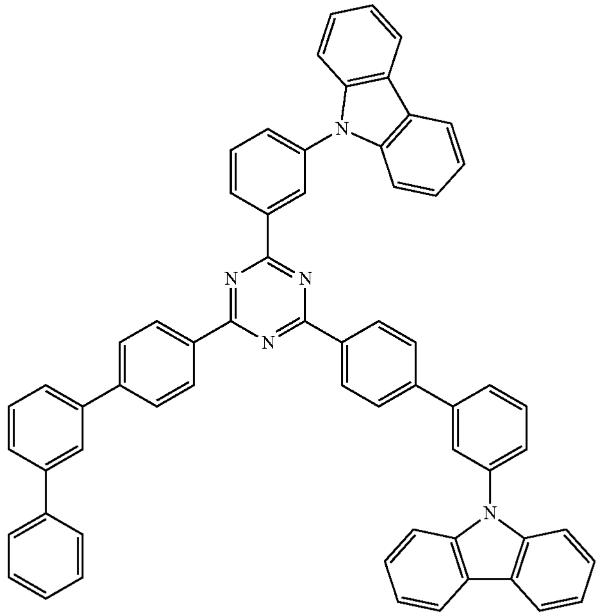
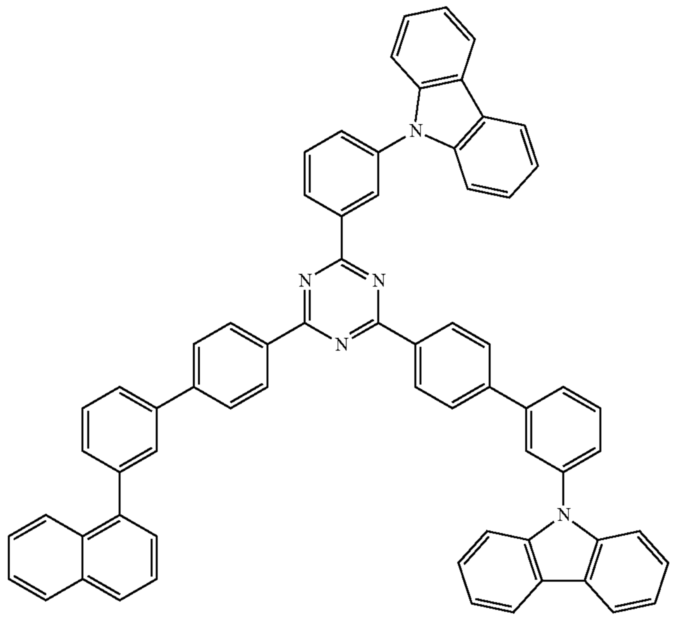
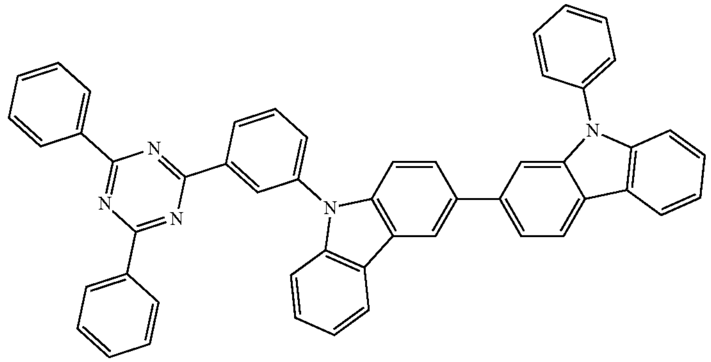

-continued
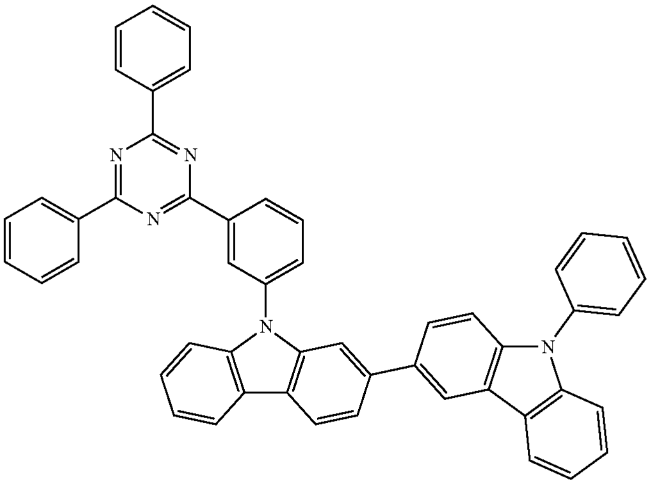
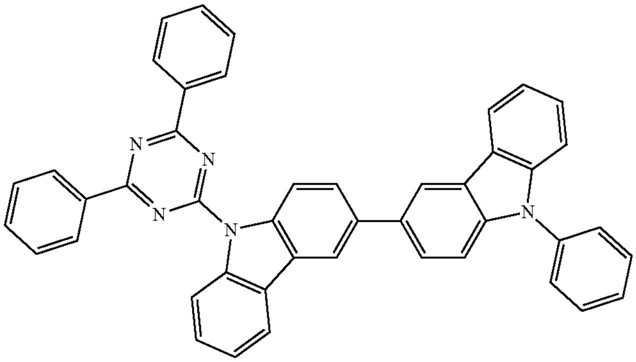
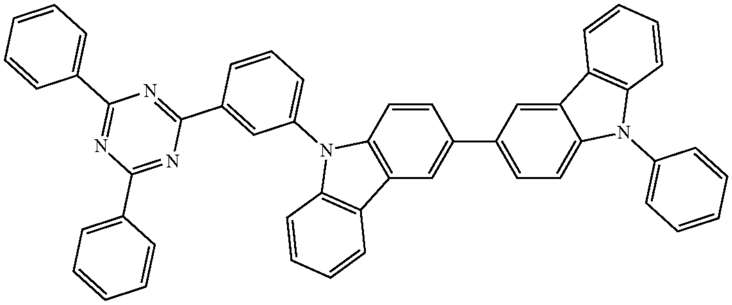
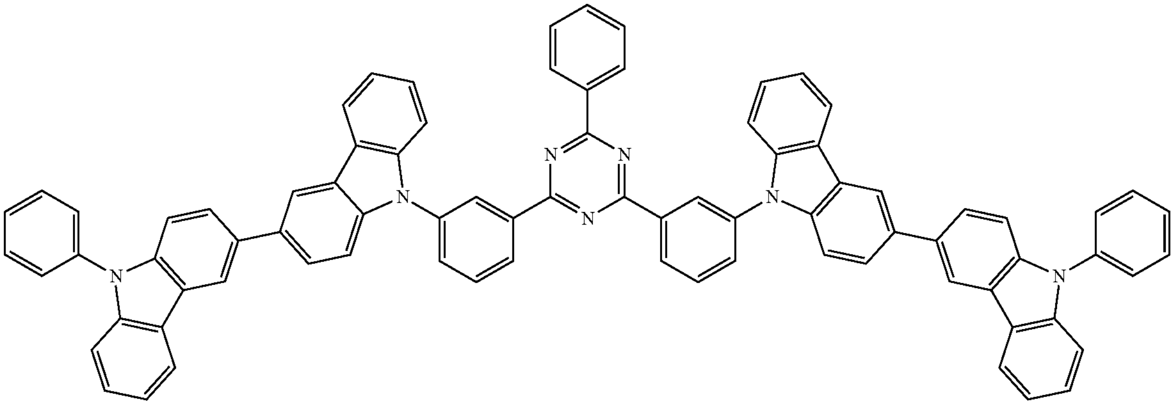

-continued
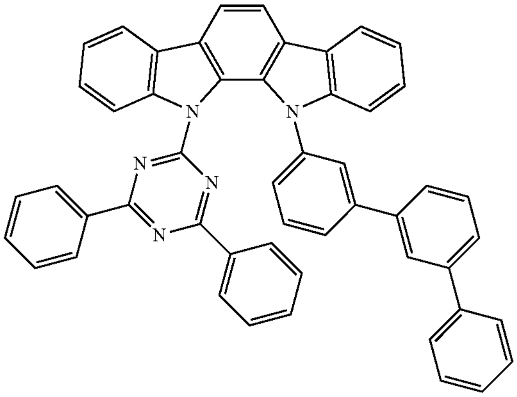
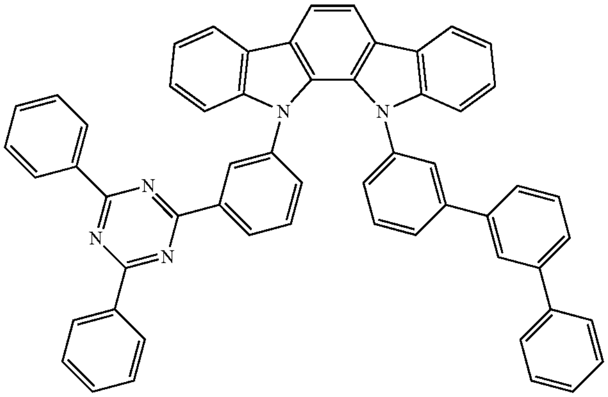
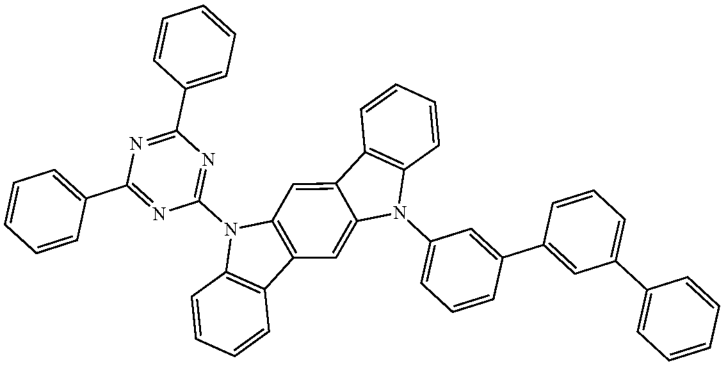
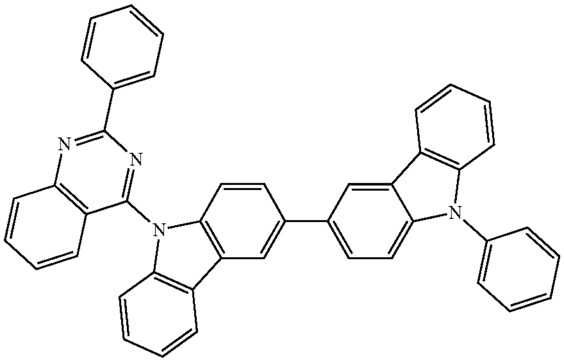
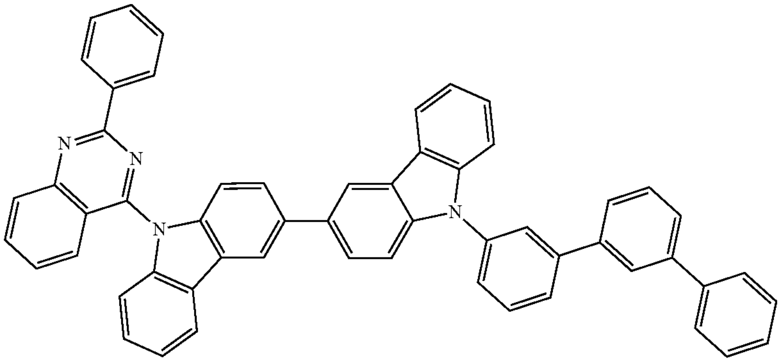

-continued
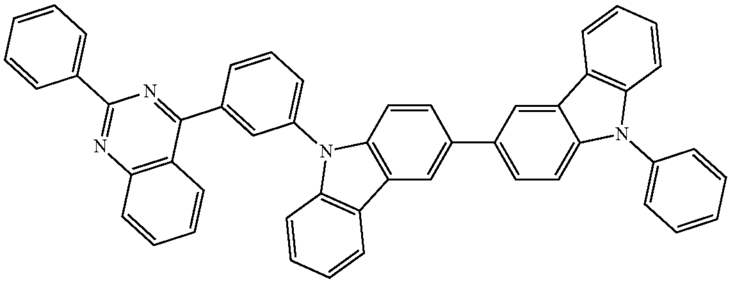
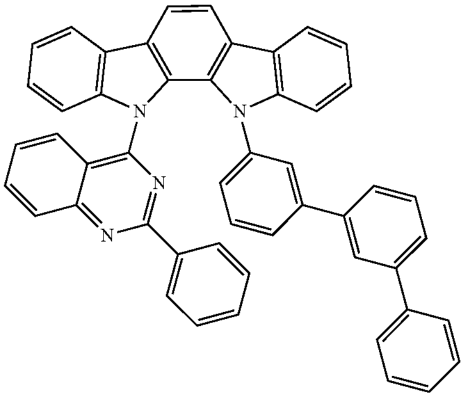
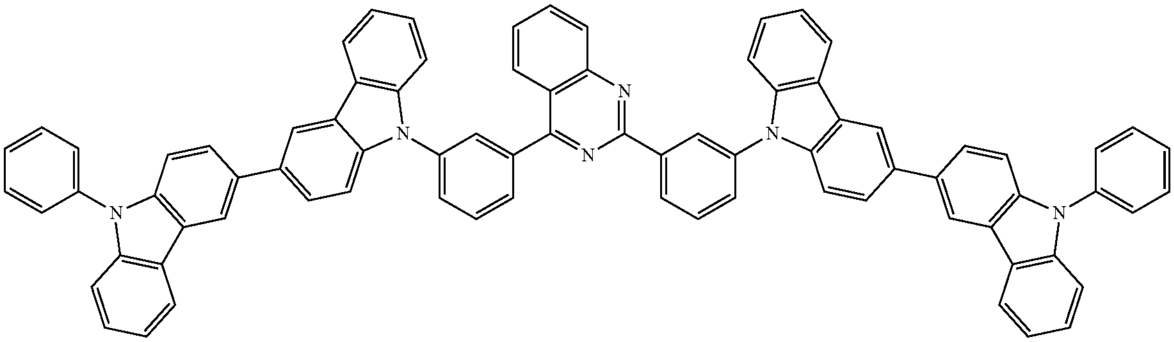
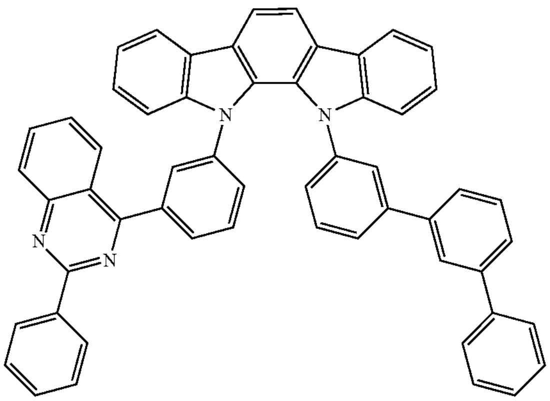
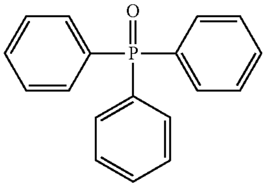

-continued
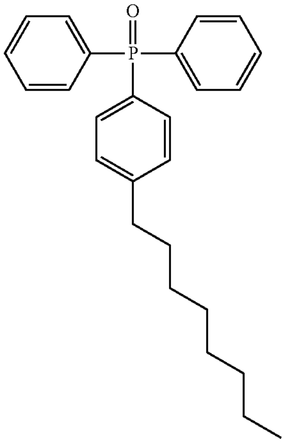
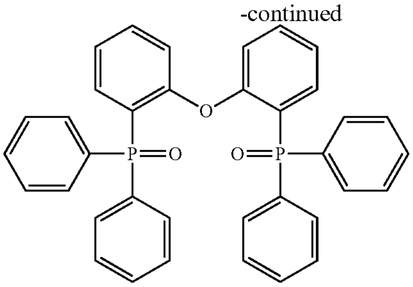
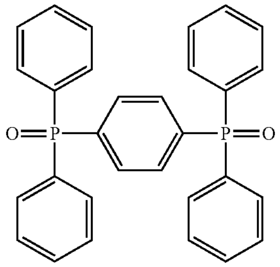
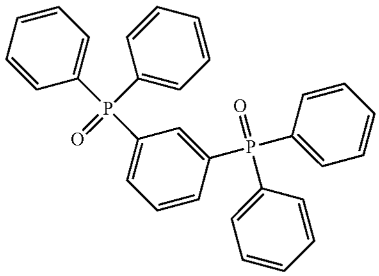
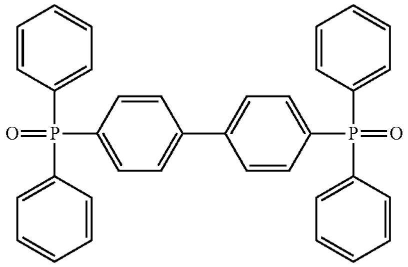
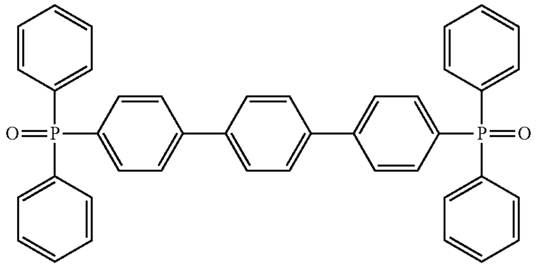
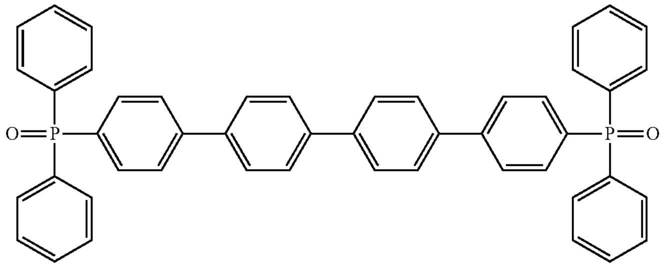
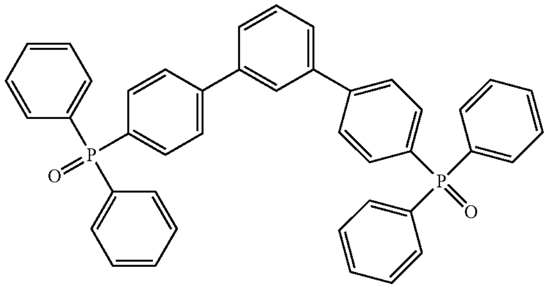

-continued
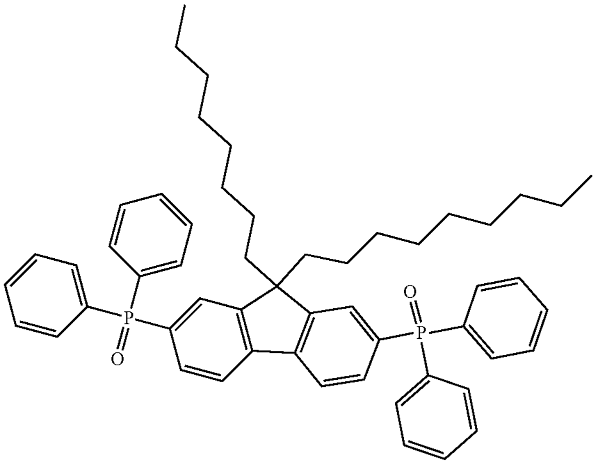
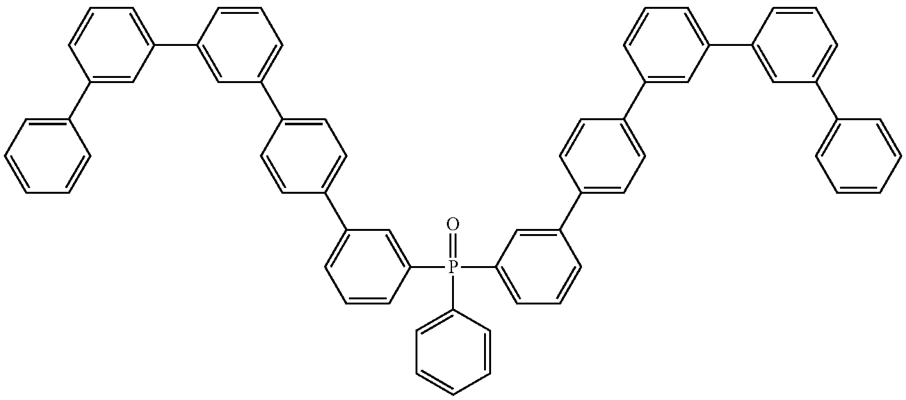
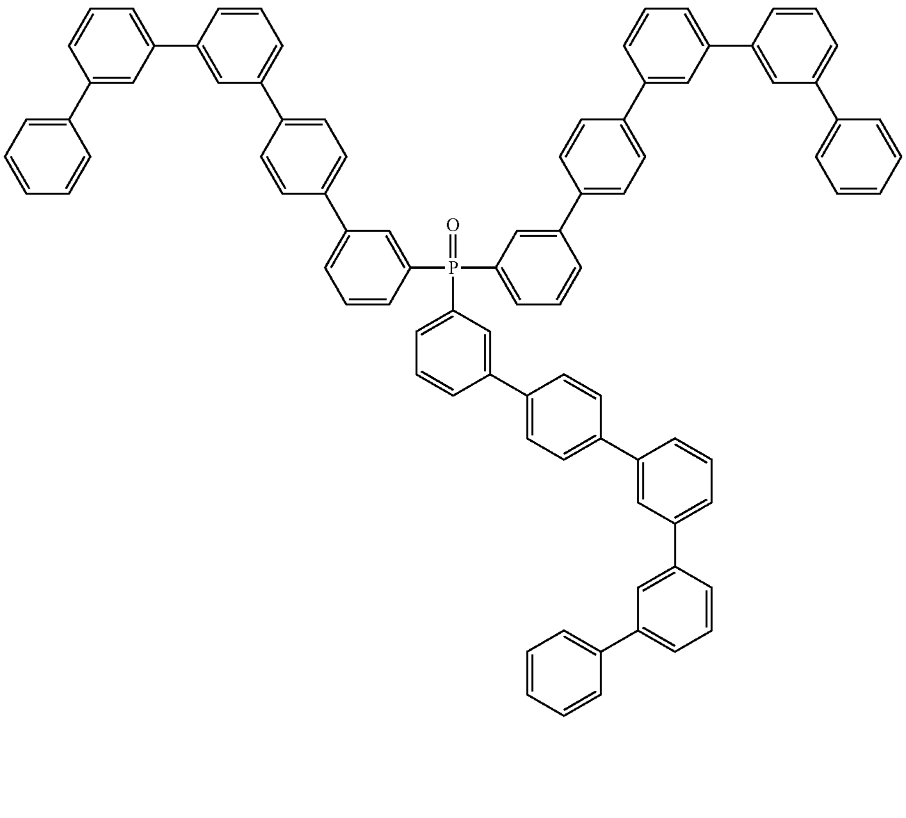

-continued
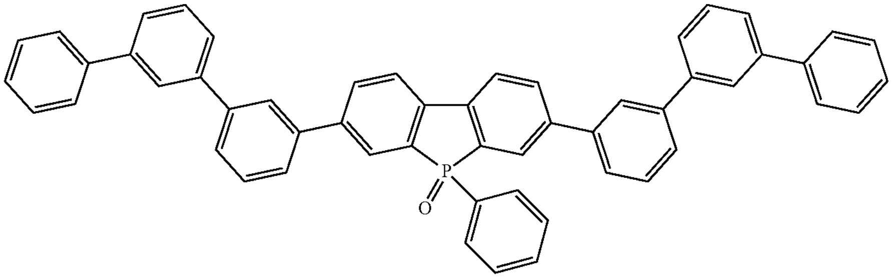
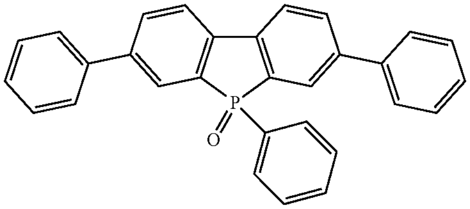
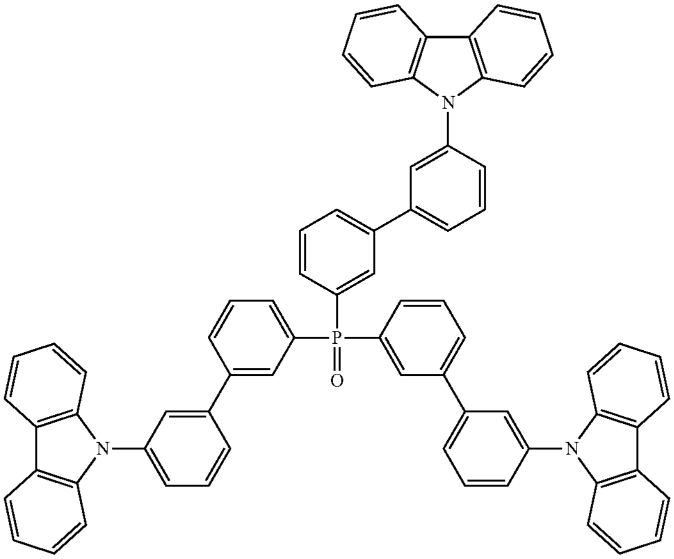
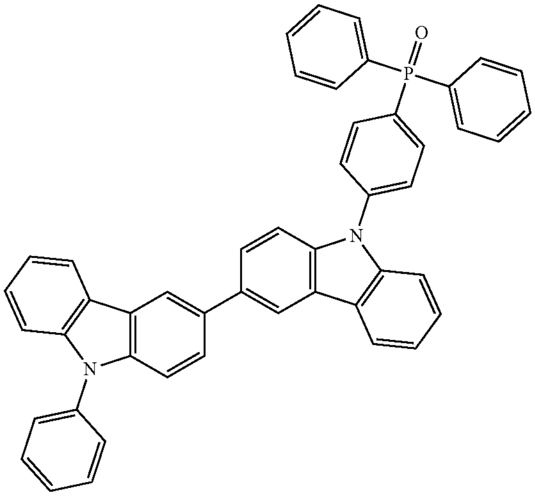
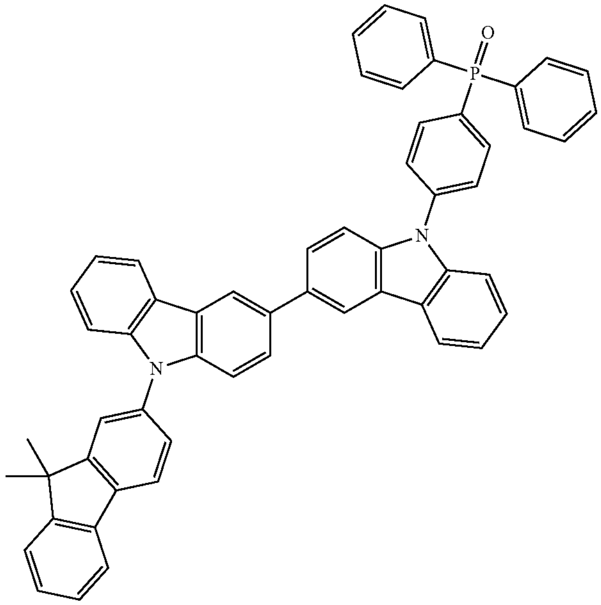
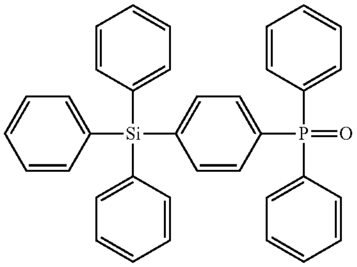
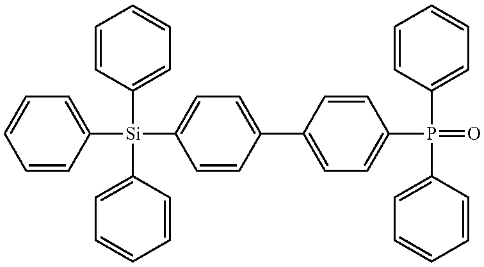

-continued
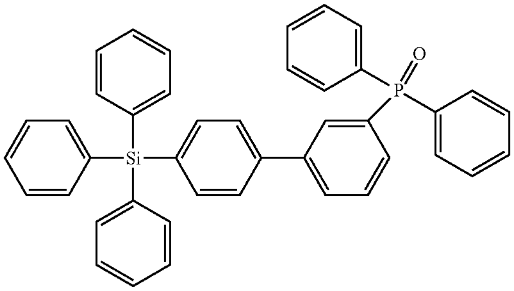
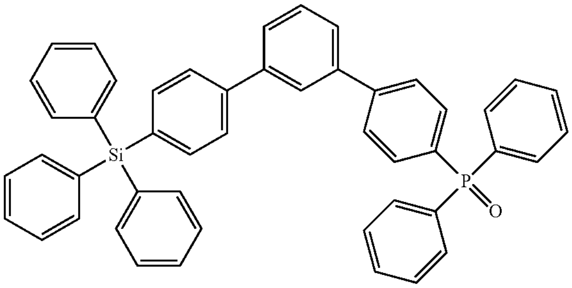
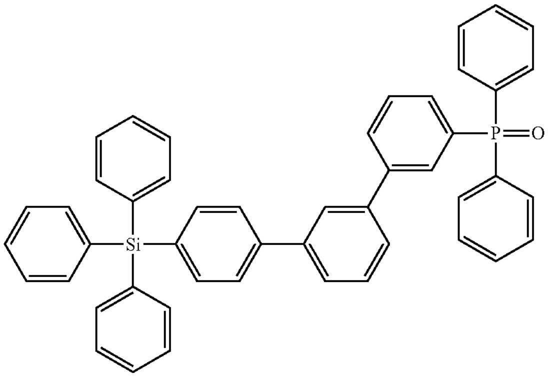
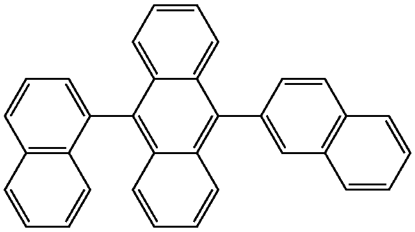
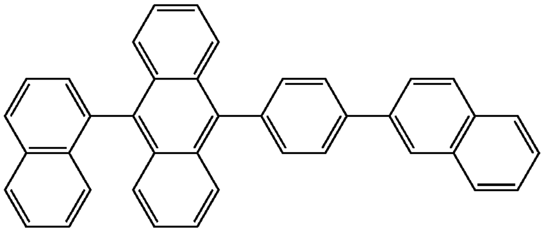
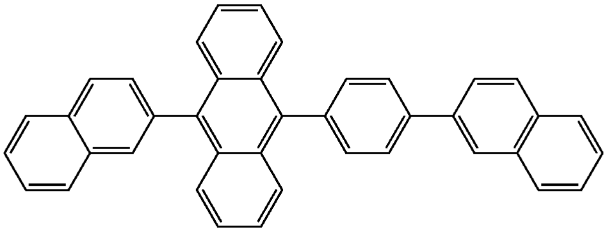
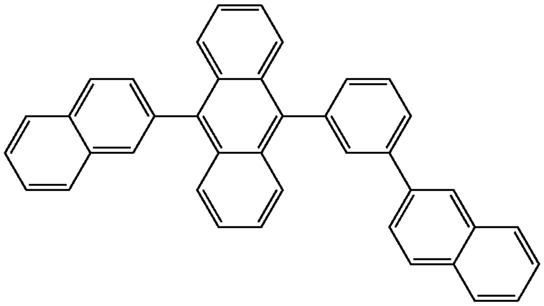
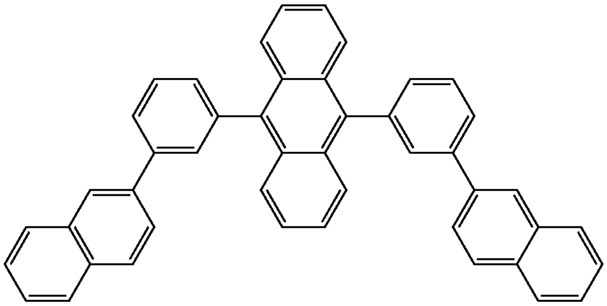
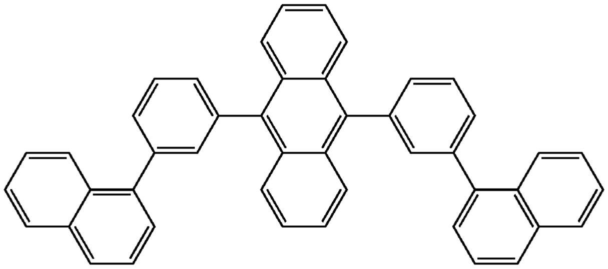
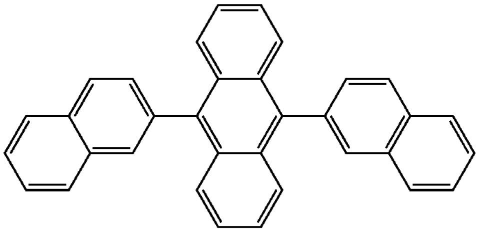
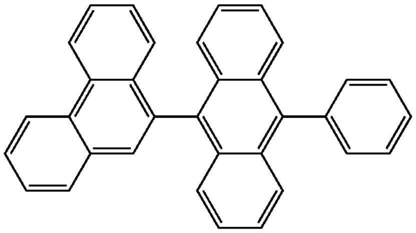
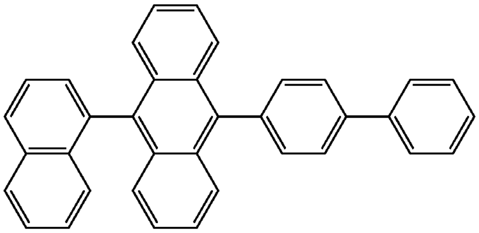

-continued
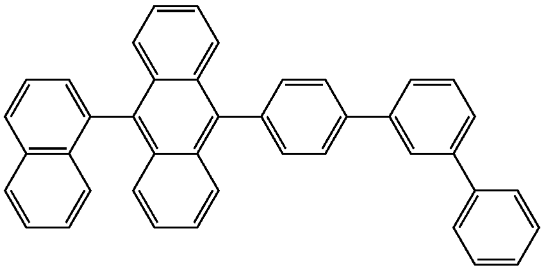
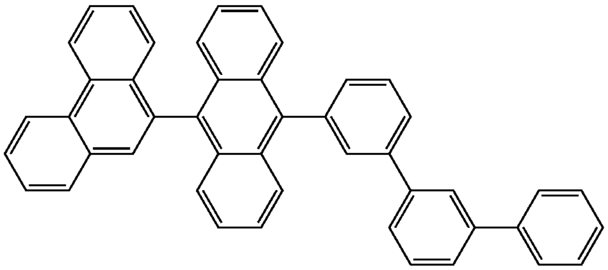
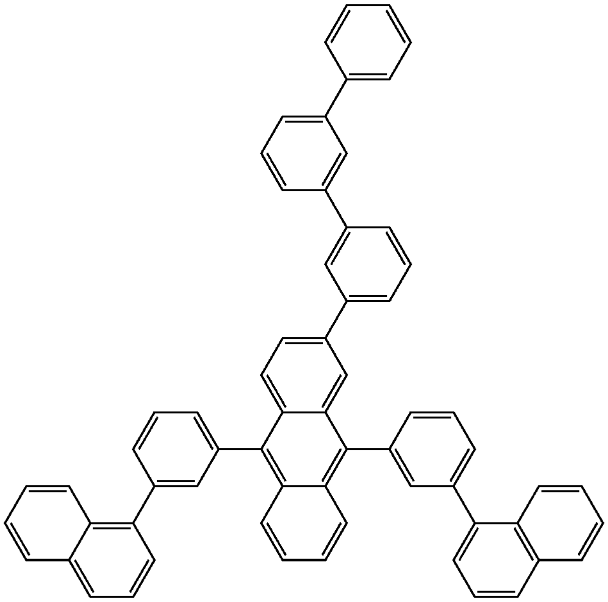
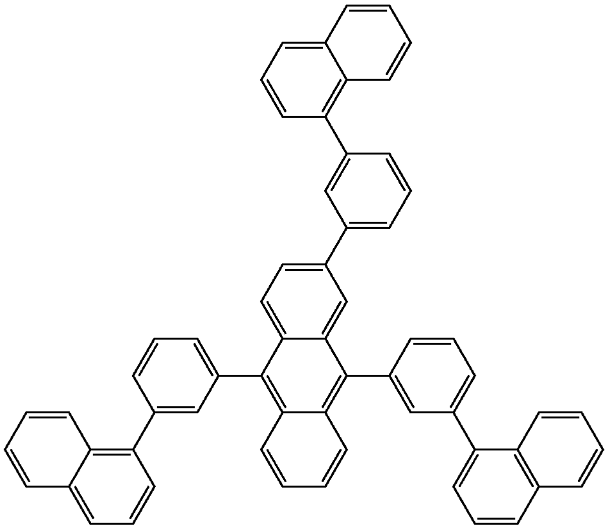

-continued
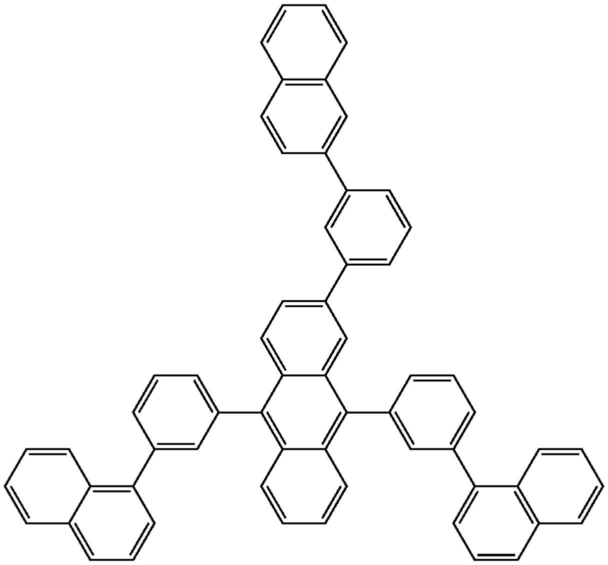
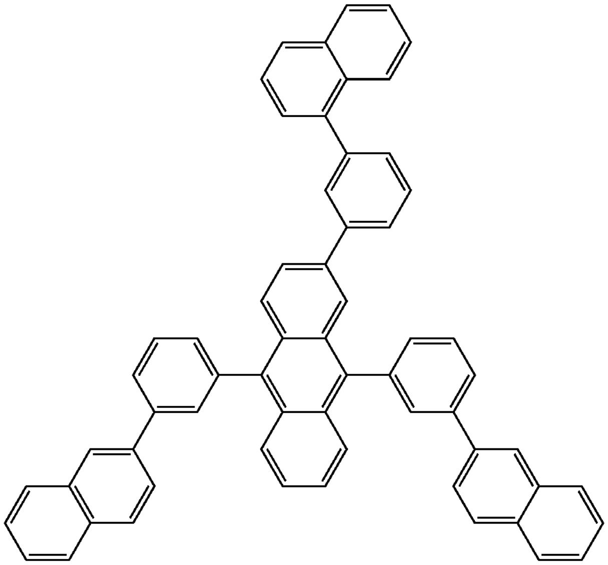 [SMILES: c1cc(-c2ccc3c(-c4cccc(-c5ccc6ccccc6c5)c4)c4ccccc4c(-c4cccc(-c5ccc6ccccc6c5)c4)c3c2)cc(-c2cccc3ccccc23)c1]

-continued
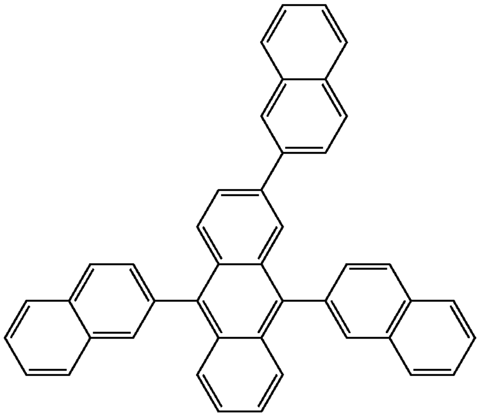
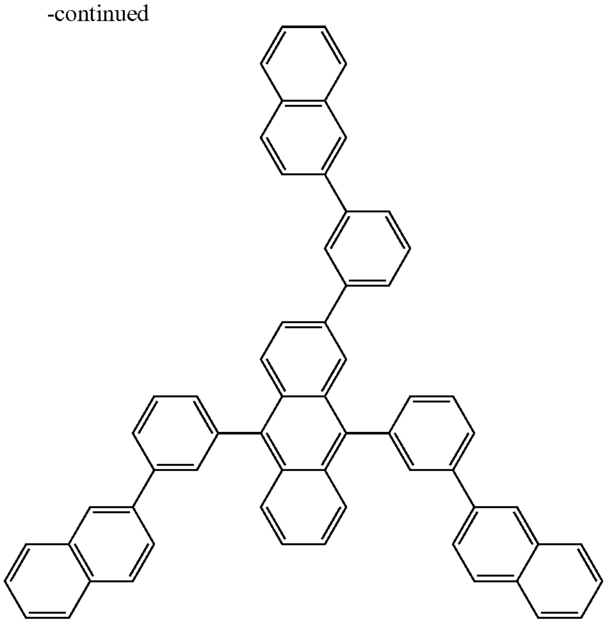
-continued
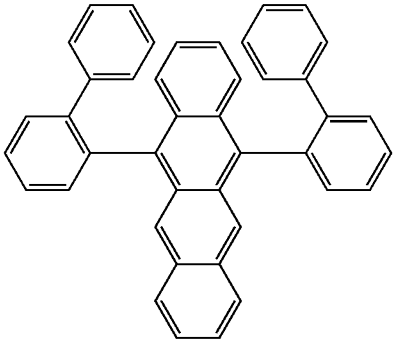
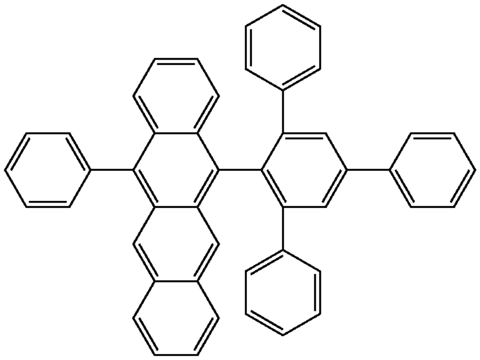
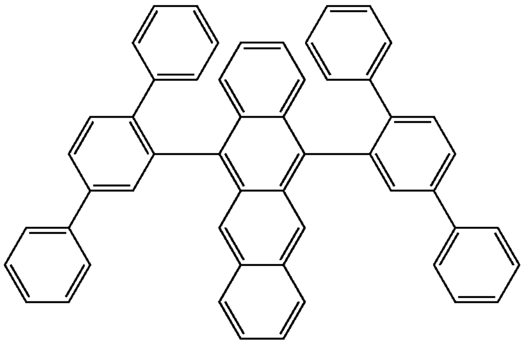
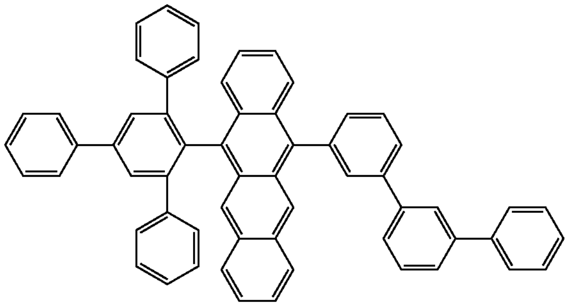
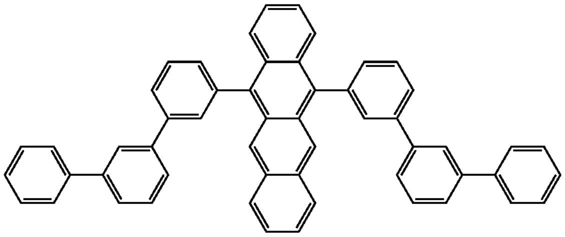
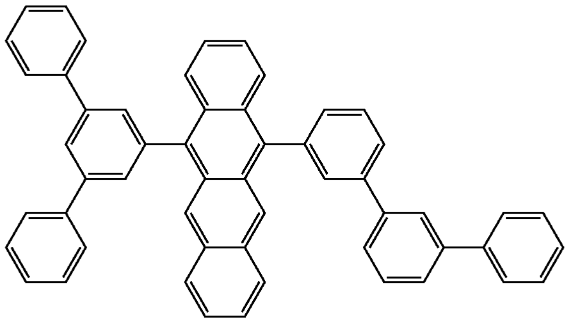

-continued

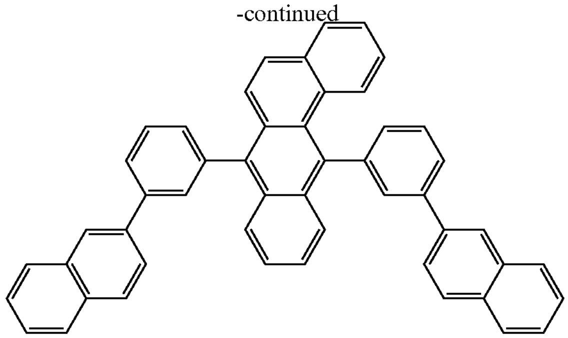

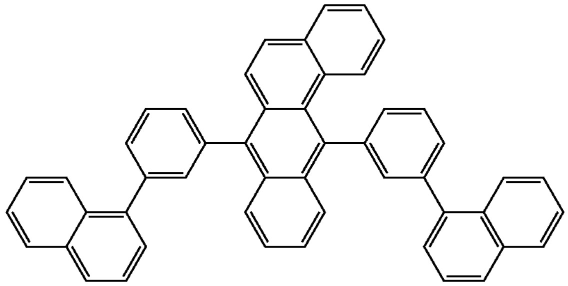

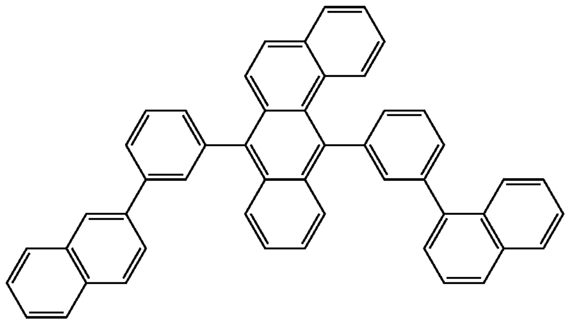

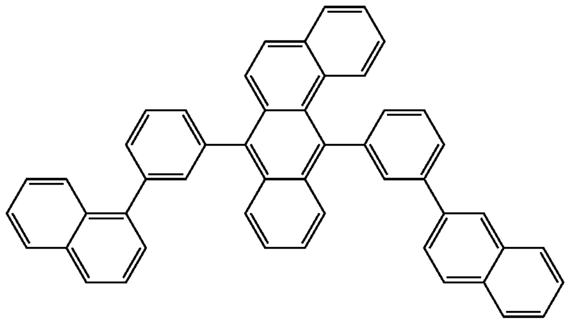

The first compound may be an electron transport host compound having electron transport capacity. A single first compound or a combination or two or more first compounds may be included.

An amount of the first compound may be about 10 wt % or more and 80 wt % or less, for example, about 25 wt % or more and about 60 wt % or less, based on 100 wt % of the total mass of the first compound, the second compound, and the third compound.

In particular, in terms of further improving current efficiency, the amount of the first compound may be about 30 wt % or more and 50 wt % or less based on 100 wt % of the total mass of the first compound, the second compound, and the third compound. In addition, in terms of further improving durability, amount of the first compound may be about 35 wt % or more and 55 wt % or less based on 100 wt % of the total mass of the first compound, the second compound, and the third compound.

In one or more embodiments, Formula 2-1 may be represented by Formula 2-1(1),

Formula 2-2 may be represented by Formula 2-2(1),

Formula 2-3 may be represented by one of Formulae 2-3(1) to 2-3(3), and

Formula 2-4 may be represented by one of Formulae 2-4(1) to 2-4(3):

2-1(1)

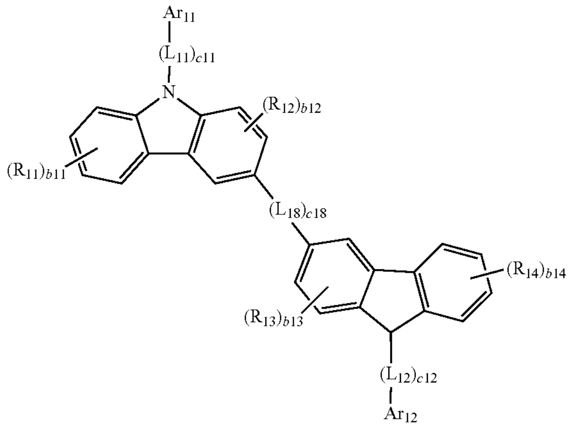

2-2(1)

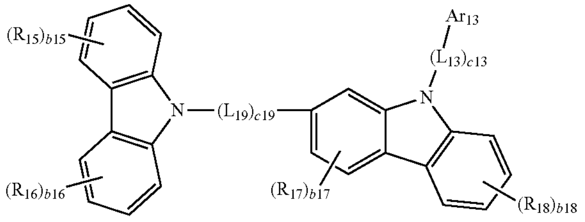

2-3(1)

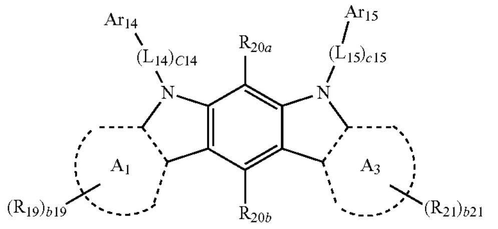

2-3(2)

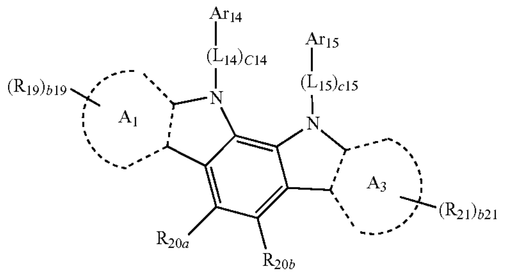

-continued
2-3(3)
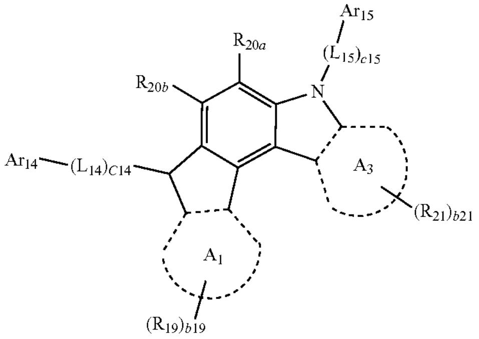
2-4(1)
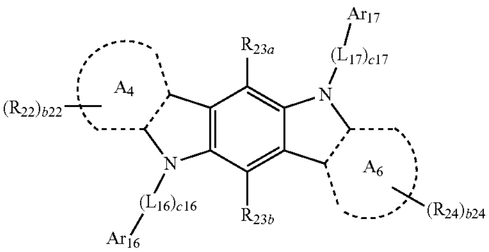
2-4(2)
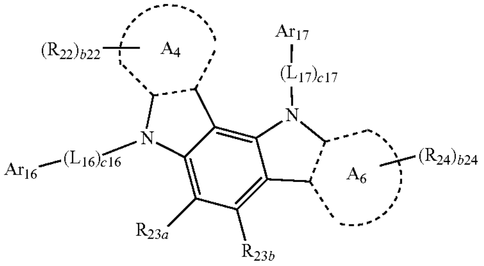
2-4(3)
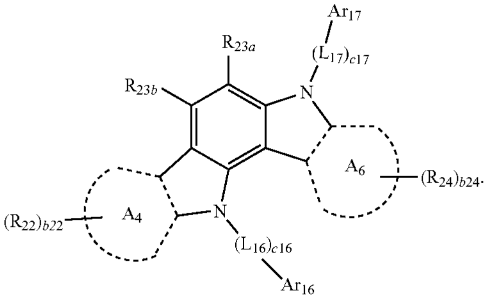
$R_{20a}$ and $R_{20b}$ in Formulae 2-3(1) to 2-3(3) may each independently be understood by referring to the description presented in connection with $R_{20}$.
$R_{23a}$ and $R_{23b}$ in Formulae 2-4(1) to 2-4(3) may each independently be understood by referring to the description presented in connection with $R_{23}$.
The second compound may include at least one of the following compounds:
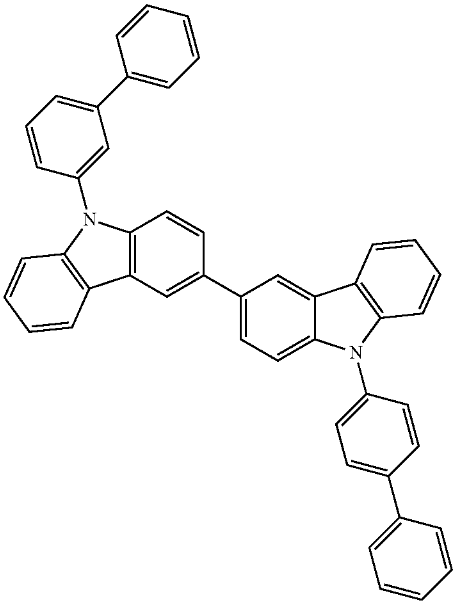
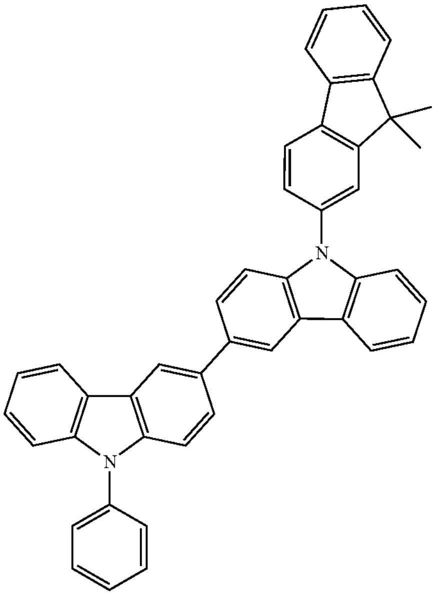

-continued
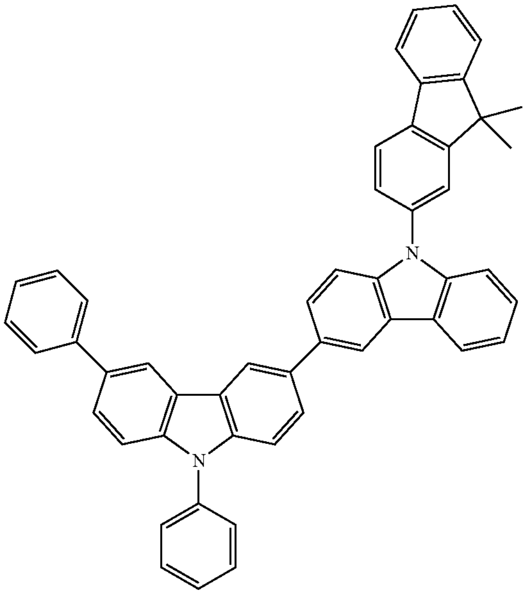
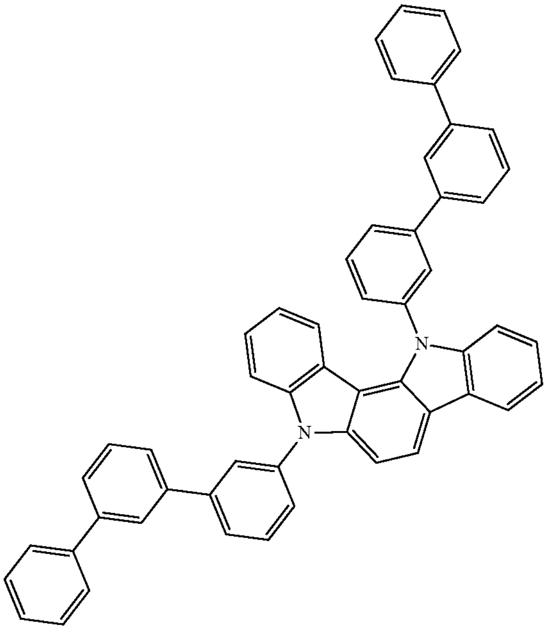
-continued
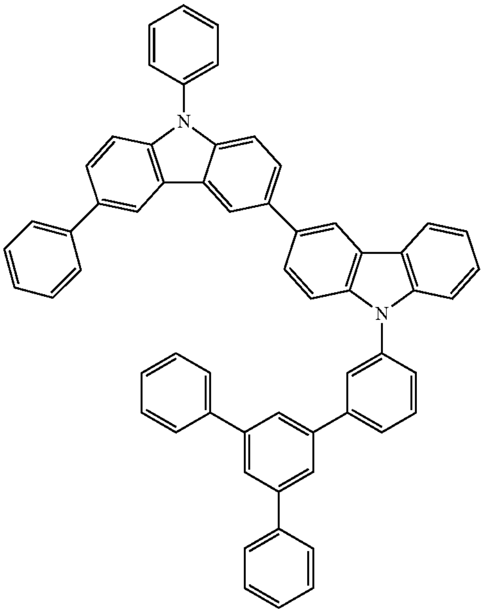
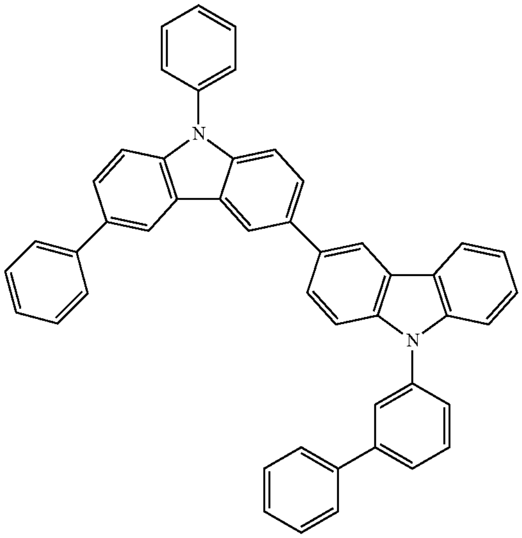

-continued
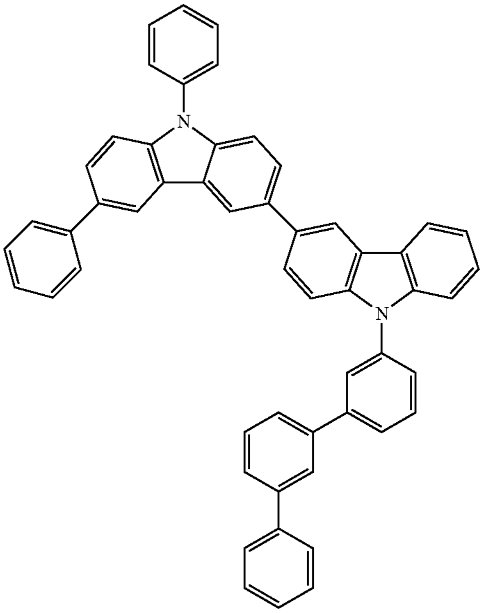
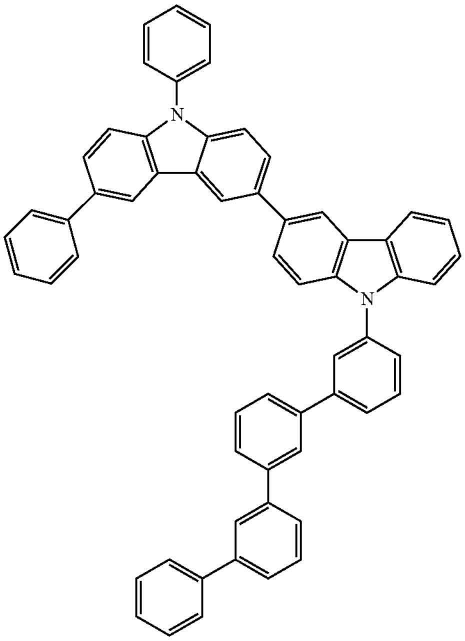
-continued
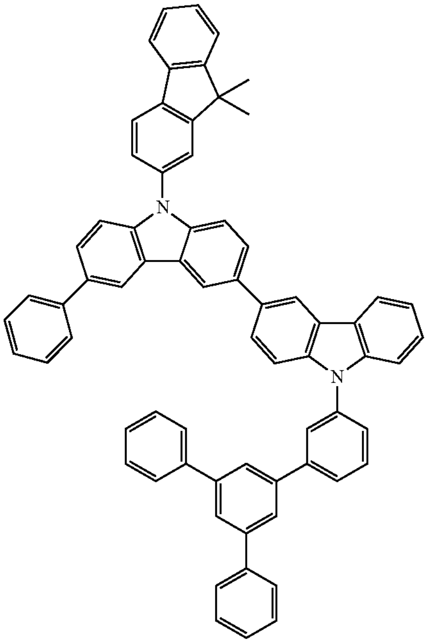 [SMILES: CC1(C)c2ccccc2-c2ccc(-n3c4ccc(-c5ccccc5)cc4c4cc(-c5ccc6c(c5)c5ccccc5n6-c5cccc(-c6cc(-c7ccccc7)cc(-c7ccccc7)c6)c5)ccc43)cc21]
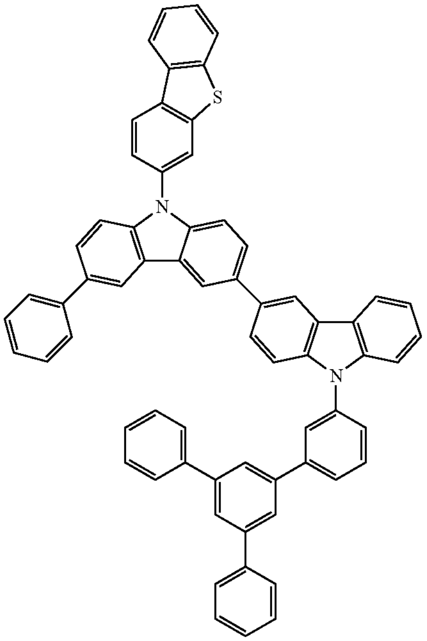

-continued
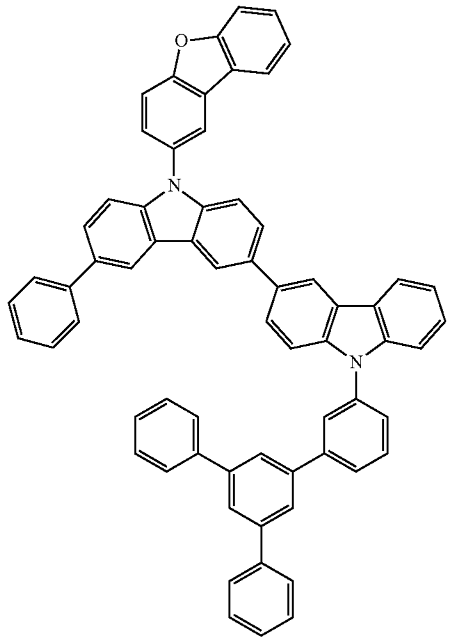
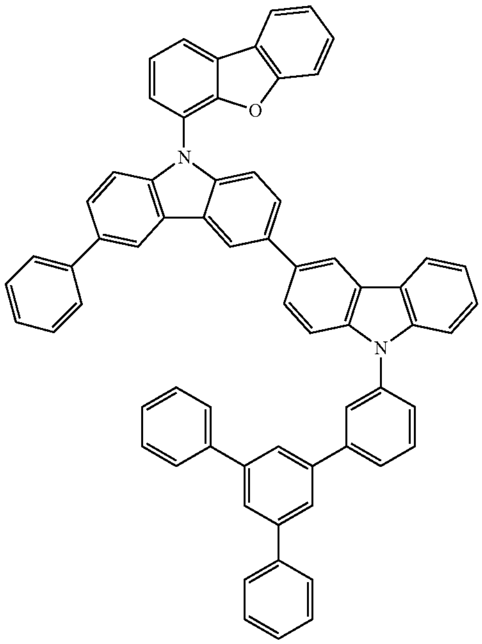
-continued
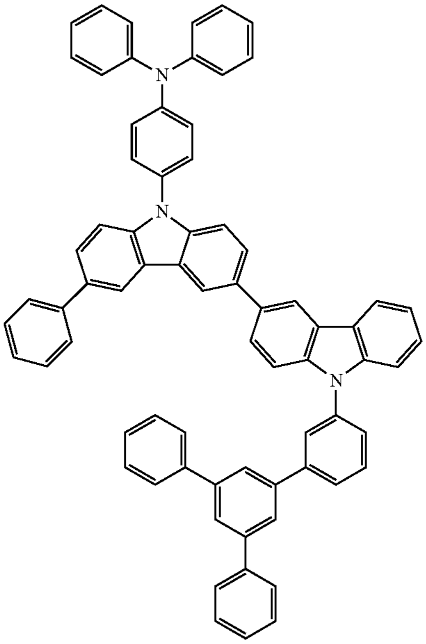
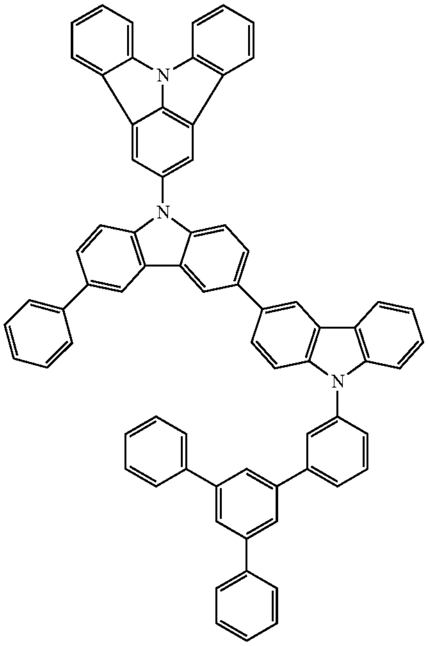

-continued
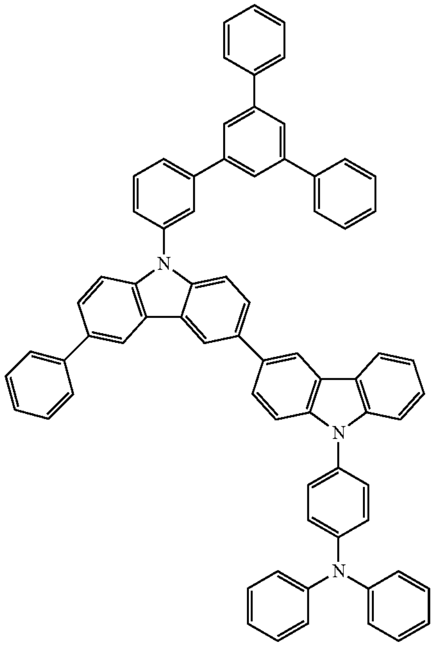
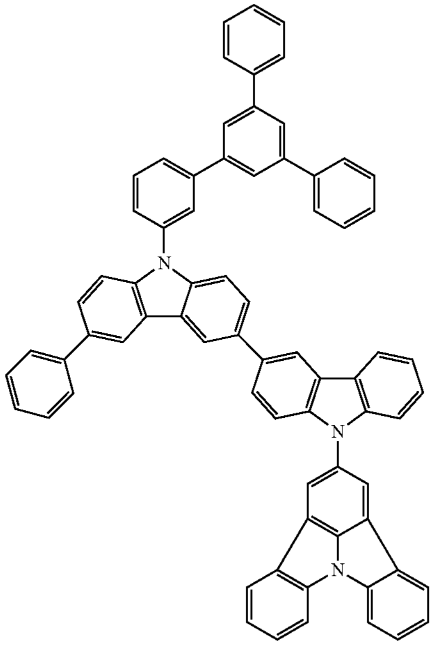 [SMILES: c1ccc(-c2cc(-c3ccccc3)cc(-c3cccc(-n4c5ccc(-c6ccccc6)cc5c5cc(-c6ccc7c(c6)c6ccccc6n7-c6cc7c8ccccc8n8c9ccccc9c(c6)c78)ccc54)c3)c2)cc1]
-continued
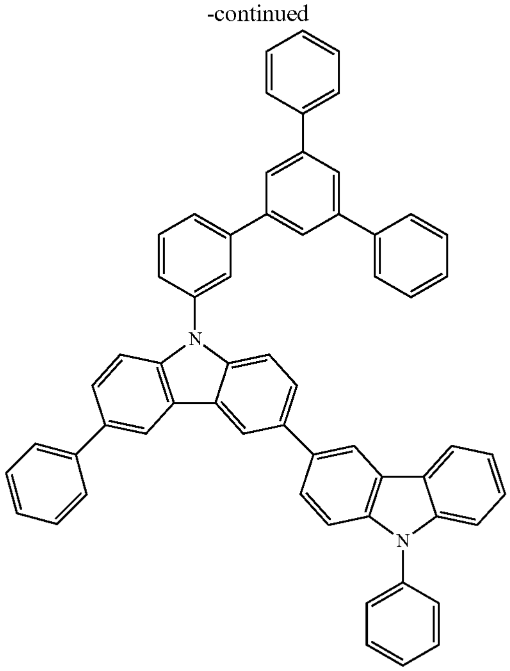
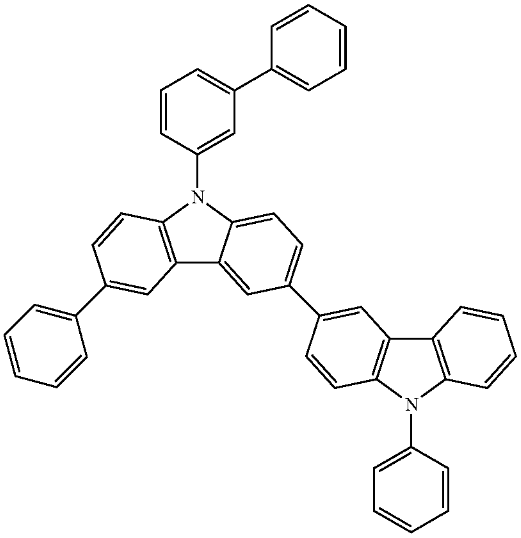

-continued
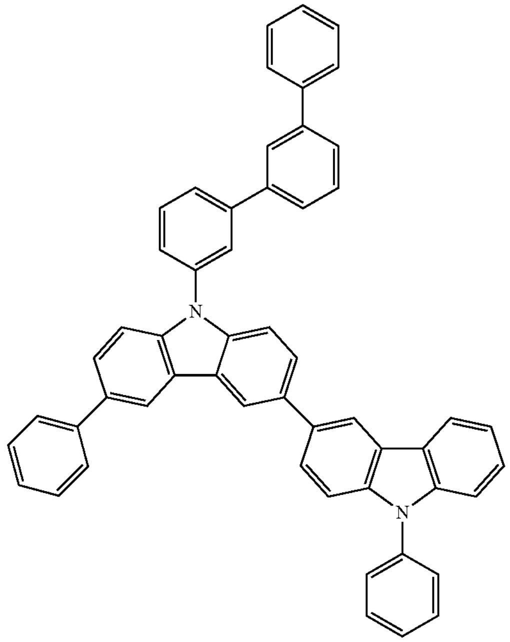
-continued
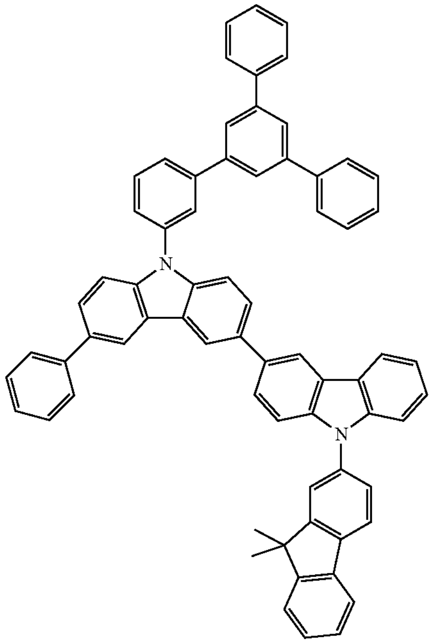
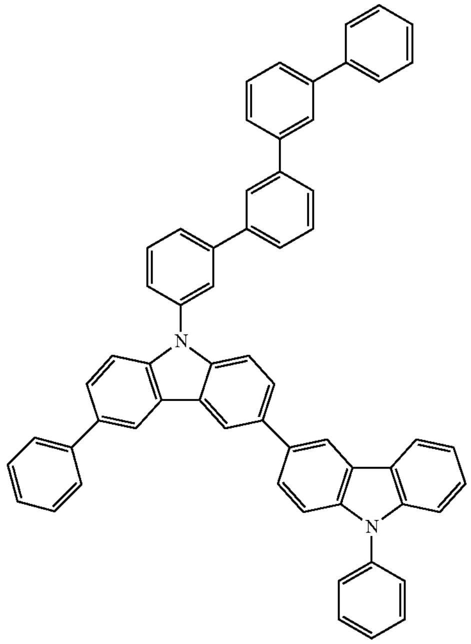
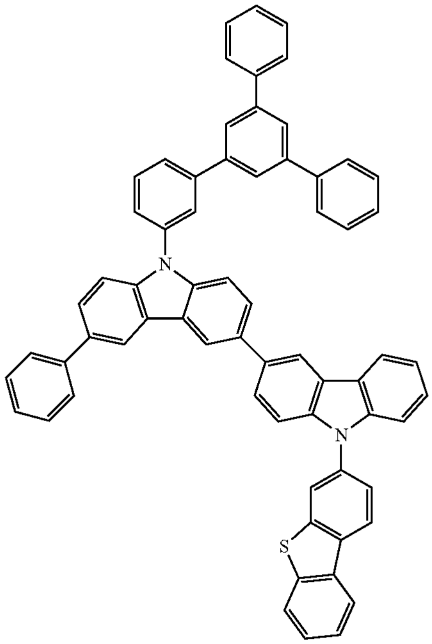

-continued
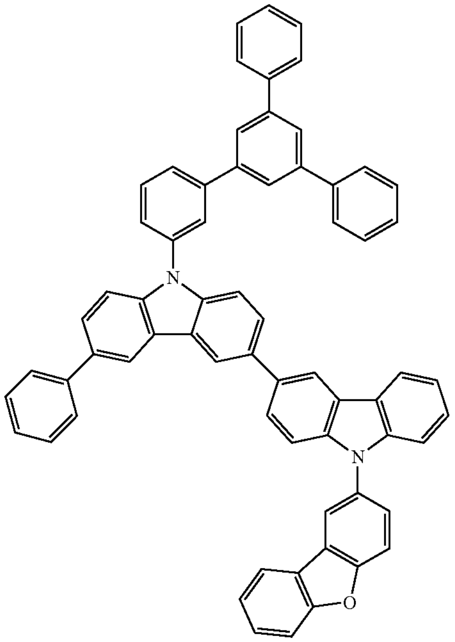
-continued
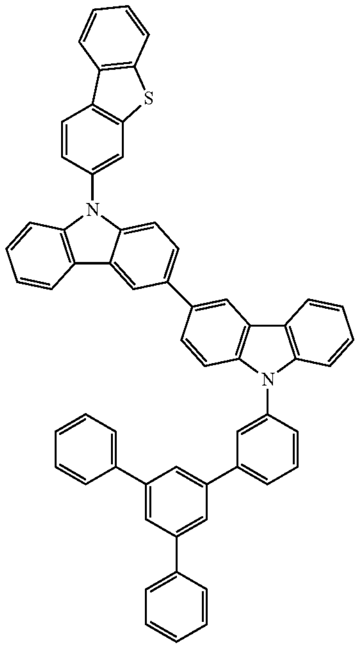
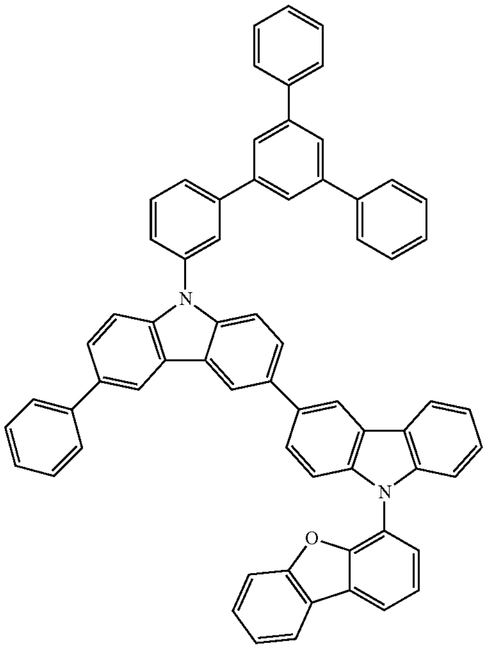
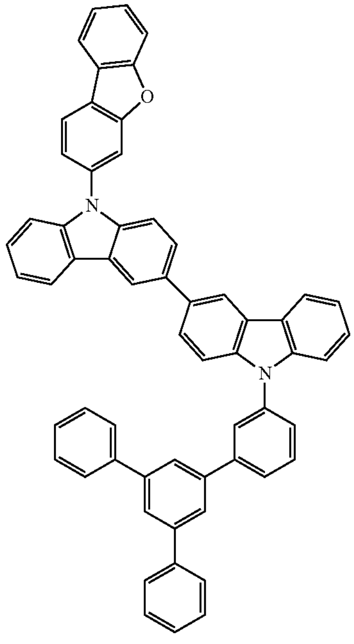

-continued
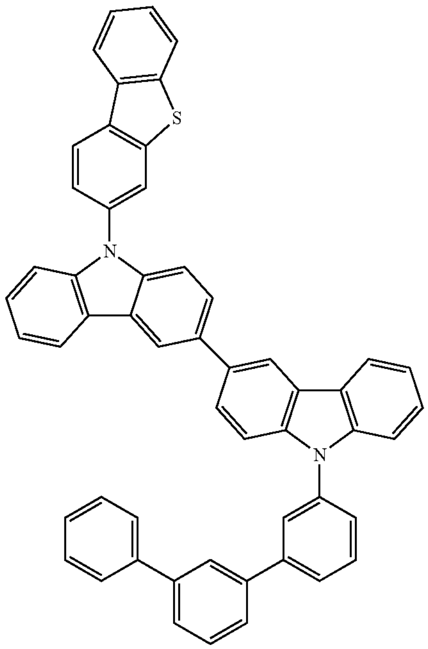 [SMILES: c1ccc(-c2cccc(-c3cccc(-n4c5ccccc5c5cc(-c6ccc7c(c6)c6ccccc6n7-c6ccc7c(c6)sc6ccccc67)ccc54)c3)c2)cc1]
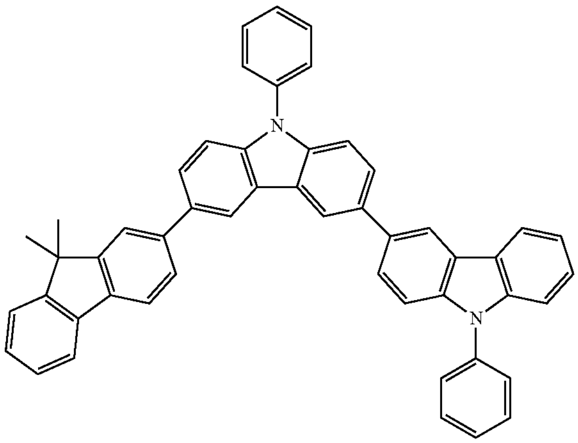
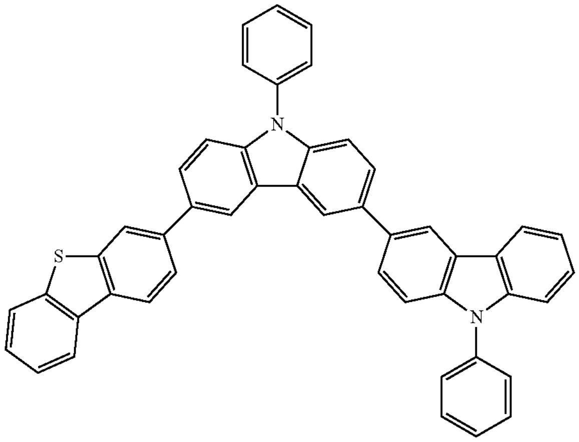
-continued
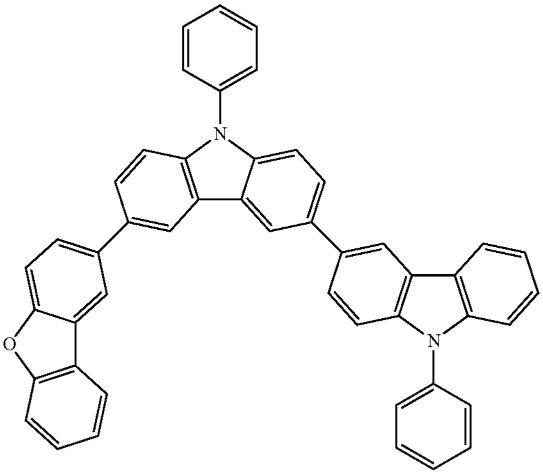
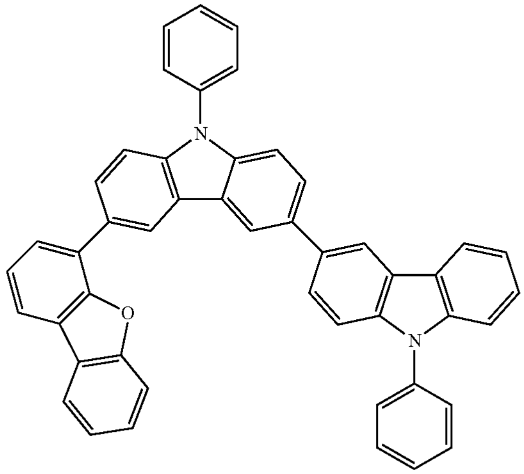
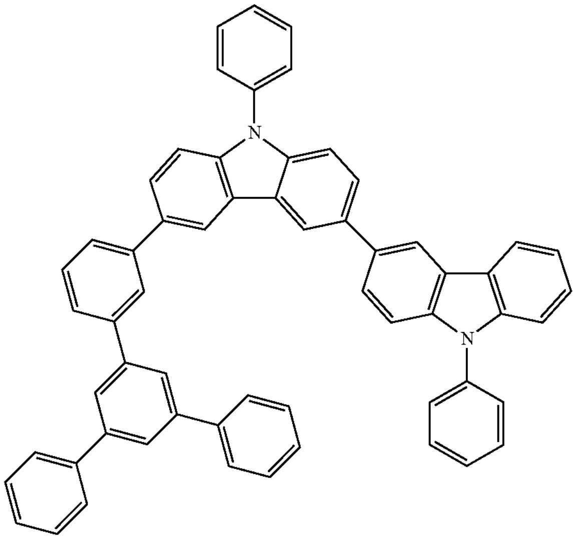

-continued

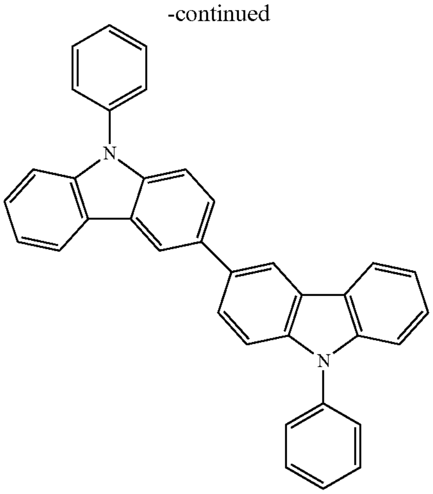

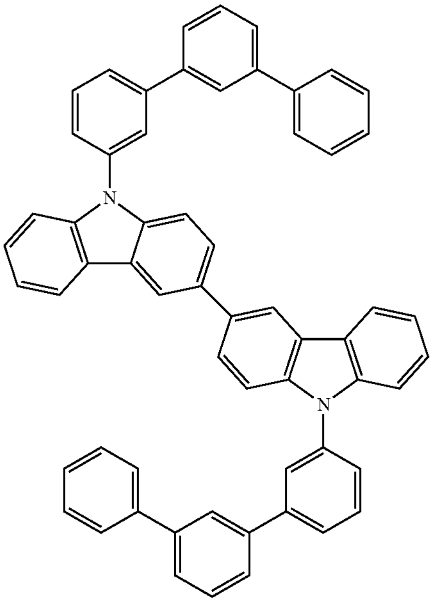

-continued

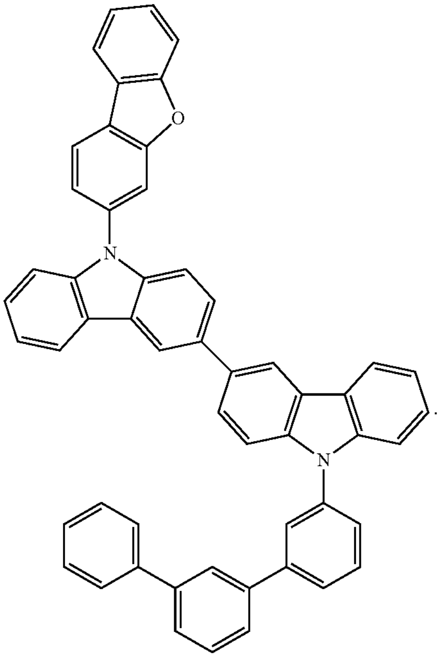

The second compound may be a hole transport host compound having hole transport capacity. A single second compound or a combination of two or more second compounds may be included.

An amount of the second compound may be about 10 wt % or more and 80 wt % or less, for example, about 25 wt % or more and about 60 wt % or less, based on 100 wt % of the total mass of the first compound, the second compound, and the third compound.

The third compound may include at least one of the following compounds:

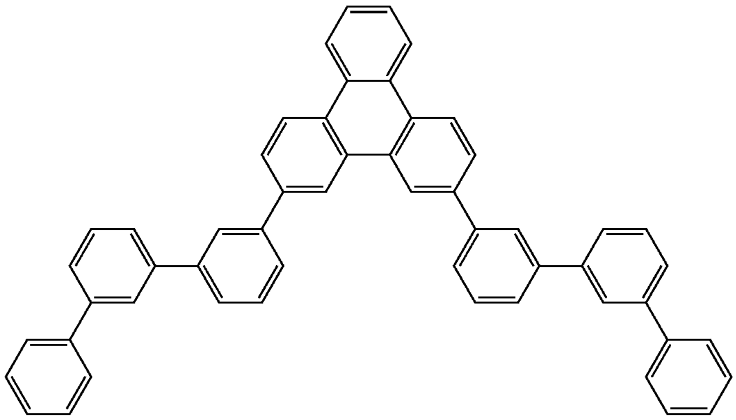

-continued
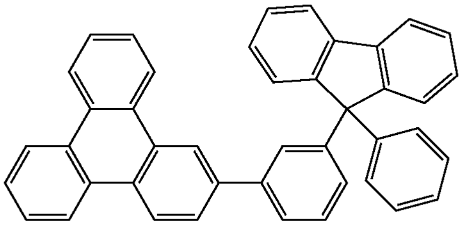
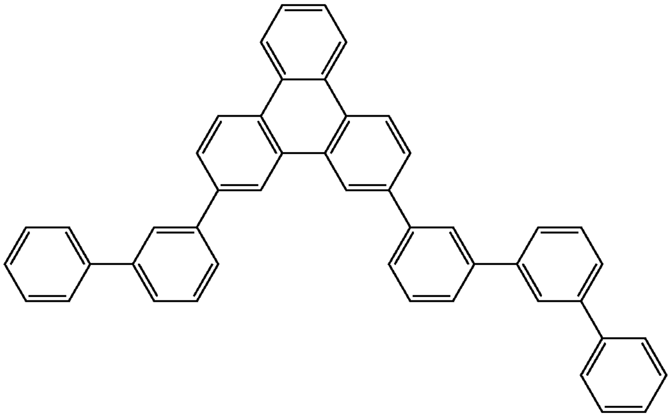
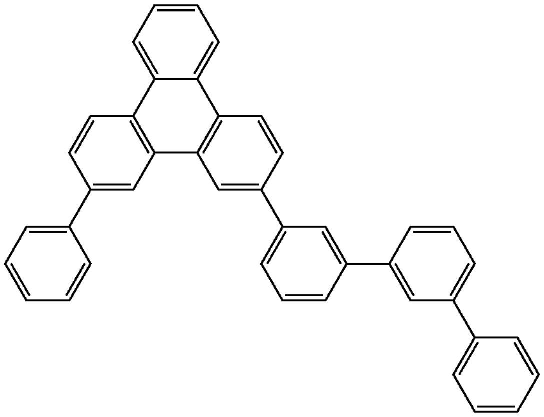
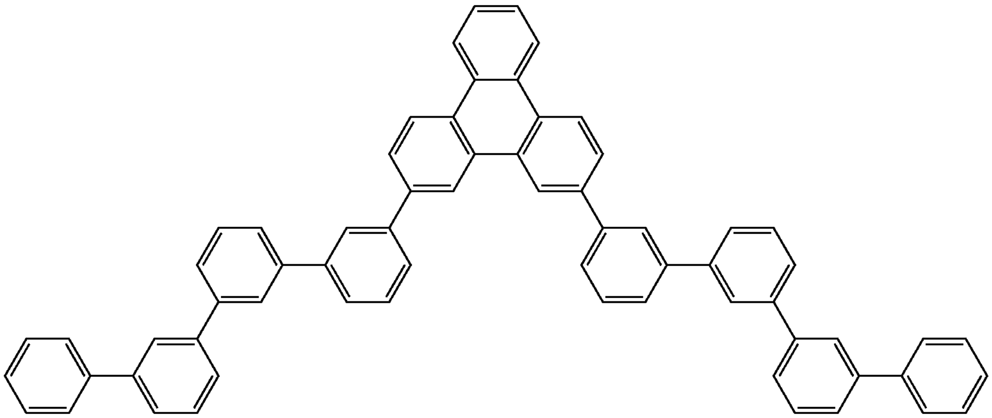
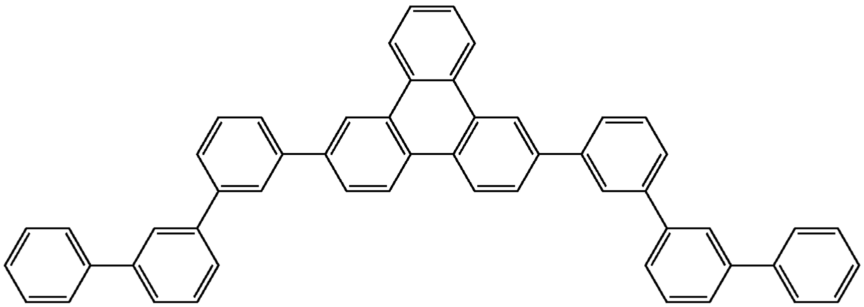

-continued
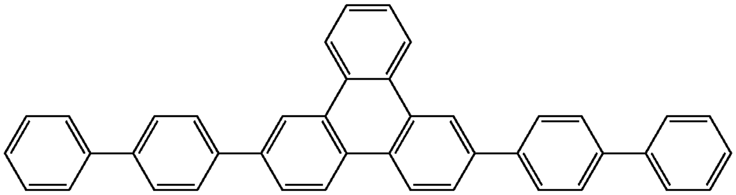
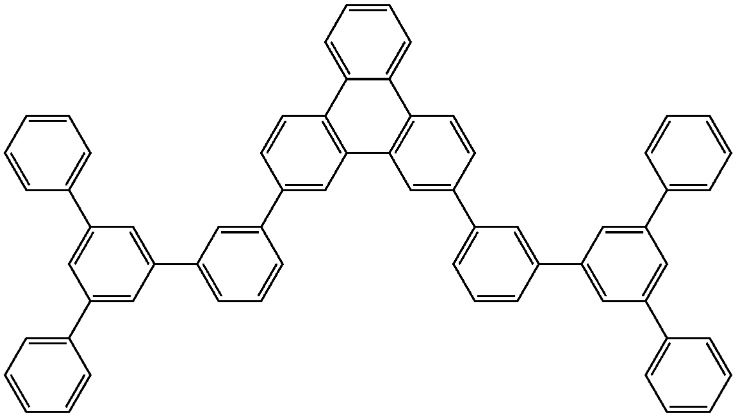
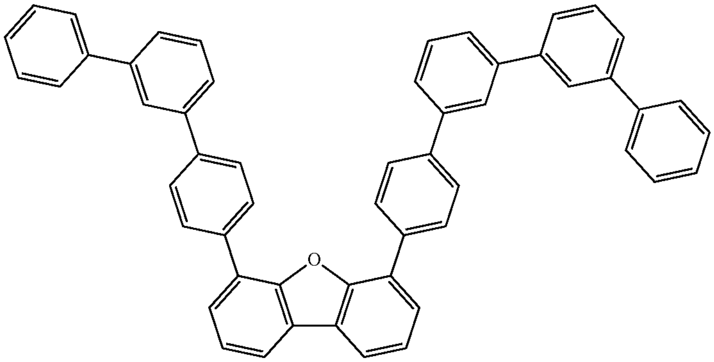
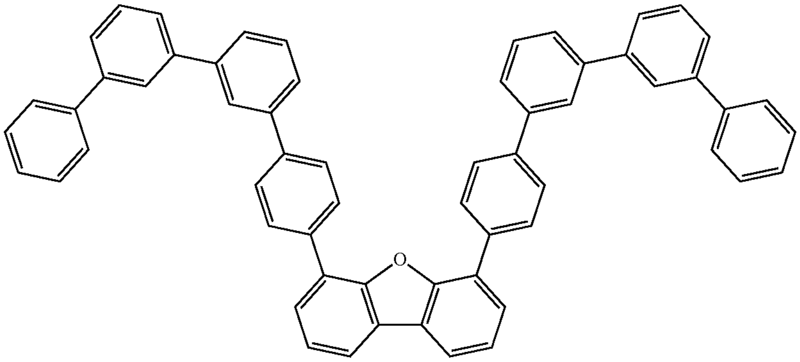
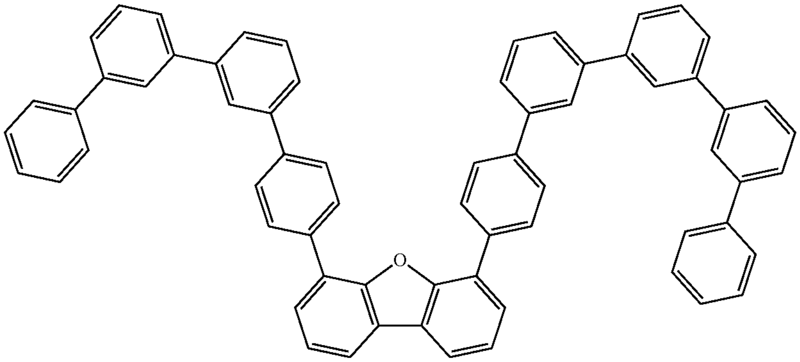

-continued
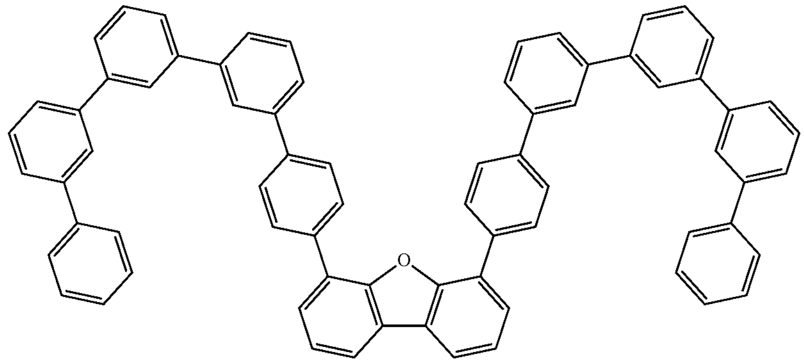
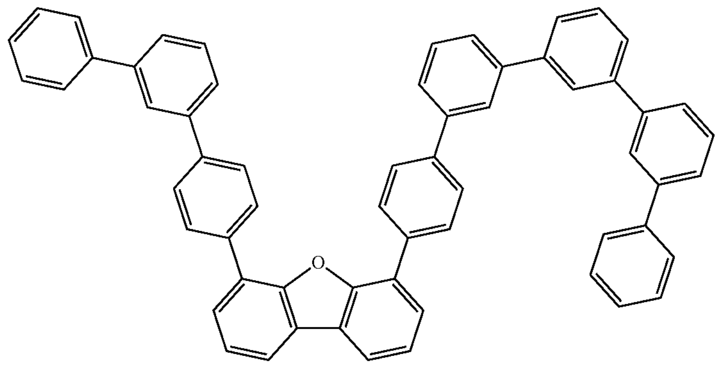
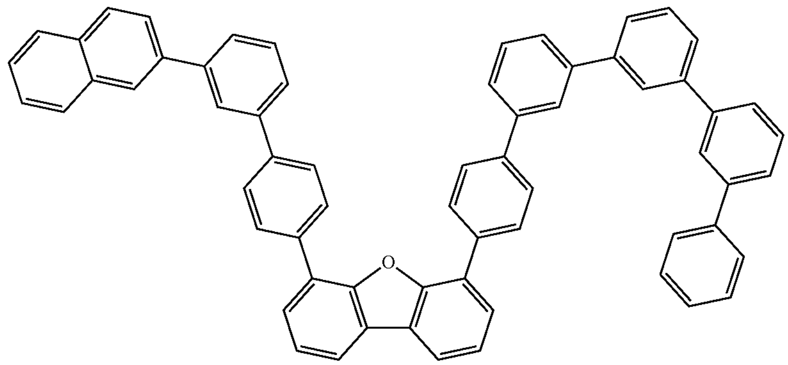
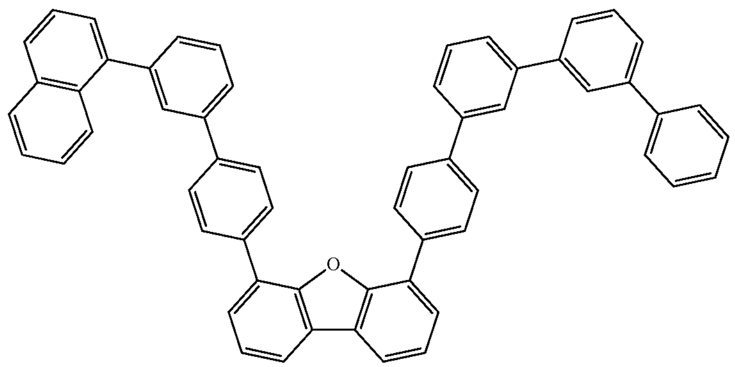

-continued
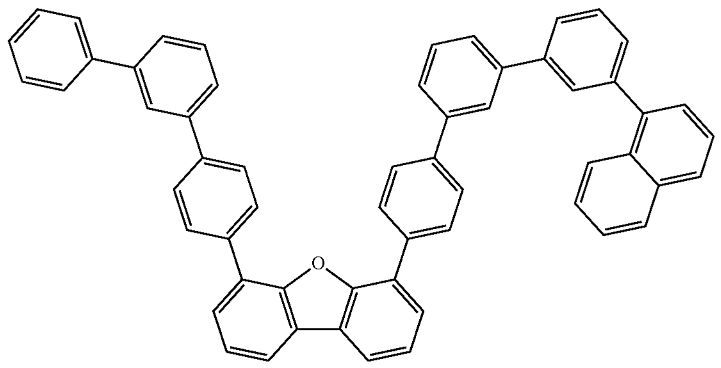
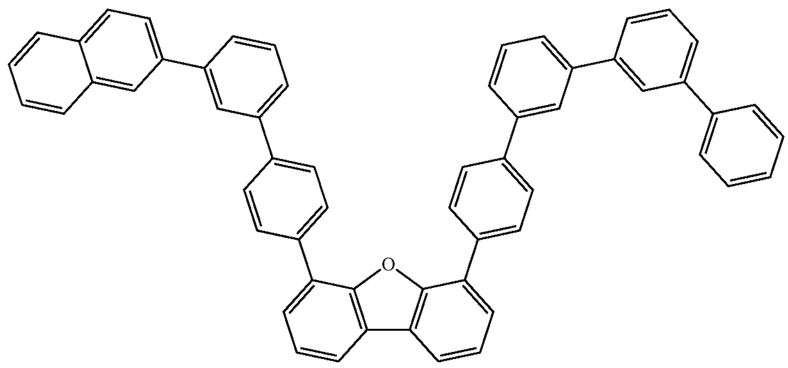
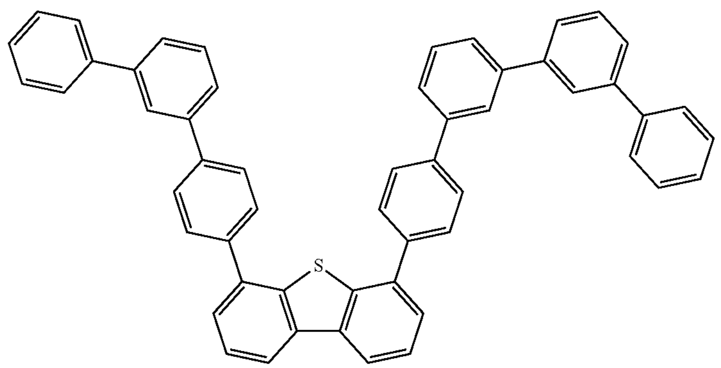
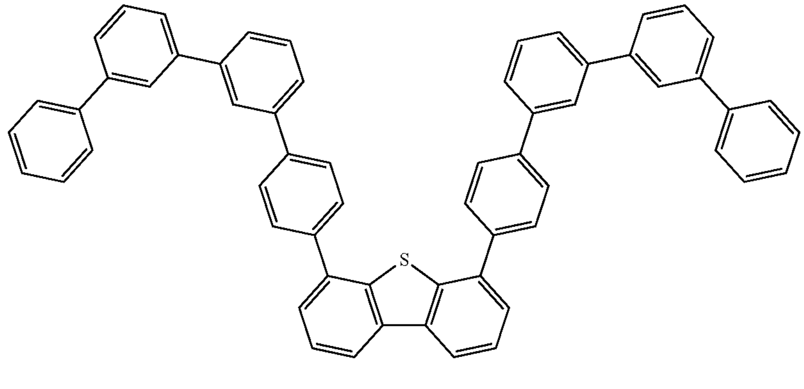

-continued
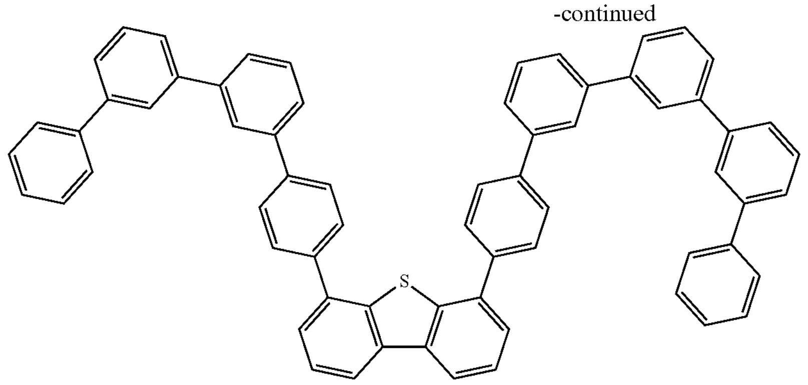
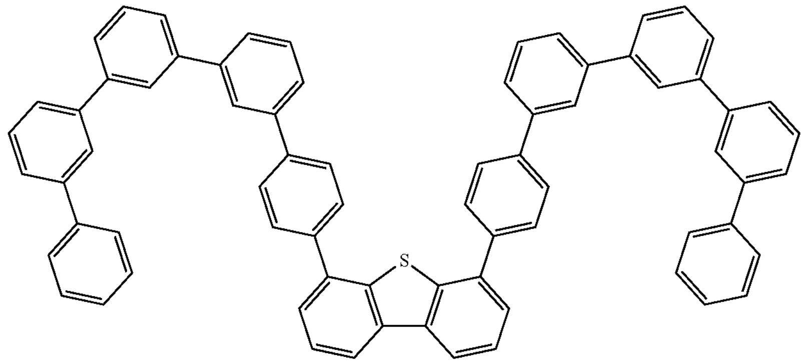
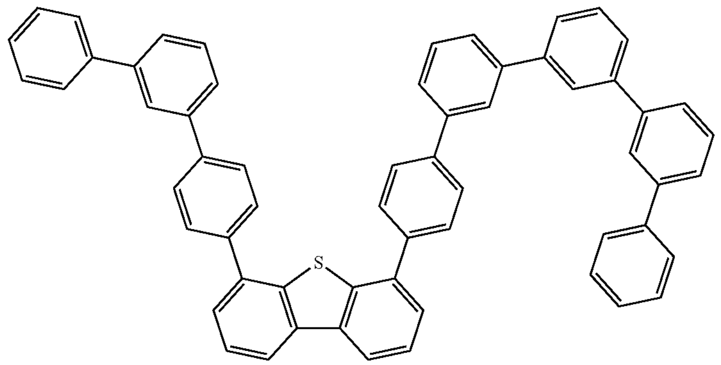
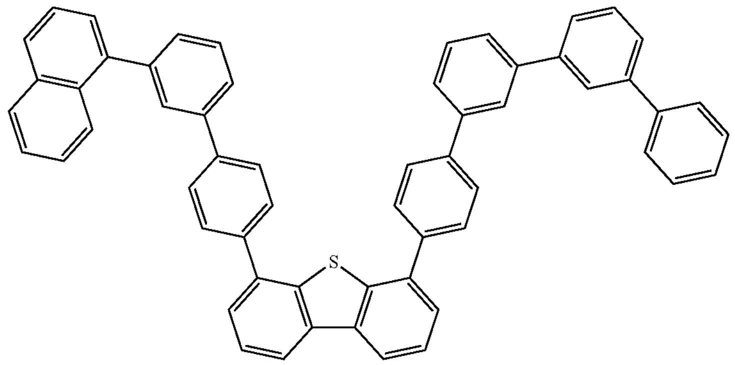

-continued
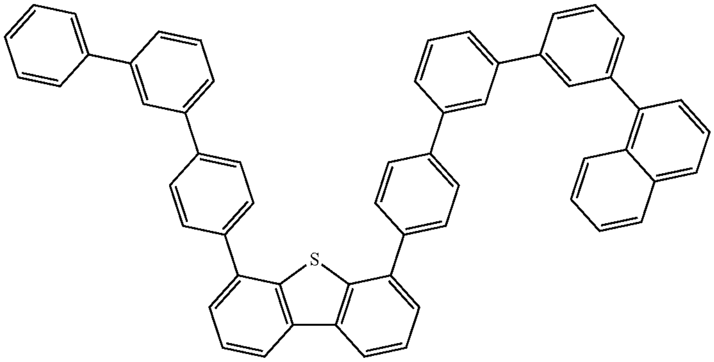
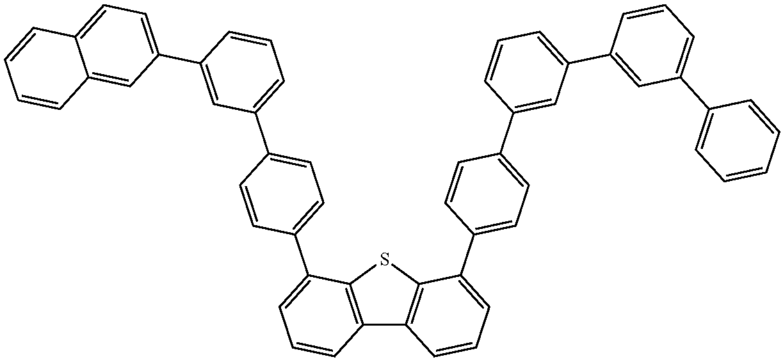
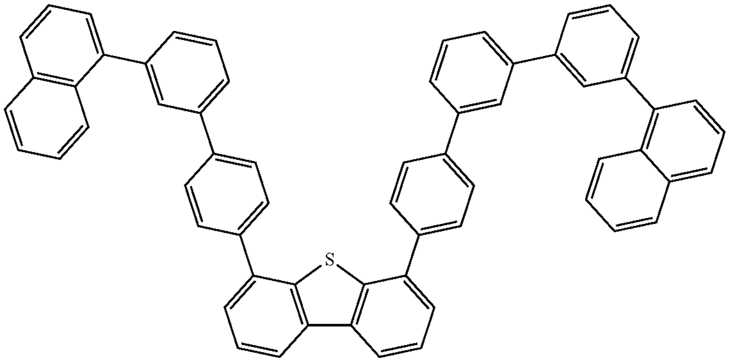
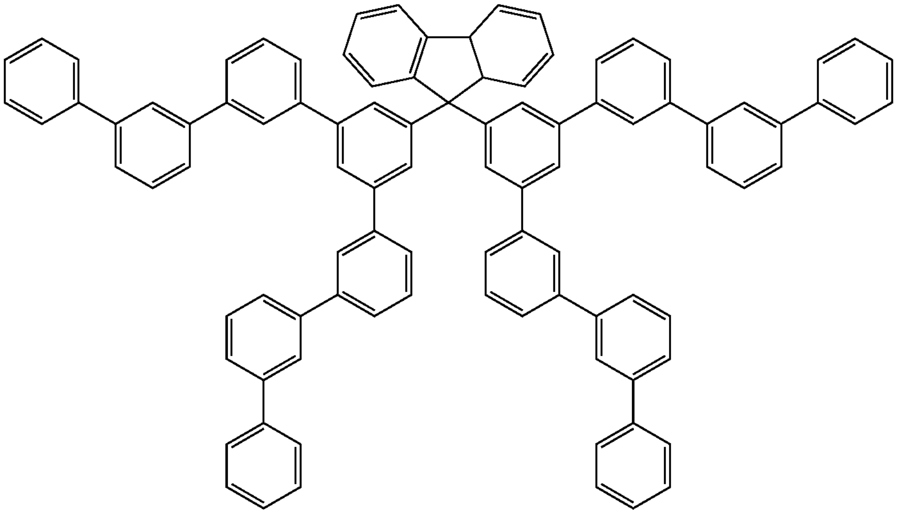

-continued
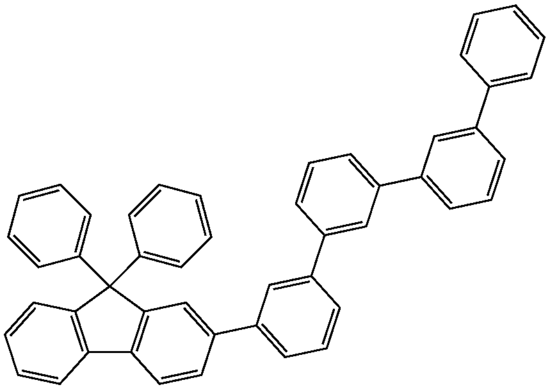
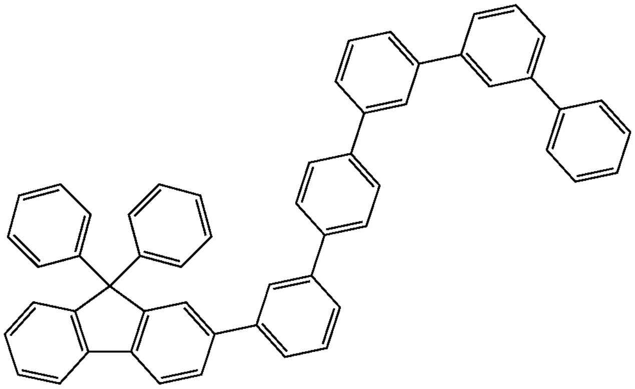
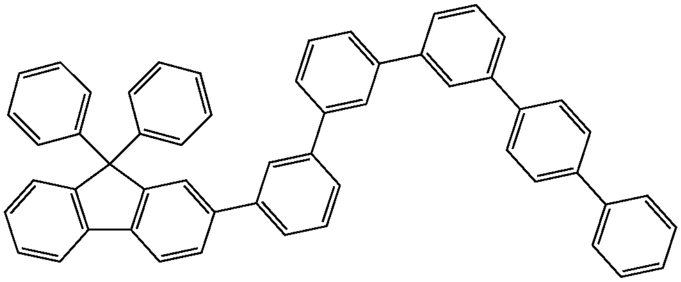
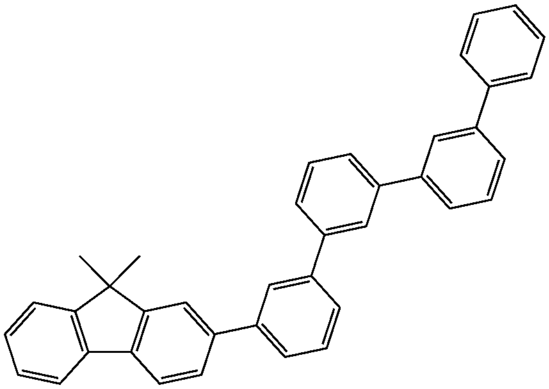
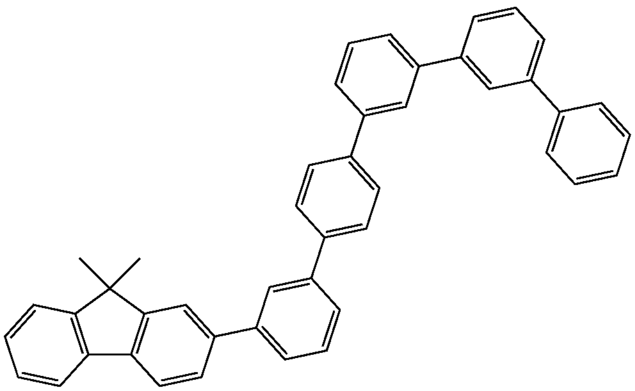

-continued
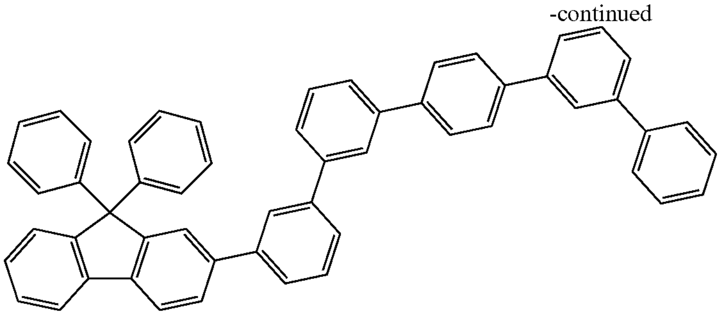
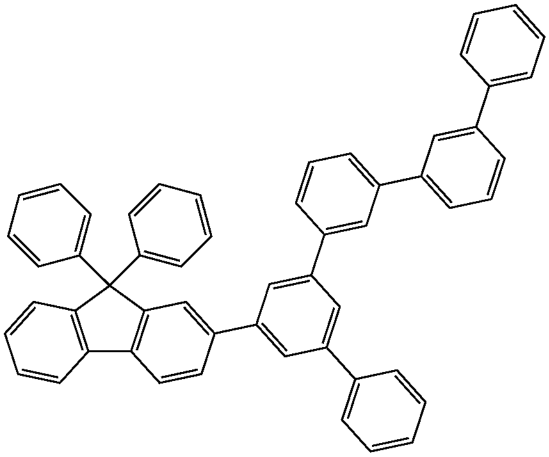
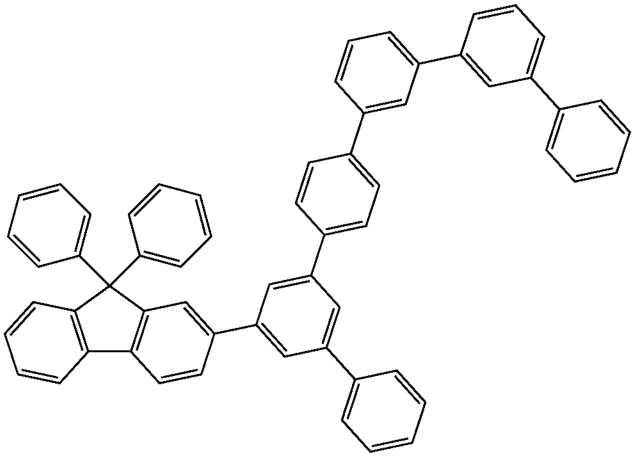
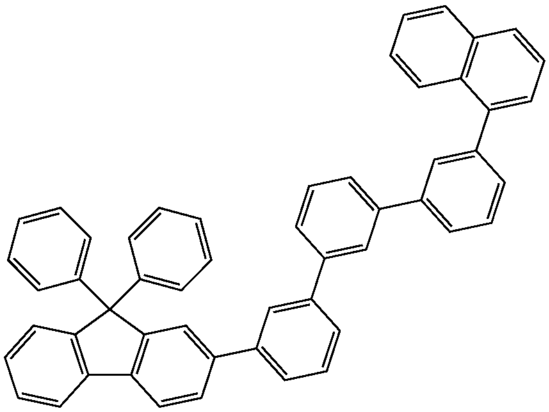
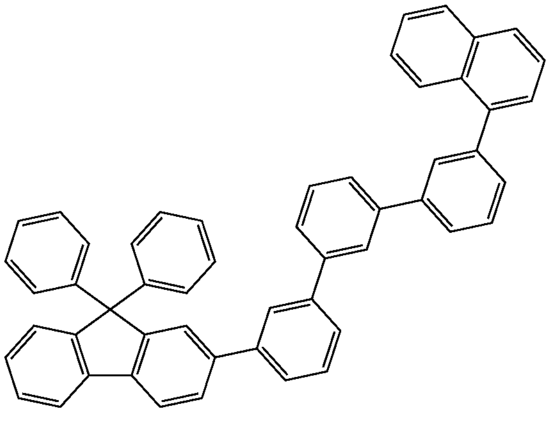
-continued
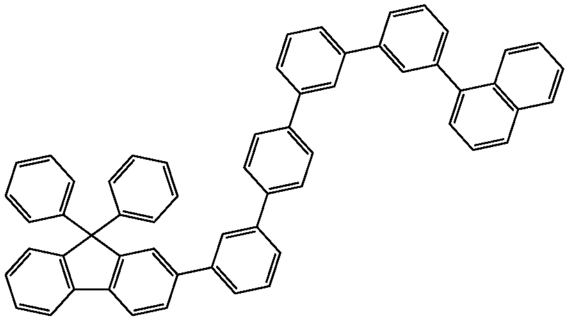

-continued
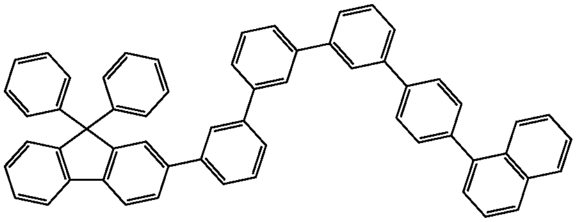
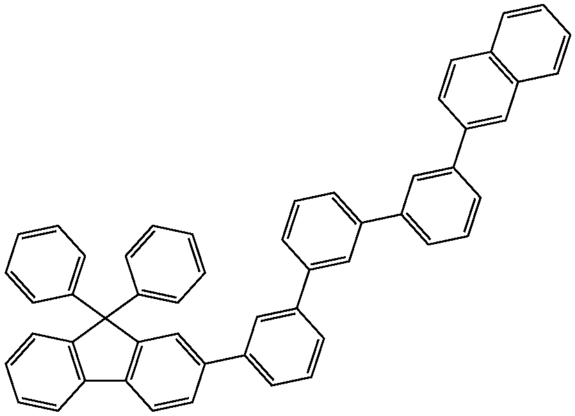
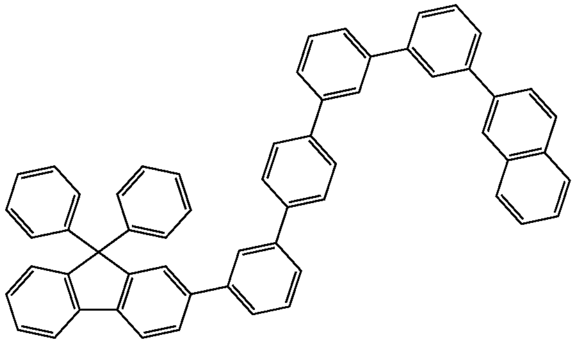
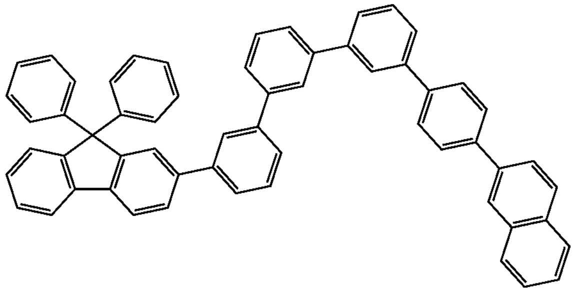
-continued
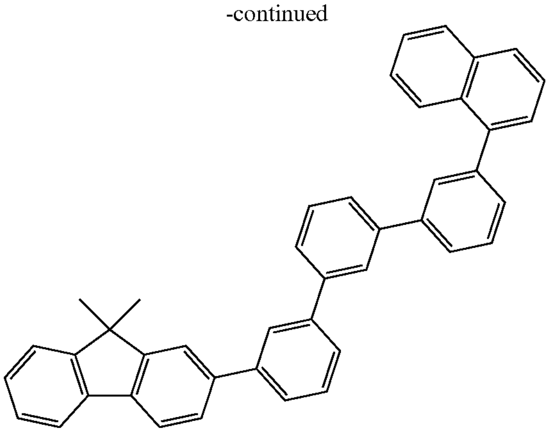
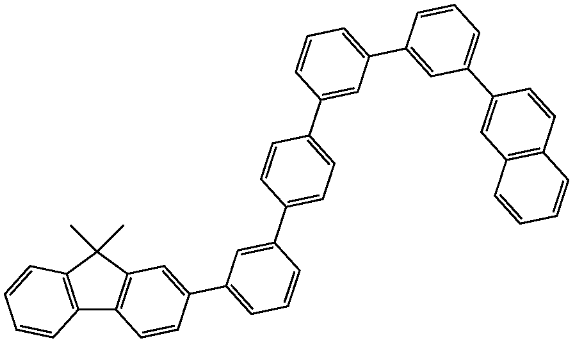
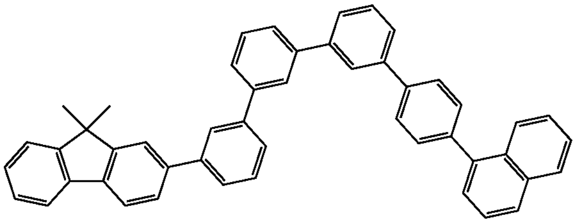

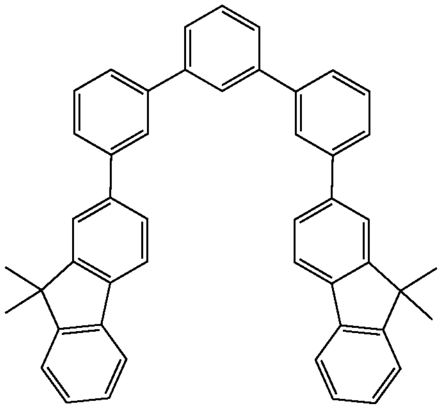
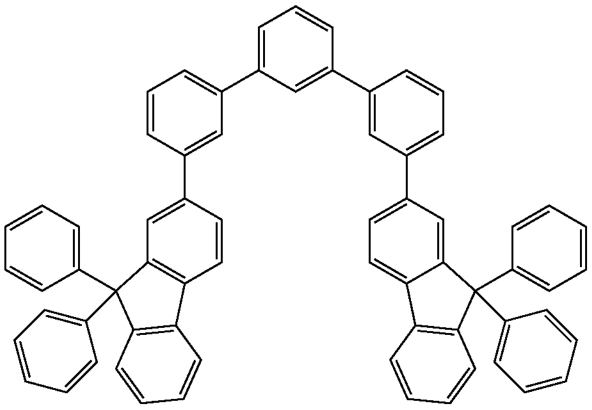
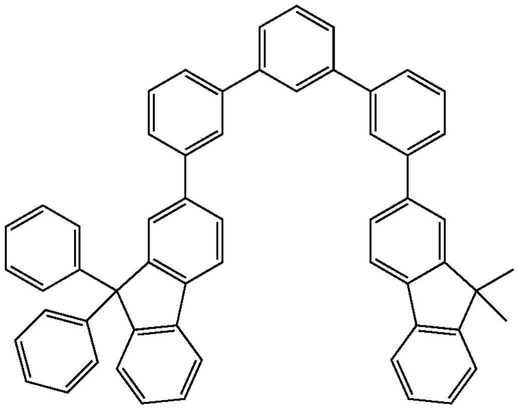
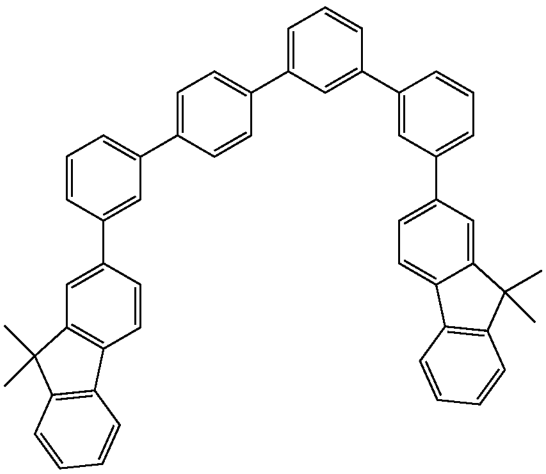
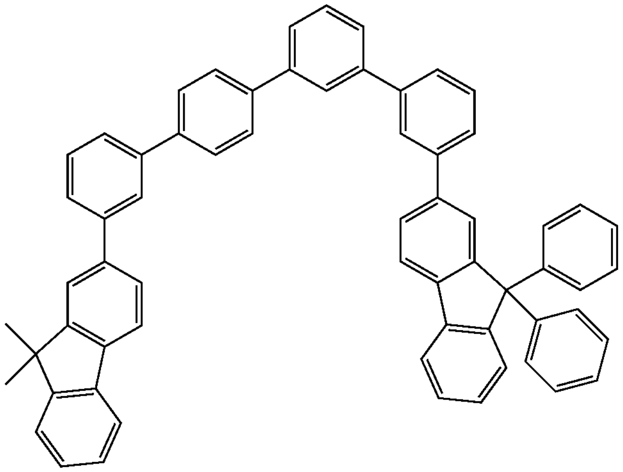

-continued
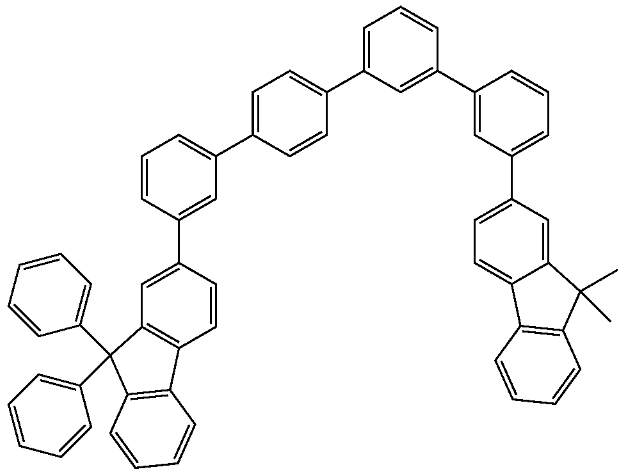
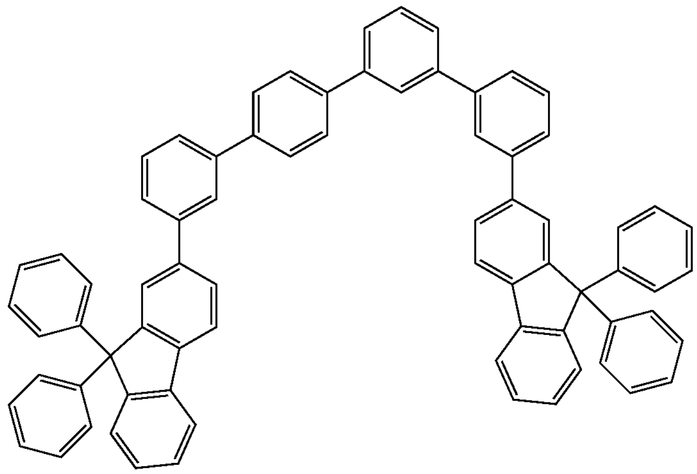
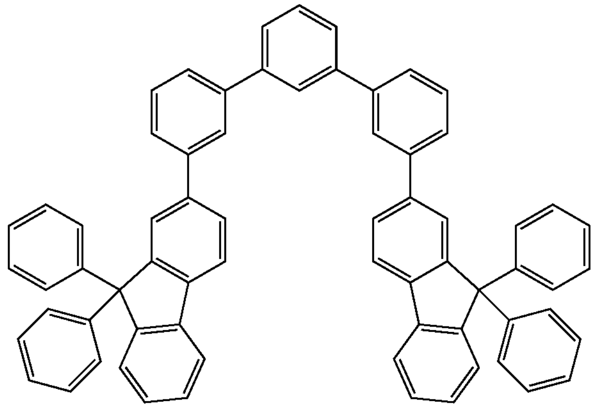
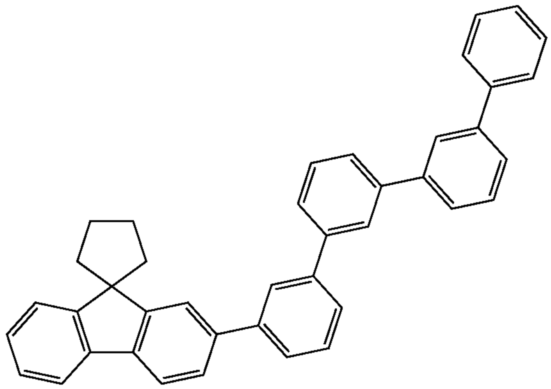

-continued
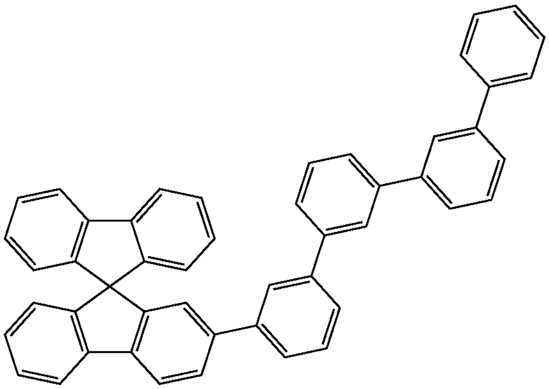
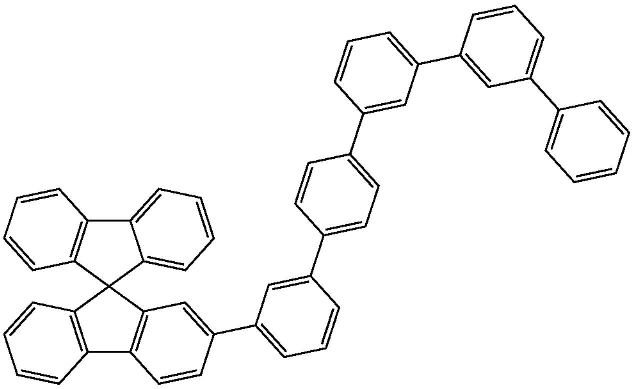
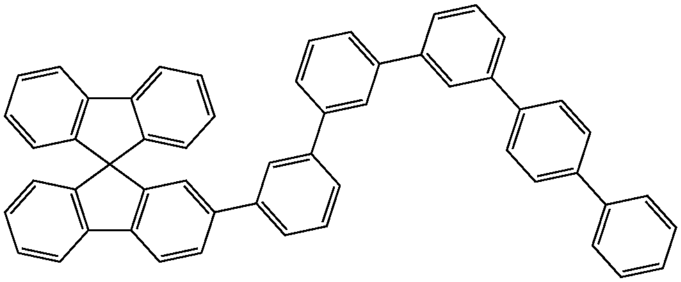
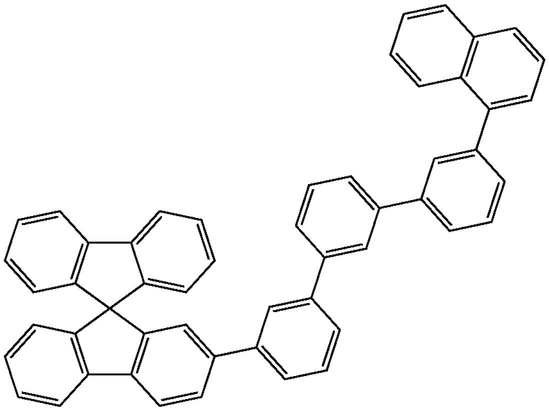
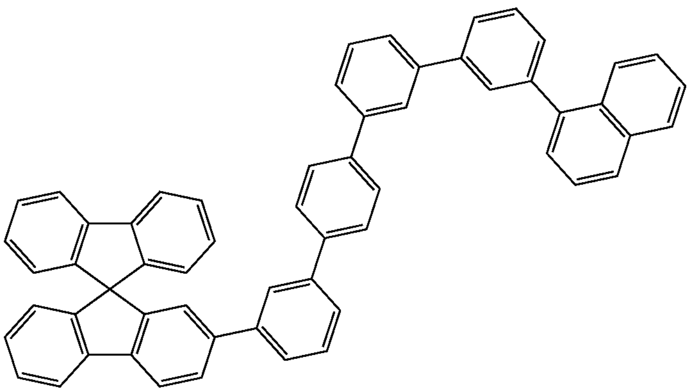

-continued
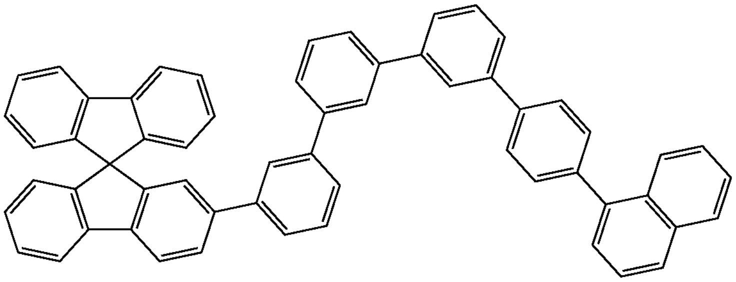
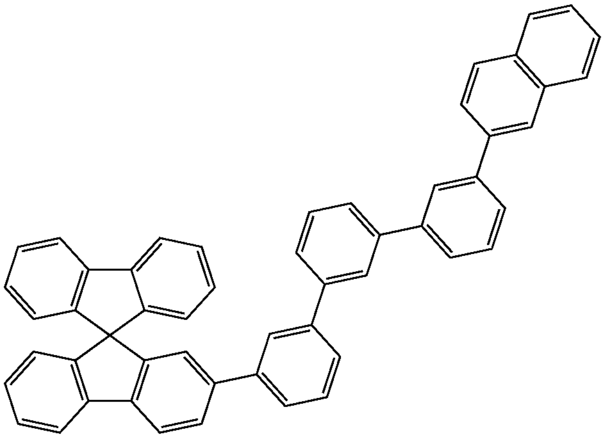
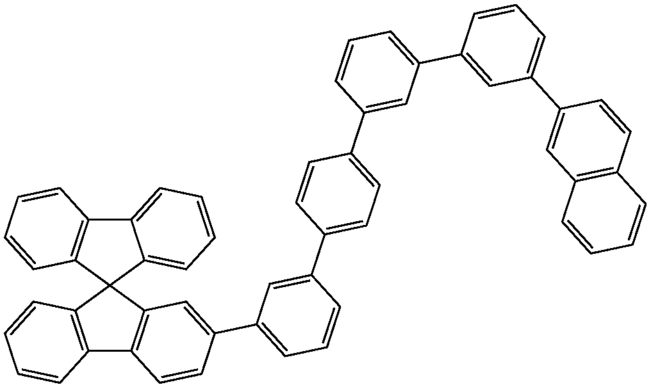
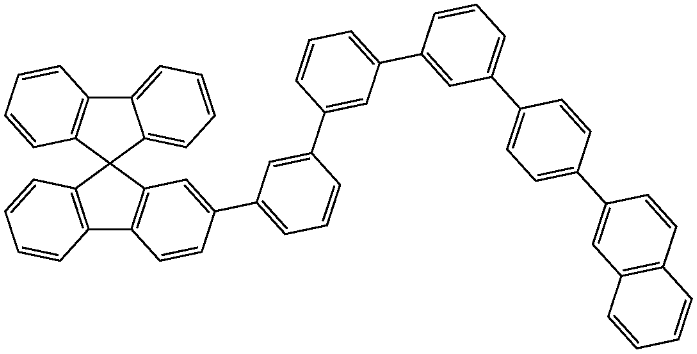

-continued
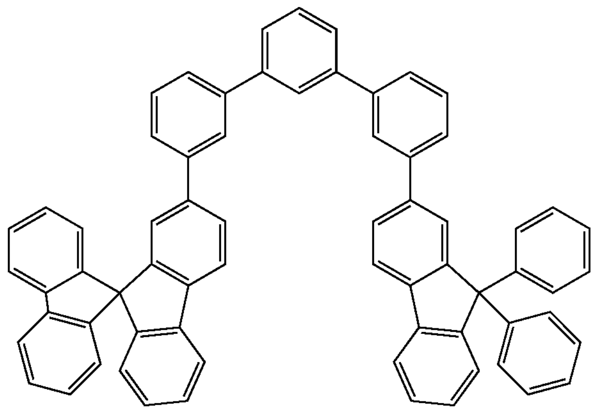
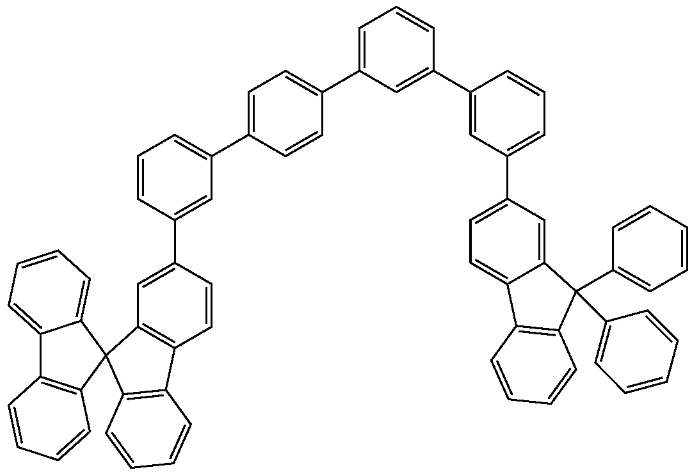
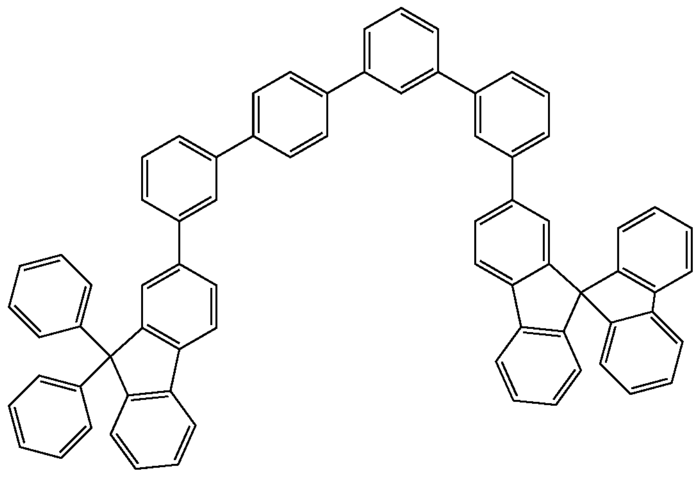

-continued
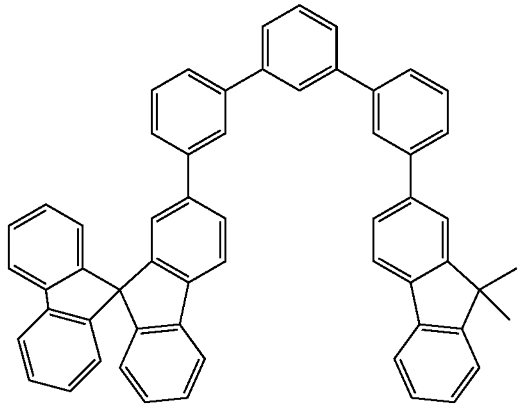
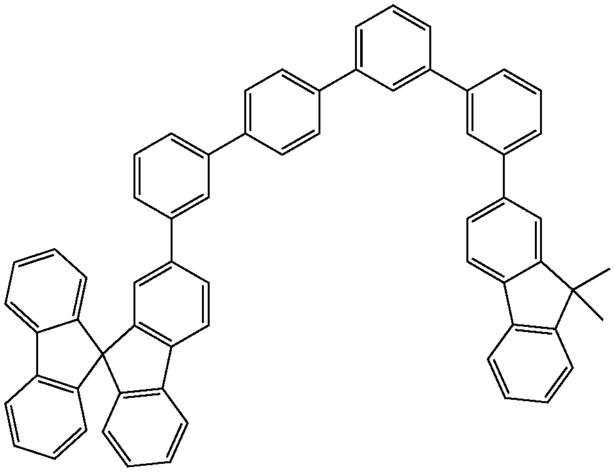
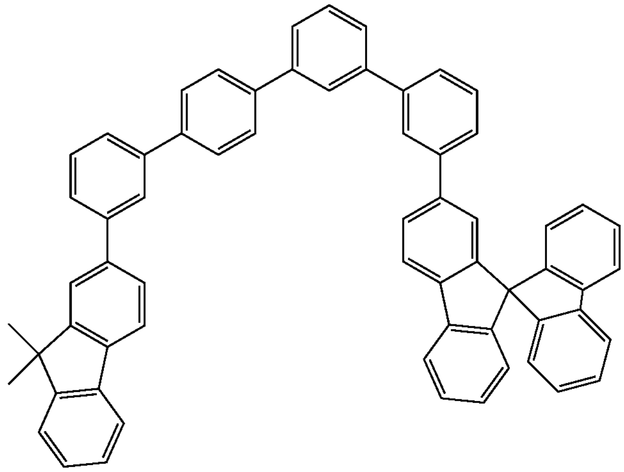
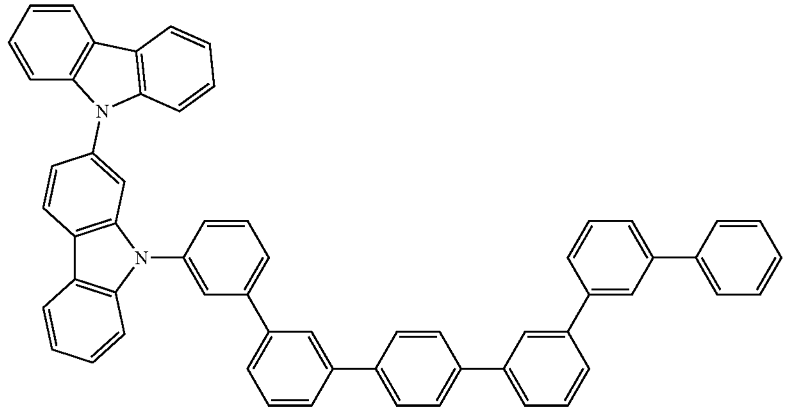

-continued

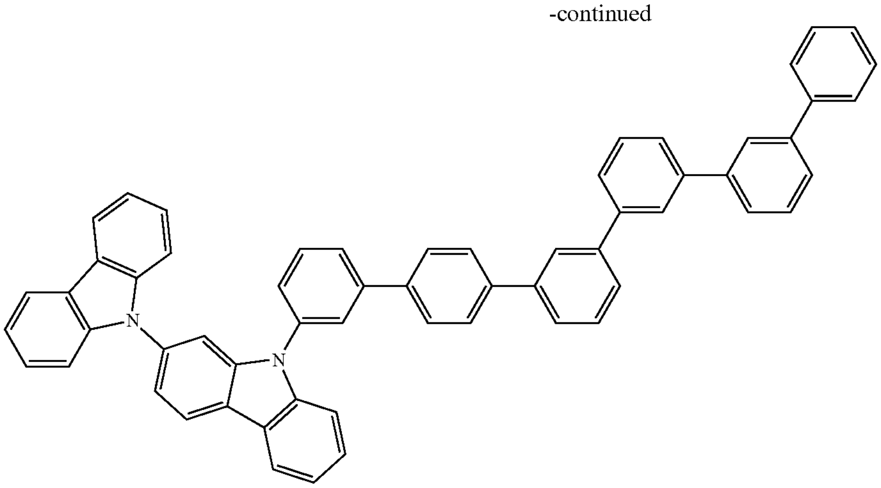

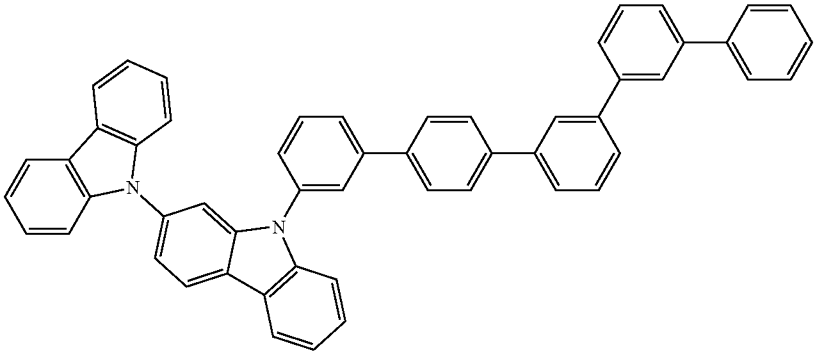

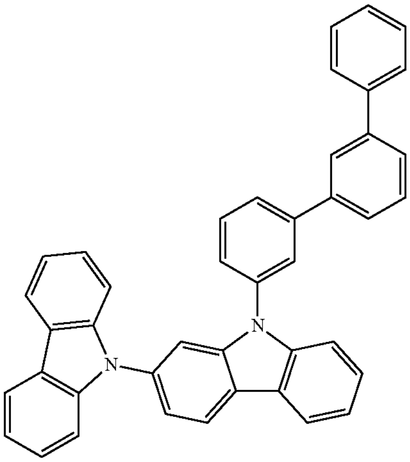

A single third compound or a combination or two or more third compounds may be included.

The third compound is a compound having a HOMO-LUMO energy gap (Eg) of 3.3 eV or more, and is also called as a wide-bandgap compound. When the HOMO-LUMO energy gap (Eg) is less than 3.3 eV, the long lifespan effect obtained by applying a wide-bandgap compound as a host material may be degraded. In addition, the upper limit of the HOMO-LUMO energy gap (Eg) is not particularly, but may be 4 eV or less.

In Examples, characteristics in terms of solubility with respect for a coating solvent to be used, emission color, and compatibility of the first compound (i.e., electron transport host), the second compound (i.e., hole transport host), and a dopant material that are used together are considered among such wide-bandgap compounds.

An amount of the third compound may be about 15 wt % or more and 40 wt % or less, for example, about 16 wt % or more and 35 wt % or less, based on 100 wt % of the total mass of the first compound, the second compound, and the third compound.

When the host compound having the three different characteristics are mixed in a state in which phase separation does not occur to form an emission layer according to a solution process, the HOMO and LUMO energy levels become smooth, thereby reducing an electron injection barrier. In addition, at the same time, the charge mobility may be controlled by adjusting a mixed ratio of charge host compounds, thereby realizing high-performance devices.

In addition, since the first compound, the second compound, and the third compound show high solubility in a solvent, film formation capability by wet coating, for example, solution coating is significantly applicable. In addition, the organic light-emitting device including the first compound, the second compound, and the third compound may have improved emission efficiency and emission lifespan, when manufactured by solution coating.

In one or more embodiments, the first compound may include at least one compound represented by Formula 1-1 or 1-4 above, the second compound may include at least one compound represented by Formula 2-1 or 2-4 above, the third compound may include at least one compound represented by Formula 3-2 below:

3-2

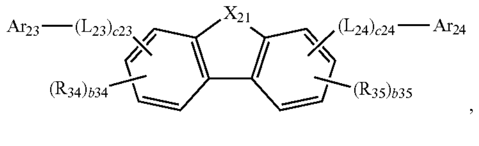

In Formula 3-2, $X_{21}$ may be O or S, $L_{23}$ to $L_{24}$ may each independently be a substituted or unsubstituted $C_6$-$C_{30}$ arylene group, c23 and c24 may each independently be 1, 2, or 3, $Ar_{23}$ and $Ar_{24}$ may each independently be hydrogen or a substituted or unsubstituted $C_6$-$C_{30}$ aryl group, $R_{34}$ and $R_{35}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, and b34 and b35 may each independently be an integer from 0 to 3.

In one or more embodiments, the first compound may include at least one compound represented by Formula 1-1 above, the second compound may include at least one compound represented by Formula 2-1 above, and the third compound may include at least one compound represented by Formula 3-1 below:

3-1

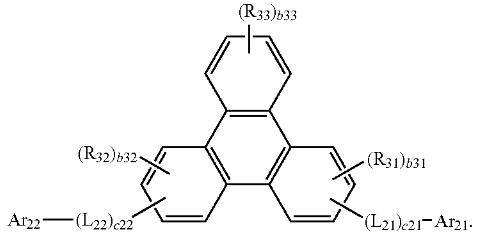

In Formula 3-1, $L_{21}$ to $L_{22}$ may each independently be a substituted or unsubstituted $C_6$-$C_{30}$ arylene group, c21 and c22 may each independently be 1, 2, or 3, $Ar_{21}$ and $Ar_{22}$ may each independently be hydrogen or a substituted or unsubstituted $C_6$-$C_{30}$ aryl group, wherein each of $Ar_{21}$ and $Ar_{22}$ may not be hydrogen at the same time, $R_{31}$ to $R_{33}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b31 and b32 may each independently be an integer from 0 to 3, and b33 may be an integer from 0 to 4.

In one or more embodiments, the first compound may include at least one compound represented by Formula 1-1 above, the second compound may include at least one compound represented by Formula 2-1 above, and the third compound may include at least compound represented by Formula 3-4 below:

3-4

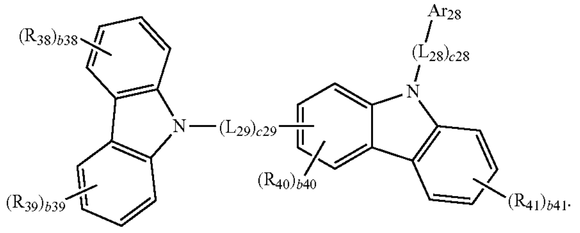

In Formula 3-4, $L_{28}$ to $L_{29}$ may each independently be a single bond or a substituted or unsubstituted $C_6$-$C_{30}$ arylene group, c28 and c29 may each independently be an integer from 1, 2, or 3, $Ar_{28}$ may be hydrogen or a substituted or unsubstituted $C_6$-$C_{30}$ aryl group, $R_{38}$ to $R_{41}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b38, b39, and b41 may each independently be an integer from 0 to 4, and b40 may be an integer from 0 to 2.

By combining a first compound, a second compound, and a third compound as described above, an emission layer having excellent emission efficiency and excellent lifespan characteristics due to excellent solubility in a solvent may be prepared.

In one or more embodiments, the emission layer may further include a fluorescent dopant, a phosphorescent dopant, or a combination thereof.

For example, for the fluorescent dopant and the phosphorescent dopant, the following materials may be used. For example, the fluorescent dopant may include a perylene or a derivative thereof, a rubrene or a derivative thereof, a coumarin or a derivative thereof, a 4-dicyanomethylene-2-(p-dimethylaminostyryl)-6-methyl-4H-pyran (DCM) or a derivative thereof, a pyrene or a derivative thereof, and the like, and the phosphorescent dopant may include an iridium complex, such as bis[2-(4,6-difluorophenyl)pyridinate]picolinate iridium (III) (Firpic), bis(1-phenylisoquinoline)(acetylacetonate) iridium (III) ($Ir(piq)_2(acac)$), tris(2-phenylpyridine) iridium (III) ($Ir(ppy)_3$), tris(2-(3-p-xylyl)phenyl)pyridine iridium (III) (dopant), and the like, an osmium complex, a platinum complex, and the like, but embodiments of the present disclosure are not limited thereto.

When the emission layer includes a host and a dopant, an amount of the dopant may be in a range of about 0.01 parts by weight to about 15 parts by weight based on 100 parts by weight of the host, but embodiments of the present disclosure are not limited thereto.

The emission layer may be formed to a thickness from about 10 nm to about 60 nm.

When the organic light-emitting device is a full-color organic light-emitting device, the emission layer may be patterned into a red emission layer, a green emission layer, or a blue emission layer. In one or more embodiments, due to a stacked structure including a red emission layer, a green emission layer, and/or a blue emission layer, the emission layer may emit white light.

Organic Light-Emitting Device

Hereinafter, an organic light-emitting device according to an embodiment will be described in connection with the FIGURE. The FIGURE is a schematic cross-sectional view of an organic light-emitting device according to an embodiment.

An organic light-emitting device 100 according to an embodiment includes a substrate 110, a first electrode 120 disposed on the substrate 110, a hole injection layer 130 disposed on the first electrode 120, a hole transport layer 140 disposed on the hole injection layer 130, an emission layer 150 disposed on the hole transport layer 140, an electron transport layer 160 disposed on the emission layer 150, an electron injection layer 170 disposed on the electron transport layer 160, and a second electrode 180 disposed on the electron injection layer 170.

The substrate 110 may be any substrate that is used in an organic light-emitting device according to the related art. For example, the substrate 110 may be a glass substrate, a silicon substrate, or a transparent plastic substrate, each having excellent mechanical strength, thermal stability, surface smoothness, ease of handling, and water resistance, but embodiments of the present disclosure are not limited thereto.

The first electrode 120 may be formed on the substrate 110. The first electrode 120 may be, for example, an anode, and may be formed of a material with a high work function to facilitate hole injection, such as an alloy or a conductive compound. The first electrode 120 may be a reflective electrode, a semi-reflective electrode, or a transmissive electrode. The first electrode 120 may have a single-layered structure or a multi-layered structure including two or more layers. For example, the first electrode 120 may be a transparent electrode formed of indium tin oxide (ITO), indium zinc oxide (IZO), tin oxide ($SnO_2$), or zinc oxide (ZnO), which has excellent transparency and conductivity.

On the transparent first electrode 120, magnesium (Mg), aluminum (Al), aluminum-lithium (Al—Li), calcium (Ca), magnesium-indium (Mg—In), or magnesium-silver (Mg—Ag) may be disposed, so as to form a reflective electrode. In one or more embodiments, the first electrode 120 may have a three-layered structure of ITO/Ag/ITO, but embodiments of the present disclosure are not limited thereto.

The hole transport region may be disposed on the first electrode 120.

The hole transport region may include at least one of the hole injection layer 130, the hole transport layer 140, an electron blocking layer (not shown), and a buffer layer (not shown).

The hole transport region may include only the hole injection layer 130 or the hole transport layer 140. In one or more embodiments, the hole transport region may have a hole injection layer/hole transport layer structure or a hole injection layer/hole transport layer/electron blocking layer structure, wherein for each structure, constituting layers are sequentially stacked from the first electrode 120 in the stated order.

The hole injection layer 130 may include, for example, at least one poly(ether ketone)-containing triphenylamine (TPAPEK), 4-isopropyl-4'-methyldiphenyliodonium tetrakis (pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino) triphenylamine (m-MTDATA), N,N'-di(1-naphthyl)-N,N'-diphenylbenzidine (NPB), 4,4',4"-tris(diphenylamino) triphenylamine (TDATA), 4,4',4"-tris(N,N-2-naphthylphenylamino) triphenylamine (2-TNATA), polyaniline/dodecylbenzenesulphonic acid (PANI/DBSA), poly(3,4-ethylenedioxythiophene)/poly(4-styrenesulfonate) (PEDOT/PSS), polyaniline/10-camphorsulfonic acid (PANI/CSA), and polyaniline/poly(4-styrenesulfonate) (PANI/PSS).

The hole injection layer 130 may be formed to a thickness from about 10 nm to about 1,000 nm, for example, from about 10 nm to about 100 nm.

The hole injection layer 140 may include, for example, at least one a carbazole derivative, such as 1,1-bis[(di-4-tolylamino)phenyl]cyclohexane (TAPC), N-phenylcarbazole, and polyvinylcarbazole, N,N'-bis(3-methylphenyl)-N,N'-diphenyl-[1,1-biphenyl]-4,4'-diamine (TPD), 4,4',4"-tris(N-carbazolyl) triphenylamine (TCTA), N,N'-di(1-naphthyl)-N,N'-diphenylbenzidine (NPB), and poly(9,9-dioctyl-fluorene-co-N-(4-butylphenyl)-diphenylamine (TFB).

The hole transport layer 140 may be formed to a thickness from about 10 nm to about 1,000 nm, for example, from about 10 nm to about 150 nm.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2 below, but are not limited thereto:

HT-D1

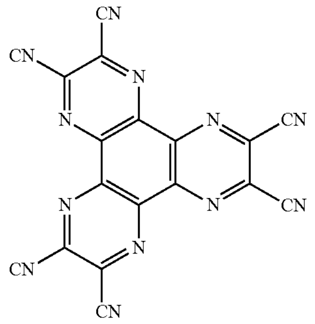

-continued

F4-TCNQ

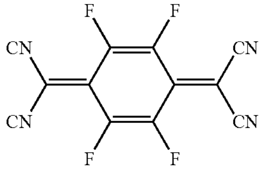

HT-D2

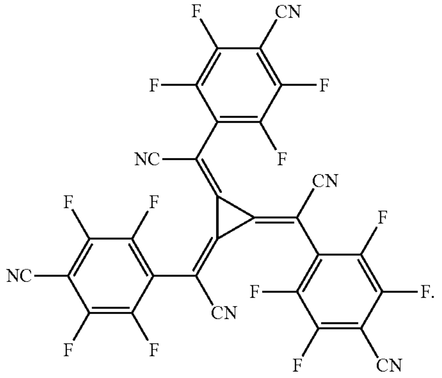

Meanwhile, when the hole transport region includes a buffer layer, a material for forming the buffer layer may be a material for the hole transport region described above or a material for a host to be explained later. However, the material for the electron blocking layer is not limited thereto.

Meanwhile, when the hole transport region includes an electron blocking layer, a material for the electron blocking layer may be a material for the hole transport region described above or a material for a host to be explained later. However, the material for the electron blocking layer is not limited thereto. For example, when the hole transport region includes an electron blocking layer, a material for the electron blocking layer may be mCP.

The emission layer 150 may be formed on the hole transport region. The emission layer 150 is a layer emitting light upon fluorescence or phosphorescence. The emission layer 150 may include a host and/or a dopant, and the host may include the first compound, the second compound, and the third compound that are different from each other. The first compound, the second compound, and the third compound are the same as described above.

The electron transport region may be formed on the emission layer 150.

The electron transport region may include at least one a hole blocking layer (not shown), the electron transport layer 160, and the electron injection layer 170.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

For example, to prevent diffusion of excitons or holes to the electron transport layer 160, the organic light-emitting device 100 may include a hole blocking layer between the electron transport layer 160 and the emission layer 150. The hole blocking layer may include, for example, at least one an oxadiazole derivative, a triazole derivative, BCP, Bphen, BAlq, or a combination thereof, but a material therefor is not limited thereto:

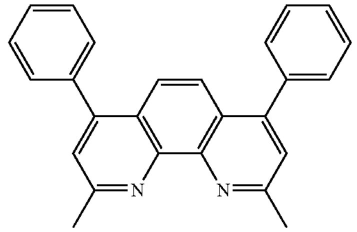

BCP

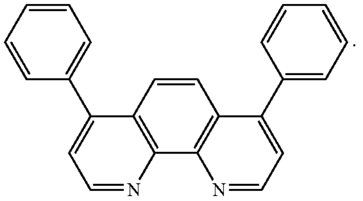

Bphen

A thickness of the hole blocking layer may be from about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer 160 may include tris(8-quinolinato) aluminum ($Alq_3$), BAlq; a pyridine ring-containing compound, such as 1,3,5-tri[(3-pyridyl)-phen-3-yl] benzene); a triazine ring-containing compound, such as 2,4,6-tris(3'-(pyridine-3-yl)biphenyl-3-yl)-1 3,5-triazine; an imidazole ring-containing compound, such as 2-(4-(N-phenylbenzimidazolyl-1-yl-phenyl)-9,10-dinaphthylanthracene; a triazole ring-containing compound, such as TAZ and NTAZ; 1,3,5-tris(N-phenyl-benzimidazol-2-yl)benzene (TPBi), BCP, Bphen, and the like:

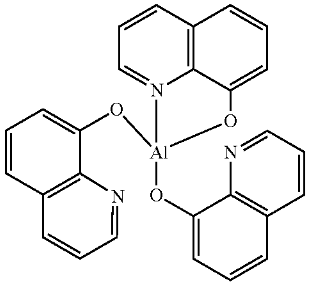

$Alq_3$

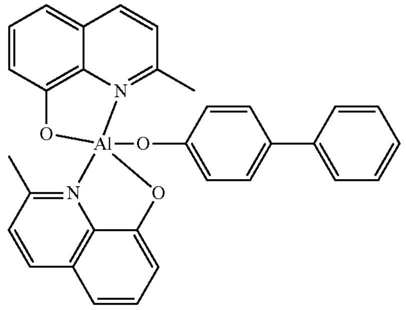

BAlq

-continued

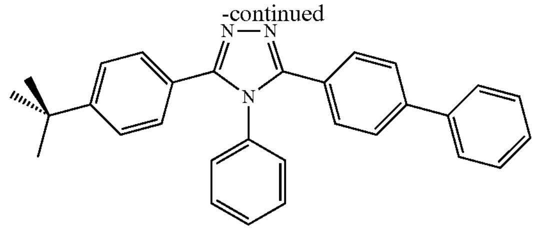

TAZ

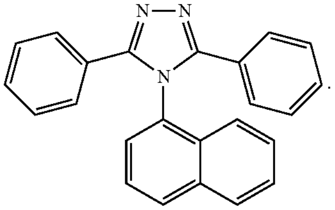

NTAZ

In one or more embodiments, the electron transport layer 160 may include KLET-01, KLET-02, KLET-03, KLET-10, KLET-M1 (available from Chemipro Kasei), or the like that is commercially available.

The electron transport layer 160 may further include, in addition to the materials described above, a metal-containing material.

The metal-containing material may include a Li complex. The Li complex may include, for example, Compound ET-D1 (lithium quinolate, LiQ) or ET-D2:

ET-D1

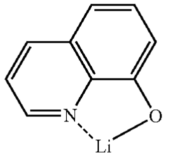

ET-D2

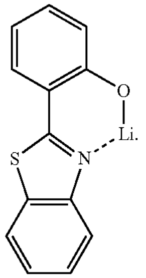

The electron transport layer 160 may be, for example, formed to a thickness from about 15 nm to about 50 nm.

The electron injection layer 170 may be formed on the electron transport layer 160.

The electron injection layer 170 may include, for example, a lithium compound, such as 8-hydroxyquinolinato lithium (Liq) and lithium fluoride (LiF), sodium chloride (NaCl), cesium fluoride (CsF), lithium oxide ($Li_2O$), or barium oxide (BaO).

The electron injection layer 170 may be formed to a thickness from about 0.3 nm to about 9 nm.

The second electrode 180 may be formed on the substrate 170. The second electrode 180 may be, specifically, a cathode, and may be formed of a material with small work function among metal, alloy, electrically conductive compound, or a combination thereof. For example, the second electrode 180 may be formed as a reflective electrode formed of metal, such as lithium (Li), magnesium (Mg), aluminum (Al), calcium (Ca), or the like, or alloy, such as aluminum-lithium (Al—Li), magnesium-indium (Mg—In), magnesium-silver (Mg—Ag), or the like. In one or more embodiments, the second electrode 180 having a thickness of about 20 nm or less, by a metal or alloy thin-film or a transparent conductive film, such as indium tin oxide ($In_2O_3$—$SnO_2$) and indium zinc oxide ($In_2O_3$—ZnO).

In addition, the stacked structure of the organic light-emitting device 100 according to an embodiment is not limited to the embodiments above. The organic light-emitting device 100 according to an embodiment may be formed to have other known stacked structures. For example, in the organic light-emitting device 100, one or more layers among the hole injection layer 130, the hole transport layer 140, the electron transport layer 160, and the electron injection layer 170 may be omitted, or other layers may be further included. In addition, each layer of the organic light-emitting device 100 may be single-layered or multi-layered.

A manufacturing method of each layer of the organic light-emitting device 100 according to an embodiment is not particularly limited, and for example, various methods, such as vacuum vapor deposition, solution coating, Langmuir-Blodgett (LB) deposition, or the like may be used.

The solution coating may include spin coat, casting, micro gravure coating, gravure coating, bar coating, roll coating, wire bar coating, dip coating, spray coating, screen printing, flexographic printing, offset printing, ink jet printing, and the like.

A solvent used in the solution coating may include toluene, xylene, diethyl ether, chloroform, ethyl acetate, dichloromethane, tetrahydrofuran, acetone, acetonitrile, N,N-dimethylformamide, dimethylsulfoxide, anisole, hexamethylphosphoric acid triamide, 1,2-dichloro ethane, 1,1,2-trichloro ethane, chlorobenzene, o-dichlorobenzene, dioxane, a cyclohexane, n-pentane, n-hexane, n-heptane, n-octane, n-nonane, n-decane, methyl ethyl ketone, cyclohexanone, butyl acetate, ethyl cellosolve acetate(ethylene glycol monoethyl ether acetate), ethylene glycol, ethylene glycol monobutyl ether, ethylene glycol monoethyl ether, ethylene glycol monomethyl ether, dimethoxyethane, propylene glycol, diethoxy methane, triethylene glycol monoethyl ether, glycerin, 1,2-hexanediol, methanol, ethanol, propanol, isopropanol, cyclohexanol, N-methyl-2-pyrrolidone, or the like. The solvent is not limited as long as it is capable of dissolving a material used to form each layer.

A concentration of a composition used in the solution coating may be, in consideration of coating property or the like, for example, from about 0.1 weight % or more to about 10 weight % or less, and for example, from about 0.5 weight % or more to about 5 weight % or less, but embodiments of the present disclosure are not limited thereto.

Conditions for the vacuum deposition may vary according to a material being used, a structure and thermal characteristics of a desired layer. For example, the deposition conditions may include a deposition temperature of about 100° C. to about 500° C., a vacuum pressure of about $10^{-8}$ to about $10^{-3}$ torr, and a deposition rate of about 0.01 Å/sec to about 100 Å/sec. However, the conditions are not limited thereto.

In one or more embodiments, the first electrode 120 may be an anode, and the second electrode 180 may be a cathode.

For example, the first electrode 120 may be an anode, and the second electrode 180 may be a cathode. The organic light-emitting device 100 may also include an organic layer including the emission layer 150 and disposed between the first electrode 120 and the second electrode 180, and the organic layer may further include a hole transport region between the first electrode 120 and the emission layer 150 and an electron transport region between the emission layer 150 and the second electrode 180, wherein the hole transport region may include at least one the hole injection layer 130, the hole transport layer 140, the buffer layer, and the electron blocking layer, and the electron transport region may include at least one the hole blocking layer, the electron transport layer 160, and the electron injection layer 170.

In one or more embodiments, the first electrode 120 may be a cathode, and the second electrode 180 may be an anode.

Hereinbefore, the organic light-emitting device according to an embodiment has been described in connection with the FIGURE.

Description of Substituents

The expression "X and Y may each independently be" as used herein refers to a case where X and Y may be identical to each other, or a case where X and Y may be different from each other.

The term "substituted" as used herein refers to a case where hydrogen of a substituent such as $R_{11}$ may be further substituted with other substituents.

The term "$C_1$-$C_{24}$ alkyl group" as used herein refers to a linear or branched aliphatic saturated hydrocarbon monovalent group having 1 to 24 carbon atoms, and examples thereof include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyldecyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, and the like.

The term "$C_1$-$C_{24}$ alkylene group" as used herein refers to a divalent group having the same structure as the $C_1$-$C_{24}$ alkyl group.

The term "$C_1$-$C_{24}$ alkoxy group" as used herein refers to a monovalent group represented by —$OA_{101}$ (wherein $A_{101}$ is the $C_1$-$C_{24}$ alkyl group), and examples thereof include a methoxy group, an ethoxy group, a propoxy group, an isopropoxy group, an n-butoxy group, an isobutoxy group, a sec-butoxy group, a tert-butoxy group, an n-pentoxy group, an isopentoxy group, a tert-pentoxy group, a neopentoxy group, an n-hexyloxy group, an isohexyloxy group, a heptyloxy group, an octyloxy group, an nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The term "$C_1$-$C_{24}$ alkylthio group" as used herein refers to a monovalent group represented by —$SA_{102}$ (wherein $A_{102}$ is the $C_1$-$C_{24}$ alkyl group).

The term "$C_3$-$C_{30}$ cycloalkyl group" as used herein refers to a monovalent saturated hydrocarbon monocyclic group having 3 to 30 carbon atoms involved in the ring formation, and examples thereof include a cyclopropyl group, a cyclobutyl group, a cyclopentyl group, a cyclohexyl group, and a cycloheptyl group. The term "$C_3$-$C_{30}$ cycloalkylene group" as used herein refers to a divalent group having the same structure as the $C_3$-$C_{30}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group.

The term "$C_3$-$C_{10}$ cycloalkenyl group" as used herein refers to a monovalent monocyclic group that has 3 to 10 carbon atoms and at least one double bond in the ring thereof and does not have aromacity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, and S as a ring-forming atom, 1 to 10 carbon atoms, and at least one double bond in its ring. Detailed examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein refers to a divalent group having the same structure as the $C_1$-$C_{10}$ heterocycloalkenyl group The term "$C_6$-$C_{30}$ aryl group" as used herein refers to a monovalent group having a carbocyclic aromatic system having 6 to 30 carbon atoms involved in the ring formation (that is, when substituted with a substituent, the atom not included in the substituent is not counted as the carbon involved in the ring formation), and the term "$C_6$-$C_{30}$ arylene group" as used herein refers to a divalent group having a carbocyclic aromatic system having 6 to 30 carbon atoms. Non-limiting examples of the $C_6$-$C_{30}$ aryl group include a phenyl group, a naphthyl group, an anthracenyl group, a phenanthrenyl group, a pyrenyl group, and a chrysenyl group. When the $C_6$-$C_{30}$ aryl group and the $C_6$-$C_{30}$ arylene group each include two or more rings, the rings may be fused to each other.

The term "$C_6$-$C_{30}$ aryloxy group" as used herein refers to a group represented by —$OA_{103}$ (wherein $A_{103}$ is the $C_6$-$C_{30}$ aryl group), and examples thereof include a 1-naphthyloxy group, a 2-naphthyloxy group, a 2-azulenyloxy group, and the like.

The term "$C_6$-$C_{30}$ arylthio group" as used herein refers to a group represented by —$SA_{104}$ (wherein $A_{104}$ is the $C_6$-$C_{30}$ aryl group).

The term "$C_1$-$C_{30}$ heteroaryl group" as used herein refers to a monovalent group having a heterocyclic aromatic system that has at least one heteroatom N, O, Si, P, Se, Ge, B, or S as a ring-forming atom, and 1 to 30 carbon atoms. The term "$C_1$-$C_{30}$ heteroarylene group" as used herein refers to a divalent group having a heterocyclic aromatic system that has at least one heteroatom N, O, Si, P, Se, Ge, B, or S as a ring-forming atom, and 1 to 30 carbon atoms. Non-limiting examples of the $C_1$-$C_{30}$ heteroaryl group include a pyridinyl group, a pyrimidinyl group, a pyrazinyl group, a pyridazinyl group, a triazinyl group, a quinolinyl group, and an isoquinolinyl group. When the $C_5$-$C_{30}$ heteroaryl group and the $C_5$-$C_{30}$ heteroarylene group each include two or more rings, the rings may be condensed with each other.

The term "$C_6$-$C_{30}$ heteroaryloxy group" as used herein refers to a group represented by —$OA_{105}$ (wherein $A_{105}$ is the $C_6$-$C_{30}$ heteroaryl group). Examples thereof include a 2-furanyloxy group, a 2-thienyloxy group, a 2-indolyloxy group, a 3-indolyloxy group, a 2-benzofuranyloxy group, and a 2-benzothienyloxy group.

The term "$C_6$-$C_{30}$ heteroarylthio group" as used herein refers to a group represented by —$SA_{106}$ (wherein $A_{106}$ is the $C_6$-$C_{30}$ heteroaryl group).

The term "$C_7$-$C_{30}$ arylalkyl group" as used herein refers to an alkylene group attached to an aryl group, and is a monovalent group in which the sum of carbon atoms of the alkylene group and the aryl group that constitute the $C_7$-$C_{30}$ arylalkyl group is 7 to 30. Examples thereof include a benzyl group, a phenylethyl group, a phenylpropyl group, a naphthylmethyl group, and the like.

The term "$C_6$-$C_{30}$ arylalkyloxy group" as used herein refers to a group represented by —$OA_{105}$ (wherein $A_{105}$ is the $C_6$-$C_{30}$ heteroaryl group).

The term "$C_6$-$C_{30}$ arylalkylthio group" as used herein refers to a group represented by —$SA_{105}$ (wherein $A_{105}$ is the $C_7$-$C_{30}$ arylalkyl group).

The term "$C_8$-$C_{30}$ arylalkenyl group" as used herein refers an alkenylene group attached to an aryl group, and is a monovalent group in which the sum of carbon atoms of the alkenylene group and the aryl group that constitute the $C_8$-$C_{30}$ arylalkenyl group is 8 to 30.

The term "$C_8$-$C_{30}$ arylalkynyl group" as used herein refers to an alkynylene group attached to an aryl group, and is a monovalent group in which sum of carbon atoms of the alkynylene group and the aryl group that constitute the $C_8$-$C_{30}$ arylalkynyl group is 8 to 30.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, Se, Ge, B, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_1$-$C_{30}$ heterocyclic group" as used herein refers to a saturated or unsaturated cyclic group having, as a ring-forming atom, at least one heteroatom N, O, Si, P, Se, Ge, B, or S other than 1 to 30 carbon atoms. The term "$C_1$-$C_{30}$ heterocyclic group" as used herein refers to a monocyclic group or a polycyclic group, and, according to its chemical structure, a monovalent, divalent, trivalent, tetravalent, pentavalent, or hexavalent group.

In the present specification, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof; or —$N(Q_{31})(Q_{32})$, —$Si(Q_{33})(Q_{34})(Q_{35})$, —$B(Q_{36})(Q_{37})$, —$P(=O)(Q_{38})(Q_{39})$, or any combination thereof, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one $C_1$-$C_{60}$ alkyl group or a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Others

The expression "A to B" refers to a range beginning from A to B.

Hereinbefore, embodiments of the present disclosure will now be described more fully with reference to the accompanying drawings, but the present disclosure is not limited these embodiments. It will be apparent to those of ordinary skill in the art that various modifications or changes may be made within the technical scope of the present disclosure. It will be understood that various modifications and modifications belong to the technical scope of the present disclosure.

Hereinafter, by referring to Examples and Comparative Examples, the organic light-emitting device including the emission layer including three different compounds will be described in detail, Examples below are examples only, and the condensed cyclic compound and the organic light-emitting device according to embodiments are not limited to Examples below. The wording "'B' was used instead of 'A'" used in describing Synthesis Examples means that a molar equivalent of 'B' was identical to a molar equivalent of 'A'.

EXAMPLES

Synthesis Examples

Synthesis of ET-HOST-A to ET-HOST-F, HT-HOST-A to HT-HOST-D, and WG-HOST-A to WG-HOST-F ET-HOST, HT-HOST, and WG-HOST that are used in present Examples may be prepared by coupling and substitution reactions well-known to one of ordinary skill in the art. Such reactions are well-known techniques, and are described in detail in various documents. For example, examples of the documents are [Yamamoto, Progress in Polymer Science, Vol. 17, p 1153(1992)], [Colon et al., Journal of Polymer Science, Part A, Polymer chemistry Edition, Vol. 28, P. 367 (1990)], [T. Ishiyama et al., J. Org. Chem. 1995 60, 7508-7510], [M. Murata et al., J. Org. Chem. 1997 62, 6458-6459], [M. Murata et al., J. Org. Chem. 2000 65, 164-168], [L. Zhu, et al., J. Org. Chem. 2003 68, 3729-3732], [Stille, J. K. Angew. Chem. Int. Ed. Engl. 1986, 25, 508], [Kumada, M. Pire. Appl. Chem. 1980, 52, 669], [Negishi, E. Acc. Chem. Res. 1982, 15, 340], and U.S. Pat. No. 5,962,631, and the like.

Synthesis of Material for Forming Hole Transport Layer (P-1, FA-14)

Based on the method of preparing Compound T disclosed in International Patent Application No. 2011/159872 (herein incorporated by reference), Polymer P-1 represented by the following formula was synthesized. Here, the number average molecular weight (Mn) of Polymer P-1 measured by gel-permeation chromatography (GPC) was 141,000, and the weight-average molecular weight (Mw) of Polymer P-1 was 511,000:

P-1

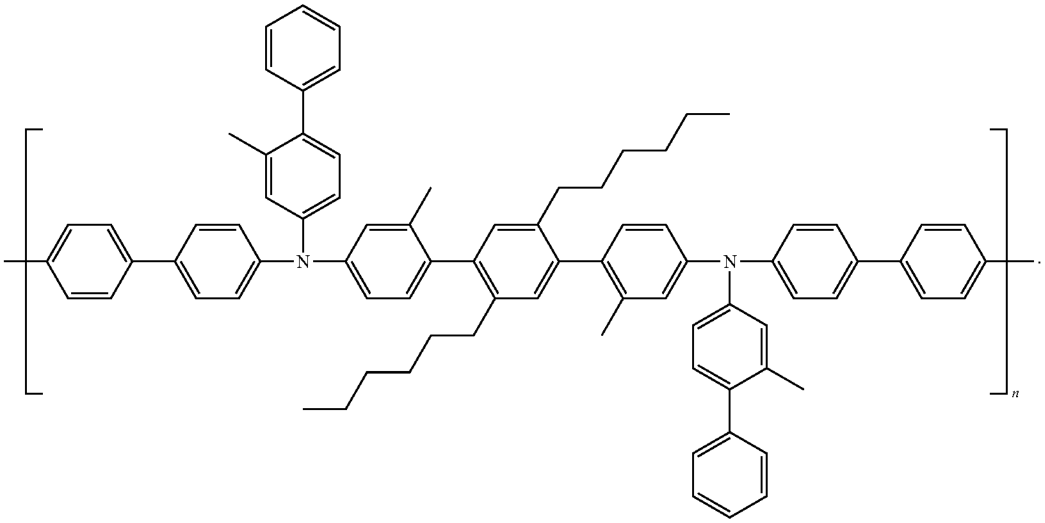

In addition, FA-14 (see the formula below) was synthesized according to US 2016/0315259 that is herein incorporated by reference:

FA-14

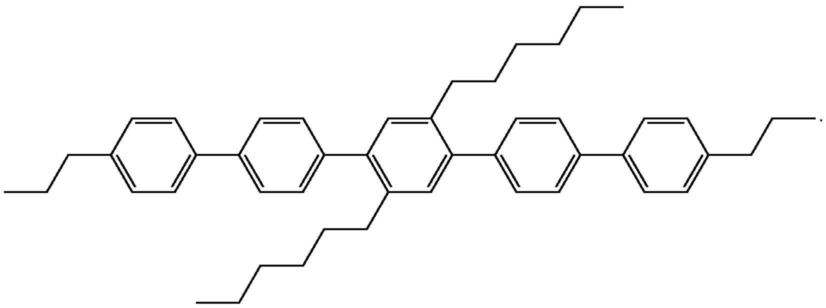

Evaluation Example 1: Measurement of Energy Band Gap

HOMO and LUMO energy levels of WG-HOST Compounds used in Examples were measured by a DFT method of Gaussian program (structurally optimized at a level of B3LYP, 6-31G(d,p)), and results thereof are shown in Table 1.

TABLE 1

| Compound | HOMO (eV) | LUMO (eV) | Band gap energy (eV) |
|---|---|---|---|
| WG-HOST-A | 6.25 | 2.86 | 3.39 |
| WG-HOST-B | 6.61 | 2.73 | 3.88 |
| WG-HOST-C | 6.22 | 2.86 | 3.36 |
| WG-HOST-D | 6.24 | 2.80 | 3.44 |
| WG-HOST-E | 6.25 | 2.71 | 3.54 |
| WG-HOST-F | 6.19 | 2.76 | 3.36 |

WG-Host-A
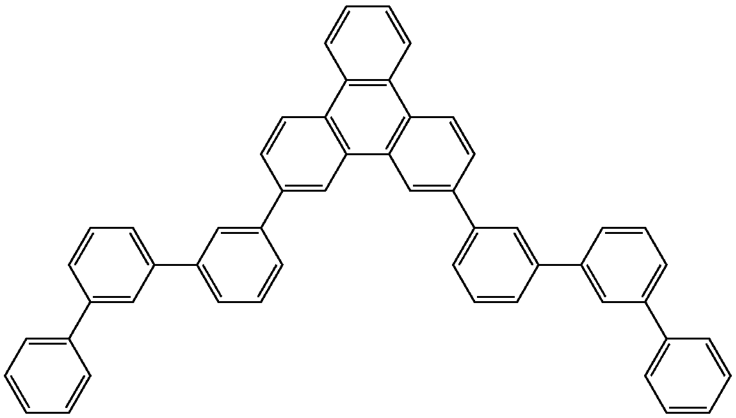
WG-Host-B
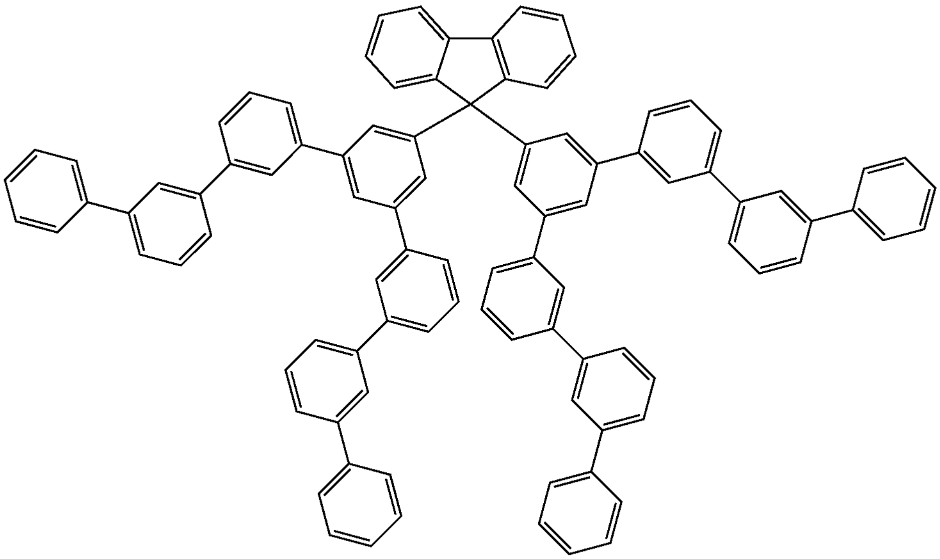
WG-Host-C
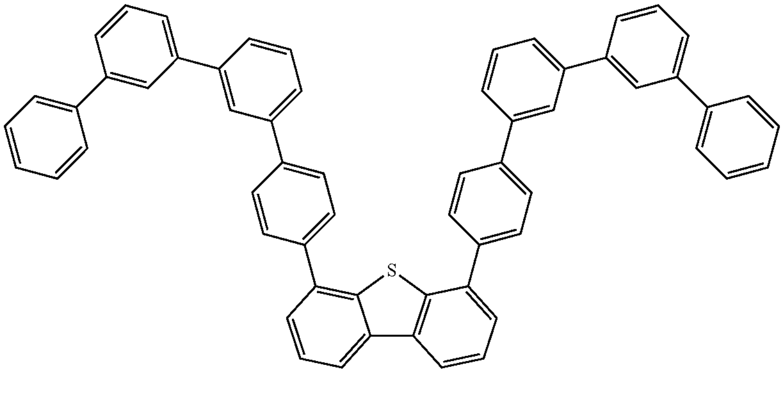

-continued

WG-Host-D

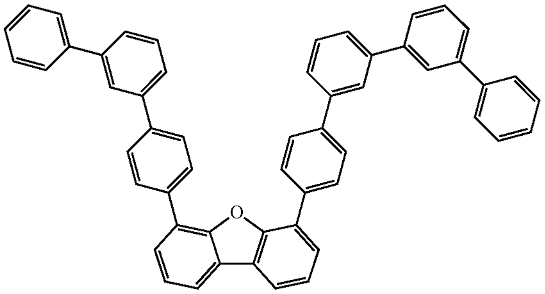

WG-Host-E

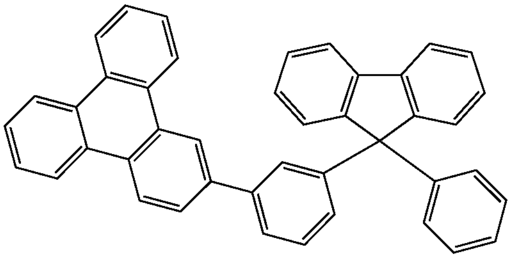

WG-Host-F

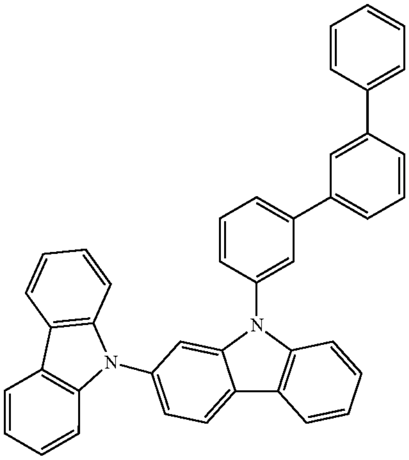

Example 1

A glass substrate on which an indium tin oxide (ITO) electrode (also referred to as a first electrode or an anode) having a thickness of 1,500 Å is formed was sonicated with distilled water. Once washing with distilled water was finished, the glass substrate was sonicated with isopropyl alcohol, acetone, and methanol, in the stated order, dried, and provided to a plasma washer. Next, the glass substrate was cleaned for 5 minutes using an oxygen plasma, and provided to a vacuum evaporator.

Compound PEDOT-PSS (available by Sigma-Aldrich) was coated on the ITO electrode of the glass substrate according to spin coating, and dried to form a hole injection layer having a thickness of 150 Å. A solution obtained by dissolving P-1 and FA-14 in an anisole solvent (P-1:FA-14=80:20 weight %) was coated on the hole injection layer according to spin coating, and dried to form a hole transport layer having a thickness of 1,250 Å.

Next, by using host compound materials and dopant materials listed in Table 2 below, tris(2-(3-p-xylyl)phenyl) pyridine iridium (III) (TEG, see the formula below) was dissolved in a methylbenzoate solvent. A composition (dopant amount: 10 weight %) for forming an emission layer including 4 weight % of the solids was coated on the hole transport layer by spin coating, dried at a temperature of 240° C. for 30 minutes to form an emission layer having a thickness of 550 Å.

On the emission layer, (8-hydroxyquinolato)lithium (Liq) and KLET-03 (available by ChemiPro Hwaseung Co., Ltd.) were co-deposited at a weight ratio of 1:1 by vacuum deposition to form an electron transport layer having a thickness of 200 Å. LiF was vacuum-deposited on the electron transport layer to form an electron injection layer having a thickness of 35 Å, and Al was vacuum-deposited on the electron injection layer to form a second electrode (also, referred to as a cathode) having a thickness of 1,000 Å, thereby completing the manufacture of an organic light-emitting device.

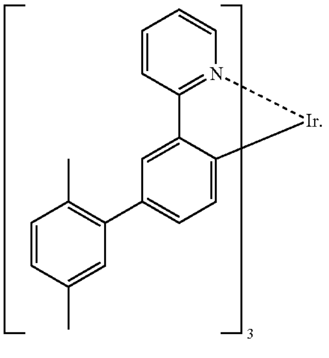

TEG

Examples 2 to 17 and Comparative Examples 1 to 6

Organic light-emitting devices were manufactured in the same manner as in Example 1, except that host compounds listed in Table 2 were used at respective ratios when preparing a composition for forming the emission layer.

Evaluation Example 2: Evaluation of Characteristics of Organic Light-Emitting Device (1)

The current efficiency and lifespan characteristics of the organic light-emitting devices manufactured according to Examples 1 to 17 and Comparative Examples 1 to 10 were evaluated. Specific measurement methods are as follows, and results thereof are shown in Table 2.

(1) Measurement of Current Efficiency

After applying a voltage to the manufactured organic light-emitting device, current was increased until luminance reached 6,000 nit (cd/$m^2$) and was maintained constant. Here, current density per unit area with respect to the light-emitting device area, and the luminance (cd/$m^2$) was divided by the current density (A/$m^2$), thereby calculating current efficiency (cd/A).

(2) Measurement of Lifespan

The time that lapsed when 95% ($T_{95}$) of initial luminance was calculated for each organic light-emitting device.

TABLE 2

| No. | Host | Efficiency (cd/A) | Lifespan ($T_{95}$) (hrs) |
|---|---|---|---|
| Example 1 | ET-Host-A:HT-Host-A:WG-Host-A = 1:1:1 | 51 | 225 |
| Example 2 | ET-Host-A:HT-Host-A:WG-Host-A = 4:3:3 | 54 | 175 |
| Example 3 | ET-Host-A:HT-Host-A:WG-Host-A = 5:3:2 | 56 | 153 |
| Example 4 | ET-Host-B:HT-Host-A:WG-Host-B = 1:1:1 | 56 | 72 |
| Example 5 | ET-Host-C:HT-Host-A:WG-Host-A = 1:1:1 | 57 | 74 |
| Example 6 | ET-Host-D:HT-Host-A:WG-Host-A = 1:1:1 | 50 | 231 |
| Example 7 | ET-Host-E:HT-Host-A:WG-Host-A = 1:1:1 | 59 | 290 |

TABLE 2-continued

| No. | Host | Efficiency (cd/A) | Lifespan ($T_{95}$) (hrs) |
|---|---|---|---|
| Example 8 | ET-Host-F:HT-Host-A:WG-Host-A = 1:1:1 | 61 | 277 |
| Example 9 | ET-Host-E:HT-Host-C:WG-Host-A = 1:1:1 | 62 | 296 |
| Example 10 | ET-Host-E:HT-Host-B:WG-Host-A = 1:1:1 | 63 | 323 |
| Example 11 | ET-Host-E:HT-Host-A:WG-Host-C = 1:1:1 | 44 | 209 |
| Example 12 | ET-Host-E:HT-Host-A:WG-Host-D = 1:1:1 | 58 | 223 |
| Example 13 | ET-Host-E:HT-Host-A:WG-Host-E = 1:1:1 | 68 | 249 |
| Example 14 | ET-Host-E:HT-Host-A:WG-Host-F = 1:1:1 | 54 | 187 |
| Example 15 | ET-Host-F:HT-Host-C:WG-Host-D = 1:1:1 | 50 | 189 |
| Example 16 | ET-Host-F:HT-Host-B:WG-Host-D = 1:1:1 | 52 | 370 |
| Example 17 | ET-Host-F:HT-Host-D:WG-Host-D = 1:1:1 | 48 | 326 |
| Comparative Example 1 | ET-Host-A:HT-Host-A = 5:5 | 54 | 40 |
| Comparative Example 2 | ET-Host-A:WG-Host-A = 5:5 | 51 | 73 |
| Comparative Example 3 | ET-Host-B:HT-Host-A = 5:5 | 60 | 44 |
| Comparative Example 4 | ET-Host-B:WG-Host-A = 5:5 | 51 | 11 |
| Comparative Example 5 | ET-Host-C:HT-Host-A = 5:5 | 36 | 1 |
| Comparative Example 6 | ET-Host-C:WG-Host-A = 5:5 | 44 | 3 |
| Comparative Example 7 | ET-Host-F:HT-Host-1:WG-Host-D = 1:1:1 | 43 | 71 |
| Comparative Example 8 | ET-Host-F:HT-Host-2:WG-Host-D = 1:1:1 | 47 | 52 |
| Comparative Example 9 | ET-Host-F:HT-Host-3:WG-Host-D = 1:1:1 | 53 | 46 |
| Comparative Example 10 | ET-Host-F:PGH3-1:WG-Host-D = 1:1:1 | 58 | 23 |

HT-Host-1

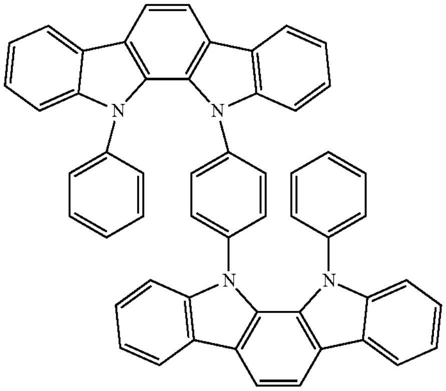

HT-Host-2

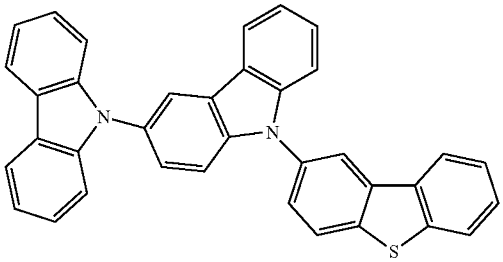

-continued
HT-Host-3
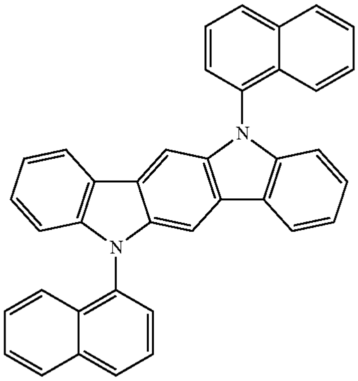
PGH3-1
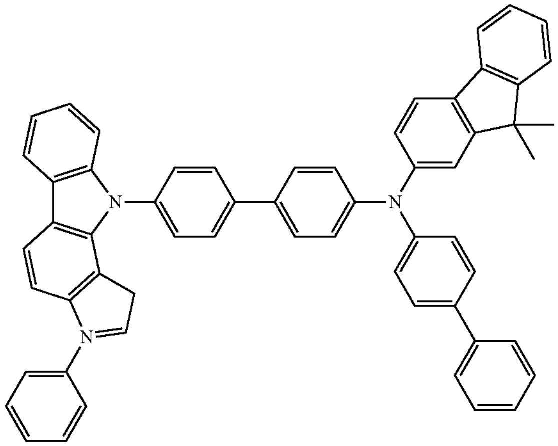
ET-Host-A
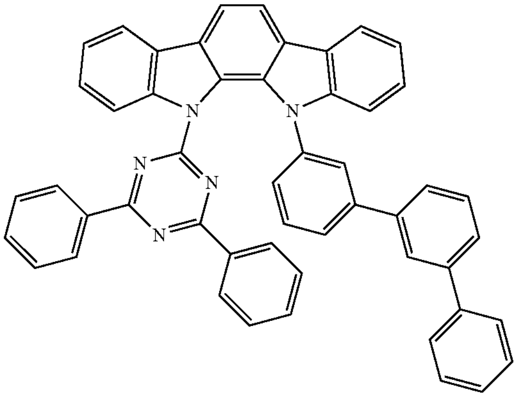
ET-Host-B
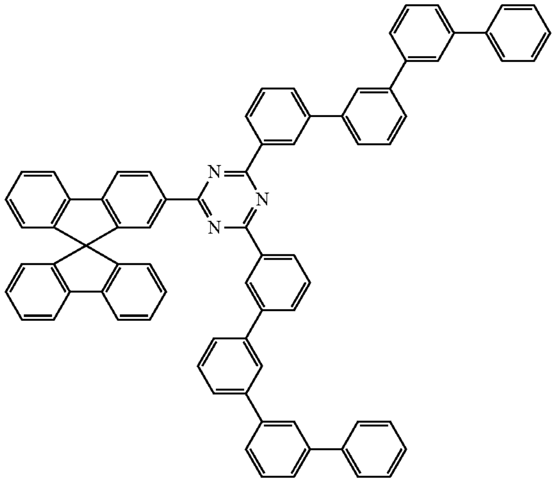
ET-Host-C
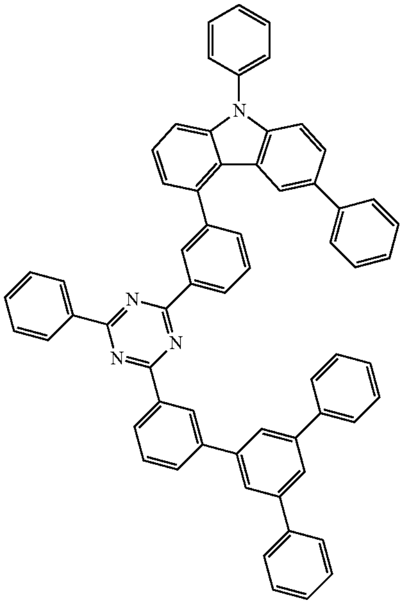

-continued
ET-Host-D
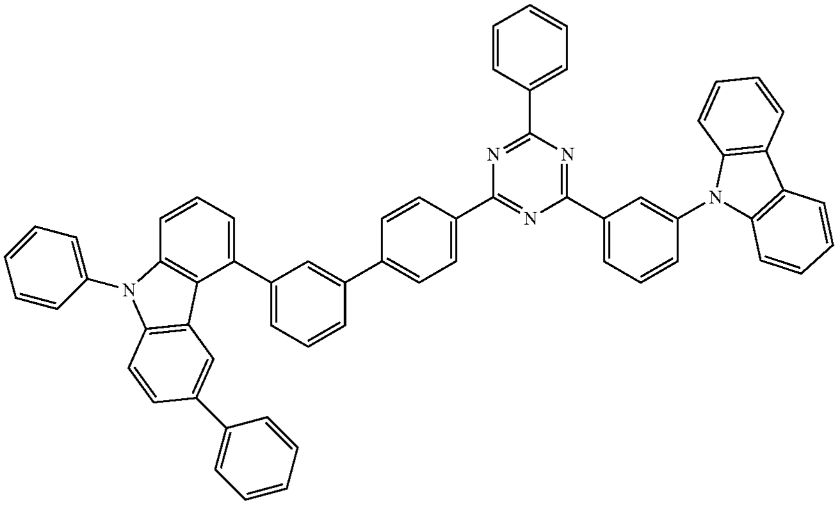
ET-Host-E
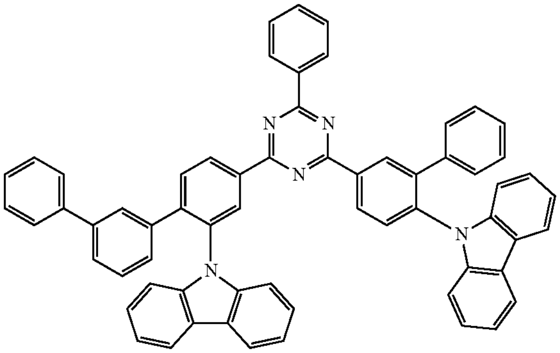
ET-Host-F
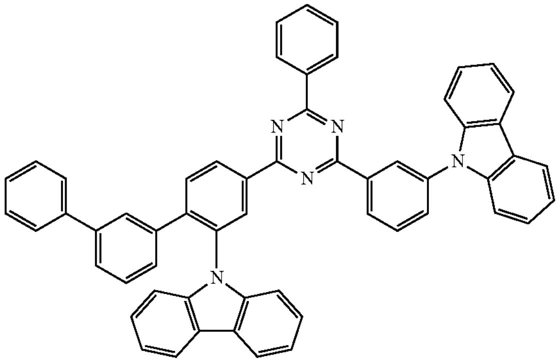
HT-Host-A
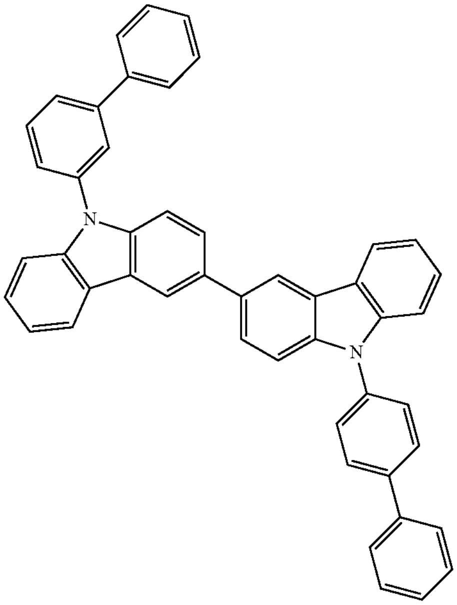
HT-Host-B
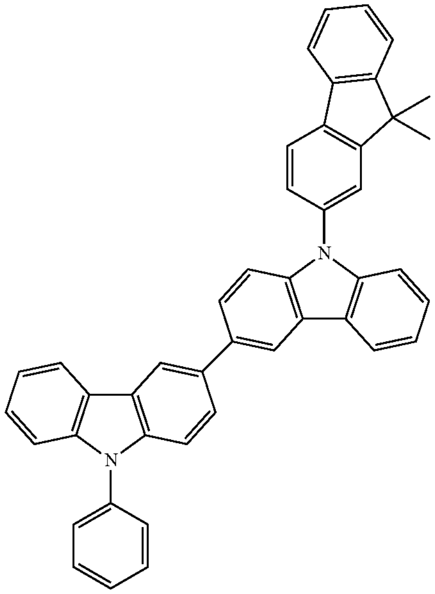

-continued

HT-Host-C

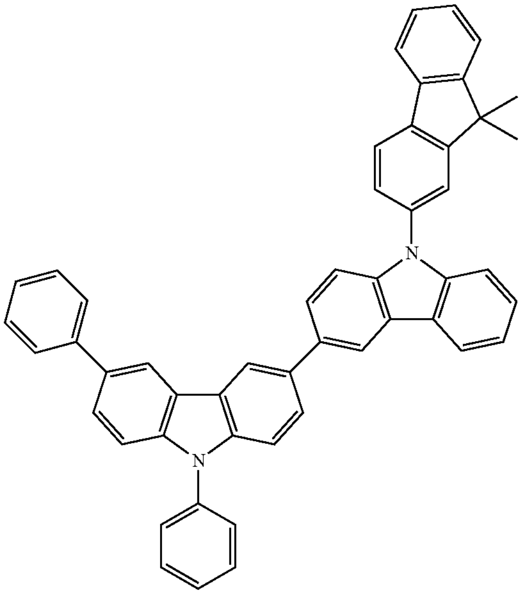

HT-Host-D

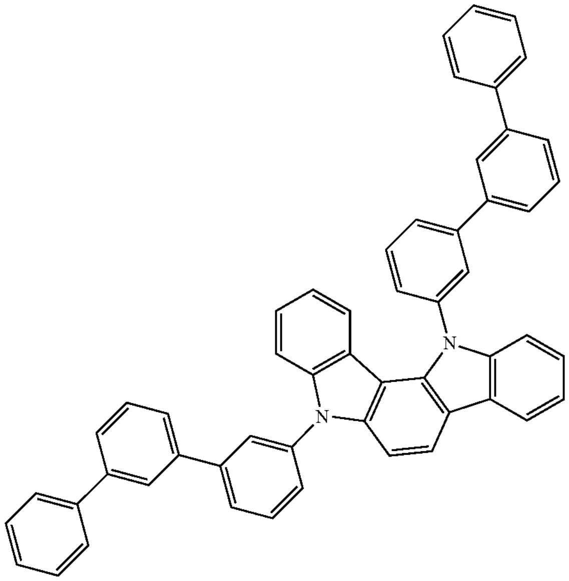

Examples 18 to 24

Organic light-emitting devices were manufactured in the same manner as in Example 1, except that host compounds listed in Table 3 were used at respective ratios when preparing a composition for forming the emission layer, and a platinum complex represented by the following formula was used as the dopant:

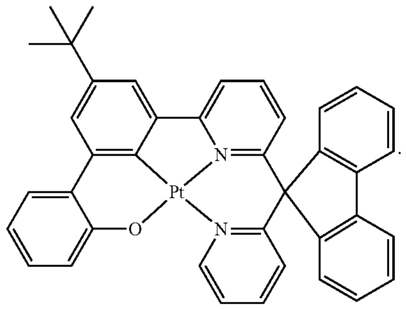

Evaluation Example 3: Evaluation of Characteristics of Organic Light-Emitting Device (2)

The current efficiency and lifespan characteristics of the organic light-emitting devices manufactured according to Examples 18 to 24 were evaluated. Specific measurement methods are the same as described above, and results thereof are shown in Table 3.

TABLE 3

| No. | Host | Efficiency (cd/A) | Lifespan ($T_{95}$) (hrs) |
|---|---|---|---|
| Example 18 | ET-Host-E:HT-Host-A:WG-Host-A = 1:1:1 | 56 | 233 |
| Example 19 | ET-Host-F:HT-Host-A:WG-Host-A = 1:1:1 | 58 | 247 |
| Example 20 | ET-Host-E:HT-Host-B:WG-Host-A = 1:1:1 | 66 | 203 |
| Example 21 | ET-Host-E:HT-Host-B:WG-Host-A = 4:3:3 | 59 | 158 |
| Example 22 | ET-Host-E:HT-Host-B:WG-Host-D = 1:1:1 | 63 | 252 |
| Example 23 | ET-Host-F:HT-Host-C:WG-Host-D = 1:1:1 | 63 | 307 |
| Example 24 | ET-Host-F:HT-Host-B:WG-Host-D = 1:1:1 | 65 | 283 |

Example 25 and Comparative Examples 11 to 12

Organic light-emitting devices were manufactured in the same manner as in Example 1, except that host compounds listed in Table 4 were used at respective ratios when preparing a composition for forming the emission layer, and an iridium complex represented by the following formula was used as the dopant:

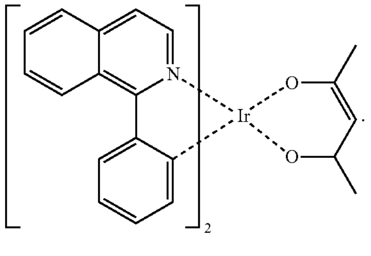

Evaluation Example 4: Evaluation of Characteristics of Organic Light-Emitting Device (3)

The current efficiency and lifespan characteristics of the organic light-emitting devices manufactured according to Example 25 and Comparative Examples 11 to 12 were evaluated. Specific measurement methods are the same as described above, and results thereof are shown in Table 4.

TABLE 4

| No. | Host | Efficiency (cd/A) | Lifespan ($T_{95}$) (hrs) |
|---|---|---|---|
| Example 25 | ET-Host-A:HT-Host-A:WG-Host-A- = 1:1:1 | 7.4 | 6.4 |
| Comparative Example 11 | ET-Host-A:HT-Host-A = 5:5 | 7.1 | 1 |
| Comparative Example 12 | ET-Host-A:WG-Host-A- = 5:5 | 6.8 | 1 |

Example 26 and Comparative Example 13

Organic light-emitting devices were manufactured in the same manner as in Example 1, except that host compounds listed in Table 5 were used at respective ratios when preparing a composition for forming the emission layer, and FlrPic represented by the following formula was used as the dopant:

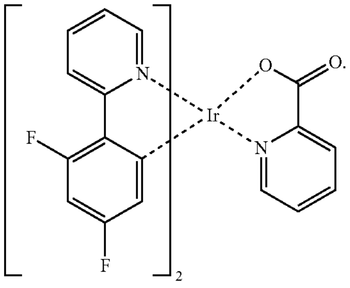

FlrPic

Evaluation Example 5: Evaluation of Characteristics of Organic Light-Emitting Device (4)

The current efficiency and lifespan characteristics of the organic light-emitting devices manufactured according to Example 26 and Comparative Example 13 were evaluated. Specific measurement methods are the same as described above, and results thereof are shown in Table 5.

TABLE 5

| No. | Host | Efficiency (cd/A) | Lifespan ($T_{95}$) (hrs) |
|---|---|---|---|
| Example 26 | ET-Host-A:HT-Host-A:WG-Host-A = 1:1:1 | 19 | 15 |
| Comparative Example 13 | ET-Host-A:HT-Host-A = 5:5 | 18 | 3 |

Example 27 and Comparative Examples 14 and 15

Organic light-emitting devices were manufactured in the same manner as in Example 1, except that host compounds listed in Table 6 were used at respective ratios when preparing a composition for forming the emission layer, and Blue Dopant-A represented by the following formula was used as the dopant:

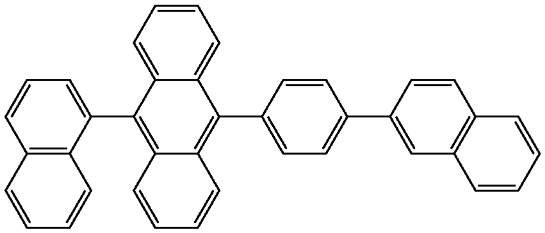

Blue-Host-A

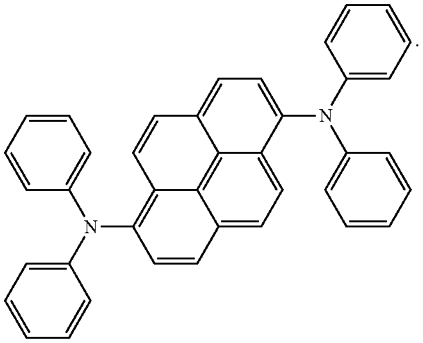

Blue Dopant-A

Evaluation Example 6: Evaluation of Characteristics of Organic Light-Emitting Device (5)

The current efficiency and lifespan characteristics of the organic light-emitting devices manufactured according to Example 27 and Comparative Examples 14 and 15 were evaluated. Specific measurement methods are the same as described above, and results thereof are shown in Table 6.

TABLE 6

| No. | Host | Efficiency (cd/A) | Lifespan ($T_{95}$) (hrs) |
|---|---|---|---|
| Example 27 | Blue-Host-A:HT-Host-A:WG-Host-D = 1:1:1 | 4.2 | 75 |
| Comparative Example 14 | Blue-Host-A:HT-Host-A = 5:5 | 3.1 | 27 |
| Comparative Example 15 | Blue-Host-A:HT-Host-A = 7:3 | 3.3 | 30 |

Referring to Tables 2 to 6, it was confirmed that the organic light-emitting devices manufactured according to Examples using the three host compounds disclosed herein showed the current efficiency (i.e., luminance efficiency) that was almost equivalent to or higher than that of the organic light-emitting devices manufactured according to Comparative Examples, and also exhibited significantly improved lifespan characteristics. In addition, the organic light-emitting devices manufactured according to Examples showed good film formation capability. Therefore, it was confirmed that the host compounds disclosed herein were useful as materials for forming the organic light-emitting devices by solution coating.

In addition, since the host compounds used in Examples were able to form the emission layer of the organic light-emitting device by coating methods, the host compounds are preferable in view of mass production.

According to the one or more embodiments, due to inclusion of three different compounds in the emission layer of the organic light-emitting device, the organic light-emitting device showed improved efficiency and lifespan characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:
- a first electrode;
- a second electrode; and
- an emission layer between the first electrode and the second electrode,
- wherein the emission layer comprises a composition comprising a first compound, a second compound, and a third compound,
- the first compound comprises at least one compound represented by one of Formulae 1-1 to 1-4, provided that when the first compound is of Formula 1-1, then the first compound does not comprise a triphenylene group,
- the second compound comprises at least one compound represented by one of Formulae 2-1 to 2-4, and
- the third compound comprises at least one group represented by one of Formulae 3-1 to 3-3, wherein a band gap between a highest occupied molecular orbital band energy level and a lowest unoccupied molecular orbital band energy level of the third compound is 3.3 eV or more,
- the first compound is an electron transporting host compound, the second compound is a hole transporting host compound, and the third compound is a wide-bandgap compound:

1-1

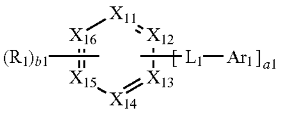

1-2

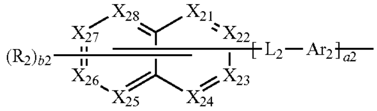

1-3

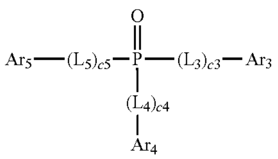

-continued 1-4

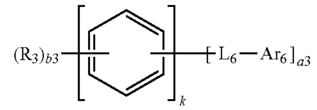

2-1

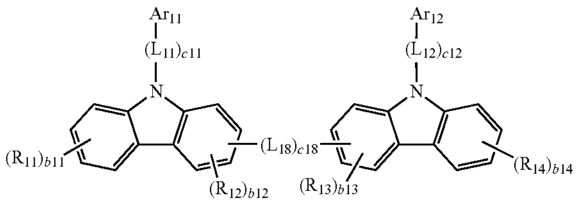

2-2

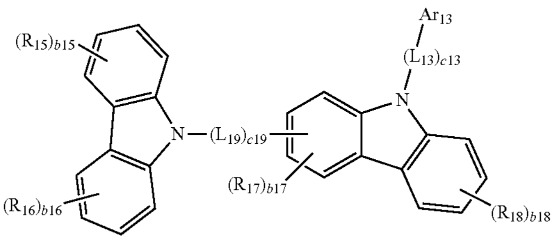

2-3

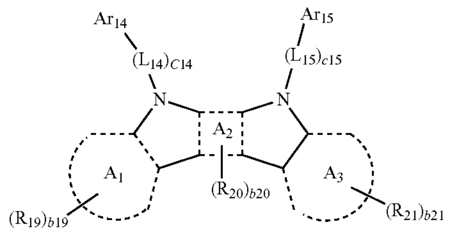

2-4

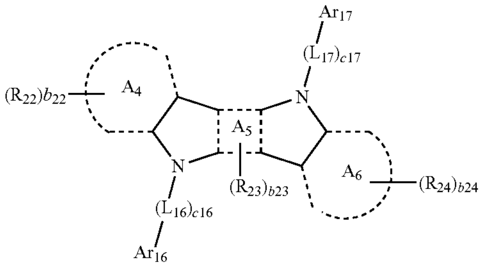

3-1

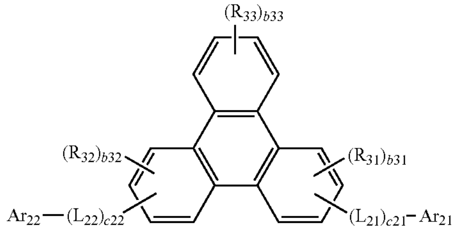

3-2

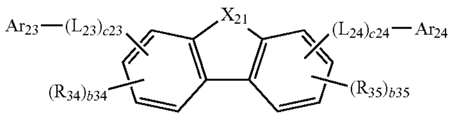

-continued 3-3

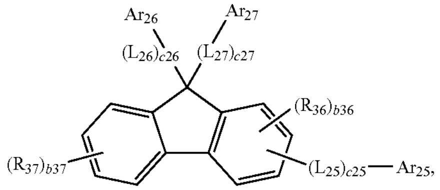

wherein, in Formulae 1-1 to 1-4, $X_{11}$ to $X_{16}$ and $X_{21}$ to $X_{28}$ are each independently C or N, at least one of $X_{11}$ to $X_{16}$ is N, at least one of $X_{21}$ to $X_{28}$ is N, $L_1$ to $L_6$ are each independently a single bond, a substituted or unsubstituted $C_6$-$C_{30}$ arylene group, a substituted or unsubstituted $C_1$-$C_{30}$ heteroarylene group, a divalent non-aromatic condensed polycyclic group, or a divalent non-aromatic condensed heteropolycyclic group, c3 to c5 are each independently an integer from 1 to 3, $Ar_1$ to $Ar_6$ are each independently a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, wherein in Formula 1-1, at least two of -$[Li_1Ar_1]_{a1}$ comprise a carbazole group, any two adjacent groups among $Ar_3$ to $Ar_5$ are optionally linked to each other via a single bond to form a condensed ring, a1 is 3, wherein the three -$[L_1Ar_1]$ groups are different from each other, a2 and a3 are each independently an integer from 1 to 3, provided that:

i) when a2 is 2, then b2 is 1 and $R_2$ is not hydrogen, $R_1$ to $R_3$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b1 is an integer from 0 to 2, b2 is an integer from 0 to 6, b3 is an integer from 7 to 11, and k is 3 or 4, and in Formulae 2-1 to 2-4, $A_1$ to $A_6$ are each independently a $C_5$-$C_{30}$ carbocyclic group or a $C_1$-$C_{30}$ heterocyclic group, $L_{11}$ to $L_{19}$ are each independently a single bond, a substituted or unsubstituted $C_6$-$C_{30}$ arylene group, a substituted or unsubstituted $C_1$-$C_{30}$ heteroarylene group, a substituted or unsubstituted divalent non-aromatic condensed polycyclic group, or a substituted or unsubstituted divalent non-aromatic condensed heteropolycyclic group, c11 to c19 are each independently an integer from 1 to 3, $Ar_{11}$, $Ar_{12}$, and $Ar_{14}$ to $Ar_{17}$ are each independently a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, wherein each of $Ar_{14}$ and $Ar_{15}$ is not an indolocarbazole group, and each of $Ar_{16}$ and $Ar_{17}$ is not a naphthyl group at the same time, $Ar_{13}$ is a substituted or unsubstituted $C_6$-$C_{30}$ aryl group or a substituted or unsubstituted monovalent non-aromatic condensed polycyclic group, $R_{11}$ to $R_{24}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{30}$ aryl group, a substituted or unsubstituted $C_1$-$C_{30}$ heteroaryl group, a substituted or unsubstituted monovalent non-aromatic condensed polycyclic group, or a substituted or unsubstituted monovalent non-aromatic condensed heteropolycyclic group, b11, b14, b15, b16, and b18 to b24 are each independently an integer from 0 to 4, b12, b13, and b17 are each independently an integer from 0 to 3, wherein, in Formulae 3-1 to 3-3, $X_{21}$ is O or S, $L_{21}$ to $L_{27}$ are each independently a single bond, a substituted or unsubstituted $C_6$-$C_{30}$ arylene group, c21 to c27 are each independently an integer from 1 to 3, $Ar_{21}$ to $Ar_{27}$ are each independently:

hydrogen, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group; or a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, or any combination thereof, each of $Ar_{21}$ and $Ar_{22}$ is not hydrogen at the same time, $Ar_{26}$ and $Ar_{27}$ are optionally linked to each other via a single bond to form a condensed ring, $R_{31}$ to $R_{37}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b31, b32, b34, b35, and b36 are each independently an integer from 0 to 3, and b33 is each independently an integer from 0 to 4, at least one substituent of the substituted $C_6$-$C_{30}$ arylene group, the substituted $C_1$-$C_{30}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{30}$ aryl group, the substituted $C_1$-$C_{30}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(═O)($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(═O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), —P(═O)($Q_{38}$)($Q_{39}$), or any combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

2. The organic light-emitting device of claim 1, wherein $L_1$ to $L_6$ and $L_{11}$ to $L_{19}$ are each independently a single bond, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolyl group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group; or a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a pentalenyl group, an indenyl group, a naphthyl group, an azulenyl group, a heptalenyl group, an indacenyl group, an acenaphthyl group, a fluorenyl group, a spiro-fluorenylene group, a benzofluorenylene group, a dibenzofluorenylene group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolylene group, a dibenzocarbazolylene group, or any combination thereof.

3. The organic light-emitting device of claim 1, wherein $Ar_1$ to $Ar_6$ are each independently:

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, or an indoloazadibenzothiophenyl group; or a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, or an indoloazadibenzothiophenyl group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an indolocarbazolyl group, an indolodibenzofuranyl group, an indolodibenzothiophenyl group, an indolofluorenyl group, an indolospiro-fluorenyl group, an indolophenanthrenyl group, an indolotriphenylenyl group, an indoloazadibenzofuranyl group, an indoloazadibenzothiophenyl group, or any combination thereof.

4. The organic light-emitting device of claim 1, wherein $R_1$ to $R_3$ are each independently:

hydrogen, deuterium, —F, —Cl, —Br, —I, a cyano group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, —F, —Cl, —Br, —I, a cyano group, a $C_1$-$C_{20}$ alkyl group, $C_1$-$C_{20}$ alkoxy group, or any combination thereof.

5. The organic light-emitting device of claim 1, wherein $A_1$, $A_2$, $A_3$, $A_4$, $A_5$, and $A_6$ are each independently a benzene group, a naphthalene group, an anthracene group, a thiophene group, a furan group, a pyrrole group, an indole group, an indene group, a benzosilole group, a benzothiophene group, a benzofuran group, a carbazole group, a fluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group.

6. The organic light-emitting device of claim 1, wherein $Ar_{11}$, $Ar_{12}$, and $Ar_{14}$ to $Ar_{17}$ are each independently:

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or a group represented by Formula a; or a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, or a group represented by Formula a, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group $—N(Q_{11})(Q_{12})$, or any combination thereof, each of $Ar_{14}$ and $Ar_{15}$ is not an indolocarbazole group, and each of $Ar_{16}$ and $Ar_{17}$ is not a naphthalene group at the same time, and $Q_{11}$ and $Q_{12}$ are each independently a phenyl group, a biphenyl group, a terphenyl group, or a naphthyl group:

Formula a

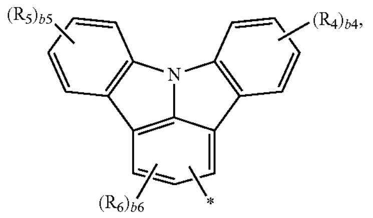

wherein, in Formula a, $R_4$ to $R_6$ are each independently:

hydrogen, deuterium, —F, —Cl, —Br, —I, a cyano group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, —F, —Cl, —Br, —I, a cyano group, a $C_1$-$C_{20}$ alkyl group, a $C_1$-$C_{20}$ alkoxy group, or any combination thereof, b4 is an integer from 0 to 4, b5 is an integer from 0 to 4, b6 is an integer from 0 to 3, and "*" indicates a binding site to a neighboring atom.

7. The organic light-emitting device of claim 1, wherein $Ar_{13}$ is:

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group;

a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, or an ovalenyl group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a biphenyl group, a terphenyl group, a quaterphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, or any combination thereof.

8. The organic light-emitting device of claim 1, wherein $R_{11}$ to $R_{24}$ are each independently:

hydrogen, deuterium, —F, —Cl, —Br, —I, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, a cyano group, or any combination thereof, a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, or a dibenzocarbazolyl group; or a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, or a dibenzocarbazolyl group, each substituted with at least one a $C_1$-$C_{20}$ alkyl group, a $C_1$-$C_{20}$ alkoxy group, a phenyl group, a biphenyl group, a terphenyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a carbazolyl group, a dibenzofuranyl group, a dibenzothiophenyl group, a benzocarbazolyl group, a dibenzocarbazolyl group, or any combination thereof, that are each substituted with at least one deuterium, —F, —Cl, —Br, —I, a cyano group, or any combination thereof.

9. The organic light-emitting device of claim 1, wherein

Formula 1-1 is represented by Formula 1-1(1),

Formula 1-2 is represented by Formula 1-2(1),

Formula 1-4 is represented by one of Formulae 1-4(1), 1-4(2), and 1-4(3):

1-1(1)

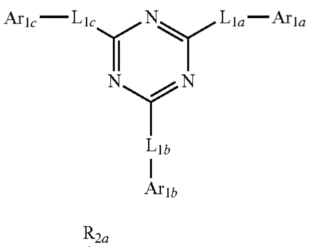

1-2(1)

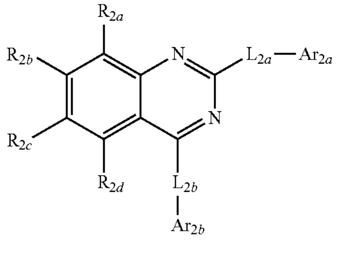

-continued 1-4(1)

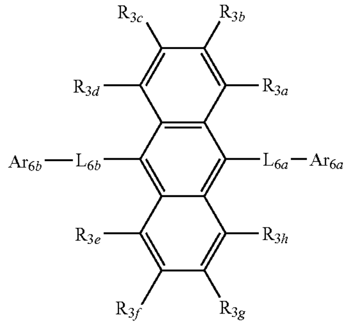

(1-4(2)

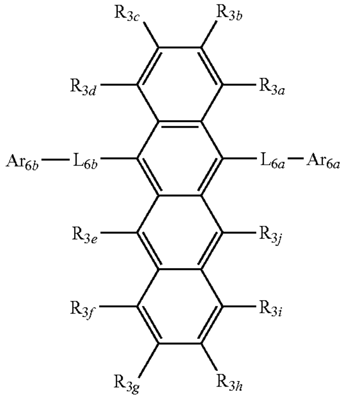

1-4(3)

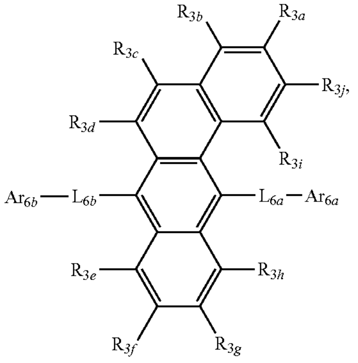

wherein, in Formula 1-1(1), $L_{1a}$, $L_{1b}$, and $L_{1c}$ are understood by referring to the description presented in connection with Li of claim 1, and $Ar_{1a}$, $Ar_{1b}$, and $Ar_{1c}$ are understood by referring to the description presented in connection with $Ar_1$ of claim 1, and in Formula 1-2(1), $L_{2a}$ and $L_{2b}$ are understood by referring to the description presented in connection with $L_2$ of claim 1, $Ar_{2a}$ and $Ar_{2b}$ are understood by referring to the description presented in connection with $Ar_2$ of claim 1, and $R_{2a}$, $R_{2b}$, $R_{2c}$, and $R_{2d}$ are understood by referring to the description presented in connection with $R_2$ of claim 1, in Formula 1-4(1) to 1-4(3), $L_{6a}$ and $L_{6b}$ are understood by referring to the description presented in connection with $L_6$ of claim 1, $Ar_{6a}$ and $Ar_{6b}$ are understood by referring to the description presented in connection with $Ar_6$ of claim 1 and $R_{3a}$ to $R_{3j}$ are understood by referring to the description presented in connection with $R_3$ of claim 1.

10. The organic light-emitting device of claim 1, wherein the first compound comprises at least one of the following compounds:

1
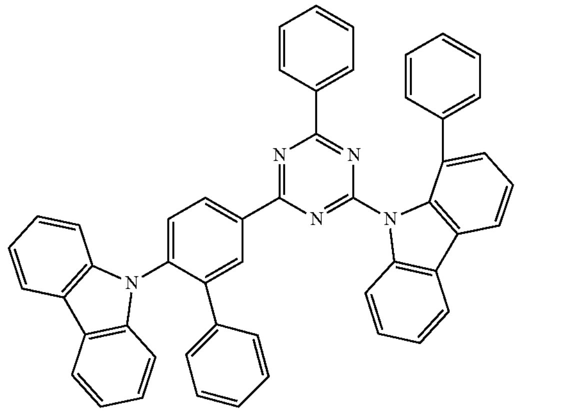
2
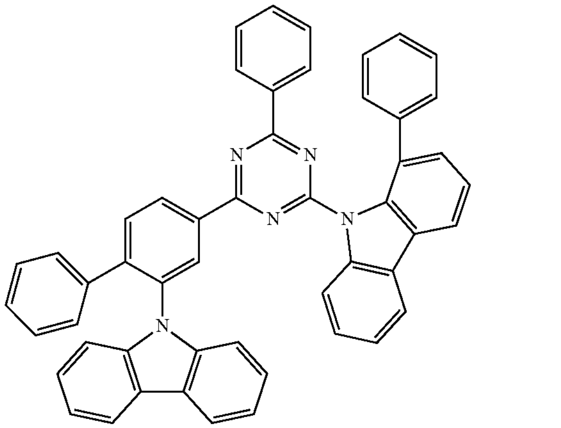
3
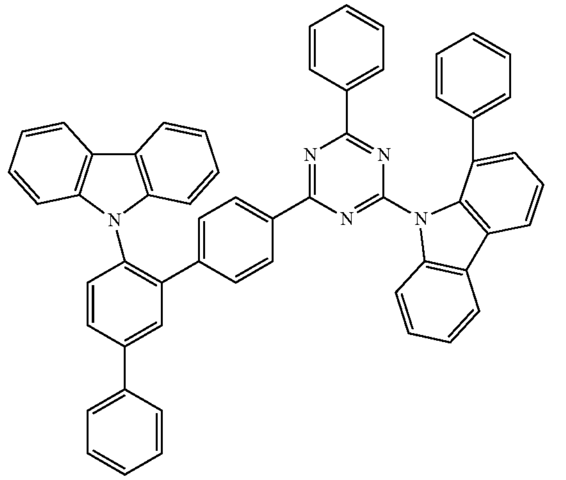
4
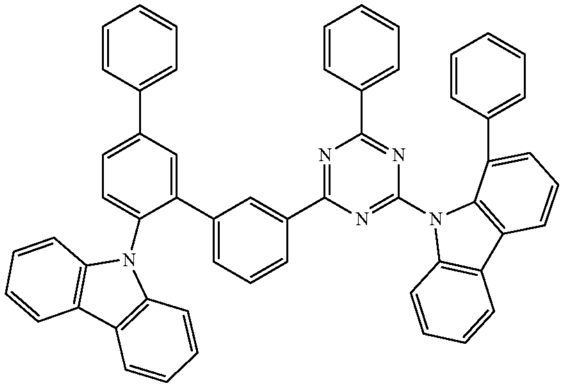
5
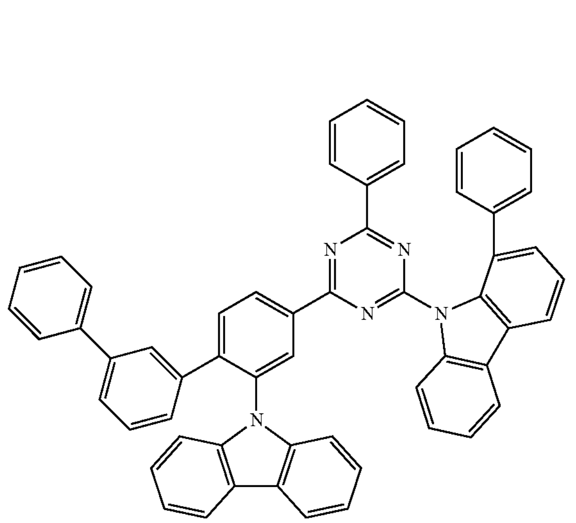
6
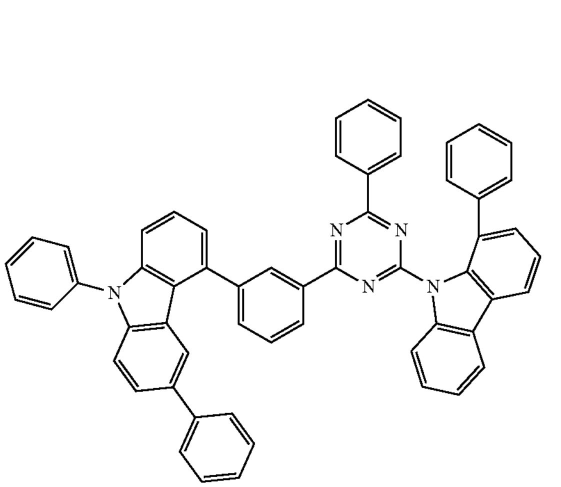

-continued
7
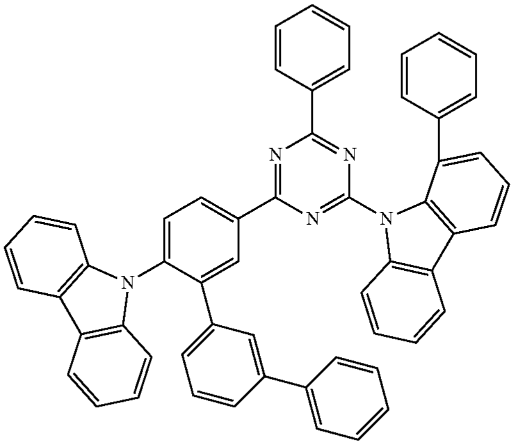
8
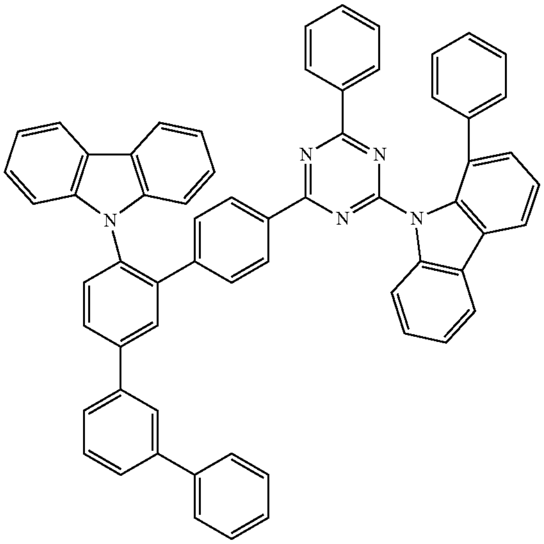
9
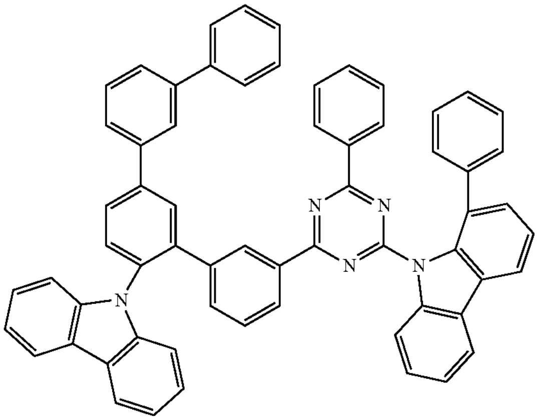
10
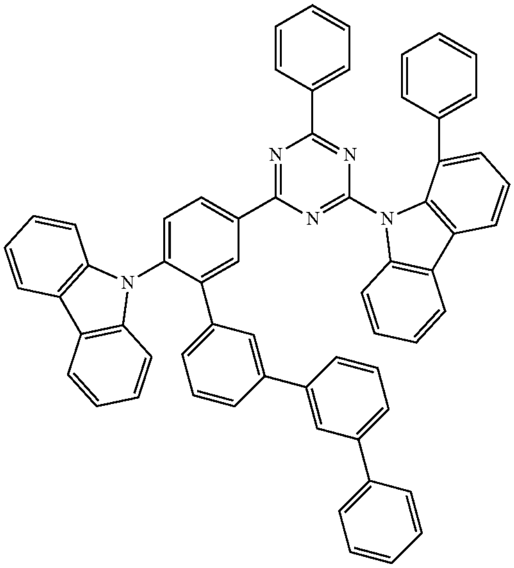
11
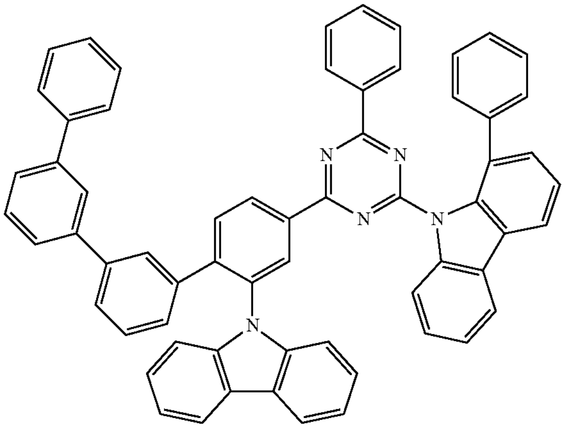
12
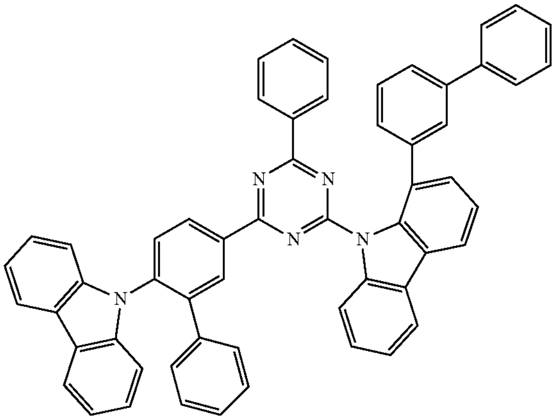

-continued
13
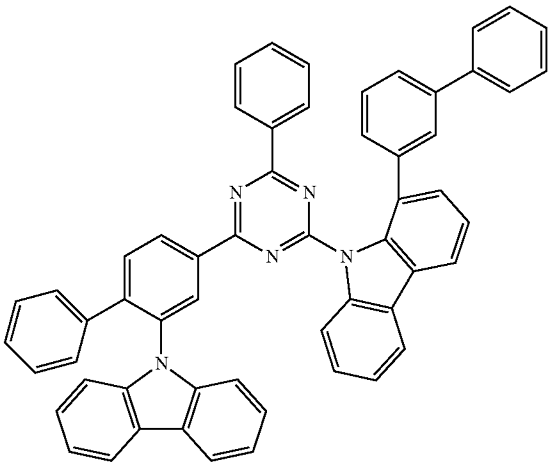
14
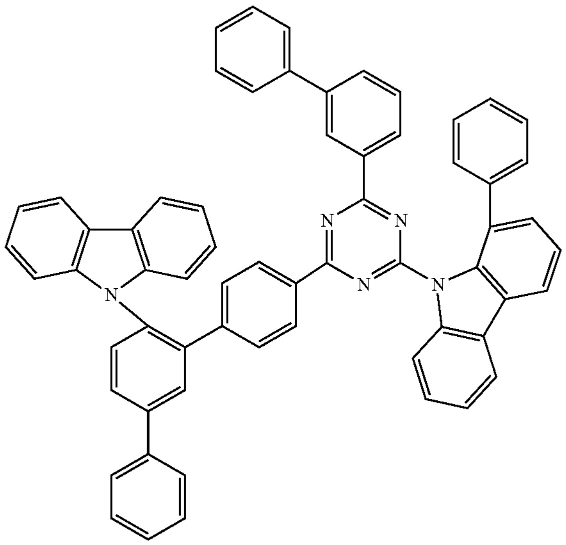
15
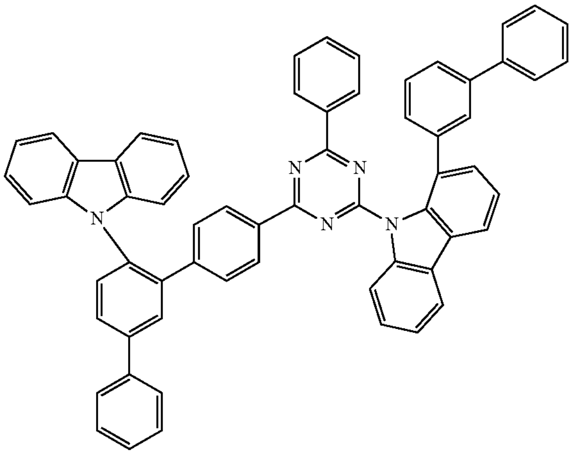
16
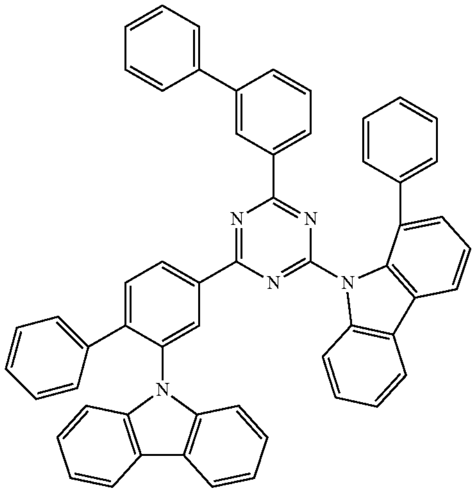
17
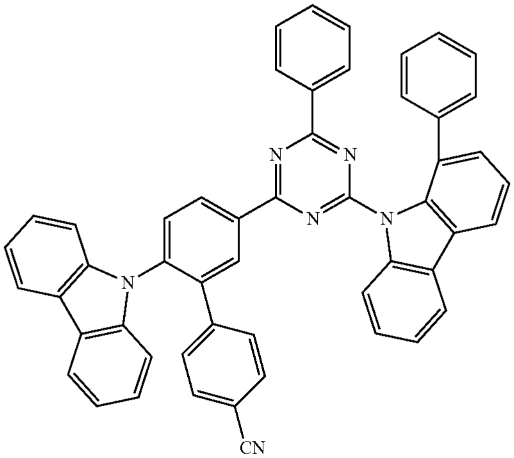
18
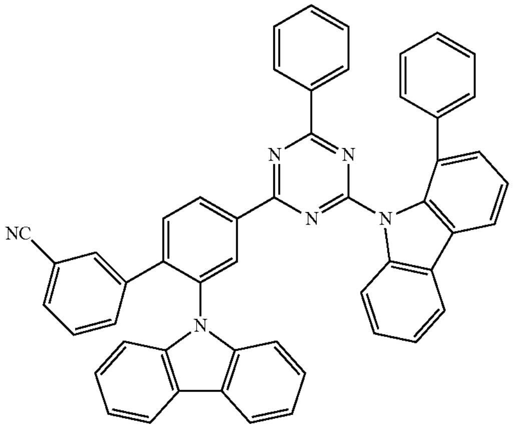

-continued
19
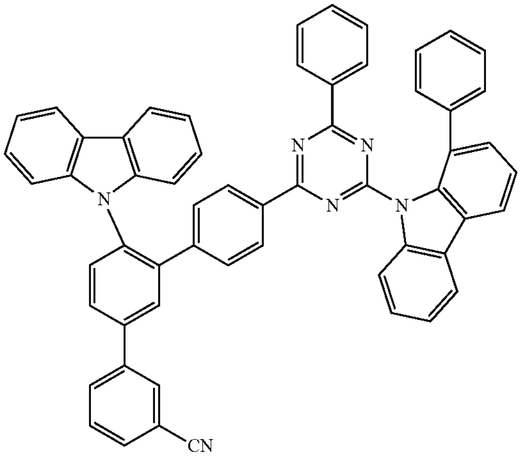
20
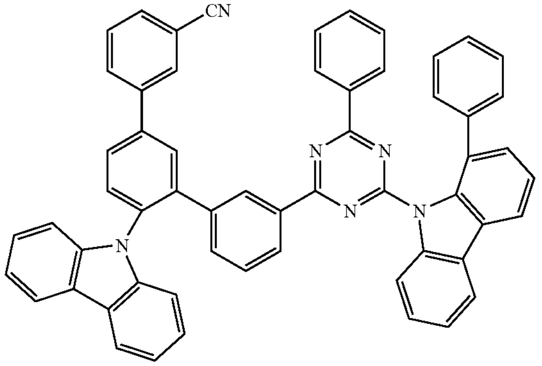
21
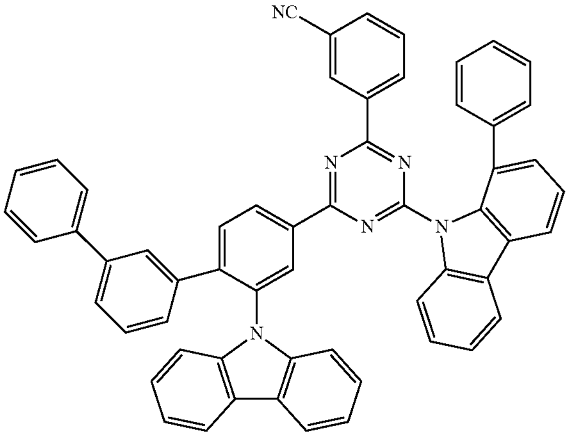
22
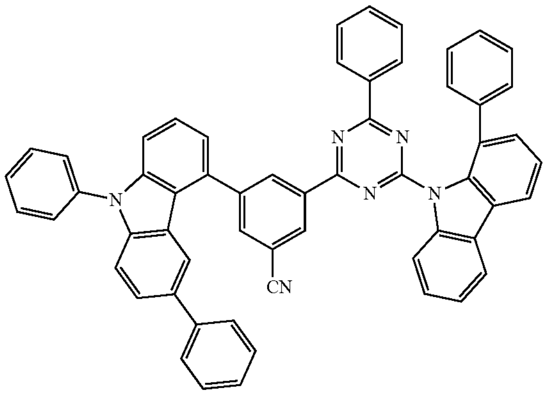
23
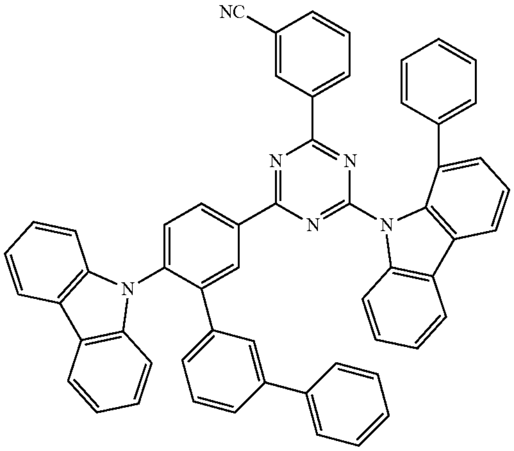
24
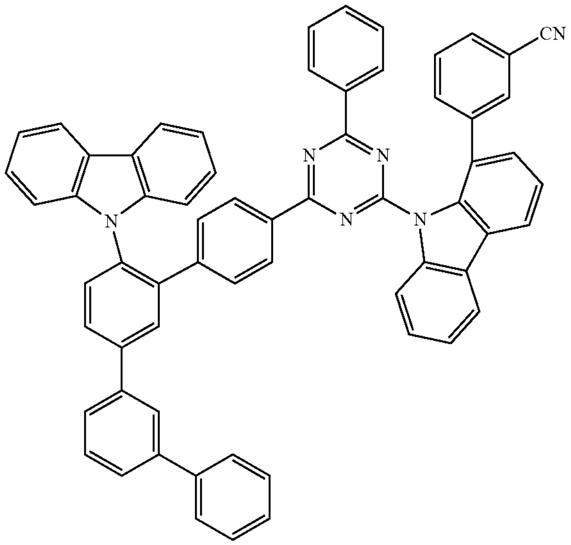

-continued
25
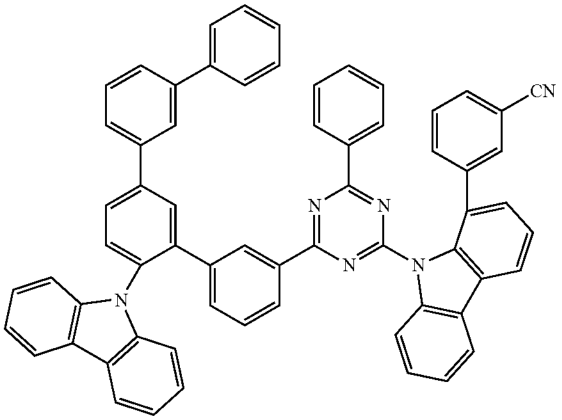
26
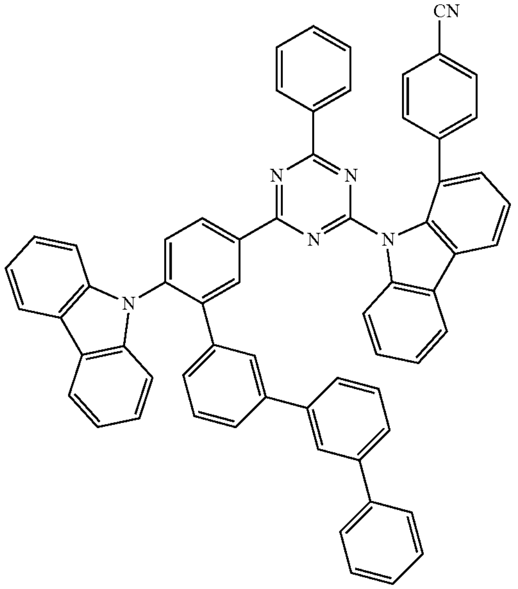
27
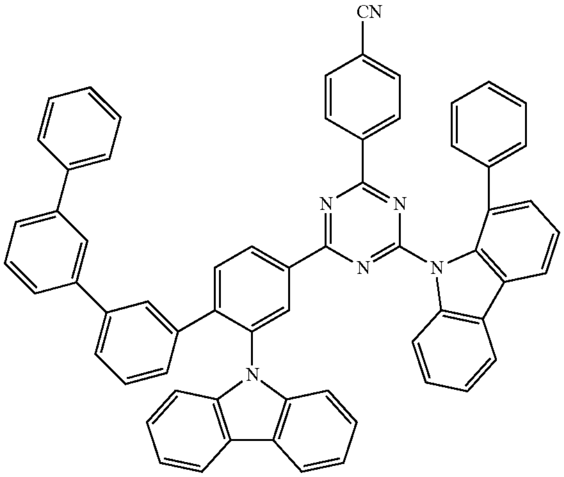
28
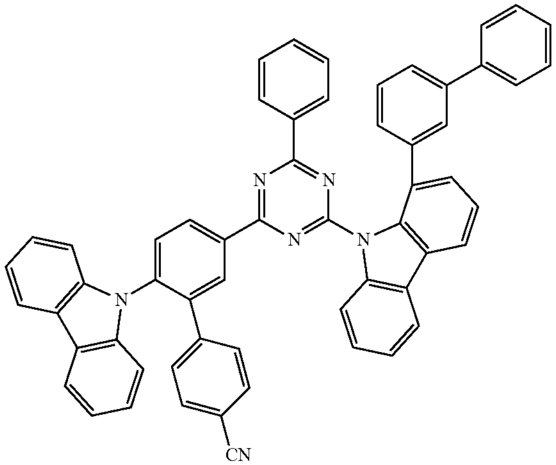
29
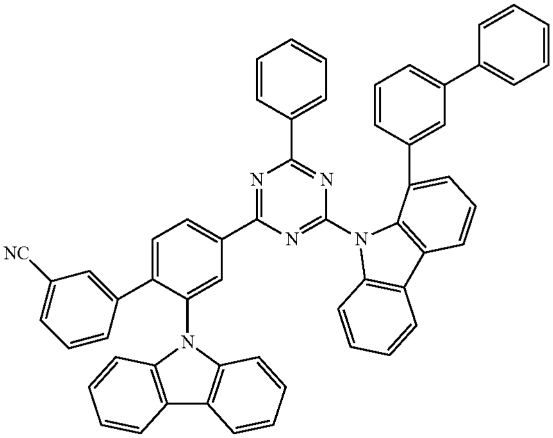
30
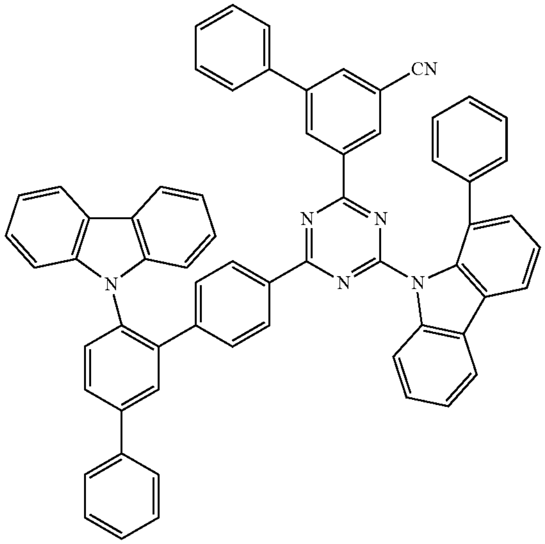

-continued
31
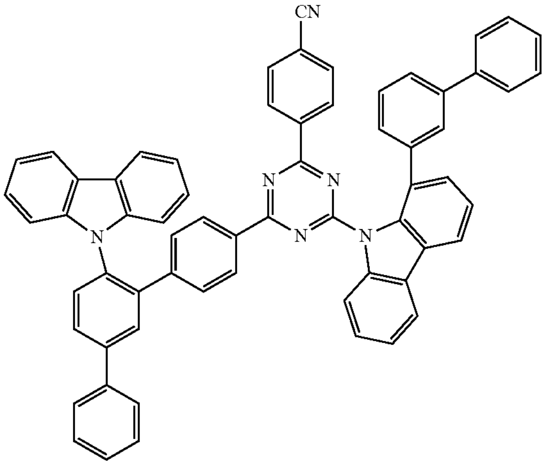
32
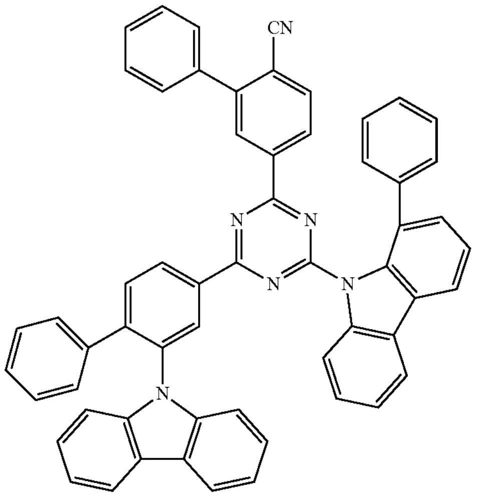
33
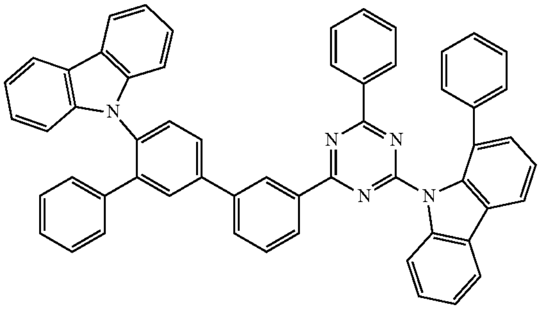
34
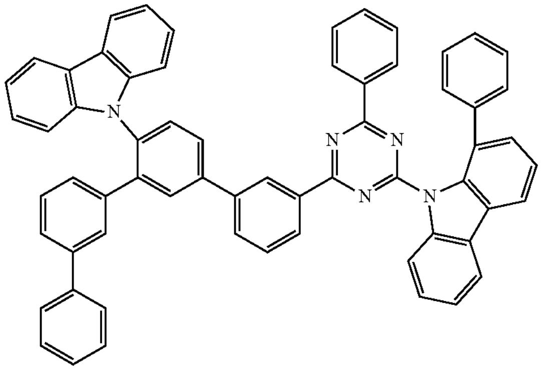
35
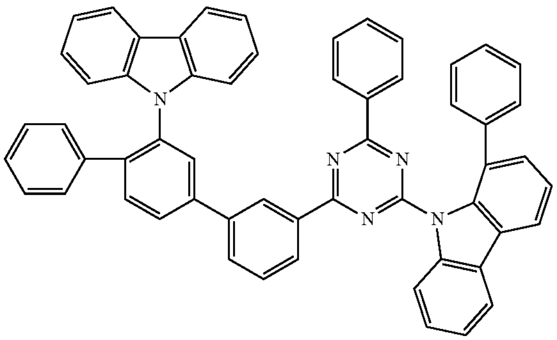
36
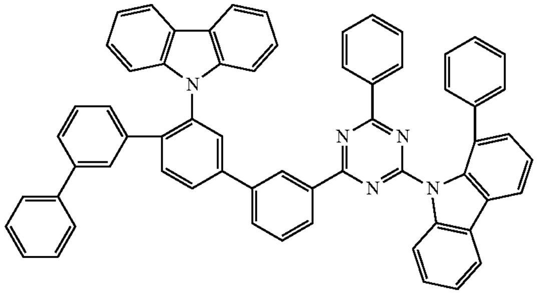
37
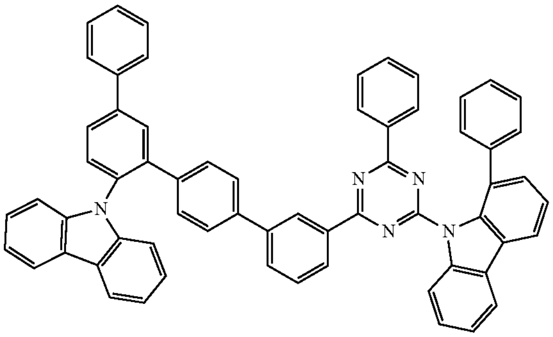
38
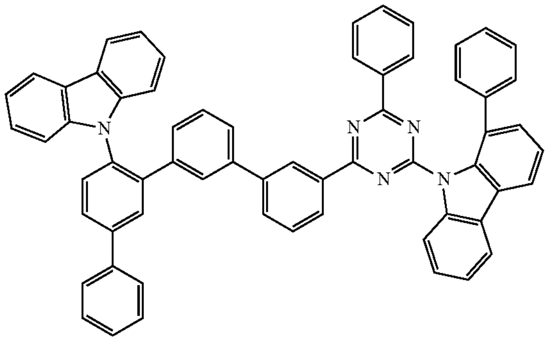

-continued
39
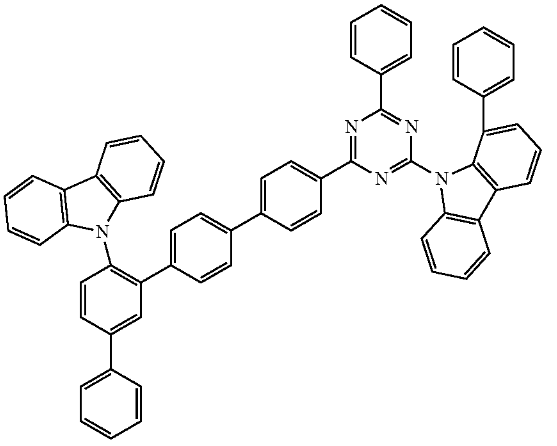
40
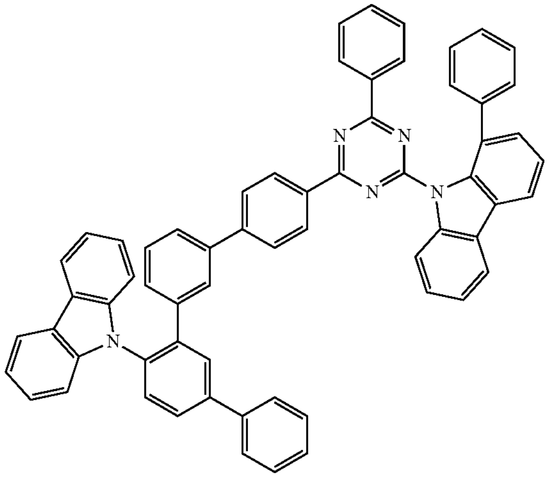
41
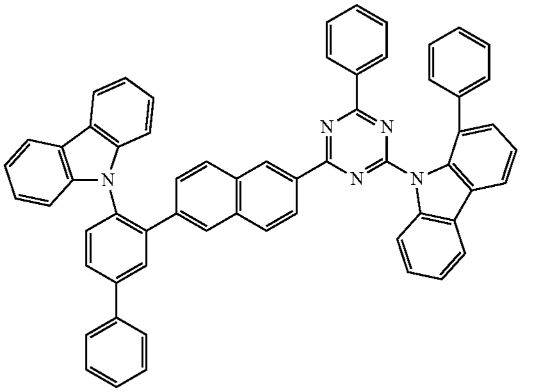
42
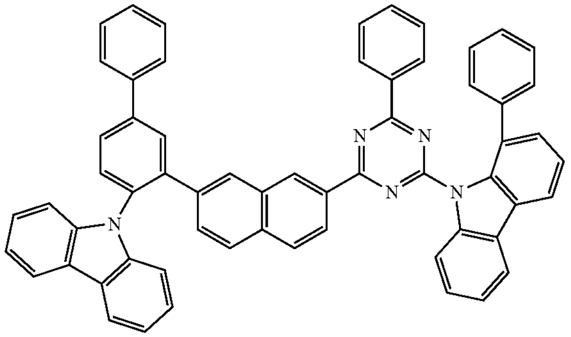
43
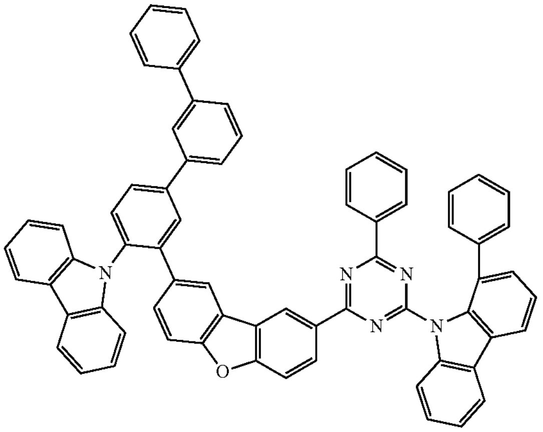
44
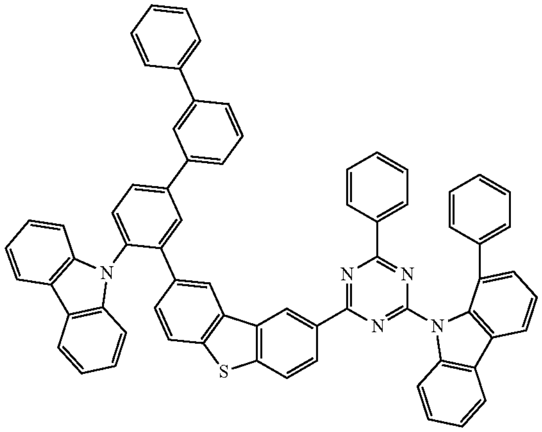

-continued
45
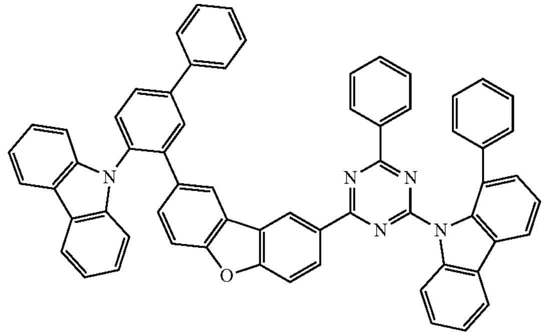
46
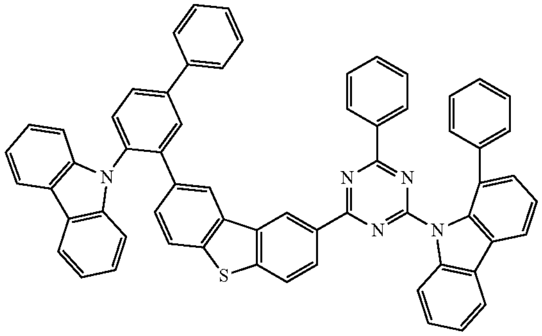
47
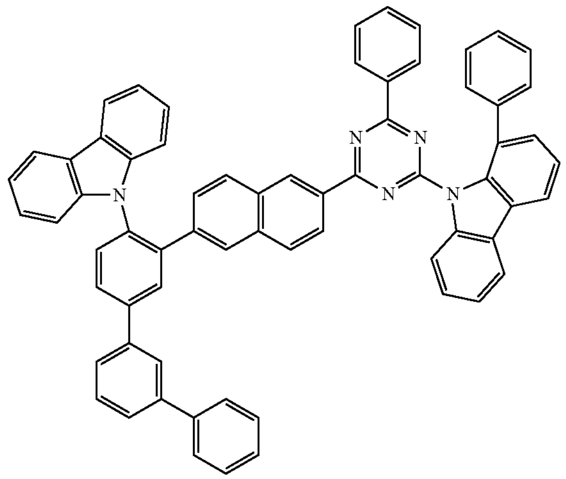
48
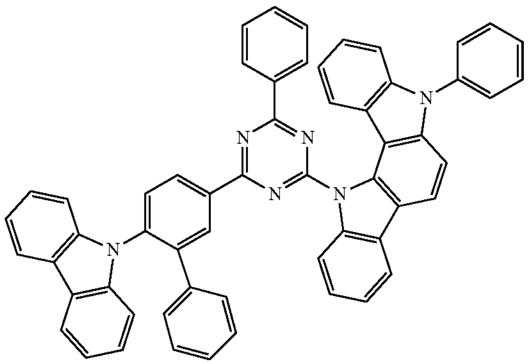
49
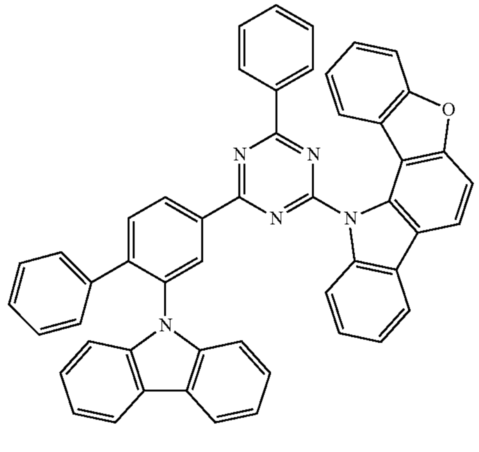
50
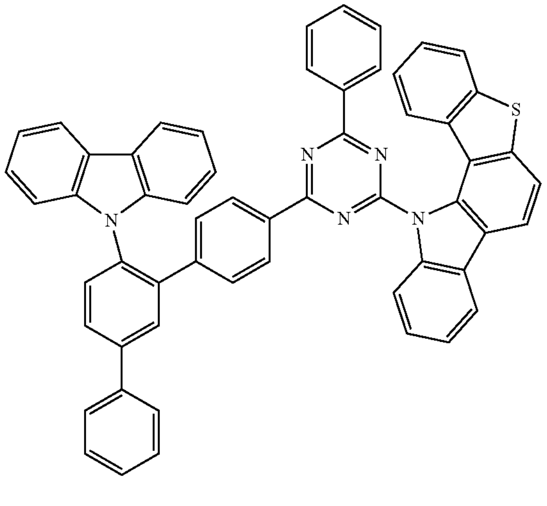

-continued
51
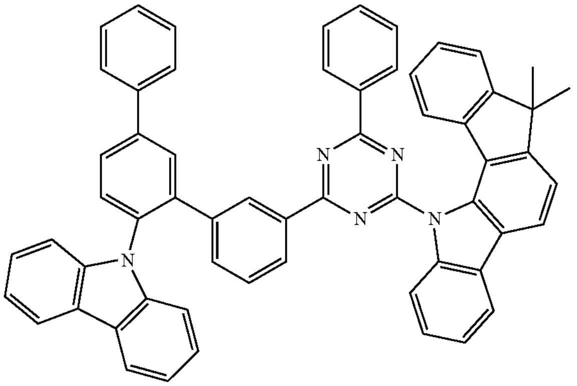
52
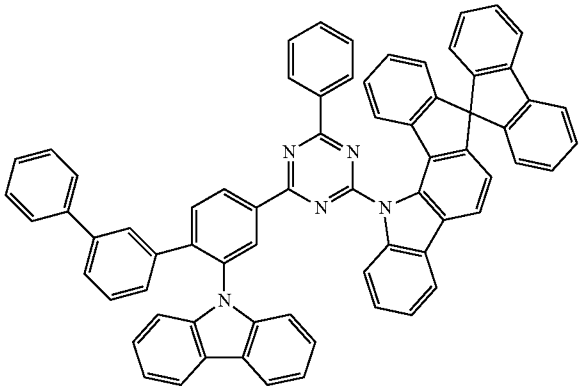
53
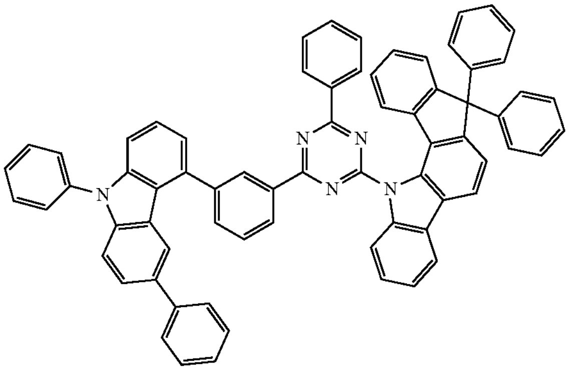
54
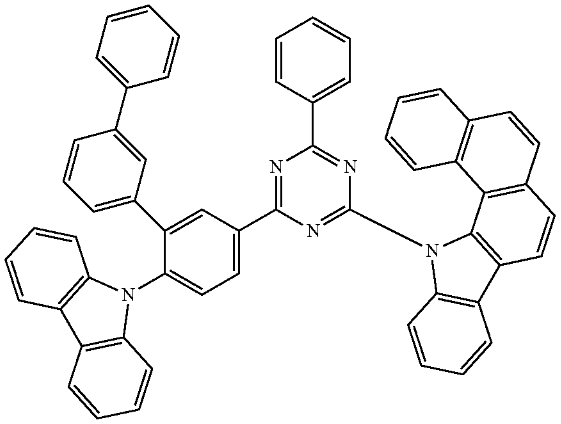
55
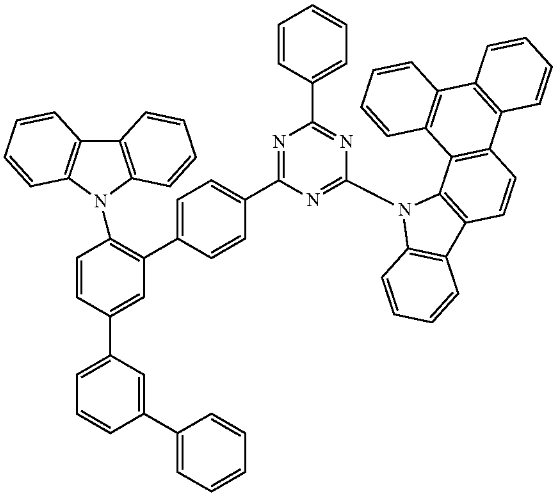
56
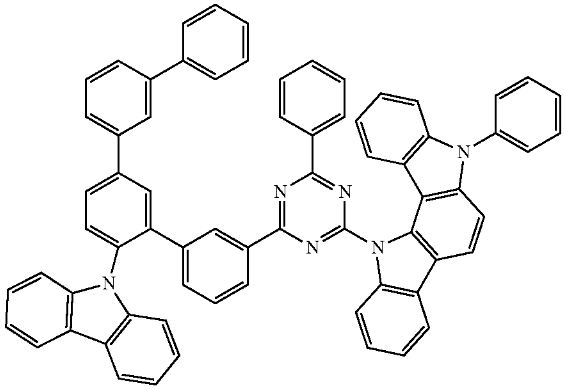

-continued
57
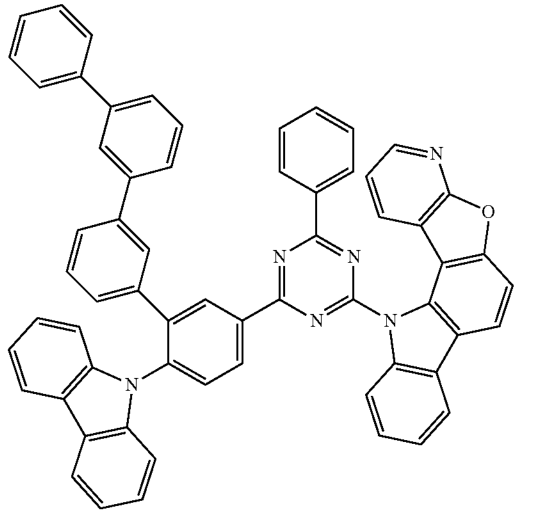
58
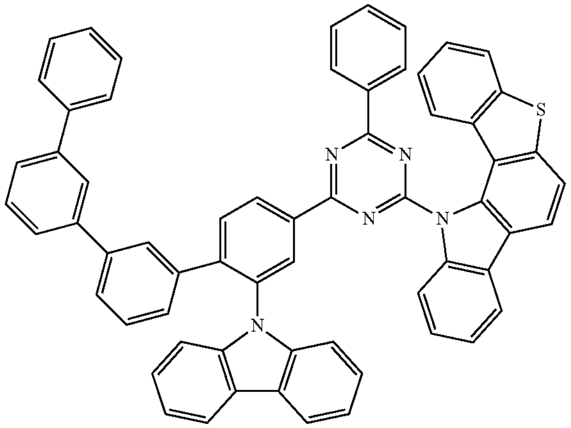
59
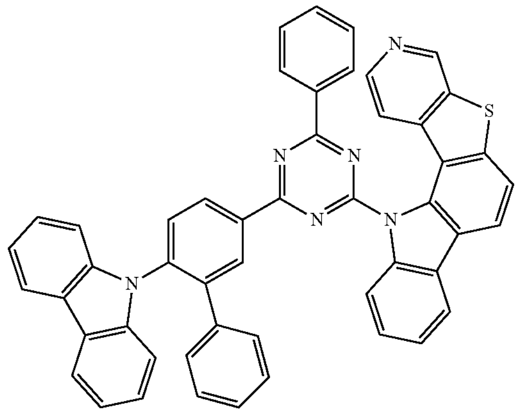
60
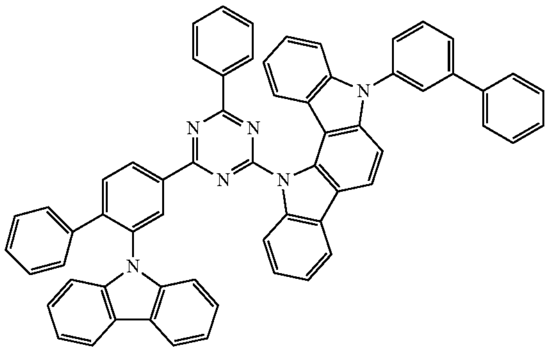
61
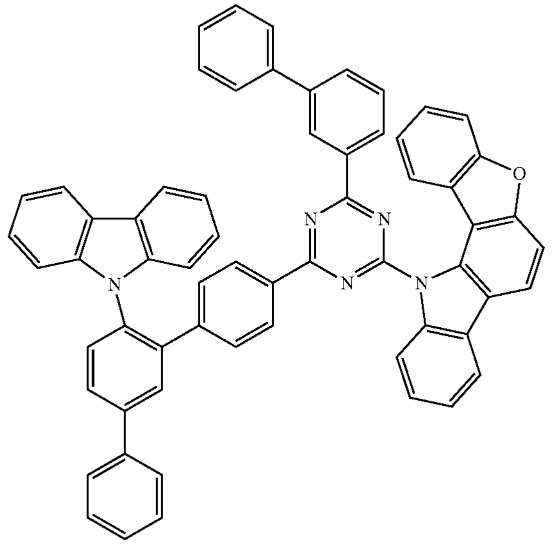
62
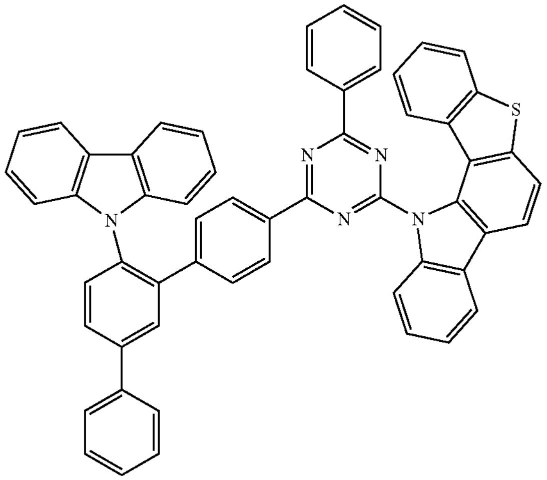

-continued
63
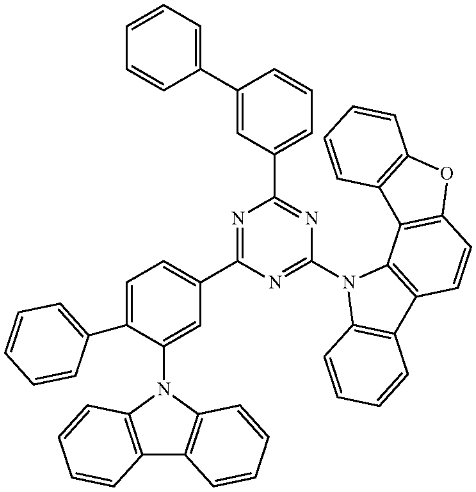
64
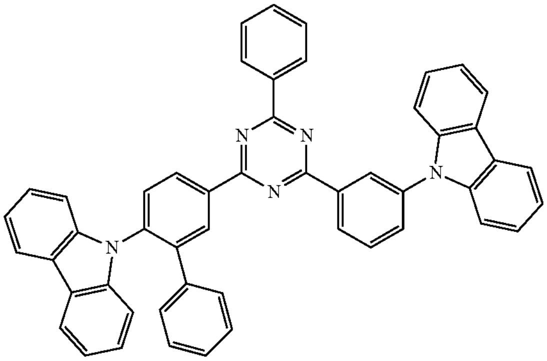
65
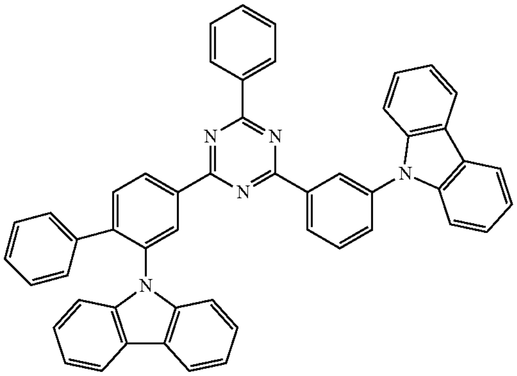
66
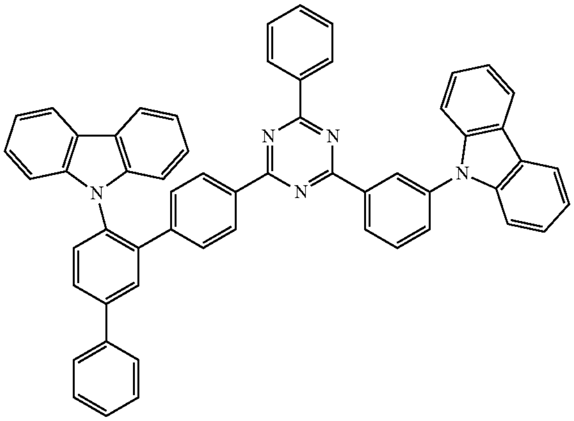
67
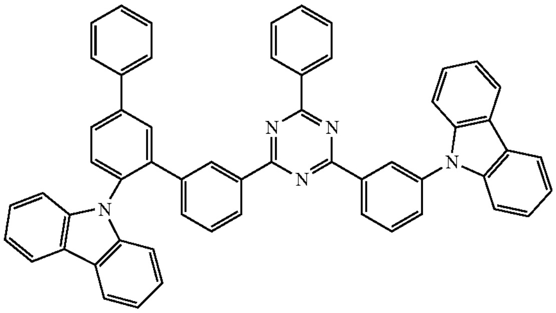
68
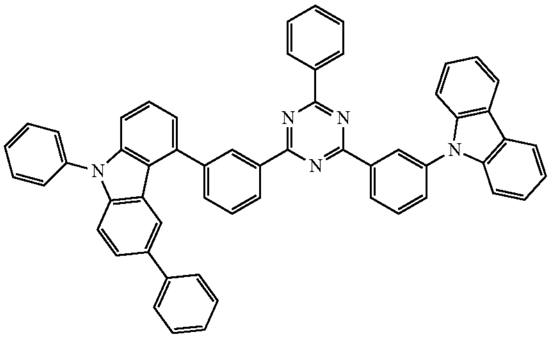

-continued
69
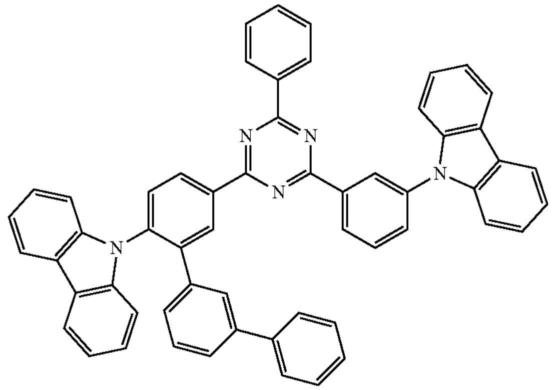
70
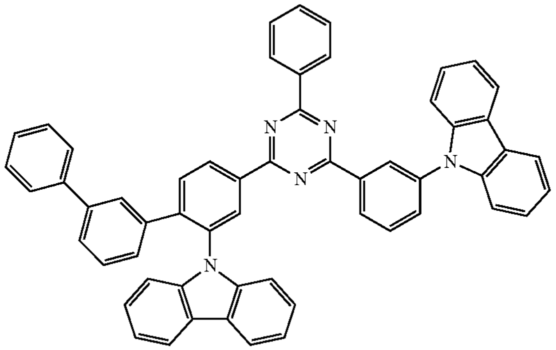
71
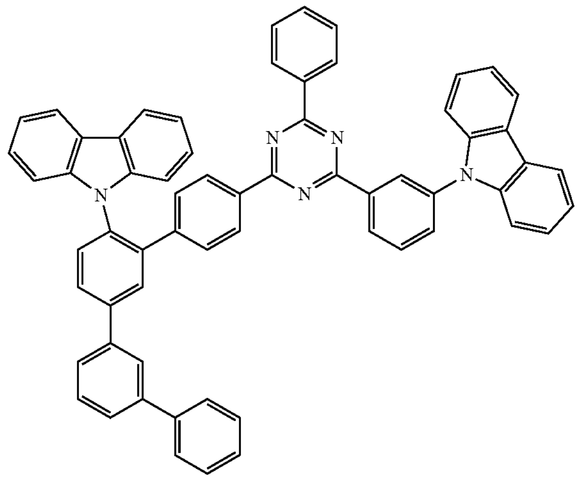
72
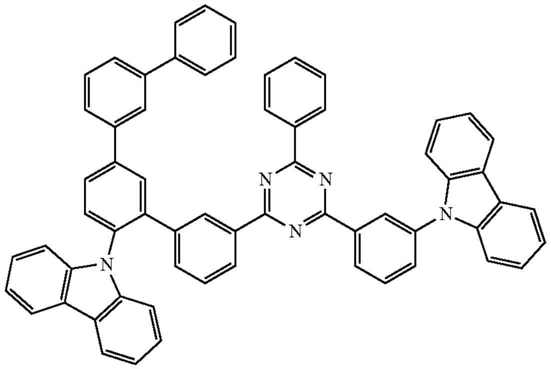
73
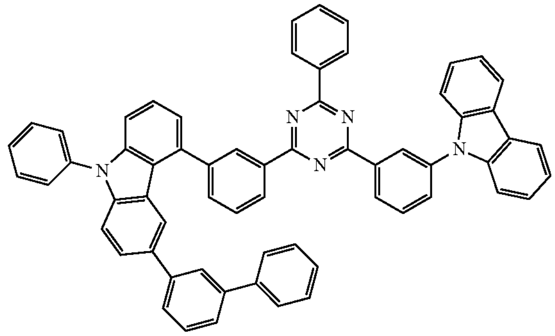
74
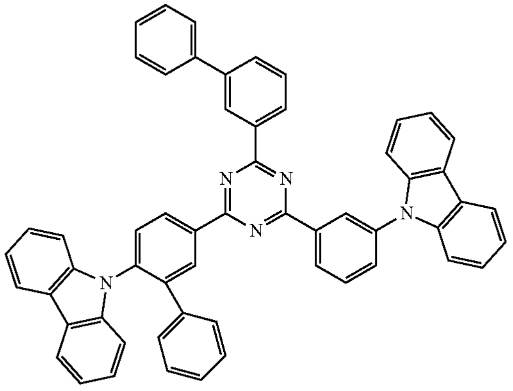

-continued
75
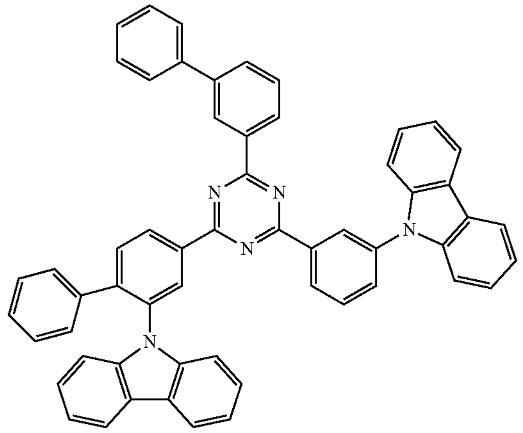
76
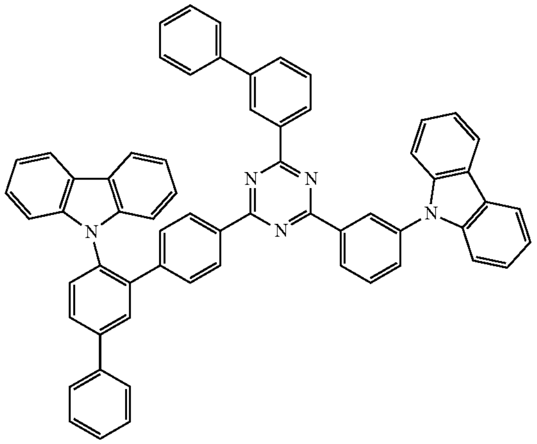
77
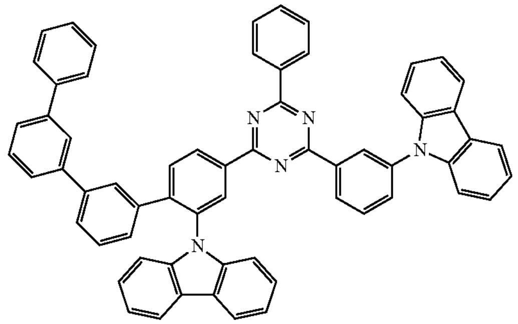
78
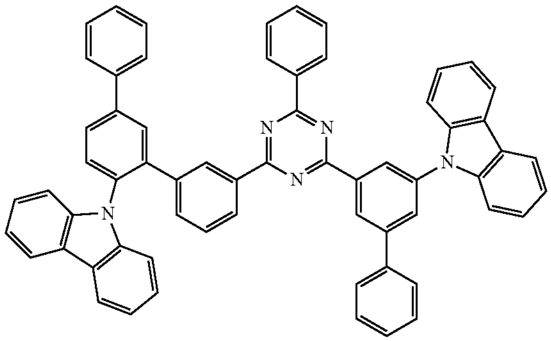
79
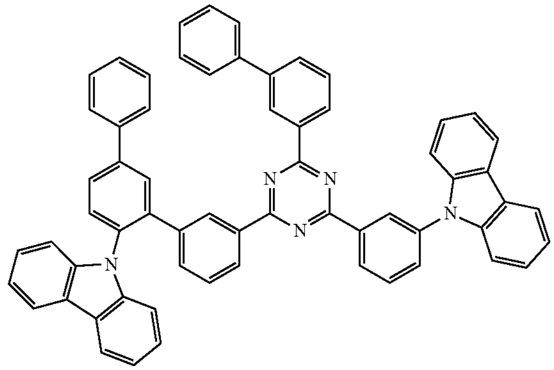
80
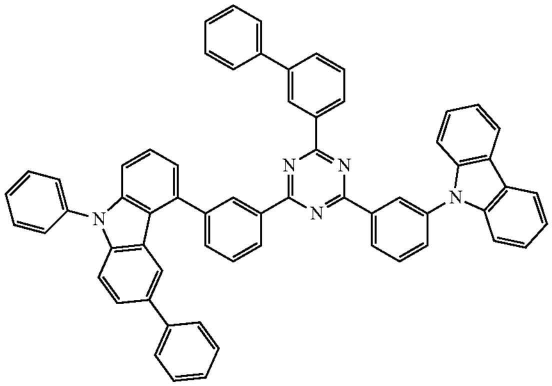

-continued
81
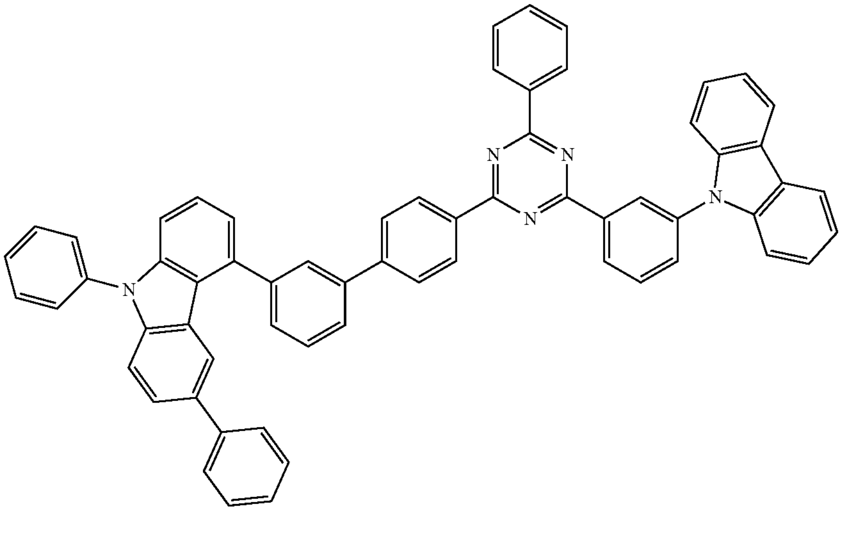
82
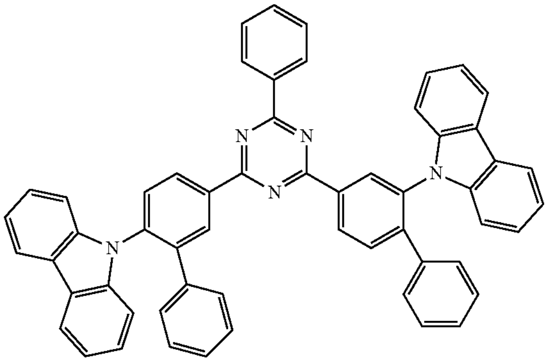
83
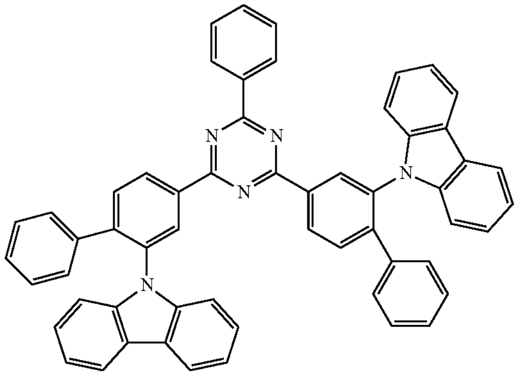
84
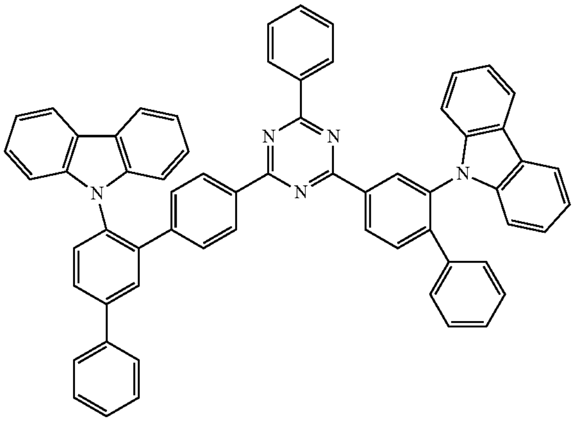
85
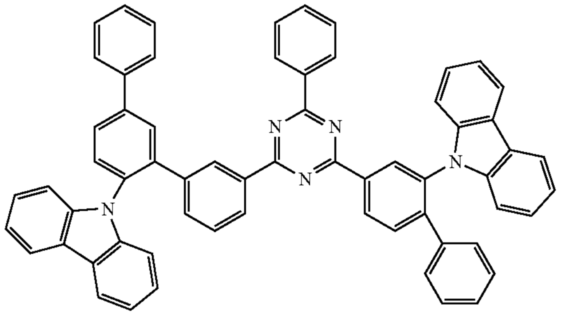

-continued
86
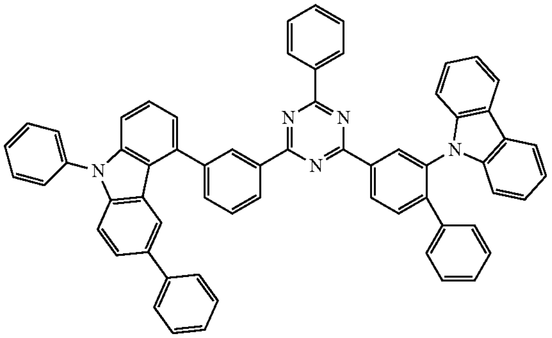
87
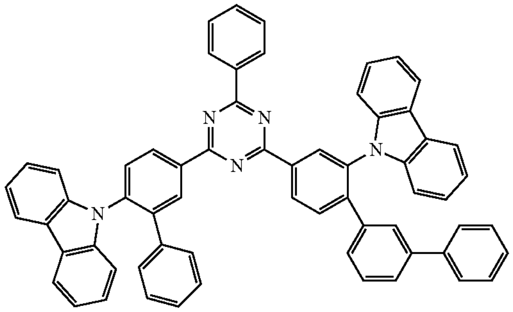
88
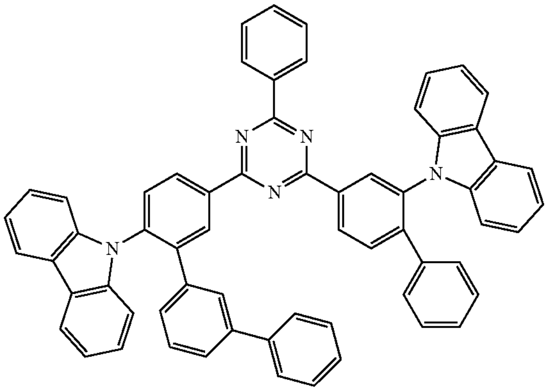
89
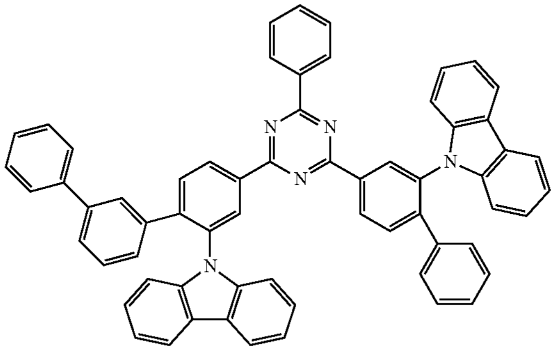
90
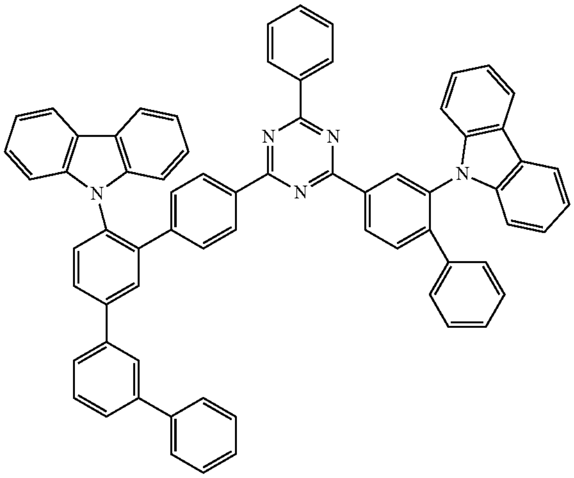
91
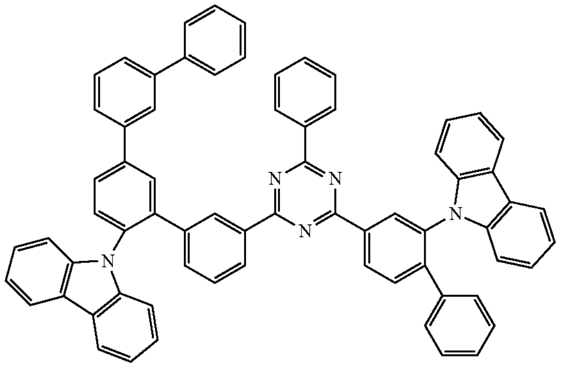
92
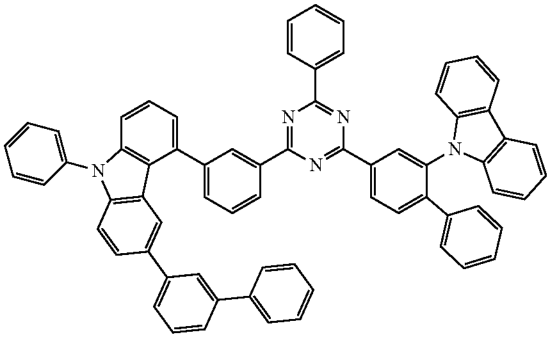
93
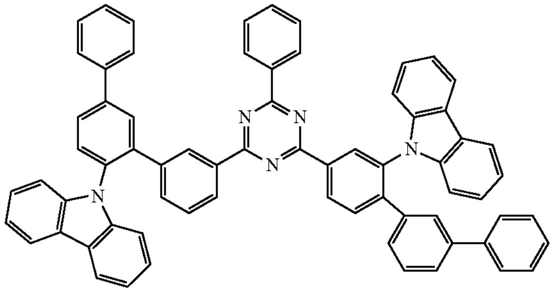

-continued
94
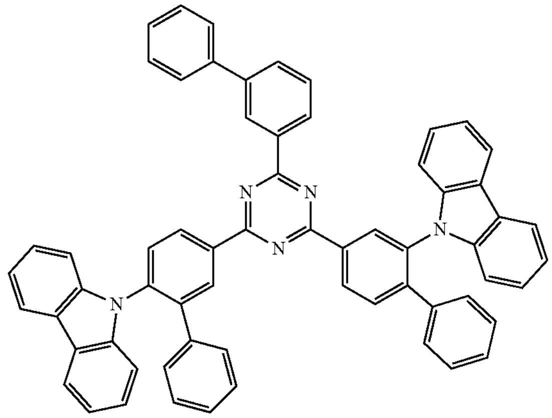
95
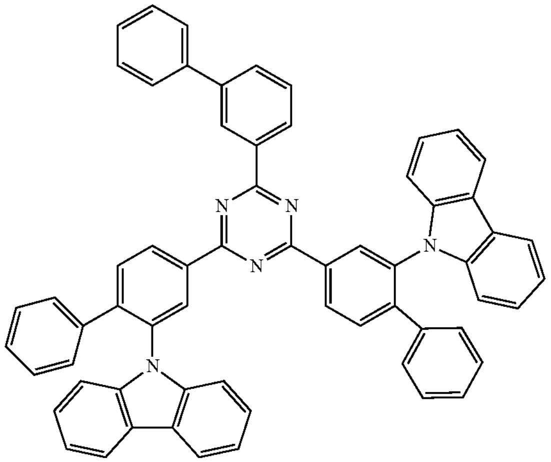
96
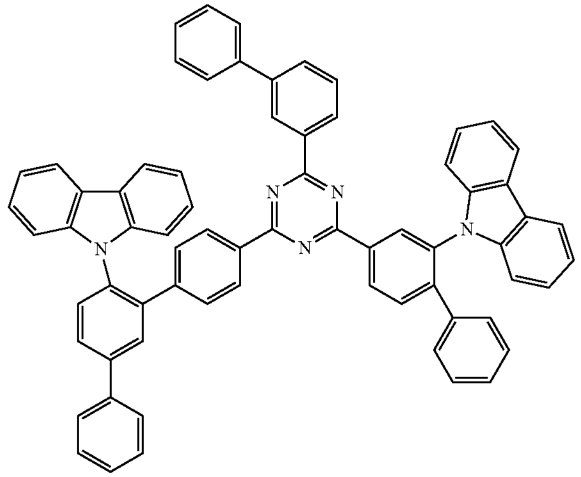
97
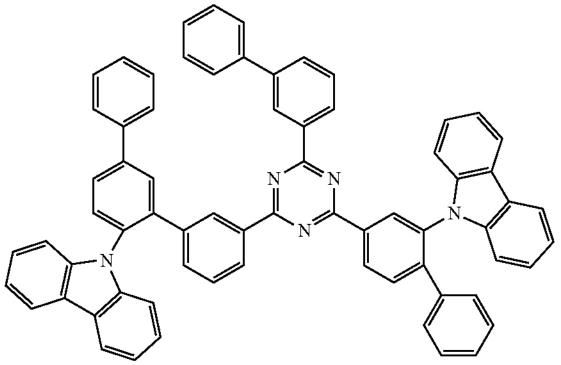
98
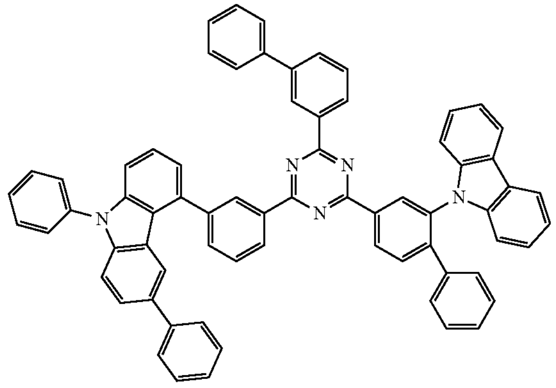
99
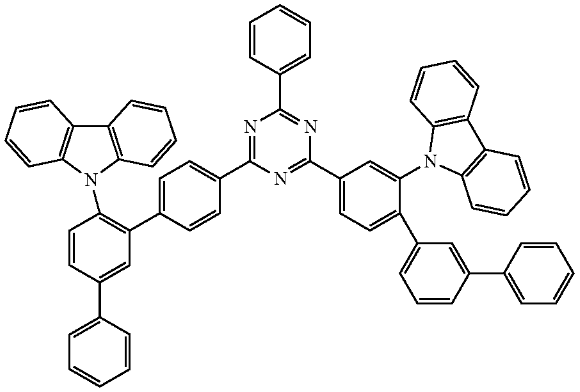

-continued
100
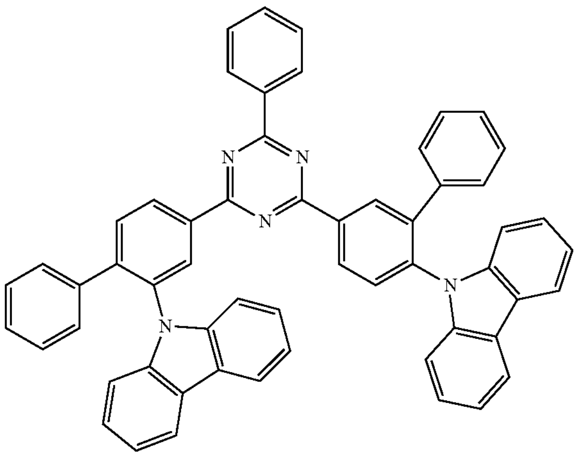
101
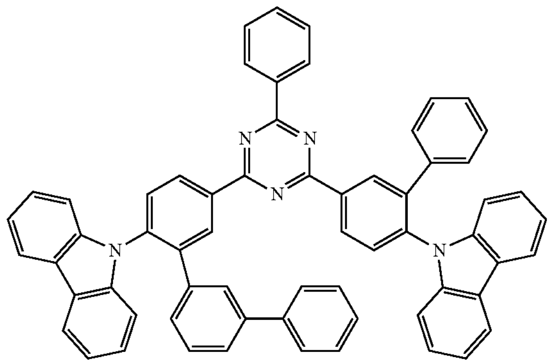
102
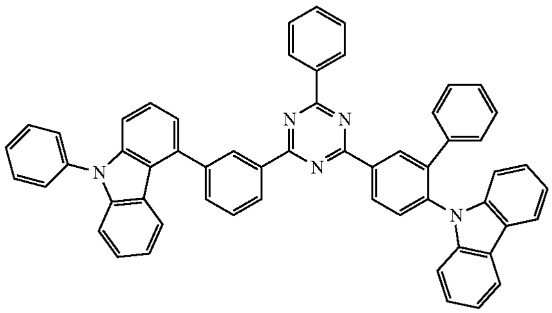
103
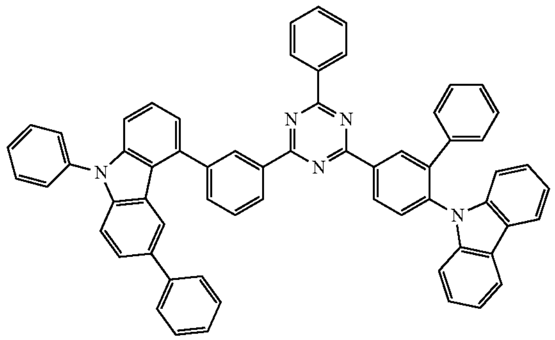
104
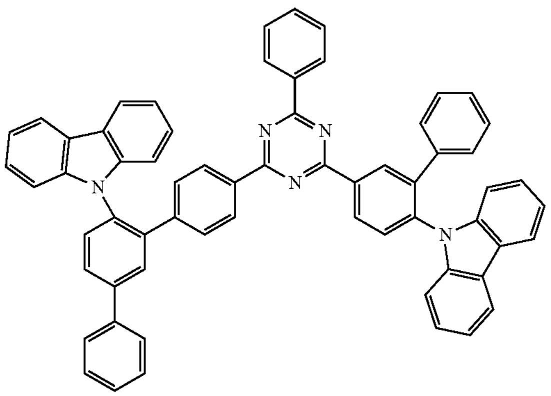
105
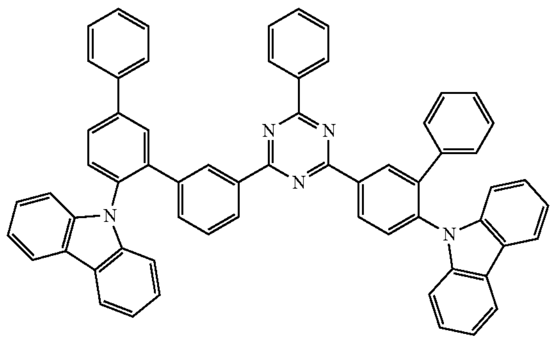
106
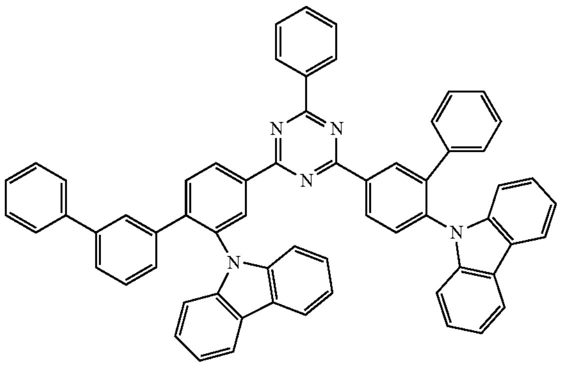
107
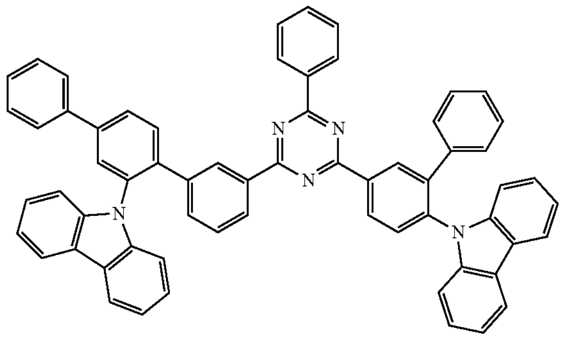

-continued
108
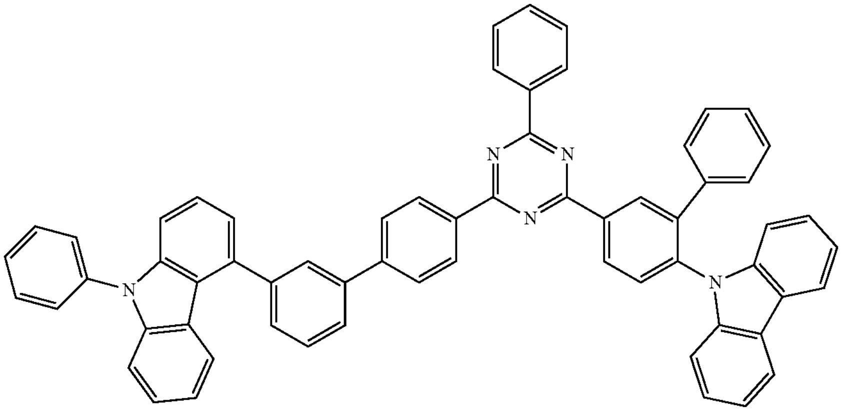
109
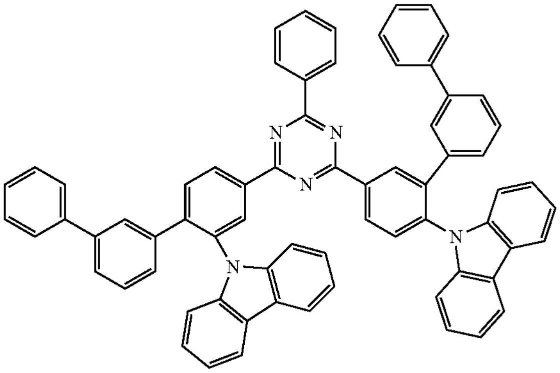
110
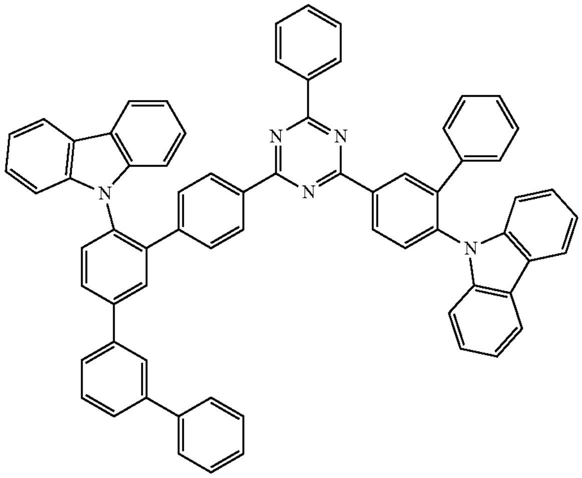
111
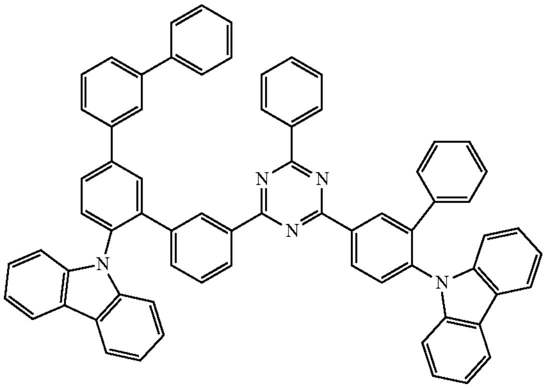
112
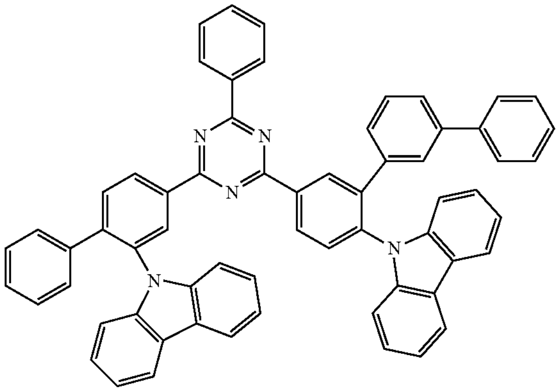

-continued
113
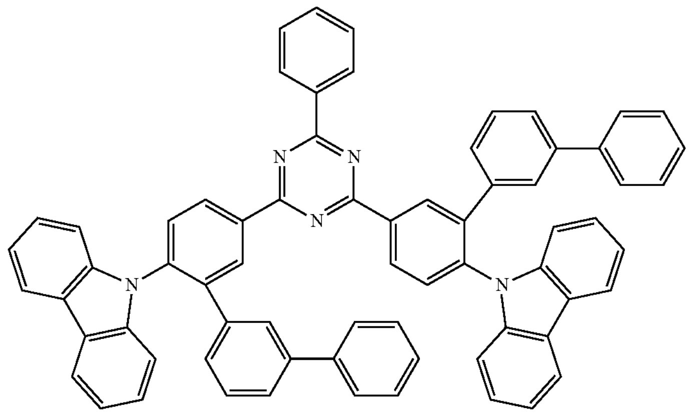
114
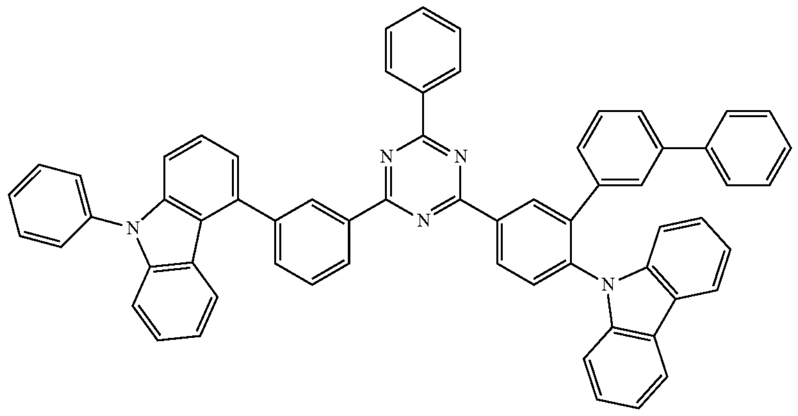
115
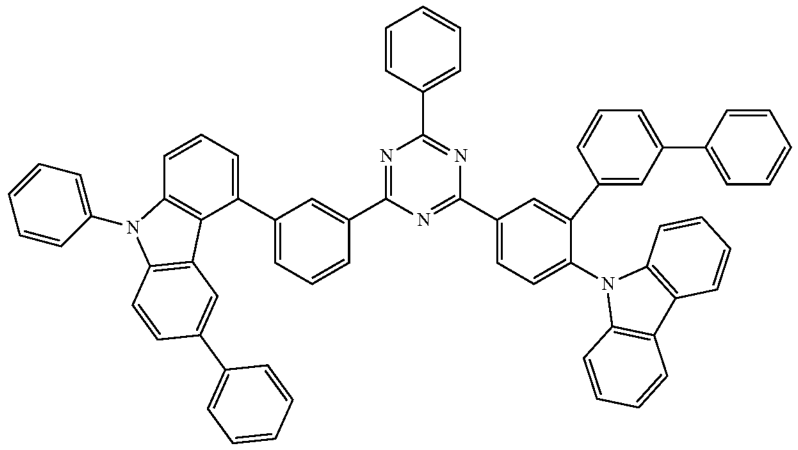

-continued
116
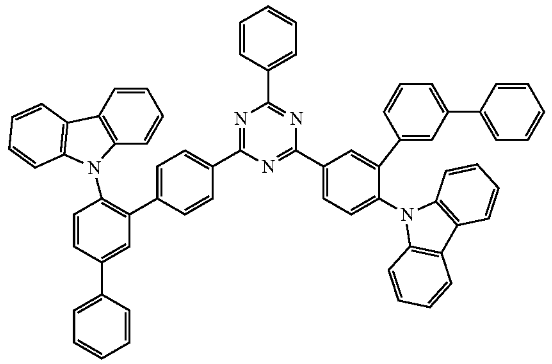
117
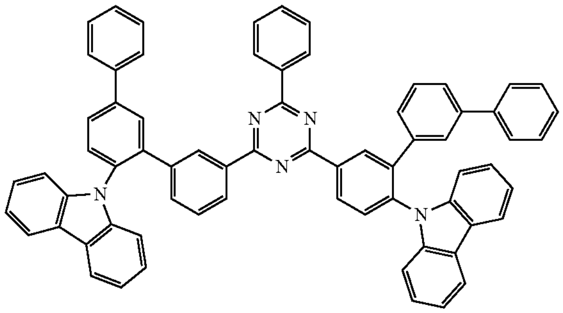
118
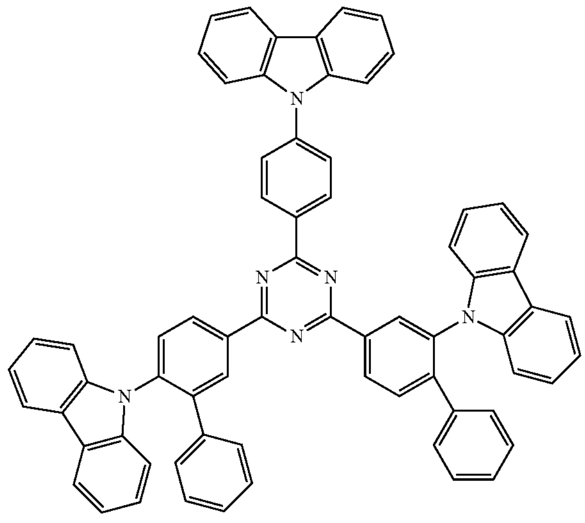
119
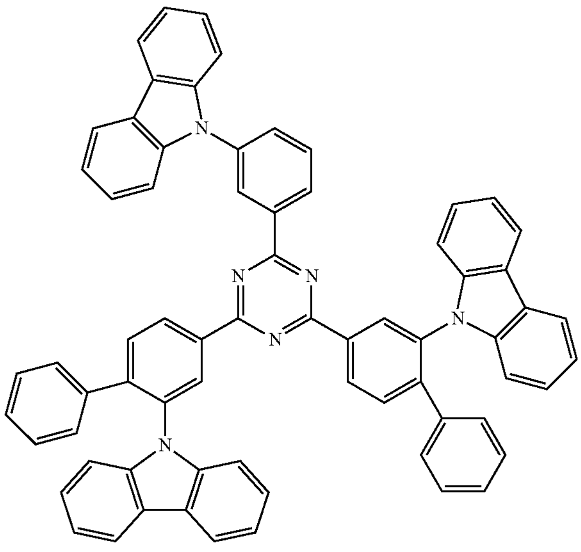

-continued
120
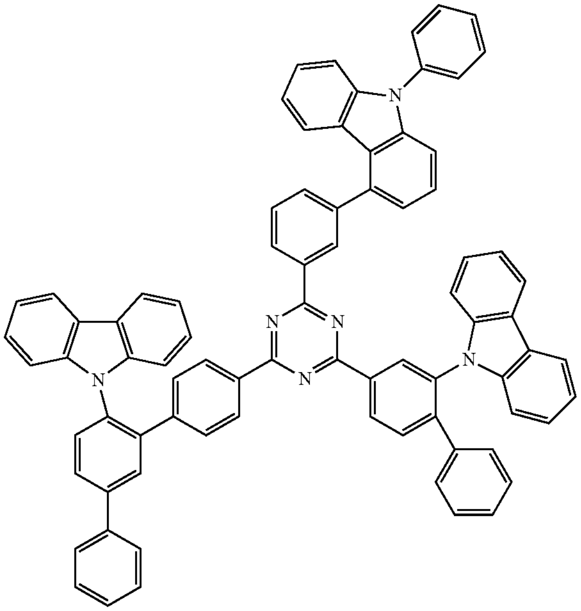
121
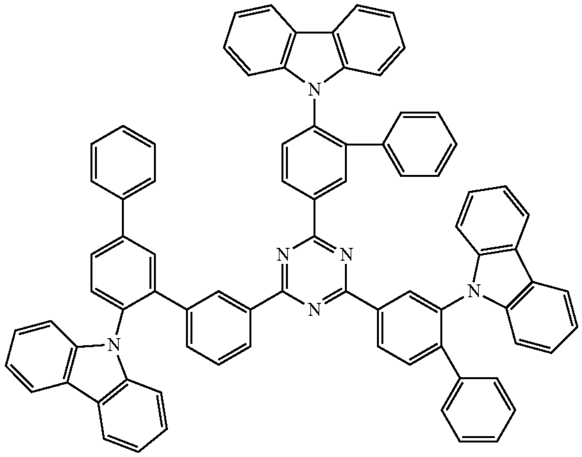
122
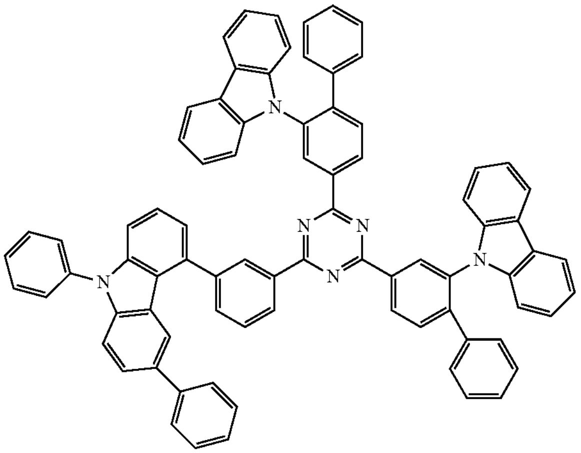
123
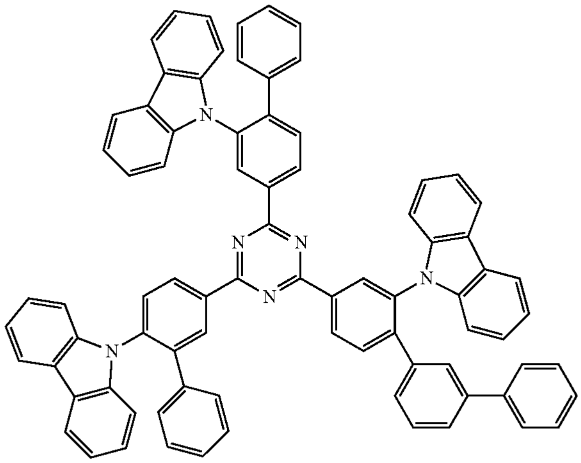

-continued
124
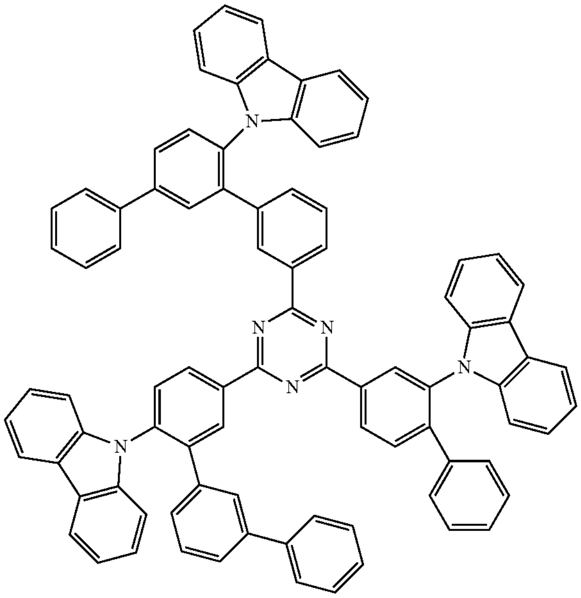
125
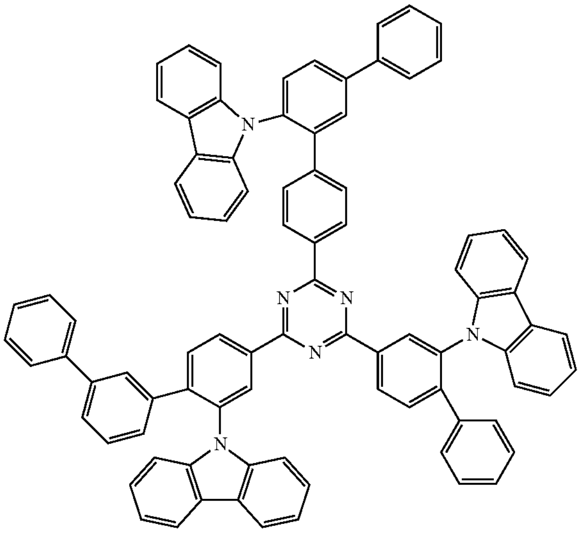
126
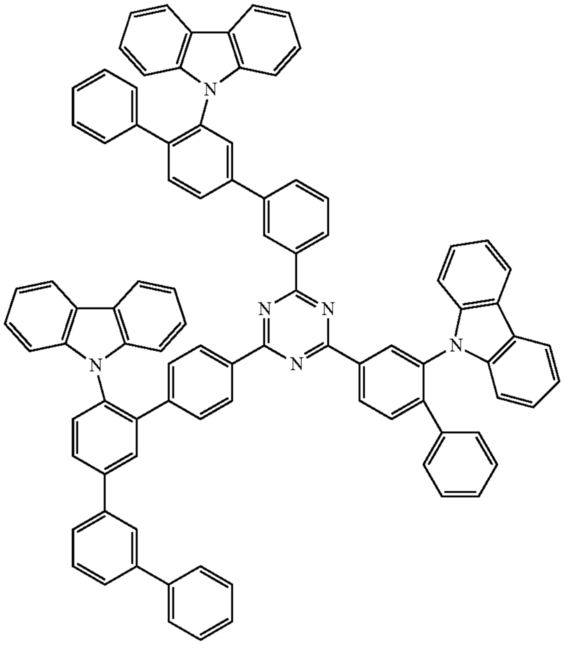
127
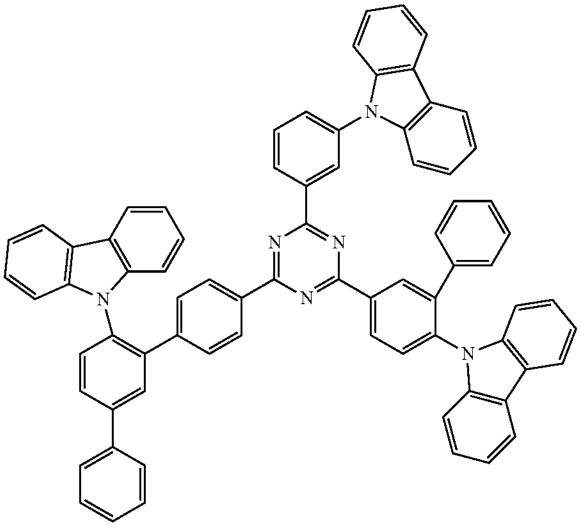

-continued
128
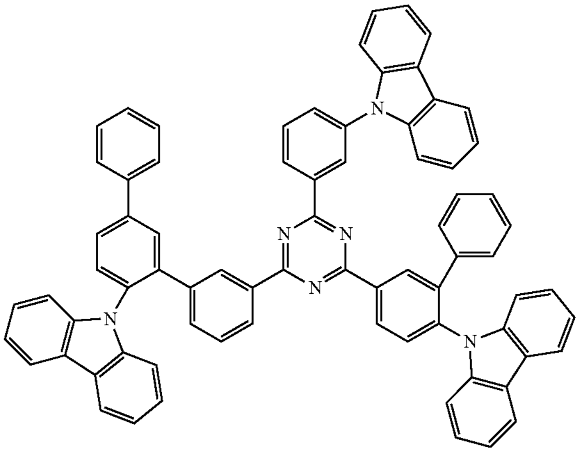
129
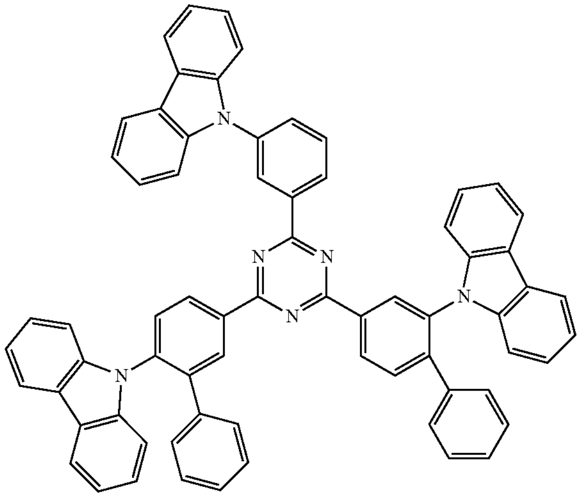
140
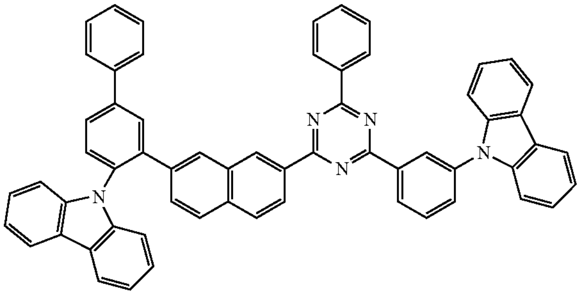
141
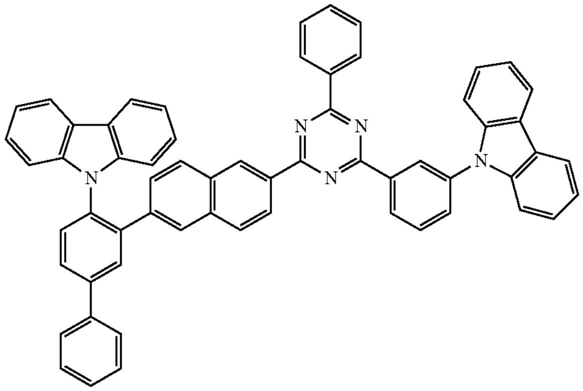
142
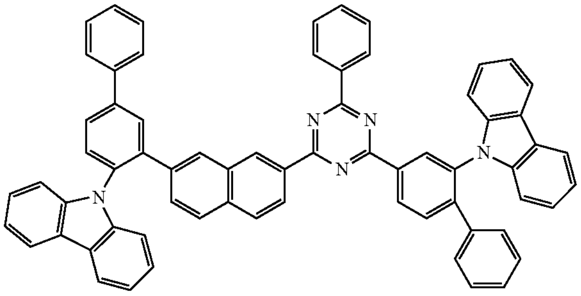
143
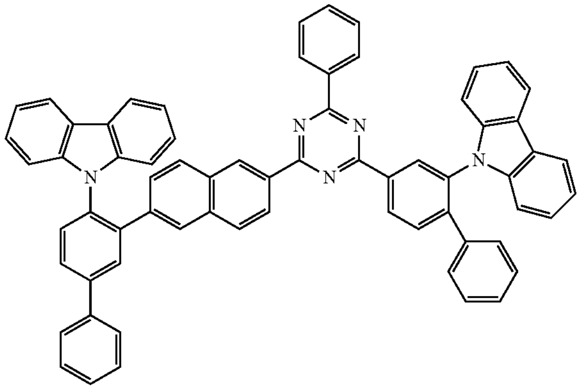

-continued
144
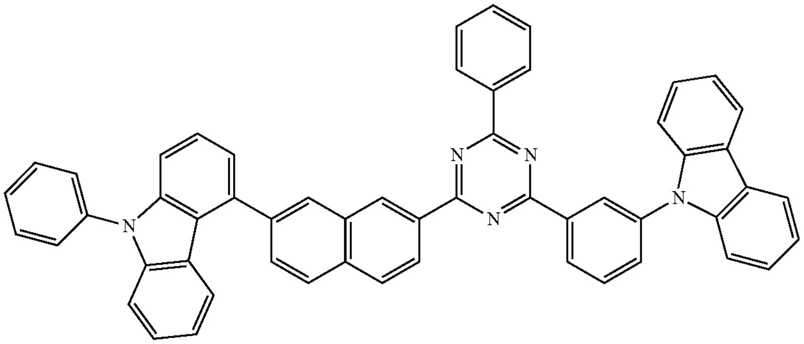
145
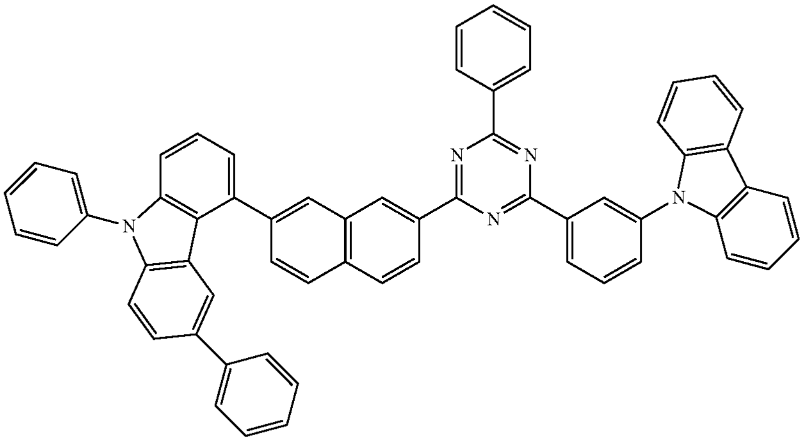
146
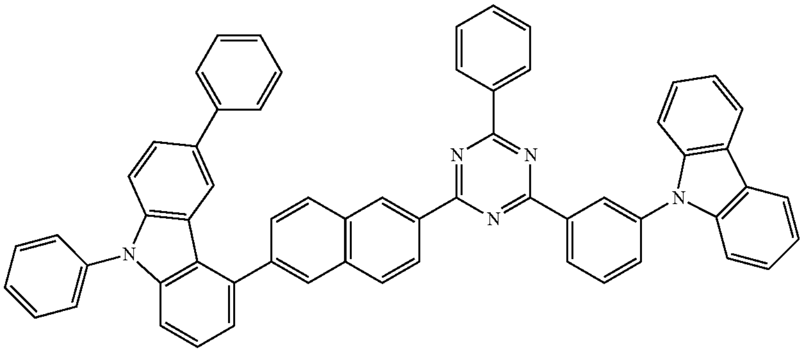
147
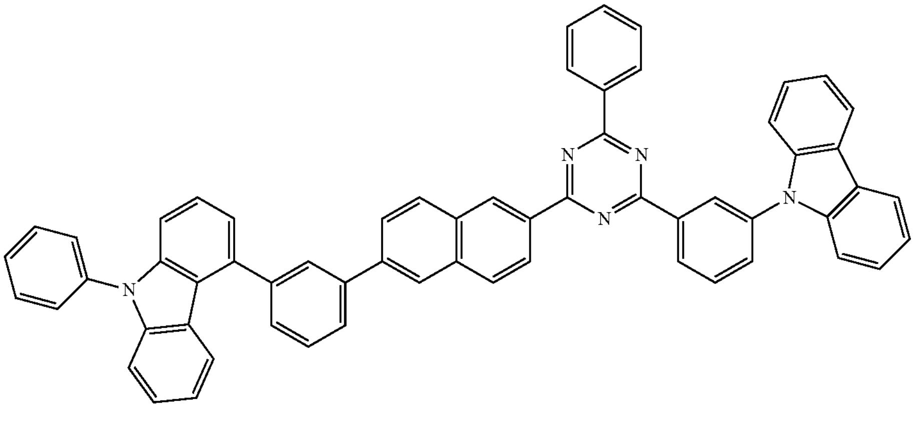

-continued
148
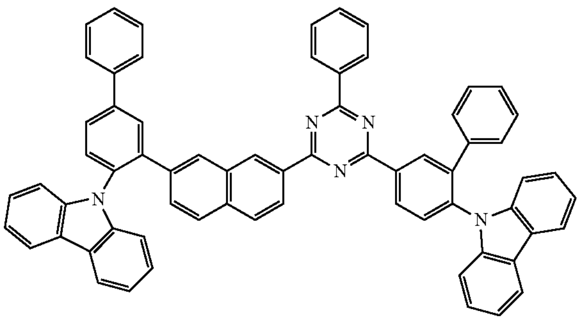
149
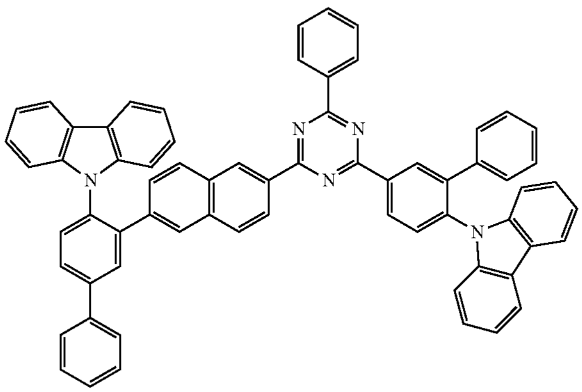
150
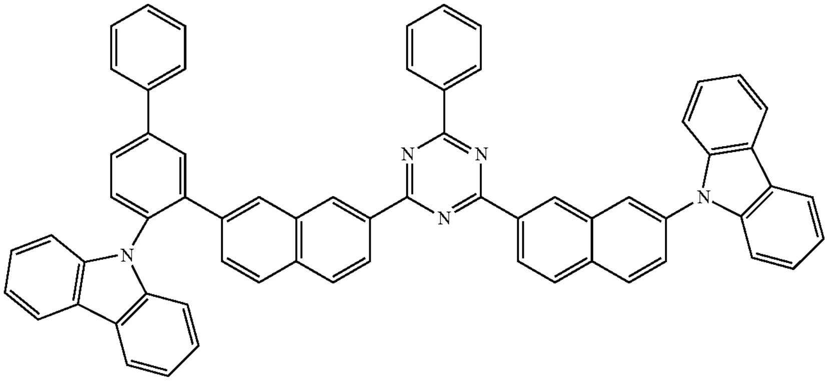
151
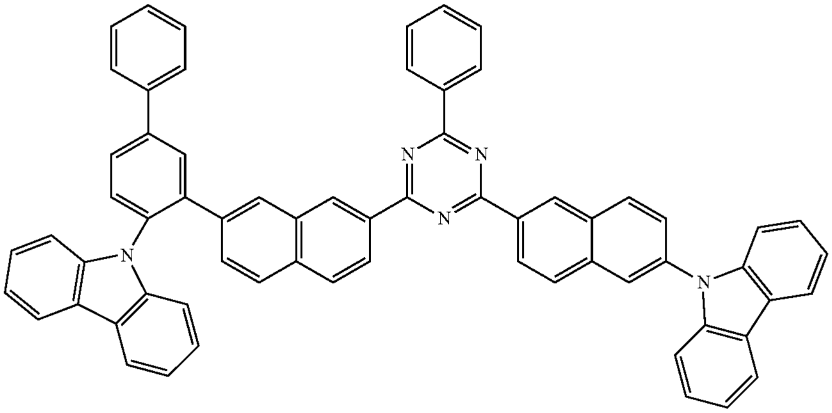

-continued
152
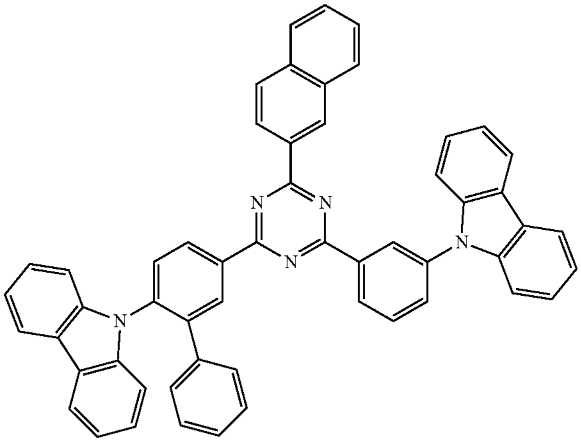
153
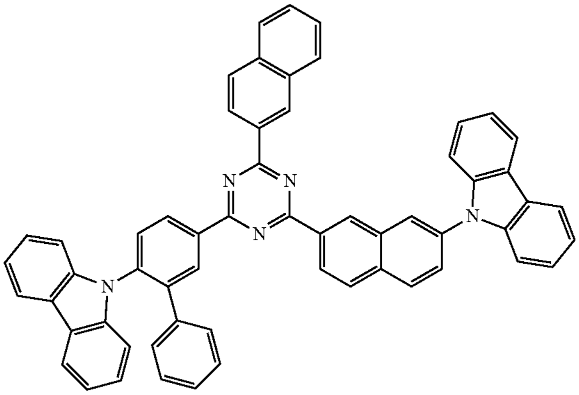
154
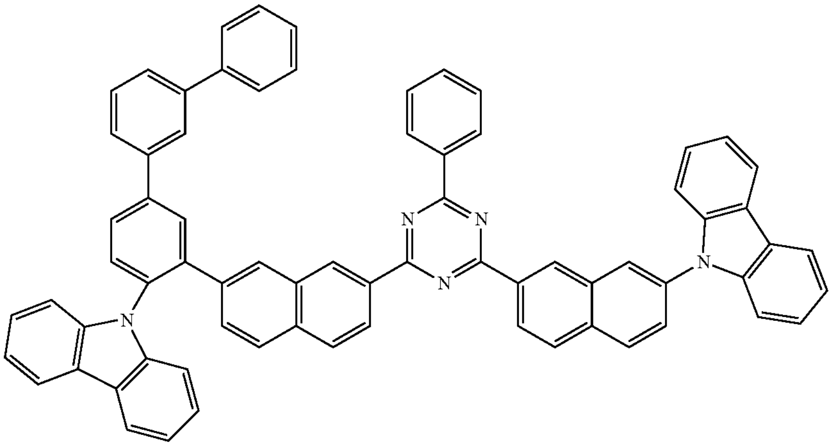
155
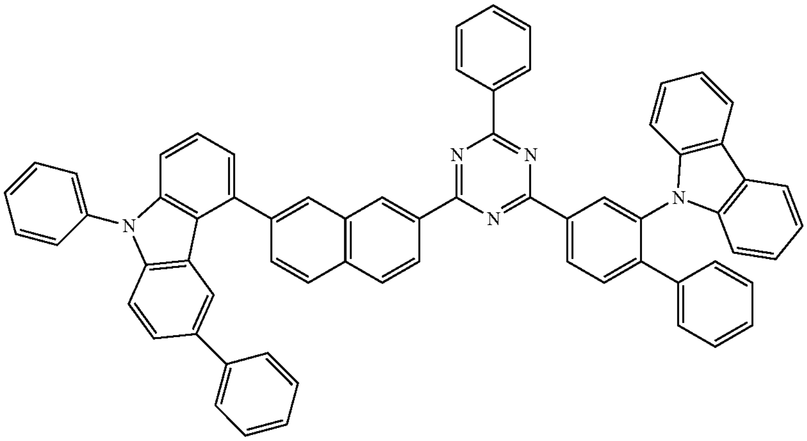

-continued
156
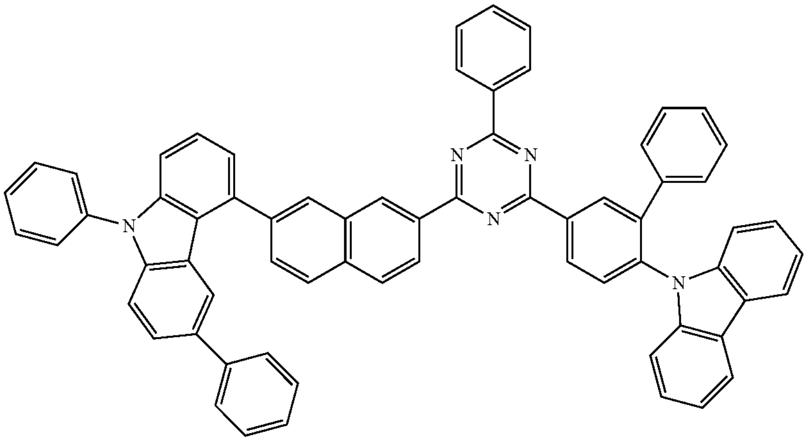
157
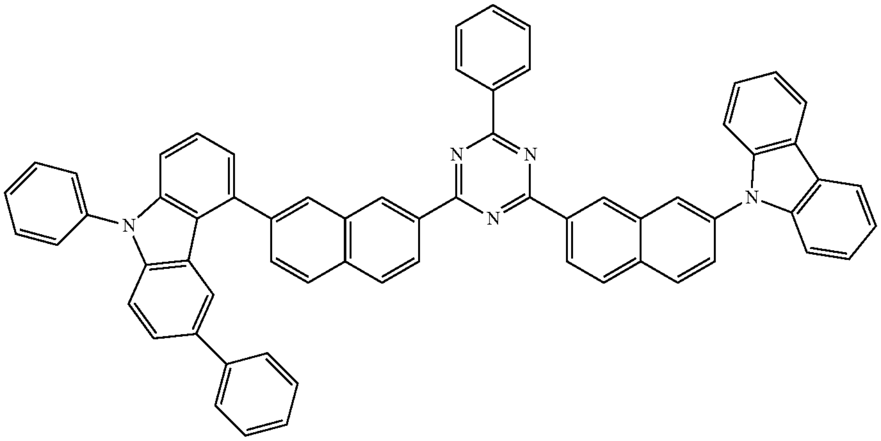
158
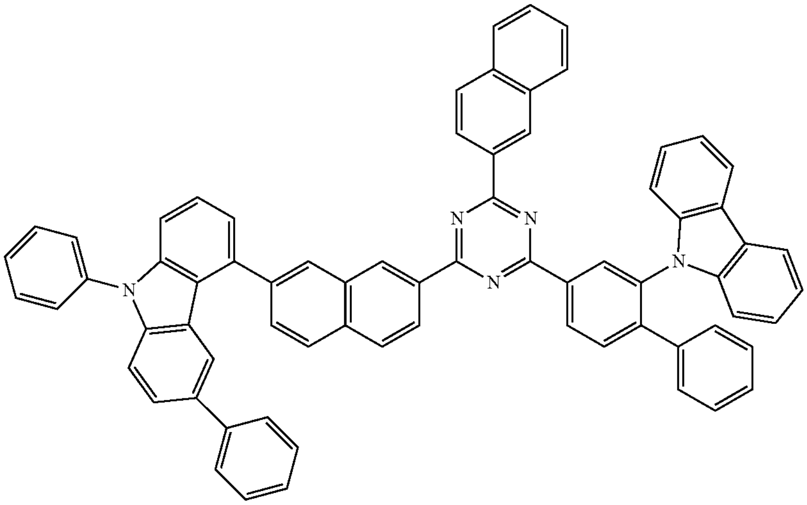

-continued
159
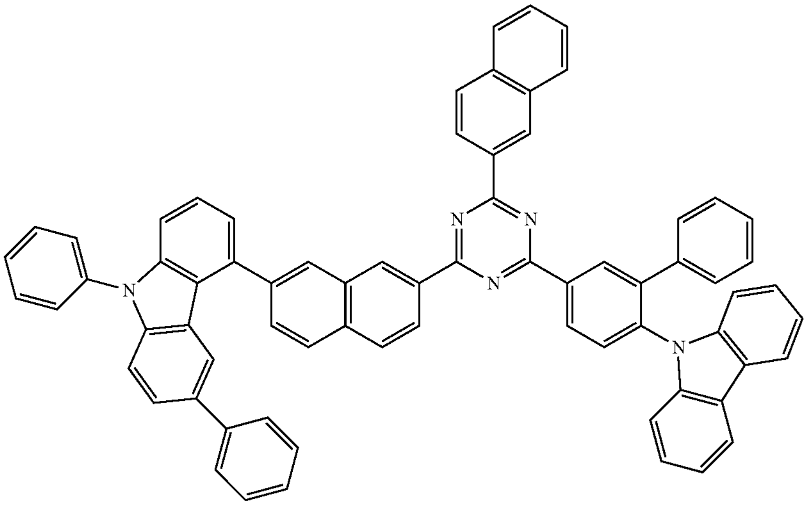
160
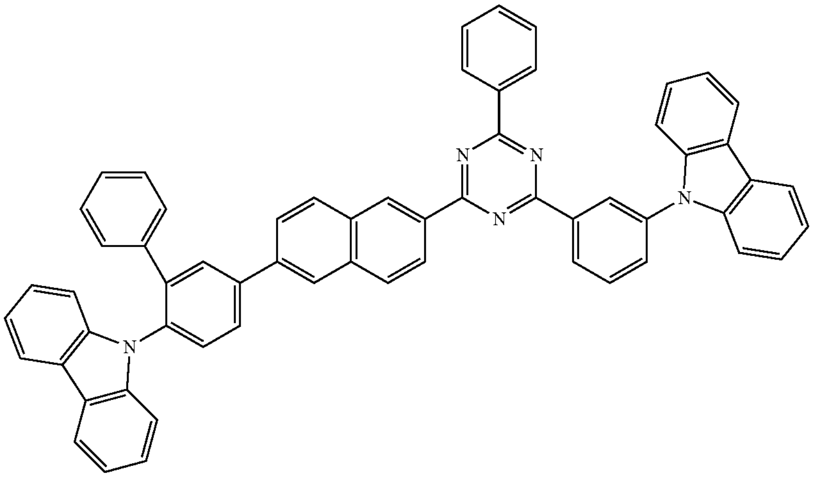
161
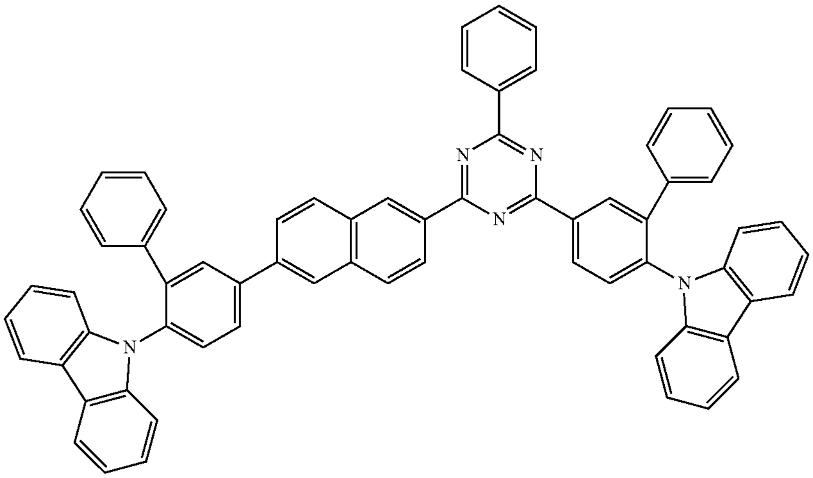

-continued
162
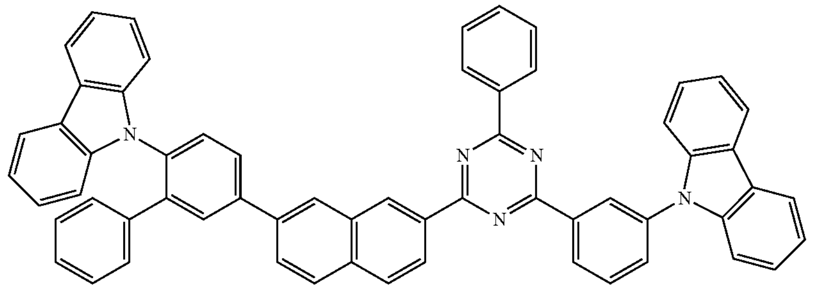
163
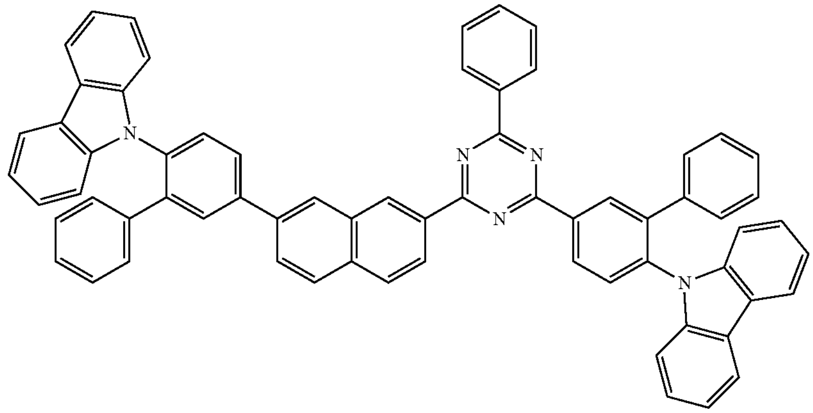
164
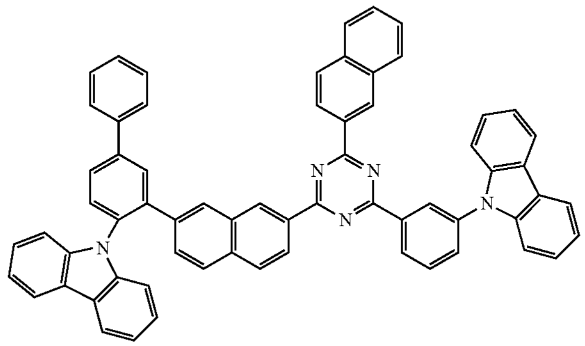
165
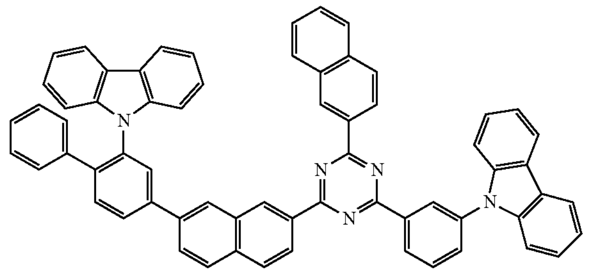
166
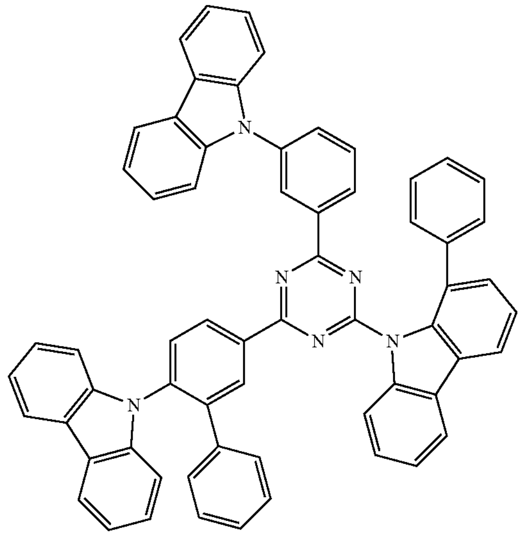
167
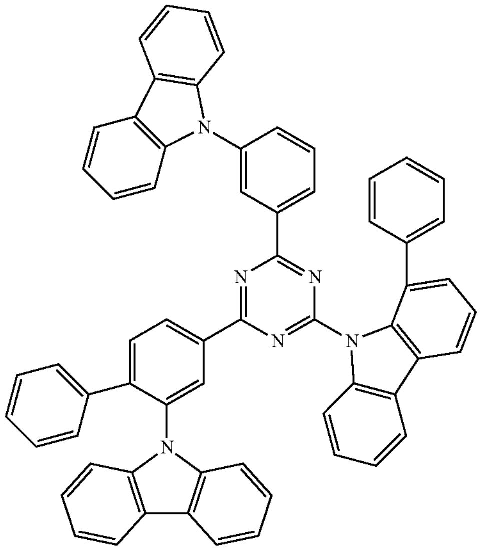

-continued
168
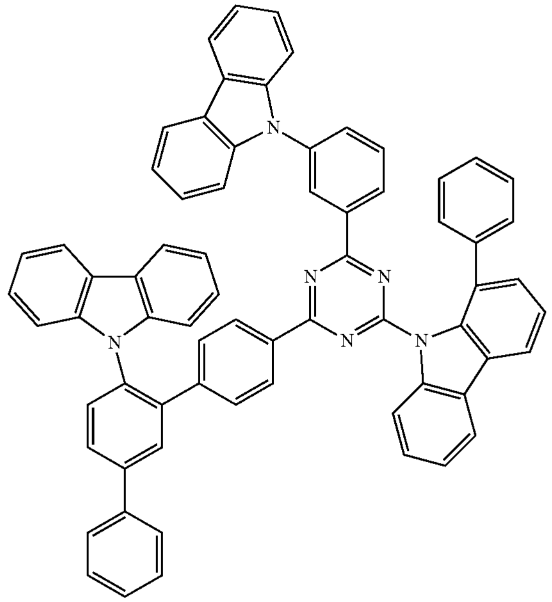
169
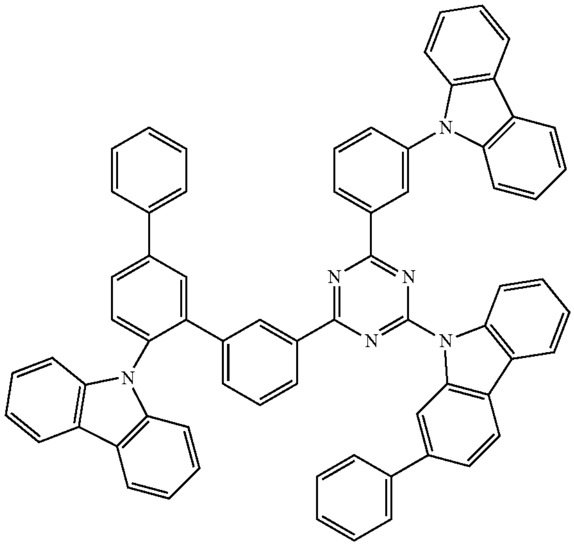
170
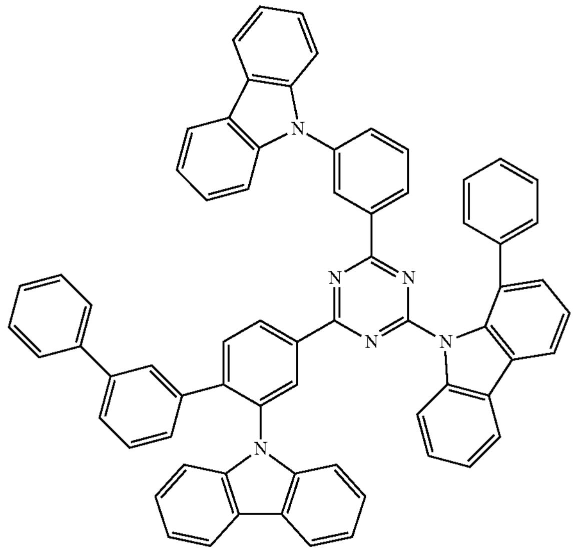
171
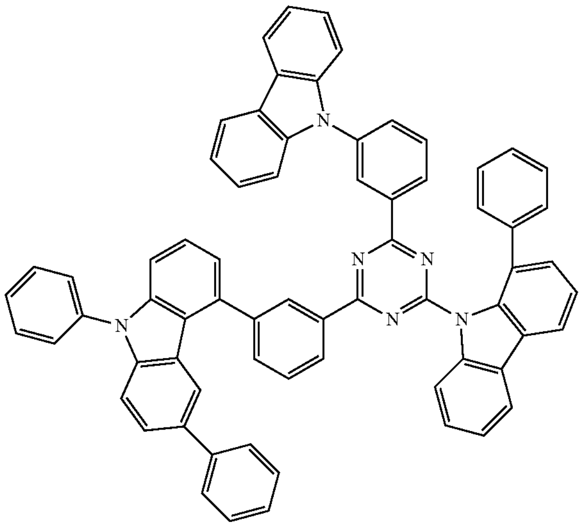

-continued
172
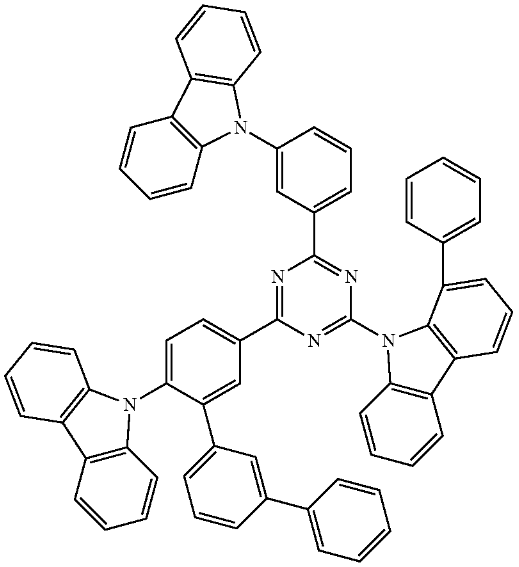
173
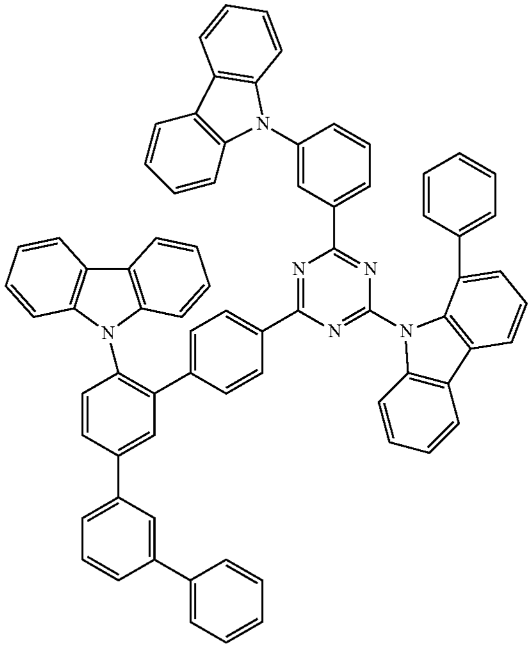
174
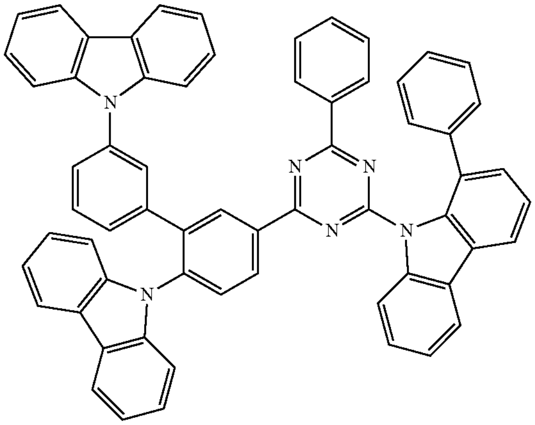
175
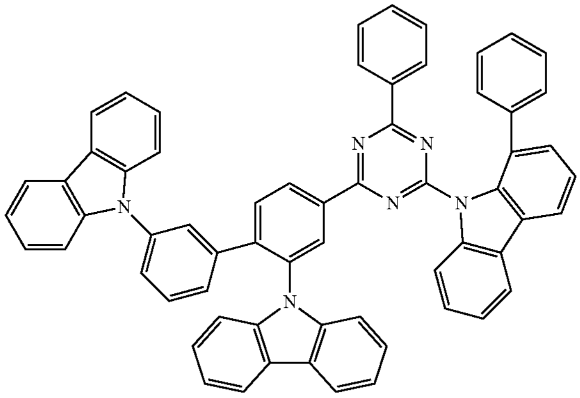

-continued
176
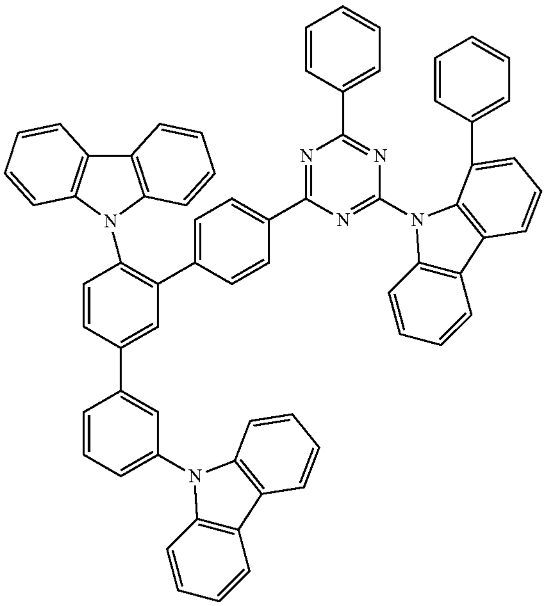
177
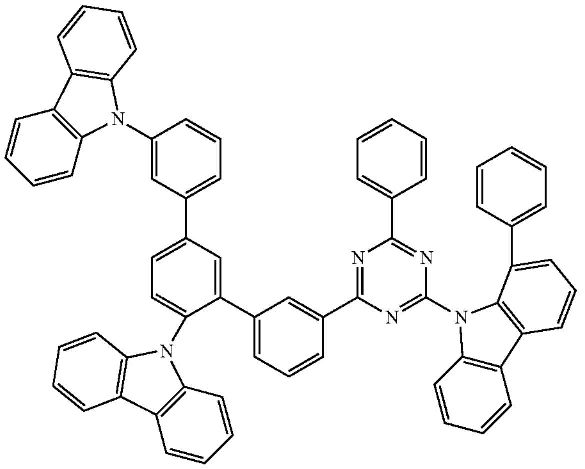
178
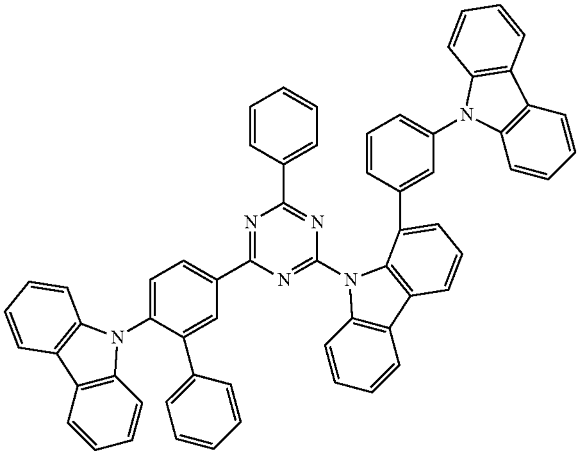
179
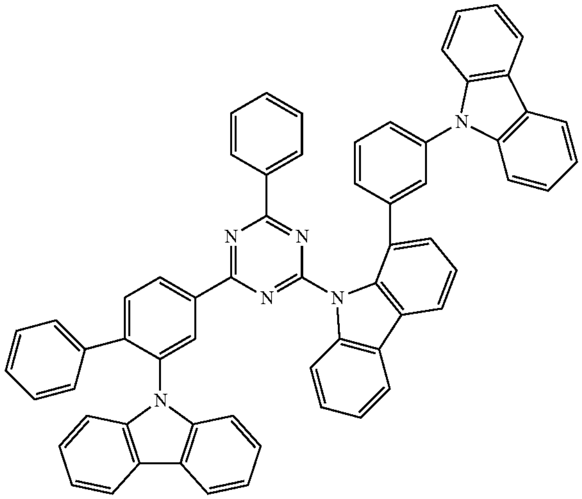
180
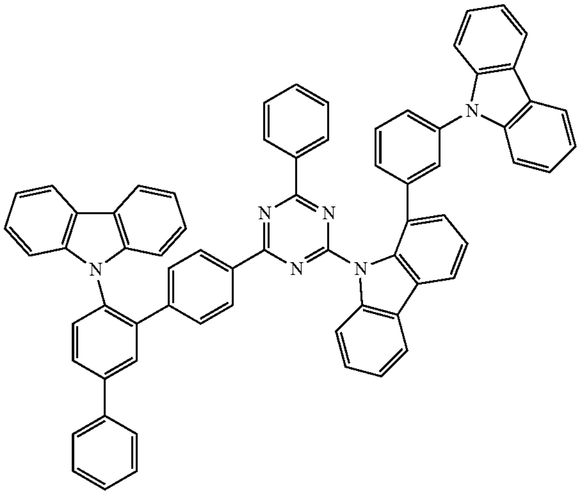
181
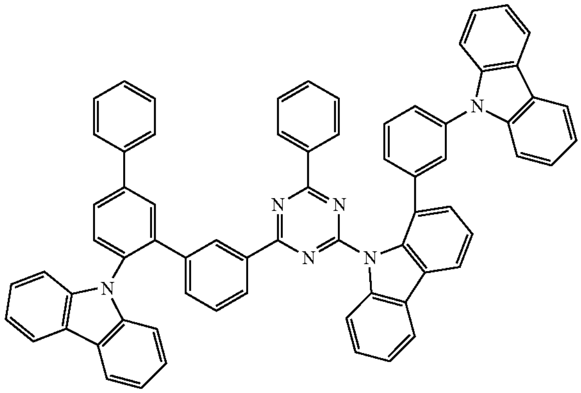

-continued
182
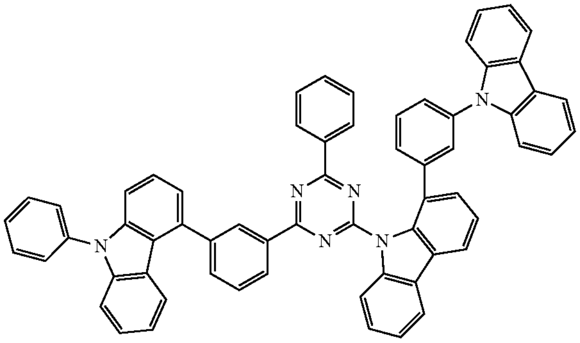
183
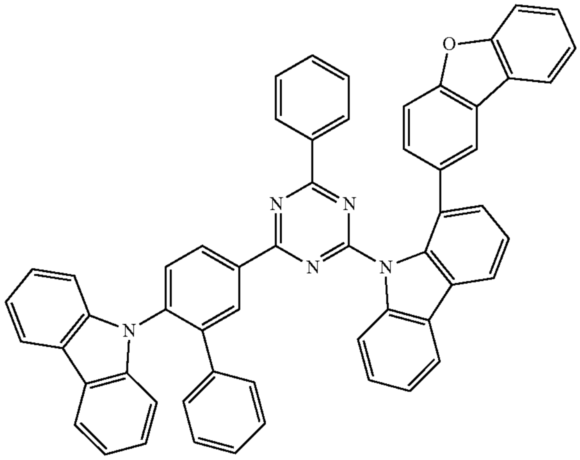
184
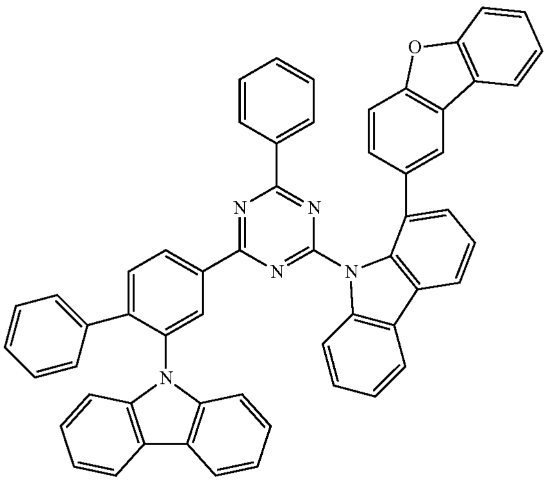
185
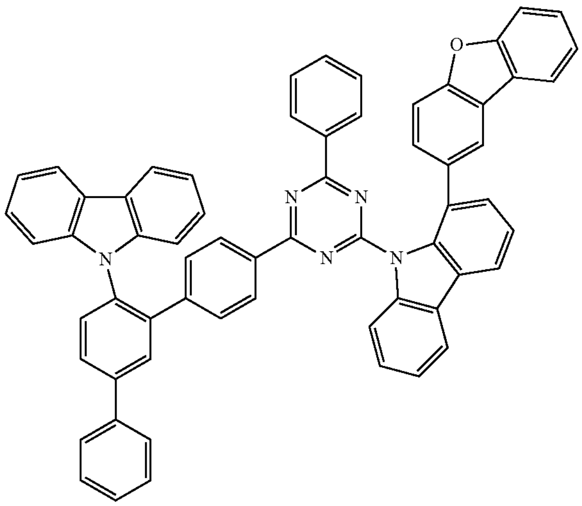
186
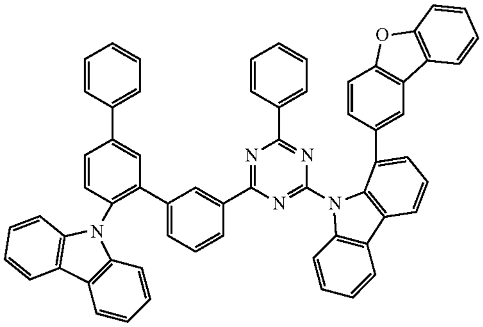
187
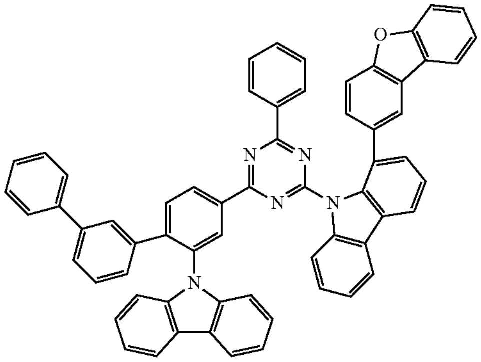

-continued
188
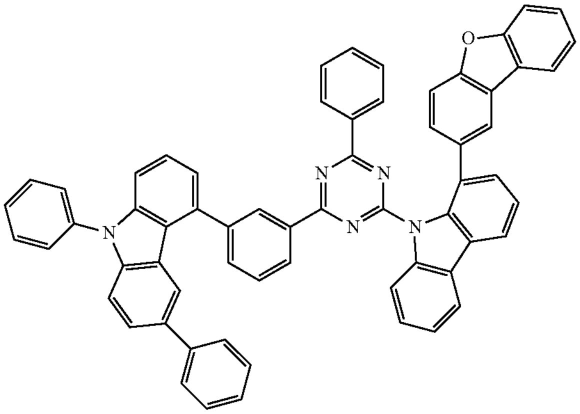
189
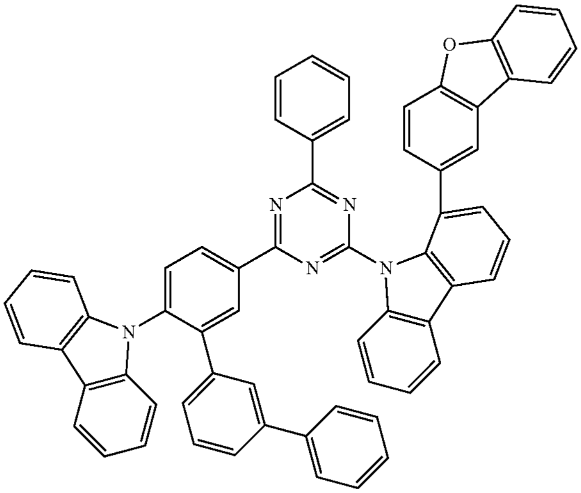
190
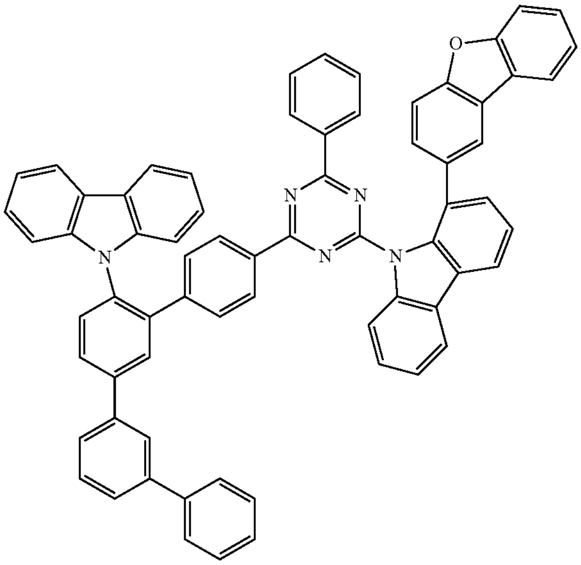
191
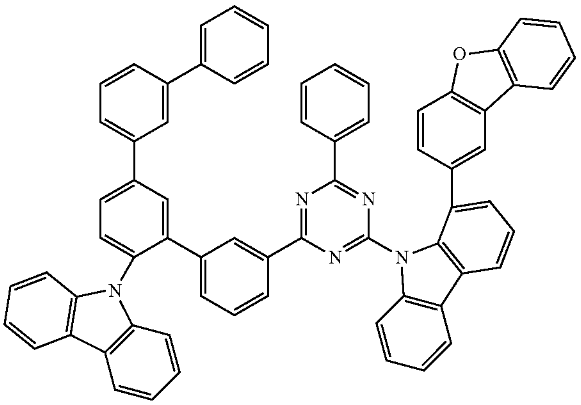

-continued
192
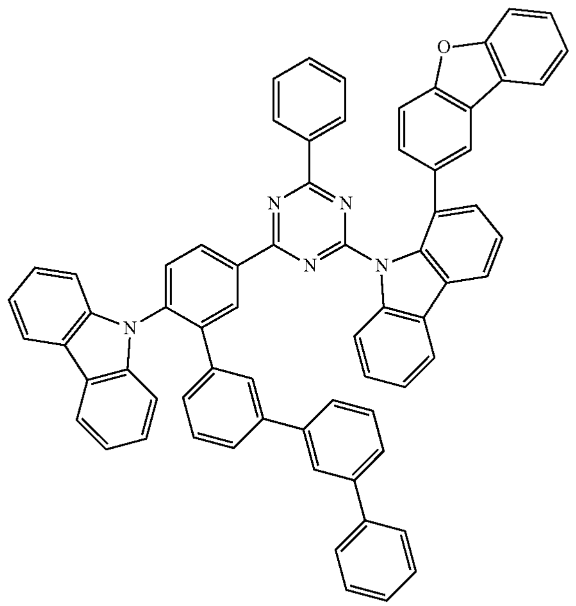
193
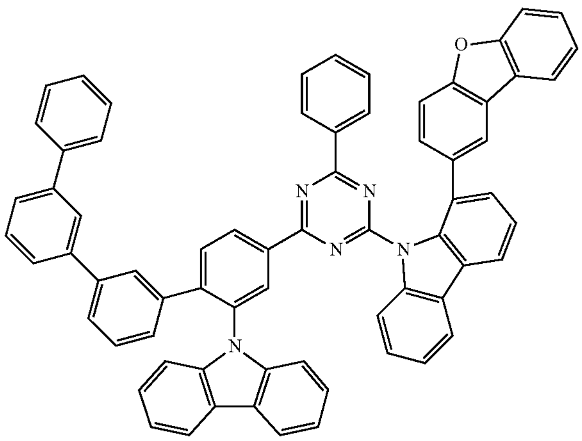
194
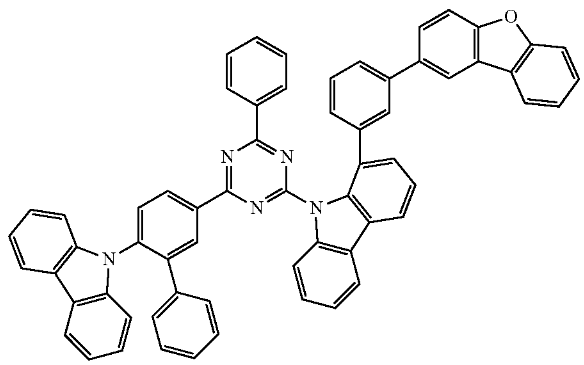
195
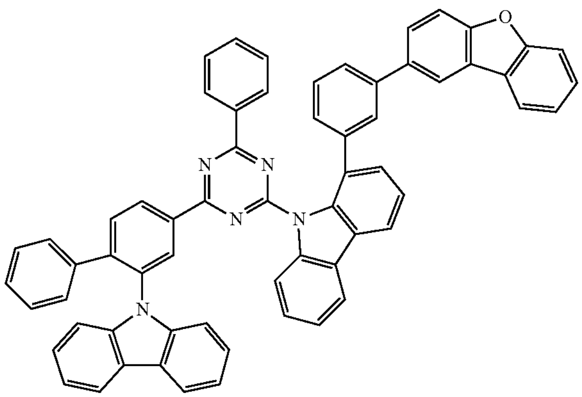

-continued
196
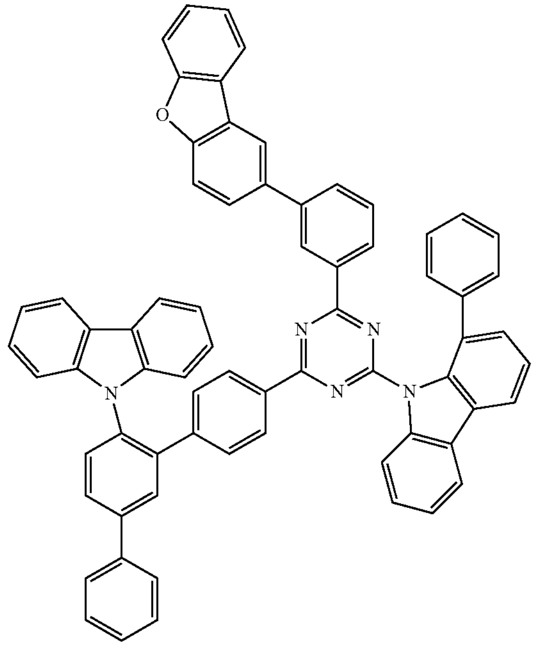
197
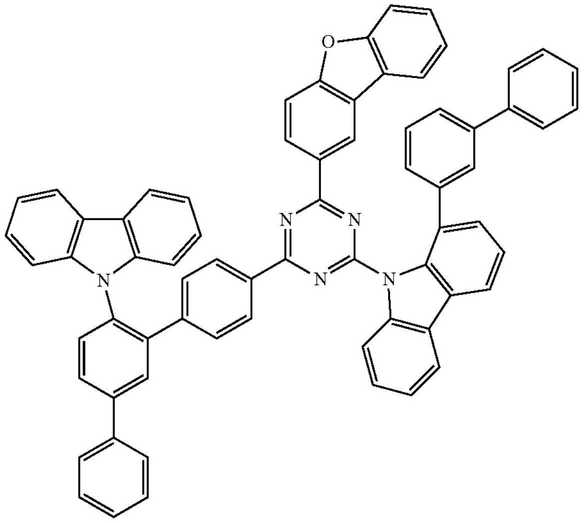
198
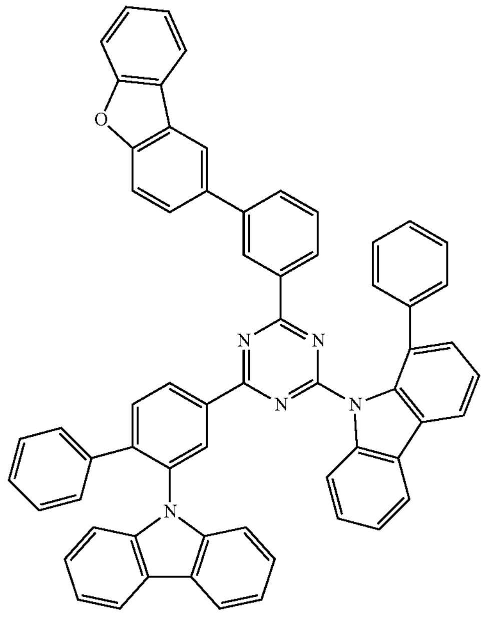
199
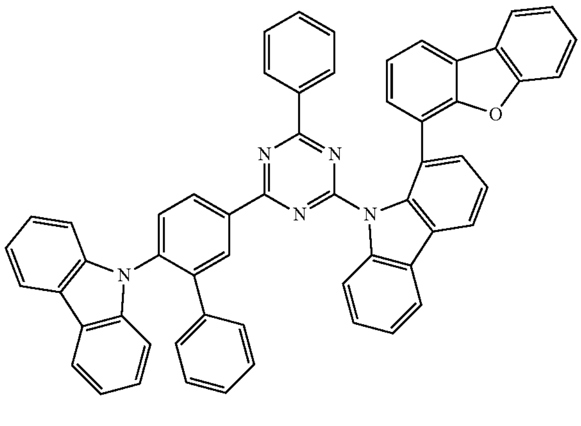

-continued
200
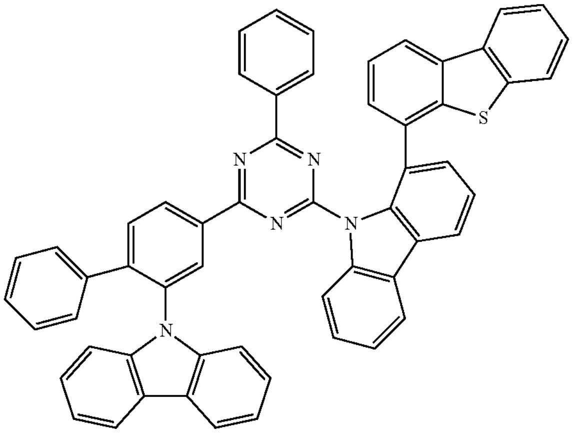
201
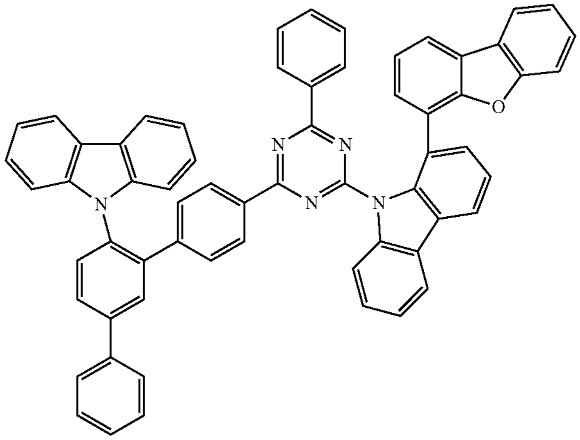
202
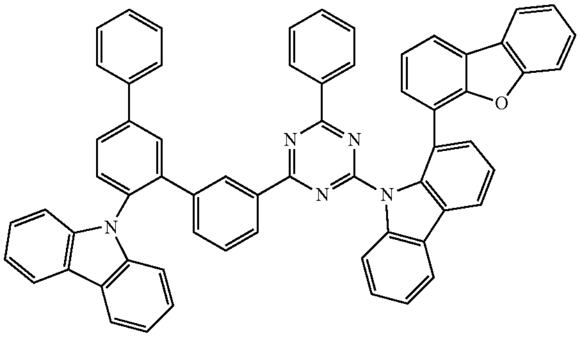
203
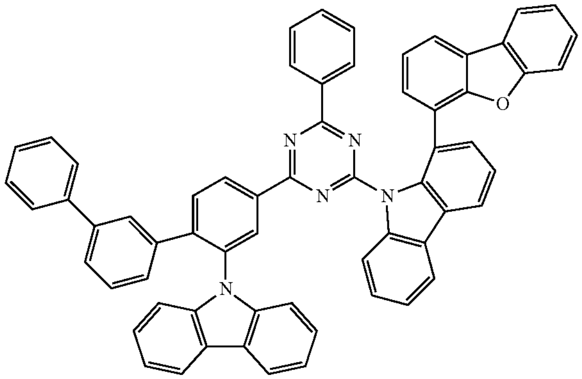
204
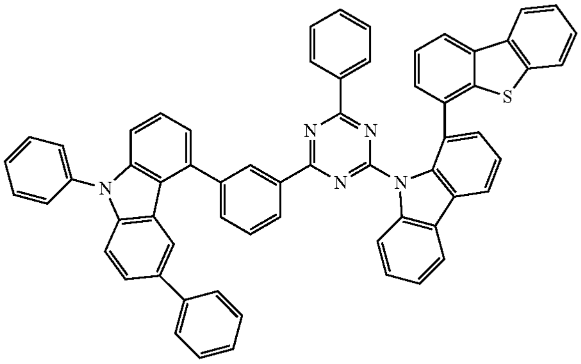
205
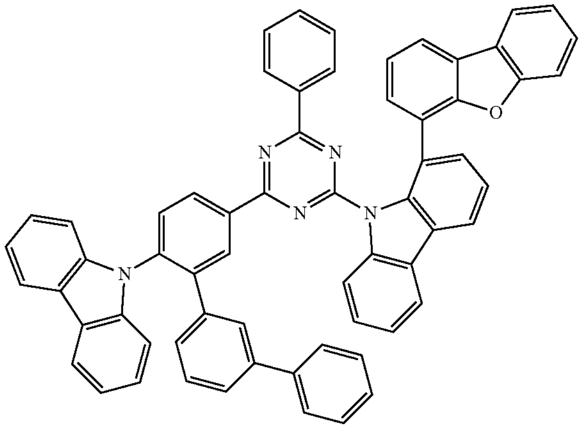

-continued
206
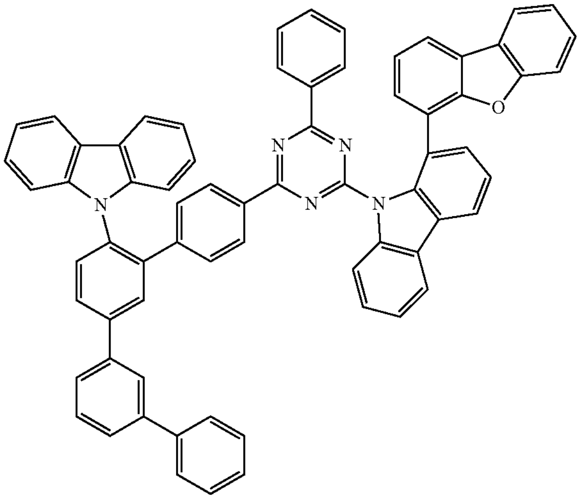
207
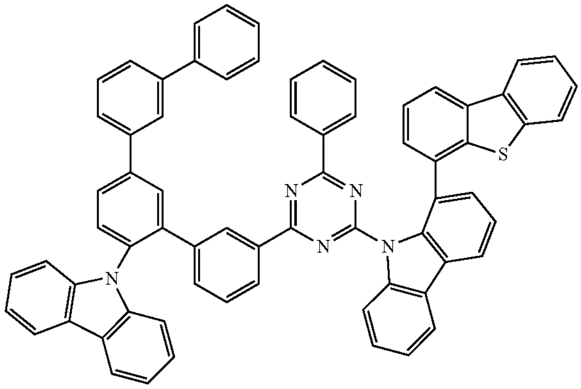
208
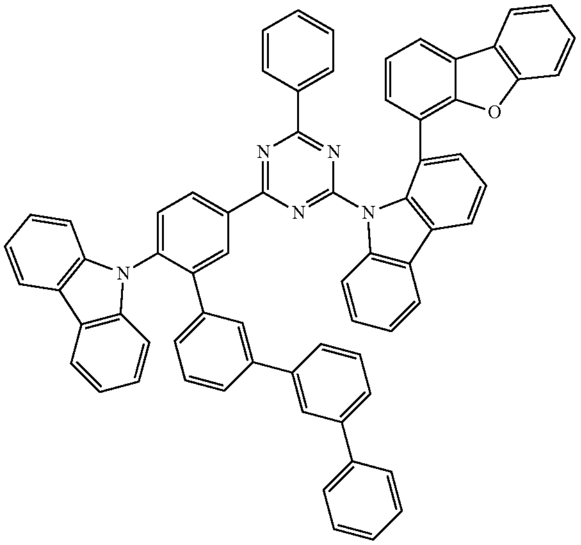
209
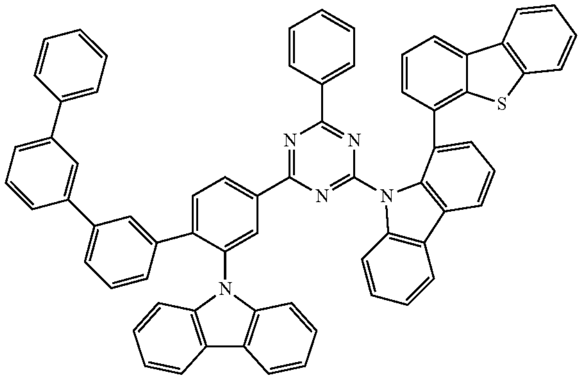
210
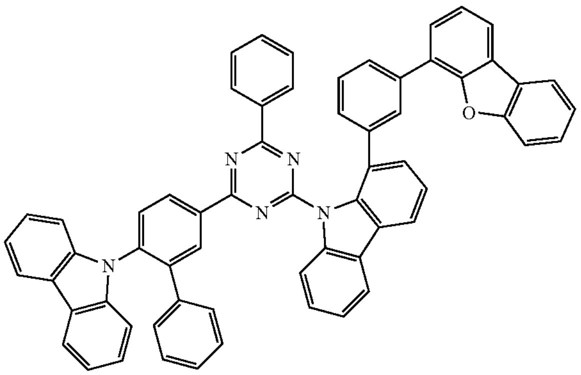
211
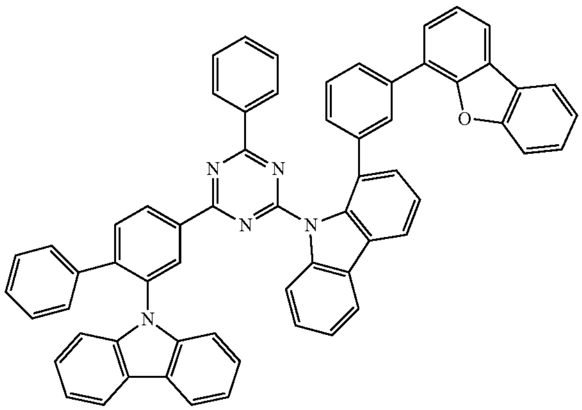

-continued
212
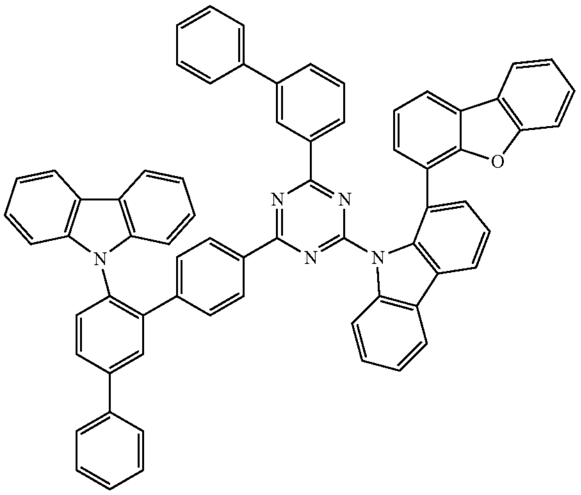
213
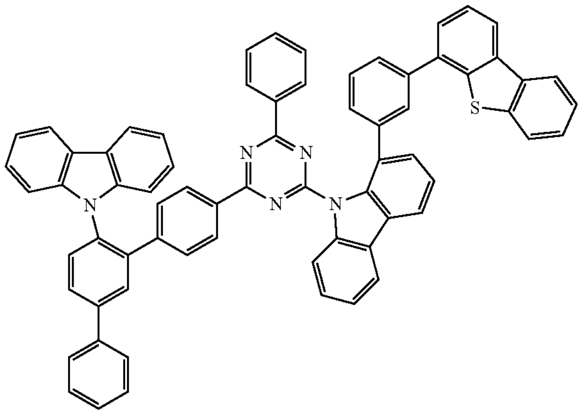
214
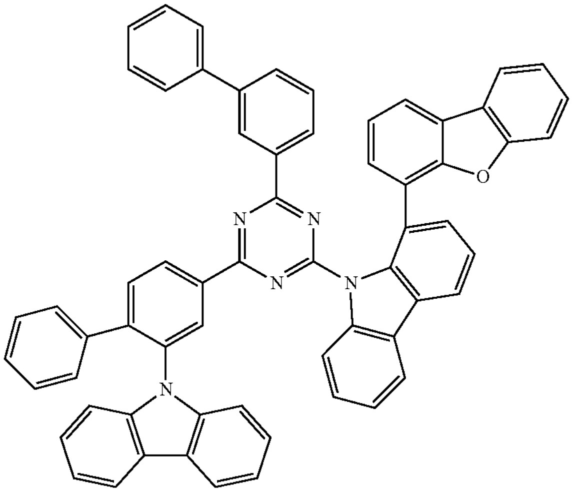
215
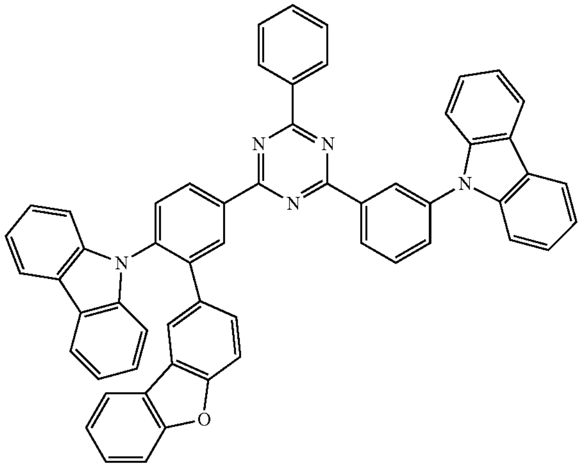
216
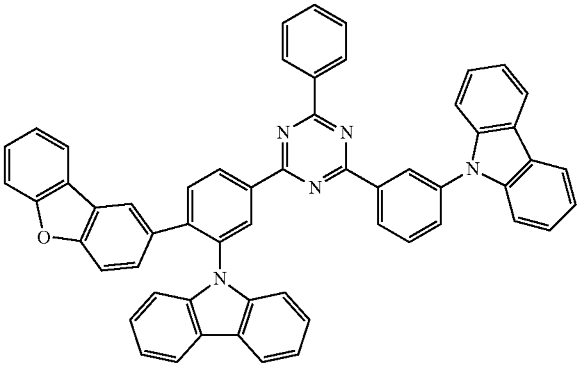
217
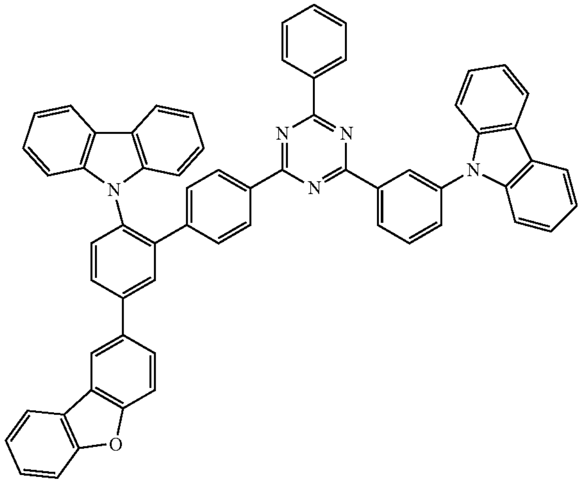

-continued
218
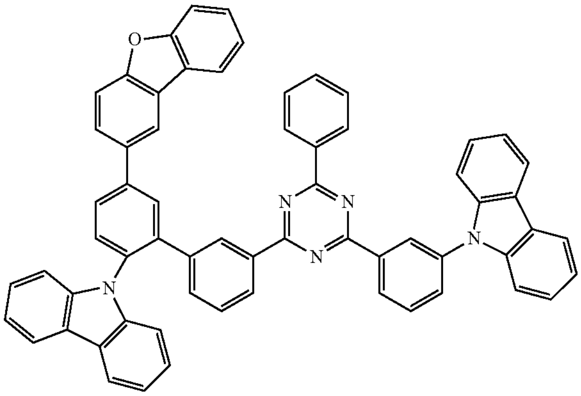
219
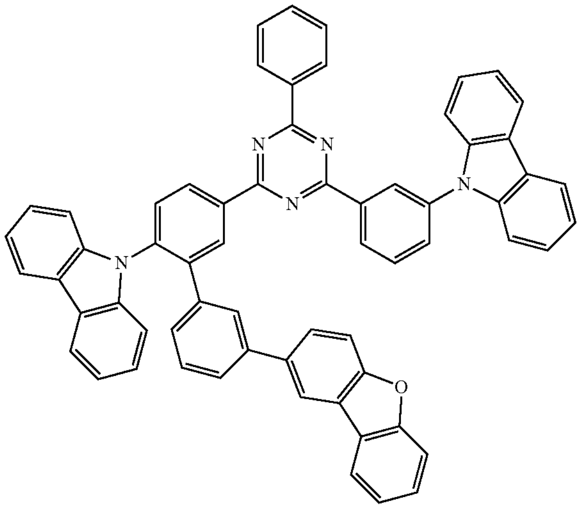
220
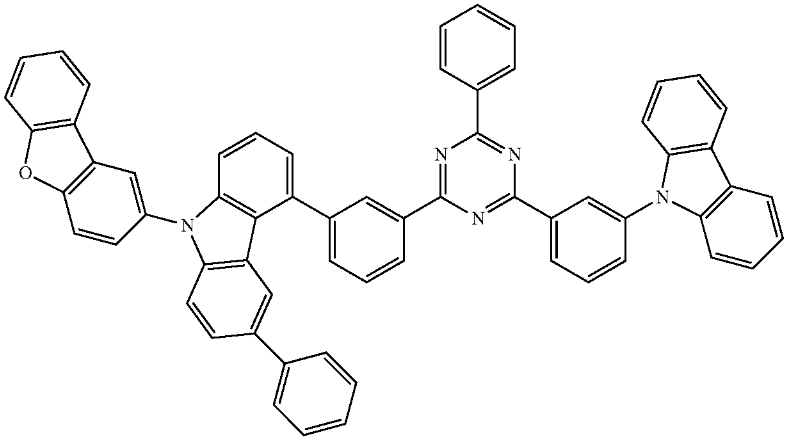
221
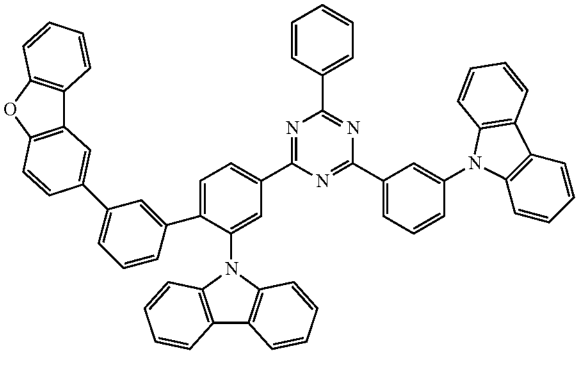
222
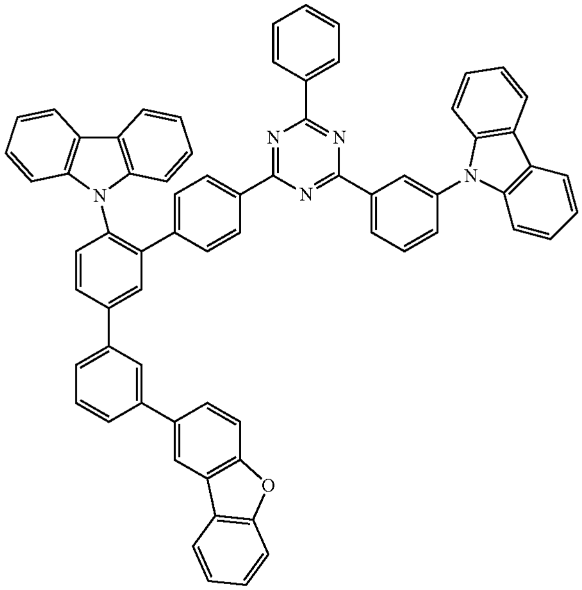

-continued
223
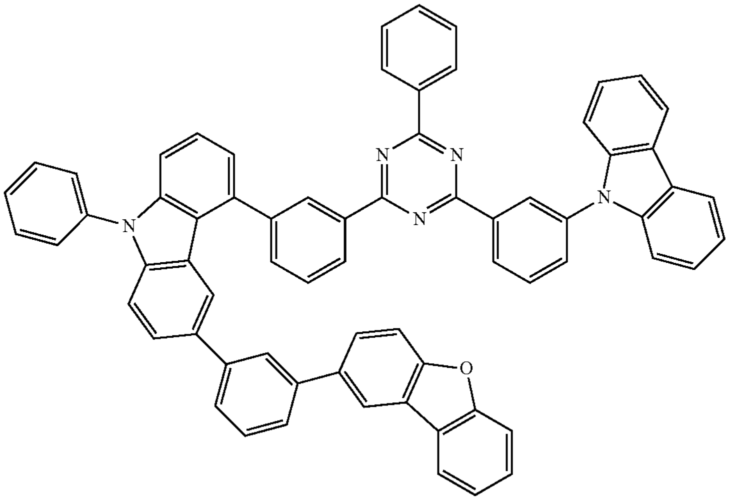
224
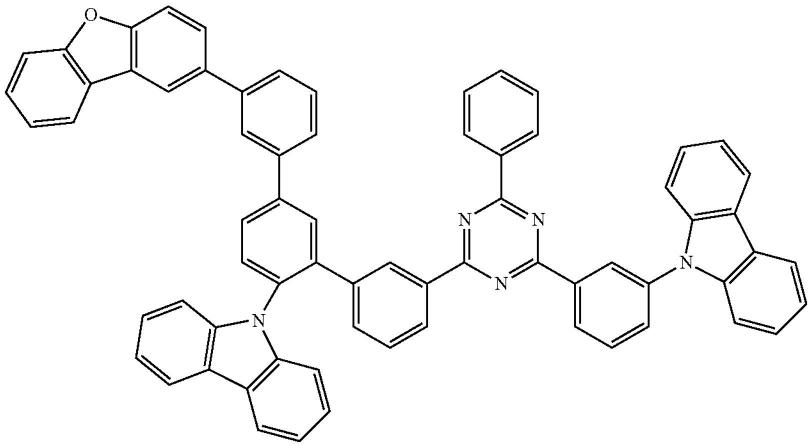
225
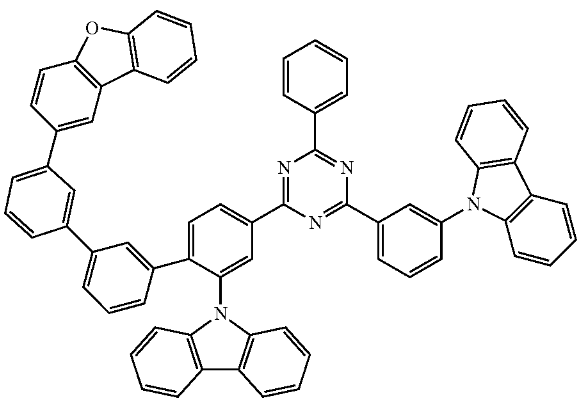
226
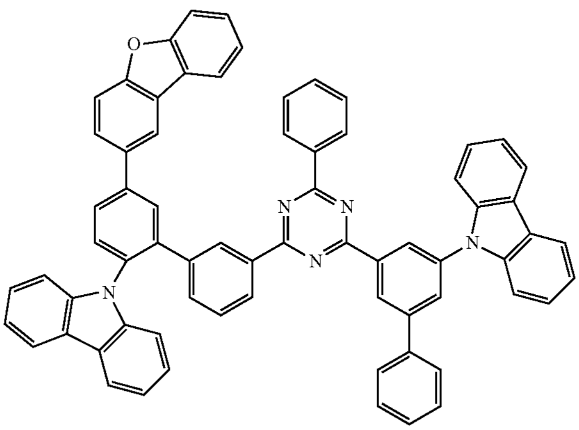

-continued
227
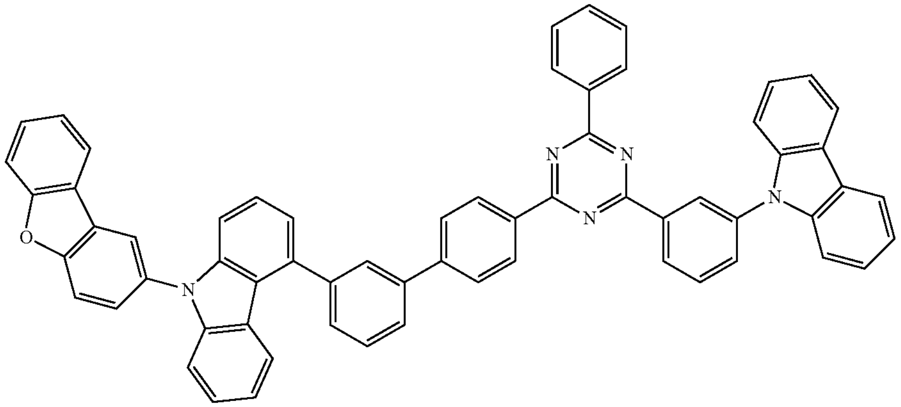
228
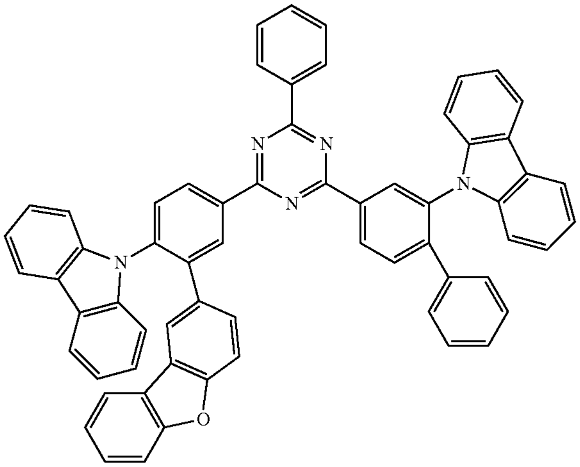
229
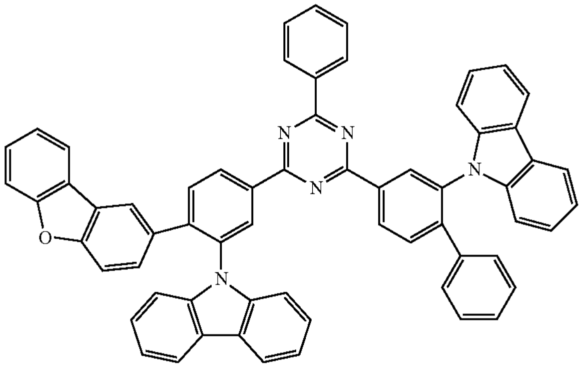
230
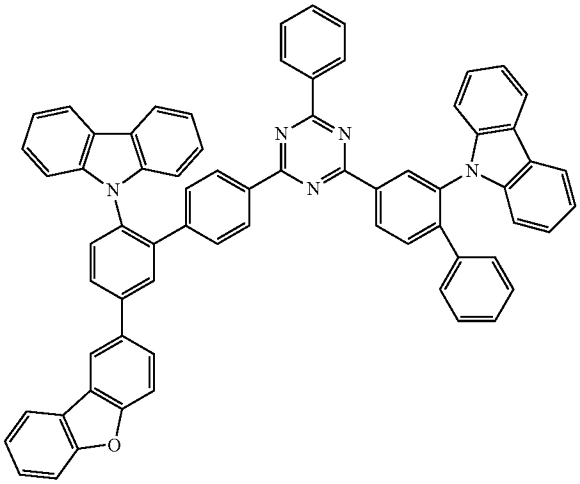
231
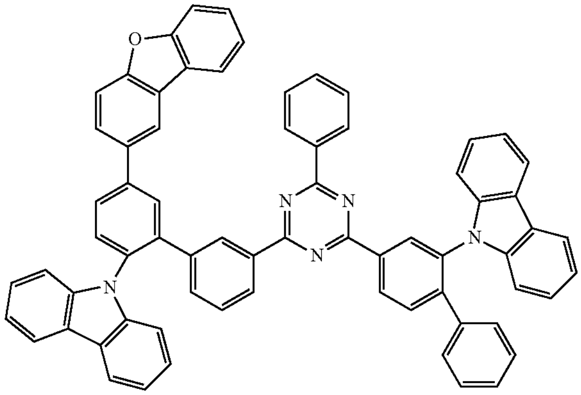

-continued
232
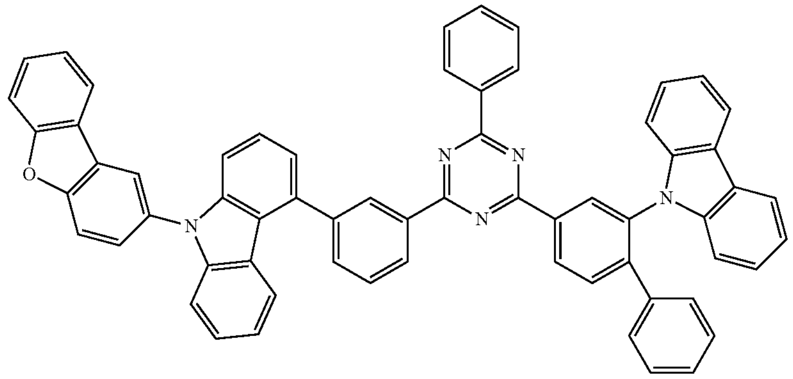
233
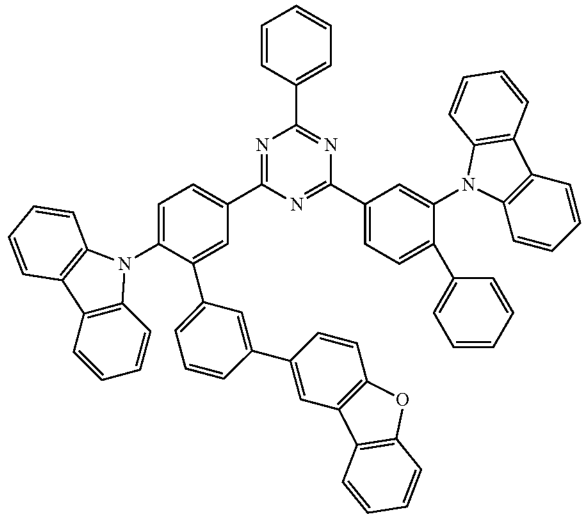
234
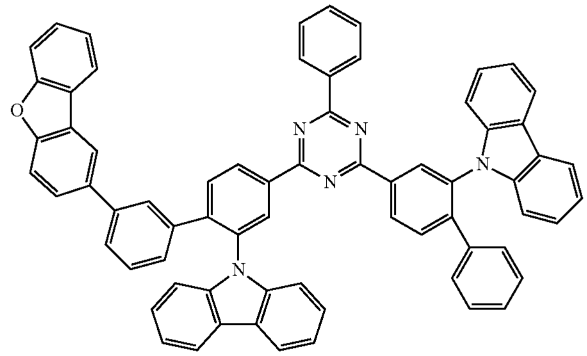
235
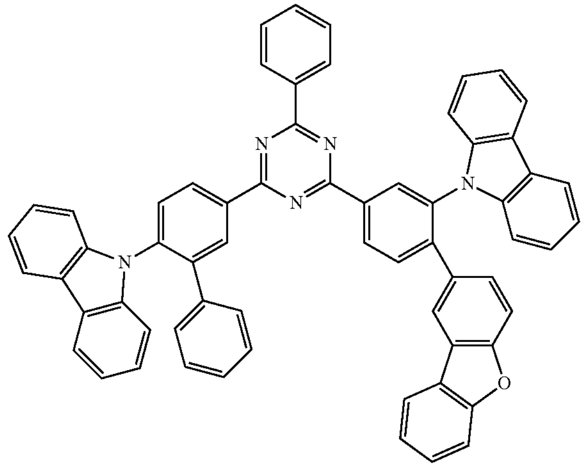
236
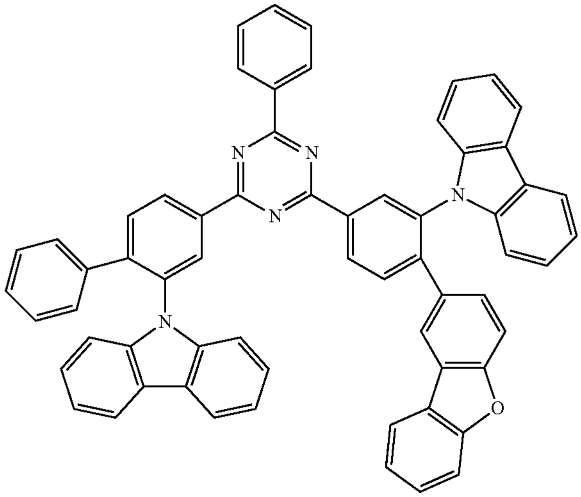

-continued
237
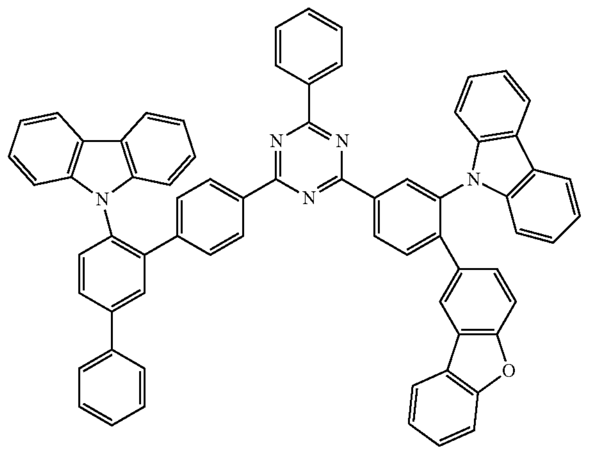
238
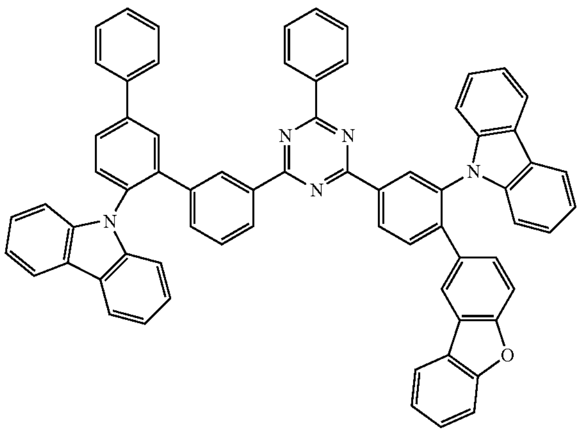
239
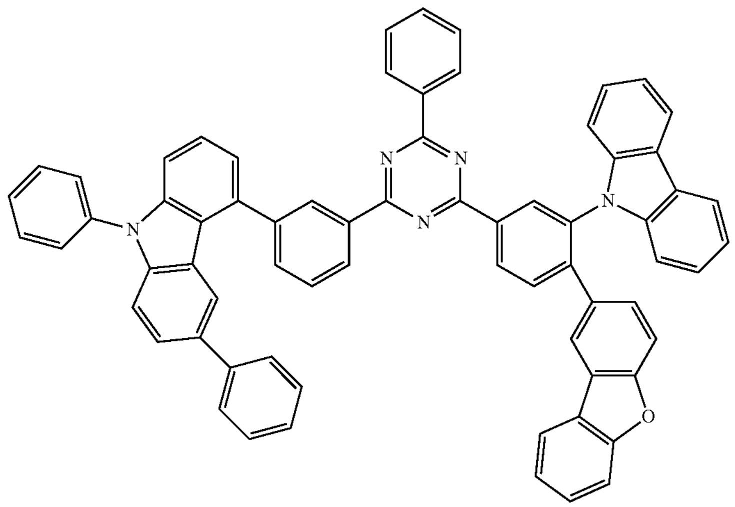
240
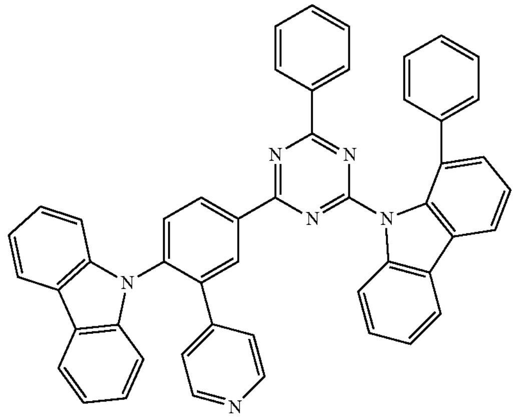
241
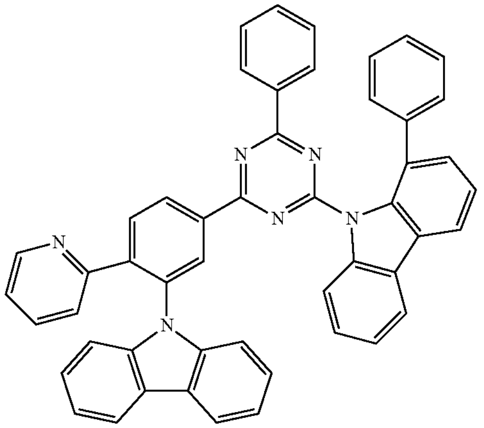

-continued
242
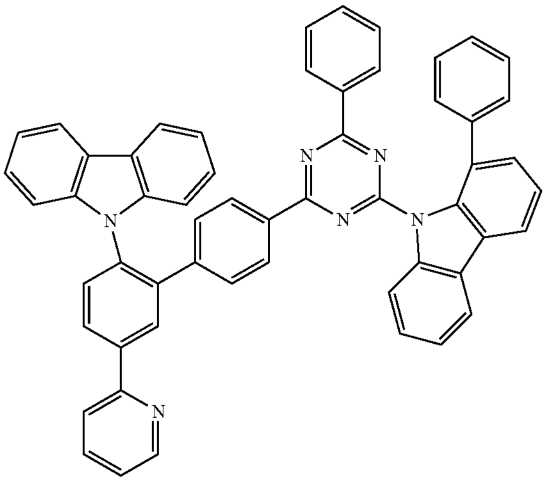
243
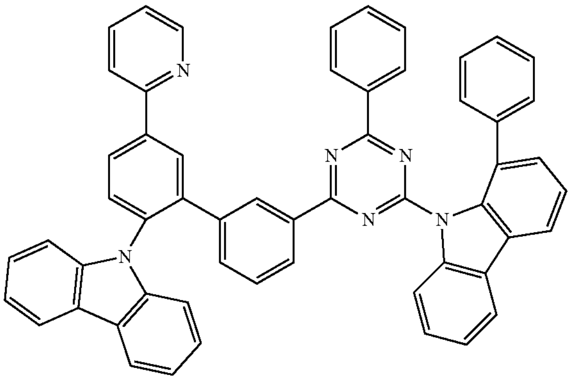
244
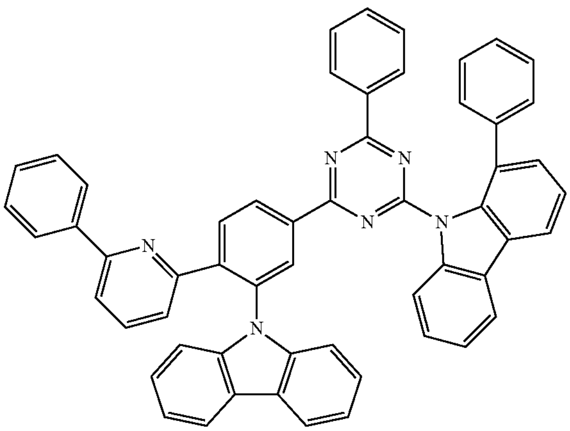
245
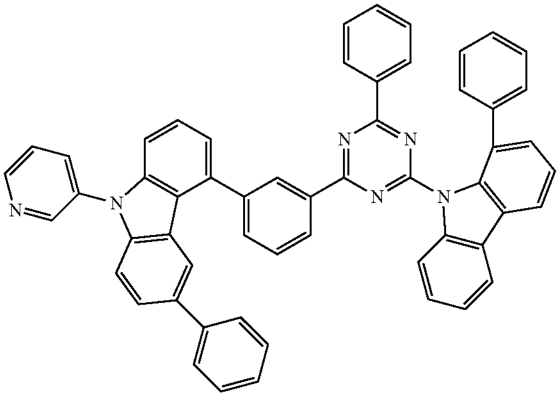
246
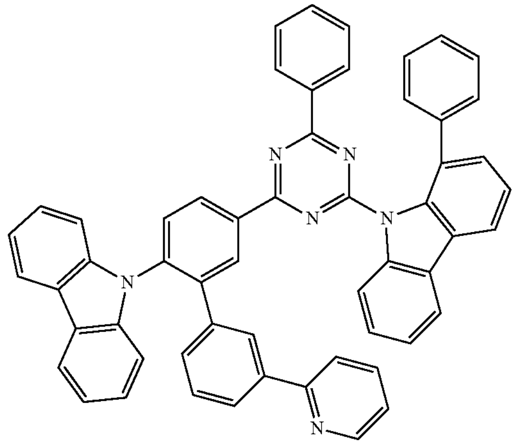
247
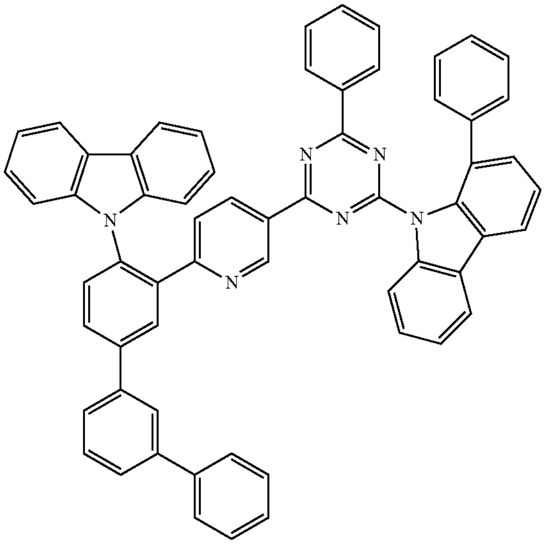

-continued
248
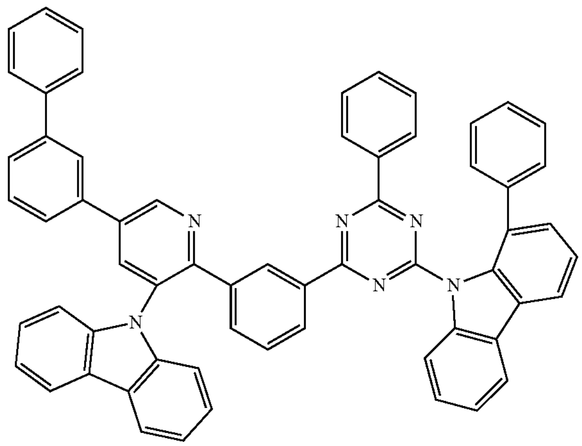
249
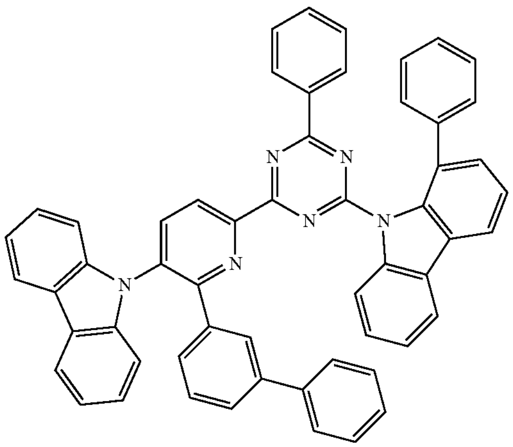
250
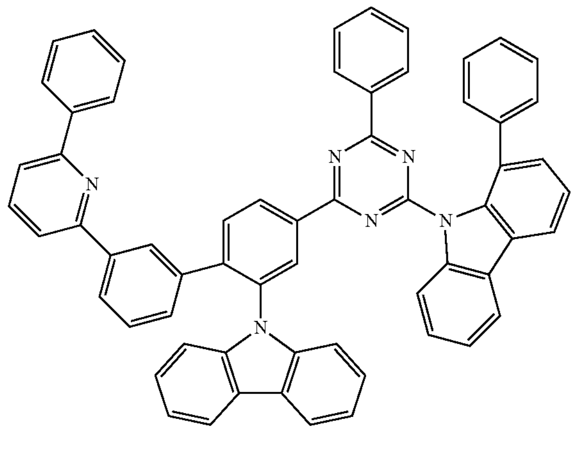
251
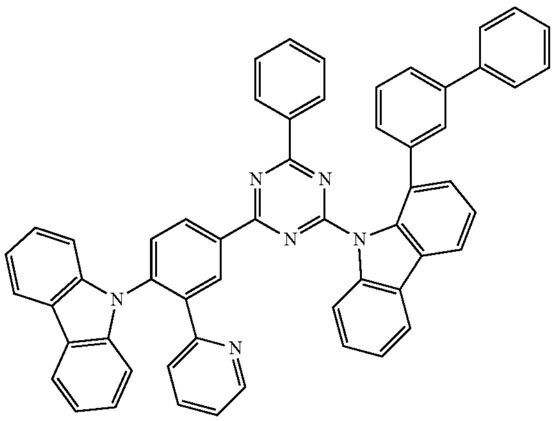
252
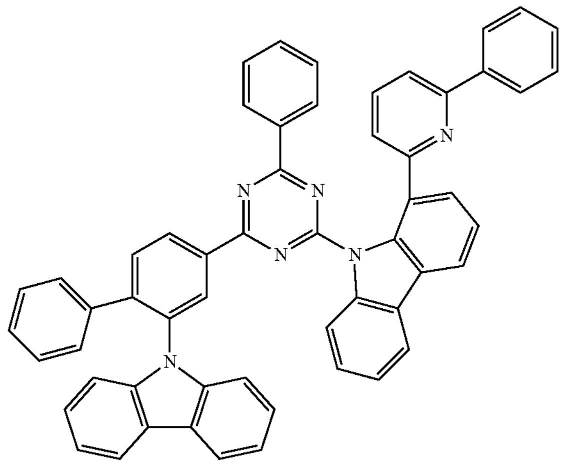
253
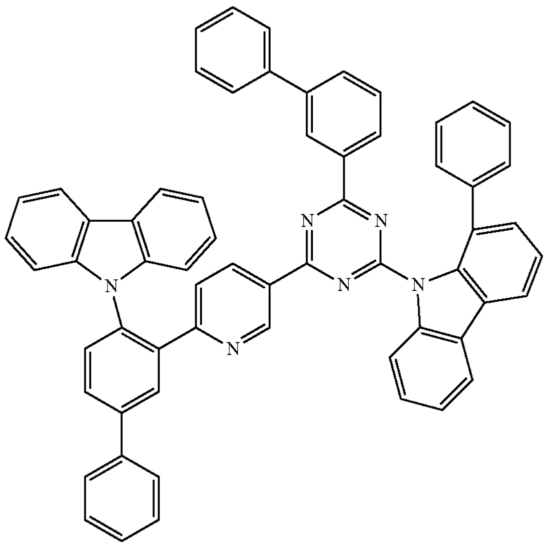

-continued
254
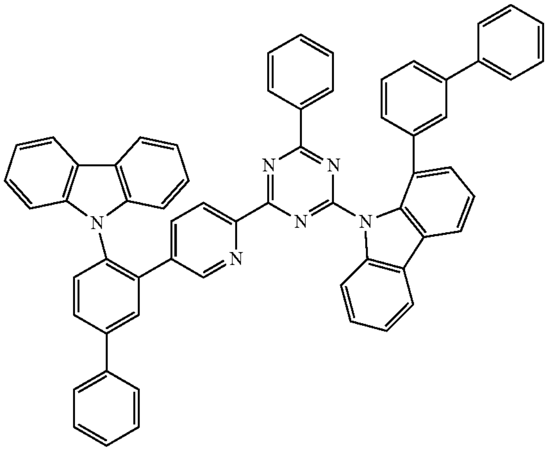
255
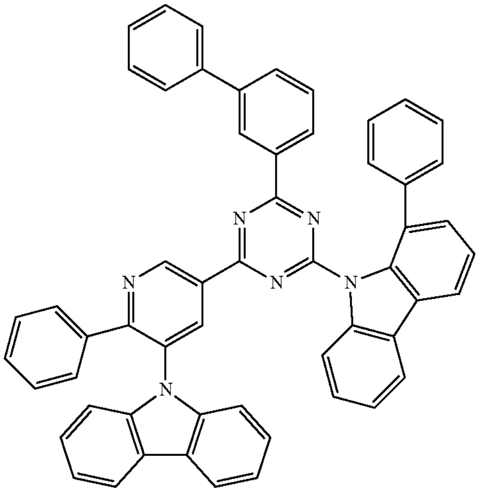
256
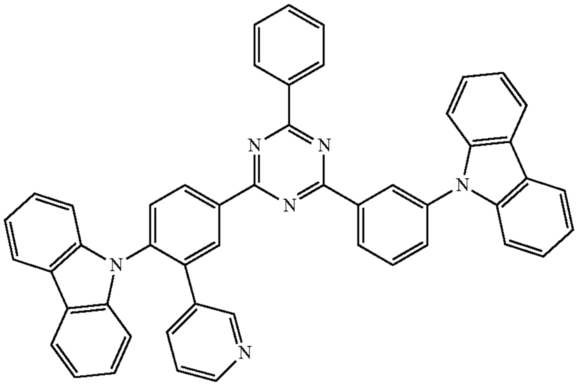
257
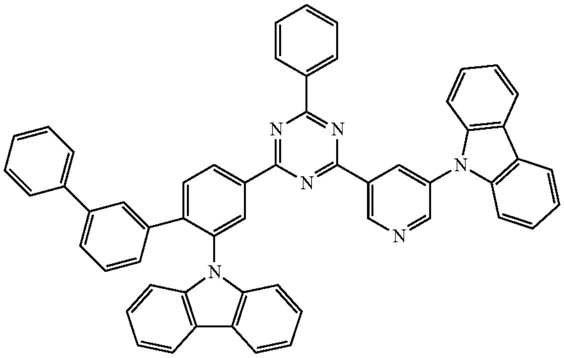
258
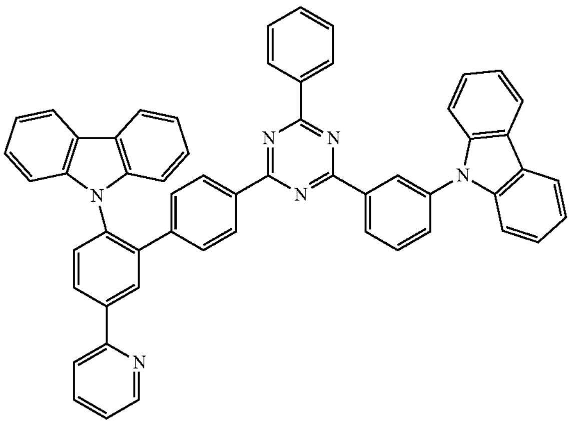
259
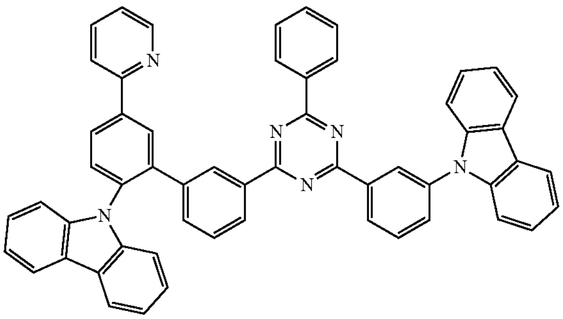

-continued
260
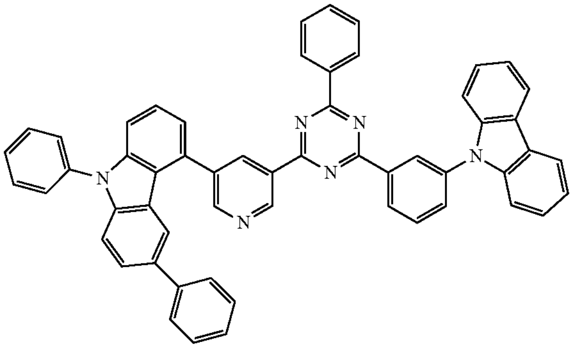
261
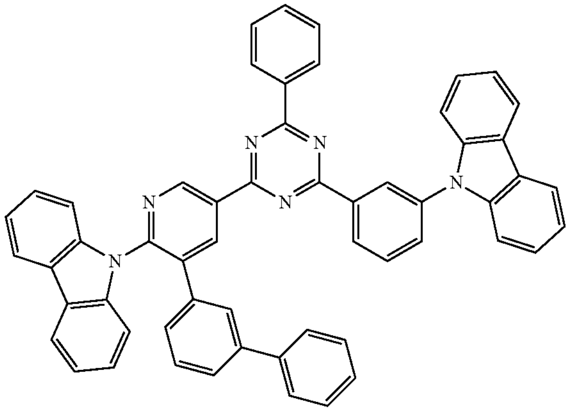
262
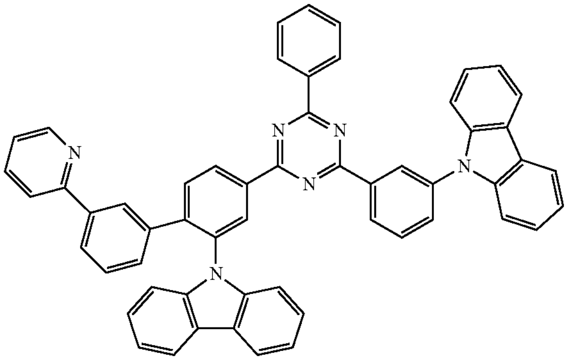
263
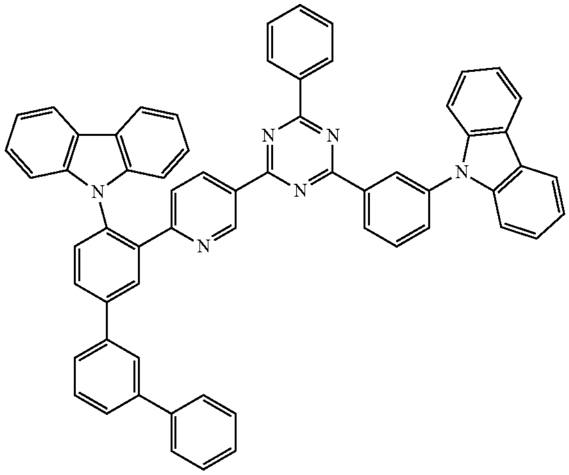
264
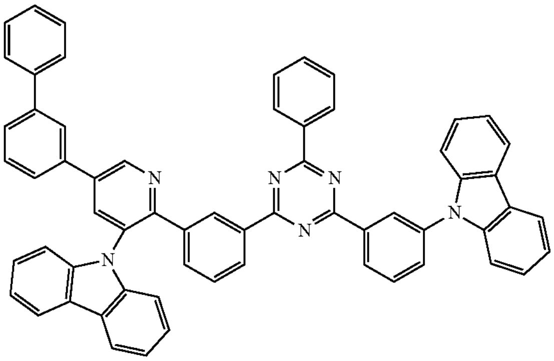
265
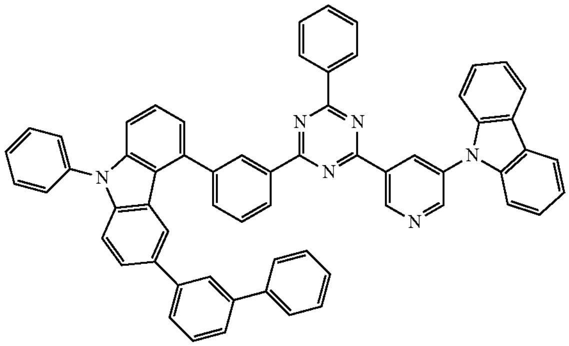

-continued
266
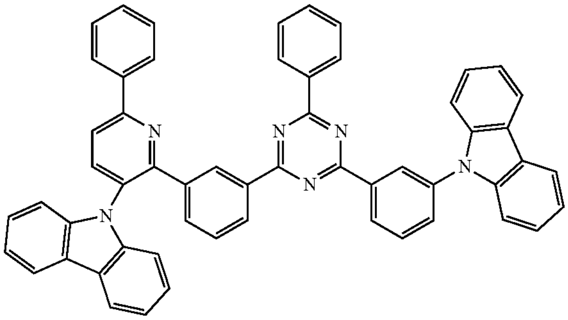
267
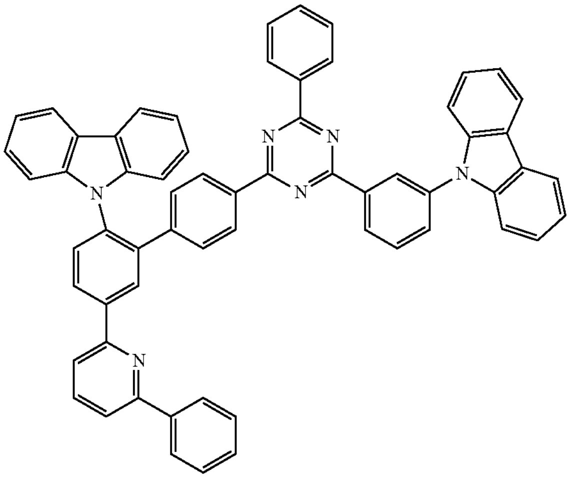
268
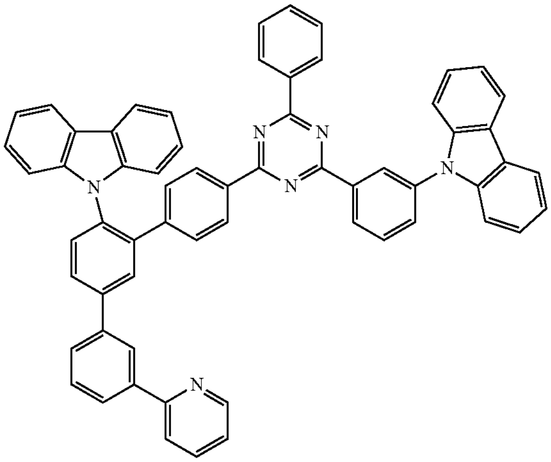
269
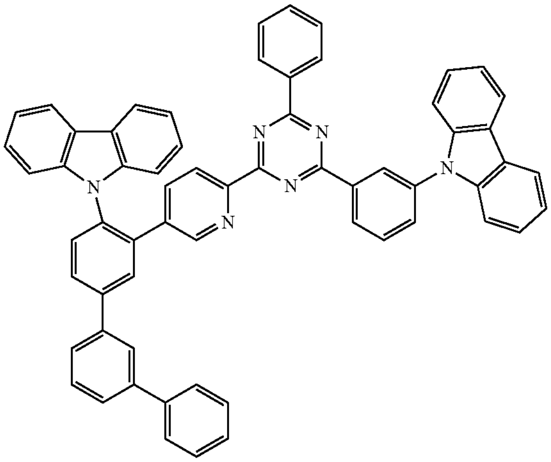
270
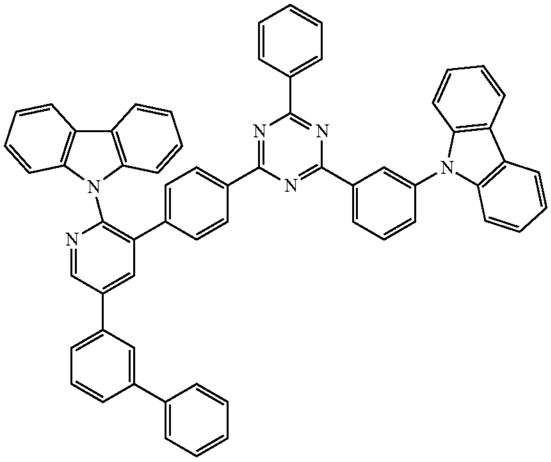
271
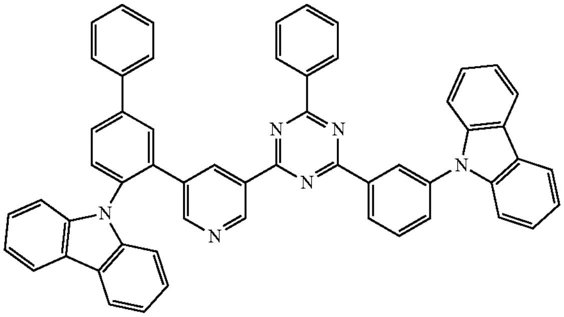

-continued
272
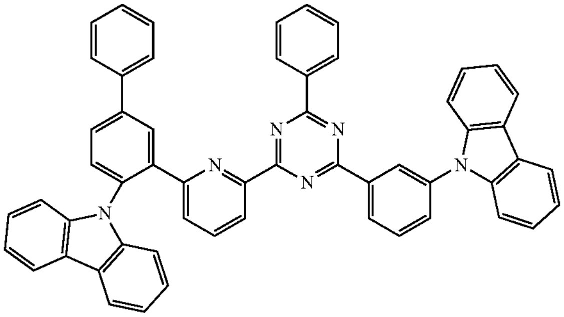
273
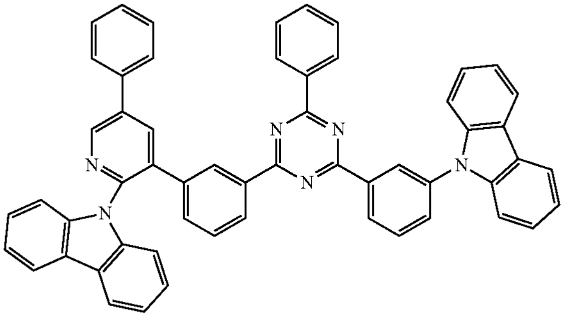
274
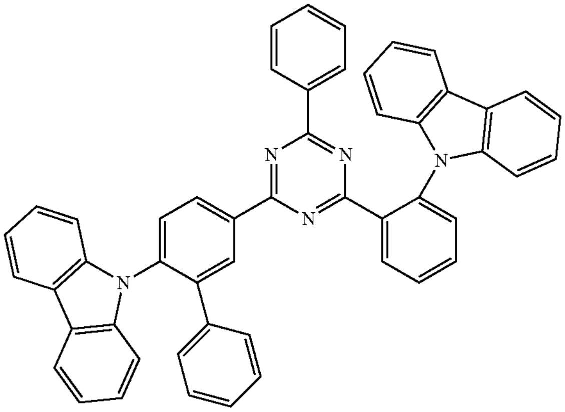
275
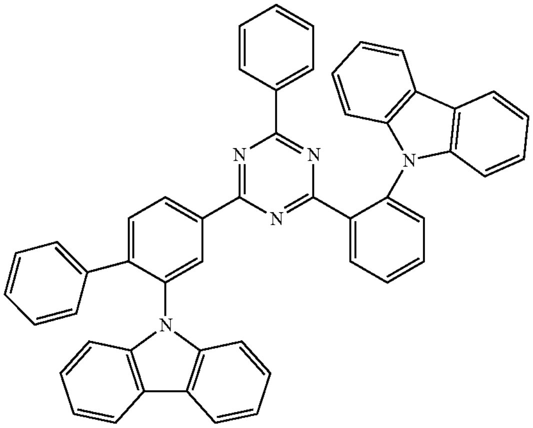
276
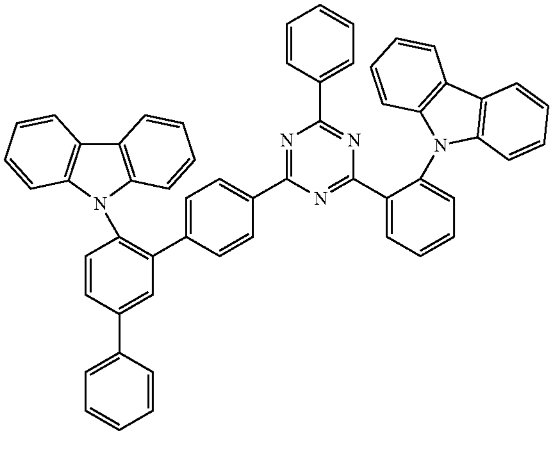
277
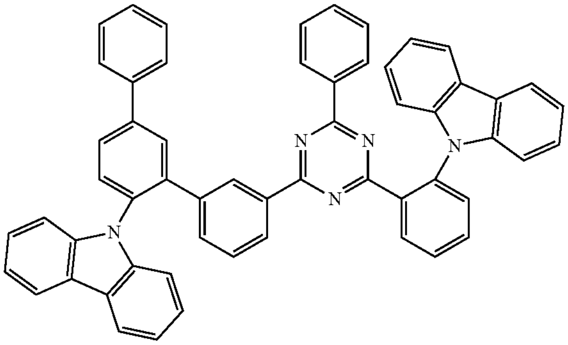

-continued
278
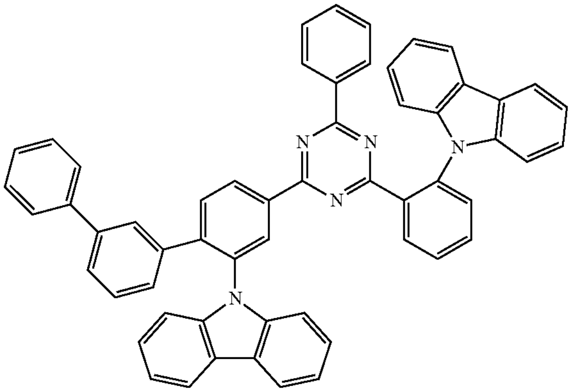
279
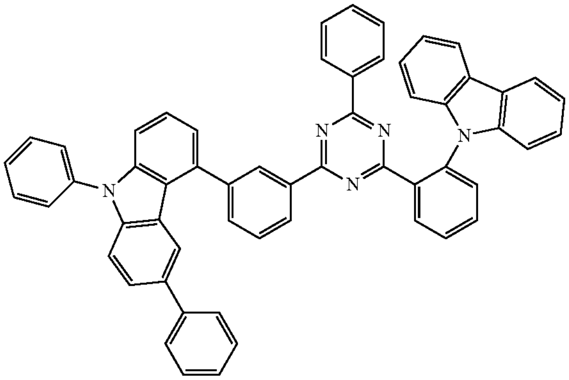
280
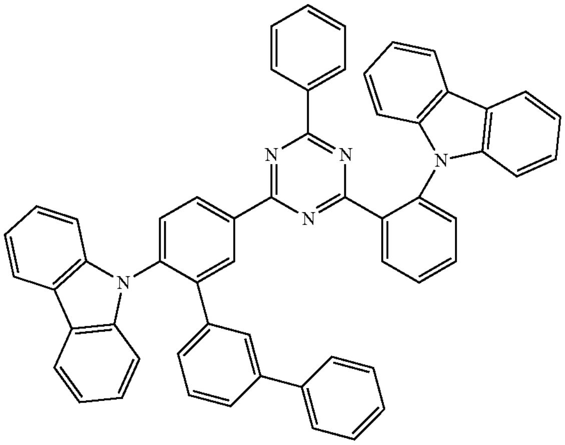
281
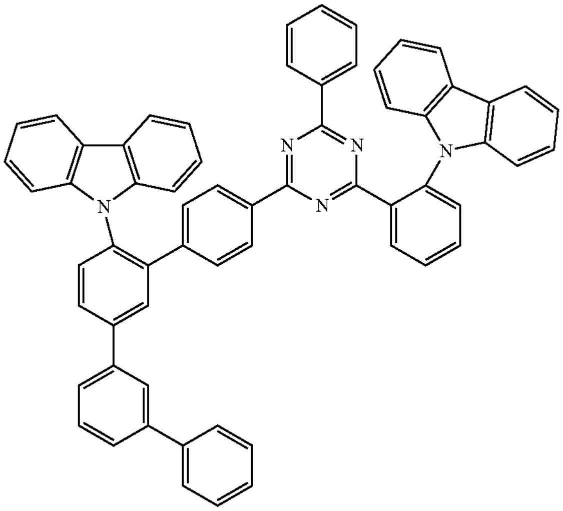
282
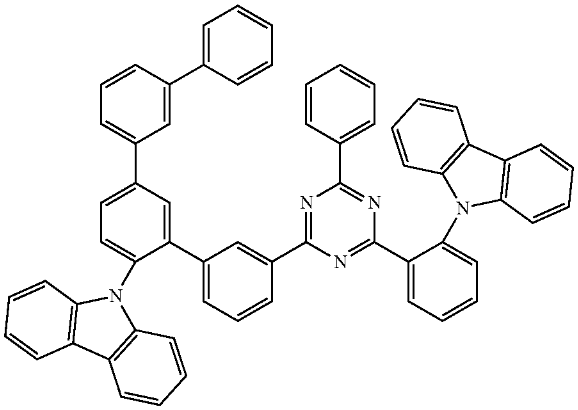
283
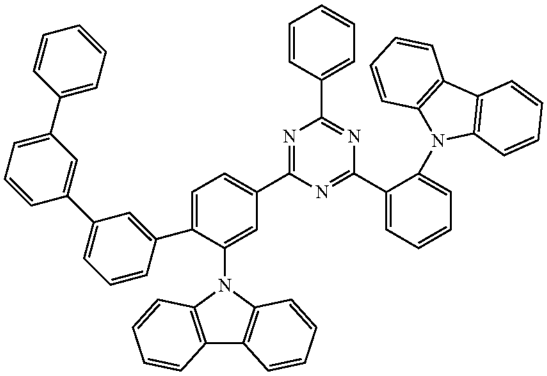

-continued
284
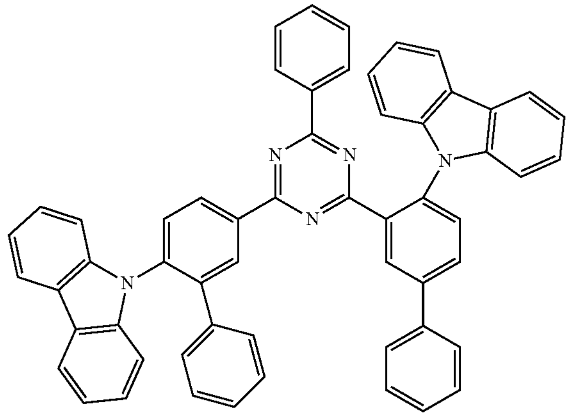
285
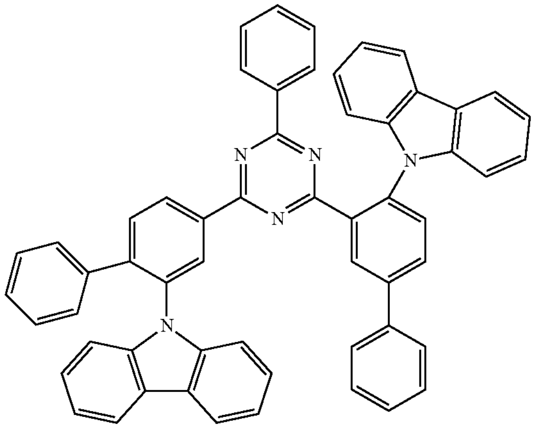
286
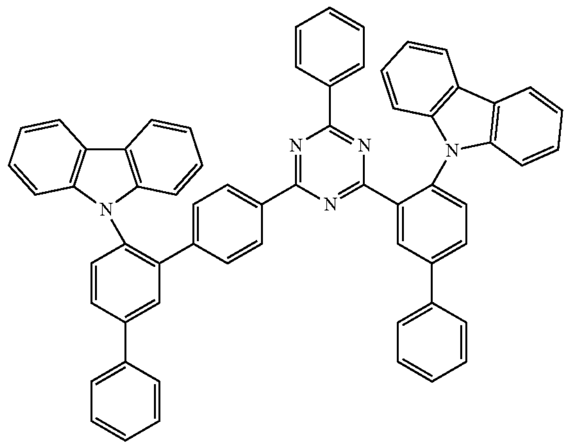
287
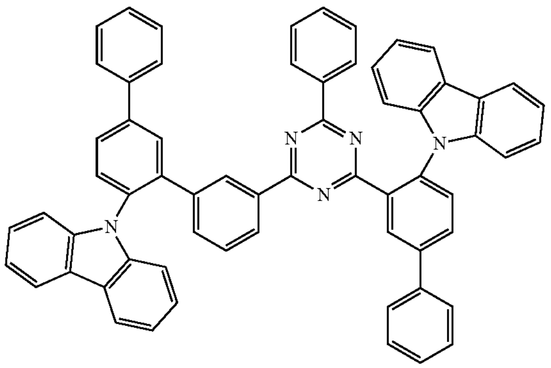
288
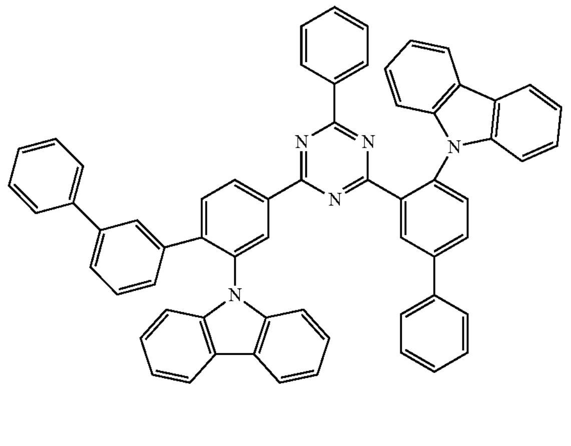
289
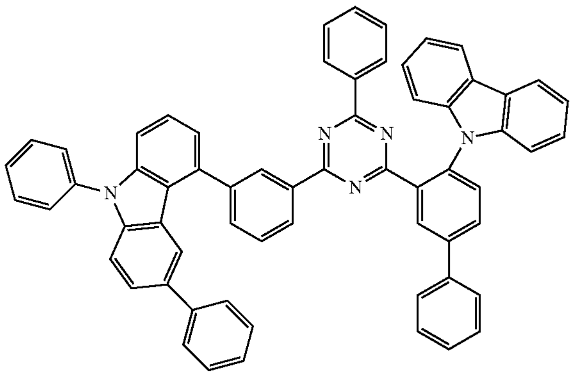

-continued
290
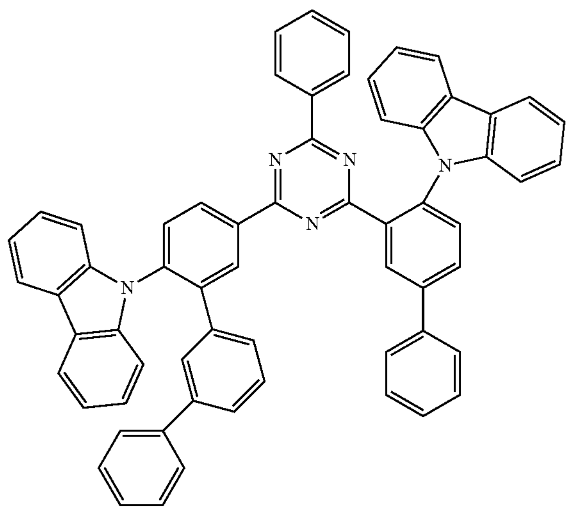
291
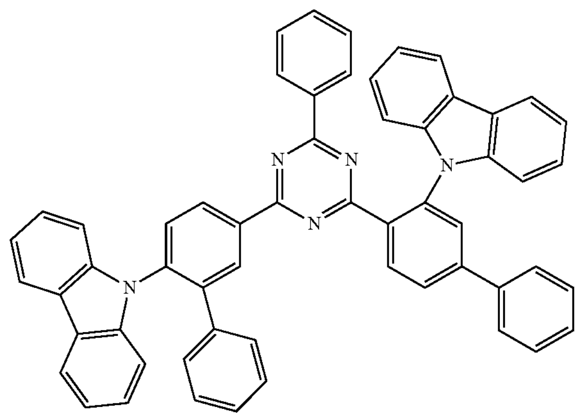
292
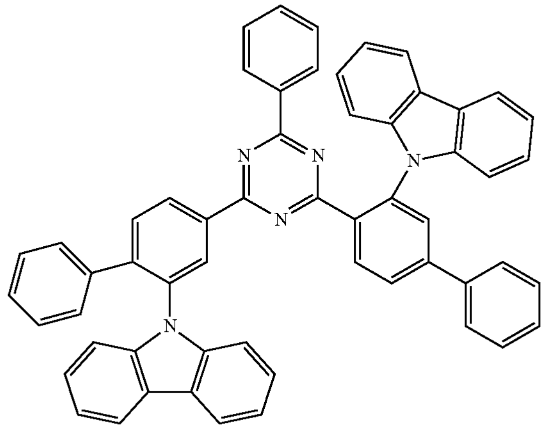
293
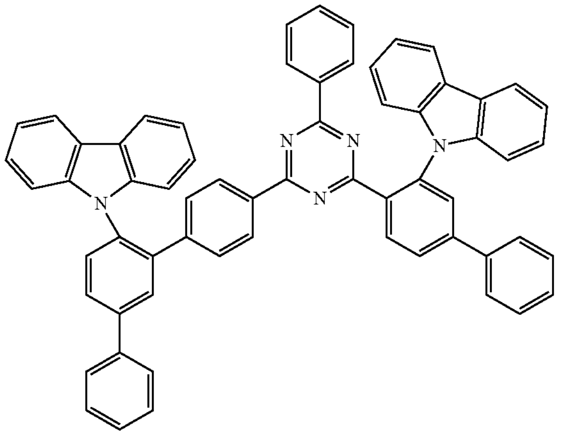
294
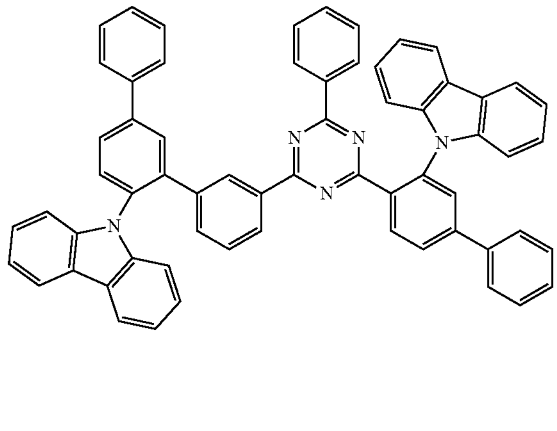
295
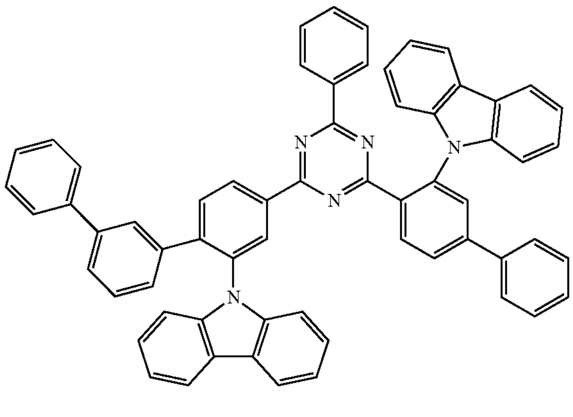

-continued
296
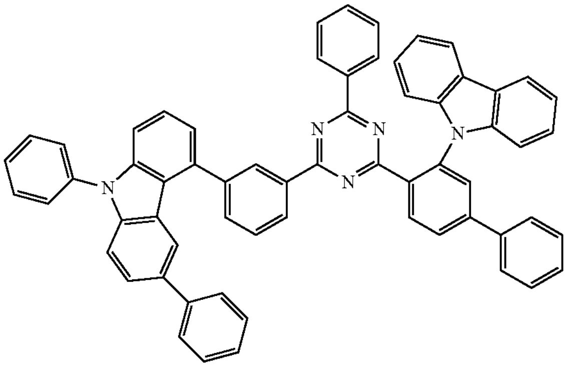
297
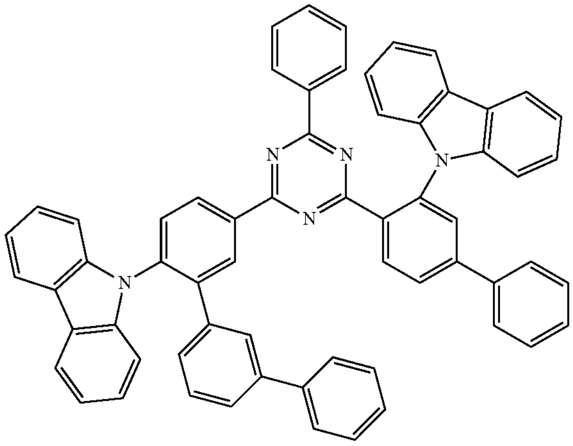
298
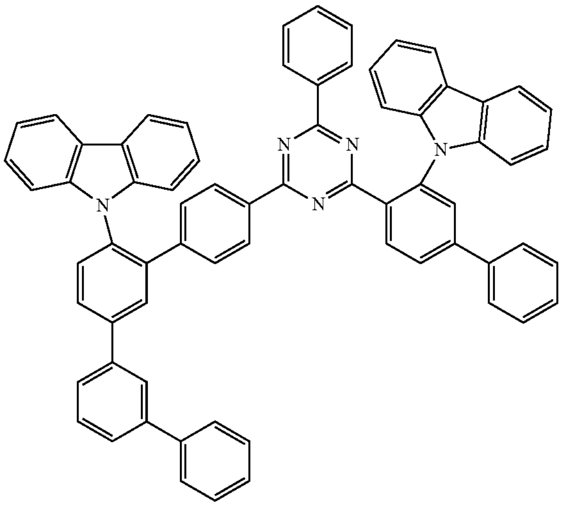
299
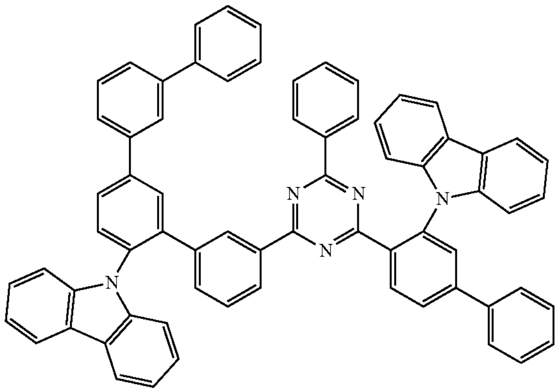
300
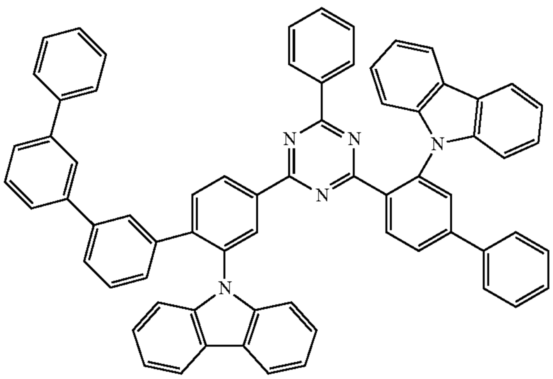
301
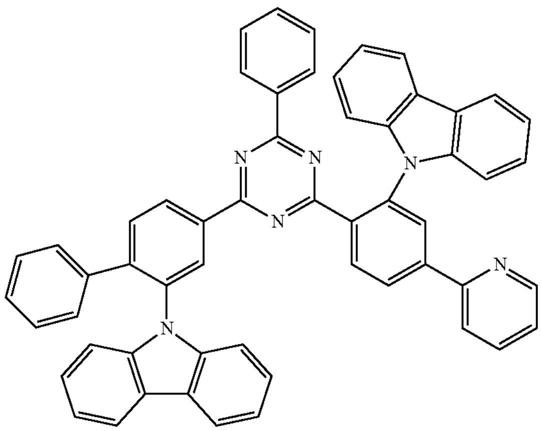

-continued
302
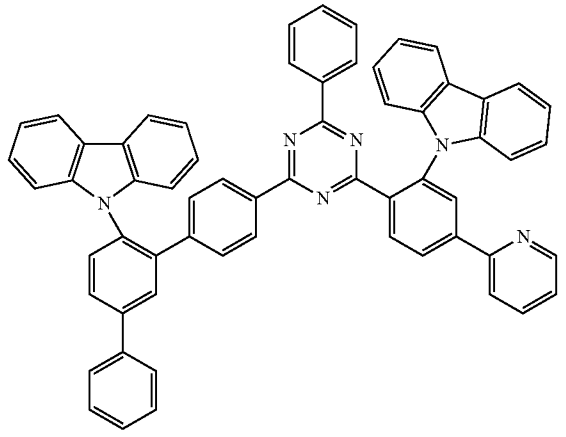
303
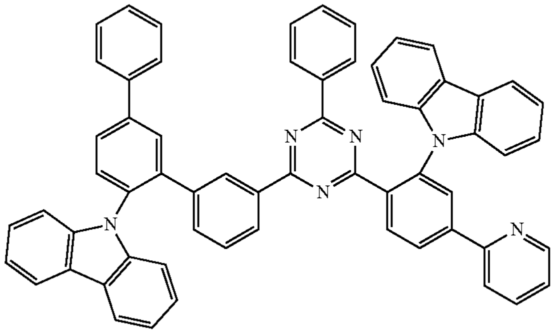
304
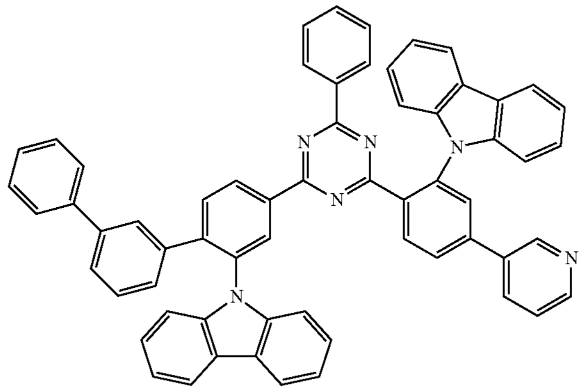
305
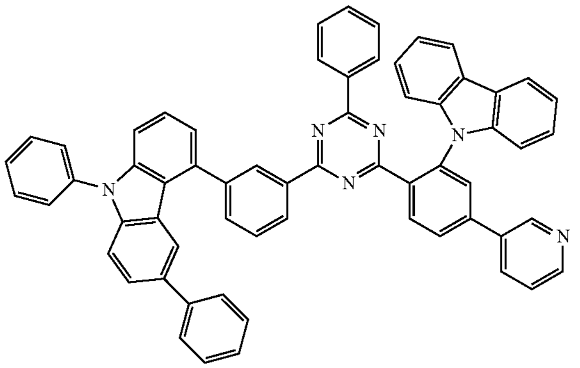
306
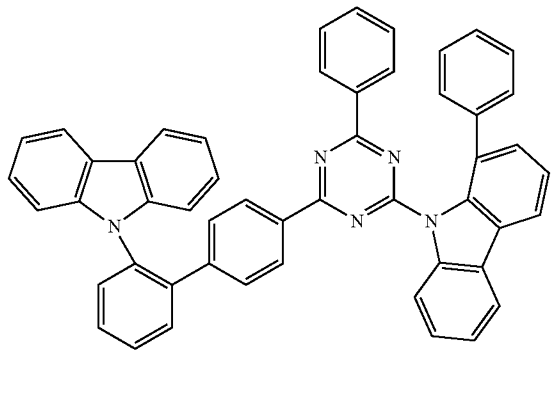
307
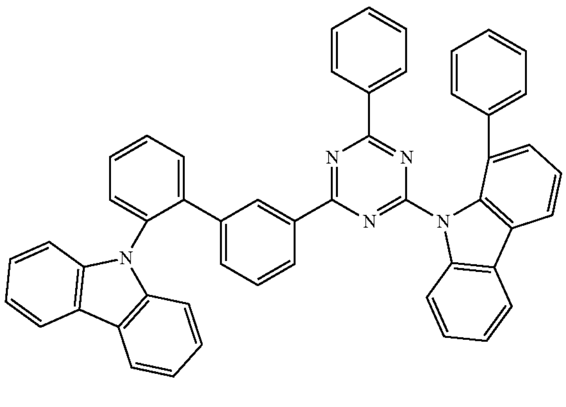

-continued
308
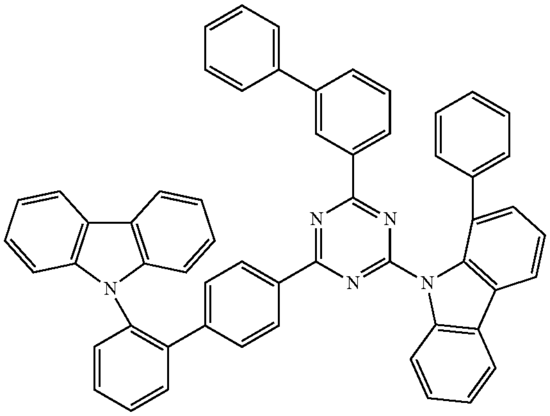
309
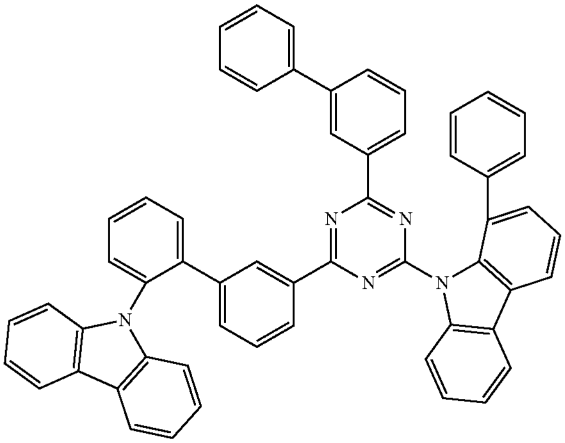
310
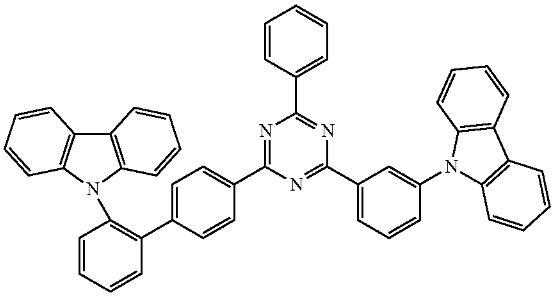
311
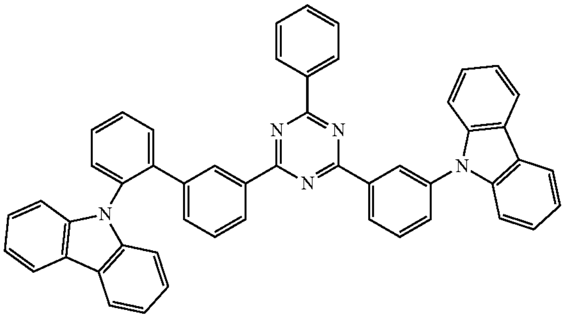
312
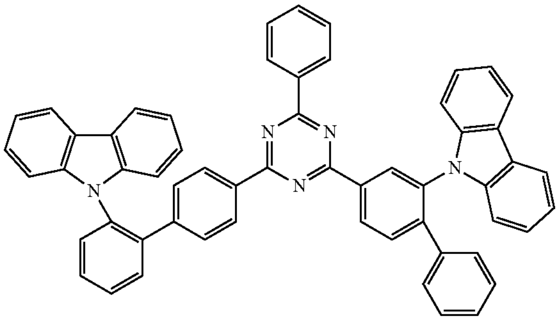
313
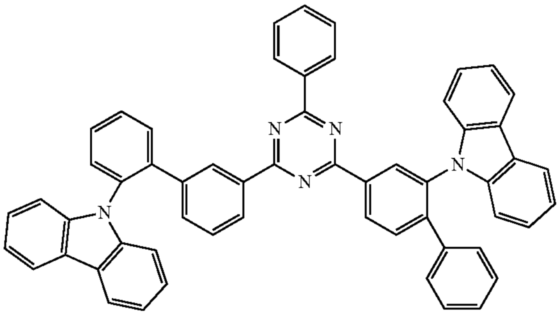
314
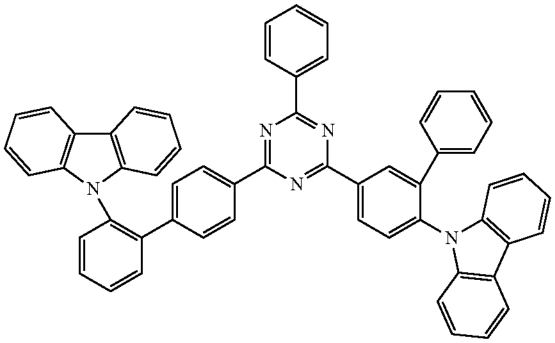
315
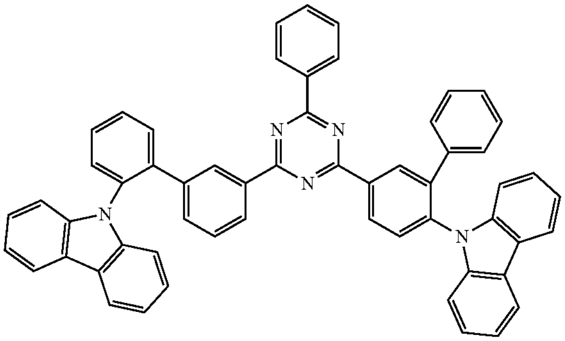

-continued
316
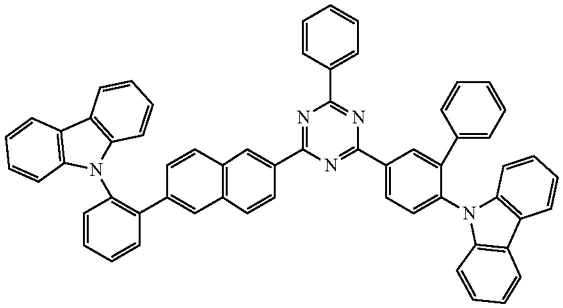
317
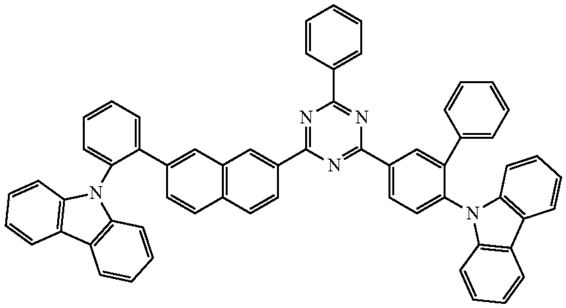
318
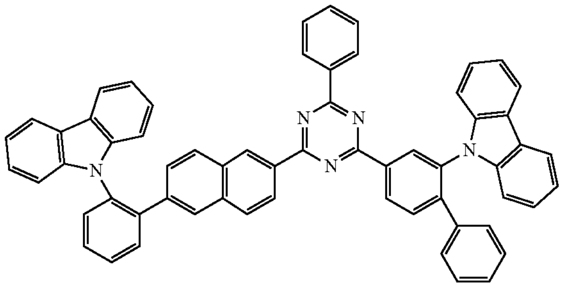
319
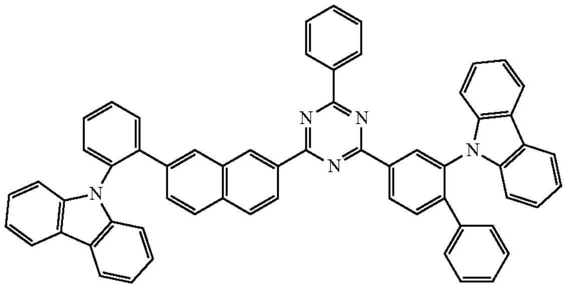
320
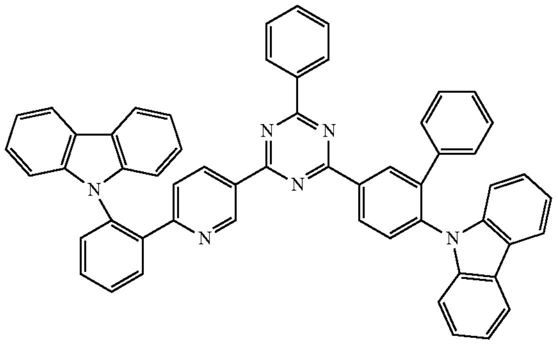
321
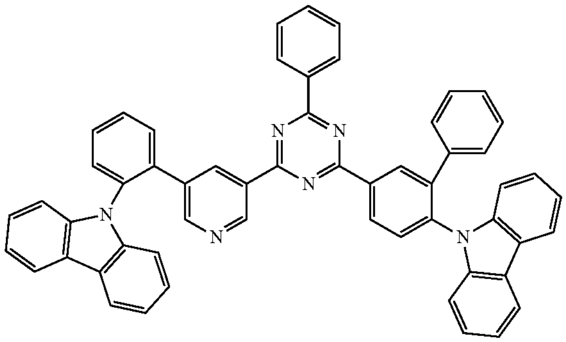
322
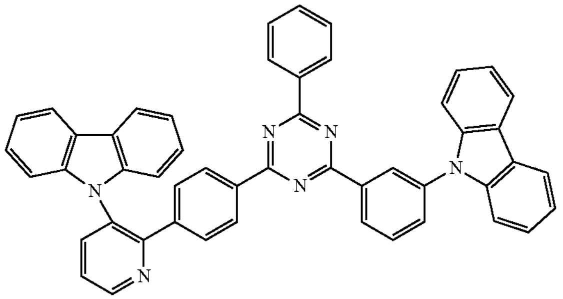
323
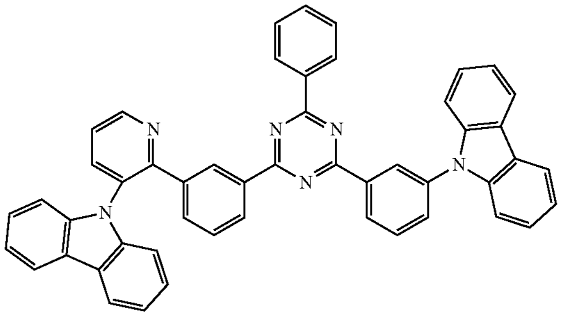

-continued
324
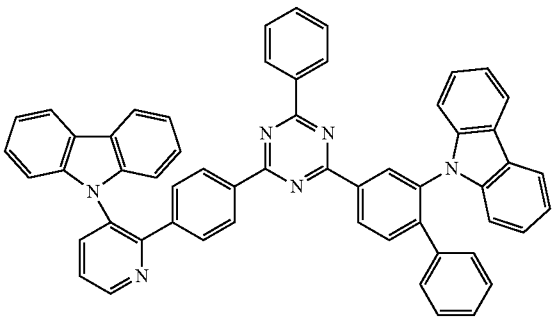
325
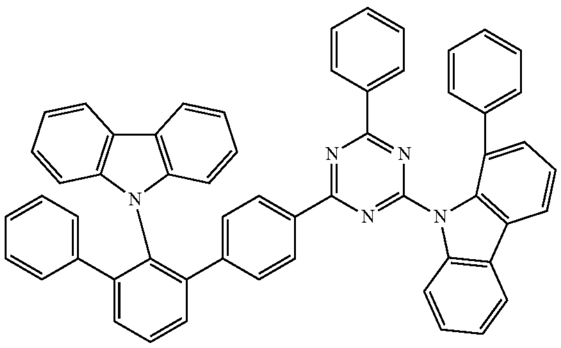
326
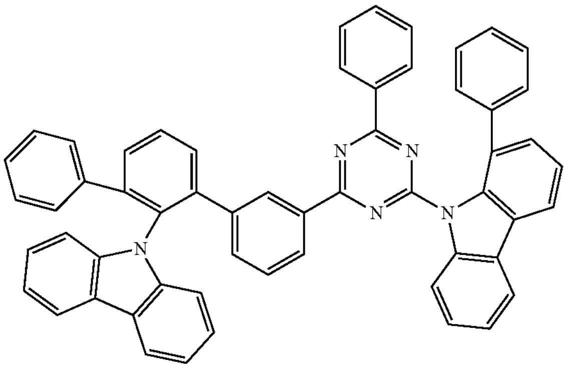
327
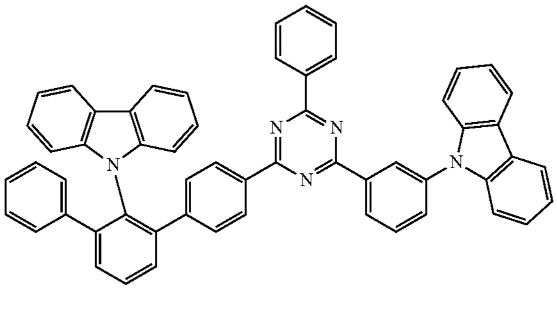
328
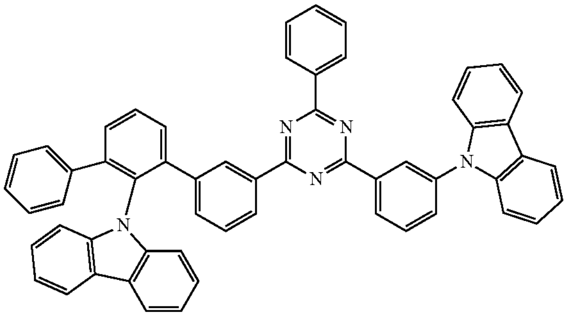
329
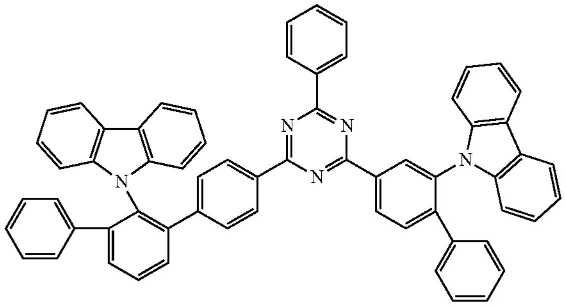
330
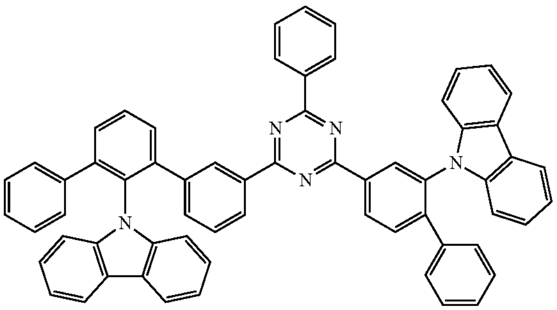
331
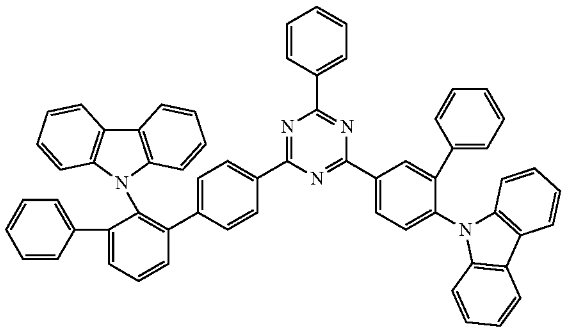

-continued
332
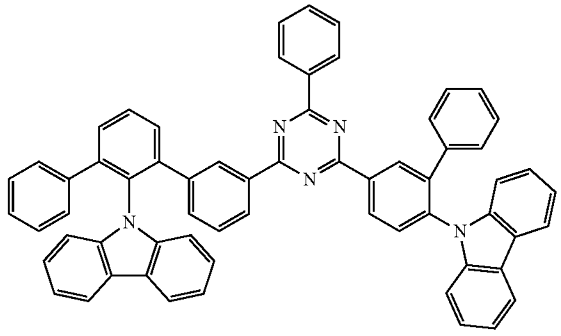
333
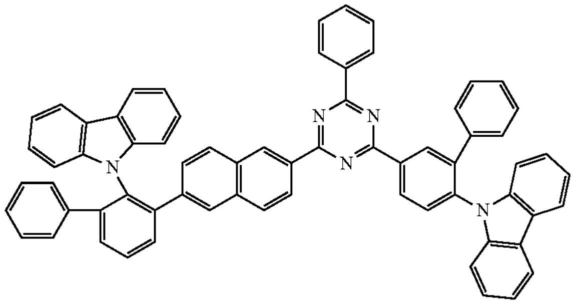
334
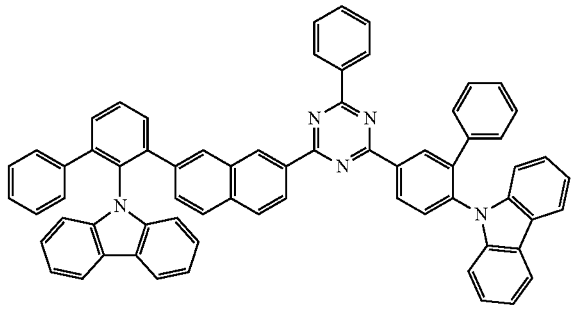
335
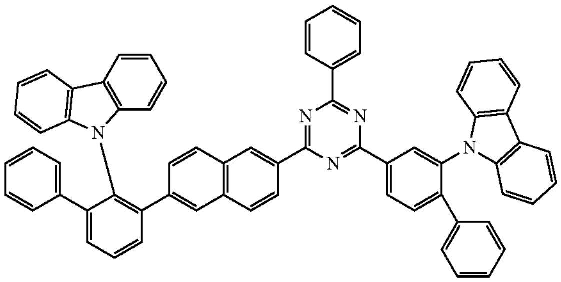
336
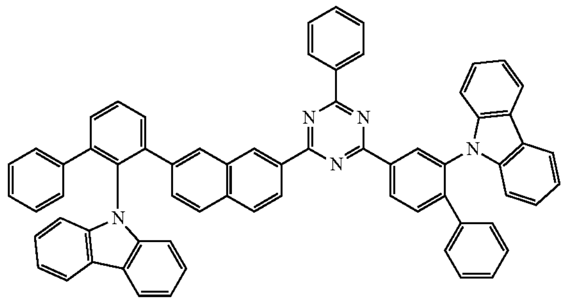
337
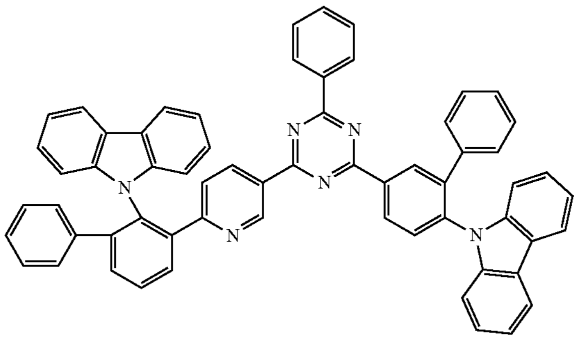
338
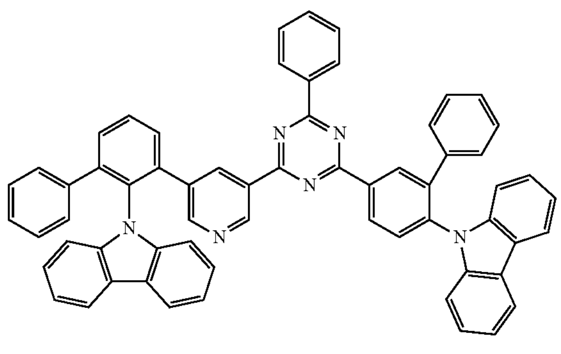
339
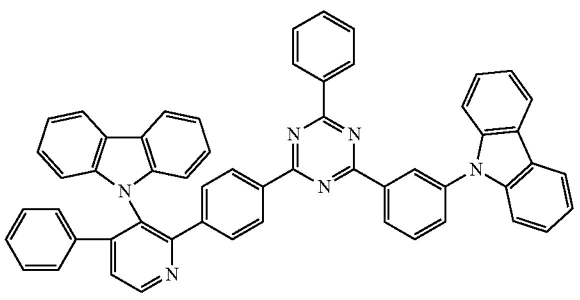

-continued
340
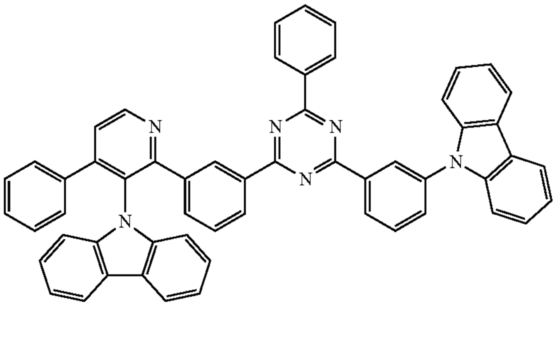
341
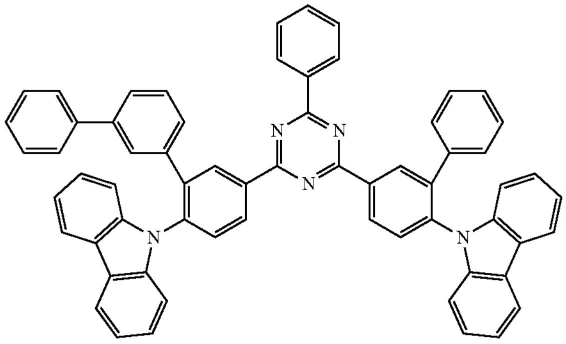
342
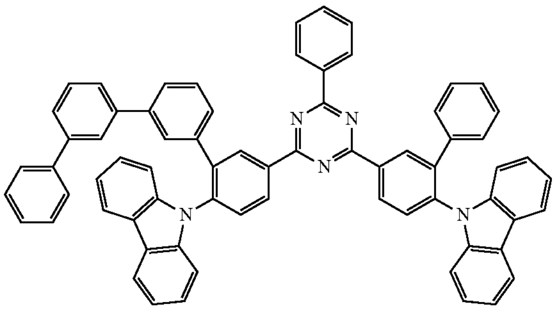
343
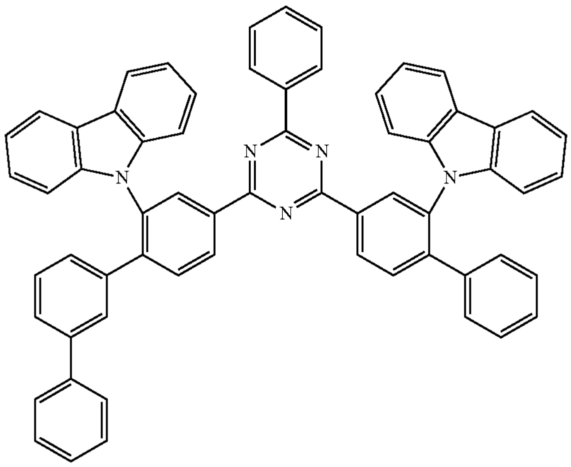
345
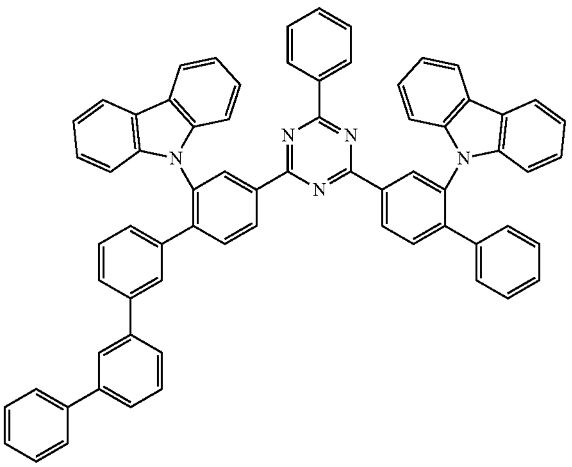
346
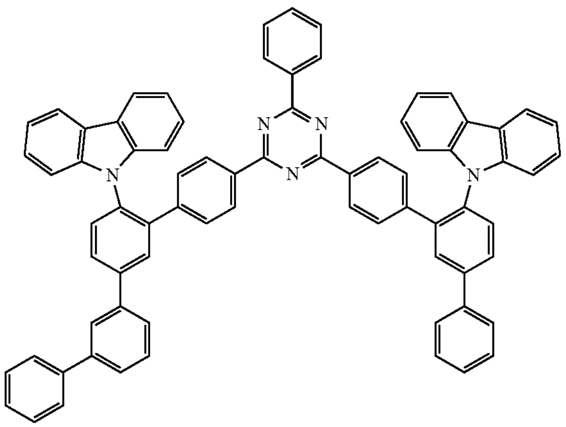

-continued
347
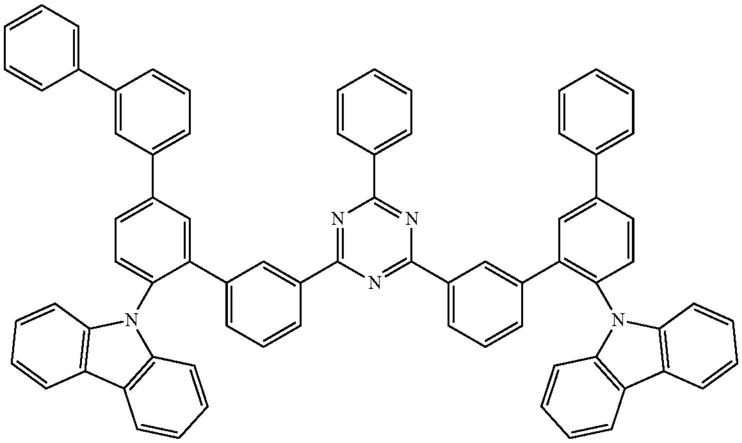
348
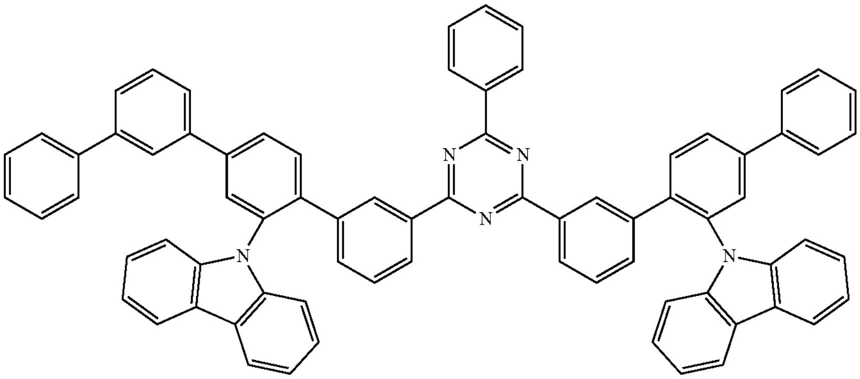
349
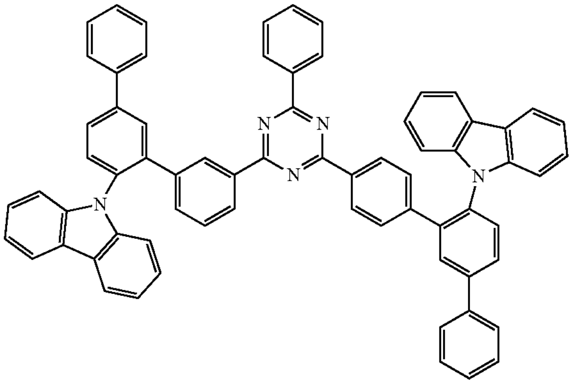
350
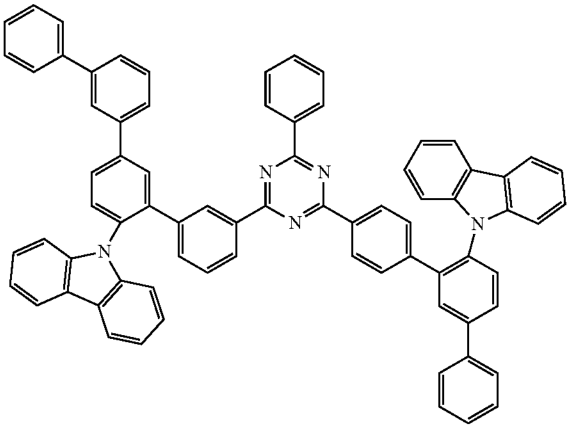

-continued
351
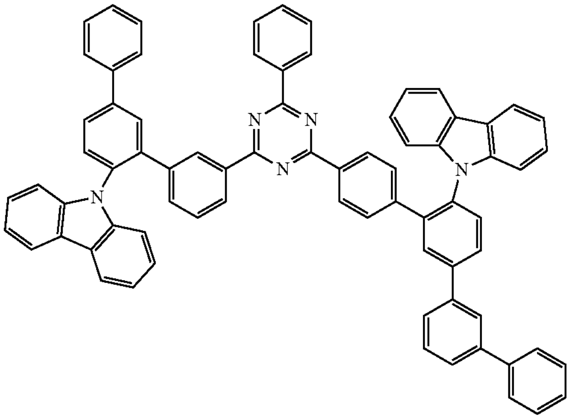
352
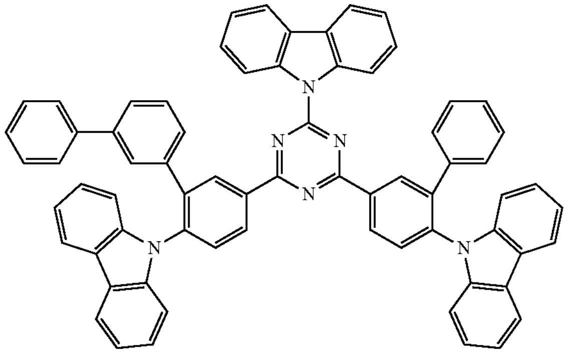
353
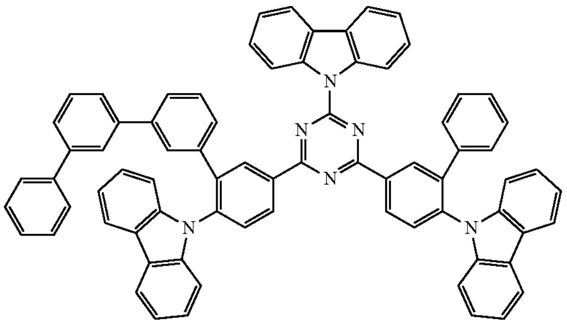
354
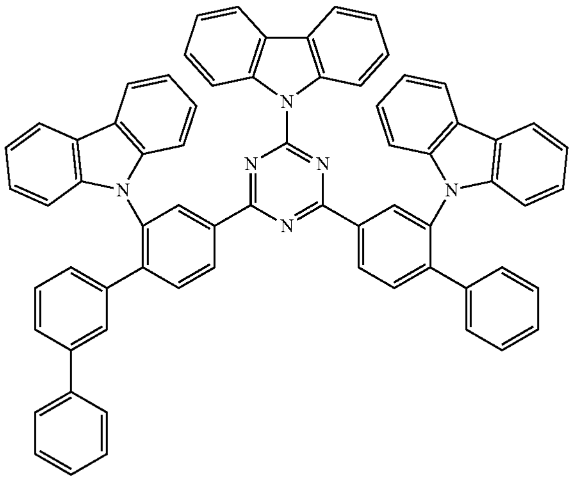
355
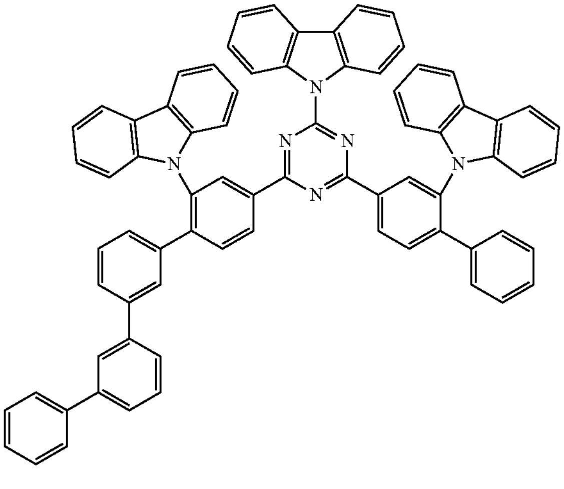
356
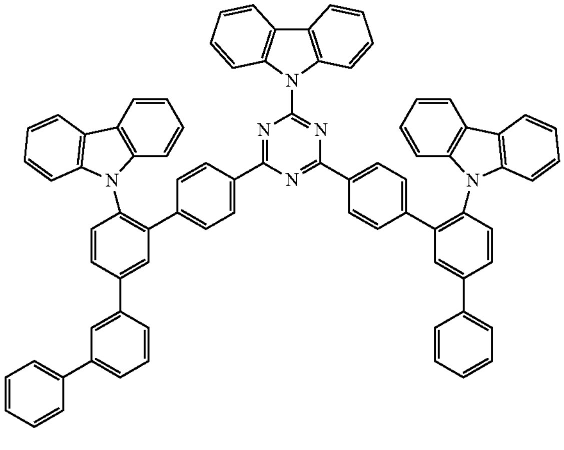

-continued
357
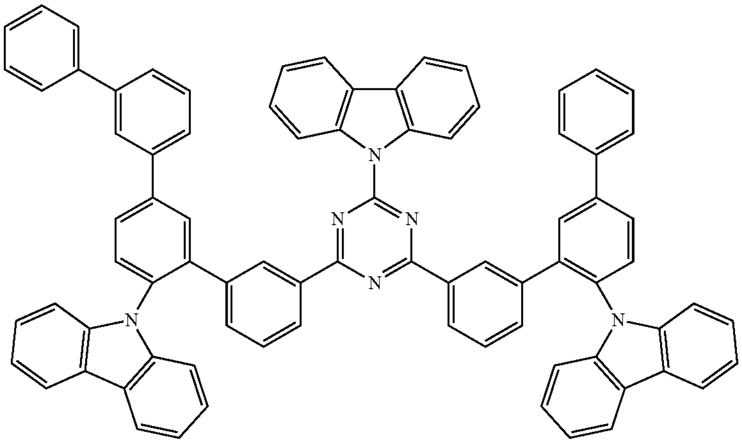
358
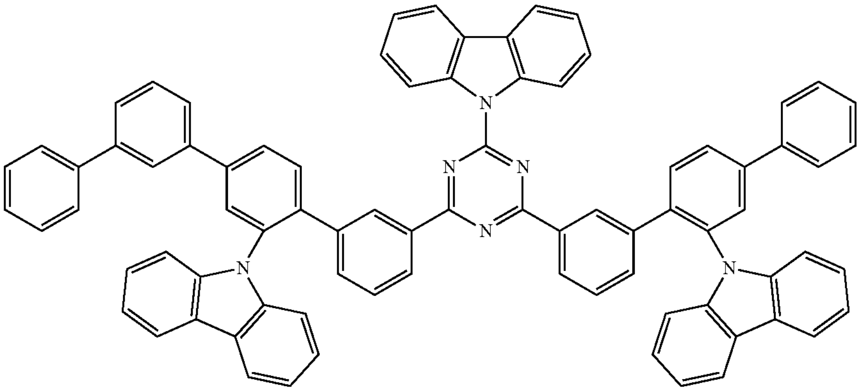
359
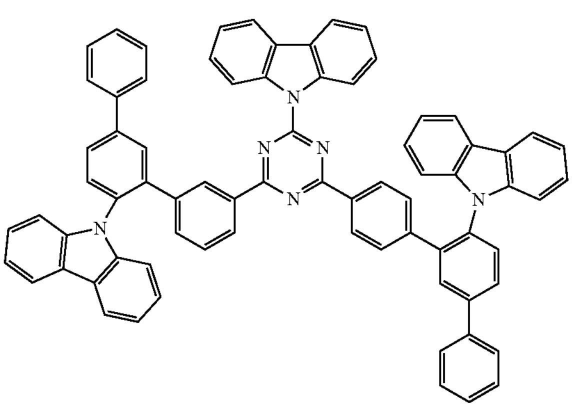
360
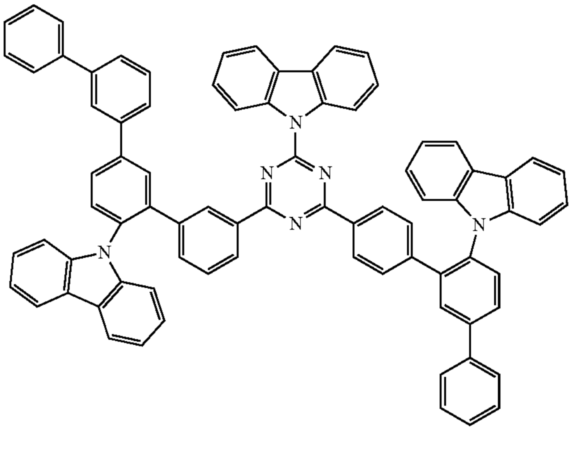

-continued
361
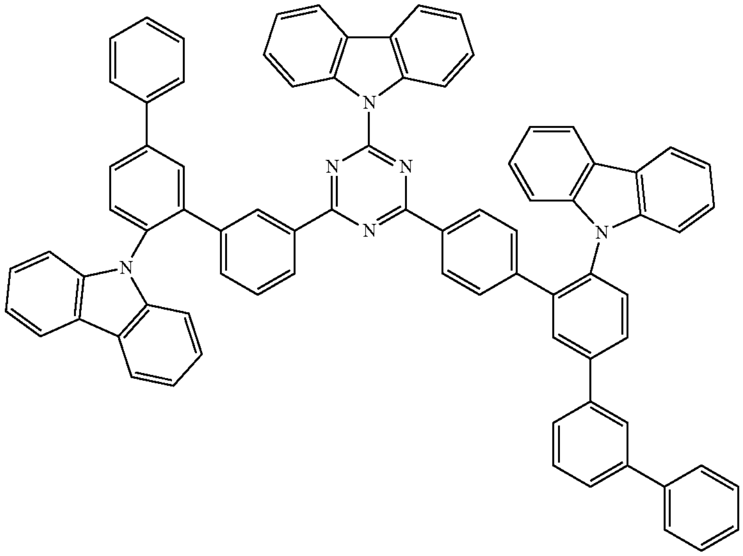
362
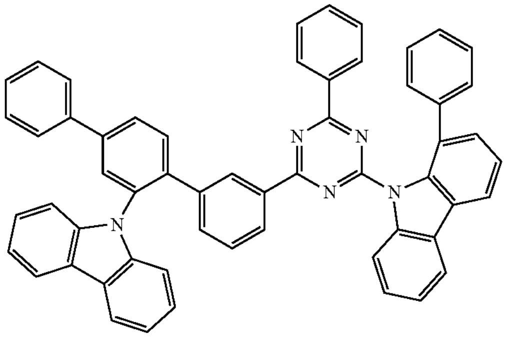
363
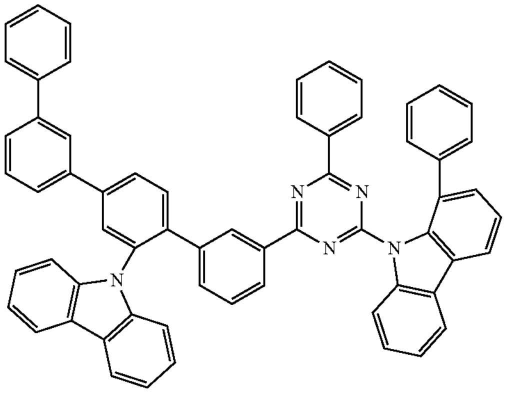
364
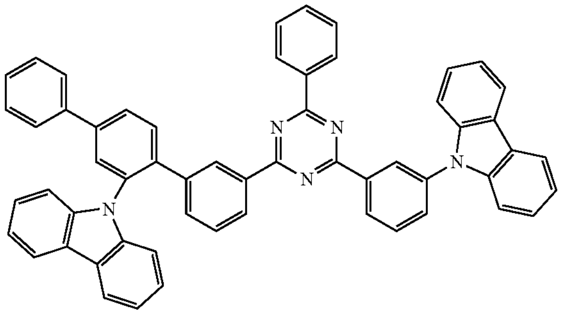
365
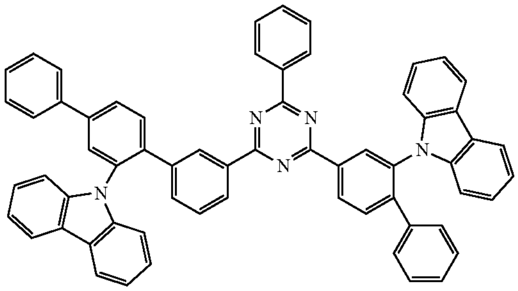

-continued
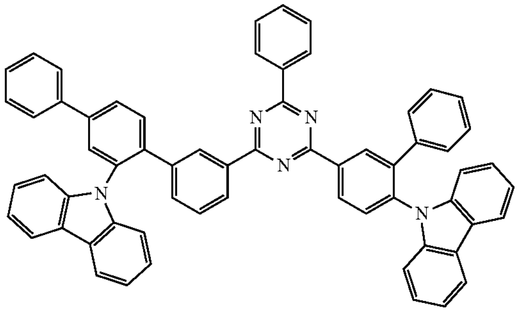
366
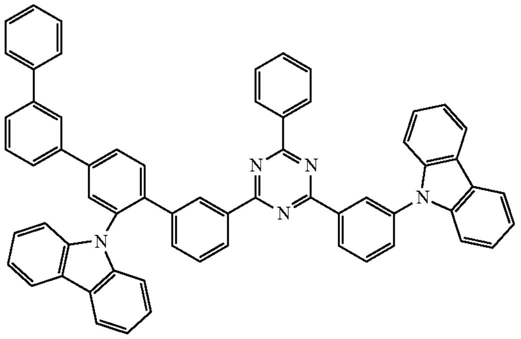
367
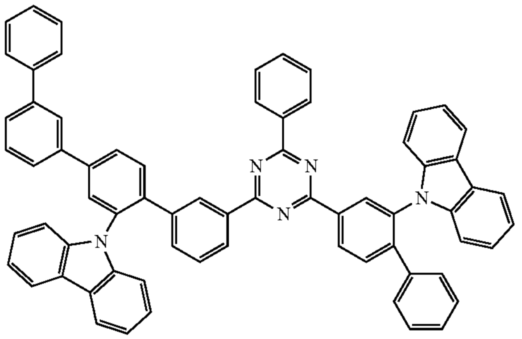
368
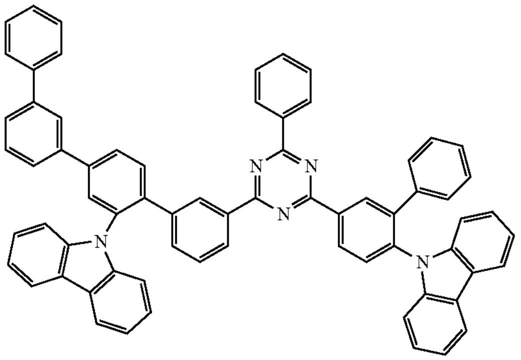
369
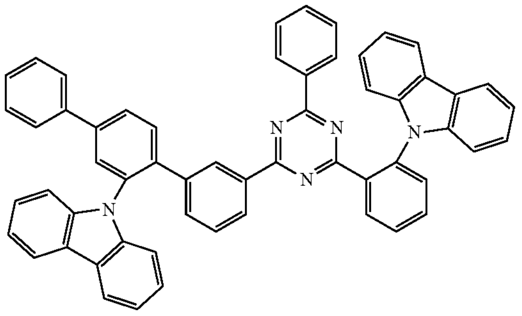
370
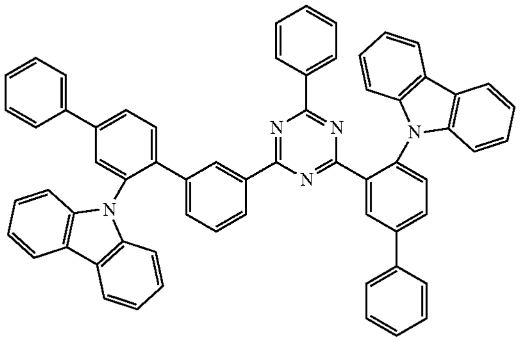
371
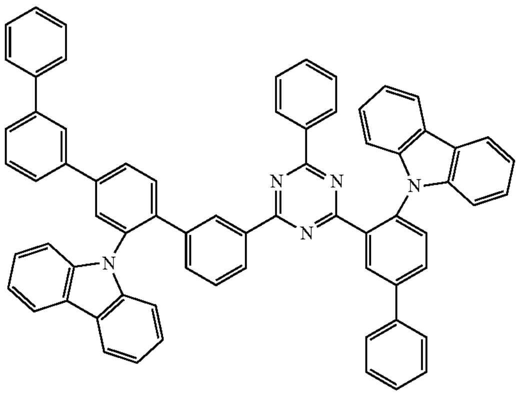
372
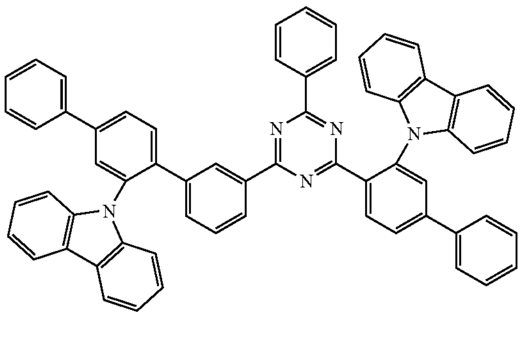
373

-continued
374
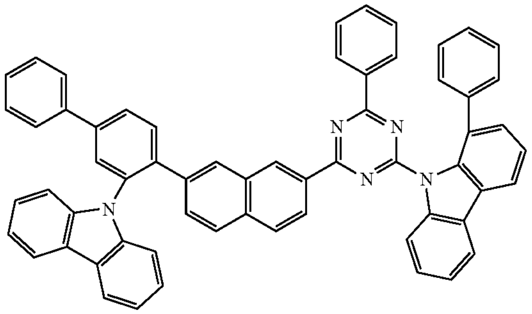
375
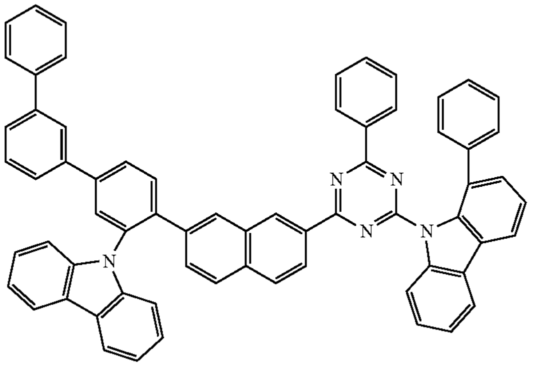
376
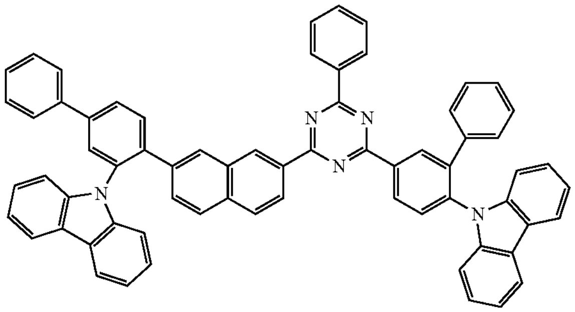
377
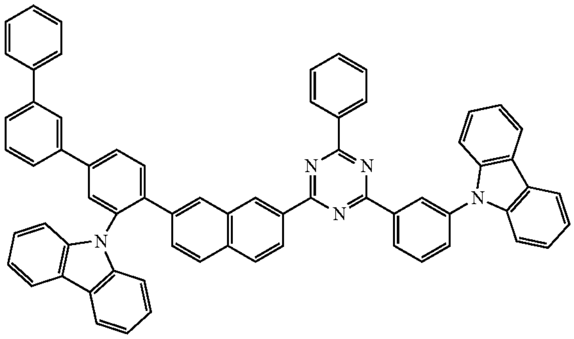
378
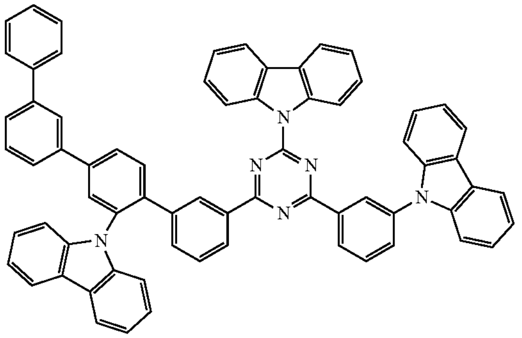
379
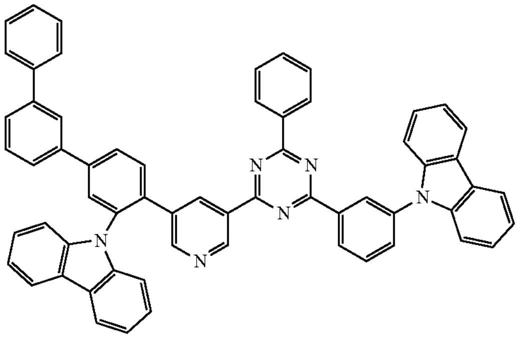
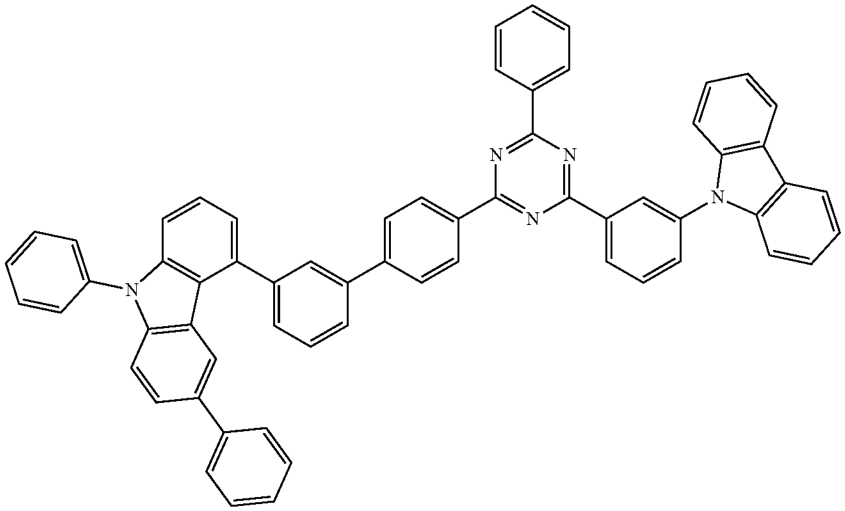

-continued
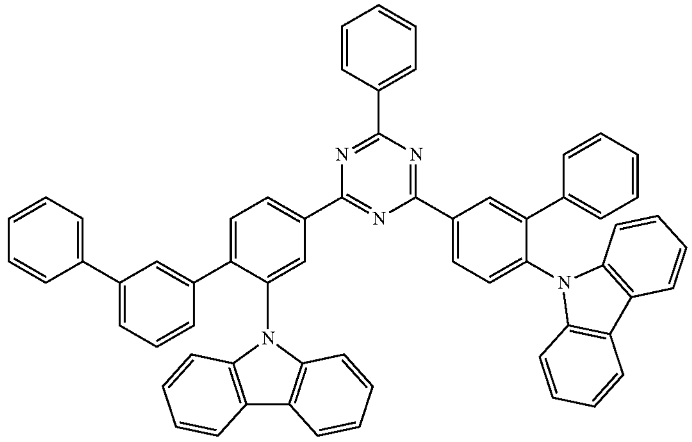
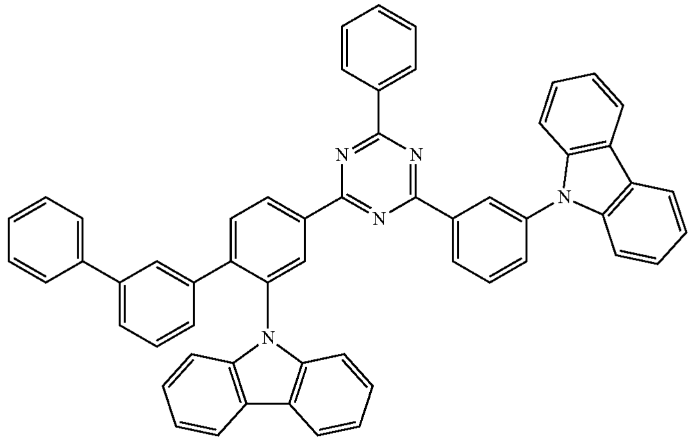
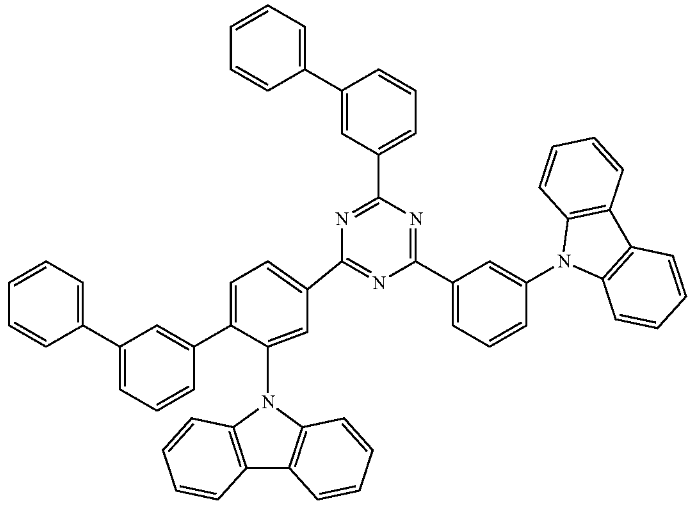

-continued
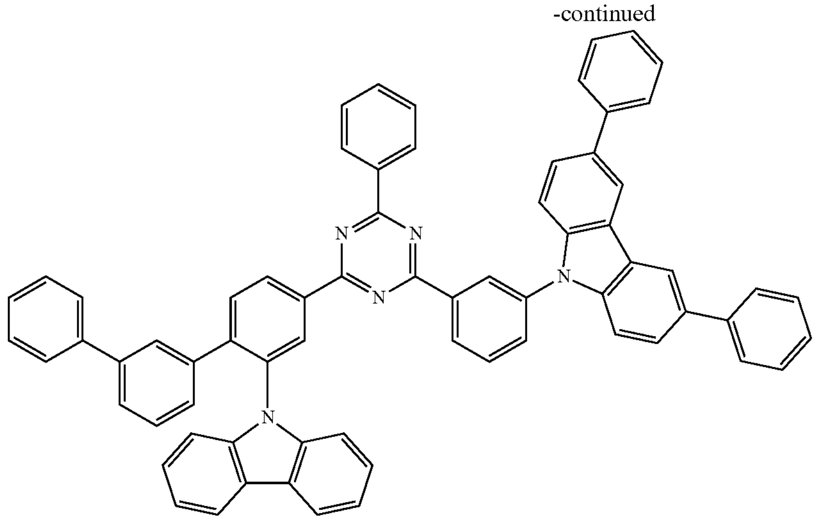
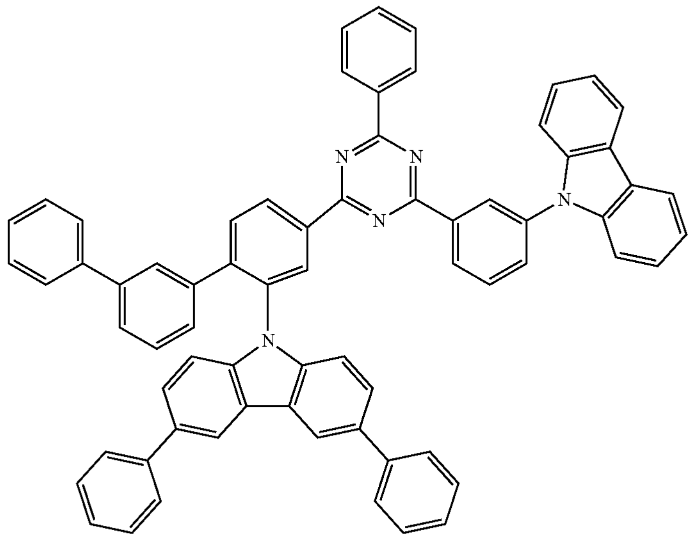
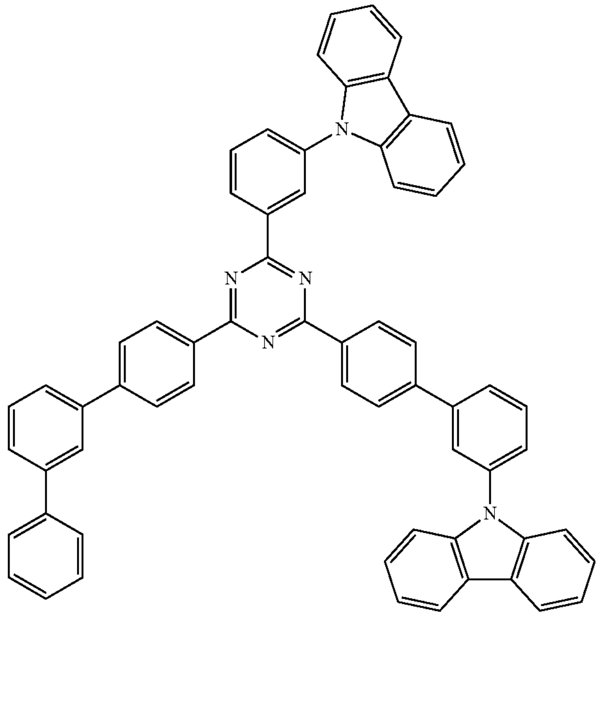

-continued
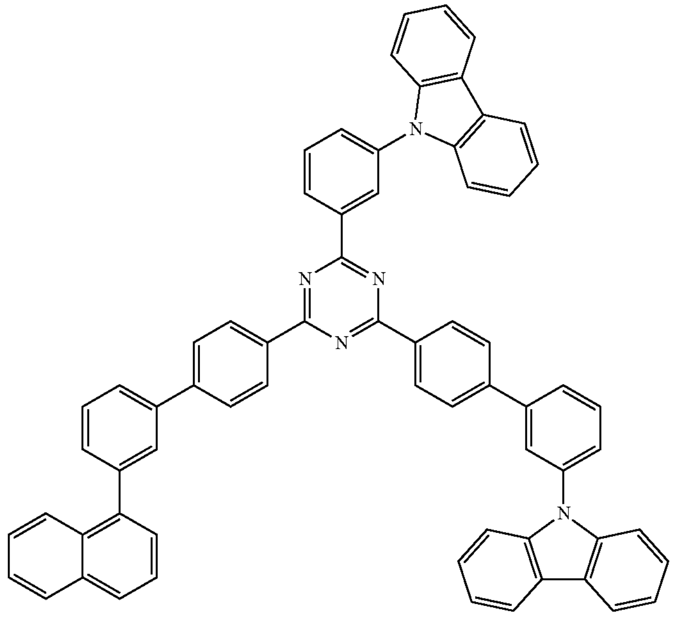
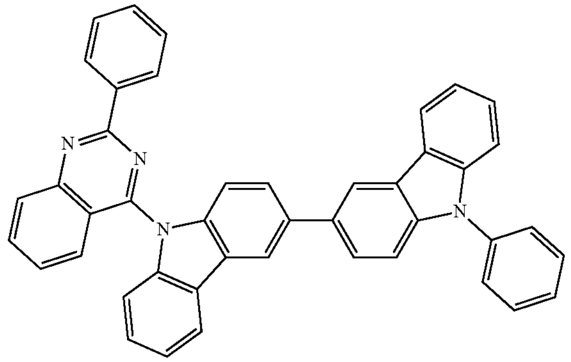
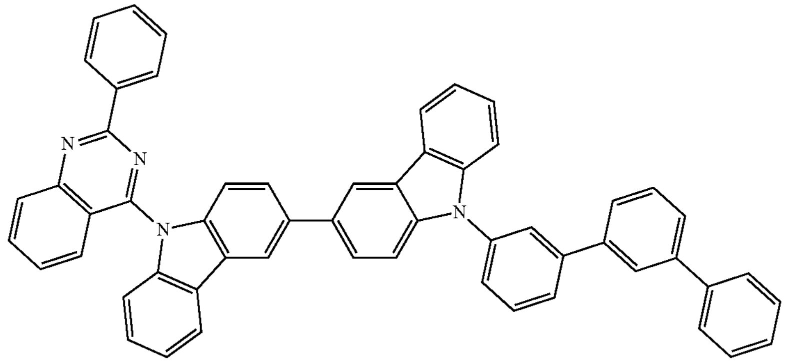

-continued
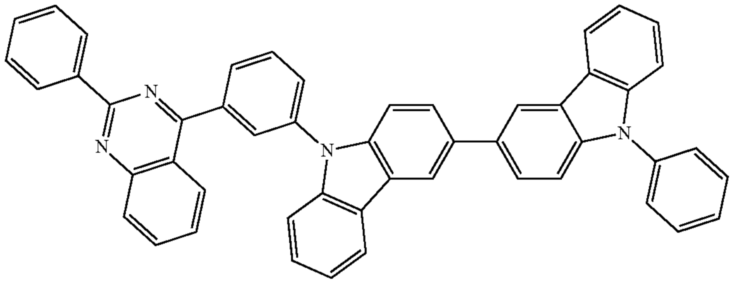
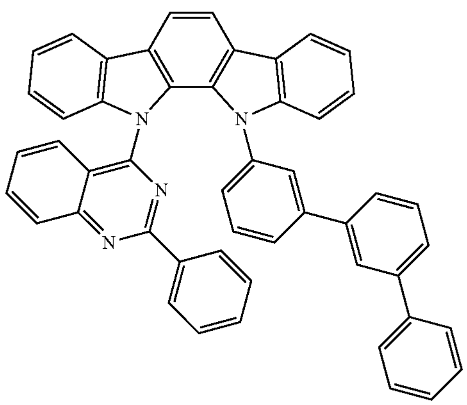
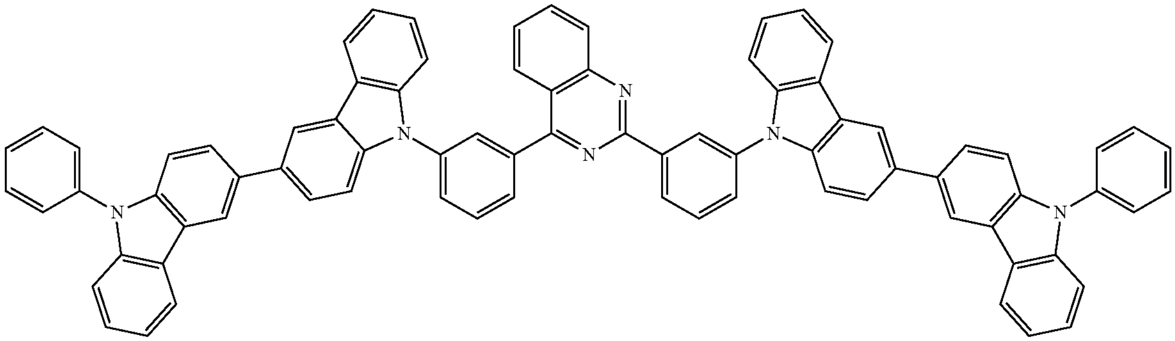
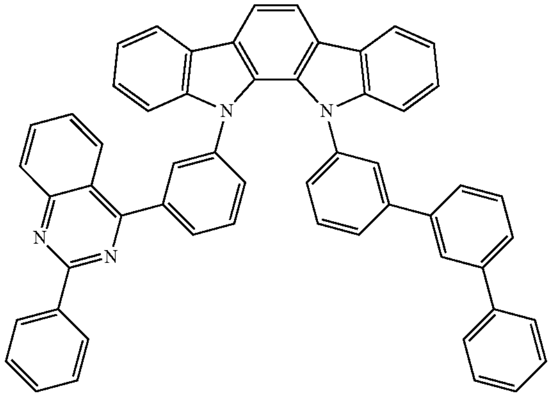
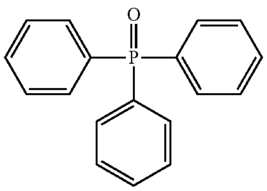
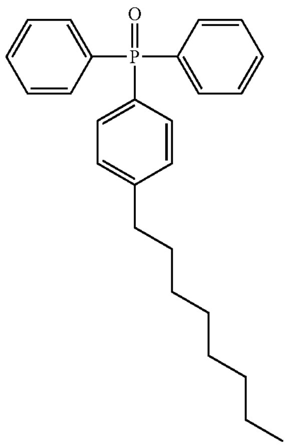
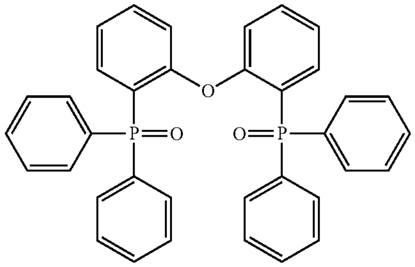
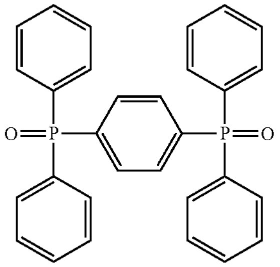
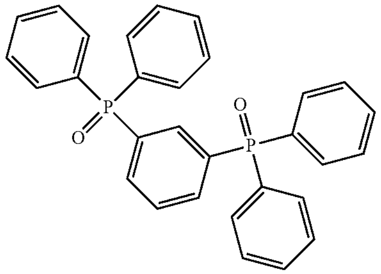

-continued
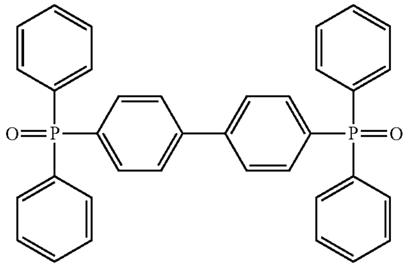
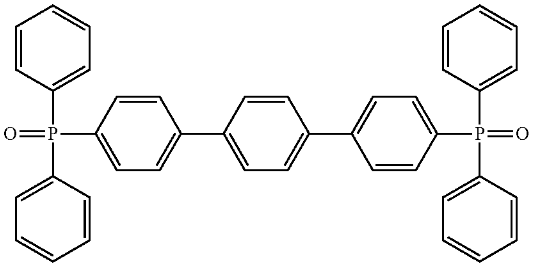
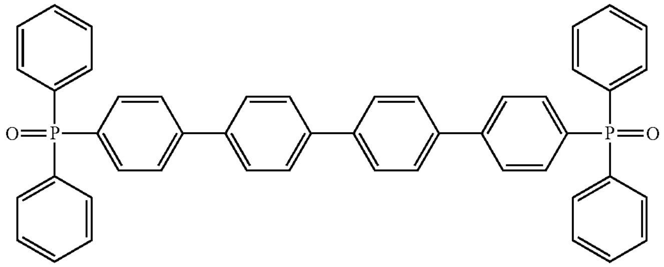
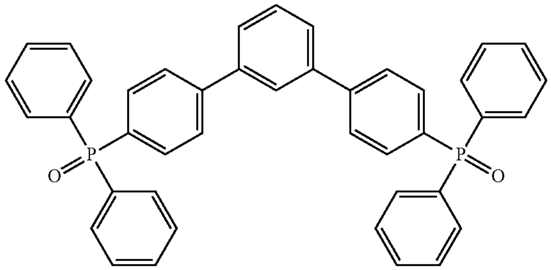
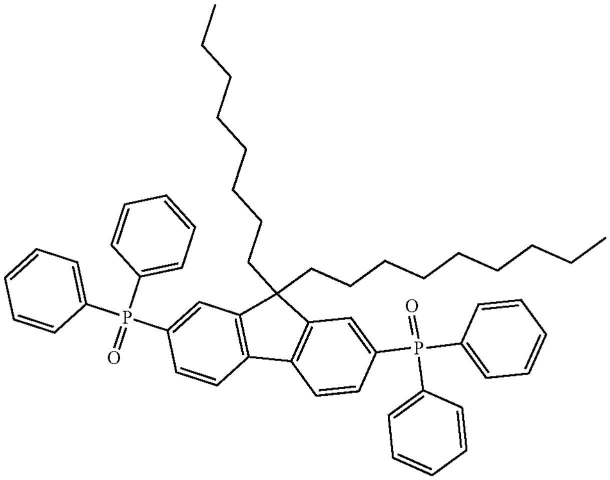
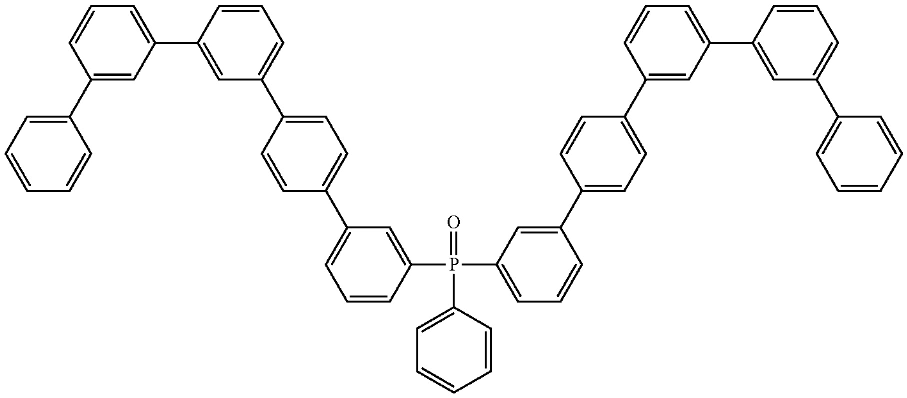

-continued
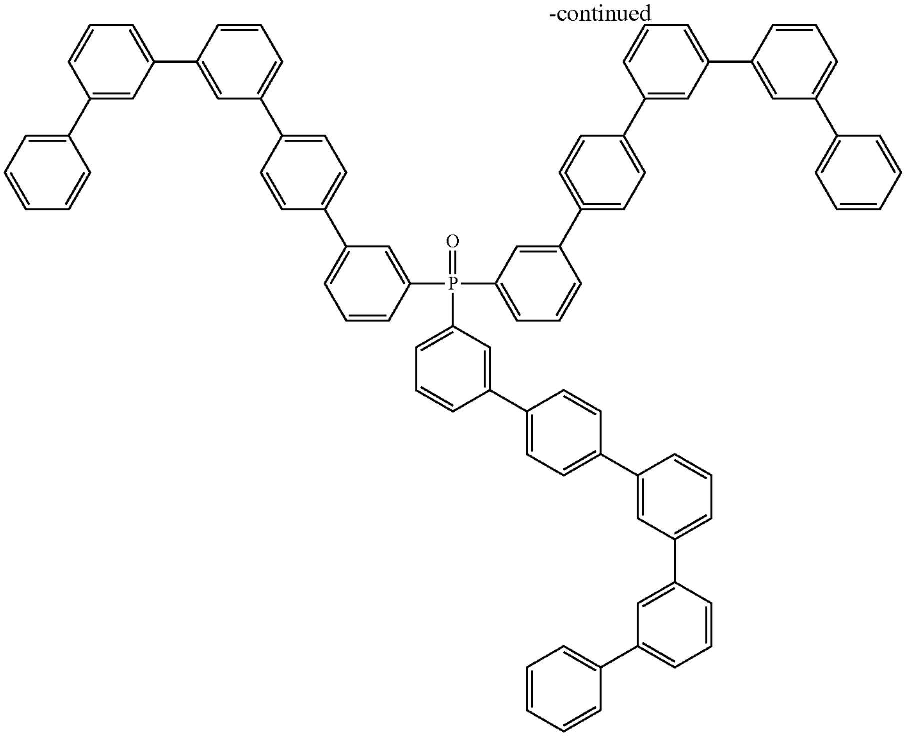
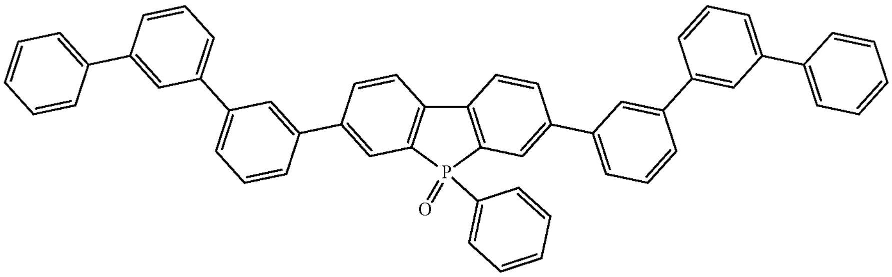
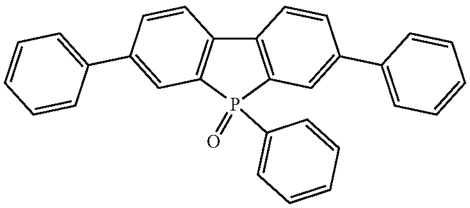
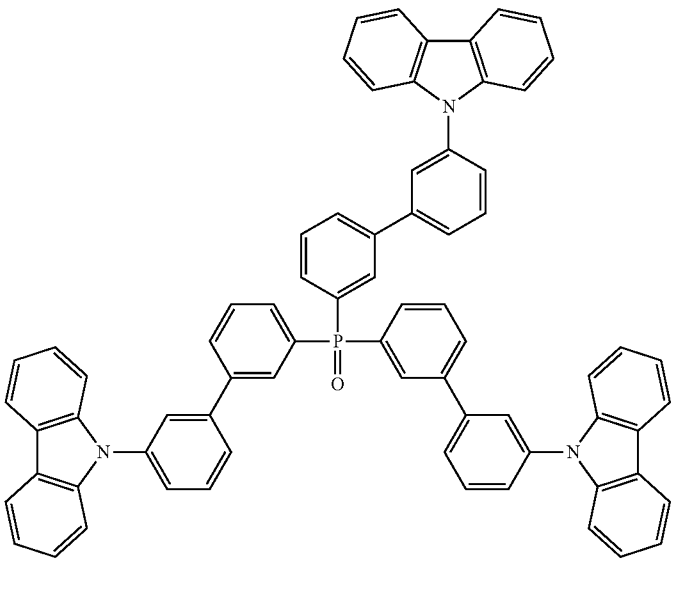

-continued
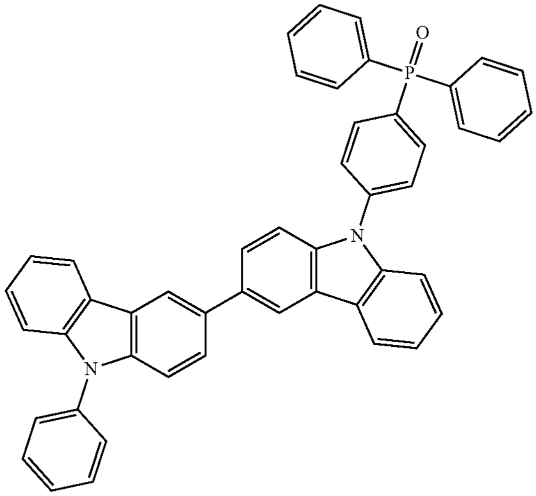
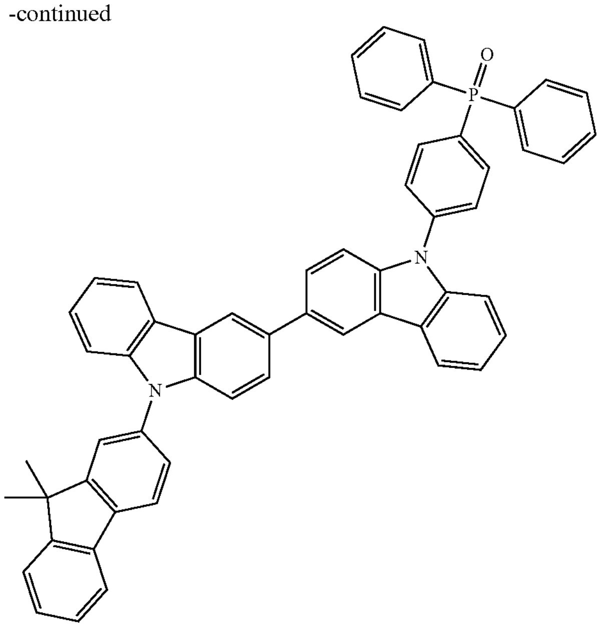
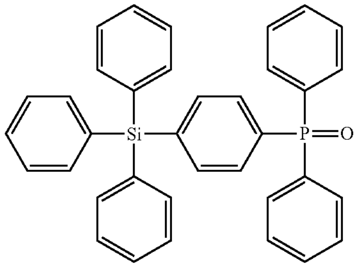
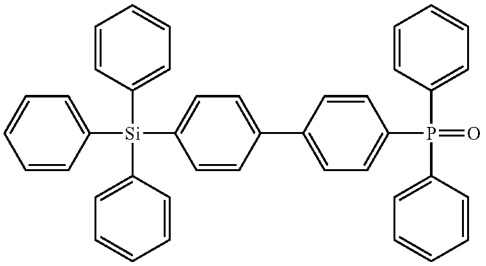
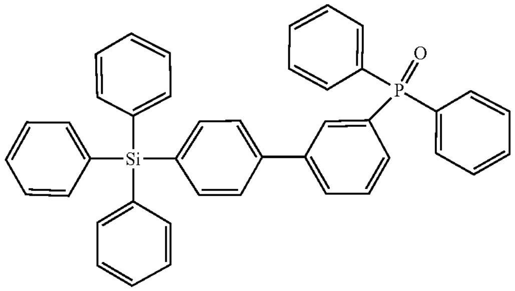
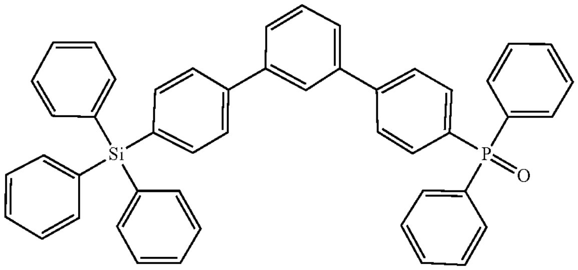
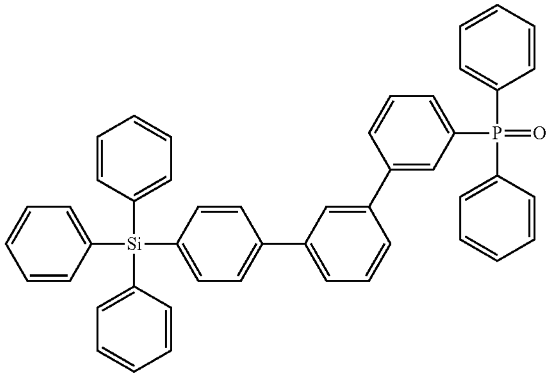
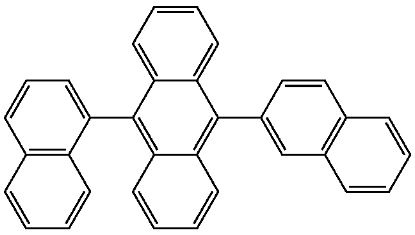

-continued
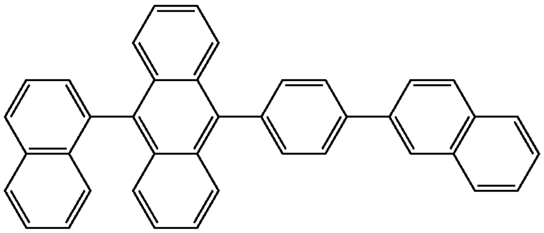
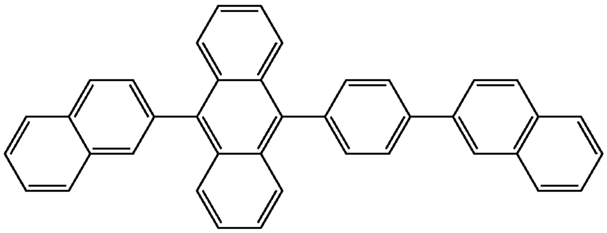
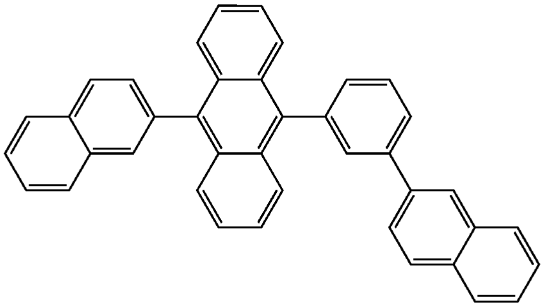
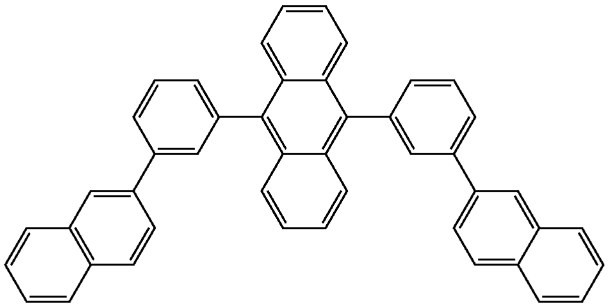
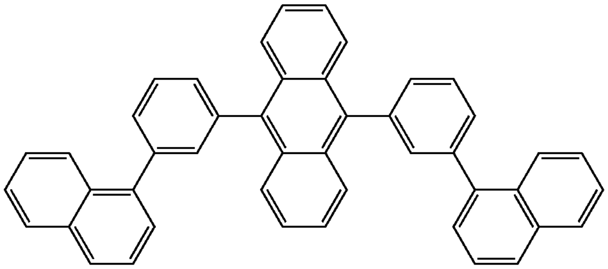
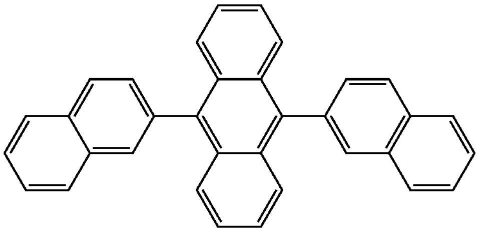
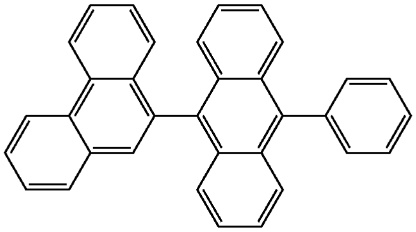
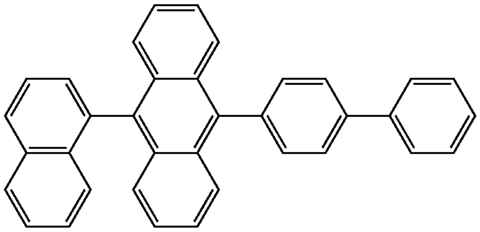
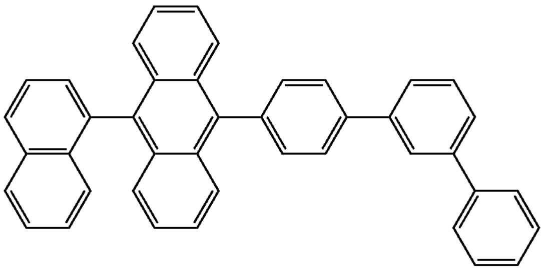
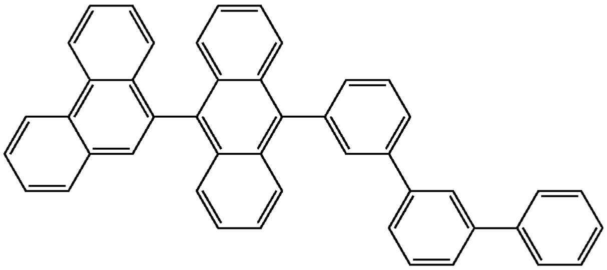

-continued
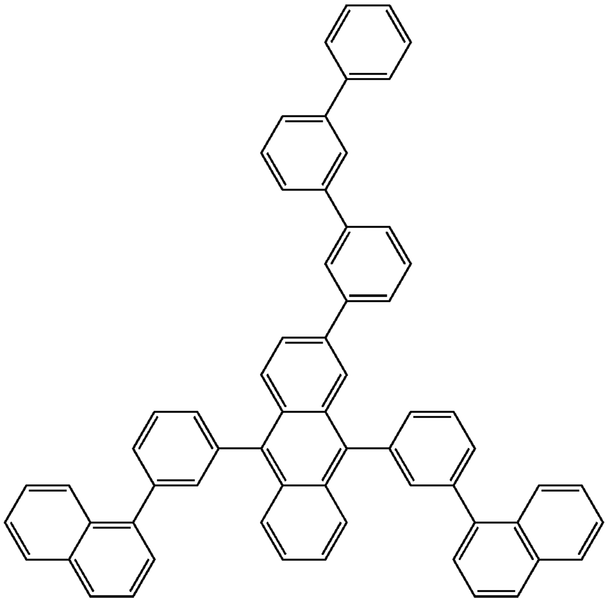
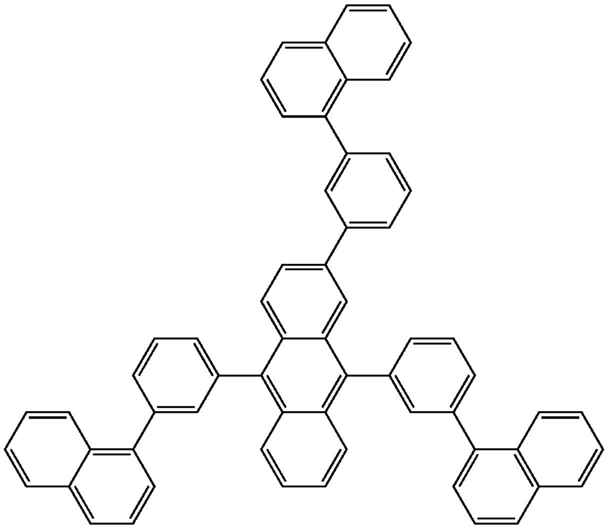
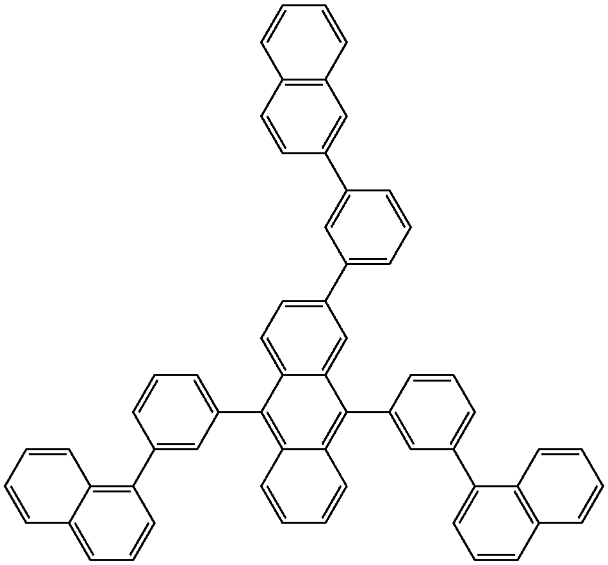

-continued
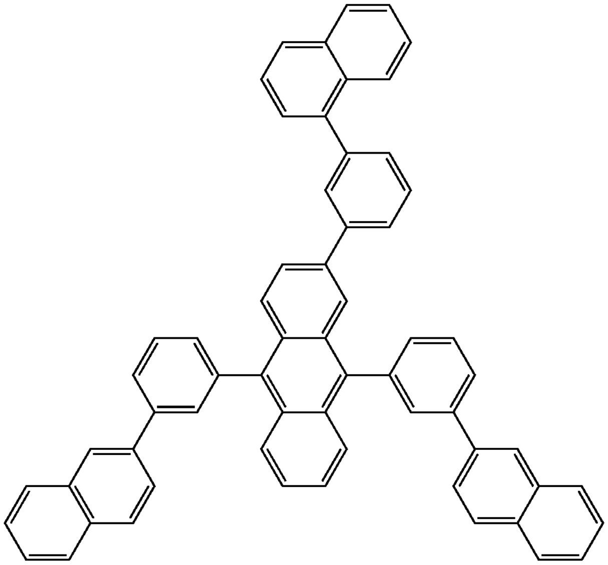
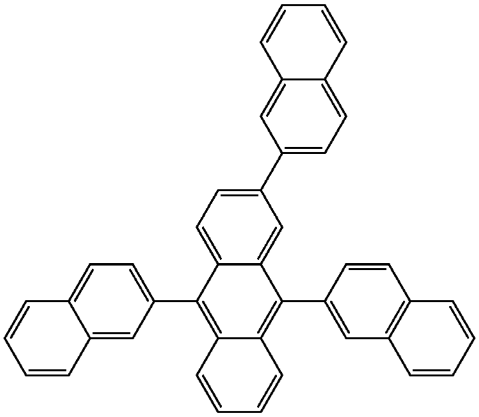
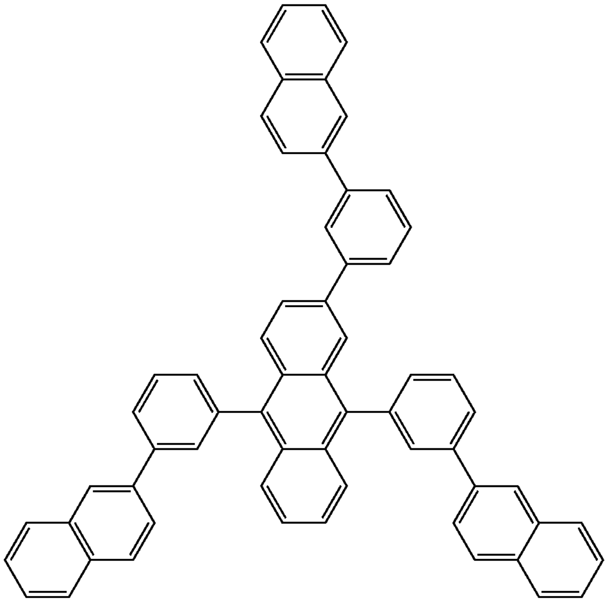
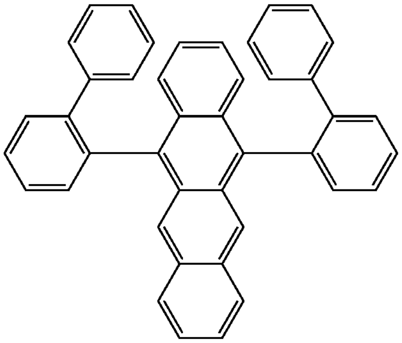
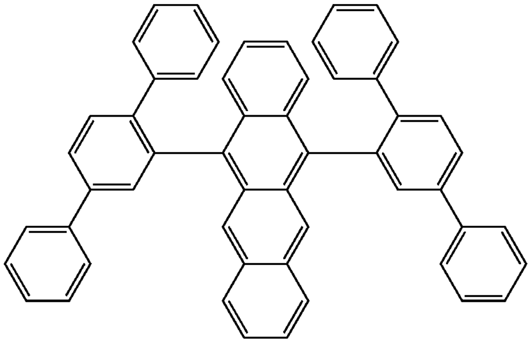

-continued
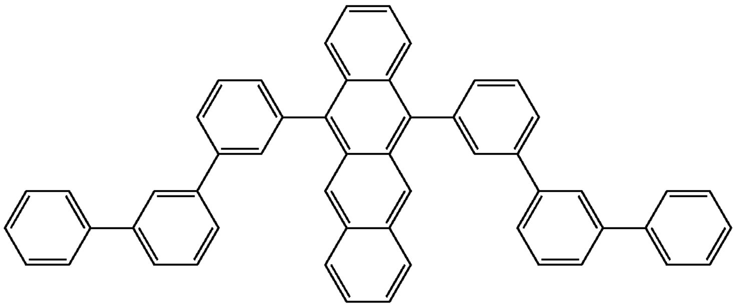
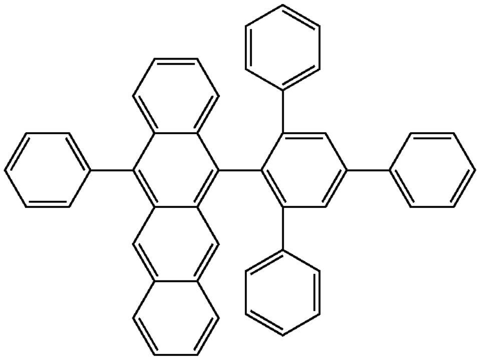
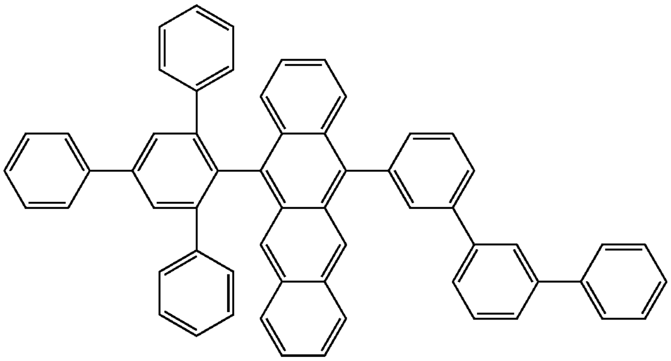
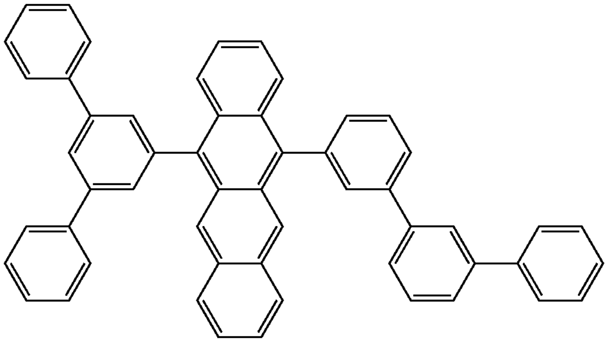
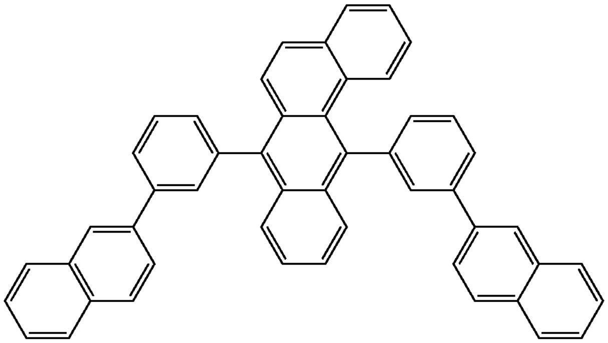
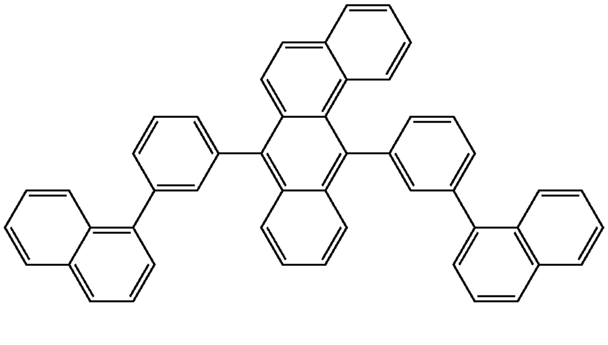

-continued
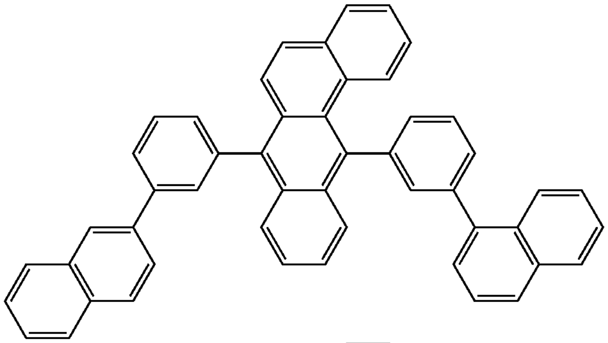
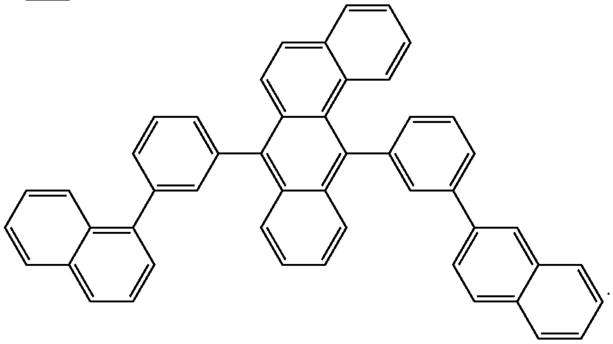
11. The organic light-emitting device of claim 1, wherein Formula 2-1 is represented by Formula 2-1(1),
Formula 2-2 is represented by Formula 2-2(1),
Formula 2-3 is represented by one of Formulae 2-3(1) to 2-3(3),
Formula 2-4 is represented by one of Formulae 2-4(1) to 2-4(3):
2-1(1)
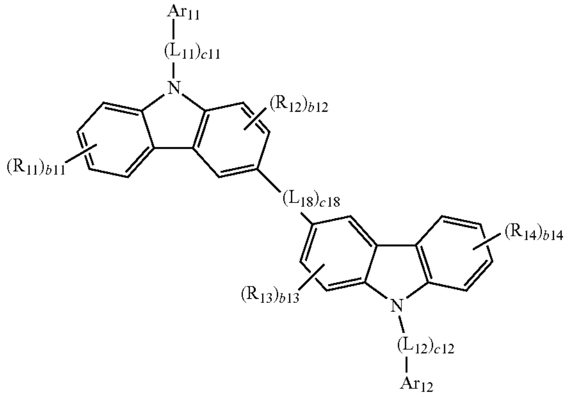
2-2(1)
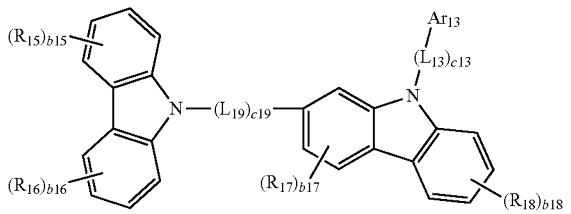
-continued
2-3(1)
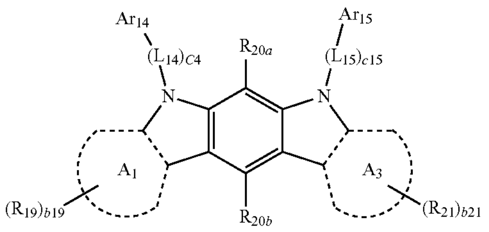
2-3(2)
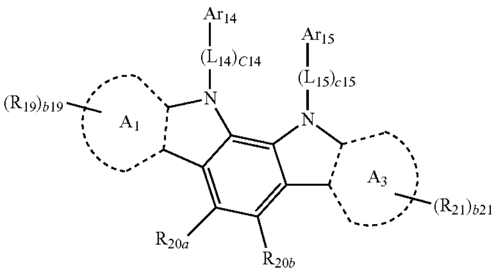
2-3(3)
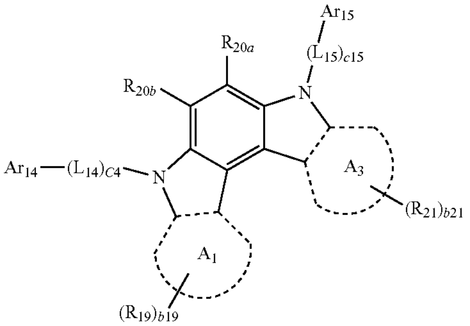

-continued 2-4(1)

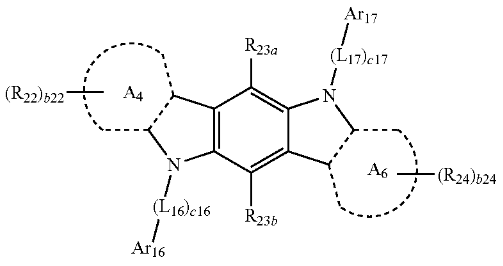

2-4(2)

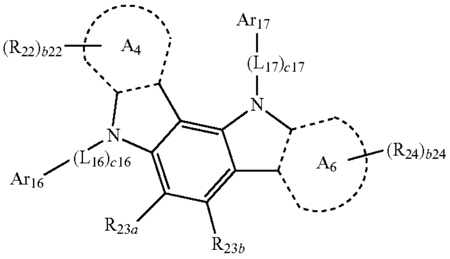

2-4(3)

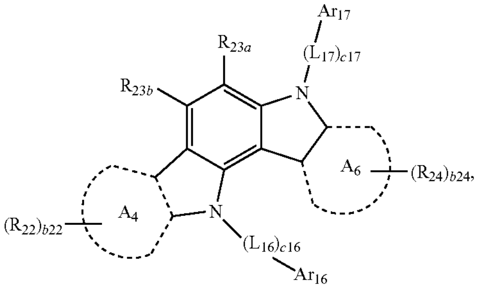

wherein, in Formulae 2-3(1) to 2-3(3), $R_{20a}$ and $R_{20b}$ are understood by referring to the description presented in connection with $R_{20}$ of claim 1, and in Formulae 2-4(1) to 2-4(3), $R_{23a}$ and $R_{23b}$ are understood by referring to the description presented in connection with $R_{23}$ of claim 1.

12. The organic light-emitting device of claim 1, wherein the second compound comprises at least one of the following compounds:

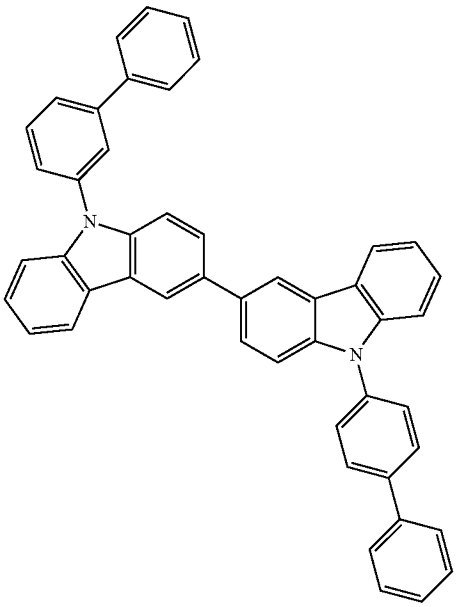

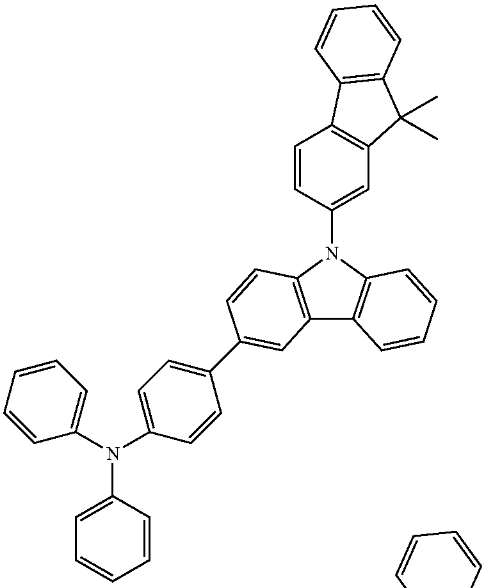

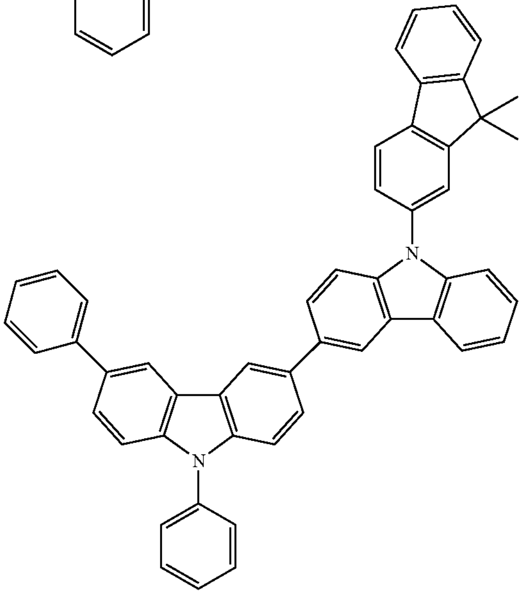

-continued
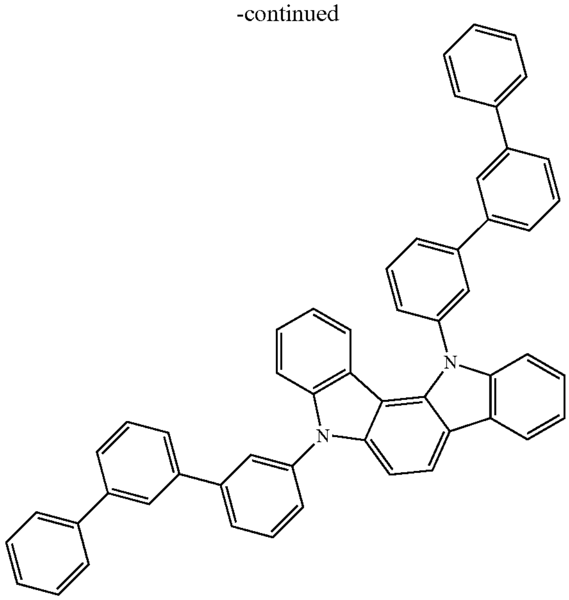
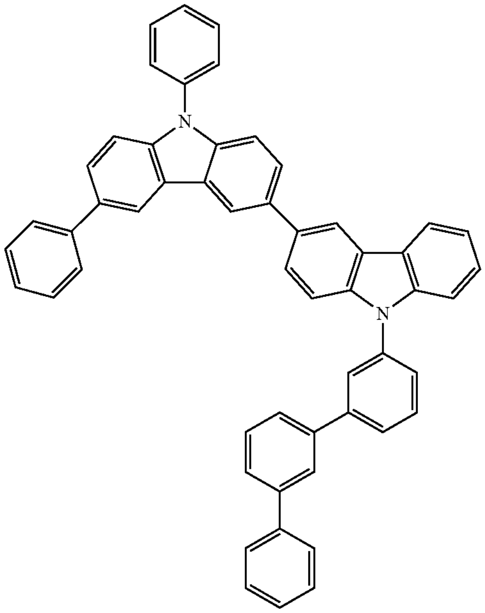
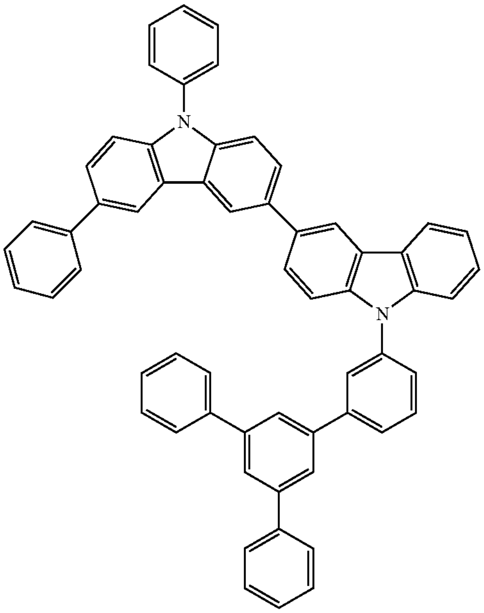
-continued
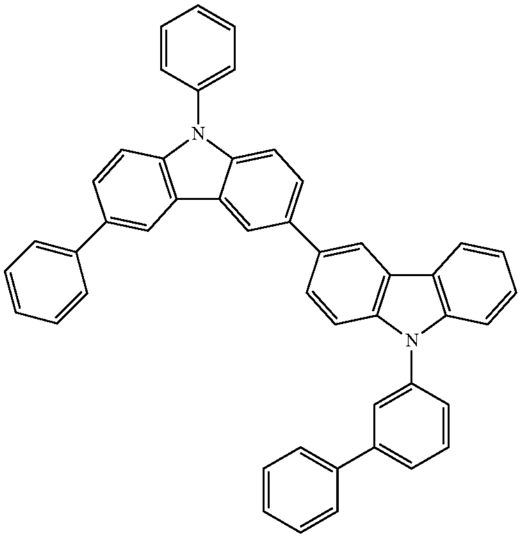
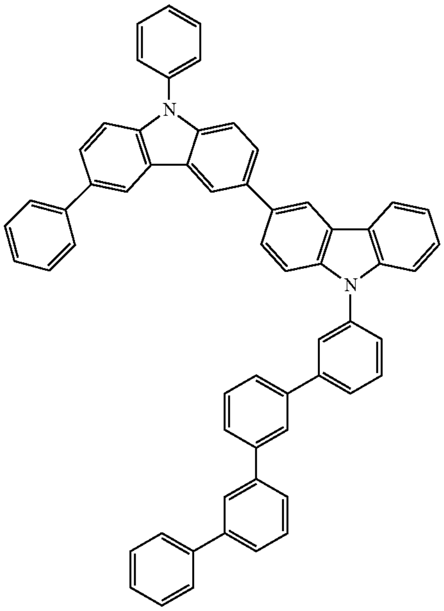

-continued
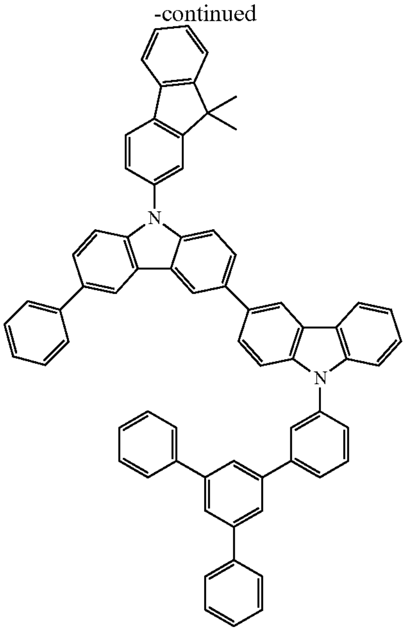
-continued
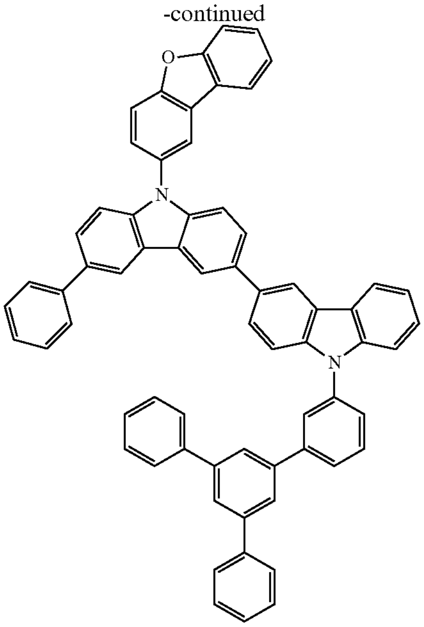
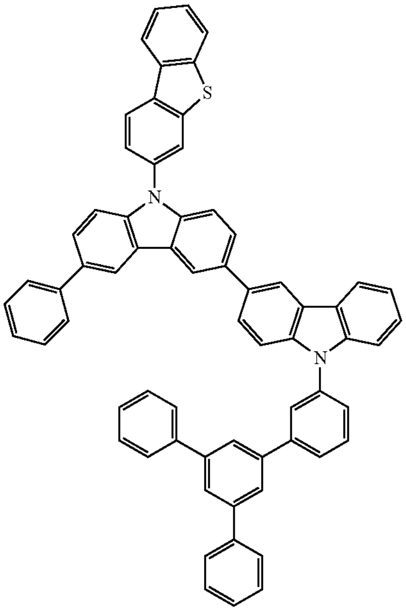 [SMILES: CC1(C)c2ccccc2-c2ccc(-n3c4ccc(-c5ccccc5)cc4c4cc(-c5ccc6c(c5)c5ccccc5n6-c5cccc(-c6cc(-c7ccccc7)cc(-c7ccccc7)c6)c5)ccc43)cc21]
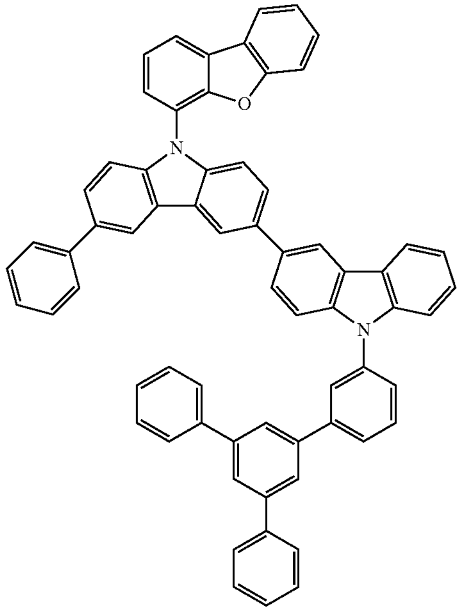

-continued
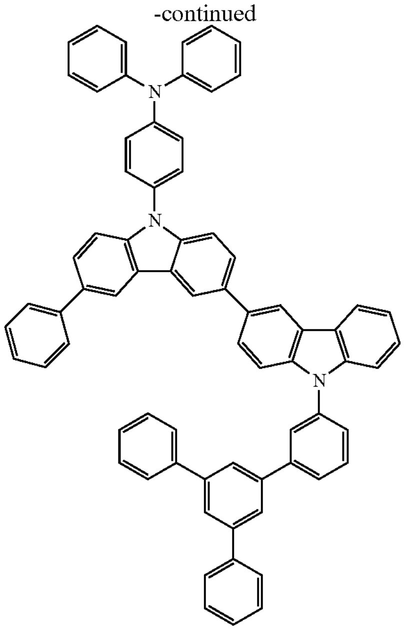
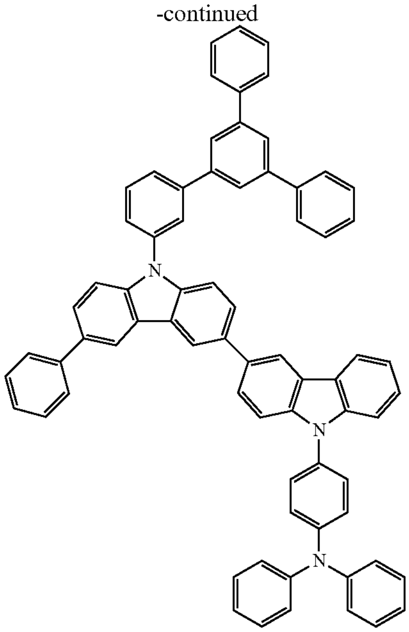
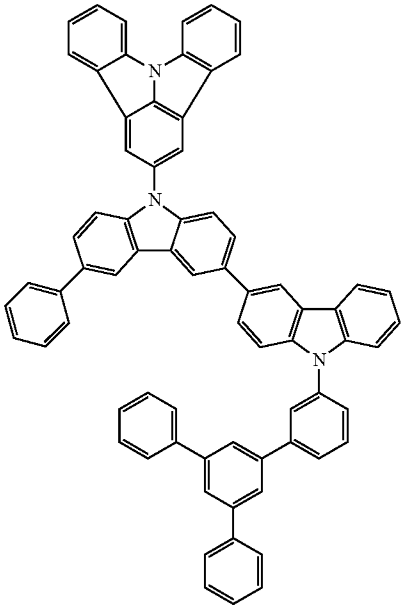
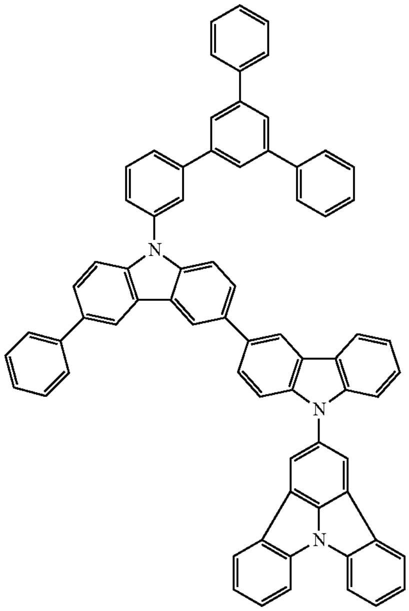 [SMILES: c1ccc(-c2cc(-c3ccccc3)cc(-c3cccc(-n4c5ccc(-c6ccccc6)cc5c5cc(-c6ccc7c(c6)c6ccccc6n7-c6cc7c8ccccc8n8c9ccccc9c(c6)c78)ccc54)c3)c2)cc1]

-continued
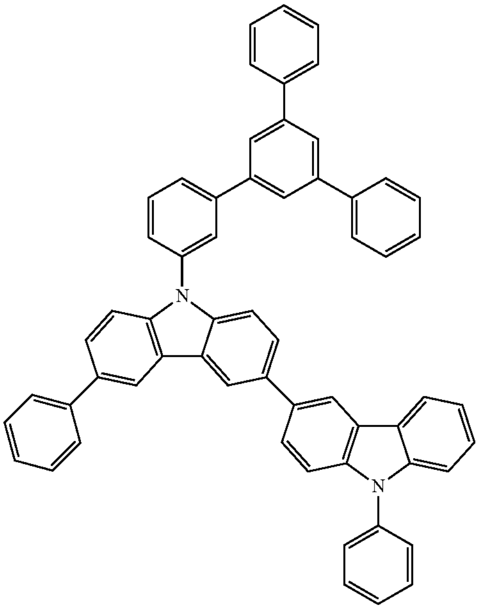
-continued
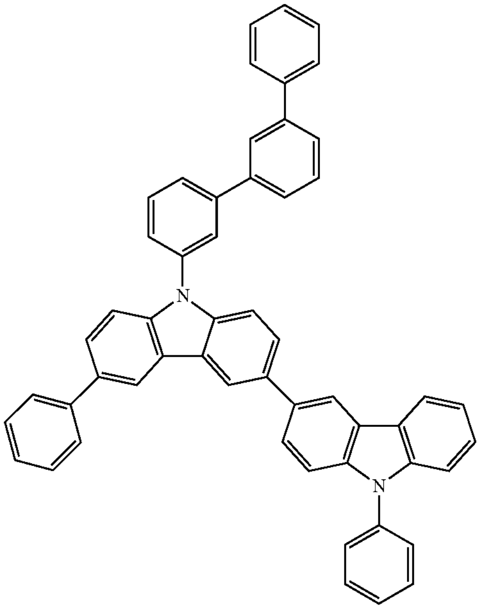
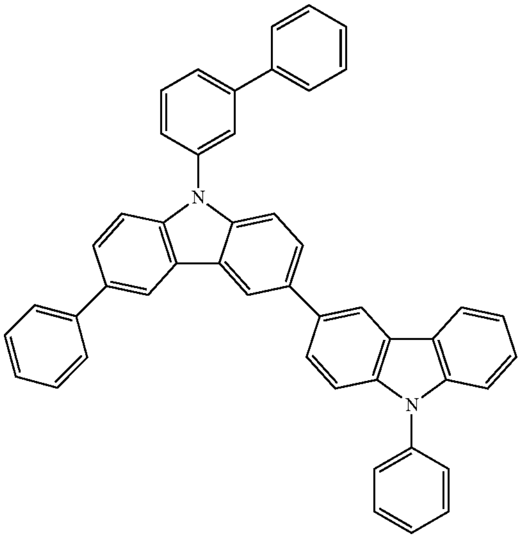
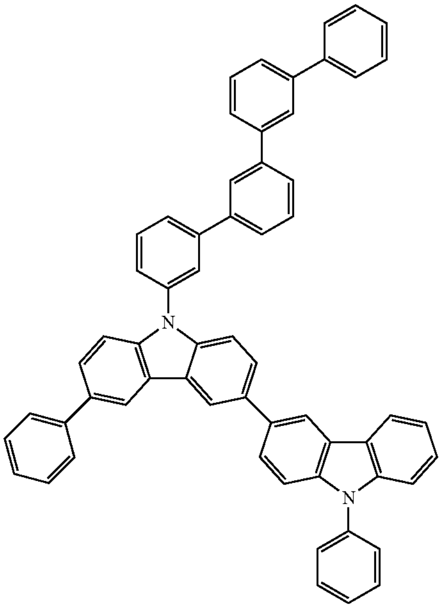

-continued
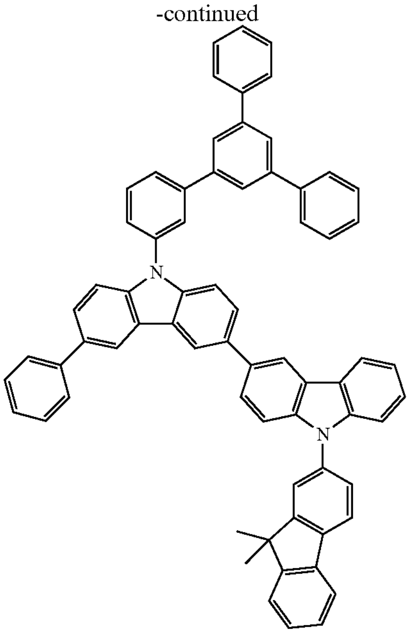
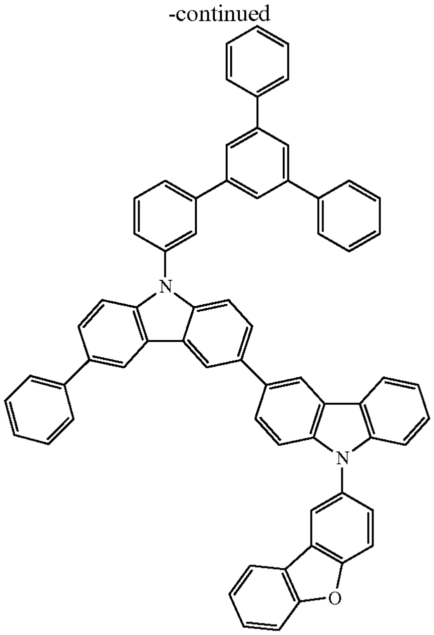
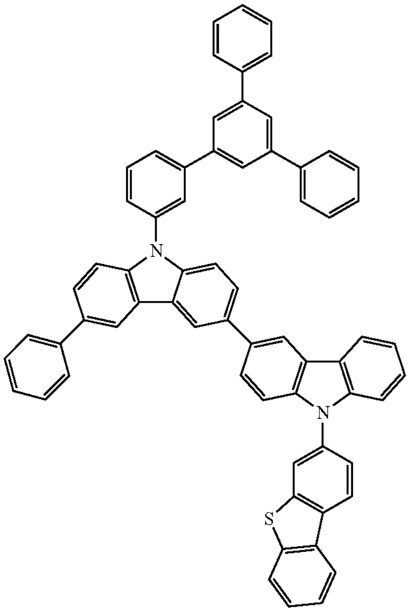
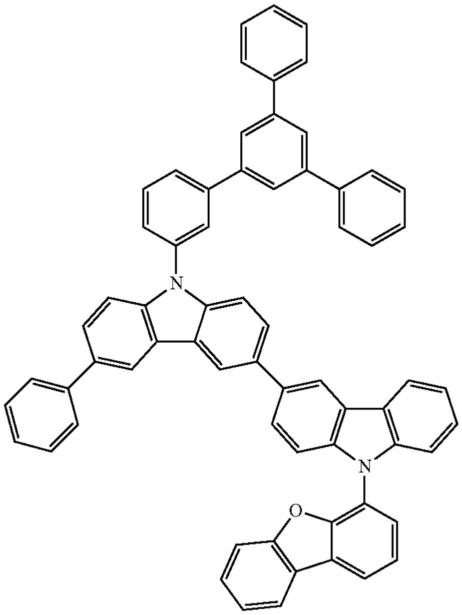
-continued

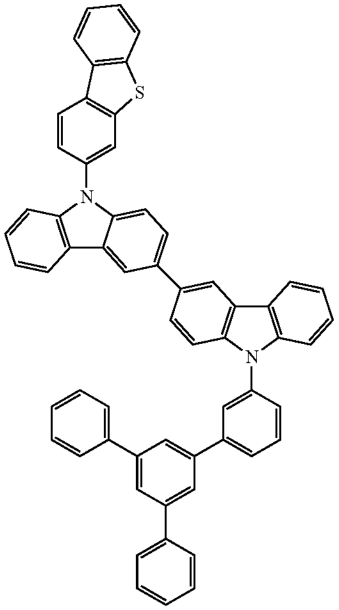
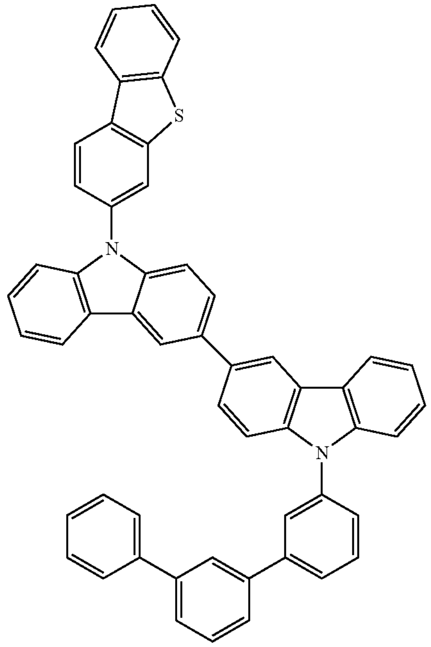
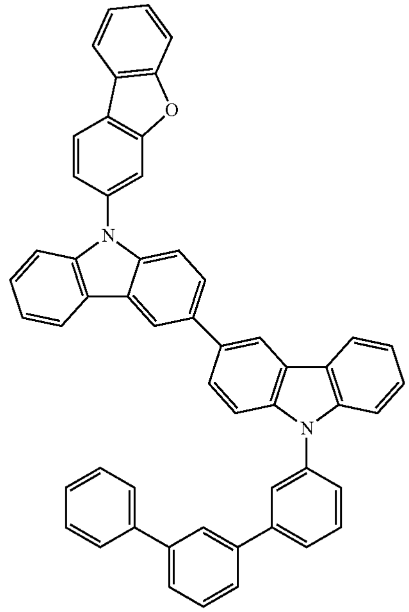
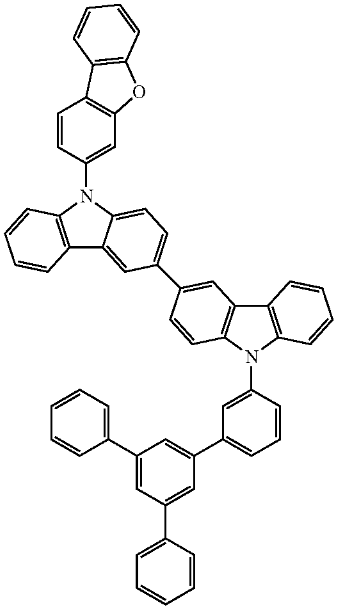
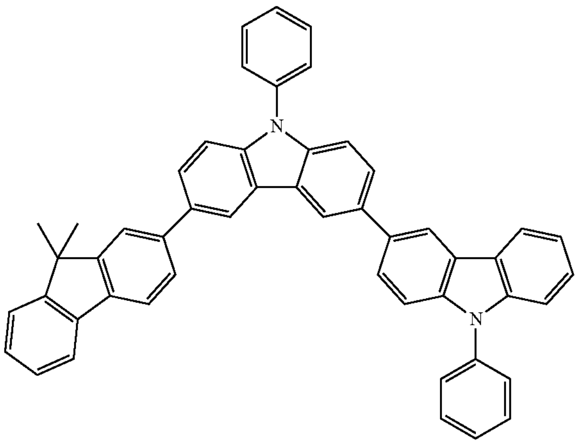

-continued
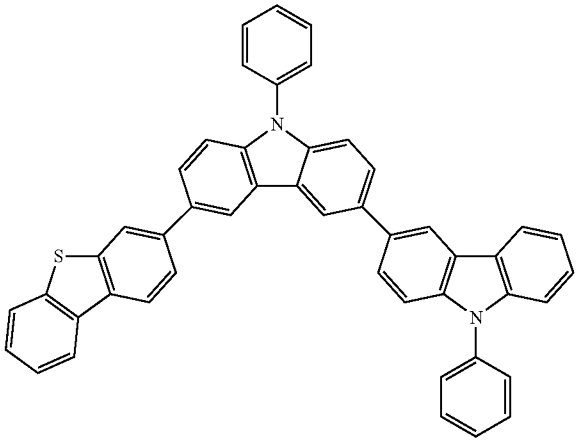
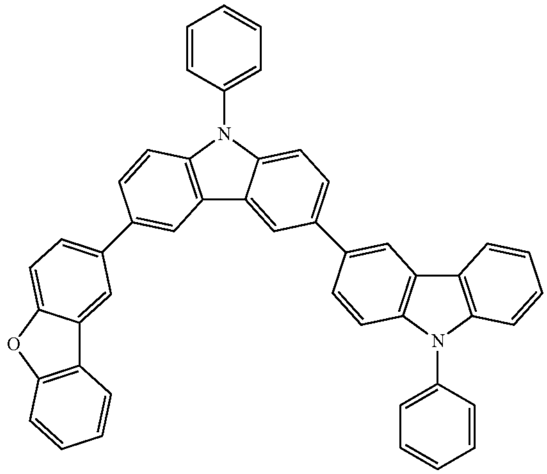
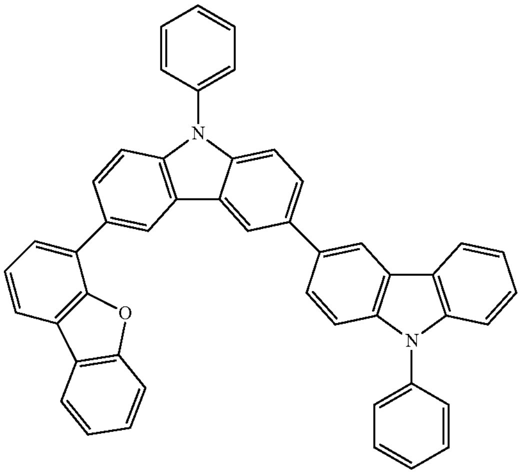
-continued
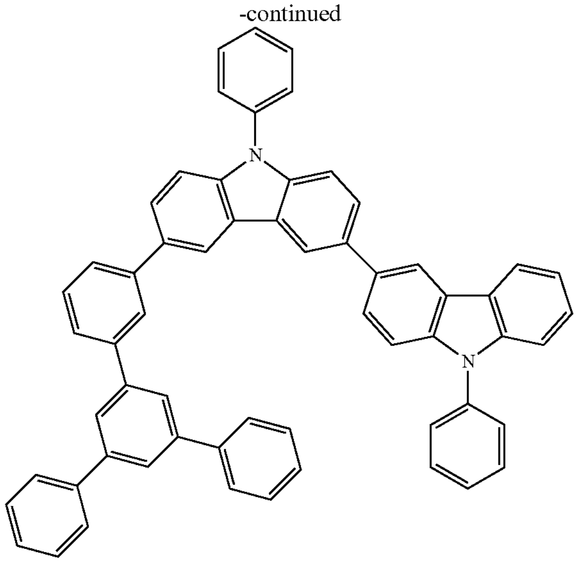
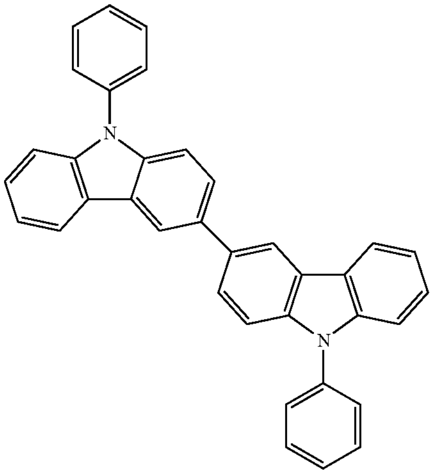
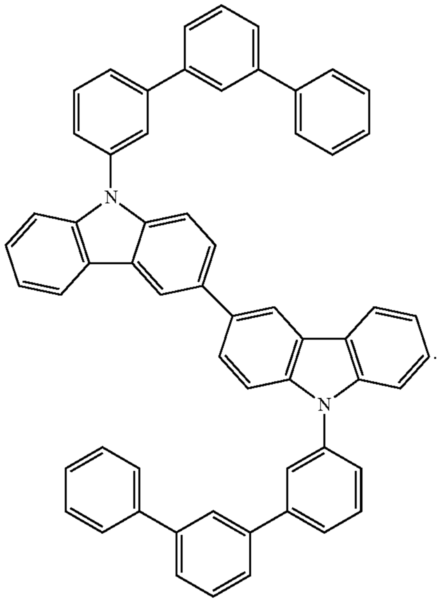 [SMILES: c1ccc(-c2cccc(-c3cccc(-n4c5ccccc5c5cc(-c6ccc7c(c6)c6ccccc6n7-c6cccc(-c7cccc(-c8ccccc8)c7)c6)ccc54)c3)c2)cc1]
13. The organic light-emitting device of claim 1, wherein the third compound comprises at least one of the following compounds:

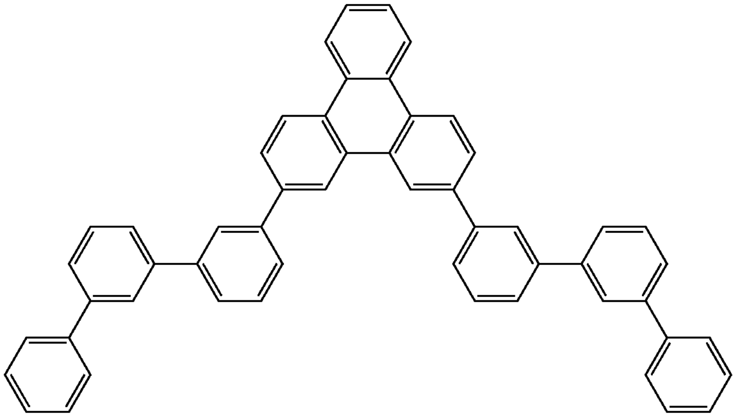
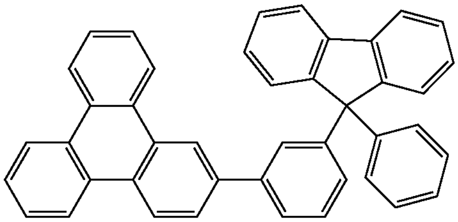
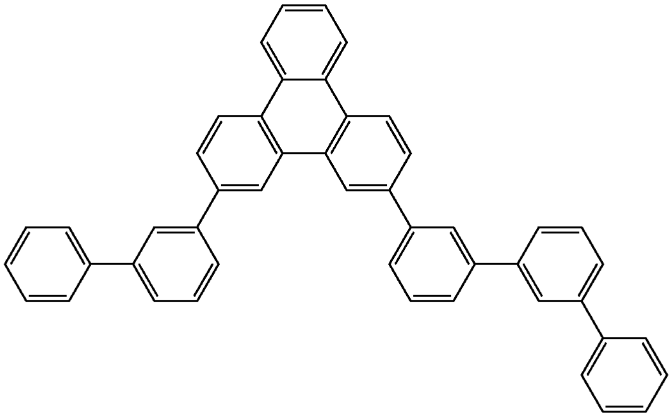
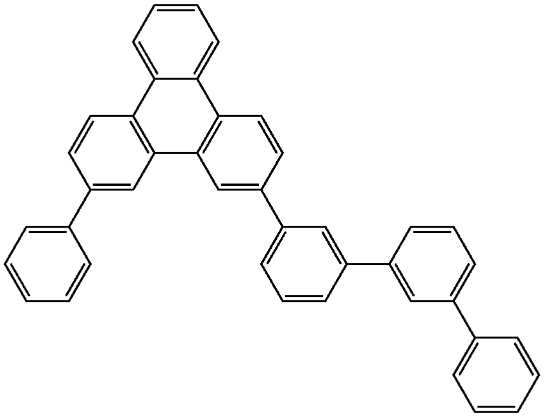
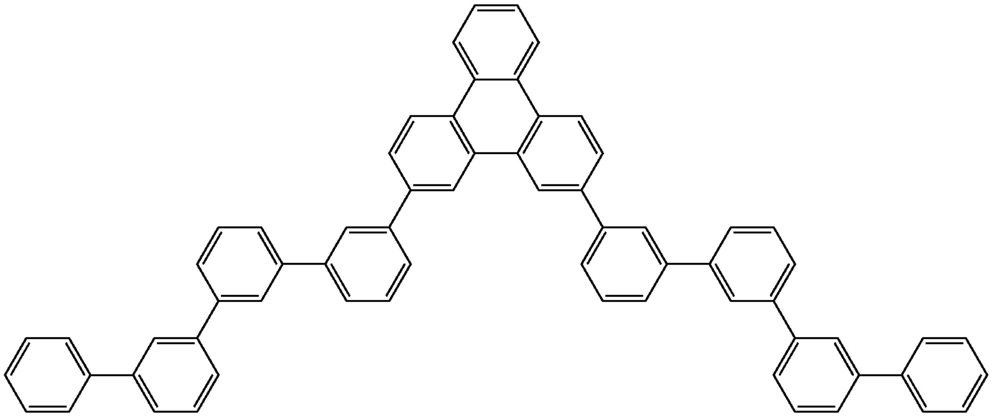

-continued
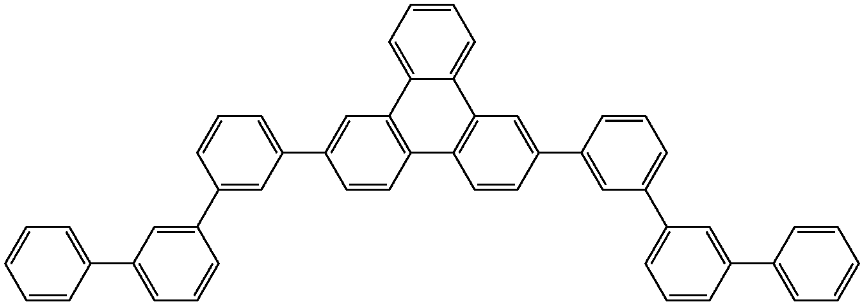
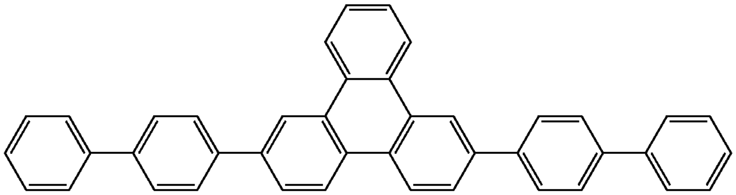
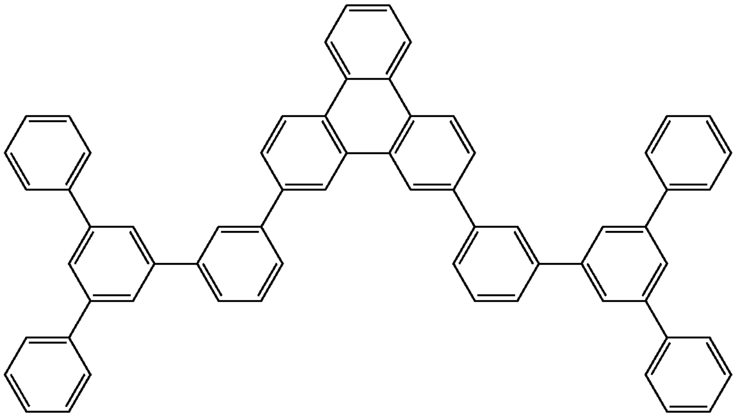
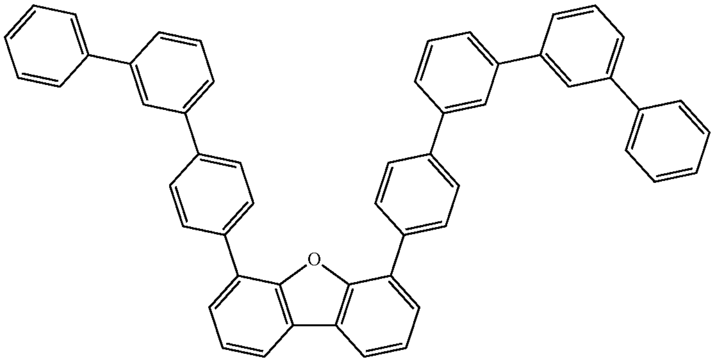
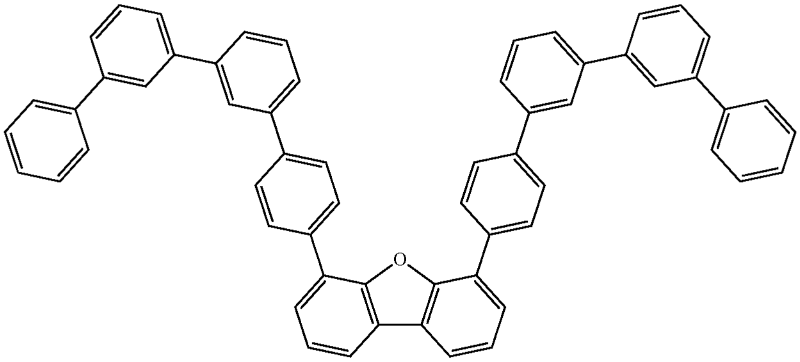

-continued
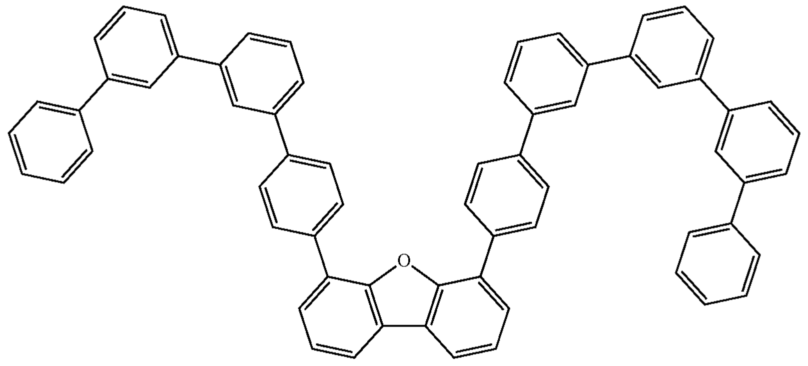
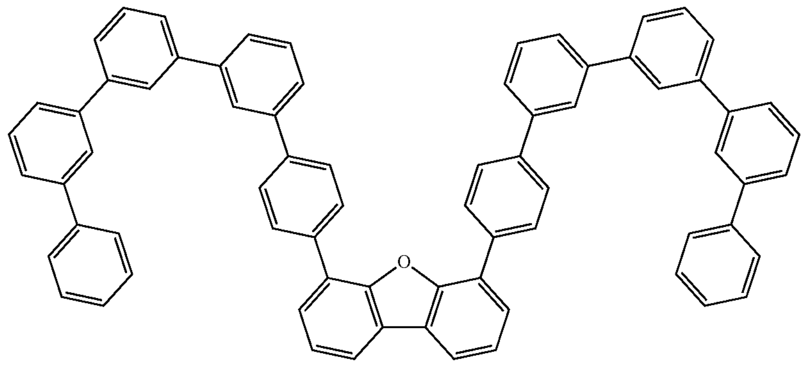
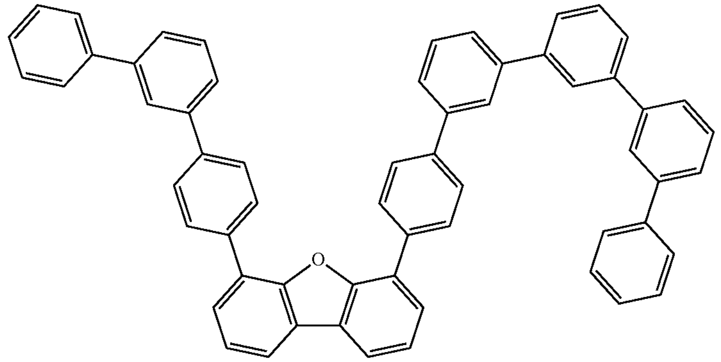
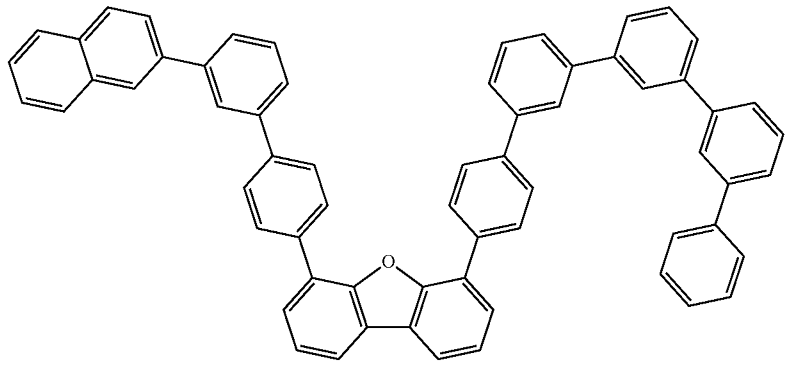

-continued
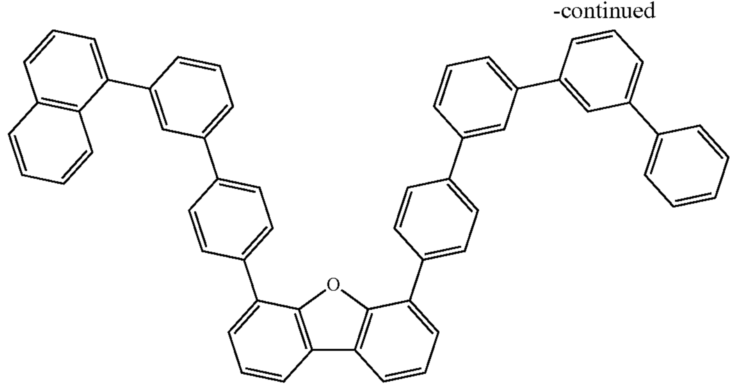
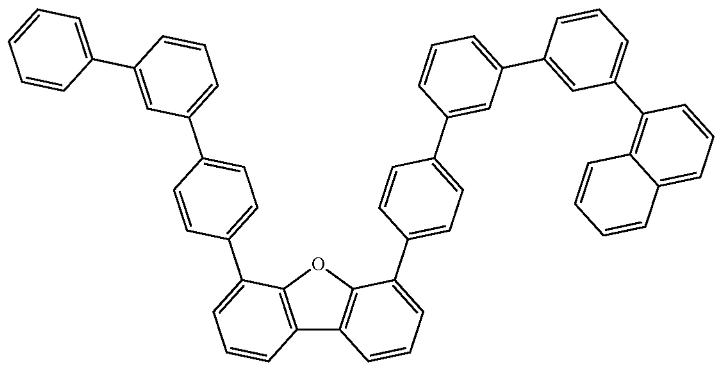
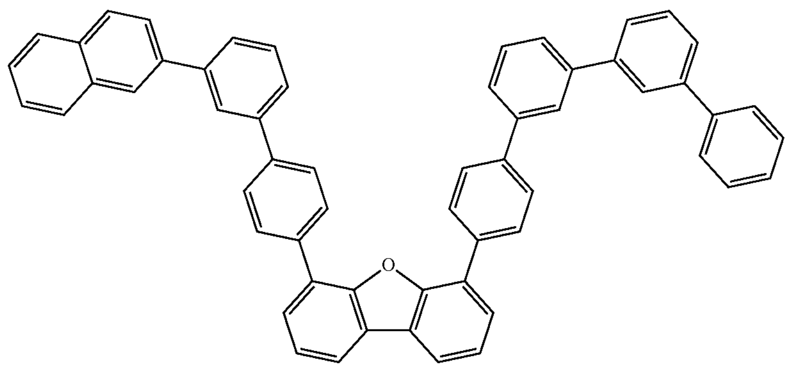
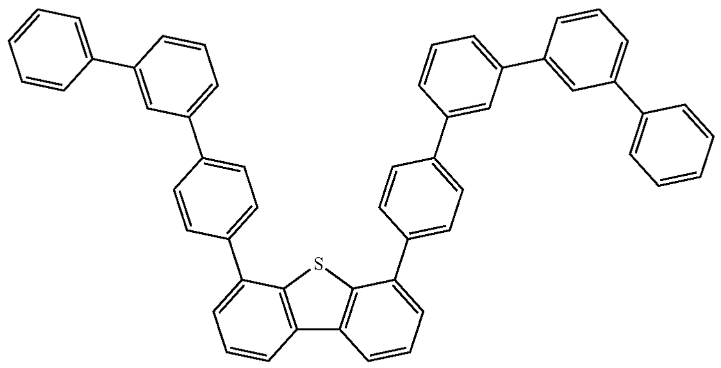

-continued
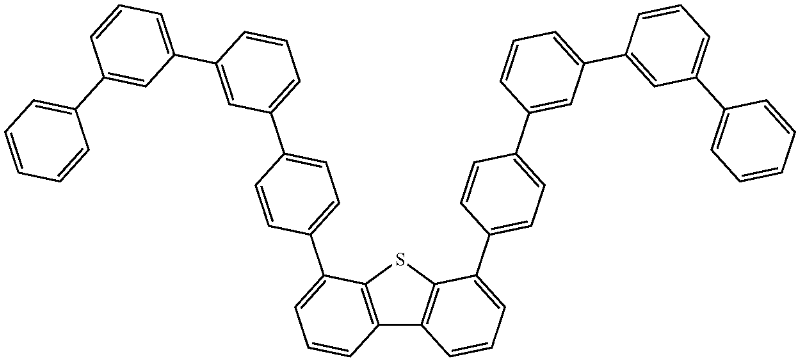
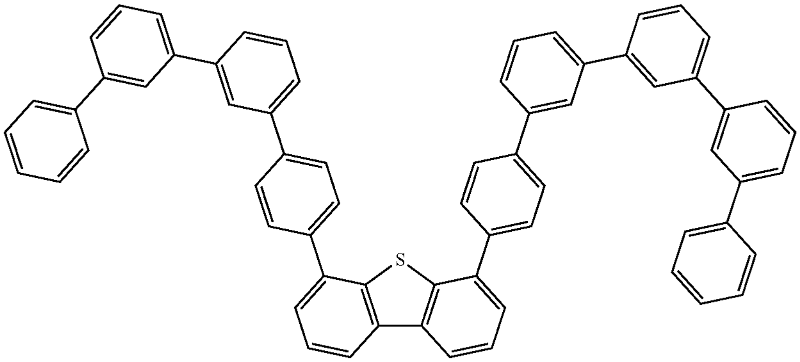
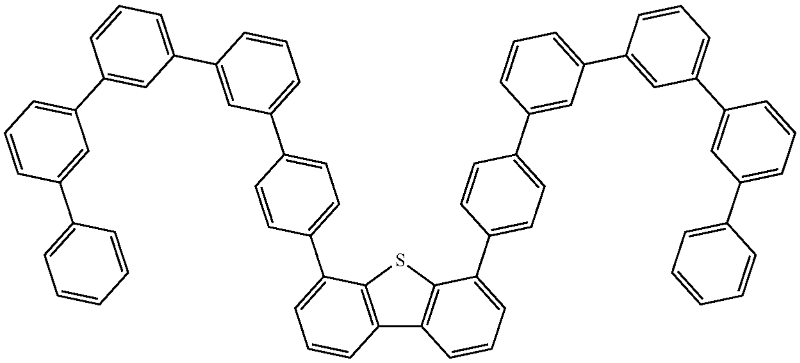
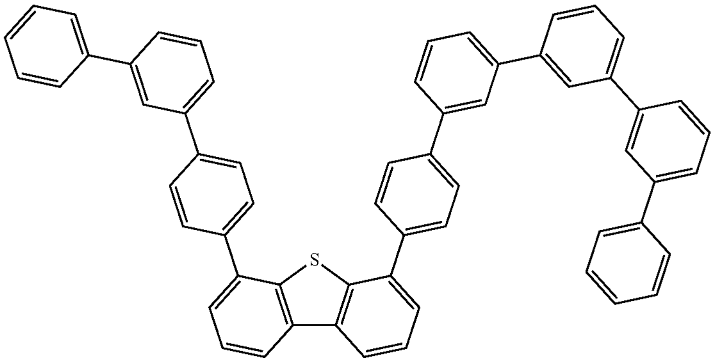

-continued
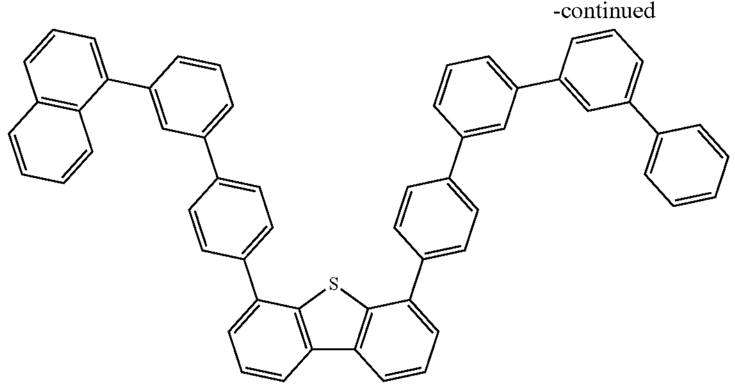
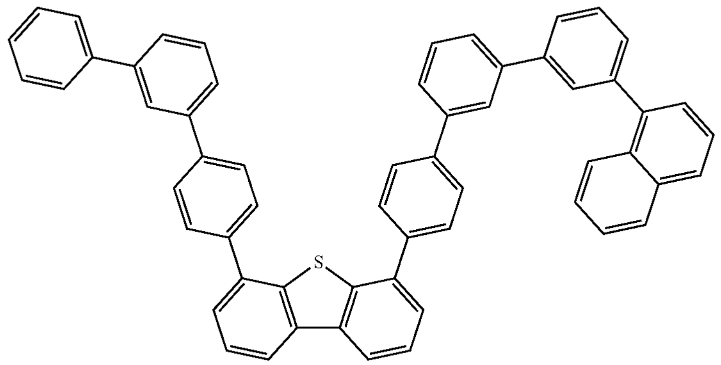
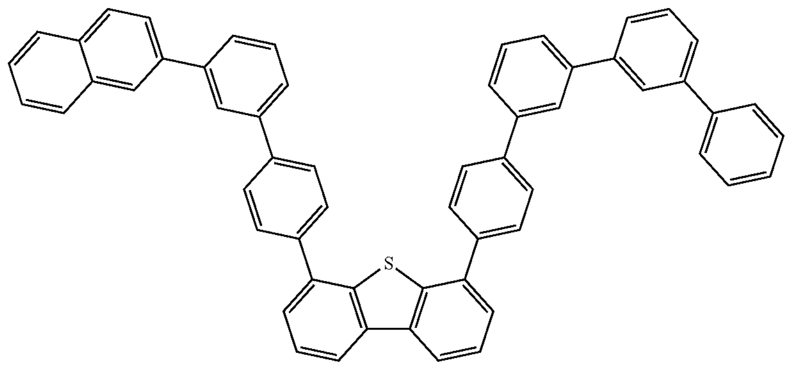
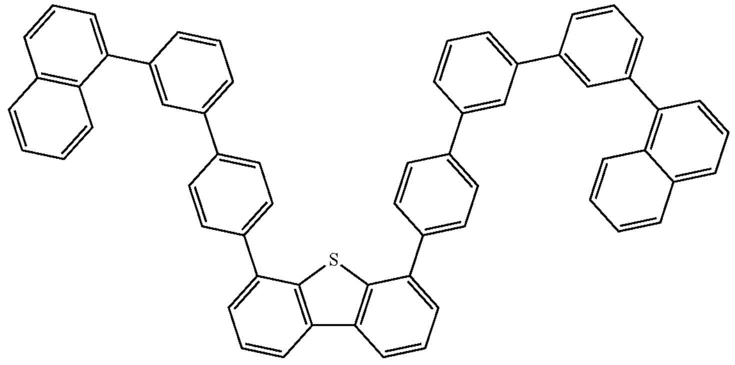

-continued
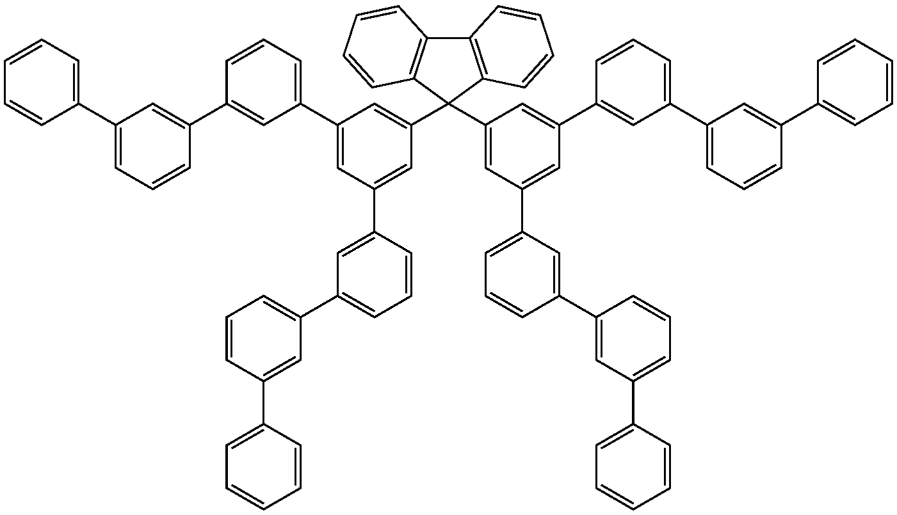 [SMILES: c1ccc(-c2cccc(-c3cccc(-c4cc(-c5cccc(-c6cccc(-c7ccccc7)c6)c5)cc(C5(c6cc(-c7cccc(-c8cccc(-c9ccccc9)c8)c7)cc(-c7cccc(-c8cccc(-c9ccccc9)c8)c7)c6)c6ccccc6-c6ccccc65)c4)c3)c2)cc1]
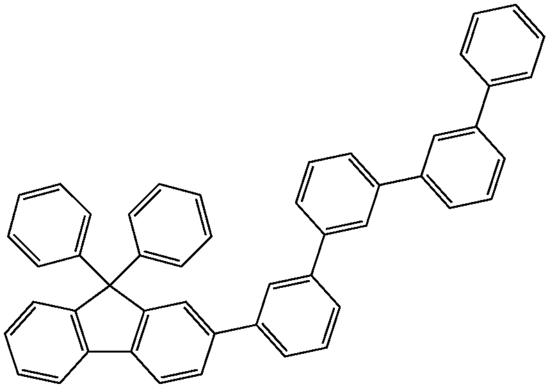
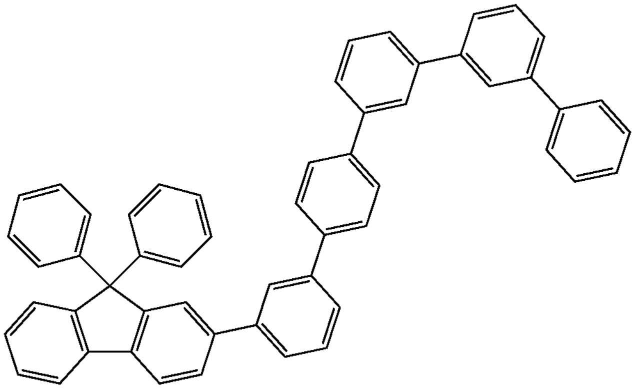
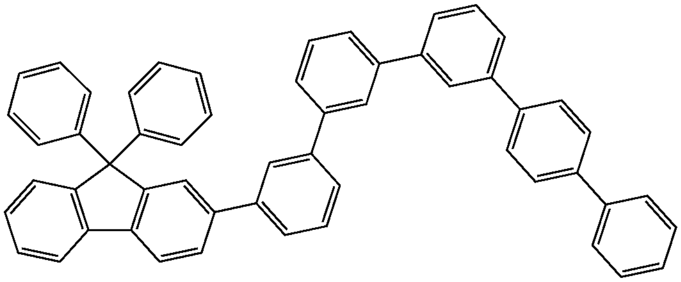
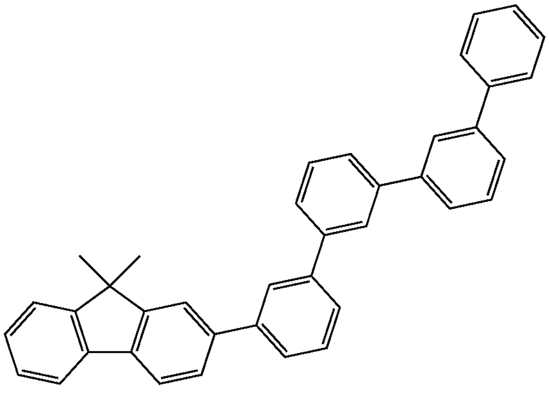
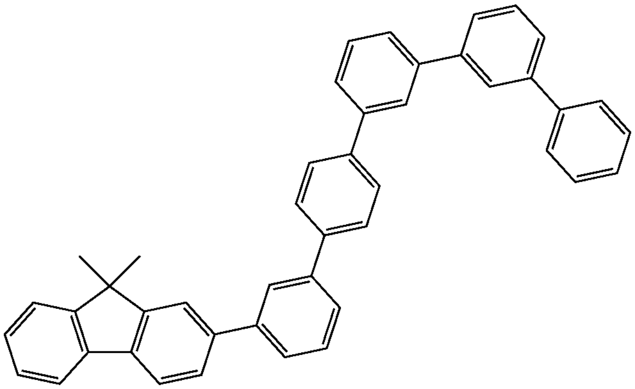

-continued
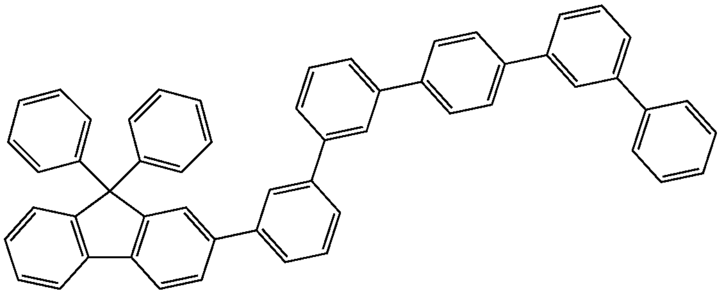
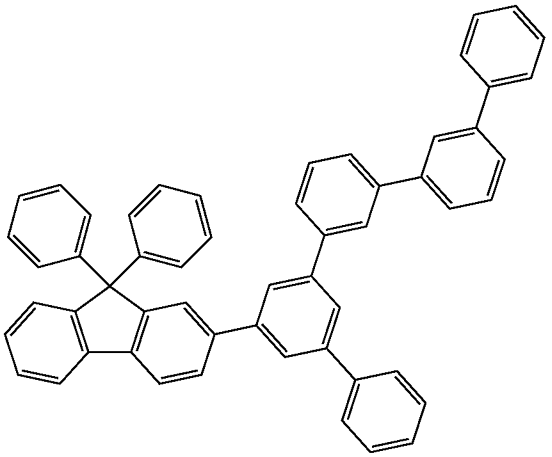
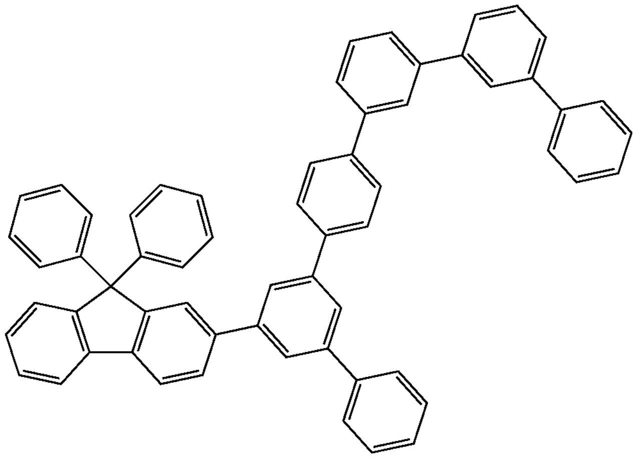
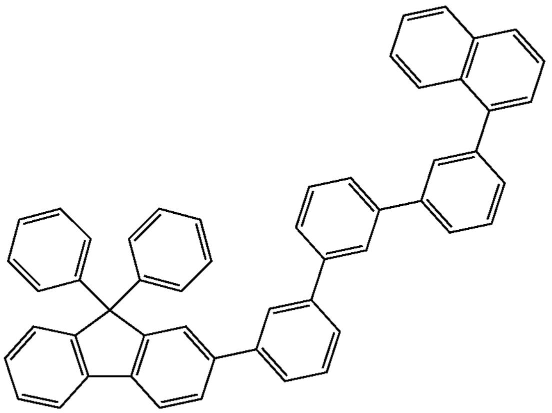
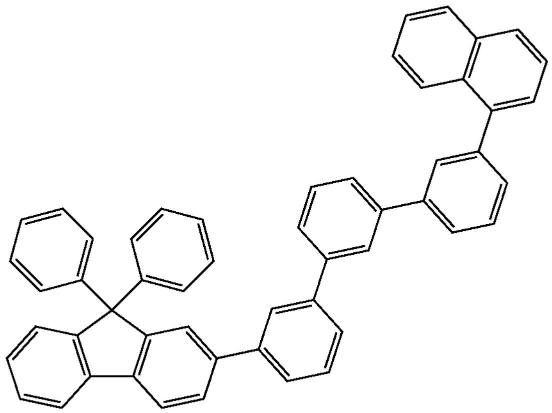
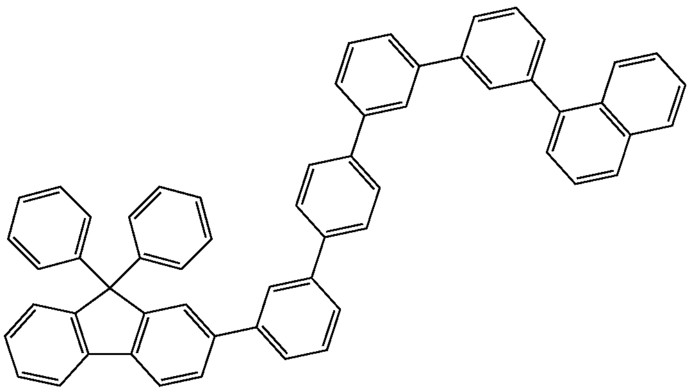

-continued
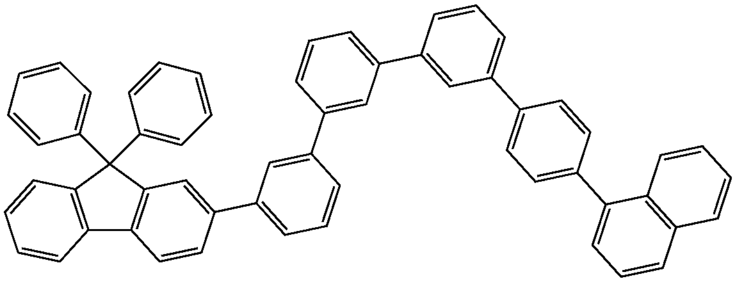
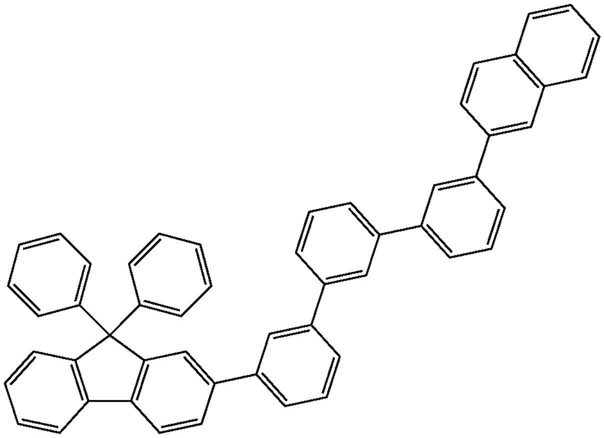
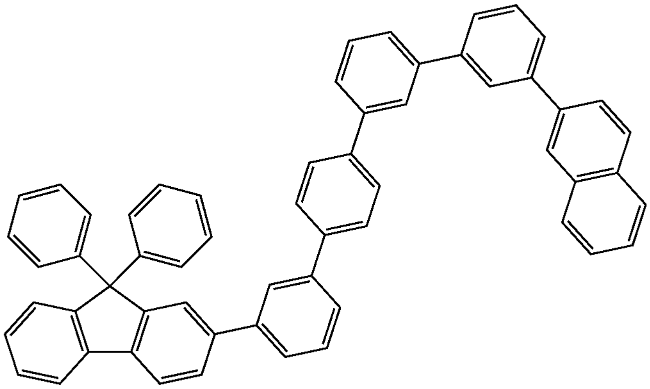
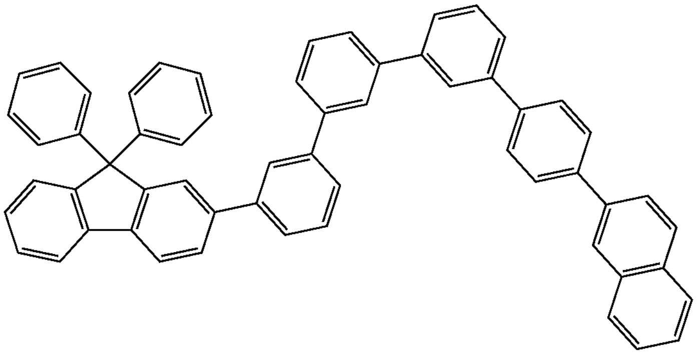

-continued
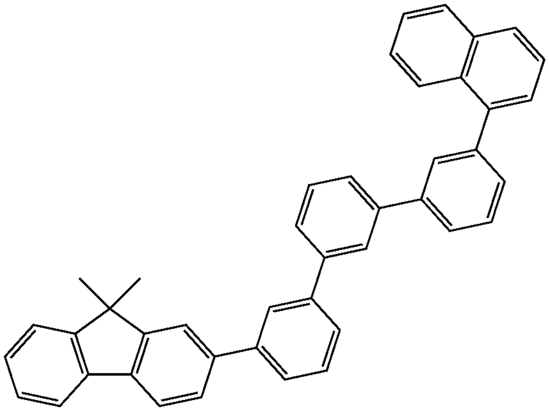
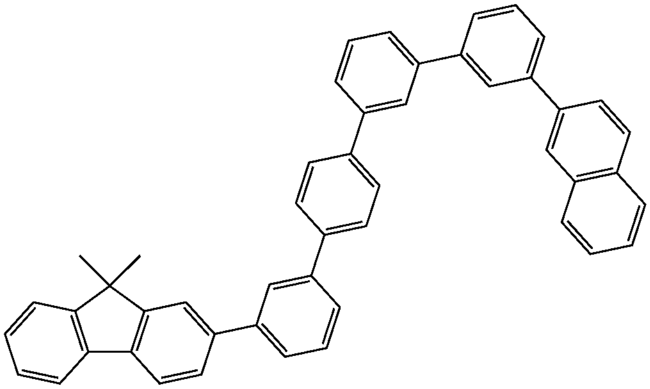
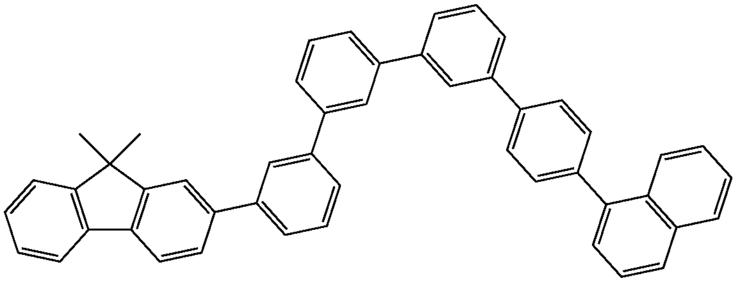
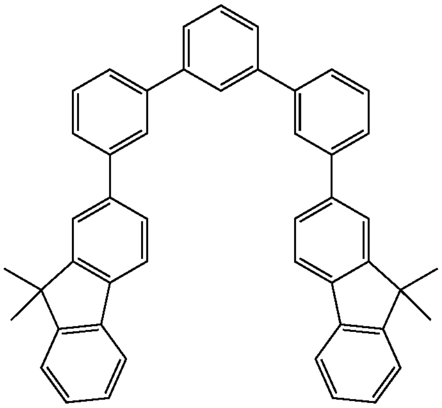
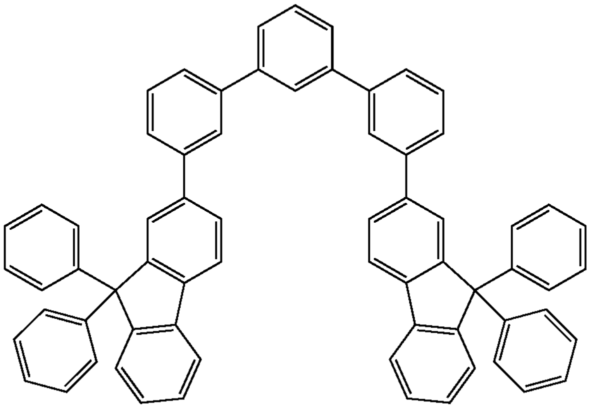
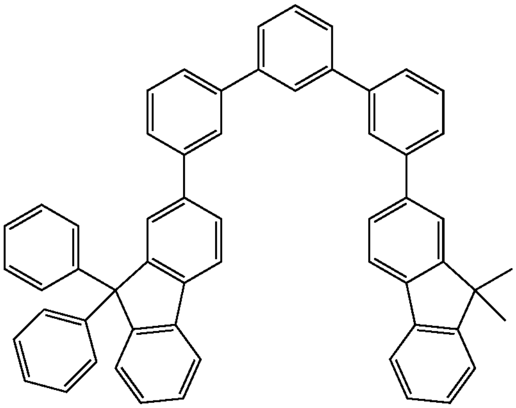
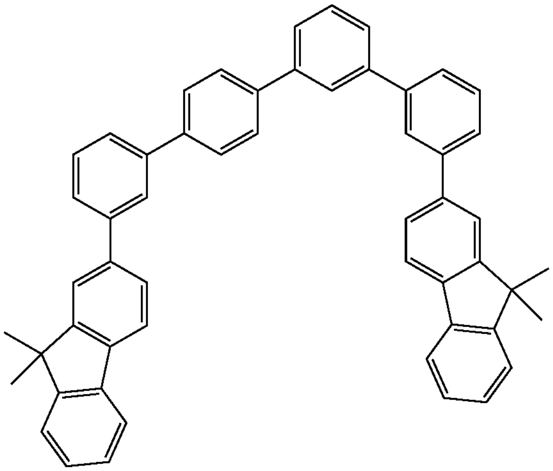
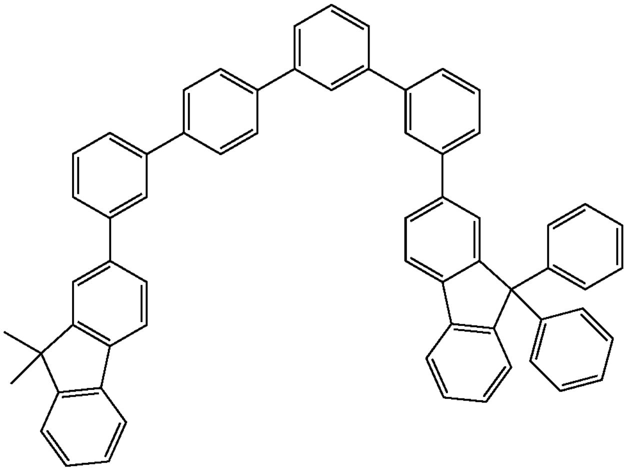

-continued
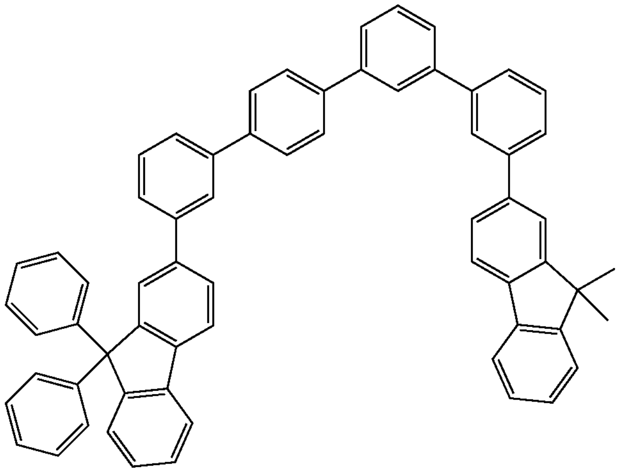
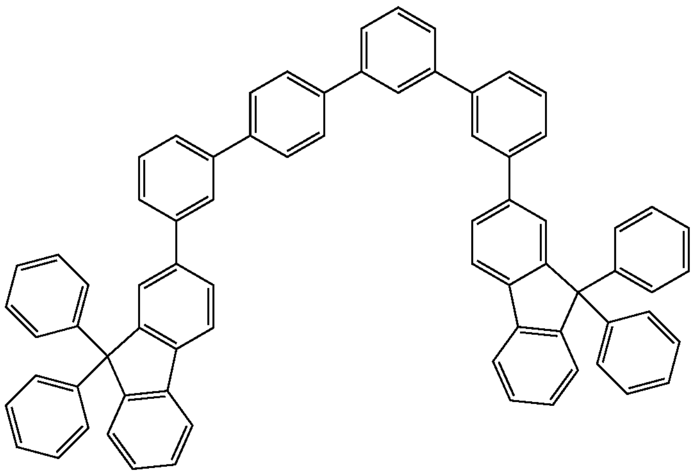
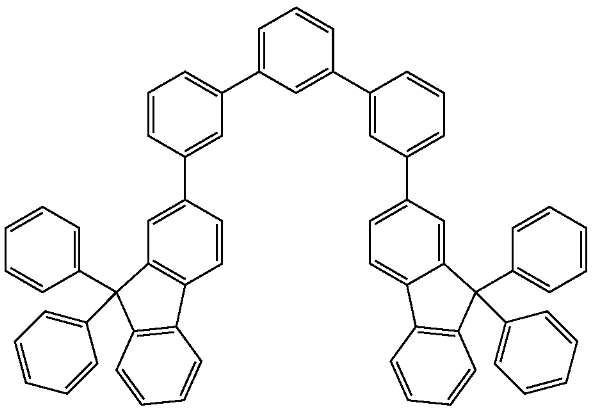
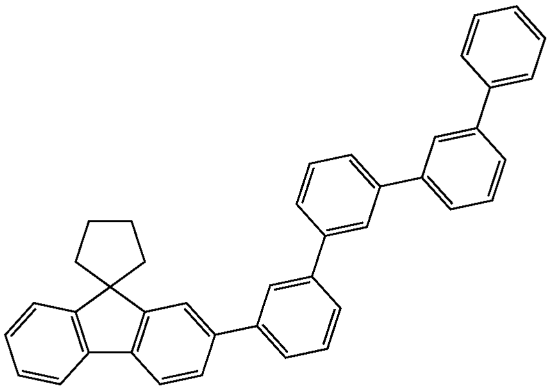

-continued
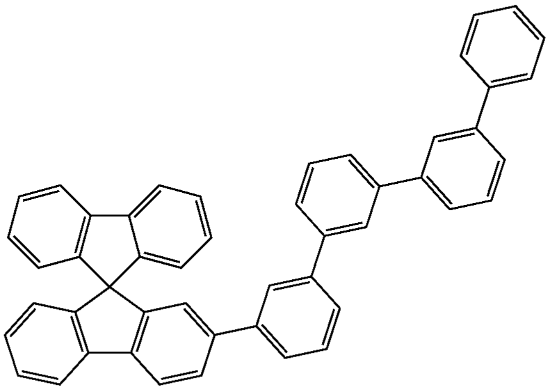
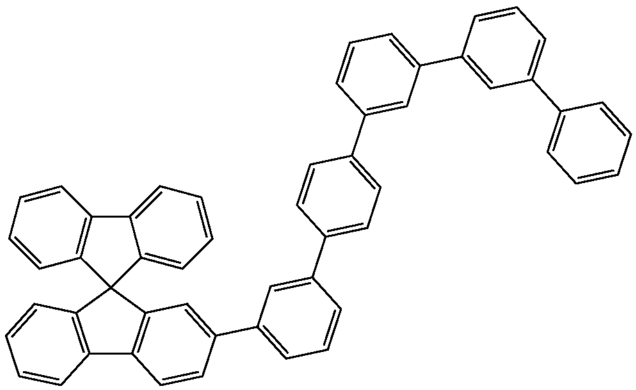
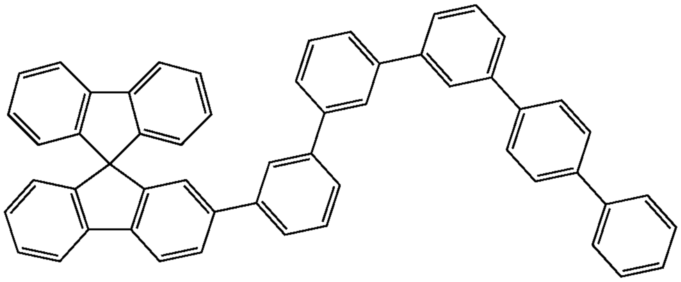
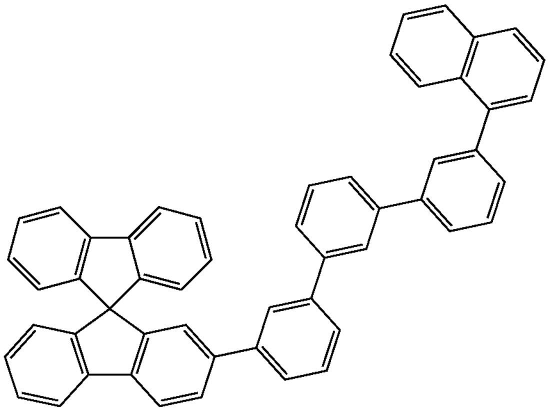
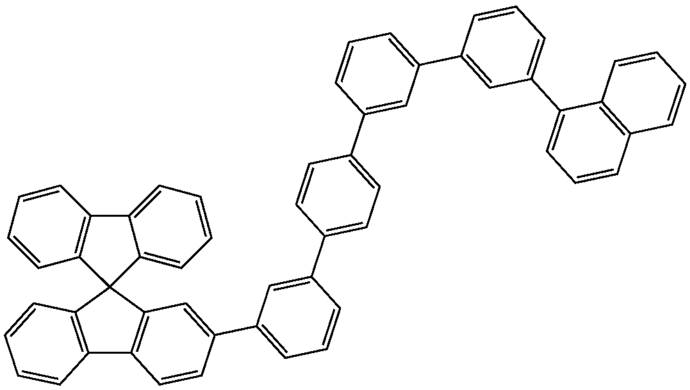

-continued
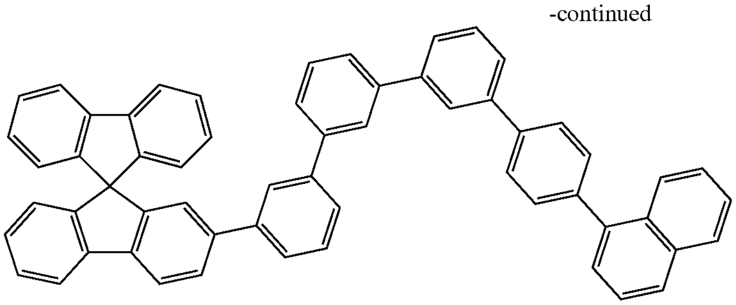
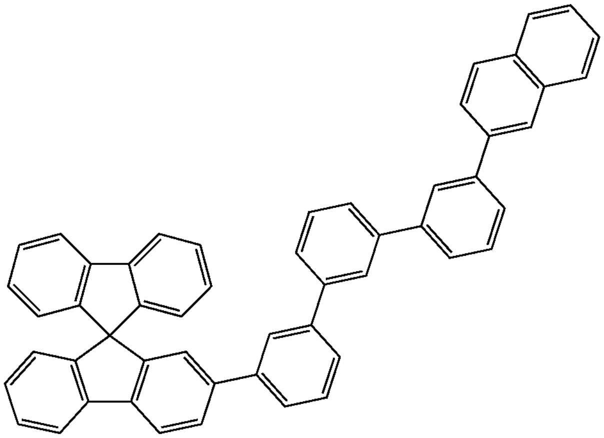
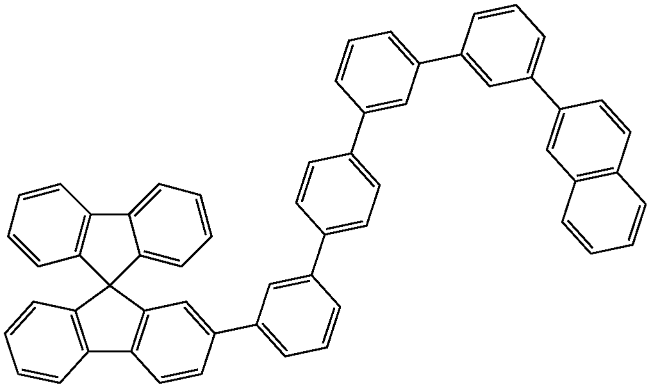
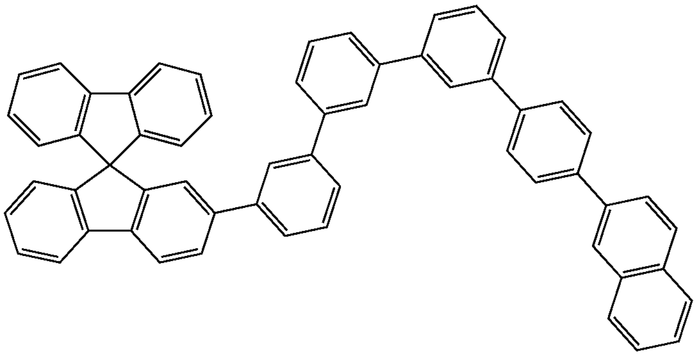

-continued
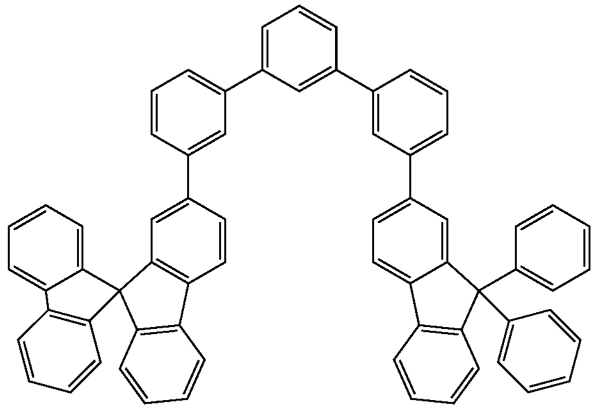
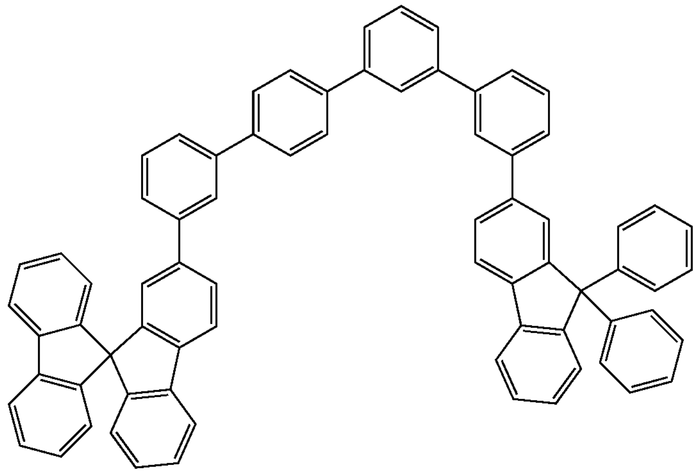
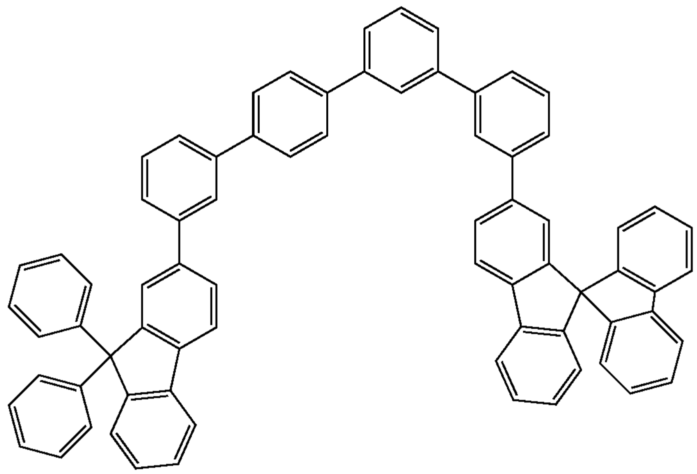

-continued

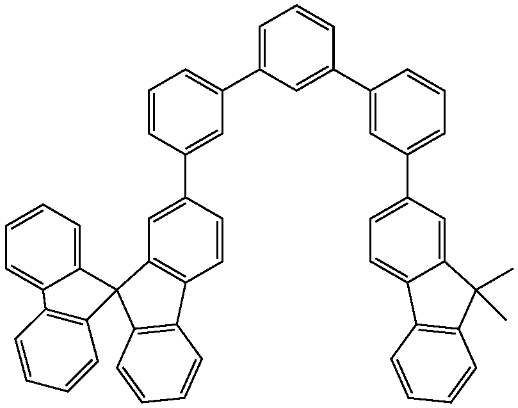

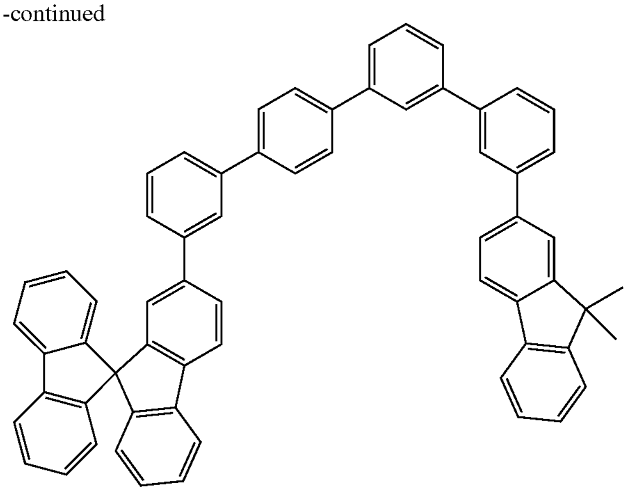

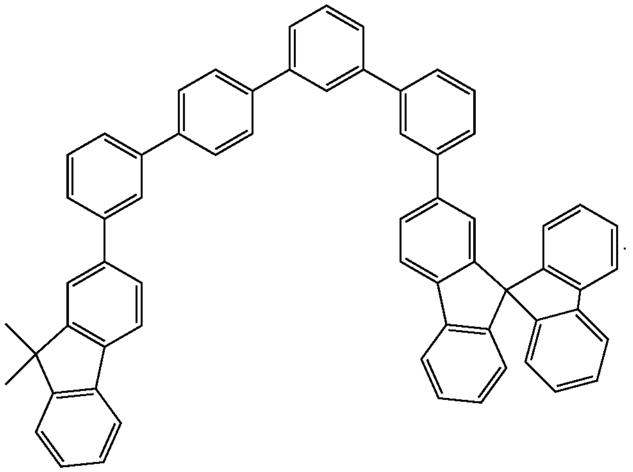

14. The organic light-emitting device of claim 1, wherein the first compound comprises at least one compound represented by Formula 1-1 or 1-4, the second compound comprises at least one compound represented by Formula 2-1 or 2-4, and the third compound comprises at least one compound represented by Formula 3-2:

3-2

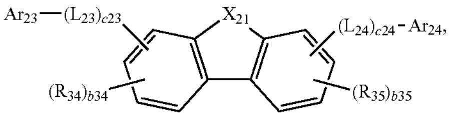

wherein, in Formula 3-2, $X_{21}$ is O or S, $L_{23}$ to $L_{24}$ are each independently a substituted or unsubstituted $C_6$-$C_{30}$ arylene group, c23 and c24 are each independently 1, 2, or 3, $Ar_{23}$ and $Ar_{24}$ are each independently hydrogen or a substituted or unsubstituted $C_6$-$C_{30}$ aryl group, $R_{34}$ and $R_{35}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, and b34 and b35 are each independently an integer from 0 to 3.

15. The organic light-emitting device of claim 1, wherein the first compound comprises at least one compound represented by Formula 1-1, the second compound comprises at least one compound represented by Formula 2-1, and the third compound comprises at least one compound represented by Formula 3-1:

3-1

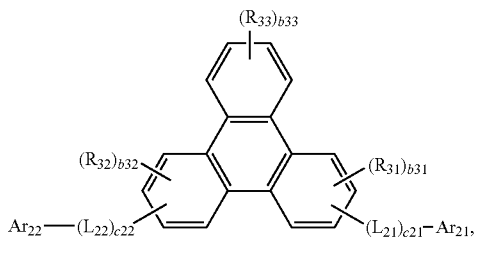

wherein, in Formula 3-1, $L_{21}$ to $L_{22}$ are each independently a substituted or unsubstituted $C_6$-$C_{30}$ arylene group, c21 and c22 are each independently 1, 2, or 3, $Ar_{21}$ and $Ar_{22}$ are each independently hydrogen or a substituted or unsubstituted $C_6$-$C_{30}$ aryl group, wherein each of $Ar_{21}$ and $Ar_{22}$ is not hydrogen at the same time, $R_{31}$ to $R_{33}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group, b31 and b32 are each independently an integer from 0 to 3, and b33 is an integer from 0 to 4.

16. The organic light-emitting device of claim 1, wherein the emission layer further comprises a fluorescent dopant, a phosphorescent dopant, or a combination thereof.

17. An apparatus comprising the organic light-emitting device of claim 1.

* * * * *